(12) United States Patent
Yoshida et al.

(10) Patent No.: US 8,907,879 B2
(45) Date of Patent: Dec. 9, 2014

(54) METHOD FOR DRIVING LIQUID CRYSTAL DISPLAY DEVICE

(75) Inventors: Yasunori Yoshida, Kanagawa (JP); Hajime Kimura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 929 days.

(21) Appl. No.: 12/121,173

(22) Filed: May 15, 2008

(65) Prior Publication Data

US 2008/0284768 A1 Nov. 20, 2008

(30) Foreign Application Priority Data

May 18, 2007 (JP) ................................. 2007-133557

(51) Int. Cl.
*G09G 3/36* (2006.01)
*G09G 3/20* (2006.01)
(Continued)

(52) U.S. Cl.
CPC .......... *G09G 3/2081* (2013.01); *H01L 27/1214* (2013.01); *G09G 2310/061* (2013.01);

(58) Field of Classification Search
CPC ............ G09G 3/3611; G09G 2340/10; G09G 2340/16
USPC ........................................................ 345/208
See application file for complete search history.

(56) References Cited

U.S. PATENT DOCUMENTS

| | | | |
|---|---|---|---|
| 5,748,164 A * | 5/1998 | Handschy et al. | ............... 345/89 |
| 5,912,651 A | 6/1999 | Bitzakidis et al. | |

(Continued)

FOREIGN PATENT DOCUMENTS

| | | |
|---|---|---|
| EP | 1931141 A | 6/2008 |
| JP | 04-302289 | 10/1992 |

(Continued)

OTHER PUBLICATIONS

N. Kimura et al.; "60.2: New Technologies for Large-Sized High-Quality LCD TV"; *SID '05 Digest—International Symposium Digest of Technical Papers*, vol. 36, Book 2; pp. 1734-1737; May 25-27, 2005.

(Continued)

*Primary Examiner* — Dorothy Harris
(74) *Attorney, Agent, or Firm* — Fish & Richardson P.C.

(57) ABSTRACT

In a period $T_{in}$, p-th input image data (p is a positive integer) and (p+1)th input image data are input to a liquid crystal display device. In a period T, i-th original image data (i is a positive integer) and (i+1)th original image data are generated based on the input image data. J number of sub-images (J is an integer equal to or more than 3) are generated based on the i-th original image data. In the period T, the J number of sub-images are sequentially displayed. At least one of the i-th original image data and the (i+1)th original image data is in an intermediate state between the p-th input image data and the (p+1)th input image data. Each of the sub-images exhibits one of first brightness and second brightness. At least one sub-image among the J number of sub-images is different from the other sub-images.

7 Claims, 119 Drawing Sheets

(51) Int. Cl.

| | |
|---|---|
| *G09G 3/32* | (2006.01) |
| *G09G 5/00* | (2006.01) |
| *H01L 27/12* | (2006.01) |
| *H01L 27/32* | (2006.01) |
| *H01L 51/50* | (2006.01) |
| *G02F 1/1362* | (2006.01) |
| *H01L 29/423* | (2006.01) |
| *H01L 29/66* | (2006.01) |
| *G09G 3/34* | (2006.01) |

(52) U.S. Cl.
CPC ...... *G09G 3/3648* (2013.01); *G09G 2320/0633* (2013.01); *G09G 3/2025* (2013.01); *G09G 2310/024* (2013.01); *H01L 27/3244* (2013.01); *G09G 2300/02* (2013.01); *G09G 2300/0408* (2013.01); *H01L 51/5012* (2013.01); *G09G 2340/0435* (2013.01); *G09G 3/3659* (2013.01); *G09G 2300/0443* (2013.01); *G09G 2300/0819* (2013.01); *G09G 2360/144* (2013.01); *G02F 1/1362* (2013.01); *G09G 2300/0876* (2013.01); *G09G 2320/0261* (2013.01); *G09G 2300/0465* (2013.01); *G09G 2300/0842* (2013.01); *G09G 2320/0252* (2013.01); *G09G 2320/064* (2013.01); *G09G 2320/0276* (2013.01); *H01L 29/42384* (2013.01); *G09G 2320/106* (2013.01); *G09G 2330/021* (2013.01); *G09G 3/2022* (2013.01); *G09G 2320/0247* (2013.01); *G09G 2320/028* (2013.01); *H01L 29/66772* (2013.01); *G09G 3/3233* (2013.01); *G09G 3/3406* (2013.01); *G09G 2340/16* (2013.01); *G09G 3/342* (2013.01); *G09G 3/2018* (2013.01); *G09G 2310/0262* (2013.01); *G09G 2310/08* (2013.01); *G09G 2360/16* (2013.01); *G09G 5/005* (2013.01)
USPC ............................................. 345/89; 345/208

(56) References Cited

U.S. PATENT DOCUMENTS

| | | | |
|---|---|---|---|
| 6,151,075 A * | 11/2000 | Shin et al. .................... 348/459 |
| 6,392,620 B1 | 5/2002 | Mizutani et al. |
| 6,614,415 B2 | 9/2003 | Mizutani et al. |
| 6,683,595 B2 | 1/2004 | Ikeda |
| 7,002,540 B2 | 2/2006 | Aoki |
| 7,057,597 B2 | 6/2006 | Ikeda |
| 7,280,103 B2 | 10/2007 | Taoka et al. |
| 7,733,319 B2 | 6/2010 | Aiba |
| 7,737,933 B2 * | 6/2010 | Yamano et al. .................. 345/94 |
| 2001/0052886 A1 | 12/2001 | Ikeda |
| 2002/0015104 A1 * | 2/2002 | Itoh et al. ....................... 348/459 |
| 2003/0035592 A1 * | 2/2003 | Cornog et al. .................. 382/284 |
| 2003/0091112 A1 * | 5/2003 | Chen ........................... 375/240.15 |
| 2003/0202780 A1 * | 10/2003 | Dumm et al. .................. 386/112 |
| 2005/0078069 A1 * | 4/2005 | Aiba et al. ...................... 345/87 |
| 2005/0184949 A1 * | 8/2005 | Kamimura ...................... 345/98 |
| 2005/0212740 A1 * | 9/2005 | Miyagawa ...................... 345/89 |
| 2005/0253785 A1 | 11/2005 | Miyasaka et al. |
| 2006/0038837 A1 | 2/2006 | Hong |
| 2006/0202945 A1 * | 9/2006 | Feng ............................. 345/102 |
| 2006/0238486 A1 | 10/2006 | Hiraki |
| 2006/0262054 A1 * | 11/2006 | Yamazaki et al. ............... 345/77 |
| 2006/0279478 A1 * | 12/2006 | Ikegami ......................... 345/30 |
| 2007/0097260 A1 * | 5/2007 | Takeuchi et al. ............... 348/441 |
| 2007/0103418 A1 | 5/2007 | Ogino et al. |
| 2007/0103585 A1 * | 5/2007 | Takeuchi et al. ............... 348/441 |
| 2007/0263121 A1 * | 11/2007 | Take et al. ..................... 348/448 |
| 2007/0279359 A1 | 12/2007 | Yoshida et al. |
| 2008/0111778 A1 * | 5/2008 | Shen et al. ...................... 345/87 |
| 2009/0059068 A1 | 3/2009 | Hanaoka et al. |

FOREIGN PATENT DOCUMENTS

| | | |
|---|---|---|
| JP | 05-080717 A | 4/1993 |
| JP | 08-500915 A | 1/1996 |
| JP | 09-325715 | 12/1997 |
| JP | 2000-200063 | 7/2000 |
| JP | 2001-281625 A | 10/2001 |
| JP | 2001-281664 A | 10/2001 |
| JP | 2002-023707 | 1/2002 |
| JP | 2002-091400 | 3/2002 |
| JP | 2003-298879 A | 10/2003 |
| JP | 2004-177575 | 6/2004 |
| JP | 2004-240317 | 8/2004 |
| JP | 2004-317928 A | 11/2004 |
| JP | 2005-268912 | 9/2005 |
| JP | 2006-243185 A | 9/2006 |
| JP | 2006-259624 A | 9/2006 |
| JP | 2006-300982 A | 11/2006 |
| JP | 2006-337448 A | 12/2006 |
| TW | 200713190 B | 4/2007 |
| WO | 95/01701 A1 | 1/1995 |
| WO | WO-2007/040045 | 4/2007 |

OTHER PUBLICATIONS

Jun-Woo Lee et al.; "69.4: Amorphous Silicon Based 40" LCD TV Using Ultra Fast OCB Mode"; *SID '06 Digest—International Symposium Digest of Technical Papers*, vol. 37, Book 2; pp. 1950-1953; Jun. 7-9, 2006.

K. Ono et al.; "69.5: Invited Paper: Progress of IPS-Pro Technology for LCD-TVs"; *SID '06 Digest—International Symposium Digest of Technical Papers*, vol. 37, Book 2; pp. 1954-1957; Jun. 7-9, 2006.

I. Imori et al.; "Improvement of Motion Blur for IPS-Pro LCD-TVs Driven by 180 Hz Impulsive Driving"; *IDW '07 Proceedings of the 14th International Display Workshops*, vol. 1; pp. 79-82; Dec. 5, 2007.

Eddy G. Chen et al.; "Advanced Overdrive Method for Dynamic Impulsive Driving"; *IDW '07 Proceedings of the 14th International Display Workshops*, vol. 3; pp. 1909-1912; Dec. 7, 2007.

Office Action, Chinese Application No. 200810099273.0, dated Dec. 12, 2011, 12 pages with full English translation.

Office Action, Taiwanese Application No. 97117702, dated Jan. 13, 2014, 18 pages with full English translation.

* cited by examiner

|     | region 1 | region 2 | region 3 |
|-----|----------|----------|----------|
| 1SF | (the sum-2SF) | constant slope | (the sum-2SF) |
| 2SF | constant slope | (the sum-1SF) | constant slope |

|     | region 1 | region 2 | region 3 |
|-----|----------|----------|----------|
| 1SF | constant slope | (the sum-2SF) | (the sum-2SF) |
| 2SF | (the sum-1SF) | constant slope | constant slope |

|  | region 1 | region 2 | region 3 |
|---|---|---|---|
| 1SF | constant ratio | constant ratio | (the sum-2SF) |
| 2SF | constant ratio | constant ratio | constant slope |

|  | region 1 | region 2 | region 3 |
|---|---|---|---|
| 1SF | constant ratio | constant ratio | constant ratio |
| 2SF | constant ratio | constant ratio | constant ratio |

1900 Input external image signal
1901 Horizontal synchronization signal
1902 Vertical synchronization signal
1903 Image signal
1904 Source start pulse
1905 Source clock
1906 Gate start pulse
1907 Gate clock
1908 Frequency control signal
1911 Control circuit
1912 Source driver
1913 Gate driver
1914 Display region
1915 Image processing circuit
1916 Timing generation circuit 1900 Input external image signal
1903 Image signal
1908 Frequency control signal
1915 Image processing circuit
1920 Motion detection circuit
1921 First memory
1922 Second memory
1923 Third memory
1924 Luminance control circuit
1925 High-speed processing circuit
1926 Fourth memory 2001 p-th image
2002 (p+1)th image
2003 (p+2)th image
2004 First region
2005 Second region
2006 Third region
2007 Fourth region
2008 Fifth region
2009 Sixth region
2010 Movement vector
2011 Displacement vector

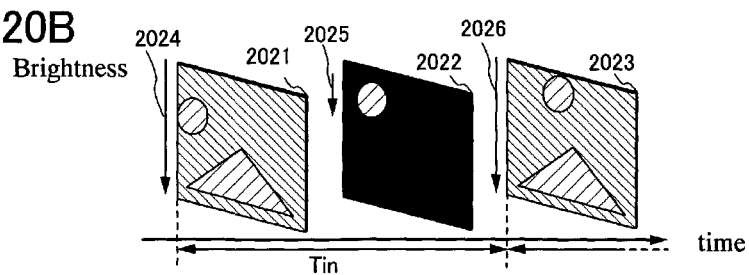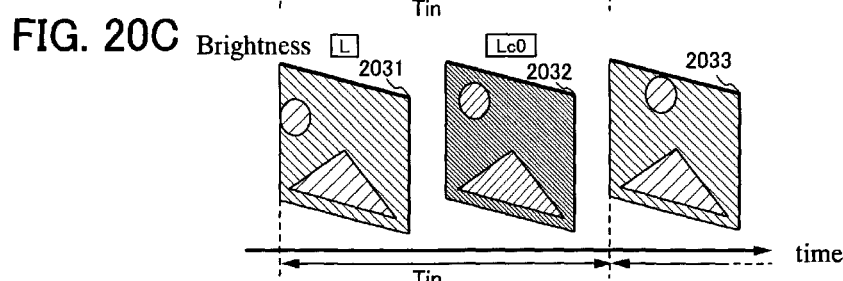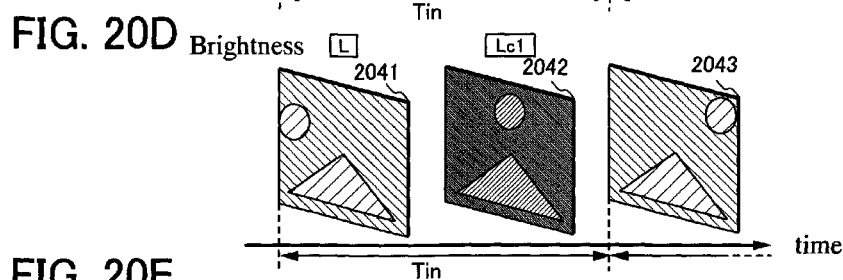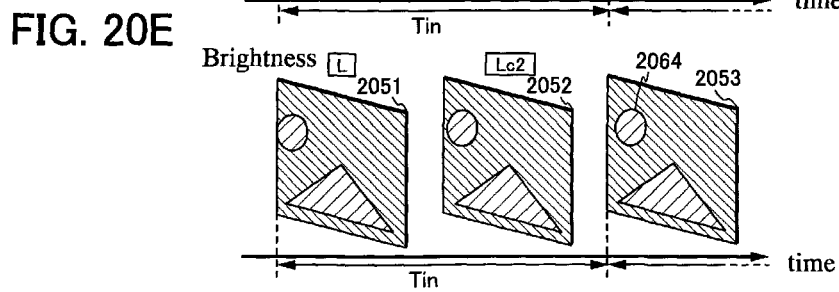

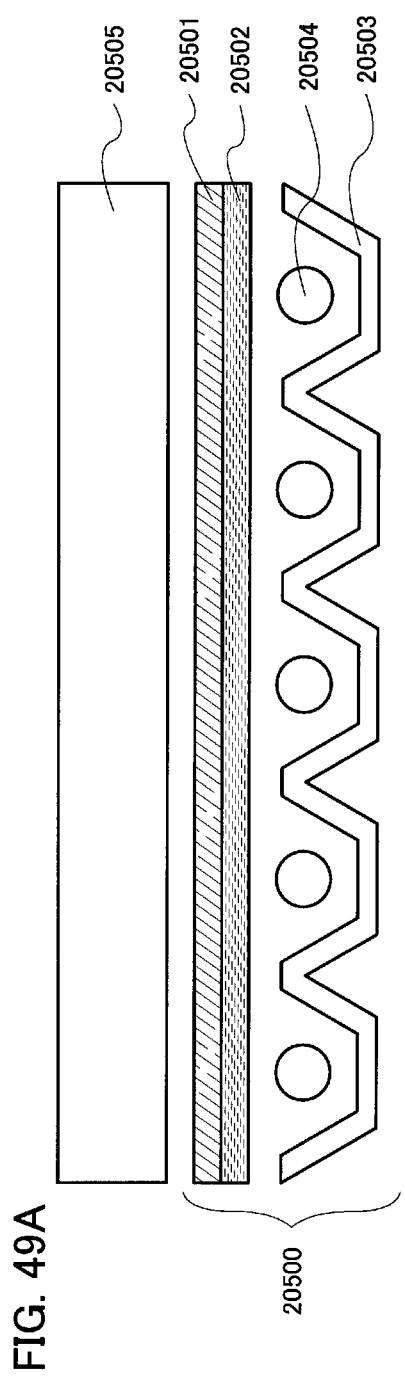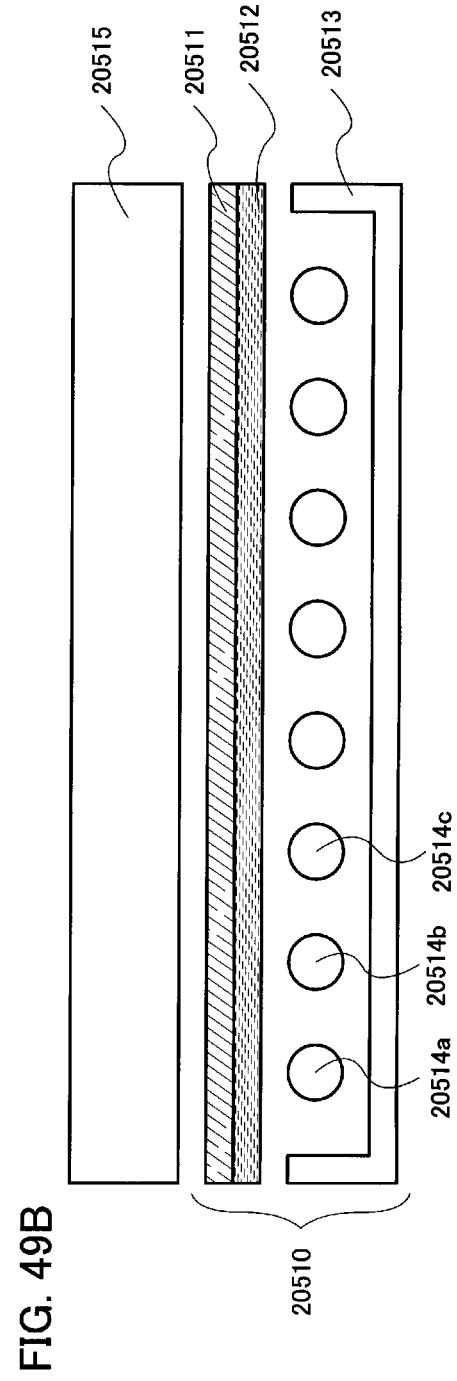

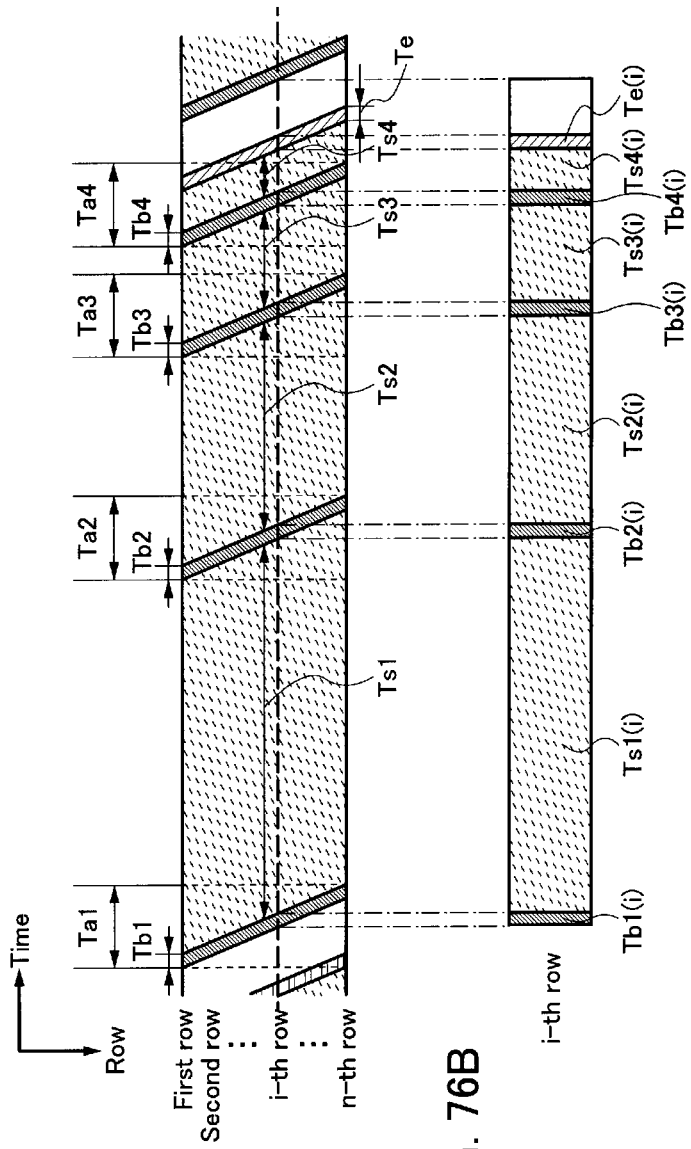

Semiconductor layer
Gate metal
Wiring
Light-transmitting conductive film

METHOD FOR DRIVING LIQUID CRYSTAL DISPLAY DEVICE

BACKGROUND OF THE INVENTION

1. Field of the Invention

The present invention relates to devices and driving methods thereof. Specifically, the present invention relates to semiconductor devices and driving methods thereof. More specifically, the present invention relates to display devices and driving methods thereof, and particularly, methods for improving quality of moving images by a hold-type driving method.

2. Description of the Related Art

In recent years, there has been growing interests in thin display devices. As substitutes for CRT displays, liquid crystal displays, plasma displays, projection displays, and the like have been developed and becoming popular. Further, field emission displays, inorganic electroluminescence displays, organic electroluminescence displays, electronic paper, and the like have been developed as next-generation display devices.

In a display portion provided in the above-described display device, pixels which are minimum units for forming an image are arranged. Each of the pixels emits light with luminance in accordance with image data, and an image is displayed on the display portion.

When a moving image is displayed by such a display device, a plurality of images are displayed quickly, several tens of times per second. A cycle in which a plurality of images are displayed (or a cycle in which image data is input to the display device) is referred to as one frame period.

Here, driving methods of display devices can be classified according to temporal distribution of luminance of a pixel in one frame period. In a hold-type driving method which is used mainly in an active matrix display device, luminance of a pixel is constant in one frame period. On the other hand, in an impulse-type driving method which is used in CRT and the like, intense light is emitted once in one frame period and thereafter, luminance of a pixel immediately decreases and light is not emitted any more. In the impulse driving method, a non-lighting state dominates the most part of one frame period.

It has become obvious that hold-type display devices have the following problems of motion blur: in displaying moving images, a moving object appears to have traces when a part of the image moves or the whole image is blurred when the whole image moves. It is said that this is because an image displayed on a hold-type display device is kept still during one frame period, while a human predicts motion of the moving object and sees a direction in which the moving object is supposed to move. That is, this is because a discrepancy between movement of human eyes and movement of the moving image. In an impulse-type display device, since an image appears for a moment and disappears immediately, there is no problem of such a discrepancy between human eyes and a moving image, and thus, a problem of motion blur does not occur.

Typically, two methods for solving the problem of motion blur in the hold-type display device are proposed (see Patent Document 1). The first method is a method in which a period for displaying an original image and a period for display a black image are provided in one frame period. By this method, display can be closer to pseudo impulse-type display, and fewer afterimages can be perceived; thus, quality of moving images can be improved (see Patent Documents 2 and 3). The second method is a method in which one frame period is shortened (i.e., frame frequency is increased). Accordingly, movement of an image can follow movement of human eyes and movement of the image is smooth, which leads to improvement of quality of moving images (see Patent Document 4). Further, as a technique for improving the first method, a method in which an image which is darker than an original image is displayed instead of a black image to improve quality of moving images is disclosed (see Patent Documents 5 and 6, and Non-patent Documents 1 to 3). Further, a method in which a driving method is changed depending on conditions is disclosed (see Patent Documents 7 and 8).

Patent Document 1: Japanese Published Patent Application No. H4-302289
Patent Document 2: Japanese Published Patent Application No. H9-325715
Patent Document 3: Japanese Published Patent Application No. 2000-200063
Patent Document 4: Japanese Published Patent Application No. 2005-268912
Patent Document 5: Japanese Published Patent Application No. 2002-23707
Patent Document 6: Japanese Published Patent Application No. 2004-240317
Patent Document 7: Japanese Published Patent Application No. 2002-91400
Patent Document 8: Japanese Published Patent Application No. 2004-177575
Non-patent Document 1: "New Technologies for Large-Sized High-Quality LCD TV", SID'05 DIGEST, 60.2, pp. 1734-1737 (2005)
Non-patent Document 2: "Amorphous Silicon Based 40" LCD TV Using Ultra Fast OCB Mode", SID'06 DIGEST, 69.4, pp. 1950-1953 (2006)
Non-patent Document 3: "Progress of IPS-Pro Technology for LCD-TVs", SID'06 DIGEST, 69.5, pp. 1954-1957 (2006)

SUMMARY OF THE INVENTION

As described above, a variety of methods have been studied to solve the problem of motion blur in hold-type display devices. However, such methods do not provide sufficient effects and do not yet have quality of moving images equal to that of impulse-type display devices. Further, in the method in which display of a black image is made closer to pseudo impulse-type display, flickers are increased. When a black image is displayed, luminance of an image is decreased, and power consumption is increased to provide the same level of luminance as in the case where a black image is not inserted. In the method of increasing frame frequency, data processing is complicated, and a driver circuit for high-speed processing is needed, which causes problems such as increase in manufacturing cost, heat generation due to the data processing, and increase in power consumption.

In view of the foregoing problems, a main object of the invention is to provide a display device in which quality (image quality) of still images and moving images is improved and a driving method of the display device. In particular, objects are to provide a display device without the problem of motion blur and a driving method of the display device, to provide a display device without flickers and a driving method of the display device, to provide a display device with wider viewing angles and a driving method of the display device, to provide a display device with higher response speed and a driving method of the display device, to provide a display device with reduced power consumption and a driving method of the display device, to provide a display device with reduced manufacturing cost and a driving method of the display device, and the like.

In one aspect of a method for driving a liquid crystal display device of the invention, p-th input image data (p is a positive integer) and (p+1)th input image data are input to the liquid crystal display device in a period $T_{in}$; in a period T, i-th original image data (i is a positive integer) and (i+1)th original image data are generated based on the input image data; J number of sub-images (J is an integer equal to or more than 3) are generated based on the i-th original image data; in the period T, the J number of sub-images are sequentially displayed; at least one of the i-th original image data and the (i+1)th original image data is in an intermediate state between the p-th input image data and the (p+1)th input image data; each of the sub-images exhibits one of first brightness and second brightness; and at least one sub-image among the J number of sub-images is different from the other sub-images.

There are the following advantages when at least one sub-image among the J number of sub-images is different from the other sub-images. For example, when different sub-images are sequentially displayed in the period T, at least one pixel whose brightness is temporally changed exists in the period T. In other words, impulse driving is performed in the pixel. That is, when at least one sub-image among the J number of sub-images is different from the other sub-images, impulse-type display can be performed; thus, quality of moving images can be improved. Further, the frequency of writing to each pixel in the period T is increased as J is increased; thus, lack of writing voltage to the pixel by constant charge driving is solved, and response time of a display element can be reduced.

In another aspect of a method for driving a liquid crystal display device of the invention, at least one of the J number of sub-images is a black image in the above-described structure.

In another aspect of a method for driving a liquid crystal display device of the invention, p-th input image data (p is a positive integer) and (p+1)th input image data are input to the liquid crystal display device in a period $T_{in}$; in a period T, i-th original image data (i is a positive integer) and (i+1)th original image data are generated based on the input image data; J number of sub-images (J is an integer equal to or more than 3) are generated based on the i-th original image data; in the period T, the J number of sub-images are sequentially displayed; at least one of the i-th original image data and the (i+1)th original image data is in an intermediate state between the p-th input image data and the (p+1)th input image data; each of the sub-images exhibits one of first brightness and second brightness; and all of the J number of sub-images are the same images.

In another aspect of a method for driving a liquid crystal display device of the invention, p-th input image data (p is a positive integer) and (p+1)th input image data are input to the liquid crystal display device in a period $T_{in}$; in a period T, i-th original image data (i is a positive integer) and (i+1)th original image data are generated based on the input image data; a first sub-image and a second sub-image are generated based on the i-th original image data; in the period T, the first sub-image and the second sub-image are sequentially displayed; at least one of the i-th original image data and the (i+1)th original image data is in an intermediate state between the p-th input image data and the (p+1)th input image data; the period $T_{in}$ is more than twice the period T; the first sub-image and the second sub-image are different from each other; and one of the first sub-image and the second sub-image is a black image.

In another aspect of a method for driving a liquid crystal display device of the invention, p-th input image data (p is a positive integer) and (p+1)th input image data are input to the liquid crystal display device in a period $T_{in}$; in a period T, i-th original image data (i is a positive integer) and (i+1)th original image data are generated based on the input image data; a first sub-image and a second sub-image are generated based on the i-th original image data; in the period T, the first sub-image and the second sub-image are sequentially displayed; at least one of the i-th original image data and the (i+1)th original image data is in an intermediate state between the p-th input image data and the (p+1)th input image data; the period $T_{in}$ is more than twice the period T; and the first sub-image and the second sub-image are the same images.

Note that various types of switches, for example, an electrical switch and a mechanical switch can be used. That is, any element can be used without being limited to a particular type as long as it can control a current flow. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a thyristor, or the like can be used as a switch. Alternatively, a logic circuit in which such elements are combined can be used as a switch.

Examples of a mechanical switch include a switch formed using a micro electro mechanical system (MEMS) technology, such as a digital micromirror device (DMD). Such a switch includes an electrode which can be moved mechanically, and operates by controlling connection or non-connection based on movement of the electrode.

When a transistor is used as a switch, polarity (a conductivity type) of the transistor is not particularly limited since it operates just as a switch. Note that when off-current is preferably to be suppressed, a transistor of polarity with smaller off-current is preferably used. Examples of a transistor with smaller off-current include a transistor having an LDD region and a transistor having a multi-gate structure. Further, an n-channel transistor is preferably used when a transistor operates with a potential of a source terminal closer to a potential of a low potential side power supply (e.g., $V_{ss}$, GND, or 0 V). On the other hand, a p-channel transistor is preferably used when a transistor operates with a potential of a source terminal closer to a potential of a high potential side power supply (e.g., $V_{dd}$). This is because when the n-channel transistor operates with the potential of the source terminal closer to the low potential side power supply and when the p-channel transistor operates with the potential of the source terminal closer to the high potential side power supply, an absolute value of gate-source voltage can be increased; thus, the transistor can more precisely operate as a switch. Moreover, this is because reduction in output voltage does not occur often because the transistor does not often perform a source follower operation.

Note that a CMOS switch may also be employed by using both n-channel and p-channel transistors. A CMOS switch can easily function as a switch since current can flow when one of the n-channel transistor and the p-channel transistor is turned on. For example, voltage can be output as appropriate whether voltage of an input signal to the switch is high or low. Further, since a voltage amplitude value of a signal for turning on/off the switch can be decreased, power consumption can be reduced.

Note that when a transistor is used as a switch, the switch includes an input terminal (one of a source terminal and a drain terminal), an output terminal (the other of the source terminal and the drain terminal), and a terminal (a gate terminal) for controlling electrical conduction. On the other hand, when a diode is used as a switch, the switch does not have a terminal for controlling electrical conduction in some cases. Therefore, when a diode is used as a switch, the number of wirings for controlling terminals can be reduced compared with the case where a transistor is used as a switch.

Note that when it is explicitly described that A and B are connected, the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, another element may be provided in a connection relationship shown in drawings and texts, without being limited to a predetermined connection relationship, for example, connection relationships shown in the drawings and the texts.

For example, when A and B are electrically connected, one or more elements which enable electrical connection of A and B (e.g., a switch, a transistor, a capacitor, an inductor, a resistor, or a diode) may be provided between A and B. Alternatively, when A and B are functionally connected, one or more circuits which enable functional connection of A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a booster circuit or a voltage step-down circuit) or a level shifter circuit for changing potential level of a signal; a voltage source; a current source; a switching circuit; or an amplifier circuit which can increase signal amplitude, the amount of current, or the like, such as an operational amplifier, a differential amplifier circuit, a source follower circuit, or a buffer circuit; a signal generation circuit; a memory circuit; or a control circuit may be provided between A and B. Alternatively, when A and B are directly connected, A and B may be directly connected without interposing another element or another circuit therebetween.

When it is explicitly described that A and B are directly connected, the case where A and B are directly connected (i.e., the case where A and B are connected without interposing another element or another circuit therebetween) and the case where A and B are electrically connected (i.e., the case where A and B are connected by interposing another element or another circuit therebetween) are included.

In addition, when it is explicitly described that A and B are electrically connected, the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included. That is, when it is explicitly described that A and B are electrically connected, the description is the same as the case where it is explicitly described only that A and B are connected.

Note that a display element, a display device which is a device including a display element, a light-emitting element, and a light-emitting device which is a device including a light-emitting element can employ various modes and can include various elements. For example, as a display element, a display device, a light-emitting element, and a light-emitting device, a display medium whose contrast, luminance, reflectivity, transmittance, or the like is changed by electromagnetic action, such as an EL (electroluminescence) element (e.g., an EL element including both organic and inorganic materials, an organic EL element, or an inorganic EL element), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used. Note that display devices using an EL element include an EL display in its category; display devices using an electron emitter include a field emission display (FED) and an SED-type flat panel display (SED: surface-conduction electron-emitter display) in its category; display devices using a liquid crystal element include a liquid crystal display (e.g., a transmissive liquid crystal display, a transflective liquid crystal display, a reflective liquid crystal display, a direct-view liquid crystal display, or a projection type liquid crystal display) in its category; and display devices using electronic ink include electronic paper in its category.

Note that an EL element is an element including an anode, a cathode, and an EL layer interposed between the anode and the cathode. Examples of the EL layer include various types of EL layers, for example, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high molecular material, a layer including a low molecular material, and a layer including a high molecular material and a low molecular material. Note that the invention is not limited thereto, and various types of EL elements can be used.

Note that an electron emitter is an element in which electrons are extracted by high electric field concentration on a pointed cathode. For example, the electron emitter may be any one of a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin-film diode type, a diamond type, a surface conduction emitter SCD type, a thin film type in which a metal, an insulator, a semiconductor, and a metal are stacked, a HEED type, an EL type, a porous silicon type, a surface-conduction electron-emitter (SED) type, and the like. However, the invention is not limited thereto, and various elements can be used as an electron emitter.

Note that a liquid crystal element is an element which controls transmission or non-transmission of light by optical modulation action of a liquid crystal and includes a pair of electrodes and a liquid crystal. Optical modulation action of the liquid crystal is controlled by an electric filed applied to the liquid crystal (including a horizontal electric field, a vertical electric field, and an oblique electric field). The following liquid crystals can be used for a liquid crystal element: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a ferroelectric liquid crystal, an anti-ferroelectric liquid crystal, a main chain type liquid crystal, a side chain type polymer liquid crystal, a plasma addressed liquid crystal (PALC), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, and a guest-host mode. Note that the invention is not limited thereto, and various kinds of liquid crystal elements can be used.

Note that examples of electronic paper include a device displaying an image by molecules which utilizes optical anisotropy, dye molecular orientation, or the like; a device displaying an image by particles which utilizes electrophoresis, particle movement, particle rotation, phase change, or the like; a device displaying an image by moving one end of a film; a device using coloring properties or phase change of molecules; a device using optical absorption by molecules; and a device using self-light emission by combination of electrons and holes. For example, the followings can be used for electronic paper: microcapsule type electrophoresis, horizontal type electrophoresis, vertical type electrophoresis, a spherical twisting ball, a magnetic twisting ball, a column twisting ball, a charged toner, an electro liquid powder, magnetic electrophoresis, a magnetic heat-sensitive type element, an electrowetting type element, a light-scattering (transparent-opaque change) type element, a cholesteric liquid crystal and a photoconductive layer, a cholesteric liquid crystal, a bistable nematic liquid crystal, a ferroelectric liquid crystal, a liquid crystal dispersed type element with a dichroic dye, a movable film, coloring and decoloring properties of a leuco dye, photochromism, electrochromism, electrodeposition, flexible organic EL, and the like. Note that the invention is not limited thereto, and various types of electronic paper can be used. By using a microcapsule electrophoretic device, defects of the electrophoresis type, which are aggregation and precipitation of phoresis particles, can be solved. Electro liquid powder has advantages such as high-speed response, high reflectivity, wide viewing angle, low power consumption, and memory properties.

A plasma display includes a substrate having a surface provided with an electrode, and a substrate having a surface provided with an electrode and a minute groove in which a phosphor layer is formed. In the plasma display, the substrates are opposite to each other with a narrow interval, and a rare gas is sealed therein. Display can be performed by applying voltage between the electrodes to generate an ultraviolet ray so that the phosphor emits light. Note that the plasma display panel may be a DC type PDP or an AC type PDP. As a driving method of the plasma display panel, ASW (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, and the like can be used. Note that the invention is not limited thereto, and various types of plasma displays can be used.

Note that electroluminescence, a cold cathode fluorescent lamp, a hot cathode fluorescent lamp, an LED, a laser light source, a mercury lamp, or the like can be used for a light source needed for a display device, such as a liquid crystal display device (a transmissive liquid crystal display, a transflective liquid crystal display, a reflective liquid crystal display, a direct-view liquid crystal display, and a projection type liquid crystal display), a display device using a grating light valve (GLV), and a display device using a digital micromirror device (DMD). Note that the invention is not limited thereto, and various light sources can be used.

Note that a structure of a transistor can employ various modes. For example, a multi-gate structure having two or more gate electrodes may be employed. When the multi-gate structure is employed, a structure where a plurality of transistors are connected in series is provided since channel regions are connected in series. The multi-gate structure realizes reduction in off-current and improvement in reliability due to improvement in withstand voltage of the transistor. Further, by employing the multi-gate structure, drain-source current does not change much even if drain-source voltage changes when the transistor operates in a saturation region; thus, the slope of voltage-current characteristics can be flat. By utilizing the characteristics in which the slope of the voltage-current characteristics is flat, an ideal current source circuit and an active load having an extremely high resistance value can be realized. Thus, a differential circuit or a current mirror circuit having excellent properties can be realized. As another example, a structure where gate electrodes are formed above and below a channel may be employed. By employing the structure where gate electrodes are formed above and below the channel, a channel region is enlarged; thus, a subthreshold swing can be reduced because the amount of current is increased or a depletion layer is easily formed. When the gate electrodes are formed above and below the channel, it seems that a plurality of transistors are connected in parallel.

Alternatively, a structure where a gate electrode is formed above a channel region, a structure where a gate electrode is formed below a channel region, a staggered structure, or an inversely staggered structure may be employed. Further, a structure where a channel region is divided into a plurality of regions, or a structure where a plurality of channel regions are connected in parallel or in series may be employed. Moreover, a structure where a source electrode or a drain electrode overlaps with a channel region (or part thereof) may be employed. By employing the structure where the source electrode or the drain electrode overlaps with the channel region (or part thereof), an unstable operation due to accumulation of charge in part of the channel region can be prevented. Alternatively, an LDD region may be provided. By providing the LDD region, off-current can be reduced, or reliability can be improved by improvement in withstand voltage of the transistor. Further, by providing the LDD region, drain-source current does not change much even if drain-source voltage changes when the transistor operates in the saturation region, so that characteristics where a slope of voltage-current characteristics is flat can be obtained.

Note that various types of transistors can be used, and the transistor can be formed using various types of substrates. Accordingly, all of circuits which are necessary to realize a predetermined function can be formed using the same substrate. For example, all of the circuits which are necessary to realize the predetermined function can be formed using various substrates such as a glass substrate, a plastic substrate, a single crystalline substrate, or an SOI substrate. When all of the circuits which are necessary to realize the predetermined function are formed using the same substrate, cost can be reduced by reduction in the number of component parts or reliability can be improved by reduction in the number of connections between circuit components. Alternatively, part of the circuits which is necessary to realize the predetermined function may be formed using one substrate and another part of the circuits which is necessary to realize the predetermined function may be formed using another substrate. That is, not all of the circuits which are necessary to realize the predetermined function are required to be formed using the same substrate. For example, part of the circuits which is necessary to realize the predetermined function may be formed over a glass substrate by using transistors and another part of the circuits which is necessary to realize the predetermined function may be formed using a single crystalline substrate, and an IC chip formed by a transistor using the single crystalline substrate may be connected to the glass substrate by COG (chip on glass) so that the IC chip is provided over the glass substrate. Alternatively, the IC chip may be connected to the glass substrate by TAB (tape automated bonding) or a printed wiring board. When part of the circuits is formed using the same substrate in such a manner, cost can be reduced by reduction in the number of component parts or reliability can be improved by reduction in the number of connections between circuit components. In addition, circuits in a portion with high driving voltage or a portion with high driving frequency consume large power. Accordingly, the circuits in such portions are formed using a single crystalline substrate, for example, instead of using the same substrate, and an IC chip formed by the circuit is used; thus, increase in power consumption can be prevented.

Note that one pixel corresponds to one element whose brightness can be controlled. For example, one pixel corresponds to one color element, and brightness is expressed with one color element. Accordingly, in the case of a color display device having color elements of R (red), G (green), and B (blue), the smallest unit of an image is formed of three pixels of an R pixel, a G pixel, and a B pixel. Note that the color elements are not limited to three colors, and color elements of more than three colors may be used and/or a color other than RGB may be used. For example, RGBW can be employed by adding W (white). Alternatively, RGB added with one or more colors of yellow, cyan, magenta, emerald green, vermilion, and the like may be used. Further alternatively, a color similar to at least one of R, G, and B may be added to RGB. For example, R, G, B1, and B2 may be used. Although both B1 and B2 are blue, they have slightly different frequencies. Similarly, R1, R2, G and B may be used. By using such color elements, display which is closer to a real object can be performed, and power consumption can be reduced. As another example, when brightness of one color element is controlled by using a plurality of regions, one region may correspond to one pixel. For example, when area ratio gray scale display is performed or a subpixel is included, a plurality of regions which control brightness are provided in one color element and gray scales are expressed with all of the regions, and one region which controls brightness may correspond to one pixel. In that case, one color element is formed of a plurality of pixels. Alternatively, even when a plurality of the regions which control brightness are provided in one color element, these regions may be collected and one color element may be referred to as one pixel. In that case, one color element is formed of one pixel. In addition, when brightness of one color element is controlled by a plurality of regions, regions which contribute to display may have different area dimensions depending on pixels in some cases. Alternatively, in a plurality of the regions which control brightness in one color element, signals supplied to respective regions may slightly vary to widen a viewing angle. That is, potentials of pixel electrodes included in the plurality of the regions in one color element may be different from each other. Accordingly, voltages applied to liquid crystal molecules vary depending on the pixel electrodes. Thus, the viewing angle can be widened.

Note that when it is explicitly described as one pixel (for three colors), it corresponds to the case where three pixels of R, G and B are considered as one pixel. When it is explicitly described as one pixel (for one color), it corresponds to the case where a plurality of the regions provided in each color element are collectively considered as one pixel.

Note that pixels are provided (arranged) in matrix in some cases. Here, description that pixels are provided (arranged) in matrix includes the case where the pixels are arranged in a straight line or in a jagged line in a longitudinal direction or a lateral direction. For example, when full-color display is performed with three color elements (e.g., RGB), the following cases are included therein: the case where the pixels are arranged in stripes, the case where dots of the three color elements are arranged in a delta pattern, and the case where dots of the three color elements are provided in Bayer arrangement. Note that the color elements are not limited to three colors, and color elements of more than three colors may be employed, for example, RGBW (W corresponds to white) or RGB added with one or more of yellow, cyan, magenta, and the like. In addition, the size of display regions may vary in respective dots of color elements. Thus, power consumption can be reduced or the life of a display element can be prolonged.

Note that an active matrix method in which an active element is included in a pixel or a passive matrix method in which an active element is not included in a pixel can be used.

In the active matrix method, as an active element (a non-linear element), various active elements (non-linear elements), such as a metal-insulator-metal (MIM) and a thin film diode (TFD) can be used as well as a transistor. Since such an element has a small number of manufacturing steps, manufacturing cost can be reduced or the yield can be improved. Further, since the size of the element is small, an aperture ratio can be increased, and reduction in power consumption and high luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Further, since an active element (a non-linear element) is not used, an aperture ratio can be increased, and reduction in power consumption and high luminance can be achieved.

Note that a transistor is an element having at least three terminals of a gate, a drain, and a source. The transistor includes a channel region between a drain region and a source region, and current can flow through the drain region, the channel region, and the source region. Here, since the source and the drain of the transistor may change depending on a structure, operating conditions, and the like of the transistor, it is difficult to define which is a source or a drain. Therefore, in this document (the specification, the claims, the drawings, and the like), a region functioning as a source and a drain is not called the source or the drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be referred to as a drain region.

In addition, a transistor may be an element having at least three terminals of a base, an emitter, and a collector. In this case also, one of the emitter and the collector may be referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to part of a conductive film which overlaps with a semiconductor forming a channel region with a gate insulating film interposed therebetween. Note that in some cases, part of the gate electrode overlaps with an LDD (lightly doped drain) region or a source region (or a drain region) with the gate insulating film interposed therebetween. A gate wiring corresponds to a wiring for connecting gate electrodes of transistors, a wiring for connecting gate electrodes included in pixels, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, when a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

Note that a portion (a region, a conductive film, a wiring, or the like) which is formed of the same material as a gate electrode and forms the same island as the gate electrode to be connected to the gate electrode may also be called a gate electrode. Similarly, a portion (a region, a conductive film, a wiring, or the like) which is formed of the same material as a gate wiring and forms the same island as the gate wiring to be connected to the gate wiring may also be called a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed of the same material as a gate electrode or a gate wiring and forms the same island as the gate electrode or the gate wiring to be connected to the gate electrode or the gate wiring in relation to a specification in manufacturing and the like. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrode. Since such a portion (a region, a conductive film, a wiring, or the like) is for connecting the gate electrode and another gate electrode, it may be called a gate wiring, and it may also be called a gate electrode since a multi-gate transistor can be considered as one transistor. That is, a portion (a region, a conductive film, a wiring, or the like) which is formed of the same material as a gate electrode or a gate wiring and forms the same island as the gate electrode or the gate wiring to be connected to the gate electrode or the gate wiring may be called either a gate electrode or a gate wiring. In addition, part of a conductive film which connects the gate electrode and the gate wiring and is formed of a material different from that of the gate electrode or the gate wiring may also be called either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

When a wiring is called a gate wiring, a gate line, a gate signal line, a scan line, a scan signal line, or the like, there is the case where a gate of a transistor is not connected to the wiring. In this case, the gate wiring, the gate line, the gate signal line, the scan line, or the scan signal line corresponds to a wiring formed in the same layer as the gate of the transistor, a wiring formed of the same material as the gate of the transistor, or a wiring formed at the same time as the gate of the transistor in some cases. Examples of such a wiring include a wiring for storage capacitance, a power supply line, and a reference potential supply line.

A source corresponds to all or part of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, a so-called LDD (lightly doped drain) region is not included in the source region. A source electrode is part of a conductive layer formed of a material different from that of a source region and electrically connected to the source region. However, there is the case where a source electrode and a source region are collectively called a source electrode. A source wiring corresponds to a wiring for connecting source electrodes of transistors, a wiring for connecting source electrodes included in pixels, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, when a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

Note that a portion (a region, a conductive film, a wiring, or the like) which is formed of the same material as a source electrode and forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a region which is formed of the same material as a source wiring and forms the same island as the source wiring to be connected to the source wiring may also be called a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed of the same material as a source electrode or a source wiring and forms the same island as the source electrode or the source wiring to be connected to the source electrode or the source wiring in relation to a specification in manufacturing and the like. Thus, such a portion (a region, a conductive film, a wiring, or the like) may also be called either a source electrode or a source wiring.

For example, part of a conductive film which connects a source electrode and a source wiring and is formed of a material which is different from that of the source electrode or the source wiring may be called either a source electrode or a source wiring.

Note that a source terminal corresponds to part of a source region, a source electrode, or a portion (a region, a conductive film, a wiring, or the like) which is electrically connected to the source electrode.

When a wiring is called a source wiring, a source line, a source signal line, a data line, a data signal line, or the like, there is the case where a source (a drain) of a transistor is not connected to the wiring. In this case, the source wiring, the source line, the source signal line, the data line, or the data signal line corresponds to a wiring formed in the same layer as the source (the drain) of the transistor, a wiring formed of the same material as the source (the drain) of the transistor, or a wiring formed at the same time as the source (the drain) of the transistor in some cases. Examples of such a wiring include a wiring for storage capacitance, a power supply line, and a reference potential supply line.

Note that a drain is similar to the source.

Note that a semiconductor device corresponds to a device having a circuit including a semiconductor element (e.g., a transistor, a diode, or a thyristor). The semiconductor device may also refer to all devices which can function by utilizing semiconductor characteristics. Alternatively, the semiconductor device refers to a device including a semiconductor material.

A display element corresponds to an optical modulation element, a liquid crystal element, a light-emitting element, an EL element (an organic EL element, an inorganic EL element, or an EL element including both organic and inorganic materials), an electron emitter, an electrophoresis element, a discharging element, a light-reflecting element, a light diffraction element, a digital micromirror device (DMD), or the like. Note that the present invention is not limited thereto.

A display device corresponds to a device including a display element. The display device may include a plurality of pixels having a display element. The display device may include a peripheral driver circuit for driving a plurality of pixels. The peripheral driver circuit for driving a plurality of pixels may be formed over the same substrate as the plurality of pixels. The display device may also include a peripheral driver circuit provided over a substrate by wire bonding or bump bonding, that is, an IC chip connected by so-called chip on glass (COG), TAB, or the like. Further, the display device may also include a flexible printed circuit (FPC) to which an IC chip, a resistor, a capacitor, an inductor, a transistor, or the like is attached. The display device may also include a printed wiring board (PWB) which is connected through a flexible printed circuit (FPC) and the like and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, an optical sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling type or an air cooling type), or the like.

A lighting device corresponds to a device including a backlight unit, a light guide plate, a prism sheet, a diffusion sheet, a reflective sheet, a light source (e.g., an LED, a cold cathode fluorescent lamp, or a hot cathode fluorescent lamp), a cooling device, or the like.

A light-emitting device corresponds to a device including a light-emitting element or the like. A light-emitting device including a light-emitting element as a display element is a specific example of a display device.

A reflective device corresponds to a device including a light-reflecting element, a light diffraction element, a light reflecting electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like in its category.

A driving device corresponds to a device including a semiconductor element, an electric circuit, or an electronic circuit. Examples of the driving device include a transistor (also referred to as a selection transistor, a switching transistor, or the like) which controls input of a signal from a source signal line to a pixel, a transistor which supplies voltage or current to a pixel electrode, and a transistor which supplies voltage or current to a light-emitting element. Moreover, examples of the driving device include a circuit (also referred to as a gate driver, a gate line driver circuit, or the like) which supplies a signal to a gate signal line, and a circuit (also referred to as a source driver, a source line driver circuit, or the like) which supplies a signal to a source signal line.

Note that categories of a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

When it is explicitly described that B is formed on or over A, it does not necessarily mean that B is formed in direct contact with A. The description includes the case where A and B are not in direct contact with each other, that is, the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

Similarly, when it is explicitly described that B is formed above A, it does not necessarily mean that B is in direct contact with A, and another object may be interposed between A and B. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

When it is explicitly described that B is formed in direct contact with A, it includes the case where B is formed in direct contact with A and does not include the case where another object is interposed between A and B.

Note that the same can be said when it is explicitly described that B is formed below or under A.

Note that explicit singular forms are preferably singular forms. However, without being limited thereto, such singular forms can include plural forms. Similarly, explicit plural forms are preferably plural forms. However, without being limited thereto, such plural forms can include singular forms.

A frame rate of input image data can be converted into a variety of display frame rates, so that optimal display frame rate and driving method can be selected depending on circumstances. Accordingly, a display device with improved image quality and a driving method thereof can be obtained.

In addition, when a display frame rate is made larger than a frame rate of input image data or pseudo impulse driving is performed, for example, a display device without the problem of motion blur and a driving method thereof can be obtained. When a cycle of change in brightness is shortened or the amount of change is reduced, for example, a display device without flickers and a driving method thereof can be obtained. Further, particularly in a liquid crystal display device, when an optimal liquid crystal mode is selected, for example, a display device with wider viewing angles and a driving method thereof can be obtained. Moreover, particularly in a liquid crystal display device, when voltage whose level is larger than original voltage is temporarily applied to the device, for example, a display device with higher response speed and a driving method thereof can be obtained. By a variety of methods, for example, when brightness is suppressed or driving frequency is reduced, a display device with reduced power consumption in addition to the above-described effects and a driving method thereof can be obtained. Further, by a variety of methods, for example, when a circuit for which high driving frequency is not necessary is used or a manufacturing process is simplified, a display device with reduced manufacturing cost and a driving method thereof can be obtained.

BRIEF DESCRIPTION OF THE DRAWINGS

FIGS. 20A to 20E each illustrate one mode of a display device of the invention.

FIGS. 49A and 49B each are a cross-sectional view of a display device according to the invention.

FIGS. 76A and 76B each are a timing chart of a display device according to the invention.

DETAILED DESCRIPTION OF THE INVENTION

Figure 1A:
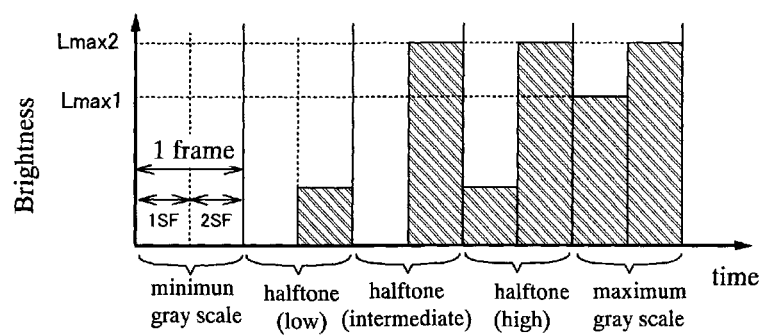
FIGS. 1A and 1B each illustrate one mode of a display device of the invention.

Hereinafter, embodiment modes of the present invention will be described with reference to drawings. However, the present invention can be implemented in various modes, and it is easily understood by those skilled in the art that modes and details can be variously changed without departing from the scope and the spirit of the present invention. Therefore, the present invention is not construed as being limited to description of the embodiment modes.

Embodiment Mode 1

In this embodiment mode, an example of a method for improving quality of images displayed on a display device is described.

In this embodiment mode, a frame rate (the number of frames per second, unit: Hz, also referred to as input frame rate) of image data to be input does not necessarily correspond to a frame rate of display (also referred to as a display frame rate). When an input frame rate and a display frame rate are different from each other, the input frame rate can be converted by a circuit which converts a frame rate of image data (a frame rate conversion circuit) so that the input frame rate corresponds to the display frame rate. In such a manner, even when the input frame rate and the display frame rate are different from each other, display can be performed at a variety of display frame rates.

When the input frame rate is higher than the display frame rate, part of the image data to be input is discarded and the input frame rate is converted so that display is performed at a variety of display frame rates. In this case, the display frame rate can be reduced; thus, operating frequency of a driver circuit used for display can be reduced, and power consumption can be reduced. On the other hand, when the input frame rate is lower than the display frame rate, display can be performed at a variety of converted display frame rates by a method such as a method in which all or part of the image data to be input is displayed more than once, a method in which another image is generated from the image data to be input, or a method in which an image having no relation to the image data to be input is generated. In this case, quality of moving images can be improved by the display frame rate being increased.

In this embodiment mode, a frame rate conversion method in the case where the input frame rate is lower than the display frame rate is described in detail. Note that a frame rate conversion method in the case where the input frame rate is higher than the display frame rate can be realized by performance of the frame rate conversion method in the case where the input frame rate is lower than the display frame rate in reverse order.

In this embodiment mode, an image displayed at the same frame rate as the input frame rate is referred to as a basic image. An image which is displayed at a frame rate different from that of the basic image and displayed to ensure that the input frame rate and the display frame rate are consistent to each other is referred to as an interpolation image. As the basic image, the same image as that of the image data to be input can be used. As the interpolation image, the same image as the basic image can be used. Further, an image different from the basic image can be generated, and the generated image can be used as the interpolation image.

In order to generate the interpolation image, the following methods can be used, for example: a method in which temporal change (movement of images) of the image data to be input is detected and an image in an intermediate state between the images is employed as the interpolation image, a method in which an image obtained by multiplication of luminance of the basic image by a coefficient is employed as the interpolation image, and a method in which a plurality of different images are generated from the image data to be input and the plurality of images are continuously displayed (one of the plurality of images is employed as the basic image and the other images are employed as interpolation images) so as to allow a viewer to perceive an image corresponding to the image data to be input. Examples of the method in which a plurality of different images are generated from the image data to be input include a method in which a gamma value of the image data to be input is converted and a method in which a gray scale value included in the image data to be input is divided up.

Note that an image in an intermediate state (an intermediate image) refers to an image obtained by detection of temporal change (movement of images) of the image data to be input and interpolation of the detected movement. Obtaining an intermediate image by such a method is referred to as motion compensation.

Next, a specific example of a frame rate conversion method is described. With this method, frame rate conversion multiplied by a given rational number (n/m) can be realized. Here, each of n and m is an integer equal to or more than 1. A frame rate conversion method in this embodiment mode can be treated as being divided into a first step and a second step. The first step is a step in which a frame rate is converted by being multiplied by the given rational number (n/m). As the interpolation image, the basic image or the intermediate image obtained by motion compensation may be used. The second step is a step in which a plurality of different images (sub-images) are generated from the image data to be input or from images each of which frame rate is converted in the first step and the plurality of sub-images are continuously displayed. By use of a method of the second step, human eyes can be made to perceive display such that the display appears to be an original image, despite the fact that a plurality of different images are displayed.

Note that in the frame rate conversion method in this embodiment mode, both the first and second steps can be used, the second step only can be used with the first step omitted, or the first step only can be used with the second step omitted.

Figure 13:
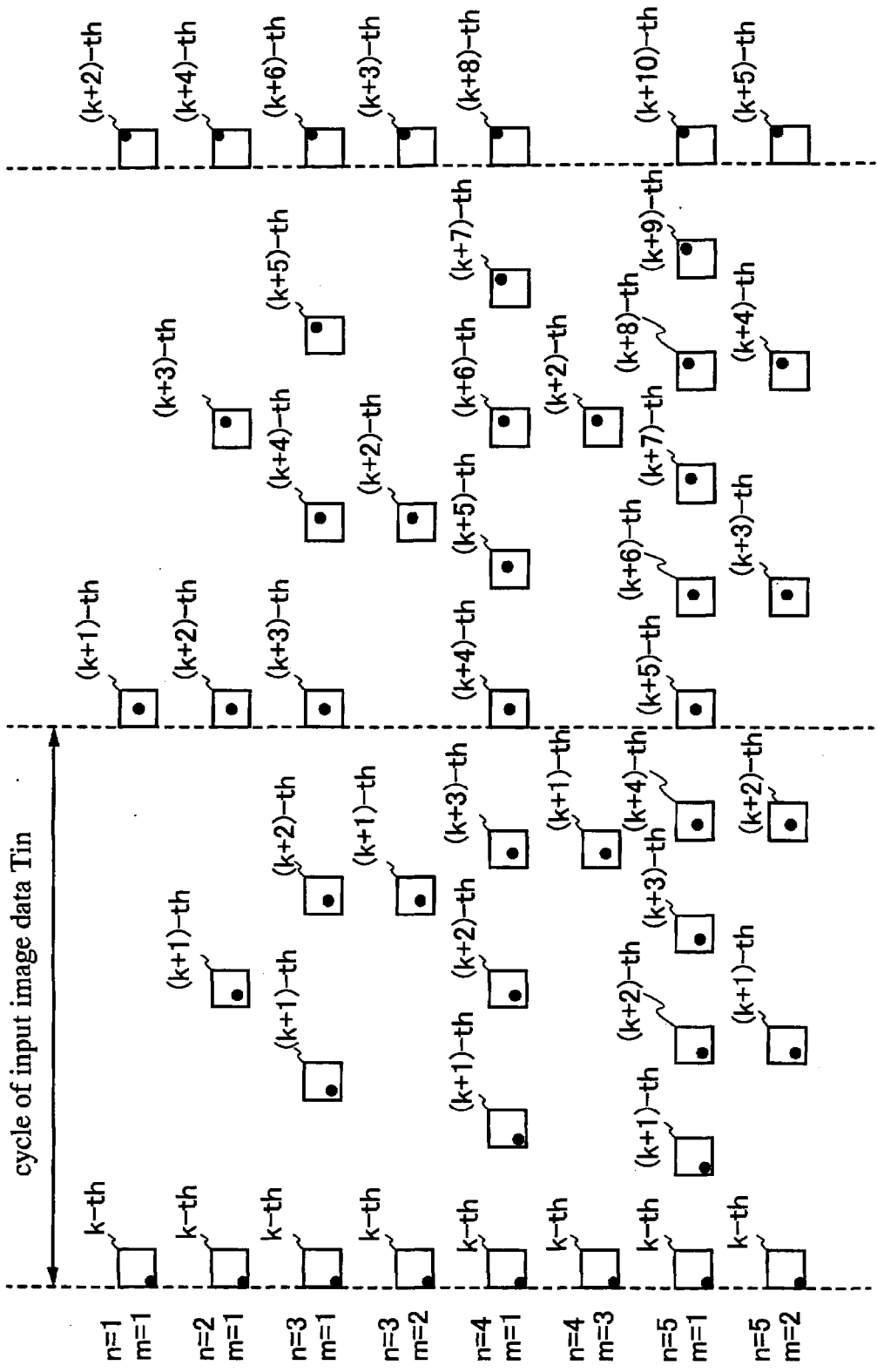
FIG. 13 illustrates one mode of a display device of the invention.

First, as the first step, frame rate conversion multiplied by the given rational number (n/m) is described with reference to FIG. 13. In FIG. 13, the horizontal axis represents time, and the vertical axis represents cases for various combinations of n and m. Each pattern in FIG. 13 is a schematic diagram of an image to be displayed, and a horizontal position of the pattern represents timing of display. A dot in the pattern schematically represents movement of an image. Note that each of these images is an example for explanation, and an image to be displayed is not limited to one of these images. This method can be applied to a variety of images.

The period $T_{in}$ represents a cycle of input image data. The cycle of input image data corresponds to an input frame rate. For example, when the input frame rate is 60 Hz, the cycle of input image data is 1/60 seconds. Similarly, when the input frame rate is 50 Hz, the cycle of input image data is 1/50 seconds. Accordingly, the cycle (unit: second) of input image data is an inverse number of the input frame rate (unit: Hz). Note that a variety of input frame rates such as 24 Hz, 50 Hz, 60 Hz, 70 Hz, 48 Hz, 100 Hz, 120 Hz, and 140 Hz can be used. 24 Hz is a frame rate for movies on film, for example. 50 Hz is a frame rate for a video signal of the PAL standard, for example. 60 Hz is a frame rate for a video signal of the NTSC standard, for example. 70 Hz is a frame rate of a display input signal of a personal computer, for example. 48 Hz, 100 Hz, 120 Hz, and 140 Hz are twice as high as 24 Hz, 50 Hz, 60 Hz, and 70 Hz, respectively. Note that the frame rate can not only be doubled but also multiplied by a variety of numbers. As described above, with the method shown in this embodiment mode, a frame rate can be converted with respect to an input signal of various standards.

Procedures of frame rate conversion multiplied by the given rational number (n/m) times in the first step are as follows. As a procedure 1, display timing of a k-th interpolation image (k is an integer equal to or more than 1, where the initial value is 1) with respect to a first basic image is decided. The display timing of the k-th interpolation image is at the timing of passage of a period obtained by multiplication of the cycle of input image data by k(m/n) after the first basic image is displayed. As a procedure 2, whether the coefficient k(m/n) used for deciding the display timing of the k-th interpolation image is an integer or not is determined. When the coefficient k is an integer, a (k(m/n)+1)th basic image is displayed at the display timing of the k-th interpolation image, and the first step is finished. When the coefficient k is not an integer, the operation proceeds to a procedure 3. As the procedure 3, an image used as the k-th interpolation image is decided. Specifically, the coefficient k(m/n) used for deciding the display timing of the k-th interpolation image is converted into the form x+y/n. Each of x and y is an integer, and y is smaller than n. When an intermediate image obtained by motion compensation is employed as the k-th interpolation image, an intermediate image which is an image corresponding to movement obtained by multiplication of the amount of movement from an (x+1)th basic image to an (x+2)th basic image by (y/n) is employed as the k-th interpolation image. When the k-th interpolation image is the same image as the basic image, the (x+1)th basic image can be used. Note that a method for obtaining an intermediate image as an image corresponding to movement obtained by multiplication of the amount of movement of the image by (y/n) will be described in detail later. As a procedure 4, a next interpolation image is set to be the objective interpolation image. Specifically, the value of k is increased by one, and the operation returns to the procedure 1.

Next, the procedures in the first step are described in detail using specific values of n and m.

Note that a mechanism for performing the procedures in the first step may be mounted on a device or decided in the design phase of the device in advance. When the mechanism for performing the procedures in the first step is mounted on the device, a driving method can be switched so that optimal operations depending on circumstances can be performed. Note that the circumstances here include contents of image data, environment inside and outside the device (e.g., temperature, humidity, barometric pressure, light, sound, electric field, the amount of radiation, altitude, acceleration, or movement speed), user settings, software version, and the like. On the other hand, when the mechanism for performing the procedures in the first step is decided in the design phase of the device in advance, driver circuits optimal for respective driving methods can be used. Moreover, since the mechanism is decided, manufacturing cost can be reduced due to efficiency of mass production.

When n=1 and m=1, that is, when a conversion ratio (n/m) is 1 (where n=1 and m=1 in FIG. 13), an operation in the first step is as follows. When k=1, in the procedure 1, display timing of a first interpolation image with respect to the first basic image is decided. The display timing of the first interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the first interpolation image is an integer or not is determined. Here, the coefficient k(m/n) is 1, which is an integer. Consequently, the (k(m/n)+1)th basic image, that is, a second basic image is displayed at the display timing of the first interpolation image, and the first step is finished.

In other words, when the conversion ratio is 1, the k-th image is a basic image, the (k+1)th image is a basic image, and an image display cycle is equal to the cycle of input image data.

Specifically, in a driving method of a display device in which, when the conversion ratio is 1 (n/m=1), i-th image data (i is a positive integer) and (i+1)th image data are sequentially input as input image data in a certain cycle and the k-th image (k is a positive integer) and the (k+1)th image are sequentially displayed at an interval equal to the cycle of the input image data, the k-th image is displayed in accordance with the i-th image data, and the (k+1)th image is displayed in accordance with the (i+1)th image data.

Since the frame rate conversion circuit can be omitted when the conversion ratio is 1, manufacturing cost can be reduced. Further, when the conversion ratio is 1, quality of moving images can be improved compared with the case where the conversion ratio is less than 1. Moreover, when the conversion ratio is 1, power consumption and manufacturing cost can be reduced compared with the case where the conversion ratio is more than 1.

When n=2 and m=1, that is, when the conversion ratio (n/m) is 2 (where n=2 and m=1 in FIG. 13), an operation in the first step is as follows. When k=1, in the procedure 1, display timing of the first interpolation image with respect to the first basic image is decided. The display timing of the first interpolation image is at the timing of passage of a period obtained by multiplication of the length of the cycle of input image data by k(m/n), that is, 1/2 after the first basic image is displayed.

Next, in the procedure 2, whether the coefficient k(m/n) used for deciding the display timing of the first interpolation image is an integer or not is determined. Here, the coefficient k(m/n) is 1/2, which is not an integer. Consequently, the operation proceeds to the procedure 3.

In the procedure 3, an image used as the first interpolation image is decided. In order to decide the image, the coefficient 1/2 is converted into the form x+y/n. In the case of the coefficient 1/2, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, 1/2 is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to a second interpolation image. That is, k is changed from 1 to 2, and the operation returns to the procedure 1.

When k=2, in the procedure 1, display timing of the second interpolation image with respect to the first basic image is decided. The display timing of the second interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the second interpolation image is an integer or not is determined. Here, the coefficient k(m/n) is 1, which is an integer. Consequently, the (k(m/n)+1)th basic image, that is, the second basic image is displayed at the display timing of the second interpolation image, and the first step is finished.

In other words, when the conversion ratio is 2 (n/m=2), the k-th image is a basic image, the (k+1)th image is an interpolation image, a (k+2)th image is a basic image, and an image display cycle is half the cycle of input image data.

Specifically, in a driving method of a display device in which, when the conversion ratio is 2 (n/m=2), the i-th image data (i is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/2, and the (k+2)th image is displayed in accordance with the (i+1)th image data.

Even specifically, in a driving method of a display device in which, when the conversion ratio is 2 (n/m=2), the i-th image data (i is a positive integer) and the (i+1)th image data are sequentially input as input image data in a certain cycle and the k-th image (k is a positive integer), the (k+1)th image, and the (k+2)th image are sequentially displayed at an interval which is half the cycle of the input image data, the k-th image is displayed in accordance with the i-th image data, the (k+1)th image is displayed in accordance with the i-th image data, and the (k+2)th image is displayed in accordance with the (i+1)th image data.

Specifically, when the conversion ratio is 2, driving is also referred to as double-frame rate driving. For example, when the input frame rate is 60 Hz, the display frame rate is 120 Hz (120 Hz driving). Accordingly, two images are continuously displayed with respect to one input image. At this time, when an interpolation image is an intermediate image obtained by motion compensation, the movement of moving images can be made to be smooth; thus, quality of the moving image can be significantly improved. Further, quality of moving images can be significantly improved particularly when the display device is an active matrix liquid crystal display device. This is related to a problem of lack of writing voltage due to change in the electrostatic capacity of a liquid crystal element by applied voltage, so-called dynamic capacitance. That is, when the display frame rate is made higher than the input frame rate, the frequency of a writing operation of image data can be increased; thus, defects such as an afterimage and a phenomenon of a moving image in which traces are seen due to lack of writing voltage because of dynamic capacitance can be reduced. Moreover, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes.

When n=3 and m=1, that is, when the conversion ratio (n/m) is 3 (where n=3 and m=1 in FIG. 13), an operation in the first step is as follows. First, when k=1, in the procedure 1, display timing of the first interpolation image with respect to the first basic image is decided. The display timing of the first interpolation image is at the timing of passage of a period obtained by multiplication of the length of the cycle of input image data by k(m/n), that is, 1/3 after the first basic image is displayed.

Next, in the procedure 2, whether the coefficient k(m/n) used for deciding the display timing of the first interpolation image is an integer or not is determined. Here, the coefficient k(m/n) is 1/3, which is not an integer. Consequently, the operation proceeds to the procedure 3.

In the procedure 3, an image used as the first interpolation image is decided. In order to decide the image, the coefficient 1/3 is converted into the form x+y/n. In the case of the coefficient 1/3, x=0 and y=1. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, 1/3 is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to the second interpolation image. That is, k is changed from 1 to 2, and the operation returns to the procedure 1.

When k=2, in the procedure 1, display timing of the second interpolation image with respect to the first basic image is decided. The display timing of the second interpolation image is at the timing of passage of a period obtained by multiplication of the length of the cycle of input image data by k(m/n), that is, 2/3 after the first basic image is displayed.

Next, in the procedure 2, whether the coefficient k(m/n) used for deciding the display timing of the second interpolation image is an integer or not is determined. Here, the coefficient k(m/n) is 2/3, which is not an integer. Consequently, the operation proceeds to the procedure 3.

In the procedure 3, an image used as the second interpolation image is decided. In order to decide the image, the coefficient 2/3 is converted into the form x+y/n. In the case of the coefficient 2/3, x=0 and y=2. When an intermediate image obtained by motion compensation is employed as the second interpolation image, an intermediate image corresponding to movement obtained by multiplication of the amount of movement from the (x+1)th basic image, that is, the first basic image to the (x+2)th basic image, that is, the second basic image by (y/n), that is, 2/3 is employed as the second interpolation image. When the second interpolation image is the same image as the basic image, the (x+1)th basic image, that is, the first basic image can be used.

According to the procedures performed up to this point, the display timing of the second interpolation image and the image displayed as the second interpolation image can be decided. Next, in the procedure 4, the objective interpolation image is shifted from the second interpolation image to a third interpolation image. That is, k is changed from 2 to 3, and the operation returns to the procedure 1.

When k=3, in the procedure 1, display timing of the third interpolation image with respect to the first basic image is decided. The display timing of the third interpolation image is at the timing of passage of a period obtained by multiplication of the length of the cycle of input image data by k(m/n), that is, 1 after the first basic image is displayed.

Next, in the procedure 2, whether the coefficient k(m/n) used for deciding the display timing of the third interpolation image is an integer or not is determined. Here, the coefficient k(m/n) is 1, which is an integer. Consequently, the (k(m/n)+

1)th basic image, that is, the second basic image is displayed at the display timing of the third interpolation image, and the first step is finished.

In other words, when the conversion ratio is 3 (n/m=3), the k-th image is a basic image, the (k+1)th image is an interpolation image, the (k+2)th image is an interpolation image, a (k+3)th image is a basic image, and an image display cycle is 1/3 times the cycle of input image data.

Specifically, in a driving method of a display device in which, when the conversion ratio is 3 (n/m=3), the i-th image data (i is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is 1/3 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/3, the (k+2)th image is displayed in accordance with image data corresponding to movement obtained by multiplication of the amount of movement from the i-th image data to the (i+1)th image data by 2/3, and the (k+3)th image is displayed in accordance with the (i+1)th image data.

Even specifically, in a driving method of a display device in which, when the conversion ratio is 3 (n/m=3), the i-th image data (i is a positive integer) and the (i+1)th image data are sequentially input as input image data in a certain cycle and the k-th image (k is a positive integer), the (k+1)th image, the (k+2)th image, and the (k+3)th image are sequentially displayed at an interval which is 1/3 times the cycle of the input image data, the k-th image is displayed in accordance with the i-th image data, the (k+1)th image is displayed in accordance with the i-th image data, the (k+2)th image is displayed in accordance with the i-th image data, and the (k+3)th image is displayed in accordance with the (i+1)th image data.

When the conversion ratio is 3, quality of moving images can be improved compared with the case where the conversion ratio is less than 3. Moreover, when the conversion ratio is 3, power consumption and manufacturing cost can be reduced compared with the case where the conversion ratio is more than 3.

Specifically, when the conversion ratio is 3, driving is also referred to as triple-frame rate driving. For example, when the input frame rate is 60 Hz, the display frame rate is 180 Hz (180 Hz driving). Accordingly, three images are continuously displayed with respect to one input image. At this time, when an interpolation image is an intermediate image obtained by motion compensation, the movement of moving images can be made to be smooth; thus, quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 45 Hz, 90 Hz, 180 Hz, or 360 Hz), flickers which appear in alternating-current driving can be reduced to a level that cannot be perceived by human eyes.

When n=3 and m=2, that is, when the conversion ratio (n/m) is 3/2 (where n=3 and m=2 in FIG. 13), an operation in the first step is as follows. When k=1, in the procedure 1, the display timing of the first interpolation image with respect to the first basic image is decided. The display timing of the first interpolation image is at the timing of passage of a period obtained by multiplication of the length of the cycle of input image data by k(m/n), that is, 2/3 after the first basic image is displayed.

Next, in the procedure 2, whether the coefficient k(m/n) used for deciding the display timing of the first interpolation image is an integer or not is determined. Here, the coefficient k(m/n) is 2/3, which is not an integer. Consequently, the operation proceeds to the procedure 3.

In the procedure 3, an image used as the first interpolation image is decided. In order to decide the image, the coefficient 2/3 is converted into the form x+y/n. In the case of the coefficient 2/3, x=0 and y=2. When an intermediate image obtained by motion compensation is employed as the first interpolation image, an intermediate image corresponding to movement obtained by multiplication of the amount of movement from the (x+1)th basic image, that is, the first basic image to the (x+2)th basic image, that is, the second basic image by (y/n), that is, 2/3 is employed as the first interpolation image. When the first interpolation image is the same image as the basic image, the (x+1)th basic image, that is, the first basic image can be used.

According to the procedures performed up to this point, the display timing of the first interpolation image and the image displayed as the first interpolation image can be decided. Next, in the procedure 4, the objective interpolation image is shifted from the first interpolation image to the second interpolation image. That is, k is changed from 1 to 2, and the operation returns to the procedure 1.

When k=2, in the procedure 1, the display timing of the second interpolation image with respect to the first basic image is decided. The display timing of the second interpolation image is at the timing of passage of a period obtained by multiplication of the length of the cycle of input image data by k(m/n), that is, 4/3 after the first basic image is displayed.

Next, in the procedure 2, whether the coefficient k(m/n) used for deciding the display timing of the second interpolation image is an integer or not is determined. Here, the coefficient k(m/n) is 4/3, which is not an integer. Consequently, the operation proceeds to the procedure 3.

In the procedure 3, an image used as the second interpolation image is decided. In order to decide the image, the coefficient 4/3 is converted into the form x+y/n. In the case of the coefficient 4/3, x=1 and y=1. When an intermediate image obtained by motion compensation is employed as the second interpolation image, an intermediate image corresponding to movement obtained by multiplication of the amount of movement from the (x+1)th basic image, that is, the second basic image to the (x+2)th basic image, that is, a third basic image by (y/n), that is, 1/3 is employed as the second interpolation image. When the second interpolation image is the same image as the basic image, the (x+1)th basic image, that is, the second basic image can be used.

According to the procedures performed up to this point, the display timing of the second interpolation image and the image displayed as the second interpolation image can be decided. Next, in the procedure 4, the objective interpolation image is shifted from the second interpolation image to the third interpolation image. That is, k is changed from 2 to 3, and the operation returns to the procedure 1.

When k=3, in the procedure 1, the display timing of the third interpolation image with respect to the first basic image is decided. The display timing of the third interpolation image is at the timing of passage of a period obtained by multiplication of the length of the cycle of input image data by k(m/n), that is, 2 after the first basic image is displayed.

Next, in the procedure 2, whether the coefficient k(m/n) used for deciding the display timing of the third interpolation image is an integer or not is determined. Here, the coefficient k(m/n) is 2, which is an integer. Consequently, the (k(m/n)+1)th basic image, that is, the third basic image is displayed at the display timing of the third interpolation image, and the first step is finished.

In other words, when the conversion ratio is 3/2 (n/m=3/2), the k-th image is a basic image, the (k+1)th image is an interpolation image, the (k+2)th image is an interpolation image, the (k+3)th image is a basic image, and an image display cycle is 2/3 times the cycle of input image data.

Specifically, in a driving method of a display device in which, when the conversion ratio is 3/2 (n/m=3/2), the i-th image data (i is a positive integer), the (i+1)th image data, and (i+2)th image data are sequentially input as input image data in a certain cycle and the k-th image (k is a positive integer), the (k+1)th image, the (k+2)th image, and the (k+3)th image are sequentially displayed at an interval which is 2/3 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 2/3, the (k+2)th image is displayed in accordance with image data corresponding to movement obtained by multiplication of the amount of movement from the (i+1)th image data to the (i+2)th image data by 1/3, and the (k+3)th image is displayed in accordance with the (i+2)th image data.

Even specifically, in a driving method of a display device in which, when the conversion ratio is 3/2 (n/m=3/2), the i-th image data (i is a positive integer), the (i+1)th image data, and the (i+2)th image data are sequentially input as input image data in a certain cycle and the k-th image (k is a positive integer), the (k+1)th image, the (k+2)th image, and the (k+3)th image are sequentially displayed at an interval which is 2/3 times the cycle of the input image data, the k-th image is displayed in accordance with the i-th image data, the (k+1)th image is displayed in accordance with the i-th image data, the (k+2)th image is displayed in accordance with the (i+1)th image data, and the (k+3)th image is displayed in accordance with the (i+2)th image data.

When the conversion ratio is 3/2, quality of moving images can be improved compared with the case where the conversion ratio is less than 3/2. Moreover, when the conversion ratio is 3/2, power consumption and manufacturing cost can be reduced compared with the case where the conversion ratio is more than 3/2.

Specifically, when the conversion ratio is 3/2, driving is also referred to as 3/2-fold frame rate driving or 1.5-fold frame rate driving. For example, when the input frame rate is 60 Hz, the display frame rate is 90 Hz (90 Hz driving). Accordingly, three images are continuously displayed with respect to two input images. At this time, when an interpolation image is an intermediate image obtained by motion compensation, the movement of moving images can be made to be smooth; thus, quality of the moving image can be significantly improved. Moreover, operating frequency of a circuit used for obtaining an intermediate image by motion compensation can be reduced, in particular, compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 90 Hz driving and alternating-current driving of a liquid crystal display device is effective. That is, when driving frequency of the liquid crystal display device is 90 Hz and frequency of alternating-current driving is an integer multiple of 90 Hz or a unit fraction of 90 Hz (e.g., 30 Hz, 45 Hz, 90 Hz, or 180 Hz), flickers which appear in alternating-current driving can be reduced to a level that cannot be perceived by human eyes.

Detailed description of procedures for positive integers n and m other than those described above is omitted. A conversion ratio can be set as a given rational number (n/m) in accordance with the procedures of frame rate conversion in the first step. Note that among combinations of the positive integers n and m, a combination in which a conversion ratio (n/m) can be reduced to its lowest term can be treated the same as a conversion ratio that is already reduced to its lowest term.

For example, when n=4 and m=1, that is, when the conversion ratio (n/m) is 4 (where n=4 and m=1 in FIG. 13), the k-th image is a basic image, the (k+1)th image is an interpolation image, the (k+2)th image is an interpolation image, the (k+3)th image is an interpolation image, a (k+4)th image is a basic image, and an image display cycle is 1/4 times the cycle of input image data.

Specifically, in a driving method of a display device in which, when the conversion ratio is 4 (n/m=4), the i-th image data (i is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is 1/4 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/4, the (k+2)th image is displayed in accordance with image data corresponding to movement obtained by multiplication of the amount of movement from the i-th image data to the (i+1)th image data by 1/2, the (k+3)th image is displayed in accordance with image data corresponding to movement obtained by multiplication of the amount of movement from the i-th image data to the (i+1)th image data by 3/4, and the (k+4)th image is displayed in accordance with the (i+1)th image data.

Even specifically, in a driving method of a display device in which, when the conversion ratio is 4 (n/m=4), the i-th image data (i is a positive integer) and the (i+1)th image data are sequentially input as input image data in a certain cycle and the k-th image (k is a positive integer), the (k+1)th image, the (k+2)th image, the (k+3)th image, and the (k+4)th image are sequentially displayed at an interval which is 1/4 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, and the (k+4)th image is displayed in accordance with the (i+1)th image data.

When the conversion ratio is 4, quality of moving images can be improved compared with the case where the conversion ratio is less than 4. Moreover, when the conversion ratio is 4, power consumption and manufacturing cost can be reduced compared with the case where the conversion ratio is more than 4.

Specifically, when the conversion ratio is 4, driving is also referred to as quadruple-frame rate driving. For example, when the input frame rate is 60 Hz, the display frame rate is 240 Hz (240 Hz driving). Accordingly, four images are continuously displayed with respect to one input image. At this time, when an interpolation image is an intermediate image obtained by motion compensation, the movement of moving images can be made to be smooth; thus, quality of the moving image can be significantly improved. Moreover, an interpolation image obtained by more accurate motion compensation can be used, in particular, compared with a driving method with low driving frequency, such as 120 Hz driving (double-frame rate driving) or 180 Hz driving (triple-frame rate driving); thus, the movement of moving images can be made smoother, and quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 40 Hz, 60 Hz, or 120 Hz), flickers which appear in alternating-current driving can be reduced to a level that cannot be perceived by human eyes.

For example, when n=4 and m=3, that is, when the conversion ratio (n/m) is 4/3 (where n=4 and m=3 in FIG. 13), the k-h image is a basic image, the (k+1)th image is an interpolation image, the (k+2)th image is an interpolation image, the (k+3)th image is an interpolation image, the (k+4)th image is a basic image, and an image display cycle is 3/4 times the cycle of input image data.

Specifically, in a driving method of a display device in which, when the conversion ratio is 4/3 (n/m=4/3), the i-th image data (i is a positive integer), the (i+1)th image data, the (i+2)th image data, and (i+3)th image data are sequentially input as input image data in a certain cycle and the k-th image (k is a positive integer), the (k+1)th image, the (k+2)th image, the (k+3)th image, and the (k+4)th image are sequentially displayed at an interval which is 3/4 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 3/4, the (k+2)th image is displayed in accordance with image data corresponding to movement obtained by multiplication of the amount of movement from the (i+1)th image data to the (i+2)th image data by 1/2, the (k+3)th image is displayed in accordance with image data corresponding to movement obtained by multiplication of the amount of movement from the (i+2)th image data to the (i+3)th image data by 1/4, and the (k+4)th image is displayed in accordance with the (i+3)th image data.

Even specifically, in a driving method of a display device in which, when the conversion ratio is 4/3 (n/m=4/3), the i-th image data (i is a positive integer), the (i+1)th image data, the (i+2)th image data, and the (i+3)th image data are sequentially input as input image data in a certain cycle and the k-th image (k is a positive integer), the (k+1)th image, the (k+2)th image, the (k+3)th image, and the (k+4)th image are sequentially displayed at an interval which is 3/4 times the cycle of the input image data, the k-th image is displayed in accordance with the i-th image data, the (k+1)th image is displayed in accordance with the i-th image data, the (k+2)th image is displayed in accordance with the (i+1)th image data, the (k+3)th image is displayed in accordance with the (i+2)th image data, and the (k+4)th image is displayed in accordance with the (i+3)th image data.

When the conversion ratio is 4/3, quality of moving images can be improved compared with the case where the conversion ratio is less than 4/3. Moreover, when the conversion ratio is 4/3, power consumption and manufacturing cost can be reduced compared with the case where the conversion ratio is more than 4/3.

Specifically, when the conversion ratio is 4/3, driving is also referred to as 4/3-fold frame rate driving or 1.25-fold frame rate driving. For example, when the input frame rate is 60 Hz, the display frame rate is 80 Hz (80 Hz driving). Accordingly, four images are continuously displayed with respect to three input images. At this time, when an interpolation image is an intermediate image obtained by motion compensation, the movement of moving images can be made to be smooth; thus, quality of the moving image can be significantly improved. Moreover, operating frequency of a circuit used for obtaining an intermediate image by motion compensation can be reduced, in particular, compared with a driving method with high driving frequency, such as 120 Hz driving (double-frame rate driving) or 180 Hz driving (triple-frame rate driving); thus, an inexpensive circuit can be used, and manufacturing cost and power consumption can be reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 80 Hz driving and alternating-current driving of a liquid crystal display device is effective. That is, when driving frequency of the liquid crystal display device is 80 Hz and frequency of alternating-current driving is an integer multiple of 80 Hz or a unit fraction of 80 Hz (e.g., 40 Hz, 80 Hz, 160 Hz, or 240 Hz), flickers which appear in alternating-current driving can be reduced to a level that cannot be perceived by human eyes.

For example, when n=5 and m=1, that is, when the conversion ratio (n/m) is 5 (where n=5 and m=1 in FIG. 13), the k-th image is a basic image, the (k+1)th image is an interpolation image, the (k+2)th image is an interpolation image, the (k+3)th image is an interpolation image, the (k+4)th image is an interpolation image, and a (k+5)th image is a basic image, and an image display cycle is 1/5 times the cycle of input image data.

Specifically, in a driving method of a display device in which, when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval which is 1/5 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 1/5, the (k+2)th image is displayed in accordance with image data corresponding to movement obtained by multiplication of the amount of movement from the i-th image data to the (i+1)th image data by 2/5, the (k+3)th image is displayed in accordance with image data corresponding to movement obtained by multiplication of the amount of movement from the i-th image data to the (i+1)th image data by 3/5, the (k+4)th image is displayed in accordance with image data corresponding to movement obtained by multiplication of the amount of movement from the i-th image data to the (i+1)th image data by 4/5, and the (k+5)th image is displayed in accordance with the (i+1)th image data.

Even specifically, in a driving method of a display device in which, when the conversion ratio is 5 (n/m=5), the i-th image data (i is a positive integer) and the (i+1)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval which is 1/5 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the i-th image data, the (k+4)th image is displayed in accordance with the i-th image data, and the (k+5)th image is displayed in accordance with the (i+1)th image data.

When the conversion ratio is 5, quality of moving images can be improved compared with the case where the conversion ratio is less than 5. Moreover, when the conversion ratio is 5, power consumption and manufacturing cost can be reduced compared with the case where the conversion ratio is more than 5.

Specifically, when the conversion ratio is 5, driving is also referred to as 5-fold frame rate driving. For example, when the input frame rate is 60 Hz, the display frame rate is 300 Hz (300 Hz driving). Accordingly, five images are continuously displayed with respect to one input image. At this time, when an interpolation image is an intermediate image obtained by motion compensation, the movement of moving images can be made to be smooth; thus, quality of the moving image can be significantly improved. Moreover, an interpolation image obtained by more accurate motion compensation can be used, in particular, compared with a driving method with low driving frequency, such as 120 Hz driving (double-frame rate driving) or 180 Hz driving (triple-frame rate driving); thus, the movement of moving images can be made smoother, and quality of the moving image can be significantly improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced to a level that cannot be perceived by human eyes.

For example, when n=5 and m=2, that is, when the conversion ratio (n/m) is 5/2 (where n=5 and m=2 in FIG. 13), the k-th image is a basic image, the (k+1)th image is an interpolation image, the (k+2)th image is an interpolation image, the (k+3)th image is an interpolation image, the (k+4)th image is an interpolation image, and the (k+5)th image is a basic image, and an image display cycle is 2/5 times the cycle of input image data.

Specifically, in a driving method of a display device in which, when the conversion ratio is 5/2 (n/m=5/2), the i-th image data (i is a positive integer), the (i+1)th image data, and the (i+2)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval which is 2/5 times the cycle of the input image data, the k-th image is displayed in accordance with the i-th image data, the (k+1)th image is displayed in accordance with image data corresponding to movement obtained by multiplication of the amount of movement from the i-th image data to the (i+1)th image data by 2/5, the (k+2)th image is displayed in accordance with image data corresponding to movement obtained by multiplication of the amount of movement from the i-th image data to the (i+1)th image data by 4/5, the (k+3)th image is displayed in accordance with image data corresponding to movement obtained by multiplication of the amount of movement from the (i+1)th image data to the (i+2)th image data by 1/5, the (k+4)th image is displayed in accordance with image data corresponding to movement obtained by multiplication of the amount of movement from the (i+1)th image data to the (i+2)th image data by 3/5, and the (k+5)th image is displayed in accordance with the (i+2)th image data.

Even specifically, in a driving method of a display device in which, when the conversion ratio is 5/2 (n/m=5/2), the i-th image data (i is a positive integer), the (i+1)th image data, and the (i+2)th image data are sequentially input as input image data in a certain cycle and the k-th image (k is a positive integer), the (k+1)th image, the (k+2)th image, the (k+3)th image, the (k+4)th image, and the (k+5)th image are sequentially displayed at an interval which is 2/5 times the cycle of the input image data, the k-th image is displayed in accordance with the i-th image data, the (k+1)th image is displayed in accordance with the i-th image data, the (k+2)th image is displayed in accordance with the i-th image data, the (k+3)th image is displayed in accordance with the (i+1)th image data, the (k+4)th image is displayed in accordance with the (i+1)th image data, and the (k+5)th image is displayed in accordance with the (i+2)th image data.

When the conversion ratio is 5/2, quality of moving images can be improved compared with the case where the conversion ratio is less than 5/2. Moreover, when the conversion ratio is 5/2, power consumption and manufacturing cost can be reduced compared with the case where the conversion ratio is more than 5/2.

Specifically, when the conversion ratio is 5/2, driving is also referred to as 5/2-fold frame rate driving or 2.5-fold frame rate driving. For example, when the input frame rate is 60 Hz, the display frame rate is 150 Hz (150 Hz driving). Accordingly, five images are continuously displayed with respect to two input images. At this time, when an interpolation image is an intermediate image obtained by motion compensation, the movement of moving images can be made to be smooth; thus, quality of the moving image can be significantly improved. Moreover, an interpolation image obtained by more accurate motion compensation can be used, in particular, compared with a driving method with low driving frequency, such as 120 Hz driving (double-frame rate driving) or 180 Hz driving (triple-frame rate driving); thus, the movement of moving images can be made smoother, and quality of the moving image can be significantly improved. Further, operating frequency of a circuit used for obtaining an intermediate image by motion compensation can be reduced, in particular, compared with a driving method with high driving frequency, such as 180 Hz driving (triple-frame rate driving); thus, an inexpensive circuit can be used, and manufacturing cost and power consumption can be reduced. Furthermore, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Moreover, a combination of 150 Hz driving and alternating-current driving of a liquid crystal display device is effective. That is, when driving frequency of the liquid crystal display device is 150 Hz and frequency of alternating-current driving is an integer multiple of 150 Hz or a unit fraction of 150 Hz (e.g., 30 Hz, 50 Hz, 75 Hz, or 150 Hz), flickers which appear in alternating-current driving can be reduced to a level that cannot be perceived by human eyes.

In this manner, by setting positive integers n and m to be a variety of numbers, the conversion ratio can be set to be a given rational number (n/m). Although detailed description is omitted, when n is 10 or less, combinations listed below can be possible: n=1 and m=1, that is, the conversion ratio is (n/m)=1 (one-times frame rate driving, 60 Hz), n=2 and m=1, that is, the conversion ratio is (n/m)=2 (double-frame rate driving, 120 Hz), n=3 and m=1, that is, the conversion ratio is (n/m)=3 (triple-frame rate driving, 180 Hz), n=3 and m=2, that is, the conversion ratio is (n/m)=3/2 (3/2-fold frame rate driving, 90 Hz), n=4 and m=1, that is, the conversion ratio is (n/m)=4 (quadruple-frame rate driving, 240 Hz), n=4 and m=3, that is, the conversion ratio is (n/m)=4/3 (4/3-fold frame rate driving, 80 Hz), n=5 and m=1, that is, the conversion ratio is (n/m)=5/1 (5-fold frame rate driving, 300 Hz), n=5 and m=2, that is, the conversion ratio is (n/m)=5/2 (5/2-fold frame rate driving, 150 Hz), n=5 and m=3, that is, the conversion ratio is (n/m)=5/3 (5/3-fold frame rate driving, 100 Hz), n=5 and m=4, that is, the conversion ratio is (n/m)=5/4 (5/4-fold frame rate driving, 75 Hz), n=6 and m=1, that is, the conversion ratio is (n/m)=6 (6-fold frame rate driving, 360 Hz), n=6 and m=5, that is, the conversion ratio is (n/m)=6/5 (6/5-fold frame rate driving, 72 Hz), n=7 and m=1, that is, the conversion ratio is (n/m)=7 (7-fold frame rate driving, 420 Hz), n=7 and m=2, that is, the conversion ratio is (n/m)=7/2 (7/2-fold frame rate driving, 210 Hz), n=7 and m=3, that is, the conversion ratio is (n/m)=7/3 (7/3-fold frame rate driving, 140 Hz), n=7 and m=4, that is, the conversion ratio is (n/m)=7/4 (7/4-fold frame rate driving, 105 Hz), n=7 and m=5, that is, the conversion ratio is (n/m)=7/5 (7/5-fold frame rate driving, 84 Hz), n=7 and m=6, that is, the conversion ratio is (n/m)= 7/6 (7/6-frame rate driving, 70 Hz), n=8 and m=1, that is, the conversion ratio is (n/m)=8 (8-fold frame rate driving, 480 Hz), n=8 and m=3, that is, the conversion ratio is (n/m)=8/3 (8/3-fold frame rate driving, 160 Hz), n=8 and m=5, that is, the conversion ratio is (n/m)=8/5 (8/5-fold frame rate driving, 96 Hz), n=8 and m=7, that is, the conversion ratio is (n/m)= 8/7 (8/7-fold frame rate driving, 68.6 Hz), n=9 and m=1, that is, the conversion ratio is (n/m)=9 (9-fold frame rate driving, 540 Hz), n=9 and m=2, that is, the conversion ratio is (n/m)= 9/2 (9/2-fold frame rate driving, 270 Hz), n=9 and m=4, that is, the conversion ratio is (n/m)=9/4 (9/4-fold frame rate driving, 135 Hz), n=9 and m=5, that is, the conversion ratio is (n/m)=9/5 (9/5-fold frame rate driving, 108 Hz), n=9 and m=7, that is, the conversion ratio is (n/m)=9/7 (9/7-frame rate driving, 77.1 Hz), n=9 and m=8, that is, the conversion ratio is (n/m)=9/8 (9/8-fold frame rate driving, 67.5 Hz), n=10 and m=1, that is, the conversion ratio is (n/m)=10 (10-fold frame rate driving, 600 Hz), n=10 and m=3, that is, the conversion ratio is (n/m)=10/3 (10/3-fold frame rate driving, 200 Hz), n=10 and m=7, that is, the conversion ratio is (n/m)=10/7 (10/7-fold frame rate driving, 85.7 Hz), and n=10 and m=9, that is, the conversion ratio is (n/m)=10/9 (10/9-fold frame rate driving, 66.7 Hz). Note that these frequencies are examples in the case where the input frame rate is 60 Hz. With regard to other frame rates, the driving frequency is obtained by multiplication of the each conversion ratio by the input frame rate.

In the case where n is an integer more than 10, although specific numbers for n and m are not stated here, the procedure of frame rate conversion in the first step can be obviously applied to a variety of n and m.

Depending on how many images which can be displayed without motion compensation to the input image data are included in images to be displayed, the conversion ratio can be determined. Specifically, the smaller m becomes, the higher the proportion of images which can be displayed without motion compensation to the input image data becomes. When motion compensation is performed less frequently, power consumption can be reduced because a circuit which performs motion compensation operates less frequently. Further, the likelihood of generation of an image including an error by motion compensation (an intermediate image which does not correctly reflect motion of an image) can be decreased, so that image quality can be improved. In the case where n is 10 or less, examples of such a conversion ratio include 1, 2, 3, 3/2, 4, 5, 5/2, 6, 7, 7/2, 8, 9, 9/2, and 10. By employing such a conversion ratio, especially when an intermediate image obtained by motion compensation is used as an interpolation image, the image quality can be improved and power consumption can be reduced. This is because the number (half the total number of images input) of images which can be displayed without motion compensation to the input image data is comparatively large, and motion compensation is performed less frequently in the case where m is 2; and because the number (equal to the total number of images input) of images which can be displayed without motion compensation to the input image data is large, and motion compensation cannot be performed in the case where m is 1. On the other hand, the larger m becomes, the smoother motion of images can be made because an intermediate image which is generated by motion compensation with high accuracy is used.

Note that when a display device is a liquid crystal display device, the conversion ratio can be determined in accordance with a response time of a liquid crystal element. Here, the response time of the liquid crystal element is the time from when voltage applied to the liquid crystal element is changed until when the liquid crystal element responds. When the response time of the liquid crystal element differs depending on the amount of change of the voltage applied to the liquid crystal element, an average of the response times of plural typical voltage changes can be used. Alternatively, the response time of the liquid crystal element can be defined as MRPT (moving picture response time). Then, by frame rate conversion, the conversion ratio can be determined so that the length of the image display cycle can be near the response time of the liquid crystal element. Specifically, the response time of the liquid crystal element is preferably the time from the value obtained by multiplication of the cycle of input image data and the inverse number of the conversion ratio, to approximately half that value. In this manner, the image display cycle can be made to correspond to the response time of the liquid crystal element, so that the image quality is improved. For example, when the response time of the liquid crystal element is more than or equal to 4 milliseconds and less than or equal to 8 milliseconds, double-frame rate driving (120 Hz driving) can be employed. This is because the image display cycle of 120 Hz driving is approximately 8 milliseconds, and the half of the image display cycle of 120 Hz driving is approximately 4 milliseconds. Similarly, for example, when the response time of the liquid crystal element is more than or equal to 3 milliseconds and less than or equal to 6 milliseconds, triple-frame rate driving (180 Hz driving) can be employed; when the response time of the liquid crystal element is more than or equal to 5 milliseconds and less than or equal to 11 milliseconds, 1.5-fold frame rate driving (90 Hz driving) can be employed; when the response time of the liquid crystal element is more than or equal to 2 milliseconds and less than or equal to 4 milliseconds, quadruple-frame rate driving (240 Hz driving) can be employed; and when the response time of the liquid crystal element is more than or equal to 6 milliseconds and less than or equal to 12 milliseconds, 1.25-fold frame rate driving (80 Hz driving) can be employed. Note that this is similar to the case of other driving frequencies.

Note that the conversion ratio can also be determined by a tradeoff between the quality of the moving image, and power consumption and manufacturing cost. That is, the quality of the moving image can be improved by increasing the conversion ratio while power consumption and manufacturing cost can be reduced by decreasing the conversion ratio. Therefore, when n is 10 or less, each conversion ratio has an advantage described below.

When the conversion ratio is 1, the quality of the moving image can be more improved compared with the case where the conversion ratio is less than 1, and power consumption and manufacturing cost can be more reduced compared with the case where the conversion ratio is more than 1. Moreover, since m is small, power consumption can be reduced while high image quality is obtained. Further, by applying the conversion ratio of 1 to a liquid crystal display device in which the response time of the liquid crystal elements is approximately the same as the cycle of input image data, the image quality can be improved.

When the conversion ratio is 2, the quality of the moving image can be more improved compared with the case where the conversion ratio is less than 2, and power consumption and manufacturing cost can be more reduced compared with the case where the conversion ratio is more than 2. Moreover, since m is small, power consumption can be reduced while high image quality is obtained. Further, by applying the conversion ratio of 2 to a liquid crystal display device in which the response time of the liquid crystal elements is approximately 1/2 times the cycle of input image data, the image quality can be improved.

When the conversion ratio is 3, the quality of the moving image can be more improved compared with the case where the conversion ratio is less than 3, and power consumption and manufacturing cost can be more reduced compared with the case where the conversion ratio is more than 3. Moreover, since m is small, power consumption can be reduced while high image quality is obtained. Further, by applying the conversion ratio of 3 to a liquid crystal display device in which the response time of the liquid crystal elements is approximately 1/3 times the cycle of input image data, the image quality can be improved.

When the conversion ratio is 3/2, the quality of the moving image can be more improved compared with the case where the conversion ratio is less than 3/2, and power consumption and manufacturing cost can be more reduced compared with the case where the conversion ratio is more than 3/2. Moreover, since m is small, power consumption can be reduced while high image quality is obtained. Further, by applying the conversion ratio of 3/2 to a liquid crystal display device in which the response time of the liquid crystal elements is approximately 2/3 times the cycle of input image data, the image quality can be improved.

When the conversion ratio is 4, the quality of the moving image can be more improved compared with the case where the conversion ratio is less than 4, and power consumption and manufacturing cost can be more reduced compared with the case where the conversion ratio is more than 4. Moreover, since m is small, power consumption can be reduced while high image quality is obtained. Further, by applying the conversion ratio of 4 to a liquid crystal display device in which the response time of the liquid crystal elements is approximately 1/4 times the cycle of input image data, the image quality can be improved.

When the conversion ratio is 4/3, the quality of the moving image can be more improved compared with the case where the conversion ratio is less than 4/3, and power consumption and manufacturing cost can be more reduced compared with the case where the conversion ratio is more than 4/3. Moreover, since m is large, motion of the image can be made smoother. Further, by applying the conversion ratio of 4/3 to a liquid crystal display device in which the response time of the liquid crystal elements is approximately 3/4 times the cycle of input image data, the image quality can be improved.

When the conversion ratio is 5, the quality of the moving image can be more improved compared with the case where the conversion ratio is less than 5, and power consumption and manufacturing cost can be more reduced compared with the case where the conversion ratio is more than 5. Moreover, since m is small, power consumption can be reduced while high image quality is obtained. Further, by applying the conversion ratio of 5 to a liquid crystal display device in which the response time of the liquid crystal elements is approximately 1/5 times the cycle of input image data, the image quality can be improved.

When the conversion ratio is 5/2, the quality of the moving image can be more improved compared with the case where the conversion ratio is less than 5/2, and power consumption and manufacturing cost can be more reduced compared with the case where the conversion ratio is more than 5/2. Moreover, since m is small, power consumption can be reduced while high image quality is obtained. Further, by applying the conversion ratio of 5/2 to a liquid crystal display device in which the response time of the liquid crystal elements is approximately 2/5 times the cycle of input image data, the image quality can be improved.

When the conversion ratio is 5/3, the quality of the moving image can be more improved compared with the case where the conversion ratio is less than 5/3, and power consumption and manufacturing cost can be more reduced compared with the case where the conversion ratio is more than 5/3. Moreover, since m is large, motion of the image can be made smoother. Further, by applying the conversion ratio of 5/3 to a liquid crystal display device in which the response time of the liquid crystal elements is approximately 3/5 times the cycle of input image data, the image quality can be improved.

When the conversion ratio is 5/4, the quality of the moving image can be more improved compared with the case where the conversion ratio is less than 5/4, and power consumption and manufacturing cost can be more reduced compared with the case where the conversion ratio is more than 5/4. Moreover, since m is large, motion of the image can be made smoother. Further, by applying the conversion ratio of 5/4 to a liquid crystal display device in which the response time of the liquid crystal elements is approximately 4/5 times the cycle of input image data, the image quality can be improved.

When the conversion ratio is 6, the quality of the moving image can be more improved compared with the case where the conversion ratio is less than 6, and power consumption and manufacturing cost can be more reduced compared with the case where the conversion ratio is more than 6. Moreover, since m is small, power consumption can be reduced while high image quality is obtained. Further, by applying the conversion ratio of 6 to a liquid crystal display device in which the response time of the liquid crystal elements is approximately 1/6 times the cycle of input image data, the image quality can be improved.

When the conversion ratio is 6/5, the quality of the moving image can be more improved compared with the case where the conversion ratio is less than 6/5, and power consumption and manufacturing cost can be more reduced compared with the case where the conversion ratio is more than 6/5. Moreover, since m is large, motion of the image can be made smoother. Further, by applying the conversion ratio of 6/5 to a liquid crystal display device in which the response time of the liquid crystal elements is approximately 5/6 times the cycle of input image data, the image quality can be improved.

When the conversion ratio is 7, the quality of the moving image can be more improved compared with the case where the conversion ratio is less than 7, and power consumption and manufacturing cost can be more reduced compared with the case where the conversion ratio is more than 7. Moreover, since m is small, power consumption can be reduced while high image quality is obtained. Further, by applying the conversion ratio of 7 to a liquid crystal display device in which the response time of the liquid crystal elements is approximately 1/7 times the cycle of input image data, the image quality can be improved.

When the conversion ratio is 7/2, the quality of the moving image can be more improved compared with the case where the conversion ratio is less than 7/2, and power consumption and manufacturing cost can be more reduced compared with the case where the conversion ratio is more than 7/2. Moreover, since m is small, power consumption can be reduced while high image quality is obtained. Further, by applying the conversion ratio of 7/2 to a liquid crystal display device in which the response time of the liquid crystal elements is approximately 2/7 times the cycle of input image data, the image quality can be improved.

When the conversion ratio is 7/3, the quality of the moving image can be more improved compared with the case where the conversion ratio is less than 7/3, and power consumption and manufacturing cost can be more reduced compared with the case where the conversion ratio is more than 7/3. Moreover, since m is large, motion of the image can be made smoother. Further, by applying the conversion ratio of 7/3 to a liquid crystal display device in which the response time of the liquid crystal elements is approximately 3/7 times the cycle of input image data, the image quality can be improved.

When the conversion ratio is 7/4, the quality of the moving image can be more improved compared with the case where the conversion ratio is less than 7/4, and power consumption and manufacturing cost can be more reduced compared with the case where the conversion ratio is more than 7/4. Moreover, since m is large, motion of the image can be made smoother. Further, by applying the conversion ratio of 7/4 to a liquid crystal display device in which the response time of the liquid crystal elements is approximately 4/7 times the cycle of input image data, the image quality can be improved.

When the conversion ratio is 7/5, the quality of the moving image can be more improved compared with the case where the conversion ratio is less than 7/5, and power consumption and manufacturing cost can be more reduced compared with the case where the conversion ratio is more than 7/5. Moreover, since m is large, motion of the image can be made smoother. Further, by applying the conversion ratio of 7/5 to a liquid crystal display device in which the response time of the liquid crystal elements is approximately 5/7 times the cycle of input image data, the image quality can be improved.

When the conversion ratio is 7/6, the quality of the moving image can be more improved compared with the case where the conversion ratio is less than 7/6, and power consumption and manufacturing cost can be more reduced compared with the case where the conversion ratio is more than 7/6. Moreover, since m is large, motion of the image can be made smoother. Further, by applying the conversion ratio of 7/6 to a liquid crystal display device in which the response time of the liquid crystal elements is approximately 6/7 times the cycle of input image data, the image quality can be improved.

When the conversion ratio is 8, the quality of the moving image can be more improved compared with the case where the conversion ratio is less than 8, and power consumption and manufacturing cost can be more reduced compared with the case where the conversion ratio is more than 8. Moreover, since m is small, power consumption can be reduced while high image quality is obtained. Further, by applying the conversion ratio of 8 to a liquid crystal display device in which the response time of the liquid crystal elements is approximately 1/8 times the cycle of input image data, the image quality can be improved.

When the conversion ratio is 8/3, the quality of the moving image can be more improved compared with the case where the conversion ratio is less than 8/3, and power consumption and manufacturing cost can be more reduced compared with the case where the conversion ratio is more than 8/3. Moreover, since m is large, motion of the image can be made smoother. Further, by applying the conversion ratio of 8/3 to a liquid crystal display device in which the response time of the liquid crystal elements is approximately 3/8 times the cycle of input image data, the image quality can be improved.

When the conversion ratio is 8/5, the quality of the moving image can be more improved compared with the case where the conversion ratio is less than 8/5, and power consumption and manufacturing cost can be more reduced compared with the case where the conversion ratio is more than 8/5. Moreover, since m is large, motion of the image can be made smoother. Further, by applying the conversion ratio of 8/5 to a liquid crystal display device in which the response time of the liquid crystal elements is approximately 5/8 times the cycle of input image data, the image quality can be improved.

When the conversion ratio is 8/7, the quality of the moving image can be more improved compared with the case where the conversion ratio is less than 8/7, and power consumption and manufacturing cost can be more reduced compared with the case where the conversion ratio is more than 8/7. Moreover, since m is large, motion of the image can be made smoother. Further, by applying the conversion ratio of 8/7 to a liquid crystal display device in which the response time of the liquid crystal elements is approximately 7/8 times the cycle of input image data, the image quality can be improved.

When the conversion ratio is 9, the quality of the moving image can be more improved compared with the case where the conversion ratio is less than 9, and power consumption and manufacturing cost can be more reduced compared with the case where the conversion ratio is more than 9. Moreover, since m is small, power consumption can be reduced while high image quality is obtained. Further, by applying the conversion ratio of 9 to a liquid crystal display device in which the response time of the liquid crystal elements is approximately 1/9 times the cycle of input image data, the image quality can be improved.

When the conversion ratio is 9/2, the quality of the moving image can be more improved compared with the case where the conversion ratio is less than 9/2, and power consumption and manufacturing cost can be more reduced compared with the case where the conversion ratio is more than 9/2. Moreover, since m is small, power consumption can be reduced while high image quality is obtained. Further, by applying the conversion ratio of 9/2 to a liquid crystal display device in which the response time of the liquid crystal elements is approximately 2/9 times the cycle of input image data, the image quality can be improved.

When the conversion ratio is 9/4, the quality of the moving image can be more improved compared with the case where the conversion ratio is less than 9/4, and power consumption and manufacturing cost can be more reduced compared with the case where the conversion ratio is more than 9/4. Moreover, since m is large, motion of the image can be made smoother. Further, by applying the conversion ratio of 9/4 to a liquid crystal display device in which the response time of the liquid crystal elements is approximately 4/9 times the cycle of input image data, the image quality can be improved.

When the conversion ratio is 9/5, the quality of the moving image can be more improved compared with the case where the conversion ratio is less than 9/5, and power consumption and manufacturing cost can be more reduced compared with the case where the conversion ratio is more than 9/5. Moreover, since m is large, motion of the image can be made smoother. Further, by applying the conversion ratio of 9/5 to a liquid crystal display device in which the response time of the liquid crystal elements is approximately 5/9 times the cycle of input image data, the image quality can be improved.

When the conversion ratio is 9/7, the quality of the moving image can be more improved compared with the case where the conversion ratio is less than 9/7, and power consumption and manufacturing cost can be more reduced compared with the case where the conversion ratio is more than 9/7. Moreover, since m is large, motion of the image can be made smoother. Further, by applying the conversion ratio of 9/7 to a liquid crystal display device in which the response time of the liquid crystal elements is approximately 7/9 times the cycle of input image data, the image quality can be improved.

When the conversion ratio is 9/8, the quality of the moving image can be more improved compared with the case where the conversion ratio is less than 9/8, and power consumption and manufacturing cost can be more reduced compared with the case where the conversion ratio is more than 9/8. Moreover, since m is large, motion of the image can be made smoother. Further, by applying the conversion ratio of 9/8 to a liquid crystal display device in which the response time of the liquid crystal elements is approximately 8/9 times the cycle of input image data, the image quality can be improved.

When the conversion ratio is 10, the quality of the moving image can be more improved compared with the case where the conversion ratio is less than 10, and power consumption and manufacturing cost can be more reduced compared with the case where the conversion ratio is more than 10. Moreover, since m is small, power consumption can be reduced while high image quality is obtained. Further, by applying the conversion ratio of 10 to a liquid crystal display device in which the response time of the liquid crystal elements is approximately 1/10 times the cycle of input image data, the image quality can be improved.

When the conversion ratio is 10/3, the quality of the moving image can be more improved compared with the case where the conversion ratio is less than 10/3, and power consumption and manufacturing cost can be more reduced compared with the case where the conversion ratio is more than 10/3. Moreover, since m is large, motion of the image can be made smoother. Further, by applying the conversion ratio of 10/3 to a liquid crystal display device in which the response time of the liquid crystal elements is approximately 3/10 times the cycle of input image data, the image quality can be improved.

When the conversion ratio is 10/7, the quality of the moving image can be more improved compared with the case where the conversion ratio is less than 10/7, and power consumption and manufacturing cost can be more reduced compared with the case where the conversion ratio is more than 10/7. Moreover, since m is large, motion of the image can be made smoother. Further, by applying the conversion ratio of 10/7 to a liquid crystal display device in which the response time of the liquid crystal elements is approximately 7/10 times the cycle of input image data, the image quality can be improved.

When the conversion ratio is 10/9, the quality of the moving image can be more improved compared with the case where the conversion ratio is less than 10/9, and power consumption and manufacturing cost can be more reduced compared with the case where the conversion ratio is more than 10/9. Moreover, since m is large, motion of the image can be made smoother. Further, by applying the conversion ratio of 10/9 to a liquid crystal display device in which the response time of the liquid crystal elements is approximately 9/10 times the cycle of input image data, the image quality can be improved.

Note that it is obvious that each conversion ratio where n is more than 10 also has a similar advantage.

Next, as the second step, a method is described in which a plurality of different images (sub-images) are generated from an image based on input image data or each image (hereinafter referred to as an original image) whose frame rate is converted by a given rational number (n/m) times in the first step, and the plurality of sub-images are displayed in temporal succession. In this manner, human eyes can be made to perceive display such that one original image appears to be displayed, despite the fact that a plurality of different images are displayed.

Here, among the sub-images generated from one original image, a sub-image which is displayed first is referred to as a first sub-image. The timing when the first sub-image is displayed is the same as the timing when the original image determined in the first step is displayed. On the other hand, a sub-image which is displayed thereafter is referred to as a second sub-image. The timing when the second sub-image is displayed can be optionally determined regardless of the timing when the original image determined in the first step is displayed. Note that an image which is actually displayed is an image generated from the original image by a method in the second step. A variety of images can be used as the original image for generating sub-images. The number of sub-images is not limited to two, and more than two sub-images are also possible. In the second step, the number of sub-images is represented as J (J is an integer of 2 or more). At that time, a sub-image which is displayed at the same timing as the timing when the original image determined in the first step is displayed is referred to as a first sub-image. Sub-images which are sequentially displayed are referred to as a second sub-image, a third sub image . . . and a J-th sub-image in order of display.

There are a variety of methods for generating a plurality of sub-images from one original image. Typically, the following methods can be given. The first method is a method in which the original image is used as it is as the sub-image. The second method is a method in which brightness of the original image is divided between the plurality of sub-images. The third method is a method in which an intermediate image obtained by motion compensation is used as the sub-image.

Here, a method of dividing brightness of the original image between the plurality of sub-images can be further divided into some methods. Typically, the following methods can be given. The first method is a method in which at least one sub-image is a black image (hereinafter referred to as a black insertion method). The second method is a method in which the brightness of the original image is divided between a plurality of ranges and just one sub-image among all the sub-images is used to control the brightness in the ranges (hereinafter referred to as a time-division gray scale control method). The third method is a method in which one sub-image is a bright image which is made by changing a gamma value of the original image, and the other sub-image is a dark image which is made by changing the gamma value of the original image (hereinafter referred to as a gamma correction method).

Some of the methods described above will be briefly described. In the method in which the original image is used as it is as the sub-image, the original image is used as it is as the first sub-image. Further, the original image is used as it is as the second sub-image. By using this method, a circuit which newly generates a sub-image does not need to operate, or the circuit itself is not necessary; thus, power consumption and manufacturing cost can be reduced. Particularly in a liquid crystal display device, this method is preferably used after frame rate conversion using an intermediate image obtained by motion compensation in the first step as an interpolation image. This is because when the intermediate image obtained by motion compensation is used as the interpolation image to make motion of the moving image smooth and the same image is displayed repeatedly, defects such as afterimages and a phenomenon that phenomenon of a moving image in which traces are seen attributed to lack of writing voltage due to dynamic capacitance of the liquid crystal elements can be reduced.

Next, in the method in which the brightness of the original image is divided between the plurality of sub-images, a method of setting the brightness of the image and the length of a period when the sub-images are displayed will be described in detail. Note that J is the number of sub-images, and an integer of 2 or more. The small letter j and the capital letter J are distinguished. The small letter j is an integer of more than or equal to 1 and less than or equal to J. When the brightness of a pixel in normal hold driving is denote by L, the cycle of original image data is denoted by T, the brightness of a pixel in a j-th sub-image is denoted by Lj, and the length of a period when the j-th sub-image is displayed is Tj, it is preferably to set Lj and Tj so that the following formulae are satisfied.

$$LT = \sum_{j=1}^{J} L_j T_j \quad \text{[Formula 1]}$$

$$T = \sum_{j=1}^{J} T_j \quad \text{[Formula 2]}$$

In the methods for dividing brightness of the original image between a plurality of sub-images, a black insertion method is a method in which at least one sub-image is a black image. In this manner, a display method can be made close to pseudo impulse type display, so that deterioration of quality of moving image due to hold-type display method can be prevented. In order to prevent decrease in brightness due to black insertion, conditions of Formulae 1 and 2 are preferably satisfied. However, in the situation that decrease in brightness of the displayed image is acceptable (dark surrounding or the like) or in the case where decrease in brightness of the displayed image is set to be acceptable by the user, the conditions of Formulae 1 and 2 are not necessarily satisfied. For example, one sub-image may be the same as the original image, and the other sub-image can be a black image. In this case, power consumption can be reduced compared with the case where the conditions of Formulae 1 and 2 are satisfied. Further, in a liquid crystal display device, when one sub-image is made by increasing the whole brightness of the original image without limitation of the maximum brightness, the conditions of Formulae 1 and 2 may be satisfied by increasing brightness of a backlight. In this case, since the conditions of Formulae 1 and 2 can be satisfied without controlling the voltage value applied to a pixel, operation of an image processing circuit can be omitted, so that power consumption can be reduced.

Note that a feature of the black insertion method is to make $L_j$ of all pixels 0 in any one of sub-images. In this manner, a display method can be made close to pseudo impulse type display, so that deterioration of quality of moving images due to a hold-type display method can be prevented.

In the methods of dividing the brightness of the original image between a plurality of sub-images, a time-division gray scale control method is a method in which brightness of the original image is divided into a plurality of ranges and brightness in the range is controlled by just one sub-image among all the sub-images. In this manner, a display method can be made close to pseudo impulse type display without decrease in brightness. Accordingly, deterioration of quality of moving images due to a hold-type display method can be prevented.

As a method of dividing the brightness of the original image into a plurality of ranges, a method in which the maximum brightness ($L_{max}$) is divided into the number of sub-images can be given. This method will be described with a display device which can adjust brightness of 0 to $L_{max}$ by 256 levels (the gray scale level of 0 to 255) in the case where two sub-images are provided. When the gray scale level of 0 to 127 is displayed, brightness of one sub-image is adjusted in the range of the gray scale level of 0 to 255 while brightness of the other sub-image is set to be the gray scale level of 0. When the gray scale level of 128 to 255 is displayed, the brightness of one sub-image is set to be the gray scale level of 255 while brightness of the other sub-image is adjusted in the range of the gray scale level of 0 to 255. In this manner, human eyes can be made to perceive display such that an original image appears to be displayed, and display can be close to pseudo impulse type display; thus, deterioration of quality of moving images due to a hold-type display method can be prevented. Note that more than two sub-images can be provided. For example, when three sub-images are provided, the level (the gray scale level of 0 to 255) of brightness of an original image is divided into three. In some cases, the number of levels of brightness is not divisible by the number of sub-images, depending on the number of levels of brightness of the original image and the number of sub-images; however, the number of levels of brightness which is included in the range of each divided brightness can be distributed as appropriate even if the number of levels of brightness is not just the same as the number of sub-images.

In the case of a time-division gray scale control method, by satisfying the conditions of Formulae 1 and 2, the same image as the original image can be displayed without decrease in brightness or the like, which is preferable.

In the methods of dividing brightness of the original image between a plurality of sub-images, a gamma correction method is a method in which one sub-image is made a bright image by changing gamma characteristic of the original image while the other sub-image is made a dark image by changing the gamma characteristic of the original image. In this manner, a display method can be made close to pseudo impulse type display without decrease in brightness. Accordingly, deterioration of quality of moving images due to a hold-type display method can be prevented. Here, a gamma characteristic is a degree of brightness with respect to a level (a gray scale) of brightness. In general, a line of the gamma characteristic is adjusted so as to be close to a linear shape. This is because a smooth gray scale can be obtained when change in brightness is proportional to one gray scale in the level of brightness. In the gamma correction method, the curve of the gamma characteristic of one sub-image is deviated from the linear shape so that the one sub-image is brighter than a sub-image in the linear shape in a region of intermediate brightness (halftone) (the image in halftone is brighter than as it usually is). Further, a line of the gamma characteristic of the other sub-image is also deviated from the linear shape so that the other sub-image is darker than the sub-image in the linear shape in a region of intermediate brightness (the image in halftone is darker than as it usually is). Here, the amount of change for brightening the one sub-image than that in the linear shape and the amount of change for darkening the other sub-image than the sub-image in the linear shape are preferably almost the same. This method can make human eyes perceive as if an original image is displayed, and decrease in quality of moving images due to a hold-type display method can be prevented. Note that more than two sub-images can be provided. For example, when three sub-images are provided, each gamma characteristic of three sub-images is adjusted so that the sum of the amounts of change for brightening sub-images and the sum of the amounts of change for darkening sub-images are almost the same.

Note that also in the case of the gamma correction method, by satisfying the conditions of Formulae 1 and 2, the same image as the original image can be displayed without decrease in brightness or the like, which is preferable. Further, in the gamma correction method, since change in brightness $L_j$ of each sub-image with respect to a gray scale follows a gamma curve, the gray scale of each sub-image can be displayed smoothly by itself. Accordingly, quality of images which are finally perceived by human eyes can be improved.

A method in which an intermediate image obtained by motion compensation is used as a sub-image is a method in which one sub-image is an intermediate image obtained by motion compensation using previous and next images. In this manner, motion of images can be smooth, and quality of moving images can be improved.

A relation between the timing when a sub-image is displayed and a method of making a sub-image will be described. Although the timing when the first sub-image is displayed is the same as that when the original image determined in the first step is displayed, and the timing when the second sub-image is displayed can be optionally decided regardless of the timing when the original image determined in the first step is displayed, the sub-image itself may be changed in accordance with the timing when the second sub-image is displayed. In this manner, even if the timing when the second sub-image is displayed is changed variously, human eyes can be made to perceive as if the original image is displayed. Specifically, if the timing when the second sub-image is displayed is earlier, the first sub-image can be brighter and the second sub-image can be darker. Further, if the timing when the second sub-image is displayed is later, the first sub-image can be darker and the second sub-image can be brighter. This is because brightness perceived by human eyes changes in accordance with the length of a period when an image is displayed. More specifically, the longer the length of the period when an image is displayed becomes, the higher brightness perceived by human eyes becomes, whereas the shorter the length of the period when an image is displayed becomes, the lower brightness perceived by human eyes becomes. That is, by making the timing when the second sub-image is displayed earlier, the length of the period when the first sub-image is displayed becomes shorter and the length of period when the second sub-image is displayed becomes longer. This means human eyes perceive as if the first sub-image is dark and the second sub-image is bright. As a result, a different image from the original image is perceived by human eyes. In order to prevent this, the first sub-image can be made much brighter and the second sub-image can be made much darker. Similarly, in the case where the length of the period when the first sub-image is displayed becomes longer and the length of the period when the second sub-image is displayed becomes shorter by making the timing when the second sub-image is displayed later, the first sub-image can be made much darker and the second sub-image can be made much brighter.

In accordance with the above description, procedures in the second step are shown below. As a procedure 1, a method of making a plurality of sub-images from one original image is decided. More specifically, a method of making a plurality of sub-images can be selected from a method in which an original image is used as it is as a sub-image, a method in which brightness of an original image is divided between a plurality of sub-images, and a method in which an intermediate image obtained by motion compensation is used as a sub-image. As a procedure 2, the number J of sub-images is decided. Note that J is an integer of 2 or more. As a procedure 3, the brightness $L_j$ of a pixel in the j-th sub-image and the length $T_j$ of the period when the j-th sub-image is displayed are decided in accordance with the method selected in the procedure 1. Through the procedure 3, the length of a period when each sub-image is displayed and the brightness of each pixel included in each sub-image are specifically decided. As a procedure 4, the original image is processed in accordance with the decisions in the respective procedures 1 to 3 to actually perform display. As a procedure 5, the objective original image is shifted to the next original image, and the operation returns to the procedure 1.

Note that a mechanism for performing the procedures in the second step may be mounted on a device or decided in the design phase of the device in advance. When the mechanism for performing the procedures in the second step is mounted on the device, a driving method can be switched so that optimal operations depending on circumstances can be performed. Note that the circumstances here include contents of image data, environment inside and outside the device (e.g., temperature, humidity, barometric pressure, light, sound, electric field, the amount of radiation, altitude, acceleration, or movement speed), user settings, software version, and the like. On the other hand, when the mechanism for performing the procedures in the second step is decided in the design phase of the device in advance, driver circuits optimal for respective driving methods can be used. Moreover, since the mechanism is decided, manufacturing cost can be reduced due to efficiency of mass production.

Next, a variety of driving methods which are decided depending on the procedures in the second step are described in detail by the use of specific values of n and m in the first step.

In the procedure 1 in the second step, when a method in which an original image is used as it is as a sub-image is selected, the driving method is as follows.

The i-th image data (i is a positive integer) and the (i+1)th image data are sequentially prepared in a constant period T. The period T is divided into J numbers of sub-image display periods (J is an integer of 2 or more). The i-th image data can make each of a plurality of pixels have unique brightness L. The j-th sub-image (j is an integer of 1 to J) is formed by arranging a plurality of pixels each having the unique brightness $L_j$ and is displayed only during the j-th sub-image display period $T_j$. In a driving method of a display device in which the aforementioned L, T, $L_j$, and $T_j$ satisfy Formulae 1 and 2, the brightness $L_j$ of each pixel which is included in the j-th sub-image is equal to L in all values of j. As image data which is sequentially prepared in a constant period T, original image data formed in the first step can be used. That is, all the display patterns given in the explanation for the first step can be combined with the above-described driving method.

Figure 14:
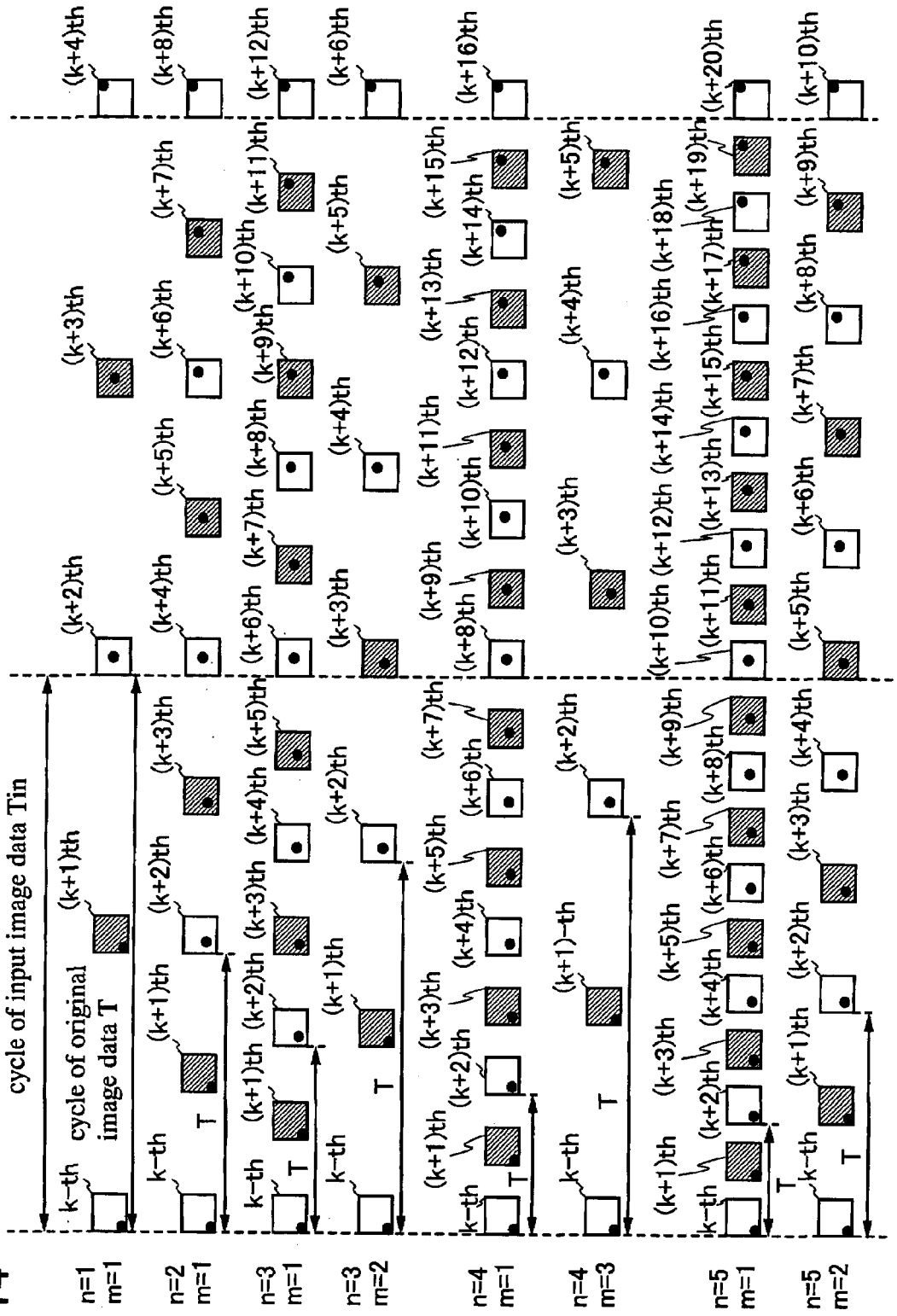
FIG. 14 illustrates one mode of a display device of the invention.

Then, when the number J of sub-images is decided to be 2 in the procedure 2 in the second step and $T_1=T_2=T/2$ is decided in the procedure 3, the above-described driving method is as shown in FIG. 14. In FIG. 14, the horizontal axis indicates time, and the vertical axis indicates cases for various combinations of n and m used in the first step.

For example, when n=1 and m=1, that is, the conversion ratio (n/m) is 1 in the first step, a driving method as shown in the point where n=1 and m=1 in FIG. 14 is performed. At this time, the display frame rate is twice as high as the frame rate of input image data (double-frame rate driving). Specifically, for example, when the input frame rate is 60 Hz, the display frame rate is 120 Hz (120 Hz driving). Accordingly, two images are continuously displayed with respect to one piece of input image data. When double-frame rate driving is performed, quality of moving images can be improved compared with the case where the frame rate is lower than that of double-frame rate driving, and power consumption and manufacturing cost can be reduced compared with the case where the frame rate is higher than that of double-frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of the liquid crystal element is approximately half a cycle of input image data, image quality can be improved.

Further, for example, when n=2 and m=1, that is, the conversion ratio (n/m) is 2 in the first step, a driving method as shown in the point where n=2 and m=1 in FIG. 14 is performed. At this time, the display frame rate is four times as high as the frame rate of input image data (quadruple-frame rate driving). Specifically, for example, when the input frame rate is 60 Hz, the display frame rate is 240 Hz (240 Hz driving). Accordingly, four images are continuously displayed with respect to one piece of input image data. At this time, when an interpolated image in the first step is an intermediate image obtained by motion compensation, movement of moving images can be smooth; thus, quality of moving images can be significantly improved. In the case of quadruple-frame rate driving, quality of moving images can be improved compared with the case where the frame rate is lower than that of quadruple-frame rate driving, and power consumption and manufacturing cost can be reduced compared with the case where the frame rate is higher than that of quadruple-frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 60 Hz, 120 Hz, or 240 Hz), flickers which appear in alternating-current driving can be reduced to a level that cannot be perceived by human eyes. Moreover, when the driving method is applied to the liquid crystal display device in which response time of the liquid crystal element is approximately 1/4 of a cycle of input image data, image quality can be improved.

For example, when n=3 and m=1, that is, the conversion ratio (n/m) is 3 in the first step, a driving method as shown in the point where n=3 and m=1 in FIG. 14 is performed. At this time, the display frame rate is six times as high as the frame rate of input image data (6-fold frame rate driving). Specifically, for example, when the input frame rate is 60 Hz, the display frame rate is 360 Hz (360 Hz driving). Accordingly, six images are continuously displayed with respect to one piece of input image data. At this time, when an interpolated image in the first step is an intermediate image obtained by motion compensation, movement of moving images can be smooth; thus, quality of moving images can be significantly improved. In the case of 6-fold frame rate driving, quality of moving images can be improved compared with the case where the frame rate is lower than that of 6-fold frame rate driving, and power consumption and manufacturing cost can be reduced compared with the case where the frame rate is higher than that of 6-fold frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 360 Hz driving and alternating-current driving of a liquid crystal display device is effective. That is, when driving frequency of the liquid crystal display device is 360 Hz and frequency of alternating-current driving is an integer multiple of 360 Hz or a unit fraction of 360 Hz (e.g., 30 Hz, 60 Hz, 120 Hz, or 180 Hz), flickers which appear in alternating-current driving can be reduced to a level that cannot be perceived by human eyes. Moreover, when the driving method is applied to the liquid crystal display device in which response time of the liquid crystal element is approximately 1/6 of a cycle of input image data, image quality can be improved.

For example, when n=3 and m=2, that is, the conversion ratio (n/m) is 3/2 in the first step, a driving method as shown in the point where n=3 and m=2 in FIG. 14 is performed. At this time, the display frame rate is three times as high as the frame rate of input image data (triple-frame rate driving). Specifically, for example, when the input frame rate is 60 Hz, the display frame rate is 180 Hz (180 Hz driving). Accordingly, three images are continuously displayed with respect to one piece of input image data. At this time, when an interpolated image in the first step is an intermediate image obtained by motion compensation, movement of moving images can be smooth; thus, quality of moving images can be significantly improved. In the case of triple-frame rate driving, quality of moving images can be improved compared with the case where the frame rate is lower than that of triple-frame rate driving, and power consumption and manufacturing cost can be reduced compared with the case where the frame rate is higher than that of triple-frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 30 Hz, 60 Hz, 120 Hz, or 180 Hz), flickers which appear in alternating-current driving can be reduced to a level that cannot be perceived by human eyes. Moreover, when the driving method is applied to the liquid crystal display device in which response time of the liquid crystal element is approximately 1/3 of a cycle of input image data, image quality can be improved.

For example, when n=4 and m=1, that is, the conversion ratio (n/m) is 4 in the first step, a driving method as shown in the point where n=4 and m=1 in FIG. 14 is performed. At this time, the display frame rate is eight times as high as the frame rate of input image data (8-fold frame rate driving). Specifically, for example, when the input frame rate is 60 Hz, the display frame rate is 480 Hz (480 Hz driving). Accordingly, eight images are continuously displayed with respect to one piece of input image data. At this time, when an interpolated image in the first step is an intermediate image obtained by motion compensation, movement of moving images can be smooth; thus, quality of moving images can be significantly improved. In the case of 8-fold frame rate driving, quality of moving images can be improved compared with the case where the frame rate is lower than that of 8-fold frame rate driving, and power consumption and manufacturing cost can be reduced compared with the case where the frame rate is higher than that of 8-fold frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 480 Hz driving and alternating-current driving of a liquid crystal display device is effective. That is, when driving frequency of the liquid crystal display device is 480 Hz and frequency of alternating-current driving is an integer multiple of 480 Hz or a unit fraction of 480 Hz (e.g., 30 Hz, 60 Hz, 120 Hz, or 240 Hz), flickers which appear in alternating-current driving can be reduced to a level that cannot be perceived by human eyes. Moreover, image quality can be improved by applying the driving method to the liquid crystal display device in which the response time of the liquid crystal element is approximately 1/8 of a cycle of input image data.

For example, in the first step, when n=4 and m=3, that is, the conversion ratio (n/m) is 4/3, a driving method as shown in the point where n=4 and m=3 in FIG. 14 is performed. At this time, the display frame rate is 8/3 times as high as the frame rate of input image data (8/3-fold frame rate driving). Specifically, for example, when the input frame rate is 60 Hz, the display frame rate is 160 Hz (160 Hz driving). Then, eight images are continuously displayed with respect to three pieces of input image data. At this time, when an interpolated image in the first step is an intermediate image obtained by motion compensation, movement of moving images can be smooth; thus, quality of moving images can be significantly improved. In the case of 8/3-fold frame rate driving, quality of moving images can be improved compared with the case where the frame rate is lower than that of 8/3-fold frame rate driving, and power consumption and manufacturing cost can be reduced compared with the case where the frame rate is higher than that of 8/3-fold frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 160 Hz driving and alternating-current driving of a liquid crystal display device is effective. That is, when driving frequency of the liquid crystal display device is 160 Hz and frequency of alternating-current driving is an integer multiple of 160 Hz or a unit fraction of 160 Hz (e.g., 40 Hz, 80 Hz, 160 Hz, or 320 Hz), flickers which appear in alternating-current driving can be reduced to a level that cannot be perceived by human eyes. Moreover, when the driving method is applied to the liquid crystal display device in which response time of the liquid crystal element is approximately 3/8 of a cycle of input image data, image quality can be improved.

Further, for example, in the first step, when n=5 and m=1, that is, when the conversion ratio (n/m) is 5, a driving method as shown in the point where n=5 and m=1 in FIG. 14 is performed. At this time, the display frame rate is ten times as high as the frame rate of input image data (10-fold frame rate driving). Specifically, for example, when the input frame rate is 60 Hz, the display frame rate is 600 Hz (600 Hz driving). Accordingly, ten images are continuously displayed with respect to one piece of input image data. At this time, when an interpolated image in the first step is an intermediate image obtained by motion compensation, movement of moving images can be smooth; thus, quality of moving images can be significantly improved. In the case of 10-fold frame rate driving, quality of moving images can be improved compared with the case where the frame rate is lower than that of 10-fold frame rate driving, and power consumption and manufacturing cost can be reduced compared with the case where the frame rate is higher than that of 10-fold frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 600 Hz driving and alternating-current driving of a liquid crystal display device is effective. That is, when driving frequency of the liquid crystal display device is 600 Hz and frequency of alternating-current driving is an integer multiple of 600 Hz or a unit fraction of 600 Hz (e.g., 30 Hz, 60 Hz, 100 Hz, or 120 Hz), flickers which appear in alternating-current driving can be reduced to a level that cannot be perceived by human eyes. Moreover, when the driving method is applied to the liquid crystal display device in which response time of the liquid crystal element is approximately 1/10 of a cycle of input image data, image quality can be improved.

Further, for example, in the first step, when n=5 and m=2, that is, the conversion ratio (n/m) is 5/2, a driving method as shown in the point where n=5 and m=2 in FIG. 14 is performed. At this time, the display frame rate is five times as high as the frame rate of input image data (5-fold frame rate driving). Specifically, for example, when the input frame rate is 60 Hz, the display frame rate is 300 Hz (300 Hz driving). Accordingly, five images are continuously displayed with respect to one piece of input image data. At this time, when an interpolated image in the first step is an intermediate image obtained by motion compensation, movement of moving images can be smooth; thus, quality of moving images can be significantly improved. In the case of 5-fold frame rate driving, quality of moving images can be improved compared with the case where the frame rate is lower than that of 5-fold frame rate driving, and power consumption and manufacturing cost can be reduced compared with the case where the frame rate is higher than that of 5-fold frame rate driving. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Moreover, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced to a level that cannot be perceived by human eyes. Moreover, when the driving method is applied to the liquid crystal display device in which response time of the liquid crystal element is approximately 1/5 of a cycle of input image data, image quality can be improved.

As described above, when a method in which an original image is used as it is as a sub-image is selected the procedure 1 in the second step, the number of sub-images is determined to be 2 in the procedure 2 in the second step, and $T_1=T_2=T/2$ is decided in the procedure 3 in the second step, the display frame rate can be twice that of frame rate conversion using a conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Furthermore, when the driving frequency of the liquid crystal display device is increased and the frequency of alternating-current driving is an integer multiple or a unit fraction of the driving frequency, flickers which appear in alternating-current driving can be reduced to a level that cannot be perceived by human eyes. Moreover, when the driving method is applied to the liquid crystal display device in which response time of the liquid crystal element is approximately 1/(twice the conversion ratio) of a cycle of input image data, image quality can be improved.

Note that although detailed description is omitted, it is apparent that conversion ratios other than those described above have similar advantages. For example, in the range that n is equal to or less than 10, the combinations can be considered as follows other than those described above: n=5 and m=3, that is, conversion ratio (n/m) of 5/3 (10/3-fold frame rate driving, 200 Hz); n=5 and m=4, that is, conversion ratio (n/m) of 5/4 (5/2-fold frame rate driving, 150 Hz); n=6 and m=1, that is, conversion ratio (n/m) of 6 (12-fold frame rate driving, 720 Hz); n=6 and m=5, that is, conversion ratio (n/m)

of 6/5 (12/5-fold frame rate driving, 144 Hz); n=7 and m=1, that is, conversion ratio (n/m) of 7 (14-fold frame rate driving, 840 Hz); n=7 and m=2, that is, conversion ratio (n/m) of 7/2 (7-fold frame rate driving, 420 Hz); n=7 and m=3, that is, conversion ratio (n/m) of 7/3 (14/3-fold frame rate driving, 280 Hz); n=7 and m=4, that is, conversion ratio (n/m) of 7/4 (7/2-fold frame rate driving, 210 Hz); n=7 and m=5, that is, conversion ratio (n/m) of 7/5 (14/5-fold frame rate driving, 168 Hz); n=7 and m=6, that is, conversion ratio (n/m) of 7/6 (7/3-fold frame rate driving, 140 Hz); n=8 and m=1, that is, conversion ratio (n/m) of 8 (16-fold frame rate driving, 960 Hz); n=8 and m=3, that is, conversion ratio (n/m) of 8/3 (16/3-fold frame rate driving, 320 Hz); n=8 and m=5, that is, conversion ratio (n/m) of 8/5 (16/5-fold frame rate driving, 192 Hz); n=8 and m=7, that is, conversion ratio (n/m) of 8/7 (16/7-fold frame rate driving, 137 Hz); n=9 and m=1, that is, conversion ratio (n/m) of 9 (18-fold frame rate driving, 1080 Hz); n=9 and m=2, that is, conversion ratio (n/m) of 9/2 (9-fold frame rate driving, 540 Hz); n=9 and m=4, that is, conversion ratio (n/m) of 9/4 (9/2-fold frame rate driving, 270 Hz); n=9 and m=5, that is, conversion ratio (n/m) of 9/5 (18/5-fold frame rate driving, 216 Hz); n=9 and m=7, that is, conversion ratio (n/m) of 9/7 (18/7-fold frame rate driving, 154 Hz); n=9 and m=8, that is, conversion ratio (n/m) of 9/8 (9/4-fold frame rate driving, 135 Hz); n=10 and m=1, that is, conversion ratio (n/m) of 10 (20-fold frame rate driving, 1200 Hz); n=10 and m=3, that is, conversion ratio (n/m) of 10/3 (20/3-fold frame rate driving, 400 Hz); n=10 and m=7, that is, conversion ratio (n/m) of 10/7 (20/7-fold frame rate driving, 171 Hz); and n=10 and m=9, that is, conversion ratio (n/m) of 10/9 (20/9-fold frame rate driving, 133 Hz). Note that these frequencies are examples in the case where the input frame rate is 60 Hz. In the case of other frequencies, the driving frequency is obtained by multiplication of the doubled conversion ratio by the input frame rate.

Although specific numbers of n and m in the case where n is an integer larger than 10 are not shown, it is apparent that the processes in the second step can be applied to a variety of combinations of n and m.

Note that in the case where J=2, it is particularly effective that the conversion ratio in the first step is larger than 2. This is because when the number of sub-images is comparatively smaller like J=2 in the second step, the conversion ratio in the first step can be higher. When n is 10 or less, such a conversion ratio includes 3, 4, 5, 5/2, 6, 7, 7/2, 7/3, 8, 8/3, 9, 9/2, 9/4, 10, and 10/3. When a display frame rate after the first step is such a value, by setting the value of J to be 3 or more, balance between advantages of the number of sub-images in the second step being small (e.g., reduction in power consumption and manufacturing cost) and advantages of the final display frame rate being high (e.g., increase in quality of moving images and reduction in flickers) can be achieved.

Although this embodiment mode describes the case where the number J of sub-images is decided to be 2 in the procedure 2 and $T_1=T_2=T/2$ is decided in the procedure 3, it is apparent that the invention is not limited thereto.

For example, when $T_1<T_2$ is decided in the procedure 3 in the second step, the first sub-image can be made brighter and the second sub-image can be made darker. Further, when $T_1>T_2$ is decided in the procedure 3 in the second step, the first sub-image can be made darker and the second sub-image can be made brighter. Accordingly, a display method can be pseudo impulse driving, while the original image can be perceived by human eyes; thus, quality of moving images can be improved. Note that as in the above-described driving method, when a method in which an original image is used as it is as a sub-image is selected in the procedure 1, the sub-image can be displayed as it is without changing brightness of the sub-image. This is because an image used as a sub-image is the same in this case, and the original image can be displayed properly regardless of display timing of the sub-image.

Further, in the procedure 2, it is obvious that the number J of sub-images is not limited to 2, and values other than 2 may be employed. In this case, the display frame rate can be J times the frame rate of the frame rate conversion of the conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 in the second step, when a method in which an original image is used as it is as a sub-image is selected, an operation of a circuit which produces an intermediate image by motion compensation can be stopped or the circuit itself can be omitted from the device, whereby power consumption and manufacturing cost of the device can be reduced. Further, when a display device is an active matrix liquid crystal display device, a problem of lack of writing voltage due to dynamic capacitance can be avoided; thus, quality of moving images can be significantly improved, in particular, with respect to defects such as a phenomenon of a moving image in which traces are seen and an afterimage. Furthermore, when the driving frequency of the liquid crystal display device is made high and the frequency of alternating-current driving is an integer multiple or a unit fraction of the driving frequency, flickers which appear in alternating-current driving can be reduced to a level that cannot be perceived by human eyes. Moreover, when the driving method is applied to the liquid crystal display device in which response time of the liquid crystal element is approximately 1/(J times of the conversion ratio) of a cycle of input image data, image quality can be improved.

For example, in the case where J=3, in particular, quality of moving images can be improved compared with the case where the number of sub-images is less than 3, and power consumption and manufacturing cost can be reduced compared with the case where the number of sub-images is more than 3. Moreover, when the driving method is applied to the liquid crystal display device in which response time of the liquid crystal element is approximately (1/(three times of the conversion ratio)) of a cycle of input image data, image quality can be improved.

For example, in the case where J=4, in particular, quality of moving images can be improved compared with the case where the number of sub-images is less than 4, and power consumption and manufacturing cost can be reduced compared with the case where the number of sub-images is more than 4. Moreover, when the driving method is applied to the liquid crystal display device in which response time of the liquid crystal element is approximately 1/(four times of the conversion ratio) of a cycle of input image data, image quality can be improved.

For example, in the case where J=5, in particular, quality of moving images can be improved compared with the case where the number of sub-images is less than 5, and power consumption and manufacturing cost can be reduced compared with the case where the number of sub-images is more than 5. Moreover, when the driving method is applied to the liquid crystal display device in which response time of the liquid crystal element is approximately 1/(five times of the conversion ratio) of a cycle of input image data, image quality can be improved.

Further, J other than those described above has similar advantages.

Figure 15:
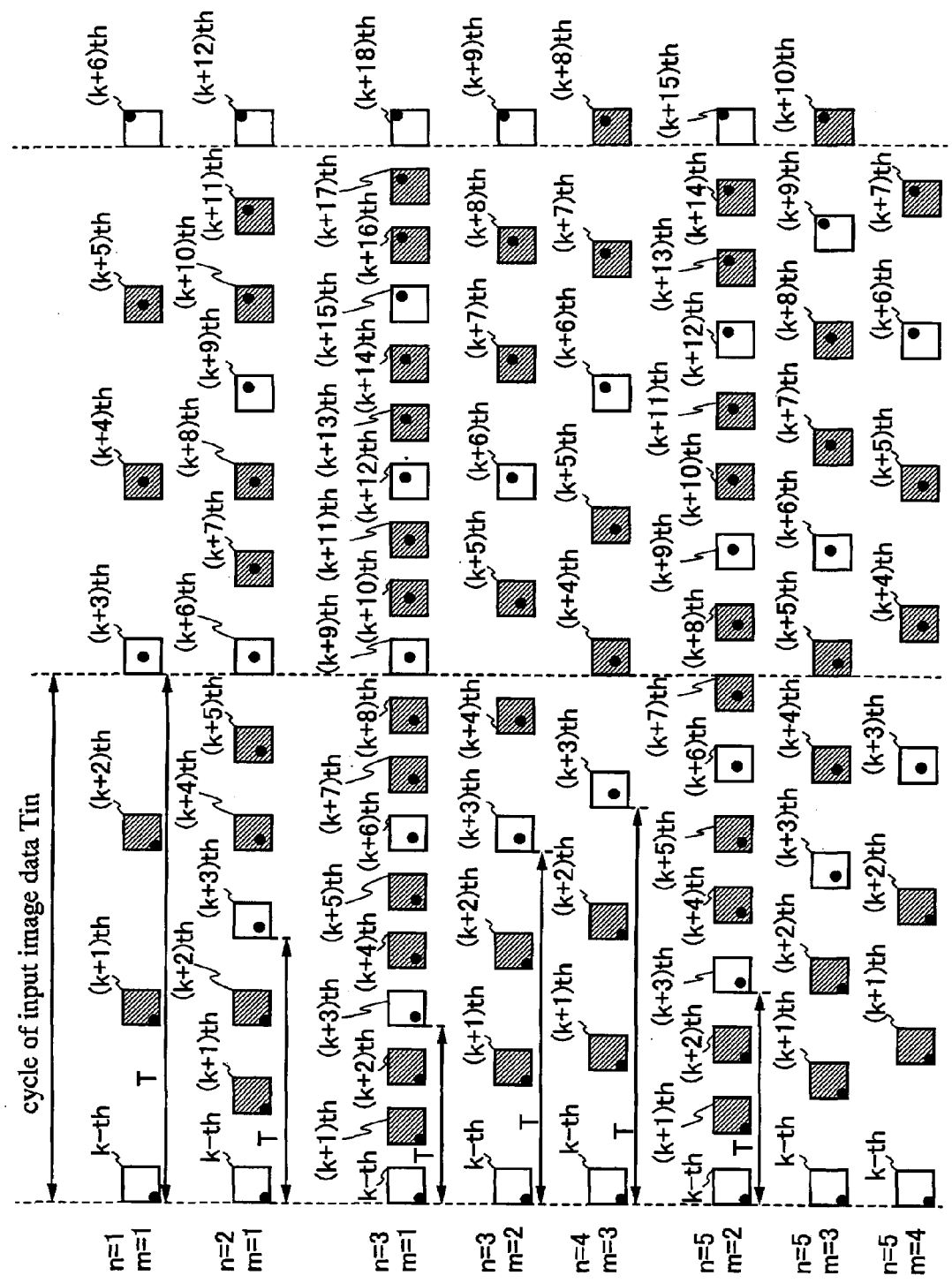
FIG. 15 illustrates one mode of a display device of the invention.

Note that in the case where J is 3 or more, the conversion ratio in the first step can be a variety of values. J of 3 or more is effective particularly when the conversion ratio in the first step is relatively small (equal to or less than 2). This is because when a display frame rate after the first step is relatively low, J can be larger in the second step. When n is 10 or less, such a conversion ratio includes 1, 2, 3/2, 4/3, 5/3, 5/4, 6/5, 7/4, 7/5, 7/6, 8/7, 9/5, 9/7, 9/8, 10/7, and 10/9. FIG. 15 shows the cases where the conversion ratio is 1, 2, 3/2, 4/3, 5/3, and 5/4 among the above-described conversion ratios. As described above, when the display frame rate after the first step is a relatively small value, by setting the value of J to be 3 or more, balance between advantages of the number of sub-images in the first step being small (e.g., reduction in power consumption and manufacturing cost) and advantages of the final display frame rate being high (e.g., increase in quality of moving image and reduction in flickers) can be achieved.

Next, another example of a driving method determined by the procedure in the second step is described in detail by the use of specific values of n and m in the first step.

In the procedure 1 in the second step, when a black insertion method is selected among methods of dividing brightness of the original image between a plurality of sub-images, the driving method is as follows.

The i-th image data (i is a positive integer) and the (i+1)th image data are sequentially prepared in a constant period T. The period T is divided into J sub-image display periods (J is an integer of 2 or more). The i-th image data is data which can make each of a plurality of pixels have unique brightness L. The j-th sub-image (j is an integer of 1 to J) is formed by arranging a plurality of pixels each having unique brightness $L_j$ and is displayed only during the j-th sub-image display period $T_j$. In a driving method of a display device in which the aforementioned L, T, $L_j$, and $T_j$ satisfy Formulae 1 and 2, the brightness $L_j$ of all pixels which are included in the j-th sub-image is equal to 0 in at least one value of j. As image data which is sequentially prepared in a constant period T, the original image data formed in the first step can be used. That is, all the display patterns given in the explanation for the first step can be combined with the above-described driving method.

Then, when the number J of sub-images is decided to be 2 in the procedure 2 of the second step and $T_1=T_2=T/2$ is decided in the procedure 3, the above-described driving method is as shown in FIG. 14. In FIG. 14, the horizontal axis represents time, and the vertical axis represents cases for various combinations of n and m used in the first step.

For example, in the first step, when n=1 and m=1, that is, when the conversion ratio (n/m) is 1, a driving method as shown in the point where n=1 and m=1 in FIG. 14 is performed. At this time, the display frame rate is twice a frame rate of image data to be input (double-frame rate driving). Specifically, for example, when the input frame rate is 60 Hz, the display frame rate is 120 Hz (120 Hz driving). Accordingly, two images are continuously displayed with respect to one piece of image data to be input. When double-frame rate driving is performed, quality of moving images can be improved compared with the case where the frame rate is lower than that of double-frame rate driving, and power consumption and manufacturing cost can be reduced compared with the case where the frame rate is higher than that of double-frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately half a cycle of input image data, image quality can be improved.

For example, in the first step, when n=2 and m=1, that is, when the conversion ratio (n/m) is 2, a driving method as shown in the point where n=2 and m=1 in FIG. 14 is performed. At this time, the display frame rate is four times a frame rate of image data to be input (quadruple-frame rate driving). Specifically, for example, when the input frame rate is 60 Hz, the display frame rate is 240 Hz (240 Hz driving). Accordingly, four images are continuously displayed with respect to one piece of image data to be input. At this time, when an interpolation image in the first step is an intermediate image obtained by motion compensation, the movement of moving images can be made to be smooth; thus, quality of the moving image can be significantly improved. When quadruple-frame rate driving is performed, quality of moving images can be improved compared with the case where the frame rate is lower than that of quadruple-frame rate driving, and power consumption and manufacturing cost can be reduced compared with the case where the frame rate is higher than that of quadruple-frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 60 Hz, 120 Hz, or 240

Hz), flickers which appear in alternating-current driving can be reduced to a level that cannot be perceived by human eyes. Moreover, when the driving method is applied to a liquid crystal display device in which response time of a liquid crystal element is approximately 1/4 of a cycle of input image data, image quality can be improved.

For example, in the first step, when n=3 and m=1, that is, when the conversion ratio (n/m) is 3, a driving method as shown in the point where n=3 and m=1 in FIG. 14 is performed. At this time, the display frame rate is six times a frame rate of image data to be input (6-fold frame rate driving). Specifically, for example, when the input frame rate is 60 Hz, the display frame rate is 360 Hz (360 Hz driving). Accordingly, six images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 6-fold frame rate driving is performed, quality of moving images can be improved compared with the case where the frame rate is lower than that of 6-fold frame rate driving, and power consumption and manufacturing cost can be reduced compared with the case where the frame rate is higher than that of 6-fold frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 360 Hz driving and alternating-current driving of a liquid crystal display device is effective. That is, when driving frequency of the liquid crystal display device is 360 Hz and frequency of alternating-current driving is an integer multiple of 360 Hz or a unit fraction of 360 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/6 of a cycle of input image data, image quality can be improved.

For example, in the first step, when n=3 and m=2, that is, when the conversion ratio (n/m) is 3/2, a driving method as shown in the point where n=3 and m=2 in FIG. 14 is performed. At this time, the display frame rate is three times a frame rate of image data to be input (triple-frame rate driving). Specifically, for example, when the input frame rate is 60 Hz, the display frame rate is 180 Hz (180 Hz driving). Accordingly, three images are continuously displayed with respect to one piece of image data to be input. At this time, when an interpolation image in the first step is an intermediate image obtained by motion compensation, the movement of moving images can be made to be smooth; thus, quality of the moving image can be significantly improved. When triple-frame rate driving is performed, quality of moving images can be improved compared with the case where the frame rate is lower than that of triple-frame rate driving, and power consumption and manufacturing cost can be reduced compared with the case where the frame rate is higher than that of triple-frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/3 of a cycle of input image data, image quality can be improved.

For example, in the first step, when n=4 and m=1, that is, when the conversion ratio (n/m) is 4, a driving method as shown in the point where n=4 and m=1 in FIG. 14 is performed. At this time, the display frame rate is eight times a frame rate of image data to be input (8-fold frame rate driving). Specifically, for example, when the input frame rate is 60 Hz, the display frame rate is 480 Hz (480 Hz driving). Accordingly, eight images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 8-fold frame rate driving is performed, quality of moving images can be improved compared with the case where the frame rate is lower than that of 8-fold frame rate driving, and power consumption and manufacturing cost can be reduced compared with the case where the frame rate is higher than that of 8-fold frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 480 Hz driving and alternating-current driving of a liquid crystal display device is effective. That is, when driving frequency of the liquid crystal display device is 480 Hz and frequency of alternating-current driving is an integer multiple of 480 Hz or a unit fraction of 480 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately 1/8 of a cycle of input image data, image quality can be improved.

For example, in the first step, when n=4 and m=3, that is, when the conversion ratio (n/m) is 4/3, a driving method as shown in the point where n=4 and m=3 in FIG. 14 is performed. At this time, the display frame rate is 8/3 times a frame rate of image data to be input (8/3-fold frame rate driving). Specifically, for example, when the input frame rate is 60 Hz, the display frame rate is 160 Hz (160 Hz driving). Accordingly, eight images are continuously displayed with respect to three pieces of image data to be input. At this time, when an interpolation image in the first step is an intermediate image obtained by motion compensation, the movement of moving images can be made to be smooth; thus, quality of the moving image can be significantly improved. When 8/3-fold frame rate driving is performed, quality of moving images can be improved compared with the case where the frame rate is lower than that of 8/3-fold frame rate driving, and power consumption and manufacturing cost can be reduced compared with the case where the frame rate is higher than that of 8/3-fold frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 160 Hz driving and alternating-current driving of a liquid crystal display device is effective. That is, when driving frequency of the liquid crystal display device is 160 Hz and frequency of alternating-current driving is an integer multiple of 160 Hz or a unit fraction of 160 Hz (e.g., 40 Hz, 80 Hz, 160 Hz, or 320 Hz), flickers which appear in alternating-current driving can be reduced to a level that cannot be perceived by human eyes. Moreover, when the driving method is applied to a liquid crystal display device in which response time of a liquid crystal element is approximately 3/8 of a cycle of input image data, image quality can be improved.

For example, in the first step, when n=5 and m=1, that is, when the conversion ratio (n/m) is 5, a driving method as shown in the point where n=5 and m=1 in FIG. 14 is performed. At this time, the display frame rate is ten times a frame rate of image data to be input (10-fold frame rate driving). Specifically, for example, when the input frame rate is 60 Hz, the display frame rate is 600 Hz (600 Hz driving). Accordingly, ten images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 10-fold frame rate driving is performed, quality of moving images can be improved compared with the case where the frame rate is lower than that of 10-fold frame rate driving, and power consumption and manufacturing cost can be reduced compared with the case where the frame rate is higher than that of 10-fold frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 600 Hz driving and alternating-current driving of a liquid crystal display device is effective. That is, when driving frequency of the liquid crystal display device is 600 Hz and frequency of alternating-current driving is an integer multiple of 600 Hz or a unit fraction of 600 Hz (e.g., 30 Hz, 60 Hz, 100 Hz, or 120 Hz), flickers which appear in alternating-current driving can be reduced to a level that cannot be perceived by human eyes. Moreover, when the driving method is applied to a liquid crystal display device in which response time of a liquid crystal element is approximately 1/10 of a cycle of input image data, image quality can be improved.

For example, in the first step, when n=5 and m=2, that is, when the conversion ratio (n/m) is 5/2, a driving method as shown in the point where n=5 and m=2 in FIG. 14 is performed. At this time, the display frame rate is five times a frame rate of image data to be input (5-fold frame rate driving). Specifically, for example, when the input frame rate is 60 Hz, the display frame rate is 300 Hz (300 Hz driving). Accordingly, five images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 5-fold frame rate driving is performed, quality of moving images can be improved compared with the case where the frame rate is lower than that of 5-fold frame rate driving, and power consumption and manufacturing cost can be reduced compared with the case where the frame rate is higher than that of 5-fold frame rate driving. Further, in the procedure 1 of the second step, when a black insertion method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced to a level that cannot be perceived by human eyes. Moreover, when the driving method is applied to a liquid crystal display device in which response time of a liquid crystal element is approximately 1/5 of a cycle of input image data, image quality can be improved.

As described above, when a black insertion method is selected among methods where brightness of an original image is divided between a plurality of sub-images in the procedure 1 of the second step, the number of sub-images is decided to be 2 in the procedure 2 of the second step, and $T_1=T_2=T/2$ is decided in the procedure 3 of the second step, the frame rate can be twice that of frame rate conversion of the conversion ratio decided by values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a black insertion method is selected among methods where brightness of an original image is divided between a plurality of sub-images, an operation of the circuit which forms an intermediate image by motion compensation can be stopped or the circuit itself can be omitted from the device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(twice the conversion ratio) of a cycle of input image data, image quality can be improved.

Note that although detailed description is omitted, it is apparent that conversion ratios other than those described above have similar advantages. For example, in the range that n is equal to or less than 10, the combinations can be considered as follows other than those described above: n=5 and m=3, that is, conversion ratio (n/m) of 5/3 (10/3-fold frame rate driving, 200 Hz); n=5 and m=4, that is, conversion ratio (n/m) of 5/4 (5/2-fold frame rate driving, 150 Hz); n=6 and m=1, that is, conversion ratio (n/m) of 6 (12-fold frame rate driving, 720 Hz); n=6 and m=5, that is, conversion ratio (n/m) of 6/5 (12/5-fold frame rate driving, 144 Hz); n=7 and m=1, that is, conversion ratio (n/m) of 7 (14-fold frame rate driving, 840 Hz); n=7 and m=2, that is, conversion ratio (n/m) of 7/2 (7-fold frame rate driving, 420 Hz); n=7 and m=3, that is, conversion ratio (n/m) of 7/3 (14/3-fold frame rate driving, 280 Hz); n=7 and m=4, that is, conversion ratio (n/m) of 7/4 (7/2-fold frame rate driving, 210 Hz); n=7 and m=5, that is, conversion ratio (n/m) of 7/5 (14/5-fold frame rate driving, 168 Hz); n=7 and m=6, that is, conversion ratio (n/m) of 7/6 (7/3-fold frame rate driving, 140 Hz); n=8 and m=1, that is, conversion ratio (n/m) of 8 (16-fold frame rate driving, 960 Hz); n=8 and m=3, that is, conversion ratio (n/m) of 8/3 (16/3-fold frame rate driving, 320 Hz); n=8 and m=5, that is, conversion ratio (n/m) of 8/5 (16/5-fold frame rate driving, 192 Hz); n=8 and m=7, that is, conversion ratio (n/m) of 8/7 (16/7-fold frame rate driving, 137 Hz); n=9 and m=1, that is, conversion ratio (n/m) of 9 (18-fold frame rate driving, 1080 Hz); n=9 and m=2, that is, conversion ratio (n/m) of 9/2 (9-fold frame rate driving, 540 Hz); n=9 and m=4, that is, conversion ratio (n/m) of 9/4 (9/2-fold frame rate driving, 270 Hz); n=9 and m=5, that is, conversion ratio (n/m) of 9/5 (18/5-fold frame rate driving, 216 Hz); n=9 and m=7, that is, conversion ratio (n/m) of 9/7 (18/7-fold frame rate driving, 154 Hz); n=9 and m=8, that is, conversion ratio (n/m) of 9/8 (9/4-fold frame rate driving, 135 Hz); n=10 and m=1, that is, conversion ratio (n/m) of 10 (20-fold frame rate driving, 1200 Hz); n=10 and m=3, that is, conversion ratio (n/m) of 10/3 (20/3-fold frame rate driving, 400 Hz); n=10 and m=7, that is, conversion ratio (n/m) of 10/7 (20/7-fold frame rate driving, 171 Hz); and n=10 and m=9, that is, conversion ratio (n/m) of 10/9 (20/9-fold frame rate driving, 133 Hz). Note that these frequencies are examples in the case where the input frame rate is 60 Hz. In the case of other frequencies, the driving frequency is obtained by multiplication of the doubled conversion ratio by the input frame rate.

Although specific numbers of n and m in the case where n is an integer larger than 10 are not shown, it is apparent that the procedures in the second step can be applied to a variety of combinations of n and m.

Although this embodiment mode describes the case where the number J of sub-images is decided to be 2 in the procedure 2 and $T_1=T_2=T/2$ is decided in the procedure 3, it is apparent that the invention is not limited thereto.

For example, when $T_1<T_2$ is decided in the procedure 3 of the second step, the first sub-image can be made brighter and the second sub-image can be made darker. Further, when $T_1>T_2$ is decided in the procedure 3 of the second step, the first sub-image can be made darker and the second sub-image can be made brighter. Accordingly, an original image can be well perceived by human eyes, and at the same time, display can be performed by pseudo impulse driving; thus, quality of moving images can be improved. Note that as in the above-described driving method, when the black insertion method is selected among methods where brightness of an original image is divided between a plurality of sub-images, display can be performed as it is without changing brightness of the sub-images. This is because when brightness of the sub-images is not changed, the whole original image is merely displayed with its reduced brightness. That is, when this method is positively used to control brightness of a display device, the brightness can be controlled while quality of moving images is improved.

In addition, in the procedure 2, it is apparent that the number J of sub-images is not limited to 2, and values other than 2 may be employed. In this case, the display frame rate can be J times the frame rate of frame rate conversion of the conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a black insertion method is selected among methods where brightness of an original image is divided between a plurality of sub-images, an operation of the circuit which forms an intermediate image by motion compensation can be stopped or the circuit itself can be omitted from the device; thus, power consumption and manufacturing cost of the device can be reduced. Moreover, a pseudo impulse display method can be employed regardless of a gray scale value included in image data; thus, quality of moving images can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(J times of the conversion ratio) of a cycle of input image data, image quality can be improved.

For example, in the case where J=3, in particular, quality of moving images can be improved compared with the case where the number of sub-images is less than 3. Moreover, power consumption and manufacturing cost can be reduced compared with the case where the number of sub-images is more than 3. Further, when the driving method is applied to a liquid crystal display device in which response time of a liquid crystal element is approximately 1/(three times of the conversion ratio) of a cycle of input image data, image quality can be improved.

For example, in the case where J=4, in particular, quality of moving images can be improved compared with the case where the number of sub-images is less than 4. Moreover, power consumption and manufacturing cost can be reduced compared with the case where the number of sub-images is more than 4. Further, when the driving method is applied to a liquid crystal display device in which response time of a liquid crystal element is approximately 1/(four times of the conversion ratio) of a cycle of input image data, image quality can be improved.

In addition, for example, in the case where J=5, in particular, quality of moving images can be improved compared with the case where the number of sub-images is less than 5. Moreover, power consumption and manufacturing cost can be reduced compared with the case where the number of sub-images is more than 5. Further, when the driving method is applied to a liquid crystal display device in which response time of a liquid crystal element is approximately 1/(five times of the conversion ratio) of a cycle of input image data, image quality can be improved.

Further, J other than those described above has similar advantages.

Next, another example of a driving method determined by the procedures in the second step is described in detail by the use of specific values of n and m in the first step.

In the procedure 1 of the second step, when a time division gray scale control method is selected among methods of dividing brightness of an original image between a plurality of sub-images, the driving method is as follows.

The i-th image data (i is a positive integer) and the (i+1)th image data are sequentially prepared in a certain period T. The period is divided into J number of sub-image display periods (J is an integer of 2 or more). The i-th image data can give respective specific values of brightness L to a plurality of pixels. The maximum value of the specific brightness L is $L_{max}$. The j-th sub-image (j is an integer of 1 to J) is formed by arranging a plurality of pixels each having the specific brightness $L_j$ and is displayed in the j-th sub-image display period $T_j$. In a driving method of a display device in which the aforementioned L, T, $L_j$, and $T_j$ satisfy Formulae 1 and 2, when the specific brightness L is displayed, brightness in the range of $(j-1) \times L_{max}/J$ to $j \times L_{max}/J$ is controlled by control of brightness in only one sub-image display period among the J number of sub-image display periods. As the image data which is sequentially prepared in the certain period T, original image data formed in the first step can be used. That is, all the display patterns given in the explanation for the first step can be combined with the above-described driving method.

Then, when the number J of sub-images is decided to be 2 in the procedure 2 of the second step and $T_1=T_2=T/2$ is decided in the procedure 3, the above-described driving method is as shown in FIG. 14. In FIG. 14, the horizontal axis represents time, and the vertical axis represents cases for various combinations of n and m used in the first step.

For example, when n=1 and m=1, that is, the conversion ratio (n/m) is 1 in the first step, a driving method as shown in the point where n=1 and m=1 in FIG. 14 is performed. At this time, the display frame rate is twice a frame rate of image data to be input (double-frame rate driving). Specifically, for example, when the input frame rate is 60 Hz, the display frame rate is 120 Hz (120 Hz driving). Accordingly, two images are continuously displayed with respect to one piece of image data to be input. When double-frame rate driving is performed, quality of moving images can be improved compared with the case where the frame rate is lower than that of double-frame rate driving, and power consumption and manufacturing cost can be reduced compared with the case where the frame rate is higher than that of double-frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. When the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately half a cycle of input image data, image quality can be improved.

For example, when n=2 and m=1, that is, the conversion ratio (n/m) is 2 in the first step, a driving method as shown in the point where n=2 and m=1 in FIG. 14 is performed. At this time, the display frame rate is four times a frame rate of image data to be input (quadruple-frame rate driving). Specifically, for example, when the input frame rate is 60 Hz, the display frame rate is 240 Hz (240 Hz driving). Accordingly, four images are continuously displayed with respect to one piece of image data to be input. At this time, when an interpolation image in the first step is an intermediate image obtained by motion compensation, the movement of moving images can be made to be smooth; thus, quality of the moving image can be significantly improved. When quadruple-frame rate driving is performed, quality of moving images can be improved compared with the case where the frame rate is lower than that of quadruple-frame rate driving, and power consumption and manufacturing cost can be reduced compared with the case where the frame rate is higher than that of quadruple-frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. When the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately 1/4 of a cycle of input image data, image quality can be improved.

For example, in the first step, when n=3 and m=1, that is, when the conversion ratio (n/m) is 3, a driving method as shown in the point where n=3 and m=1 in FIG. 14 is performed. At this time, the display frame rate is six times a frame rate of image data to be input (6-fold frame rate driving). Specifically, for example, when the input frame rate is 60 Hz, the display frame rate is 360 Hz (360 Hz driving). Accordingly, six images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 6-fold frame rate driving is performed, quality of moving images can be improved compared with the case where the frame rate is lower than that of 6-fold frame rate driving, and power consumption and manufacturing cost can be reduced compared with the case where the frame rate is higher than that of 6-fold frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 360 Hz driving and alternating-current driving of a liquid crystal display device is effective. That is, when driving frequency of the liquid crystal display device is 360 Hz and frequency of alternating-current driving is an integer multiple of 360 Hz or a unit fraction of 360 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/6 of a cycle of input image data, image quality can be improved.

For example, in the first step, when n=3 and m=2, that is, when the conversion ratio (n/m) is 3/2, a driving method as shown in the point where n=3 and m=2 in FIG. 14 is performed. At this time, the display frame rate is three times a frame rate of image data to be input (triple-frame rate driving). Specifically, for example, when the input frame rate is 60 Hz, the display frame rate is 180 Hz (180 Hz driving). Accordingly, three images are continuously displayed with respect to one piece of image data to be input. At this time, when an interpolation image in the first step is an intermediate image obtained by motion compensation, the movement of moving images can be made to be smooth; thus, quality of the moving image can be significantly improved. When triple-frame rate driving is performed, quality of moving images can be improved compared with the case where the frame rate is lower than that of triple-frame rate driving, and power consumption and manufacturing cost can be reduced compared with the case where the frame rate is higher than that of triple-frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/3 of a cycle of input image data, image quality can be improved.

For example, in the first step, when n=4 and m=1, that is, when the conversion ratio (n/m) is 4, a driving method as shown in the point where n=4 and m=1 in FIG. 14 is performed. At this time, the display frame rate is eight times a frame rate of image data to be input (8-fold frame rate driving). Specifically, for example, when the input frame rate is 60 Hz, the display frame rate is 480 Hz (480 Hz driving). Accordingly, eight images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 8-fold frame rate driving is performed, quality of moving images can be improved compared with the case where the frame rate is lower than that of 8-fold frame rate driving, and power consumption and manufacturing cost can be reduced compared with the case where the frame rate is higher than that of 8-fold frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 480 Hz driving and alternating-current driving of a liquid crystal display device is effective. That is, when driving frequency of the liquid crystal display device is 480 Hz and frequency of alternating-current driving is an integer multiple of 480 Hz or a unit fraction of 480 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately 1/8 of a cycle of input image data, image quality can be improved.

For example, in the first step, when n=4 and m=3, that is, when the conversion ratio (n/m) is 4/3, a driving method as shown in the point where n=4 and m=3 in FIG. 14 is performed. At this time, the display frame rate is 8/3 times a frame rate of image data to be input (8/3-fold frame rate driving). Specifically, for example, when the input frame rate is 60 Hz, the display frame rate is 160 Hz (160 Hz driving). Accordingly, eight images are continuously displayed with respect to three pieces of image data to be input. At this time, when an interpolation image in the first step is an intermediate image obtained by motion compensation, the movement of moving images can be made to be smooth; thus, quality of the moving image can be significantly improved. When 8/3-fold frame rate driving is performed, quality of moving images can be improved compared with the case where the frame rate is lower than that of 8/3-fold frame rate driving, and power consumption and manufacturing cost can be reduced compared with the case where the frame rate is higher than that of 8/3-fold frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 160 Hz driving and alternating-current driving of a liquid crystal display device is effective. That is, when driving frequency of the liquid crystal display device is 160 Hz and frequency of alternating-current driving is an integer multiple of 160 Hz or a unit fraction of 160 Hz (e.g., 40 Hz, 80 Hz, 160 Hz, or 320 Hz), flickers which appear in alternating-current driving can be reduced to a level that cannot be perceived by human eyes. Moreover, when the driving method is applied to a liquid crystal display device in which response time of a liquid crystal element is approximately 3/8 of a cycle of input image data, image quality can be improved.

For example, in the first step, when n=5 and m=1, that is, when the conversion ratio (n/m) is 5, a driving method as shown in the point where n=5 and m=1 in FIG. 14 is performed. At this time, the display frame rate is ten times a frame rate of image data to be input (10-fold frame rate driving). Specifically, for example, when the input frame rate is 60 Hz, the display frame rate is 600 Hz (600 Hz driving). Accordingly, ten images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 10-fold frame rate driving is performed, quality of moving images can be improved compared with the case where the frame rate is lower than that of 10-fold frame rate driving, and power consumption and manufacturing cost can be reduced compared with the case where the frame rate is higher than that of 10-fold frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 600 Hz driving and alternating-current driving of a liquid crystal display device is effective. That is, when driving frequency of the liquid crystal display device is 600 Hz and frequency of alternating-current driving is an integer multiple of 600 Hz or a unit fraction of 600 Hz (e.g., 30 Hz, 60 Hz, 100 Hz, or 120 Hz), flickers which appear in alternating-current driving can be reduced to a level that cannot be perceived by human eyes. Moreover, when the driving method is applied to a liquid crystal display device in which response time of a liquid crystal element is approximately 1/10 of a cycle of input image data, image quality can be improved.

For example, in the first step, when n=5 and m=2, that is, when the conversion ratio (n/m) is 5/2, a driving method as shown in the point where n=5 and m=2 in FIG. 14 is performed. At this time, the display frame rate is five times a frame rate of image data to be input (5-fold frame rate driving). Specifically, for example, when the input frame rate is 60 Hz, the display frame rate is 300 Hz (300 Hz driving). Accordingly, five images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 5-fold frame rate driving is performed, quality of moving images can be improved compared with the case where the frame rate is lower than that of 5-fold frame rate driving, and power consumption and manufacturing cost can be reduced compared with the case where the frame rate is higher than that of 5-fold frame rate driving. Further, in the procedure 1 of the second step, when a time division gray scale control method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced to a level that cannot be perceived by human eyes. Moreover, when the driving method is applied to a liquid crystal display device in which response time of a liquid crystal element is approximately 1/5 of a cycle of input image data, image quality can be improved.

As described above, when a time division gray scale control method is selected in the procedure 1 of the second step among methods where brightness of an original image is divided between a plurality of sub-images, the number of sub-images is decided to be 2 in the procedure 2 of the second step, and $T_1=T_2=T/2$ is decided in the procedure 3 of the second step, the frame rate can be twice that of frame rate conversion of the conversion ratio decided by values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a time division gray scale method is selected among methods where brightness of an original image is divided between a plurality of sub-images, an operation of the circuit which forms an intermediate image by motion compensation can be stopped or the circuit itself can be omitted from the device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(twice the conversion ratio) of a cycle of input image data, image quality can be improved.

Note that although detailed description is omitted, it is apparent that conversion ratios other than those described above have similar advantages. For example, in the range that n is equal to or less than 10, the combinations can be considered as follows other than those described above: n=5 and m=3, that is, conversion ratio (n/m) of 5/3 (10/3-fold frame rate driving, 200 Hz); n=5 and m=4, that is, conversion ratio (n/m) of 5/4 (5/2-fold frame rate driving, 150 Hz); n=6 and m=1, that is, conversion ratio (n/m) of 6 (12-fold frame rate driving, 720 Hz); n=6 and m=5, that is, conversion ratio (n/m) of 6/5 (12/5-fold frame rate driving, 144 Hz); n=7 and m=1, that is, conversion ratio (n/m) of 7 (14-fold frame rate driving, 840 Hz); n=7 and m=2, that is, conversion ratio (n/m) of 7/2 (7-fold frame rate driving, 420 Hz); n=7 and m=3, that is, conversion ratio (n/m) of 7/3 (14/3-fold frame rate driving, 280 Hz); n=7 and m=4, that is, conversion ratio (n/m) of 7/4 (7/2-fold frame rate driving, 210 Hz); n=7 and m=5, that is, conversion ratio (n/m) of 7/5 (14/5-fold frame rate driving, 168 Hz); n=7 and m=6, that is, conversion ratio (n/m) of 7/6 (7/3-fold frame rate driving, 140 Hz); n=8 and m=1, that is, conversion ratio (n/m) of 8 (16-fold frame rate driving, 960 Hz); n=8 and m=3, that is, conversion ratio (n/m) of 8/3 (16/3-fold frame rate driving, 320 Hz); n=8 and m=5, that is, conversion ratio (n/m) of 8/5 (16/5-fold frame rate driving, 192 Hz); n=8 and m=7, that is, conversion ratio (n/m) of 8/7 (16/7-fold frame rate driving, 137 Hz); n=9 and m=1, that is, conversion ratio (n/m) of 9 (18-fold frame rate driving, 1080 Hz); n=9 and m=2, that is, conversion ratio (n/m) of 9/2 (9-fold frame rate driving, 540 Hz); n=9 and m=4, that is, conversion ratio (n/m) of 9/4 (9/2-fold frame rate driving, 270 Hz); n=9 and m=5, that is, conversion ratio (n/m) of 9/5 (18/5-fold frame rate driving, 216 Hz); n=9 and m=7, that is, conversion ratio (n/m) of 9/7 (18/7-fold frame rate driving, 154 Hz); n=9 and m=8, that is, conversion ratio (n/m) of 9/8 (9/4-fold frame rate driving, 135 Hz); n=10 and m=1, that is, conversion ratio (n/m) of 10 (20-fold frame rate driving, 1200 Hz); n=10 and m=3, that is, conversion ratio (n/m) of 10/3 (20/3-fold frame rate driving, 400 Hz); n=10 and m=7, that is, conversion ratio (n/m) of 10/7 (20/7-fold frame rate driving, 171 Hz); and n=10 and m=9, that is, conversion ratio (n/m) of 10/9 (20/9-fold frame rate driving, 133 Hz). Note that these frequencies are examples in the case where the input frame rate is 60 Hz. In the case of other frequencies, the driving frequency is obtained by multiplication of the doubled conversion ratio by the input frame rate.

Although specific numbers of n and m in the case where n is an integer larger than 10 are not shown, it is apparent that the processes in the second step can be applied to a variety of combinations of n and m.

Although this embodiment mode describes the case where the number J of sub-images is decided to be 2 in the procedure 2 and $T_1=T_2=T/2$ is decided in the procedure 3, it is apparent that the invention is not limited thereto.

For example, when $T_1<T_2$ is decided in the procedure 3 of the second step, the first sub-image can be made brighter and the second sub-image can be made darker. Further, when $T_1>T_2$ is decided in the procedure 3 of the second step, the first sub-image can be made darker and the second sub-image can be made brighter. Accordingly, an original image can be well perceived by human eyes, and at the same time, display can be performed by pseudo impulse driving; thus, quality of moving images can be improved.

In addition, in the procedure 2, it is apparent that the number J of sub-images is not limited to 2, and values other than 2 may be employed. In this case, the display frame rate can be J times the frame rate of frame rate conversion of the conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a time division gray scale control method is selected among methods where brightness of an original image is divided between a plurality of sub-images, an operation of the circuit which forms an intermediate image by motion compensation can be stopped or the circuit itself can be omitted from the device; thus, power consumption and manufacturing cost of the device can be reduced. Moreover, a pseudo impulse display method can be employed, so that quality of moving images can be improved. Furthermore, since brightness of the display device is not reduced, power consumption can be further reduced. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(J times of the conversion ratio) of a cycle of input image data, image quality can be improved.

For example, in the case where J=3, in particular, quality of moving images can be improved compared with the case where the number of sub-images is less than 3. Moreover, power consumption and manufacturing cost can be reduced compared with the case where the number of sub-images is more than 3. Further, when the driving method is applied to a liquid crystal display device in which response time of a liquid crystal element is approximately 1/(three times of the conversion ratio) of a cycle of input image data, image quality can be improved.

For example, in the case where J=4, in particular, quality of moving images can be improved compared with the case where the number of sub-images is less than 4. Moreover, power consumption and manufacturing cost can be reduced compared with the case where the number of sub-images is more than 4. Further, when the driving method is applied to a liquid crystal display device in which response time of a liquid crystal element is approximately 1/(four times of the conversion ratio) of a cycle of input image data, image quality can be improved.

In addition, for example, in the case where J=5, in particular, quality of moving images can be improved compared with the case where the number of sub-images is less than 5. Moreover, power consumption and manufacturing cost can be reduced compared with the case where the number of sub-images is more than 5. Further, when the driving method is applied to a liquid crystal display device in which response time of a liquid crystal element is approximately 1/(five times of the conversion ratio) of a cycle of input image data, image quality can be improved.

Further, J other than those described above has similar advantages.

Next, another example of a driving method determined by the processes in the second step is described in detail by the use of specific values of n and m in the first step.

In the procedure 1 of the second step, when a gamma correction method is selected among methods of dividing brightness of an original image between a plurality of sub-images, the driving method is as follows.

The i-th image data (i is a positive integer) and the (i+1)th image data are sequentially prepared in a certain period T. The period is divided into J number of sub-image display periods (J is an integer of 2 or more). The i-th image data can give respective specific values of brightness L to a plurality of pixels. The j-th sub-image (j is an integer of 1 to J) is formed by arranging a plurality of pixels each having the specific brightness $L_j$ and is displayed in the j-th sub-image display period $T_j$. In a driving method of a display device in which L, T, $L_j$, and $T_j$ satisfy Formulae 1 and 2, in each sub-image, characteristics of change in brightness with respect to gray scales changes from a linear shape, and the sum of the amount of brightness which is deviated to the brighter side and the sum of the amount of brightness which is deviated to the darker side are approximately the same in all the gray scales. As the image data which is sequentially prepared in the certain period T, original image data formed in the first step can be used. That is, all the display patterns given in the explanation for the first step can be combined with the above-described driving method.

Then, when the number J of sub-images is decided to be 2 in the procedure 2 of the second step and $T_1=T_2=T/2$ is decided in the procedure 3, the above-described driving method is as shown in FIG. 14. In FIG. 14, the horizontal axis represents time, and the vertical axis represents cases for various combinations of n and m used in the first step.

For example, when n=1 and m=1, that is, the conversion ratio (n/m) is 1 in the first step, a driving method as shown in the point where n=1 and m=1 in FIG. 14 is performed. At this time, the display frame rate is twice a frame rate of image data to be input (double-frame rate driving). Specifically, for example, when the input frame rate is 60 Hz, the display frame rate is 120 Hz (120 Hz driving). Accordingly, two images are continuously displayed with respect to one piece of image data to be input. When double-frame rate driving is performed, quality of moving images can be improved compared with the case where the frame rate is lower than that of double-frame rate driving, and power consumption and manufacturing cost can be reduced compared with the case where the frame rate is higher than that of double-frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. When the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 120 Hz driving and alternating-current driving of a liquid crystal display device is effective. That is, when driving frequency of the liquid crystal display device is 120 Hz and frequency of alternating-current driving is an integer multiple of 120 Hz or a unit fraction of 120 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately half a cycle of input image data, image quality can be improved.

For example, when n=2 and m=1, that is, the conversion ratio (n/m) is 2 in the first step, a driving method as shown in the point where n=2 and m=1 in FIG. 14 is performed. At this time, the display frame rate is four times a frame rate of image data to be input (quadruple-frame rate driving). Specifically, for example, when the input frame rate is 60 Hz, the display frame rate is 240 Hz (240 Hz driving). Accordingly, four images are continuously displayed with respect to one piece of image data to be input. At this time, when an interpolation image in the first step is an intermediate image obtained by motion compensation, the movement of moving images can be made to be smooth; thus, quality of the moving image can be significantly improved. When quadruple-frame rate driving is performed, quality of moving images can be improved compared with the case where the frame rate is lower than that of quadruple-frame rate driving, and power consumption and manufacturing cost can be reduced compared with the case where the frame rate is higher than that of quadruple-frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. When the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 240 Hz driving and alternating-current driving of a liquid crystal display device is effective. That is, when driving frequency of the liquid crystal display device is 240 Hz and frequency of alternating-current driving is an integer multiple of 240 Hz or a unit fraction of 240 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately 1/4 of a cycle of input image data, image quality can be improved.

For example, in the first step, when n=3 and m=1, that is, when the conversion ratio (n/m) is 3, a driving method as shown in the point where n=3 and m=1 in FIG. 14 is performed. At this time, the display frame rate is six times a frame rate of image data to be input (6-fold frame rate driving). Specifically, for example, when the input frame rate is 60 Hz, the display frame rate is 360 Hz (360 Hz driving). Accordingly, six images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 6-fold frame rate driving is performed, quality of moving images can be improved compared with the case where the frame rate is lower than that of 6-fold frame rate driving, and power consumption and manufacturing cost can be reduced compared with the case where the frame rate is higher than that of 6-fold frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 360 Hz driving and alternating-current driving of a liquid crystal display device is effective. That is, when driving frequency of the liquid crystal display device is 360 Hz and frequency of alternating-current driving is an integer multiple of 360 Hz or a unit fraction of 360 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/6 of a cycle of input image data, image quality can be improved.

For example, in the first step, when n=3 and m=2, that is, when the conversion ratio (n/m) is 3/2, a driving method as shown in the point where n=3 and m=2 in FIG. 14 is performed. At this time, the display frame rate is three times a frame rate of image data to be input (triple-frame rate driving). Specifically, for example, when the input frame rate is 60 Hz, the display frame rate is 180 Hz (180 Hz driving). Accordingly, three images are continuously displayed with respect to one piece of image data to be input. At this time, when an interpolation image in the first step is an intermediate image obtained by motion compensation, the movement of moving images can be made to be smooth; thus, quality of the moving image can be significantly improved. When triple-frame rate driving is performed, quality of moving images can be improved compared with the case where the frame rate is lower than that of triple-frame rate driving, and power consumption and manufacturing cost can be reduced compared with the case where the frame rate is higher than that of triple-frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 180 Hz driving and alternating-current driving of a liquid crystal display device is effective. That is, when driving frequency of the liquid crystal display device is 180 Hz and frequency of alternating-current driving is an integer multiple of 180 Hz or a unit fraction of 180 Hz (e.g., 30 Hz, 60 Hz, 120 Hz, or 180 Hz), flickers which appear in alternating-current driving can be reduced to a level that cannot be perceived by human eyes. Moreover, when the driving method is applied to a liquid crystal display device in which response time of a liquid crystal element is approximately 1/3 of a cycle of input image data, image quality can be improved.

For example, in the first step, when n=4 and m=1, that is, when the conversion ratio (n/m) is 4, a driving method as shown in the point where n=4 and m=1 in FIG. 14 is performed. At this time, the display frame rate is eight times a frame rate of image data to be input (8-fold frame rate driving). Specifically, for example, when the input frame rate is 60 Hz, the display frame rate is 480 Hz (480 Hz driving). Accordingly, eight images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 8-fold frame rate driving is performed, quality of moving images can be improved compared with the case where the frame rate is lower than that of 8-fold frame rate driving, and power consumption and manufacturing cost can be reduced compared with the case where the frame rate is higher than that of 8-fold frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 480 Hz driving and alternating-current driving of a liquid crystal display device is effective. That is, when driving frequency of the liquid crystal display device is 480 Hz and frequency of alternating-current driving is an integer multiple of 480 Hz or a unit fraction of 480 Hz (e.g., 30 Hz, 60 Hz, 120 Hz, or 240 Hz), flickers which appear in alternating-current driving can be reduced to a level that cannot be perceived by human eyes. Moreover, when the driving method is applied to a liquid crystal display device in which response time of a liquid crystal element is approximately 1/8 of a cycle of input image data, image quality can be improved.

For example, in the first step, when n=4 and m=3, that is, when the conversion ratio (n/m) is 4/3, a driving method as shown in the point where n=4 and m=3 in FIG. 14 is performed. At this time, the display frame rate is 8/3 times a frame rate of image data to be input (8/3-fold frame rate driving). Specifically, for example, when the input frame rate is 60 Hz, the display frame rate is 160 Hz (160 Hz driving). Accordingly, eight images are continuously displayed with respect to three pieces of image data to be input. At this time, when an interpolation image in the first step is an intermediate image obtained by motion compensation, the movement of moving images can be made to be smooth; thus, quality of the moving image can be significantly improved. When 8/3-fold frame rate driving is performed, quality of moving images can be improved compared with the case where the frame rate is lower than that of 8/3-fold frame rate driving, and power consumption and manufacturing cost can be reduced compared with the case where the frame rate is higher than that of 8/3-fold frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 160 Hz driving and alternating-current driving of a liquid crystal display device is effective. That is, when driving frequency of the liquid crystal display device is 160 Hz and frequency of alternating-current driving is an integer multiple of 160 Hz or a unit fraction of 160 Hz (e.g., 40 Hz, 80 Hz, 160 Hz, or 320 Hz), flickers which appear in alternating-current driving can be reduced to a level that cannot be perceived by human eyes. Moreover, when the driving method is applied to a liquid crystal display device in which response time of a liquid crystal element is approximately 3/8 of a cycle of input image data, image quality can be improved.

For example, in the first step, when n=5 and m=1, that is, when the conversion ratio (n/m) is 5, a driving method as shown in the point where n=5 and m=1 in FIG. 14 is performed. At this time, the display frame rate is ten times a frame rate of image data to be input (10-fold frame rate driving). Specifically, for example, when the input frame rate is 60 Hz, the display frame rate is 600 Hz (600 Hz driving). Accordingly, ten images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 10-fold frame rate driving is performed, quality of moving images can be improved compared with the case where the frame rate is lower than that of 10-fold frame rate driving, and power consumption and manufacturing cost can be reduced compared with the case where the frame rate is higher than that of 10-fold frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 600 Hz driving and alternating-current driving of a liquid crystal display device is effective. That is, when driving frequency of the liquid crystal display device is 600 Hz and frequency of alternating-current driving is an integer multiple of 600 Hz or a unit fraction of 600 Hz (e.g., 30 Hz, 60 Hz, 100 Hz, or 120 Hz), flickers which appear in alternating-current driving can be reduced to a level that cannot be perceived by human eyes. Moreover, when the driving method is applied to a liquid crystal display device in which response time of a liquid crystal element is approximately 1/10 of a cycle of input image data, image quality can be improved.

For example, in the first step, when n=5 and m=2, that is, when the conversion ratio (n/m) is 5/2, a driving method as shown in the point where n=5 and m=2 in FIG. 14 is performed. At this time, the display frame rate is five times a frame rate of image data to be input (5-fold frame rate driving). Specifically, for example, when the input frame rate is 60 Hz, the display frame rate is 300 Hz (300 Hz driving). Accordingly, five images are continuously displayed with respect to one piece of image data to be input. At this time, when an interpolation image in the first step is an intermediate image obtained by motion compensation, the movement of moving images can be made to be smooth; thus, quality of the moving image can be significantly improved. When 5-fold frame rate driving is performed, quality of moving images can be improved compared with the case where the frame rate is lower than that of 5-fold frame rate driving, and power consumption and manufacturing cost can be reduced compared with the case where the frame rate is higher than that of 5-fold frame rate driving. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, a combination of 300 Hz driving and alternating-current driving of a liquid crystal display device is effective. That is, when driving frequency of the liquid crystal display device is 300 Hz and frequency of alternating-current driving is an integer multiple of 300 Hz or a unit fraction of 300 Hz (e.g., 30 Hz, 50 Hz, 60 Hz, or 100 Hz), flickers which appear in alternating-current driving can be reduced to a level that cannot be perceived by human eyes. Moreover, when the driving method is applied to a liquid crystal display device in which response time of a liquid crystal element is approximately 1/5 of a cycle of input image data, image quality can be improved.

As described above, when a gamma correction method is selected among methods where brightness of an original image is divided between a plurality of sub-images in the procedure 1 of the second step, the number of sub-images is decided to be 2 in the procedure 2 of the second step, and $T_1=T_2=T/2$ is decided in the procedure 3 of the second step, the frame rate can be twice that of frame rate conversion of the conversion ratio decided by values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(twice the conversion ratio) of a cycle of input image data, image quality can be improved.

Note that although detailed description is omitted, it is apparent that conversion ratios other than those described above have similar advantages. For example, in the range that n is equal to or less than 10, the combinations can be considered as follows other than those described above: n=5 and m=3, that is, conversion ratio (n/m) of 5/3 (10/3-fold frame rate driving, 200 Hz); n=5 and m=4, that is, conversion ratio (n/m) of 5/4 (5/2-fold frame rate driving, 150 Hz); n=6 and m=1, that is, conversion ratio (n/m) of 6 (12-fold frame rate driving, 720 Hz); n=6 and m=5, that is, conversion ratio (n/m) of 6/5 (12/5-fold frame rate driving, 144 Hz); n=7 and m=1, that is, conversion ratio (n/m) of 7 (14-fold frame rate driving, 840 Hz); n=7 and m=2, that is, conversion ratio (n/m) of 7/2 (7-fold frame rate driving, 420 Hz); n=7 and m=3, that is, conversion ratio (n/m) of 7/3 (14/3-fold frame rate driving, 280 Hz); n=7 and m=4, that is, conversion ratio (n/m) of 7/4 (7/2-fold frame rate driving, 210 Hz); n=7 and m=5, that is, conversion ratio (n/m) of 7/5 (14/5-fold frame rate driving, 168 Hz); n=7 and m=6, that is, conversion ratio (n/m) of 7/6 (7/3-fold frame rate driving, 140 Hz); n=8 and m=1, that is, conversion ratio (n/m) of 8 (16-fold frame rate driving, 960 Hz); n=8 and m=3, that is, conversion ratio (n/m) of 8/3 (16/3-fold frame rate driving, 320 Hz); n=8 and m=5, that is, conversion ratio (n/m) of 8/5 (16/5-fold frame rate driving, 192 Hz); n=8 and m=7, that is, conversion ratio (n/m) of 8/7 (16/7-fold frame rate driving, 137 Hz); n=9 and m=1, that is, conversion ratio (n/m) of 9 (18-fold frame rate driving, 1080 Hz); n=9 and m=2, that is, conversion ratio (n/m) of 9/2 (9-fold frame rate driving, 540 Hz); n=9 and m=4, that is, conversion ratio (n/m) of 9/4 (9/2-fold frame rate driving, 270 Hz); n=9 and m=5, that is, conversion ratio (n/m) of 9/5 (18/5-fold frame rate driving, 216 Hz); n=9 and m=7, that is, conversion ratio (n/m) of 9/7 (18/7-fold frame rate driving, 154 Hz); n=9 and m=8, that is, conversion ratio (n/m) of 9/8 (9/4-fold frame rate driving, 135 Hz); n=10 and m=1, that is, conversion ratio (n/m) of 10 (20-fold frame rate driving, 1200 Hz); n=10 and m=3, that is, conversion ratio (n/m) of 10/3 (20/3-fold frame rate driving, 400 Hz); n=10 and m=7, that is, conversion ratio (n/m) of 10/7 (20/7-fold frame rate driving, 171 Hz); and n=10 and m=9, that is, conversion ratio (n/m) of 10/9 (20/9-fold frame rate driving, 133 Hz). Note that these frequencies are examples in the case where the input frame rate is 60 Hz. In the case of other frequencies, the driving frequency is obtained by multiplication of the doubled conversion ratio by the input frame rate.

Although specific numbers of n and m in the case where n is an integer larger than 10 are not shown, it is apparent that the processes in the second step can be applied to a variety of combinations of n and m.

Although this embodiment mode describes the case where the number J of sub-images is decided to be 2 in the procedure 2 and $T_1=T_2=T/2$ is decided in the procedure 3, it is apparent that the invention is not limited thereto.

For example, when $T_1<T_2$ is decided in the procedure 3 of the second step, the first sub-image can be made brighter and the second sub-image can be made darker. Further, when $T_1>T_2$ is decided in the procedure 3 of the second step, the first sub-image can be made darker and the second sub-image can be made brighter. Accordingly, an original image can be well perceived by human eyes, and at the same time, display can be performed by pseudo impulse driving; thus, quality of moving images can be improved. Note that when a gamma correction method is selected in the procedure 1 among methods where brightness of an original image is divided between a plurality of sub-images, as in the above-described driving method, a gamma value may be changed in changing brightness of the sub-image. That is, the gamma value may be determined depending on display timing of the second sub-image. Accordingly, an operation of a circuit which changes brightness of the whole image can be stopped or the circuit itself can be omitted from a device; thus, power consumption and manufacturing cost of the device can be reduced.

In addition, in the procedure 2, it is apparent that the number J of sub-images is not limited to 2, and values other than 2 may be employed. In this case, the display frame rate can be J times the frame rate of frame rate conversion of the conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. Further, in the procedure 1 of the second step, when a gamma correction method is selected among methods where brightness of an original image is divided between a plurality of sub-images, an operation of a circuit which forms an intermediate image by motion compensation can be stopped or the circuit itself can be omitted from a device; thus, power consumption and manufacturing cost of the device can be reduced. Moreover, a pseudo impulse display method can be employed regardless of a gray scale value included in image data, so that quality of moving images can be improved. A sub-image may be obtained by direct gamma conversion of image data. In this case, a gamma value can be variously controlled depending on the amount of movement of moving images or the like. Furthermore, a sub-image whose gamma value is changed may be obtained by change in reference voltage of a digital-analog converter circuit (DAC), without direct gamma conversion of image data. In this case, since the image data is not directly subjected to gamma conversion, an operation of a circuit which performs gamma conversion can be stopped or the circuit itself can be omitted from a device; thus, power consumption and manufacturing cost of the device can be reduced. In the gamma correction method, since change in brightness $L_j$ of each sub-image with respect to gray scales depends on a gamma curve, each sub-image itself can smoothly express the gray scale, and quality of images which are finally perceived by human eyes can be improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(J times of the conversion ratio) of a cycle of input image data, image quality can be improved.

For example, in the case where J=3, in particular, quality of moving images can be improved compared with the case where the number of sub-images is less than 3. Moreover, power consumption and manufacturing cost can be reduced compared with the case where the number of sub-images is more than 3. Further, when the driving method is applied to a liquid crystal display device in which response time of a liquid crystal element is approximately 1/(three times of the conversion ratio) of a cycle of input image data, image quality can be improved.

For example, in the case where J=4, in particular, quality of moving images can be improved compared with the case where the number of sub-images is less than 4. Moreover, power consumption and manufacturing cost can be reduced compared with the case where the number of sub-images is more than 4. Further, when the driving method is applied to a liquid crystal display device in which response time of a liquid crystal element is approximately 1/(four times of the conversion ratio) of a cycle of input image data, image quality can be improved.

In addition, for example, in the case where J=5, in particular, quality of moving images can be improved compared with the case where the number of sub-images is less than 5. Moreover, power consumption and manufacturing cost can be reduced compared with the case where the number of sub-images is more than 5. Further, when the driving method is applied to a liquid crystal display device in which response time of a liquid crystal element is approximately 1/(five times of the conversion ratio) of a cycle of input image data, image quality can be improved.

Further, J other than those described above has similar advantages.

Next, another example of a driving method determined by the processes in the second step is described in detail.

When a method in which an intermediate image obtained by motion compensation is used as a sub-image is selected in the procedure 1 of the second step, the number J of sub-images is decided to be 2 in the procedure 2, and $T_1=T_2=T/2$ is decided in the procedure 3, a driving method determined by the processes in the second step is as follows.

In a driving method of a display device in which the i-th image data (i is a positive integer) and the (i+1)th image data are sequentially prepared in a certain period T, and the k-th image (k is a positive integer), the (k+1)th image, and the (k+2)th image are sequentially displayed at an interval which is half a cycle of original image data, the k-th image is displayed in accordance with the i-th image data, the (k+1)th image is displayed in accordance with image data corresponding to movement obtained by multiplication of the amount of movement from the i-th image data to the (i+1)th image data by 1/2, and the (k+2)th image is displayed in accordance with the (i+1)th image data. As the image data which is sequentially prepared in the certain period T, original image data formed in the first step can be used. That is, all the display patterns given in the explanation for the first step can be combined with the above-described driving method.

Note that in the above-described driving method, it is apparent that a variety of n and m used in the first step can be implemented in combination.

In the procedure 1 of the second step, an advantage in that the method in which an intermediate image obtained by motion compensation is used as a sub-image is selected is as follows. In the processes of the first step, when an intermediate image obtained by motion compensation is used as an interpolation image, a method for obtaining an intermediate image used in the first step can also be used as it is in the second step. That is, a circuit used for obtaining an intermediate image by motion compensation can be used not only in the first step but also in the second step; thus, the circuit can be effectively used, and processing efficiency can be improved. Moreover, movement of the image can be made smoother, so that quality of moving images can be further improved.

Although this embodiment mode describes the case where the number J of sub-images is decided to be 2 in the procedure 2 and $T_1=T_2=T/2$ is decided in the procedure 3, it is apparent that the invention is not limited thereto.

For example, when $T_1<T_2$ is decided in the procedure 3 of the second step, the first sub-image can be made brighter and the second sub-image can be made darker. Further, when $T_1>T_2$ is decided in the procedure 3 of the second step, the first sub-image can be made darker and the second sub-image can be made brighter. Accordingly, an original image can be well perceived by human eyes, and at the same time, display can be performed by pseudo impulse driving; thus, quality of moving images can be improved. Note that as in the above-described driving method, when the method in which an intermediate image obtained by motion compensation is used as a sub-image is selected in the procedure 2, brightness of the sub-image is not needed to be changed. This is because the intermediate image is complete in itself as an image, and thus, the image perceived by human eyes is not changed even when display timing of the second sub-image is changed. In this case, an operation of a circuit which changes brightness of the whole image can be stopped or the circuit itself can be omitted from a device; thus, power consumption and manufacturing cost of the device can be reduced.

In addition, in the procedure 2, it is apparent that the number J of sub-images is not limited to 2, and values other than 2 may be employed. In this case, the display frame rate can be J times the frame rate of frame rate conversion of the conversion ratio determined by the values of n and m in the first step; thus, quality of moving images can be further improved. Further, quality of moving images can be improved compared with the case where a display frame rate is lower than the display frame rate, and power consumption and manufacturing cost can be reduced compared with the case where a display frame rate is higher than the display frame rate. In the case where the method where an intermediate image obtained by motion compensation is used as a sub-image is selected in the procedure 1 of the second step, when an intermediate image obtained by motion compensation is used as an interpolation image in the processes of the first step, a method for obtaining an intermediate image used in the first step can also be used as it is in the second step. That is, a circuit used for obtaining an intermediate image by motion compensation can be used not only in the first step but also in the second step; thus, the circuit can be effectively used, and processing efficiency can be improved. Moreover, movement of the image can be made smoother, so that quality of moving images can be further improved. Further, when the display device is an active matrix liquid crystal display device, a problem of lack of writing voltage due to dynamic capacitance can be avoided; thus, quality of moving images can be significantly improved, in particular with respect to defects such as an afterimage and a phenomenon of a moving image in which traces are seen. Furthermore, when driving frequency of the liquid crystal display device is increased and frequency of alternating-current driving is an integer multiple of the driving frequency or a unit fraction of the driving frequency, flickers which appear in alternating-current driving can be reduced to a level that cannot be perceived by human eyes. Moreover, when the driving method is applied to a liquid crystal display device in which response time of a liquid crystal element is approximately 1/(J times of the conversion ratio) of a cycle of input image data, image quality can be improved.

For example, in the case where J=3, in particular, quality of moving images can be improved compared with the case where the number of sub-images is less than 3. Moreover, power consumption and manufacturing cost can be reduced compared with the case where the number of sub-images is more than 3. Further, when the driving method is applied to a liquid crystal display device in which response time of a liquid crystal element is approximately 1/(three times of the conversion ratio) of a cycle of input image data, image quality can be improved.

For example, in the case where J=4, in particular, quality of moving images can be improved compared with the case where the number of sub-images is less than 4. Moreover, power consumption and manufacturing cost can be reduced compared with the case where the number of sub-images is more than 4. Further, when the driving method is applied to a liquid crystal display device in which response time of a liquid crystal element is approximately 1/(four times of the conversion ratio) of a cycle of input image data, image quality can be improved.

In addition, for example, in the case where J=5, in particular, quality of moving images can be improved compared with the case where the number of sub-images is less than 5. Moreover, power consumption and manufacturing cost can be reduced compared with the case where the number of sub-images is more than 5. Further, when the driving method is applied to a liquid crystal display device in which response time of a liquid crystal element is approximately 1/(five times of the conversion ratio) of a cycle of input image data, image quality can be improved.

Further, J other than those described above has similar advantages.

Next, specific examples of a method for converting the frame rate when the input frame rate and the display frame rate are different are described with reference to FIGS. 16A to 16C. In methods shown in FIGS. 16A to 16C, circular regions in images are changed from frame to frame, and triangle regions in the images are hardly changed from frame to frame. Note that the images are only examples for explanation, and the images to be displayed are not limited to these examples. The methods shown in FIGS. 16A to 16C can be applied to a variety of images.

Figure 16A:
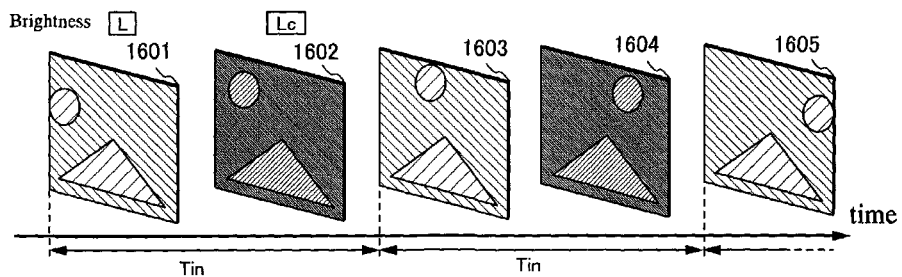
FIGS. 16A to 16C each illustrate one mode of a display device of the invention.

FIG. 16A shows the case where the display frame rate is twice as high as the input frame rate (the conversion ratio is 2). When the conversion ratio is 2, quality of moving images can be improved compared with the case where the conversion ratio is less than 2. Further, when the conversion ratio is 2, power consumption and manufacturing cost can be reduced compared with the case where the conversion ratio is more than 2. FIG. 16A schematically shows time change in images to be displayed with time represented by the horizontal axis. Here, a focused image is referred to as a p-th image p is a positive integer). An image displayed after the focused image is referred to as a (p+1)th image, and an image displayed before the focused image is referred to as a (p−1)th image, for example. Thus, how far an image to be displayed is apart from the focused image is described for convenience. An image 1602 is the (p+1)th image. An image 1603 is a (p+2)th image. An image 1604 is a (p+3)th image. An image 1605 is a (p+4)th image. The period $T_{in}$ represents a cycle of input image data.

Note that since FIG. 16A shows the case where the conversion ratio is 2, the period $T_{in}$ is twice as long as a period after the p-th image is displayed until the (p+1)th image is displayed.

Here, the (p+1)th image 1602 may be an image which is made to be in an intermediate state between the p-th image 1601 and the (p+2)th image 1603 by detecting the amount of change in the images from the p-th image 1601 to the (p+2)th image 1603. FIG. 16A shows an image in an intermediate state by a region whose position is changed from frame to frame (the circular region) and a region whose position is hardly changed from frame to frame (the triangle region). In other words, the position of the circular region in the (p+1)th image 1602 is an intermediate position between the positions of the circular regions in the p-th image 1601 and the (p+2)th image 1603. That is, as for the (p+1)th image 1602, image data is interpolated by motion compensation. When motion compensation is performed on a moving object on the image in this manner to interpolate the image data, smooth display can be performed.

Further, the (p+1)th image 1602 may be an image which is made to be in an intermediate state between the p-th image 1601 and the (p+2)th image 1603 and may have luminance controlled by a certain rule. As the certain rule, for example, $L > L_c$ may be satisfied when typical luminance of the p-th image 1601 is denoted by L and typical luminance of the (p+1)th image 1602 is denoted by $L_c$, as shown in FIG. 16A. Preferably, $0.1L < L_c < 0.8L$ is satisfied, and more preferably $0.2L < L_c < 0.5L$ is satisfied. Alternatively, $L < L_c$ may be satisfied, preferably $0.1L_c < L < 0.8L_c$ is satisfied, and more preferably $0.2L_c < L < 0.5L_c$ is satisfied. In this manner, display can be made pseudo impulse display, so that an afterimage perceived by human eyes can be suppressed.

Note that typical luminance of the images will be described later in detail with reference to FIGS. 17A to 17E.

When two different causes of motion blur (non-smoothness in movement of images and an afterimage perceived by human eyes) are removed at the same time in this manner, motion blur can be considerably reduced.

Moreover, the (p+3)th image 1604 may also be formed from the (p+2)th image 1603 and the (p+4)th image 1605 by using a similar method. That is, the (p+3)th image 1604 may be an image which is made to be in an intermediate state between the (p+2)th image 1603 and the (p+4)th image 1605 by detecting the amount of change in the images from the (p+2)th image 1603 to the (p+4)th image 1605 and may have luminance controlled by a certain rule.

Figure 16B:
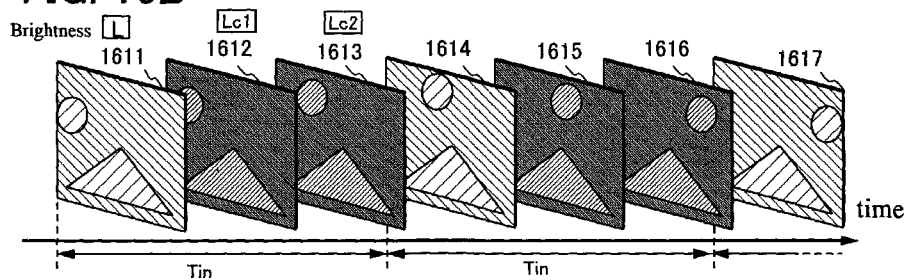

FIG. 16B shows the case where the display frame rate is three times as high as the input frame rate (the conversion ratio is 3). FIG. 16B schematically shows time change in images to be displayed with time represented by the horizontal axis. An image 1611 is the p-th image. An image 1612 is the (p+1)th image. An image 1613 is a (p+2)th image. An image 1614 is a (p+3)th image. An image 1615 is a (p+4)th image An image 1616 is a (p+5)th image. An image 1617 is a (p+6)th image. The period $T_{in}$ represents a cycle of input image data. Note that since FIG. 16B shows the case where the conversion ratio is 3, the period $T_{in}$ is three times as long as a period after the p-th image is displayed until the (p+1)th image is displayed.

Each of the (p+1)th image 1612 and the (p+2)th image 1613 may be an image which is made to be in an intermediate state between the p-th image 1611 and the (p+3)th image 1614 by detecting the amount of change in the images from the p-th image 1611 to the (p+3)th image 1614. FIG. 16B shows an image in an intermediate state by a region whose position is changed from frame to frame (the circular region) and a region whose position is hardly changed from frame to frame (the triangle region). That is, the position of the circular region in each of the (p+1)th image 1612 and the (p+2)th image 1613 is an intermediate position between the positions of the circular regions in the p-th image 1611 and the (p+3)th image 1614. Specifically, when the amount of movement of the circular regions detected from the p-th image 1611 and the (p+3)th image 1614 is denoted by X, the position of the circular region in the (p+1)th image 1612 may be displaced by approximately (1/3)X from the position of the circular region in the p-th image 1611. Further, the position of the circular region in the (p+2)th image 1613 may be displaced by approximately (2/3)X from the position of the circular region in the p-th image 1611. That is, as for each of the (p+1)th image 1612 and the (p+2)th image 1613, image data is interpolated by motion compensation. When motion compensation is performed on a moving object on the image in this manner to interpolate the image data, smooth display can be performed.

Further, each of the (p+1)th image 1612 and the (p+2)th image 1613 may be an image which is made to be in an intermediate state between the p-th image 1611 and the (p+3)th image 1614 and may have luminance controlled by a certain rule. As the certain rule, for example, $L > L_{c1}$, $L > L_{c2}$, or $L_{c1} = L_{c2}$ may be satisfied when typical luminance of the p-th image 1611 is denoted by L, typical luminance of the (p+1)th image 1612 is denoted by $L_{c1}$, and typical luminance of the (p+2)th image 1613 is denoted by $L_{c2}$, as shown in FIG. 16B. Preferably, $0.1L < L_{c1} = L_{c2} < 0.8L$ is satisfied, and more preferably $0.2L < L_{c} = L_{c2} < 0.5L$ is satisfied. Alternatively, $L < L_{c1}$, $L < L_{c2}$, or $L_{c1} = L_{c2}$ may be satisfied, preferably $0.1L_{c1} = 0.1L_{c2} < L = 0.8L_{c1} = 0.8L_{c2}$ is satisfied, and more preferably $0.2L_{c1} = 0.2L_{c2} < L = 0.5L_{c1} = 0.5L_{c2}$ is satisfied. In this manner, display can be made pseudo impulse display, so that an afterimage perceived by human eyes can be suppressed. Alternatively, images each of which luminance is changed may be made to appear alternately. In such a manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Moreover, each of the (p+4)th image 1615 and the (p+5)th image 1616 may also be formed from the (p+3)th image 1614 and the (p+6)th image 1617 by using a similar method. That is, each of the (p+4)th image 1615 and the (p+5)th image 1616 may be an image which is made to be in an intermediate state between the (p+3)th image 1614 and the (p+6)th image 1617 by detecting the amount of change in the images from the (p+3)th image 1614 to the (p+6)th image 1617 and may have luminance controlled by a certain rule.

Note that when the method shown in FIG. 16B is used, the display frame rate is so high that movement of the image can follow movement of human eyes; thus, movement of the image can be displayed smoothly. Accordingly, motion blur can be considerably reduced.

Figure 16C:
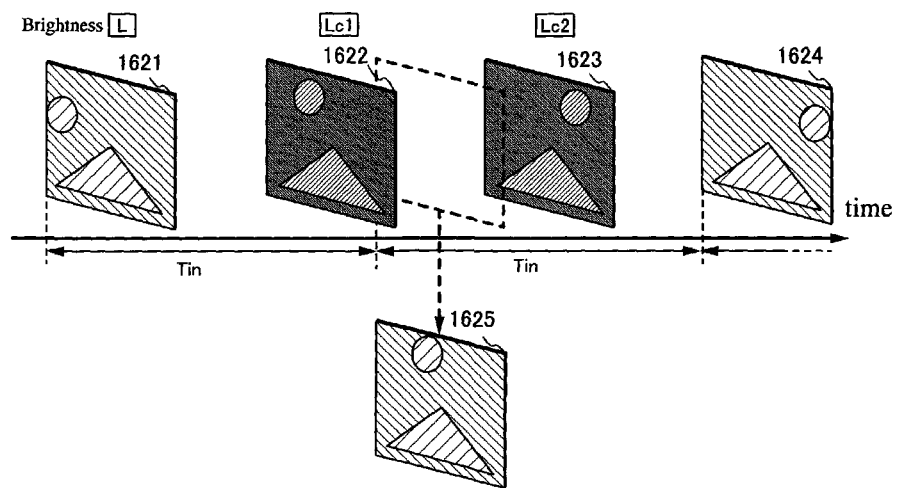

FIG. 16C shows the case where the display frame rate is 1.5 times as high as the input frame rate (the conversion ratio is 1.5). FIG. 16C schematically shows time change in images to be displayed with time represented by the horizontal axis. An image 1622 is the (p+1)th image. An image 1623 is the (p+2)th image. An image 1624 is the (p+3)th image. Note that although not necessarily displayed in practice, an image 1625, which is input image data, may be used to form the (p+1)th image 1622 and the (p+2)th image 1623. The period $T_{in}$ represents a cycle of input image data. Note that since FIG. 16C shows the case where the conversion ratio is 1.5, the period $T_{in}$ is 1.5 times as long as a period after the p-th image is displayed until the (p+1)th image is displayed.

Here, each of the (p+1)th image 1622 and the (p+2)th image 1623 may be an image which is made to be in an intermediate state between the p-th image 1621 and the (p+3)th image 1624 by detecting the amount of change in the images from the p-th image 1621 to the (p+3)th image 1624 via the image 1625. FIG. 16C shows an image in an intermediate state by a region whose position is changed from frame to frame (the circular region) and a region whose position is hardly changed from frame to frame (the triangle region). That is, the position of the circular region in each of the (p+1)th image 1622 and the (p+2)th image 1623 is an intermediate position between the positions of the circular regions in the p-th image 1621 and the (p+3)th image 1624. That is, as for each of the (p+1)th image 1622 and the (p+2)th image 1623, image data is interpolated by motion compensation. When motion compensation is performed on a moving object on the image in this manner to interpolate the image data, smooth display can be performed.

Further, each of the (p+1)th image 1622 and the (p+2)th image 1623 may be an image which is made to be in an intermediate state between the p-th image 1621 and the (p+3)th image 1624 and may have luminance controlled by a certain rule. As the certain rule, for example, $L > L_{c1}$, $L > L_{c2}$, or $L_{c1} = L_{c2}$ is satisfied when typical luminance of the p-th image 1621 is denoted by L, typical luminance of the (p+1)th image 1622 is denoted by $L_{c1}$, and typical luminance of the (p+2)th image 1623 is denoted by $L_{c2}$, as shown in FIG. 16C. Preferably, $0.1L < L_{c1} = L_{c2} < 0.8L$ is satisfied, and more preferably $0.2L < L_{c1} = L_{c2} < 0.5L$ is satisfied. Alternatively, $L < L_{c1}$, $L < L_{c2}$, or $L_{c1} = L_{c2}$ may be satisfied, preferably $0.1L_{c1} = 0.1L_{c2} < L = 0.8L_{c1} = 0.8L_{c2}$ is satisfied, and more preferably $0.2L_{c1} = 0.2L_{c2} < L = 0.5L_{c1} = 0.5L_{c2}$ is satisfied. In this manner, display can be made pseudo impulse display, so that an afterimage perceived by human eyes can be suppressed. Alternatively, images each of which luminance is changed may be made to appear alternately. In this manner, a cycle of luminance change can be shortened, so that flickers can be reduced.

When two different causes of motion blur (non-smoothness in movement of images and an afterimage perceived by human eyes) are removed at the same time in this manner, motion blur can be considerably reduced.

Note that when the method shown in FIG. 16C is used, the display frame rate is so low that time for writing a signal to a display device can be increased. Accordingly, clock frequency of the display device can be made lower, so that power consumption can be reduced. Further, processing speed of motion compensation can be decreased, so that power consumption can be reduced.

Next, typical luminance of images is described with reference to FIGS. 17A to 17E. FIGS. 17A to 17D each schematically show time change in images to be displayed with time represented by the horizontal axis. FIG. 17E shows an example of a method for measuring luminance of an image in a certain region.

An example of a method for measuring luminance of an image includes a method for individually measuring luminance of each pixel which forms the image. With this method, luminance in every detail of the image can be strictly measured.

Note that since a method for individually measuring luminance of each pixel which forms the image needs much energy, another method may be used. Another method for measuring luminance of an image is a method for measuring average luminance of a region in an image, which is focused.

With this method, luminance of an image can be easily measured. In this embodiment mode, luminance measured by a method for measuring average luminance of a region in an image is referred to as typical luminance of an image for convenience.

Then, which region in an image is focused in order to measure typical luminance of the image is described below.

Figure 17A:
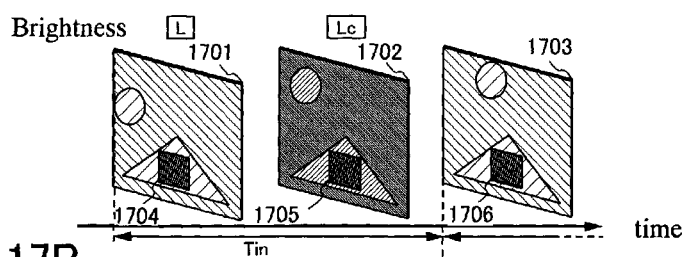
FIGS. 17A to 17E each illustrate one mode of a display device of the invention.

FIG. 17A shows an example of a measuring method in which luminance of a region whose position is hardly changed with respect to change in an image (the triangle region) is typical luminance of the image. The period $T_{in}$ represents a cycle of input image data. An image 1701 is the p-th image. An image 1702 is the (p+1)th image. An image 1703 is the (p+2)th image. A first region 1704 is a luminance measurement region in the p-th image 1701. A second region 1705 is a luminance measurement region in the (p+1)th image 1702. A third region 1706 is a luminance measurement region in the (p+2)th image 1703. Here, the first to third regions may be provided in almost the same spatial positions in a device. That is, when typical luminance of the images is measured in the first to third regions, time change in typical luminance of the images can be calculated.

When the typical luminance of the images is measured, whether display is made pseudo impulse display or not can be judged. For example, if $L_c<L$ is satisfied when luminance measured in the first region 1704 is denoted by L and luminance measured in the second region 1705 is denoted by $L_c$, it can be said that display is made pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 1704 and the second region 1705 can be the ratio of lower luminance to higher luminance; relative luminance between the second region 1705 and the third region 1706 can be the ratio of lower luminance to higher luminance; and relative luminance between the first region 1704 and the third region 1706 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 17B:
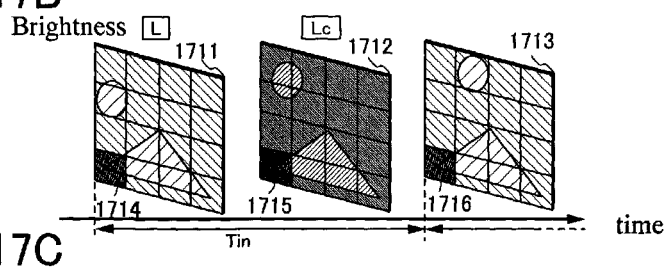

FIG. 17B shows an example of a method in which luminance of regions which are divided into tiled shapes is measured and an average value thereof is typical luminance of an image. The period $T_{in}$ represents a cycle of input image data. An image 1711 is the p-th image. An image 1712 is the (p+1)th image. An image 1713 is the (p+2)th image. A first region 1714 is a luminance measurement region in the p-th image 1711. A second region 1715 is a luminance measurement region in the (p+1)th image 1712. A third region 1716 is a luminance measurement region in the (p+2)th image 1713. Here, the first to third regions may be provided in almost the same spatial positions in a device. That is, when typical luminance of the images is measured in the first to third regions, time change in typical luminance of the images can be measured.

When the typical luminance of the images is measured, whether display is made pseudo impulse display or not can be judged. For example, if $L_c<L$ is satisfied when luminance measured in the first region 1714 is denoted by L and luminance measured in the second region 1715 is denoted by $L_c$, it can be said that display is made pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 1714 and the second region 1715 can be the ratio of lower luminance to higher luminance; relative luminance between the second region 1715 and the third region 1716 can be the ratio of lower luminance to higher luminance; and relative luminance between the first region 1714 and the third region 1716 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 17C:
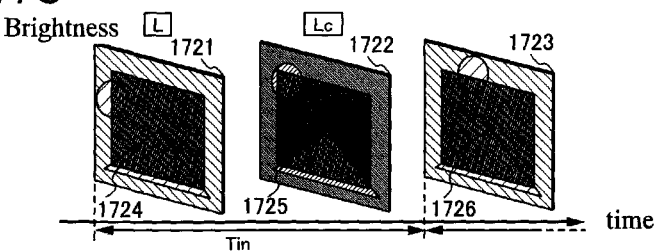

FIG. 17C shows an example of a method in which luminance of a center region in an image is measured and an average value thereof is typical luminance of the image. The period $T_{in}$ represents a cycle of input image data. An image 1721 is the p-th image. An image 1722 is the (p+1)th image. An image 1723 is the (p+2)th image. A first region 1724 is a luminance measurement region in the p-th image 1721. A second region 1725 is a luminance measurement region in the (p+1)th image 1722. A third region 1726 is a luminance measurement region in the (p+2)th image 1723.

When the typical luminance of the images is measured, whether display is made pseudo impulse display or not can be judged. For example, if $L_c<L$ is satisfied when luminance measured in the first region 1724 is denoted by L and luminance measured in the second region 1725 is denoted by $L_c$, it can be said that display is made pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 1724 and the second region 1725 can be the ratio of lower luminance to higher luminance; relative luminance between the second region 1725 and the third region 1726 can be the ratio of lower luminance to higher luminance; and relative luminance between the first region 1724 and the third region 1726 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

Figure 17D:
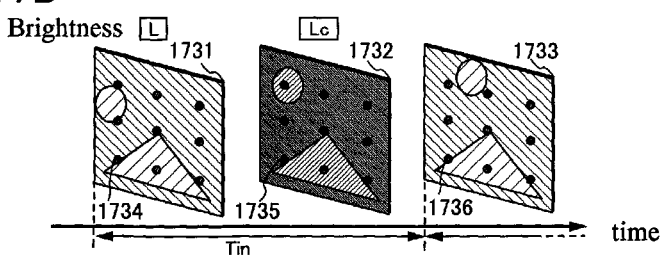
Figure 17E:
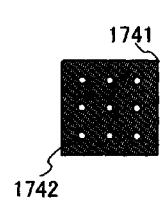

FIG. 17D shows an example of a method in which luminance of a plurality of points sampled from the entire image is measured and an average value thereof is typical luminance of the image. The period $T_{in}$ represents a cycle of input image data. An image 1731 is the p-th image. An image 1732 is the (p+1)th image. An image 1733 is the (p+2)th image. A first region 1734 is a luminance measurement region in the p-th image 1731. A second region 1735 is a luminance measurement region in the (p+1)th image 1732. A third region 1736 is a luminance measurement region in the (p+2)th image 1733.

When the typical luminance of the images is measured, whether display is made pseudo impulse display or not can be judged. For example, if $L_c < L$ is satisfied when luminance measured in the first region 1734 is denoted by L and luminance measured in the second region 1735 is denoted by $L_c$, it can be said that display is made pseudo impulse display. At that time, it can be said that quality of moving images is improved.

Note that when the amount of change in typical luminance of the images with respect to time change (relative luminance) in the luminance measurement regions is in the following range, image quality can be improved. As for relative luminance, for example, relative luminance between the first region 1734 and the second region 1735 can be the ratio of lower luminance to higher luminance; relative luminance between the second region 1735 and the third region 1736 can be the ratio of lower luminance to higher luminance; and relative luminance between the first region 1734 and the third region 1736 can be the ratio of lower luminance to higher luminance. That is, when the amount of change in typical luminance of the images with respect to time change (relative luminance) is 0, relative luminance is 100%. When the relative luminance is less than or equal to 80%, quality of moving images can be improved. In particular, when the relative luminance is less than or equal to 50%, quality of moving images can be significantly improved. Further, when the relative luminance is more than or equal to 10%, power consumption and flickers can be reduced. In particular, when the relative luminance is more than or equal to 20%, power consumption and flickers can be significantly reduced. That is, when the relative luminance is more than or equal to 10% and less than or equal to 80%, quality of moving images can be improved and power consumption and flickers can be reduced. Further, when the relative luminance is more than or equal to 20% and less than or equal to 50%, quality of moving images can be significantly improved and power consumption and flickers can be significantly reduced.

FIG. 17E shows a measurement method in the luminance measurement regions shown in FIGS. 17A to 17D. A region 1741 is a focused luminance measurement region. A point 1742 is a luminance measurement point in the luminance measurement region 1741. In a luminance measurement apparatus having high time resolution, a measurement range thereof is small in some cases. Accordingly, in the case where the region 1741 is large, instead of measuring the whole region, a plurality of points in the region 1741 may be measured uniformly by dots and an average value thereof may be the luminance of the region 174, as shown in FIG. 17E.

Note that when the image is formed using a combination of three primary colors of R, G, and B, luminance to be measured may be luminance of R, G and B, luminance of R and G, luminance of G and B, luminance of B and R, or each luminance of R, G, and B.

Next, a method for producing an image in an intermediate state by detecting movement of an image, which is included in input image data, and a method for controlling a driving method in accordance with movement of an image, which is included in input image data, or the like are described.

Figure 18A:
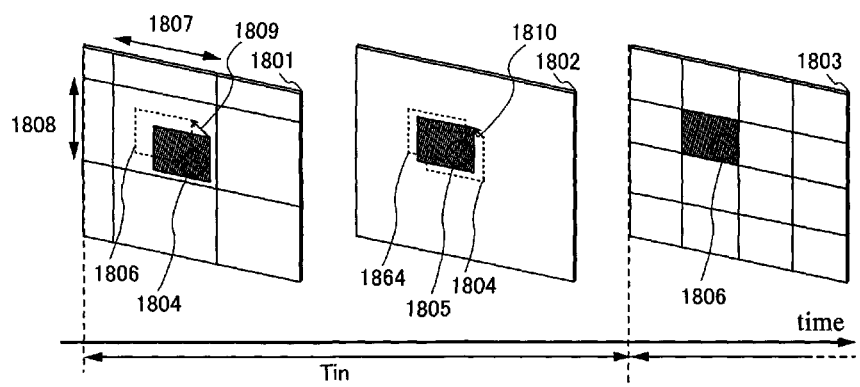
FIGS. 18A and 18B each illustrate one mode of a display device of the invention.

A method for producing an image in an intermediate state by detecting movement of an image, which is included in input image data, is described with reference to FIGS. 18A and 18B. FIG. 18A shows the case where the display frame rate is twice as high as the input frame rate (the conversion ratio is 2). FIG. 18A schematically shows a method for detecting movement of an image with time represented by the horizontal axis. The period $T_{in}$ represents a cycle of input image data. An image 1801 is the p-th image. An image 1802 is the (p+1)th image. An image 1803 is the (p+2)th image. Further, as regions which are independent of time, a first region 1804, a second region 1805, and a third region 1806 are provided in images.

First, in the (p+2)th image 1803, the image is divided into a plurality of tiled regions, and image data in the third region 1806 which is one of the regions is focused.

Next, in the p-th image 1801, a region which uses the third region 1806 as the center and is larger than the third region 1806 is focused. Here, the region which uses the third region 1806 as the center and is larger than the third region 1806 corresponds to a data retrieval region. In the data retrieval region, a range in a horizontal direction (the X direction) is denoted by reference numeral 1807, and a range in a perpendicular direction (the Y direction) is denoted by reference numeral 1808. Note that the range 1807 in the horizontal direction and the range 1808 in the perpendicular direction may be ranges in which each of a range in a horizontal direction and a range in a perpendicular direction of the third region 1806 is enlarged by approximately 15 pixels.

Then, in the data retrieval region, a region having image data which is most similar to the image data in the third region 1806 is retrieved. As a retrieval method, a least-squares method or the like can be used. As a result of retrieval, it is assumed that the first region 1804 is derived as the region having the most similar image data.

Next, as an amount which shows positional difference between the derived first region 1804 and the third region 1806, a vector 1809 is derived. Note that the vector 1809 is referred to as a motion vector.

Then, in the (p+1)th image 1802, the second region 1805 is formed by a vector 1810 calculated from the motion vector

1809, the image data in the third region 1806 in the (p+2)th image 1803, and image data in the first region 1804 in the p-th image 1801.

Here, the vector 1810 calculated from the motion vector 1809 is referred to as a displacement vector. The displacement vector 1810 has a function of determining a position in which the second region 1805 is formed. The second region 1805 is formed in a position which is apart from the third region 1806 by the displacement vector 1810. Note that the amount of the displacement vector 1810 may be an amount which is obtained by multiplication of the motion vector 1809 by a coefficient (1/2).

Image data in the second region 1805 in the (p+1)th image 1802 may be determined by the image data in the third region 1806 in the (p+2)th image 1803 and the image data in the first region 1804 in the p-th image 1801. For example, the image data in the second region 1805 in the (p+1)th image 1802 may be an average value between the image data in the third region 1806 in the (p+2)th image 1803 and the image data in the first region 1804 in the p-th image 1801.

In such a manner, the second region 1805 in the (p+1)th image 1802, which corresponds to the third region 1806 in the (p+2)th image 1803, can be formed. Note that when the above-described treatment is also performed on other regions in the (p+2)th image 1803, the (p+1)th image 1802 which is made to be in an intermediate state between the (p+2)th image 1803 and the p-th image 1801 can be formed.

Figure 18B:
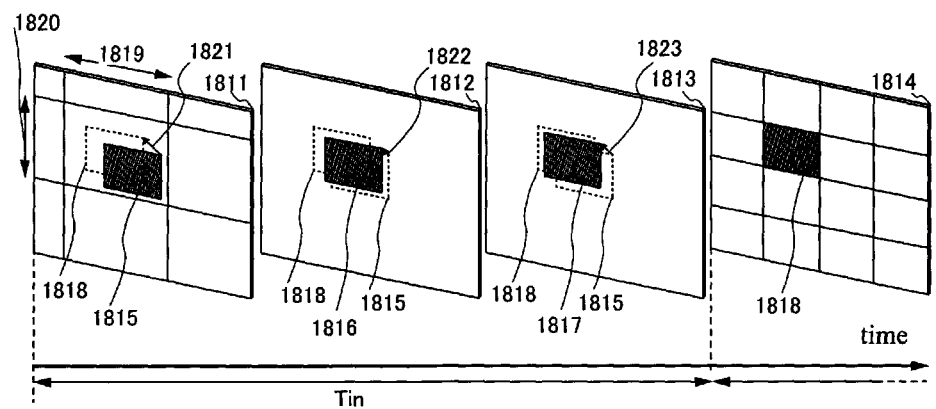

FIG. 18B shows the case where the display frame rate is three times as high as the input frame rate (the conversion ratio is 3). FIG. 18B schematically shows a method for detecting movement of an image with time represented by the horizontal axis. The period $T_{in}$ represents a cycle of input image data. An image 1811 is the p-th image. An image 1812 is the (p+1)th image. An image 1813 is the (p+2)th image. An image 1814 is the (p+3)th image. Further, as regions which are independent of time, a first region 1815, a second region 1816, a third region 1817, and a fourth region 1818 are provided in images.

First, in the (p+3)th image 1814, the image is divided into a plurality of tiled regions, and image data in the fourth region 1818 which is one of the regions is focused.

Next, in the p-th image 1811, a region which uses the fourth region 1818 as the center and is larger than the fourth region 1818 is focused. Here, the region which uses the fourth region 1811 as the center and is larger than the fourth region 1818 corresponds to a data retrieval region. In the data retrieval region, a range in a horizontal direction (the X direction) is denoted by reference numeral 1819, and a range in a perpendicular direction (the Y direction) is denoted by reference numeral 1820. Note that the region 1819 in the horizontal direction and the range 1820 in the perpendicular direction may be ranges in which each of a range in a horizontal direction and a range in a perpendicular direction of the fourth region 1818 is enlarged by approximately 15 pixels.

Then, in the data retrieval region, a region having image data which is most similar to the image data in the fourth region 1818 is retrieved. As a retrieval method, a least-squares method or the like can be used. As a result of retrieval, it is assumed that the first region 1815 is derived as the region having the most similar image data.

Next, as an amount which shows positional difference between the derived first region 1815 and the fourth region 1818, a vector 1821 is derived. Note that the vector 1821 is referred to as a motion vector.

Then, in each of the (p+1)th image 1812 and the (p+2)th image 1813, the second region 18016 and the third region 1817 are formed by a vector 1822 and a vector 1823 calculated from the motion vector 1821, the image data in the fourth region 1818 in the (p+3)th image 1814, and image data in the first region 1815 in the p-th image 1811.

Here, the vector 1822 calculated from the motion vector 1821 is referred to as a first displacement vector. Moreover, the vector 1823 is referred to as a second displacement vector. The first displacement vector 1822 has a function of determining a position in which the second region 1816 is formed. The second region 1816 is formed in a position which is apart from the fourth region 1818 by the first displacement vector 1822. Note that the first displacement vector 1822 may be an amount which is obtained by multiplication of the motion vector 1821 by a coefficient (1/3). Further, the second displacement vector 1823 has a function of determining a position in which the third region 1817 is formed. The third region 1817 is formed in a position which is apart from the fourth region 1818 by the second displacement vector 1823. Note that the second displacement vector 1823 may be an amount which is obtained by multiplication of the motion vector 1821 by a coefficient (2/3).

Image data in the second region 1816 in the (p+1)th image 1812 may be determined by the image data in the fourth region 1818 in the (p+3)th image 1814 and the image data in the first region 1815 in the p-th image 1811. For example, the image data in the second region 1816 in the (p+1)th image 1812 may be an average value between the image data in the fourth region 1818 in the (p+3)th image 1814 and the image data in the first region 1815 in the p-th image 1811.

Image data in the third region 1817 in the (p+2)th image 1813 may be determined by the image data in the fourth region 1818 in the (p+3)th image 1814 and the image data in the first region 1815 in the p-th image 1811. For example, the image data in the third region 1817 in the (p+2)th image 1813 may be an average value between the image data in the fourth region 1818 in the (p+3)th image 1814 and the image data in the first region 1815 in the p-th image 1811.

In such a manner, the second region 1816 in the (p+1)th image 1812 and the third region 1817 in the (p+2)th image 1813, which correspond to the fourth region 1818 in the (p+3)th image 1814, can be formed. Note that when the above-described treatment is also performed on other regions in the (p+3)th image 1814, the (p+1)th image 1812 and the (p+2)th image 1813 which are made to be in an intermediate state between the (p+3)th image 1814 and the p-th image 1811 can be formed.

Figure 19A:
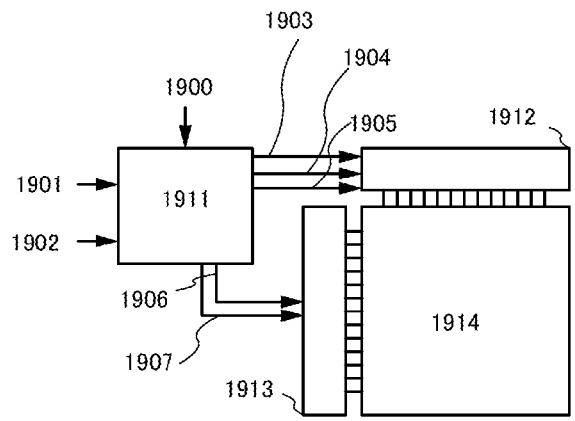
FIGS. 19A to 19D each illustrate one mode of a display device of the invention.
Figure 19B:
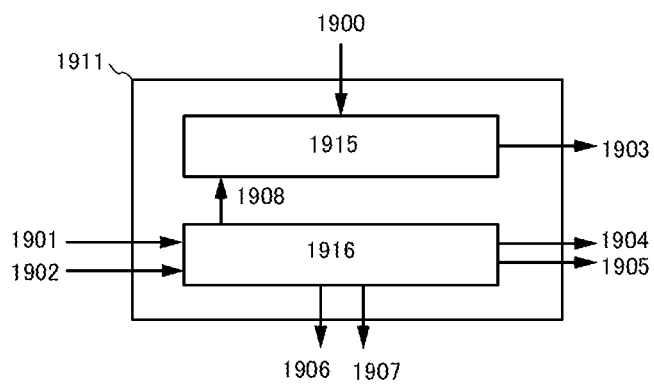
Figure 19C:
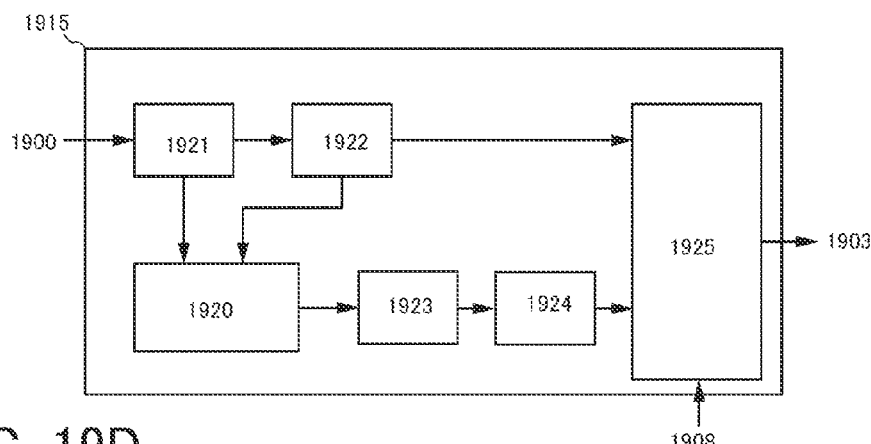
Figure 19D:
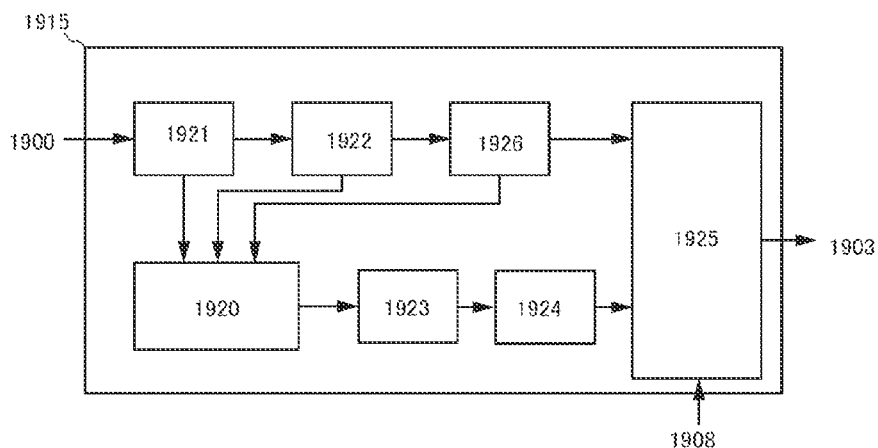

Next, an example of a circuit which produces an image in an intermediate state by detecting movement of an image, which is included in input image data, is described with reference to FIGS. 19A to 19D. FIG. 19A shows a connection relation between a peripheral driver circuit including a source driver and a gate driver for displaying an image on a display region, and a control circuit for controlling the peripheral driver circuit. FIG. 19B shows an example of a specific circuit structure of the control circuit. FIG. 19C shows an example of a specific circuit structure of an image processing circuit included in the control circuit. FIG. 19D shows another example of a specific circuit structure of the image processing circuit included in the control circuit.

As shown in FIG. 19A, a device in this embodiment mode may include a control circuit 1911, a source driver 1912, a gate driver 1913, and a display region 1914.

Note that the control circuit 1911, the source driver 1912, and the gate driver 1913 may be formed over the same substrate as the display region 1914.

Note that part of the control circuit 1911, the source driver 1912, and the gate driver 1913 may be formed over the same substrate as the display region 1914, and other circuits may be formed over a different substrate from that of the display region 1914. For example, the source driver 1912 and the gate driver 1913 may be formed over the same substrate as the display region 1914, and the control circuit 1911 may be formed over a different substrate as an external IC. Alternatively, the gate driver 1913 may be formed over the same substrate as the display region 1914, and other circuits may be formed over a different substrate as an external IC. Similarly, part of the source driver 1912, the gate driver 1913, and the control circuit 1911 may be formed over the same substrate as the display region 1914, and other circuits may be formed over a different substrate as an external IC.

The control circuit 1911 may have a structure to which an external image signal 1900, a horizontal synchronization signal 1901, and a vertical synchronization signal 1902 are input and an image signal 1903, a source start pulse 1904, a source clock 1905, a gate start pulse 1906, and a gate clock 1907 are output.

The source driver 1912 may have a structure in which the image signal 1903, the source start pulse 1904, and the source clock 1905 are input and voltage or current in accordance with the image signal 1903 is output to the display region 1914.

The gate driver 1913 may have a structure in which the gate start pulse 1906 and the gate clock 1907 are input and a signal which specifies timing for writing a signal output from the source driver 1912 to the display region 1914 is output.

When frequency of the external image signal 1900 is different from frequency of the image signal 1903, a signal for controlling timing for driving the source driver 1912 and the gate driver 1913 is also different from frequency of the horizontal synchronization signal 1901 and the vertical synchronization signal 1902 which are input. Accordingly, in addition to processing of the image signal 1903, it is necessary to process the signal for controlling timing for driving the source driver 1912 and the gate driver 1913. The control circuit 1911 may have a function of processing the signal for controlling timing for driving the source driver 1912 and the gate driver 1913. For example, when the frequency of the image signal 1903 is twice as high as the frequency of the external image signal 1900, the control circuit 1911 generates the image signal 1903 having the doubled frequency by interpolating an image signal included in the external image signal 1900, and controls the signal for controlling timing so that the signal also has the doubled frequency.

Further, as shown in FIG. 19B, the control circuit 1911 may include an image processing circuit 1915 and a timing generation circuit 1916.

The image processing circuit 1915 may have a structure in which the external image signal 1900 and a frequency control signal 1908 are input and the image signal 1903 is output.

The timing generation circuit 1916 may have a structure in which the horizontal synchronization signal 1901 and the vertical synchronization signal 1902 are input, and the source start pulse 1904, the source clock 1905, the gate start pulse 1906, the gate clock 1907, and the frequency control signal 1908 are output. Note that the timing generation circuit 1916 may include a memory, a register, or the like for holding data for specifying the state of the frequency control signal 1908. Alternatively, the timing generation circuit 1916 may have a structure in which a signal for specifying the state of the frequency control signal 1908 is input.

As shown in FIG. 19C, the image processing circuit 1915 may include a motion detection circuit 1920, a first memory 1921, a second memory 1922, a third memory 1923, a luminance control circuit 1924, and a high-speed processing circuit 1925.

The motion detection circuit 1920 may have a structure in which a plurality of pieces of image data are input, movement of an image is detected, and image data which is in an intermediate state of the plurality of pieces of image data is output.

The first memory 1921 may have a structure in which the external image signal 1900 is input, the external image signal 1900 is held for a certain period, and the external image signal 1900 is output to the motion detection circuit 1920 and the second memory 1922.

The second memory 1922 may have a structure in which image data output from the first memory 1921 is input, the image data is held for a certain period, and the image data is output to the motion detection circuit 1920 and the high-speed processing circuit 1925.

The third memory 1923 may have a structure in which image data output from the motion detection circuit 1920 is input, the image data is held for a certain period, and the image data is output to the luminance control circuit 1924.

The high-speed processing circuit 1925 may have a structure in which image data output from the second memory 1922, image data output from the luminance control circuit 1924, and the frequency control signal 1908 are input and the image data is output as the image signal 1903.

When the frequency of the external image signal 1900 is different from the frequency of the image signal 1903, the image signal 1903 may be generated by interpolating the image signal included in the external image signal 1900 by the image processing circuit 1915. The input external image signal 1900 is once held in the first memory 1921. At that time, image data which is input in the previous frame is held in the second memory 1922. The motion detection circuit 1920 may read the image data held in the first memory 1921 and the second memory 1922 as appropriate to detect a motion vector by difference between the both pieces of image data and to generate image data in an intermediate state. The generated image data in an intermediate state is held in the third memory 1923.

When the motion detection circuit 1920 generates the image data in an intermediate state, the high-speed processing circuit 1925 outputs the image data held in the second memory 1922 as the image signal 1903. After that, the image data held in the third memory 1923 is output as the image signal 1903 through the luminance control circuit 1924. At this time, frequency updated by the second memory 1922 and the third memory 1923 is the same as the external image signal 1900; however, the frequency of the image signal 1903 which is output through the high-speed processing circuit 1925 may be different from the frequency of the external image signal 1900. Specifically, for example, the frequency of the image signal 1903 is 1.5 times, twice, or three times as high as the frequency of the external image signal 1900. However, the present invention is not limited to this, and a variety of frequencies can be used. Note that the frequency of the image signal 1903 may be specified by the frequency control signal 1908.

The structure of the image processing circuit 1915 shown in FIG. 19D is obtained by adding a fourth memory 1926 to the structure of the image processing circuit 1915 shown in FIG. 19C. When image data output from the fourth memory 1926 is output to the motion detection circuit 1920 in addition to the image data output from the first memory 1921 and the image data output from the second memory 1922 in this manner, movement of an image can be detected adequately.

Note that when image data to be input has already included a motion vector for data compression or the like, for example, the image data to be input is image data which is based on an MPEG (moving picture expert group) standard, an image in an intermediate state may be generated as an interpolated image by using this image data. At this time, a portion which generates a motion vector included in the motion detection circuit 1920 is not necessary. Further, since encoding and decoding processing of the image signal 1903 is simplified, power consumption can be reduced.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 2

In this embodiment mode, application examples of a method where image quality of a display device is improved, mainly change in driving method depending on circumstances are described. The circumstances here include contents of image data, environment inside and outside the device (e.g., temperature, humidity, barometric pressure, light, sound, electric field, the amount of radiation, altitude, acceleration, or movement speed), user settings, and software version.

Figure 20A:
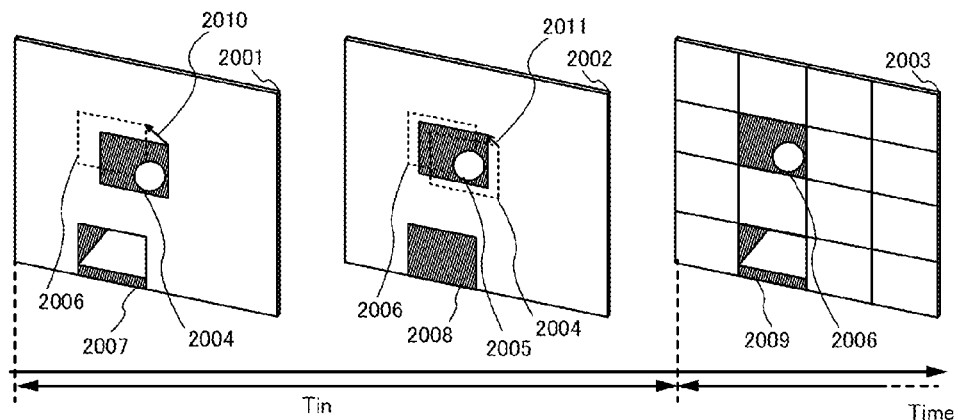

A method in which movement of an image included in input image data is detected to form an intermediate image is described with reference to FIGS. 20A to 20E. FIGS. 20A to 20E schematically illustrate images displayed when the display frame rate is twice as high as the input frame rate. FIG. 20A schematically illustrates a method of detecting motion of the image with time represented by the horizontal axis. The period $T_{in}$ represents a cycle of input image data. An image 2001 represents the p-th image. An image 2002 represents the (p+1)th image. An image 2003 represents the (p+2)th image. In the images, a first region 2004, a second region 2005, a third region 2006, a fourth region 2007, a fifth region 2008, and a sixth region 2009 are provided as regions which do not depend on time.

The method of obtaining the second region 2005 in the (p+1)th image 2002 from the third region 2006 of the (p+2)th image 2003 and the first region 2004 of the p-th image 2001 may be the above-described method. In other words, the p-th image 2001, the (p+1)th image 2002, the (p+2)th image 2003, the first region 2004, the second region 2005, the third region 2006, a movement vector 2010, and a displacement vector 2011 in FIG. 20A may correspond to the p-th image 1801, the (p+1)th image 1802, the (p−2)th image 1803, the first region 1804, the second region 1805, the third region 1806, the movement vector 1809, and the displacement vector 1810 in FIG. 18A, respectively.

Image data included in the fourth region 2007 and the sixth region 2009 are hardly moved in the p-th image 2001 and the (p+2)th image 2003. In this case, image data produced in the fifth region 2008 may be an average value of the image data of the fourth region 2007 in the p-th image 2001 and the image data of the sixth region 2009 in the (p+2)th image 2003; however, as shown in FIG. 20A, the image data in the fifth region 2008 may be a black image having low luminance. That is, an intermediate image may be produced for the region in which the image is moved so much, and a black image may be produced for the region in which the image is not moved so much. Accordingly, typical luminance of the (p+1)th image 2002 becomes small, and display can be pseudo impulse type display. In such a manner, the image is interpolated by motion compensation, and then, display may be pseudo impulse type display by provision of difference in typical luminances between images to be displayed. Thus, motion can be smoothed and afterimages can be reduced; thus, motion blur can be drastically reduced.

When whether an intermediate image or a black image is produced is determined, the movement vector 2010 may have a threshold value. The threshold value of the movement vector 2010 is preferably three times as high as that of one pixel, more preferably twice as high as that of one pixel.

FIG. 20B schematically illustrates shift of an image when an intermediate image is produced by the method shown in FIG. 20A. The period $T_{in}$ represents a cycle of input image data. An image 2021 represents the p-th image. An image 2022 represents the (p+1)th image. An image 2023 represents the (p+2)th image. Each of arrows 2024, 2025, and 2026 represents scanning of an image by a scan signal.

FIG. 20B illustrates an image including both of a region whose position is changed from frame to frame (the circular region) and a region whose position is hardly changed from frame to frame (the triangle region) as an example. At this time, in a driving method shown in FIG. 20B, the (p+1)th image 2022 is produced in different ways in a region where the movement vector is large and in a region where the movement vector is small. The movement vector is detected based on the movement of the image. Specifically, the intermediate image is employed in the region where the movement vector is large (here, the circular region), and the black image is employed in the region where the movement vector is small (here, the triangle region). In such a manner, typical luminance of the (p+1)th image 2022 is low so that display can be pseudo impulse type display. In this manner, the image is interpolated by motion compensation, and then, display may be pseudo impulse type display by provision of difference in typical luminances between images to be displayed. Accordingly, motion can be smoothed and afterimages can be reduced; thus, motion blur can be drastically reduced.

Note that in FIG. 20B, when the image data of the (p+1)th image 2022 is written to a display region, instead of writing black data positively, the data may be written only to the region in which the image is moved largely, while the data of the p-th image 2021 may be held in the region in which the image is not moved so much, without writing the data of the (p+1)th image 2022 thereto. In this case, when the data of the p-th image 2021 is written, a scan signal is scanned entirely as indicated by the arrow 2024. Next, when the data of the (p+1)th image 2022 is written, the scan signal is scanned only in the region in which the image is moved largely as indicated by the arrow 2025. When the data of the (p+2)th image 2023 is written, the scan signal is scanned entirely as indicated by the arrow 2026. Accordingly, it is unnecessary to write data in a region in which motion is small and the intermediate image is not needed to be displayed, which leads to reduction in power consumption. Further, a noise is not mixed when the (p+1)th image 2022 is produced, which leads to improvement in image quality.

FIGS. 20C to 20E illustrate images including both of a region whose position is changed from frame to frame (the circular region) and a region whose position is hardly changed from frame to frame (the triangle region) as an example. In FIGS. 20C to 20E, the amount of movement is different in the regions in which the images are moved from frame to frame.

In FIG. 20C, the period $T_{in}$ represents a cycle of input image data. An image 2031 represents the p-th image. An image 2032 represents the (p+1)th image. An image 2033 represents the (p+2)th image. The (p+1)th image 2032 may be an image which is made to be in an intermediate state between the p-th image 2031 and (the p+2)th image 2033 by detection of the amount of change (a movement vector) of the image from the p-th image 2031 to the (p+2)th image 2033. Further, the (p+1)th image 2032 may be in an intermediate state between the p-th image 2031 and the (p−2)th image 2033 and may have luminance controlled by a certain rule. Specifically, the certain rule may be determined based on the amplitude of the movement vector.

In FIG. 20D, the period $T_{in}$ represents a cycle of input image data. An image 2041 represents the p-th image. An image 2042 represents the (p+1)th image. An image 2043 represents the (p+2)th image. The (p+1)th image 2042 may be an image which is made to be an intermediate state between the p-th image 2041 and the (p+2)th image 2043 by detection of the amount of change (a movement vector) of the image from the p-th image 2041 to the (p+2)th image 2043. Further, the (p+1)th image 2042 may be an image which is made to be in an intermediate state between the p-th image 2041 and the (p+2)th image 2043 and may have luminance controlled by a certain rule. Specifically, the certain rule may be determined based on the amplitude of the movement vector.

In FIG. 20E, the period $T_{in}$ represents a cycle of input image data. An image 2051 represents the p-th image. An image 2052 represents the (p+1)th image. An image 2053 represents the (p+2)th image. The (p+1)th image 2052 may be an image which is made to be in an intermediate state between the p-th image 2051 and the (p+2)th image 2053 by detection of the amount of change (a movement vector) of the image from the p-th image 2051 to the (p+2)th image 2053. Further, the (p+1)th image 2052 may be an image which is made to be in an intermediate state between the p-th image 2051 and the (p+2)th image 2053 and may have luminance controlled by a certain rule. Specifically, the certain rule may be determined based on the amplitude of the movement vector.

In FIGS. 20C to 20E, the amount of movement of the region whose position is changed from frame to frame (the circular region) is the largest in the driving method shown in FIG. 20D, and is followed by the driving method shown in FIG. 20C and the driving method shown in FIG. 20E. At this time, luminance of the interpolation image may be determined by the magnitude of the detected movement vector.

That is, when the luminance of the (p+1)th image 2032 in FIG. 20C is denoted by $L_{c0}$, the luminance of the (p+1)th image 2042 in FIG. 20D is denoted by $L_{c1}$, and the luminance of the (p+1)th image 2052 in FIG. 20E is denoted by $L_{c2}$, a relation among $L_{c0}$, $L_{c1}$ and $L_{c2}$ may satisfy $L_{c1} < L_{c0} < L_{c2}$. In other words, as the amount of movement of the region whose position is changed from frame to frame is larger, the luminance of the interpolation image may be made smaller. Accordingly, when the amount of movement of the image is large and thus motion blur occurs strongly, display can be made closer to pseudo impulse type display. In such a manner, the image is interpolated by motion interpolation, and then, display may be pseudo impulse type display by provision of difference in typical luminances between images to be displayed. Accordingly, motion can be smoothed and afterimages can be suppressed; thus, motion blur can be drastically reduced.

Note that when movement of an image is small and motion blur does not occur so much, display can be close to hold type display; thus, flickers and power consumption can be reduced.

Note that the control amount of luminance of an image may be determined by not only the amplitude of a detected movement vector but also setting by a user or external environment (e.g., surrounding brightness or temperature), or a combination of the above.

Figure 21A:
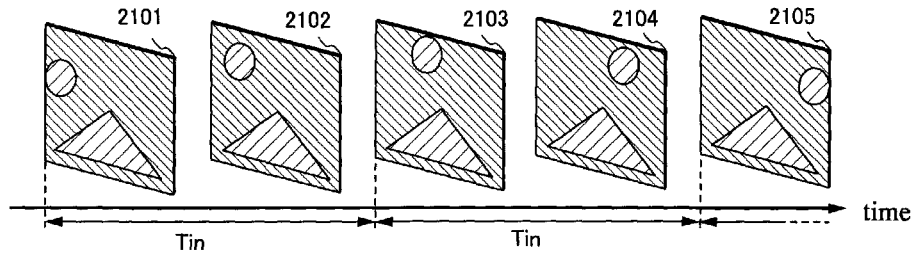
FIGS. 21A to 21C each illustrate one mode of a display device of the invention.
Figure 21B:
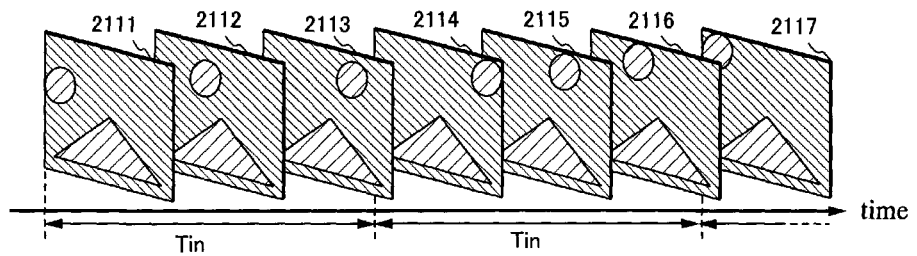
Figure 21C:
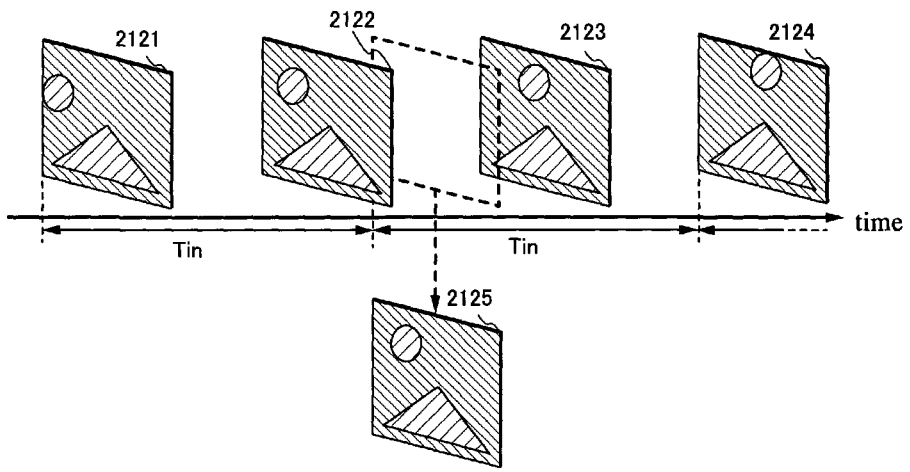

Next, a method of relating movement of an image to a display frame rate is described with reference to FIGS. 21A to 21C. FIGS. 21A to 21C schematically illustrate temporal change of an image to be displayed with time represented by the horizontal axis. FIGS. 21A to 21C each illustrate intermediate images by using a region whose position is changed from frame to frame (a circular region) and a region whose position is hardly changed from frame to frame (a triangle region). FIG. 21A shows the case where the display frame rate is twice as high as the input frame rate. FIG. 21B shows the case where the display frame rate is three times as high as the input frame rate. FIG. 21C shows the case where the display frame rate is 1.5 times as high as the input frame rate.

In FIG. 21A, the period $T_{in}$ represents a cycle of input image data. An image 2101 represents the p-th image. An image 2102 represents the (p+1)th image. An image 2103 represents the (p+2)th image. An image 2104 represents the (p+3)th image. An image 2105 represents the (p+4)th image.

In FIG. 21A, the (p+1)th image 2102 may be an image which is made to be in an intermediate state between the p-th image 2101 and the (p+2)th image 2103 by detection of the amount of change of the image from the p-th image 2101 to the (p+2)th image 2103. Similarly, the (p+3)th image 2104 may be an image which is made to be in an intermediate state between the (p+2)th image 2103 and the (p+4)th image 2105 by detection of the amount of change of the image from the (p+2)th image 2103 to the (p+4)th image 2105.

In FIG. 21B, the period $T_{in}$ represents a cycle of input image data. An image 2111 represents the p-th image. An image 2112 represents the (p+1)th image. An image 2113 represents the (p+2)th image. An image 2114 represents the (p+3)th image. An image 2115 represents the (p+4)th image. An image 2116 represents the (p+5)th image. An image 2117 represents the (p+6)th image.

In FIG. 21B, each of the (p+1)th image 2112 and the (p+2)th image 2113 may be an image which is made to be in an intermediate state between the p-th image 2111 and the (p+3)th image 2114 by detection of the amount of change of the image from the p-th image 2111 to the (p+3)th image 2114. Similarly, each of the (p+4)th image 2115 and the (p+5)th image 2116 may be an image which is made to be in an intermediate state between the (p+3)th image 2114 and the (p+6)th image 2117 by detection of the amount of change of the image from the (p+3)th image 2114 to the (p+6)th image 2117.

In FIG. 21C, the period $T_{in}$ represents a cycle of input image data. An image 2121 represents the p-th image. An image 2122 represents the (p+1)th image. An image 2123 represents the (p+2)th image. An image 2124 represents the (p+3)th image. Note that although not necessarily displayed in practice, an image 2125 which is input image data may be used to form the (p+1)th image 2122 and the (p+2)th image 2123.

In FIG. 21C, each of the (p+1)th image 2122 and the (p+2)th image 2123 may be an image which is made to be in an intermediate state between the p-th image 2121 and the (p+3)th image 2124 by detection of the amount of change of the image from the p-th image 2121 to the (p+3)th image 2124 via the (p+4)th image 2125.

In FIGS. 21A to 21C, the amount of movement of a region whose position is moved from frame to frame in the basic image varies. In other words, the amount of movement of the image shown in FIG. 21B (the display frame rate is three times as high as the input frame rate) is the largest, and is followed by that of the image shown in FIG. 21A (the display frame rate is twice as high as the input frame rate) and that of the image shown in FIG. 21C (the display frame rate is 1.5 times as high as the input frame rate). In such a manner, in accordance with the amount of movement of the image, the frequency of the display frame rate may be changed for display. Accordingly, driving frequency appropriate for the amount of movement of the image can be selected; thus, motion blur can be effectively reduced by improvement in smoothness of moving images, and increase in heat generation due to increase in power consumption and processing amount can be reduced. Further, flickers can be reduced when movement of an image is small.

Note that the display frame rate may be determined by not only the amplitude of a detected movement vector but also setting by a user or external environment (e.g., surrounding brightness or temperature), or a combination of the above.

In addition, each of the interpolation images shown in FIGS. 21A to 21C may be an image which is made to be in an intermediate state between a plurality of basic images and may have luminance controlled by a certain rule. Specifically, the certain rule may be determined by the amplitude of the movement vector, setting by a user, or external environment (e.g., surrounding brightness or temperature), or a combination of the above. In such a manner, the image is interpolated by motion compensation, and then, display may be pseudo impulse type display by provision of difference in typical luminances between images to be displayed. Accordingly, motion can be smoothed and afterimages can be reduced; thus, motion blur can be drastically reduced.

Next, a method of relating movement of an image to a driving method is described with reference to FIGS. 22A to 22E. FIGS. 22A to 22E schematically illustrate temporal change of an image to be displayed with time represented by the horizontal axis. FIGS. 22A to 22E each illustrate an intermediate image by using a region whose position is changed from frame to frame (a circular region) and a region whose position is hardly changed from frame to frame (a triangle region).

Figure 22A:
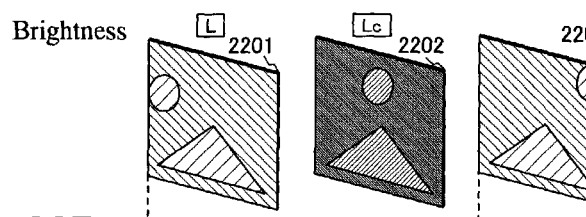
FIGS. 22A to 22E each illustrate one mode of a display device of the invention.

In FIG. 22A, the period $T_{in}$ represents a cycle of input image data. An image 2201 represents the p-th image. An image 2202 represents the (p+1)th image. An image 2203 represents the (p+2)th image. Note that the (p+1)th image 2202 may be an image which is made to be in an intermediate state between the p-th image 2201 and the (p+2)th image 2203 by detection of the amount of change (a movement vector) of the image from the p-th image 2201 to the (p+2)th image 2203. Further, the (p+1)th image 2202 may be in an intermediate state between the p-th image 2201 and the (p+2)th image 2203 and may have luminance controlled by a certain rule. Specifically, the certain rule may be determined by the amplitude of the movement vector, setting by a user, or external environment (e.g., surrounding brightness or temperature), or a combination of the above.

FIG. 22A illustrates the driving method in which the amount of movement of an image is detected from image data to be input and an intermediate image between the images is used as an interpolation image, and luminance of the interpolation image is changed. In this embodiment mode, the driving method illustrated in FIG. 22A is referred to as luminance control double-frame rate driving.

Figure 22B:
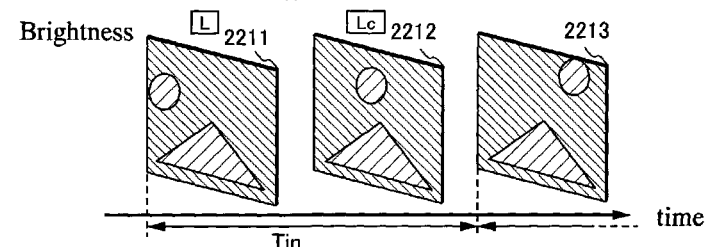

In FIG. 22B, the period $T_{in}$ represents a cycle of input image data. An image 2211 represents the p-th image. An image 2212 represents the (p+1)th image. An image 2213 represents the (p+2)th image. Note that the (p+1)th image 2212 may be an image which is made to be in an intermediate state between the p-th image 2211 and the (p+2)th image 2213 by detection of the amount of change (a movement vector) of the image from the p-th image 2211 to the (p+2)th image 2213. Further, the (p+1)th image 2212 may be in an intermediate state between the p-th image 2211 and the (p+2)th image 2213 and may have a display frame rate controlled by a certain rule. Specifically, the certain rule may be determined by the amplitude of the movement vector, setting by a user, or external environment (e.g., surrounding brightness or temperature), or a combination of the above.

FIG. 22B illustrates a method in which the amount of movement of an image is detected from image data included in a plurality of frames, and an intermediate image between the images included in the plurality of frames is used as an interpolation image, and the display frame rate is made higher than the input frame rate. In this embodiment mode, the driving method illustrated in FIG. 22B is referred to as double-frame rate driving.

Figure 22C:
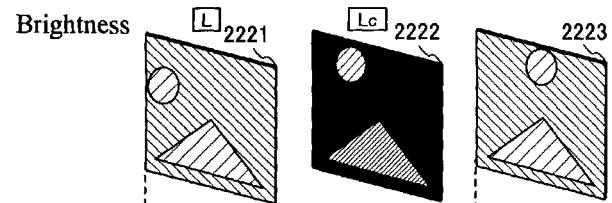

In FIG. 22C, the period $T_{in}$ represents a cycle of input image data. An image 2221 represents the p-th image. An image 2222 represents the (p+1)th image. An image 2223 represents the (p+2)th image. Note that the (p+1)th image 2222 may be an image obtained by controlling luminance of the p-th image 2221 by a certain rule. Specifically, the certain rule may be determined by the amplitude of the movement vector, setting by a user, or external environment (e.g., surrounding brightness or temperature), or a combination of the above.

FIG. 22C illustrates a method in which a dark image or a black image is used as an interpolation image to make pseudo impulse type display. In this embodiment mode, the driving method illustrated in FIG. 22C is referred to as black frame insertion driving.

Figure 22D:
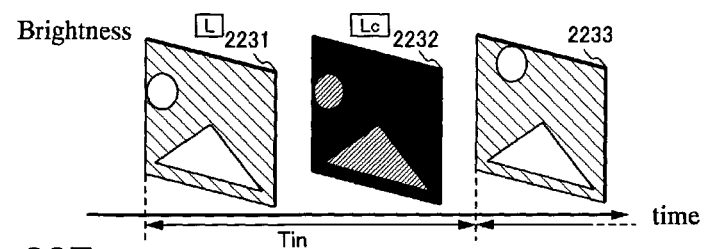

In FIG. 22D, the period $T_{in}$ represents a cycle of input image data. An image 2231 represents the p-th image. An image 2232 represents the (p+1)th image. An image 2233 represents the (p+2)th image. Note that the (p+1)th image 2232 may be an image formed in accordance with image data of the p-th image 2231 by a certain rule. Specifically, the certain rule may be determined by the amplitude of the movement vector, setting by a user, or external environment (e.g., surrounding brightness or temperature), or a combination of the above.

In FIG. 22D, the gray scale level of the p-th image 2231 is made higher and the (p+1)th image 2232 is displayed as an interpolation image for a portion having saturated luminance to interpolate the gray scale of the p-th image 2231, which leads to pseudo impulse type display. In this embodiment mode, the driving method illustrated in FIG. 22D is referred to as time-division gray scale control driving.

Figure 22E:
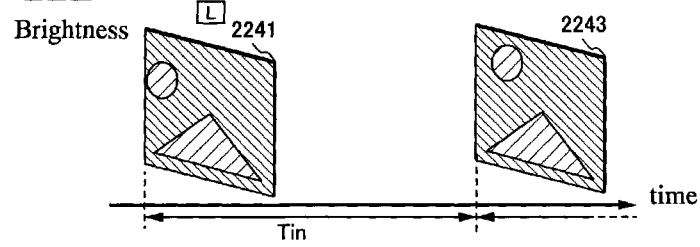

In FIG. 22E, the period $T_{in}$ represents a cycle of input image data. An image 2241 represents the p-th image. An image 2243 represents the (p+2)th image.

FIG. 22E illustrates hold-type driving in which a basic image is being displayed during a cycle of input image data.

In FIGS. 22A to 22E, the amount of movement of a region whose position is changed from frame to frame in the basic images varies. In other words, the amount of movement of the image illustrated in FIG. 22A (luminance control double-frame rate driving) is the largest, and is followed by that of the image illustrated in FIG. 22B (double-frame rate driving), that of the image illustrated in FIG. 22C (black frame insertion driving), that of the image illustrated in FIG. 22D (time-division gray scale control driving), and that of the image illustrated in FIG. 22E (hold-type driving). In such a manner, in accordance with the amount movement of the image, the driving method may be changed for display. Accordingly, an appropriate driving method for the amount of movement of the image can be selected; thus, motion blur can be effectively reduced, and increase in heat generation due to increase in power consumption and processing amount can be reduced. Further, flickers in an image with small movement can be reduced.

Next, a flow chart for selection of a driving method based on movement of an image and surrounding brightness is described with reference to FIG. 23.

After the start of the flow chart, whether to detect surrounding brightness or not is selected in Step 1. When the surrounding brightness is detected, the operation proceeds to Step 2. When the surrounding brightness is not detected, the operation proceeds to Step 6. Note that the case where the surrounding brightness is not detected includes the case where a device does not have a means to detect surrounding brightness.

In Step 2, the surrounding brightness is detected. Then, the operation proceeds to Step 3.

In Step 3, whether the brightness detected in Step 2 is equal to or lower than a predetermined brightness threshold value is determined. When the brightness is equal to or lower than the brightness threshold value, the operation proceeds to Step 4. When the brightness is higher than the brightness threshold value, the operation proceeds to Step 5. Note that the brightness threshold value may be stored in a memory in the device. Further, the brightness threshold value may be designated by a user.

In Step 4, when the device includes a backlight like a liquid crystal display device, a backlight blinking mode is selected. Then, the operation proceeds to Step 5. When the device does not include a backlight, the operation directly proceeds to Step 5. Note that the backlight blinking mode may be a mode in which luminance of the whole backlight is increased or decreased at one time or a mode in which luminance of a part of the backlight is sequentially increased or decreased. When the backlight blinking mode is selected and the maximum luminance of the backlight is the same, an average luminance becomes small; thus, the backlight is darkened. However, when surrounding brightness is equal to or lower than the threshold value, darkness of the backlight makes recognition of display more easily, black blurring can be suppressed, and power consumption can be reduced.

In Step 5, when the device includes a backlight like a liquid crystal display device, backlight output is determined. Then, the operation proceeds to Step 6. Meanwhile, when the device does not include a backlight, the operation directly proceeds to Step 6, or alternatively, the maximum luminance is determined by the detected brightness, and thereafter, the operation directly proceeds to Step 6. Note that the backlight output is preferably reduced as the surrounding brightness is smaller. Accordingly, power consumption can be reduced while black blurring is reduced.

In Step 6, a movement vector $\in$ is detected. Thereafter, the operation proceeds to Step 7. Note that in this embodiment mode, the movement vector $\in$ is regarded as a scalar quantity.

In Step 6, the movement vector $\in$ detected from an image may be one movement vector or a vector obtained from a plurality of movement vectors. For example, a plurality of movement vectors are detected, and a movement vector $\in$ to be used for selecting a driving method may be obtained from the size and the number of the detected movement vectors.

In Step 7, whether the movement vector $\in$ is larger than a first threshold value $\in 1$ of the movement vector is determined. When the movement vector $\in$ satisfies this condition, the operation proceeds to Step 12. When the movement vector $\in$ does not satisfy this condition, the operation proceeds to Step 8.

In Step 8, whether the movement vector $\in$ is larger than a second threshold value $\in 2$ of the movement vector and equal to or smaller than the first threshold value $\in 1$ is determined. When the movement vector $\in$ satisfies this condition, the operation proceeds to Step 13. When the movement vector $\in$ does not satisfy this condition, the operation proceeds to Step 9.

In Step 9, whether the movement vector $\in$ is larger than a third threshold value $\in 3$ of the movement vector and equal to or smaller than the second threshold value $\in 2$ is determined. When the movement vector $\in$ satisfies this condition, the operation proceeds to Step 14. When the movement vector $\in$ does not satisfy this condition, the operation proceeds to Step 10.

In Step 10, whether the movement vector $\in$ is larger than a fourth threshold value $\in 4$ of the movement vector and equal to or smaller than the third threshold value $\in 3$ is determined. When the movement vector $\in$ satisfies this condition, the operation proceeds to Step 15. When the movement vector $\in$ does not satisfy this condition, the operation proceeds to Step 11.

In Step 11, hold-type driving (FIG. 22E) is selected. Then, the operation proceeds to Step 16.

In Step 12, luminance control double-frame rate driving (FIG. 22A) is selected. Then, the operation proceeds to Step 16.

In Step 13, double-frame rate driving (FIG. 22B) is selected. Then, the operation proceeds to Step 16.

In Step 14, black frame insertion driving (FIG. 22C) is selected. Then, the operation proceeds to Step 16.

In Step 15, time-division gray scale control driving (FIG. 22D) is selected. Then, the operation proceeds to Step 16.

In Step 16, the selected driving method is held for a certain period. Then, the operation is finished.

Note that in Step 16, a period for holding the driving method can be selected as appropriate. For example, the driving method may be switched for each frame based on the movement vector detected in each frame, may be switched every several seconds, or may be switched every several minutes, or the period for holding the driving method may be determined based on a displayed mode set by a user or the like.

Figure 23:
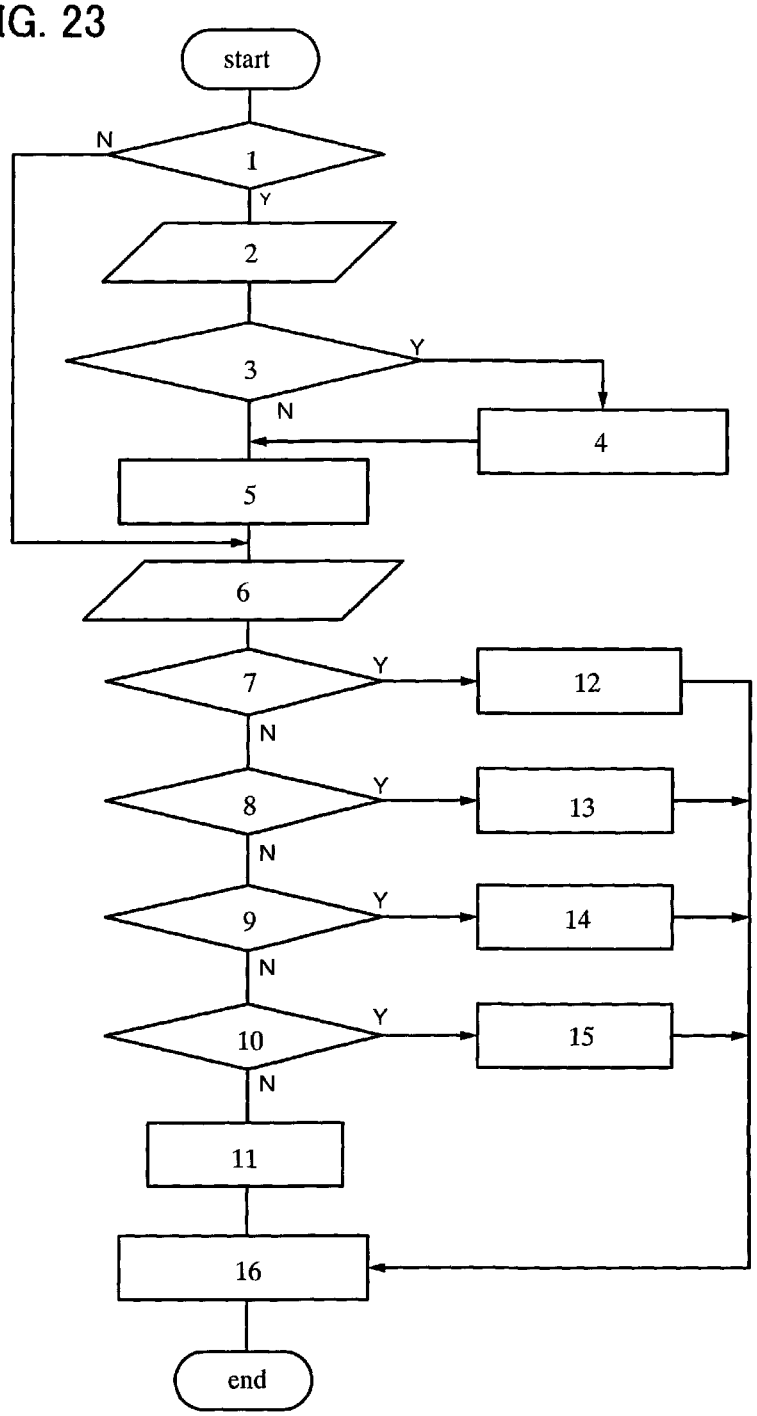
FIG. 23 illustrates one mode of a display device of the invention.

As described above, when a driving method is selected in accordance with the flow chart shown in FIG. 23, a driving method appropriate for the amount of movement of an image can be selected. Thus, motion blur can be effectively reduced, and increase in heat generation due to increase in power consumption and processing amount can be reduced. Further, flickers in an image with small movement can be reduced.

In this embodiment mode, four threshold values of the movement vectors are set, and one of five driving methods is selected based on the threshold values. However, a driving method to be selected is not limited to the above-described driving methods, and various driving methods can be used. Further, if the number of driving methods which can be selected is large, a driver circuit becomes complicated, and thus processing is also complicated; therefore, the number of driving methods is preferably five or less. Thus, manufacturing cost and power consumption can be reduced.

A magnitude relation of the threshold values $\in 1$ to $\in 4$ of the movement vectors may satisfy $0 < \in 4 < \in 3 < \in 2 < \in 1$.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 3

In this embodiment mode, a method for improving quality of moving images by dividing one frame into two or more subframes and using some of the two or more subframes mainly for display images (a bright image) and the others mainly for reducing afterimages of moving images (a dark image) is described.

Difference between a black image and a dark image is described. The black image is an image where all of the pixels for forming an image are in a non-lighting state or a non-transmitting state, and is just an inky black image. On the other hand, the dark image is an image formed when most of the pixels for forming an image emit light with relatively low luminance. In other words, the dark image is an image where the total amount of light emission of all the pixels for forming an image is smaller than that of a corresponding bright image. In accordance with this definition, the black image is used as the dark image in some cases.

Next, integrated luminance is described. In general, an image formed as a collection of pixels arranged in a display device is not always perceived by a human as it is.

First, when the size of pixels is sufficiently small, human eyes cannot distinguish pixels which are dispersedly arranged from pixels spatially adjacent to each other. For example, when light emission colors of the adjacent pixels are different from each other, difference of the light emission colors is not perceived, and the different colors are perceived as a mixed color of the adjacent pixels. This characteristic is referred to as juxtaposition color mixture and enables a color image to be displayed. Further, when adjacent pixels have different luminances, an intermediate value of the luminances of the adjacent pixels is perceived. Examples of techniques of expressing intermediate luminance by utilizing this characteristic include gray scale interpolation techniques such as dithering and error diffusion, and an area gray scale method which expresses a gray scale depending on the area of a light-emitting region.

Secondly, when the time in which pixels emit light is sufficiently short and the pixels emit light a plurality of times with temporal dispersion, human eyes cannot distinguish difference of luminances temporally close to each other. For example, when light emission with high luminance and light emission with low luminance are continuously performed, human eyes perceive that the pixel emits light with the intermediate luminance. A technique which utilizes this characteristic to express the intermediate luminance is referred to as a time gray scale method. Further, when light emission colors are different temporally close to each other, the light emission color of the pixel is perceived as a mixed color of the colors temporally close to each other. Examples of a technique of displaying color images by utilizing this characteristic include a field sequential method.

Such a phenomenon in which human eyes cannot distinguish difference of luminances temporally close to each other when light is emitted a plurality of times with temporal dispersion is related to time-frequency characteristic of human eyes. Human eyes do not perceive change of luminance at higher frequency than a given critical value, and is seems that light continue to be emitted with constant luminance. At this time, the luminance which is perceived by the human eyes depends on a value obtained by integrating the luminance by time (integrated luminance).

On the other hand, when luminance changes at frequency that is lower than or equal to a given critical value, human eyes perceive the change in luminance as flickers as it is. The critical value depends on luminance and is approximately several tens of Hz (a cycle is ten to several tens of milliseconds). That is, integrated luminance is a value obtained by integrating luminance by time in the time range up to several tens of milliseconds in which change in luminance is not perceived by human eyes.

Next, formulation of the integrated luminance when one frame is divided into a plurality of subframes is described with reference to FIGS. 2A and 2B. A solid line in FIG. 2A shows an example of temporal change of luminance of a pixel in one frame when one frame is divided into two subframes.

Figure 2A:
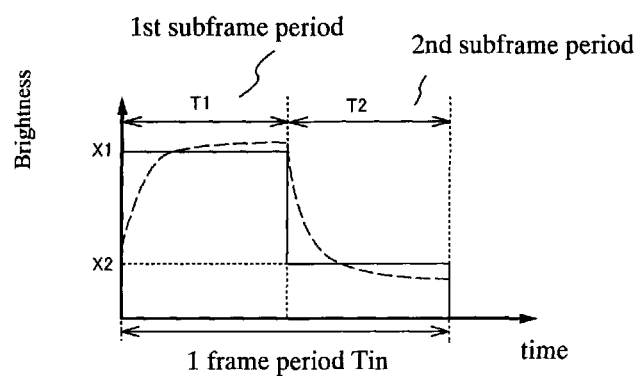
FIGS. 2A and 2B each illustrate one mode of a display device of the invention.

In FIG. 2A, the length of one frame period is denoted by $T_{in}$, the length of a first subframe is denoted by $T_1$, the length of a second subframe is denoted by $T_2$, average luminance of a pixel in the first subframe period is denoted by $X_1$, and average luminance of the pixel in the second subframe period is denoted by $X_2$. Integrated luminance in the first subframe period is the product of $T_1$ and $X_1$. Similarly, integrated luminance in the second subframe period is the product of $T_2$ and $X_2$.

Note that temporal change of luminance is not like the solid line in FIG. 2A in some cases, due to characteristics of a device used as a display device. For example, in the case of a display device using liquid crystals, luminance changes gently as shown by a dashed line in FIG. 2A. In such a case, the integrated luminance is precisely defined by time integration of luminance; however, in this embodiment mode, the integrated luminance is defined by the product of average luminance and a subframe period for simplicity. Accordingly, luminance in each subframe period is not necessarily constant.

Figure 2B:
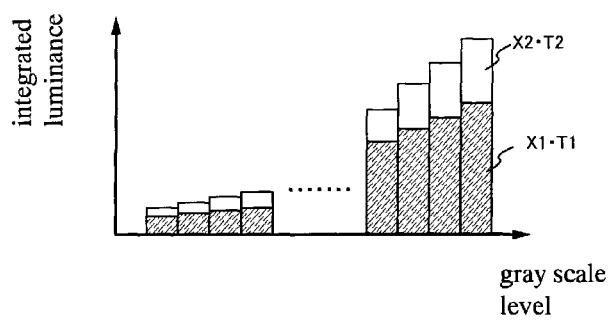

FIG. 2B shows an example of distribution of integrated luminance in one frame period with respect to gray scale levels to be displayed. The horizontal axis represents a gray scale level, and the vertical axis represents integrated luminance in one frame period. FIG. 2B shows the case where display at the gray scale level of 0 to the gray scale level of 255 is performed. Note that the cases of the gray scale level of 5 to the gray scale level of 251 are not shown in the drawing. In each gray scale, a shaded portion represents integrated luminance in the first subframe period, and a white portion represents integrated luminance in the second subframe period.

As described above, integrated luminance in one frame period can be expressed as the sum of the integrated luminance in the first subframe period and the integrated luminance in the second subframe period. The distribution of the integrated luminance can be set individually depending on a gray scale level to be displayed.

The number of subframe periods by which one frame period is divided is not particularly limited as long as it is an integer equal to or more than 2. When formulated, this can be expressed as below. That is, when one frame period is divided into n subframe periods (n is an integer equal to or more than 2), average luminance of a display element in the i-th subframe period (i is an integer equal to or more than 1 and equal to less than n) is denoted by Xi and the length of the i-th subframe period is denoted by Ti, integrated luminance Y which is obtained by time-integrating a function X(t) of luminance related to time by the one frame period can be expressed as Formula 3.

$$Y = \sum_{i=1}^{n} X_i T_i \qquad \text{[Formula 3]}$$

Note that the length Ti of the i-th subframe period is preferably approximately the same in every subframe period. This is because a period in which image data is written to a pixel (an address period) can be longest when the length of all the subframe periods is the same. When the address period is long, operating frequency of a peripheral driver circuit of the display device can be reduced; thus, power consumption can be reduced. Further, yield of the display device is improved. However, the invention is not limited to this structure, and Ti may vary depending on each subframe period. For example, when the length of a subframe period for displaying a bright image is longer, average luminance of a backlight unit can be increased without increase in power consumption. Moreover, power consumption can be reduced without change of average luminance of the backlight unit. In other words, emission efficiency can be improved. Further, when the length of a subframe period for displaying a dark image is longer, quality of moving images can be significantly improved.

In this embodiment mode, the case is described in which the division number n of subframes is 2 and the length of each subframe period is the same. A subframe period which is the first half of one frame period is referred to as 1SF, and a subframe period which is the latter half of one frame period is referred to as 2SF.

Figure 1B:
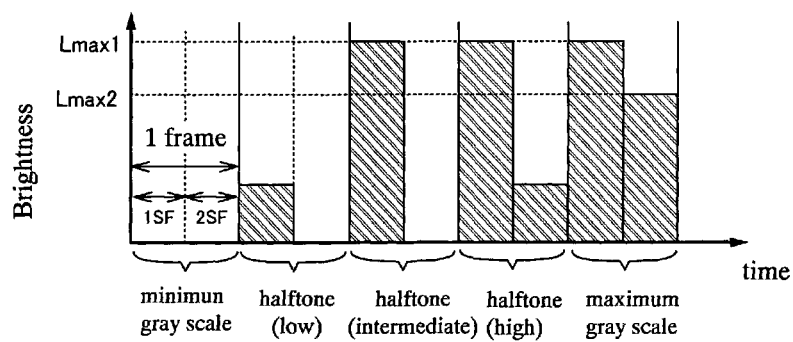

Each of FIGS. 1A and 1B is a graph for showing a distribution method of luminance to two subframe periods with respect to a gray scale to be displayed, in this embodiment mode. FIG. 1A shows the case where luminance in 2SF is higher than luminance in 1SF, and FIG. 1B shows the case where luminance in 1SF is higher than luminance in 2SF.

First, description is made with reference to FIG. 1A. In FIG. 1A, the horizontal axis represents time, and the vertical solid lines represent boundaries of frames. The vertical dashed lines represent boundaries of subframes. The vertical axis represents luminance. That is, FIG. 1A shows change of luminance of a pixel with respect to time over five frames when the luminance is increased along with time.

The degree of gray scale in each frame is represented below the horizontal axis. That is, FIG. 1A shows change of luminance of a pixel with respect to time in the case where a minimum gray scale is displayed first, and then, halftone on the lower gray scale level side, halftone of the intermediate level, halftone on the higher gray scale level side, and a maximum gray scale are displayed in this order.

Although quality of moving images is improved by inserting a black image, an aspect of a driving method of a display device which is described in this embodiment mode is that quality of moving images is improved by inserting a dark image which is close to black but is not a black image. That is, one frame period is divided into two subframe periods 1SF and 2SF and light is emitted so that luminance of 1SF is lower than luminance of 2SF when a maximum gray scale is to be displayed; thus, improvement in quality of moving images is realized, and luminance in one frame period is kept constant.

As for a method for expressing gray scales, first, in the range of the minimum gray scale to the halftone of the intermediate degree, the gray scales are expressed by the level of the luminance in 2SF. Then, after the luminance in 2SF reaches maximum value $L_{max2}$, the luminance in 2SF is fixed to $L_{max2}$ and the gray scales are expressed by the level of the luminance in 1SF Then, when the maximum gray scale is to be expressed, luminance $L_{max1}$ in 1SF is preferably lower than $L_{max2}$ because quality of moving images can be improved.

That is, when time in which the luminance is maintained (hold time) is reduced even near the maximum gray scale, afterimages are reduced in the range of all the gray scale levels; thus, quality of moving images can be favorable. Further, a dark image, instead of a black image, is displayed in 1SF when the maximum gray scale is displayed; thus, luminance of $L_{max1}$ can be reduced. Accordingly, power consumption can be reduced.

$L_{max1}$ is preferably 90% or less of $L_{max2}$, and more preferably 60% or less of $L_{max2}$ in order to improve quality of moving images. Further, in order to increase $L_{max1}$ and suppress the maximum luminance in one frame so as to reduce power consumption, $L_{max1}$ is preferably 50% or more of $L_{max2}$. That is, when a dark image is inserted in 1SF, $L_{max1}$ is preferably in the range represented as follows: $(1/2)L_{max2} < L_{max1} < (9/10)L_{max2}$, and more preferably $(1/2)L_{max2} < L_{max1} < (3/5)L_{max2}$.

Note that the length of one frame period is preferably less than or equal to 1/60 seconds so that a flicker does not easily occur. However, the shorter the length of one frame period is, the higher the operating frequency of a peripheral driver circuit becomes, which leads to increase in power consumption. Therefore, the length of one frame period is preferably in the range of 1/120 to 1/60 seconds.

Next, the case where luminance in 1SF is higher than luminance in 2SF is described with reference to FIG. 1B. In FIG. 1B, the horizontal axis represents time, and the vertical solid lines represent boundaries of frames. The vertical dashed lines represent boundaries of subframes. The vertical axis represents luminance. That is, FIG. 1B shows change of luminance of a pixel with respect to time over five frames. Although the luminance of 1SF is lower than that of 2SF in FIG. 1A, the invention is not limited to this. That is, as shown in FIG. 1B, one frame period is divided into two subframe periods 1SF and 2SF, and light is emitted so that luminance of 2SF is lower than luminance of 1SF when a maximum gray scale is displayed; thus, improvement in quality of moving images can be realized. In this manner, it is possible to reverse the order of 1SF and 2SF.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 4

In this embodiment mode, another example of a method in which one frame is divided into a plurality of subframes, and some of the plurality of subframes are used mainly for displaying images (bright images) and the others are used mainly for reducing afterimages of moving images (dark images), which is described in Embodiment Mode 3, is described.

When images to be displayed are divided into bright images and dark images, there are several methods with different ways of distribution of luminance which is needed to express a gray scale of an image to be displayed to a plurality of subframes. In order to describe these methods, in this embodiment mode, graphs each of which horizontal axis represents a gray scale level and vertical axis represents integrated luminance are employed. Each graph shows a relation between integrated luminance and a gray scale level in 1SF, a relation between integrated luminance and a gray scale level in 2SF, and a relation between integrated luminance and a gray scale level of the sum of 1SF and 2SF.

Figure 3A:
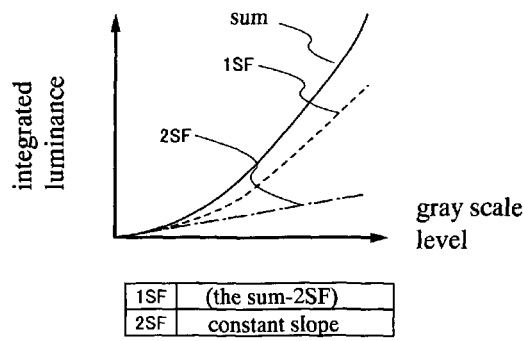
FIGS. 3A and 3B each illustrate one mode of a display device of the invention.

First, one mode of this embodiment mode is described with reference to FIG. 3A. FIG. 3A shows an example of a method for distributing the total integrated luminance in one frame to 1SF and 2SF. Further, a table under the graph shows a feature of each subframe briefly. A subframe which is described as having a constant slope in the table means that change of integrated luminance with respect to a gray scale level is constant. That is, in the mode shown in FIG. 3A, change of the integrated luminance with respect to a gray scale level of 2SF is constant. Although FIG. 3A shows the case where the slope is positive, the slope may be 0 or negative as well. Moreover, when a subframe is described as (the sum−xSF) in the table, the integrated luminance of the subframe depends on the integrated luminance of another subframe. A variety of subframes such as 1SF or 2SF may correspond to xSF. That is, in the mode shown in FIG. 3A, the integrated luminance of 1SF is a value obtained by subtracting the integrated luminance of 2SF from the total luminance. Here, the total luminance is separately determined, and in this embodiment mode, it is shown by a curve which is convex downward. This is the case where gamma correction is performed in consideration of characteristics of human eyes. Note that the total luminance may be linear with respect to a gray scale level, a curve which is convex upward, or a combination of a line segment and a curve. Furthermore, a mechanism in which the total luminance and the gamma correction are switched depending on a display image or a mechanism in which the total luminance and the gamma correction can be controlled by a user may be provided.

In the mode shown in FIG. 3A, since the change of the integrated luminance with respect to the gray scale level of 2SF is constant, image processing and applied voltage are simplified and a load of a peripheral driver circuit is reduced. In the mode shown in FIG. 3A, 1SF and 2SF can be exchanged as shown in FIGS. 1A and 1B, and even when characteristics of 1SF and 2SF are exchanged, a similar effect can be obtained. Note that the luminance in 1SF is higher than the luminance in 2SF; however, the invention is not limited to this. The luminance in 1SF may be lower than the luminance in 2SF. Note that when the total luminance is nonlinear, the luminance in 2SF is preferably lower than that in 1SF because the gray scale level can be controlled more easily.

Figure 3B:
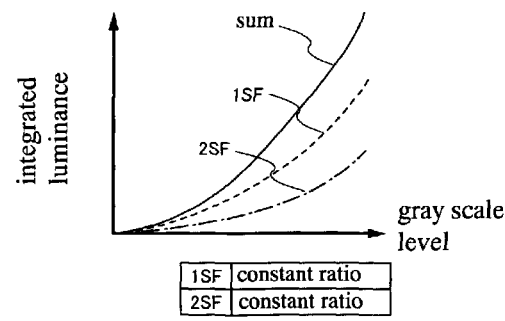

FIG. 3B shows an example of a method for distributing the total integrated luminance in one frame to 1SF and 2SF. As in FIG. 3B, a subframe which is described as having a constant ratio in a table under the graph means that the case where an integrated luminance ratio between 1SF and 2SF is equal at each gray scale level. That is, the mode shown in FIG. 3B shows the case where the ratio between the integrated luminance of 1SF and the integrated luminance of 2SF is equal in any gray scale level. Note that a value of the ratio in this case (the level of the smaller luminance with respect to the larger luminance) is preferably greater than 0.5 and less than 1. Accordingly, motion blur can be efficiently reduced. In the case of having a characteristic of the constant ratio, each of the two subframes may have a characteristic of the constant ratio. In other words, it may be said that there is no case where one of the subframes has a constant ratio and the other does not. In the mode shown in FIG. 3B, 1SF and 2SF can be exchanged, and even when the characteristics of 1SF and 2SF are exchanged, a similar effect can be obtained. Note that the luminance in 1SF is higher than the luminance in 2SF; however, the invention is not limited to this. The luminance in 1SF may be lower than the luminance in 2SF. Note that when the total luminance is nonlinear, the luminance in 2SF is preferably lower than the luminance in 1SF because the gray scale level can be controlled more easily.

Next, another mode of this embodiment mode is described with reference to FIGS. 4A to 4F. FIGS. 4A to 4F each show an example of a method for distributing the total integrated luminance in one frame to 1SF and 2SF in the case where gray scale levels which can be displayed are divided into a plurality of regions, for example, two regions and each subframe can have different characteristics in each region. In this embodiment mode, for explanation, each of the regions is referred to as a region 1, a region 2, . . . in ascending order of gray scale level.

In the description below, "a value of integrated luminance is continuous at the boundary of regions" is defined as follows. Of two adjacent gray scale levels which are separated by the boundary of regions, when a gray scale level which belongs to a region on the lower gray scale level side is a boundary gray scale level (low), a gray scale level which belongs to a region on the higher gray scale level side is a boundary gray scale level (high), and an absolute value of luminance difference between the boundary gray scale level (high) and the boundary gray scale level (low) is boundary luminance difference; "a value of integrated luminance is continuous at the boundary of regions" means that the boundary luminance difference is less than or equal to a certain value Δx.

Here, the value of Δx can be a variety of values depending on the luminance in the boundary gray scale level (high), the luminance in the boundary gray scale level (low), and the like. However, it can be determined from a standpoint of continuity of gray scale level-luminance characteristics seen from the human eyes (i.e., whether or not an image corresponding to the gray scale level-luminance characteristics is displayed smoothly on the boundary of the regions). Specifically, when an absolute value of difference between the luminance at the boundary gray scale level (low) and the luminance which is lower than the boundary gray scale level (low) by 1 is a first neighborhood boundary luminance difference (low), Δx is preferably approximately twice the first neighborhood boundary luminance difference (low).

In this embodiment mode and other embodiment modes, description is made on the assumption that Δx is twice the first neighborhood boundary luminance difference (low).

Figure 4A:
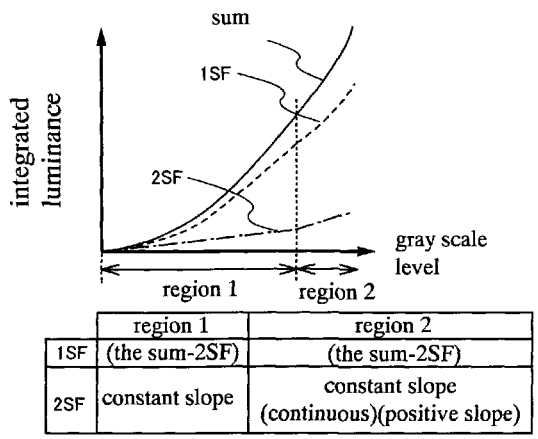
FIGS. 4A to 4F each illustrate one mode of a display device of the invention.

FIG. 4A shows an example of a method for distributing the total integrated luminance in one frame to 1SF and 2SF. A table under the graph shows a feature of each subframe briefly. A subframe described as having a constant slope (continuous) (positive slope) in a column of the region 2 in the table means that change of the integrated luminance with respect to the gray scale level is constant, a value of the integrated luminance at the boundary with the adjacent region on the lower gray scale level side (the region 1) is continuous, and change of the integrated luminance with respect to the gray scale level in this region has a positive sign. With such features, luminance difference between 1SF and 2SF in the maximum gray scale is reduced, so that flickers in displaying an image can be reduced.

Figure 4B:
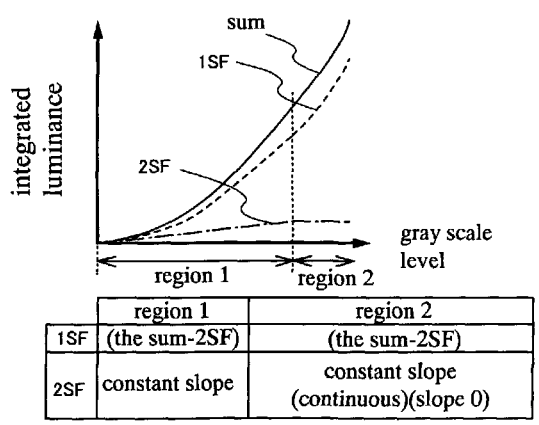

FIG. 4B shows an example of a method for distributing the total integrated luminance in one frame to 1SF and 2SF. A table under the graph shows a feature of each subframe briefly. A subframe described as having a constant slope (continuous) (slope 0) in a column of the region 2 in the table means that change of the integrated luminance with respect to the gray scale level is constant, a value of the integrated luminance at the boundary with the adjacent region on the lower gray scale level side (the region 1) is continuous, and change of the integrated luminance with respect to the gray scale level in this region is 0. With such features, image processing and applied voltage are simplified, and a load of a peripheral driver circuit is reduced.

Figure 4C:
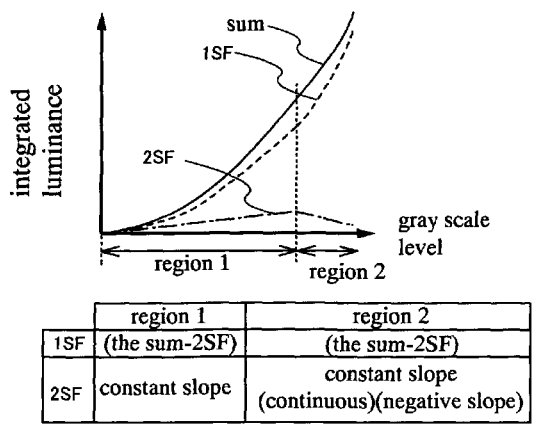

FIG. 4C shows an example of a method for distributing the total integrated luminance in one frame to 1SF and 2SF. A table under the graph shows a feature of each subframe briefly. A subframe described as having a constant slope (continuous) (negative slope) in a column of the region 2 in the table means that change of the integrated luminance with respect to the gray scale level is constant, a value of the integrated luminance at the boundary with the adjacent region on the lower gray scale level side (the region 1) is continuous, and change of the integrated luminance with respect to the gray scale level in this region has a negative sign. With such features, luminance difference between 1SF and 2SF in the maximum gray scale is increased, so that motion blur can be efficiently reduced.

In the modes shown in FIGS. 4A, 4B, and 4C, 1SF and 2SF can be exchanged, and even when the characteristics of 1SF and 2SF are exchanged, a similar effect can be obtained.

Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale level can be controlled more easily. Further, a magnitude relation of the luminance between 1SF and 2SF may be exchanged separately in each region. A region or regions in which the magnitude relation of luminance is exchanged may be only the region 1, only the region 2, or the region 1 and the region 2, for example.

Figure 4D:
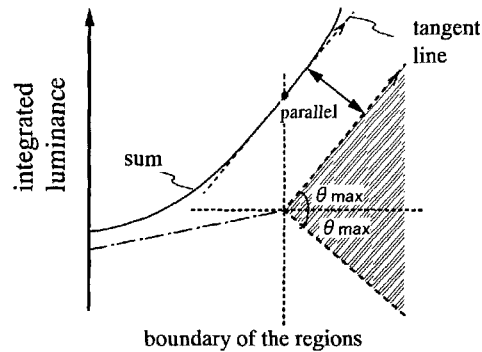

In such a manner, when gray scales which can be displayed are divided into a plurality of regions, change of integrated luminance with respect to a gray scale level (a value of slope) in each region can be a variety of values. However, as shown in FIG. 4D, the value of slope is preferably smaller than a slope of a tangent line of the total value of integrated luminance at the boundary of the regions. That is, when a slope of a tangent line of the total value of integrated luminance at the boundary of the regions is θmax, the value θ in the regions is preferably in the range of (−θmax<θ<θmax) (a hatched region in FIG. 4D). When θ is within the range, a phenomenon in which when change of integrated luminance with respect to a gray scale level is sharp, the gray scale level at the boundary of the regions is intensified and an unnatural contour is generated can be reduced.

Figure 4E:
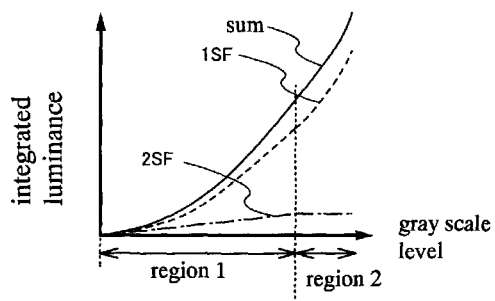
Figure 4F:
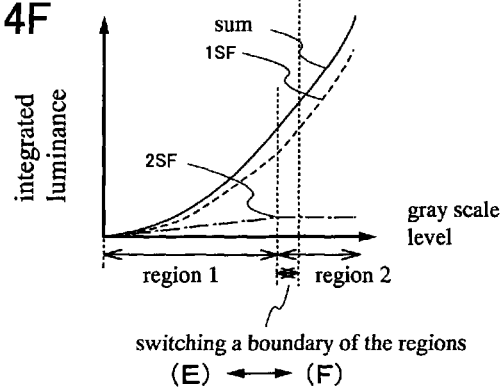

As a method for reducing a phenomenon in which when change of integrated luminance with respect to a gray scale level is sharp, the gray scale level at the boundary of the regions is intensified and an unnatural contour is generated, methods shown in FIGS. 4E and 4F can be used as well as the method shown in FIG. 4D. A feature of each region in FIGS. 4E and 4F is the same as the mode shown in FIG. 4B, and a gray scale level at the boundary of the regions is different. When a plurality of luminance distribution modes in which a gray scale level at the boundary of the regions varies are prepared and switched as needed, a phenomenon in which the gray scale level at the boundary of the regions is intensified and an unnatural contour is generated can be reduced. Such a method can be applied to a variety of luminance distribution modes, without being limited to the mode shown in FIG. 4B.

As for a method for switching a plurality of luminance distribution modes, the luminance distribution modes may be switched per frame, for example. Accordingly, a phenomenon in which an unnatural contour is generated can be efficiently reduced. Alternatively, the luminance distribution modes may be switched in accordance with an image to be displayed. At this time, when a threshold value exists in gray scale level distribution of the image, the boundary of the regions is preferably set near the threshold value. For example, in the case of a bright image with little distribution of gray scale levels less than or equal to the gray scale level of 100, the boundary of the regions is preferably set near the gray scale level of 100. Similarly, also in the case of a dark image with little distribution of gray scale levels greater than or equal to the gray scale level of 100, the boundary of the regions is preferably set near the gray scale level of 100. Accordingly, in an image to be displayed, gray scale levels which cross near the threshold value are reduced, so that a phenomenon in which the gray scale level at the boundary of the regions is intensified and thus an unnatural contour is generated can be reduced. Note that the threshold value may be set depending on the brightness of an image. For example, the boundary of the regions may be set on the higher gray scale level side in the case of a generally dark image, and the boundary of the regions may be set on the lower gray scale level side in the case of a generally bright image. Accordingly, in an image to be displayed, gray scale levels which cross near the threshold value are reduced, so that a phenomenon in which the gray scale level at the boundary of the regions is intensified and thus an unnatural contour is generated can be reduced. Note that the method of switching the luminance distribution mode in accordance with an image to be displayed can be applied to a variety of luminance distribution modes, without being limited to modes with different boundaries of the regions.

Next, another mode of this embodiment mode is described with reference to FIGS. 5A to 5F. FIGS. 5A to 5F each show an example of a method for distributing the total integrated luminance in one frame to 1SF and 2SF in the case where gray scales which can be displayed are divided into a plurality of regions, for example, two regions and each subframe can have different characteristics in each region. In particular, the case where change of integrated luminance with respect to a gray scale of one of subframes is constant in both of the two regions is described.

Figure 5A:
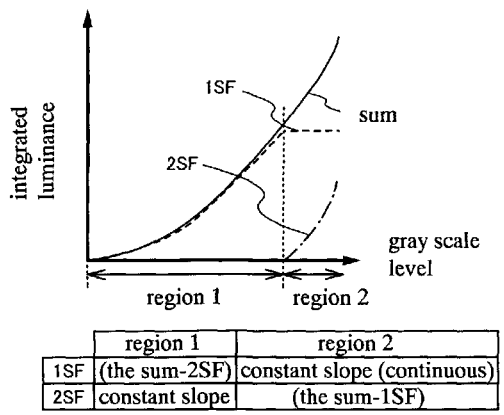
FIGS. 5A to 5F each illustrate one mode of a display device of the invention.

FIG. 5A shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 1SF in a region 2 is that change of integrated luminance with respect to a gray scale level is constant and a value of integrated luminance is continuous at the boundary with an adjacent region on the lower gray scale level side (the region 1). A value of the slope may be positive, 0, or negative. A feature of 2SF in the region 2 is that the luminance depends on the total luminance and the luminance of 1SF. With such features, image processing and applied voltage are simplified, and a load of a peripheral driver circuit is reduced. Moreover, a phenomenon in which an unnatural contour is generated can be reduced. Further, since the maximum luminance in 1SF and 2SF can be lowered, power consumption can be reduced.

Figure 5B:
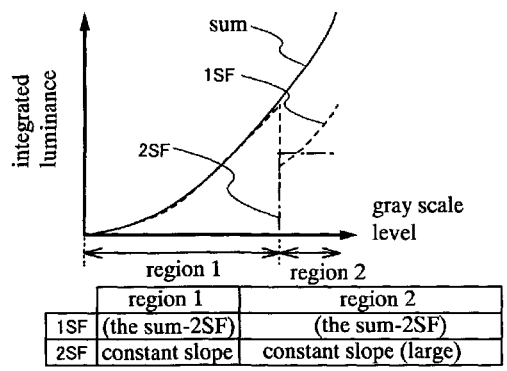

FIG. 5B shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 2SF in a region 2 is that change of integrated luminance with respect to a gray scale level is constant and a value of integrated luminance changes discontinuously toward a larger value of integrated luminance at the boundary with an adjacent region on the lower gray scale level side (the region 1). A value of the slope may be positive, 0, or negative. A feature of 1SF in the region 2 is that the luminance depends on the total luminance and the luminance of 2SF. With such features, luminance difference between 1SF and 2SF in the maximum gray scale is reduced, so that flickers in displaying an image can be reduced. Further, since the luminance change of 2SF is simplified, image processing and applied voltage are simplified, and a load of a peripheral driver circuit is reduced. In particular, capacitance of a memory element can be reduced when overdriving is performed.

Figure 5C:
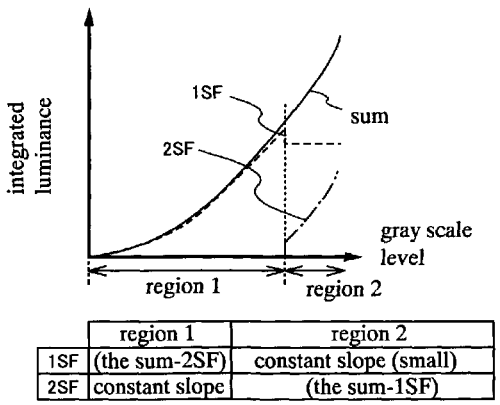

FIG. 5C shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 1SF in a region 2 is that change of integrated luminance with respect to a gray scale level is constant and a value of integrated luminance changes discontinuously toward a smaller value of integrated luminance at the boundary with an adjacent region on the lower gray scale level side (the region 1). A value of the slope may be positive, 0, or negative. A feature of 2SF in the region 2 is that the luminance depends on the total luminance and the luminance of 1SF. With such features, luminance difference between 1SF and 2SF in the maximum gray scale is reduced, and flickers in displaying an image can be reduced.

Figure 5D:
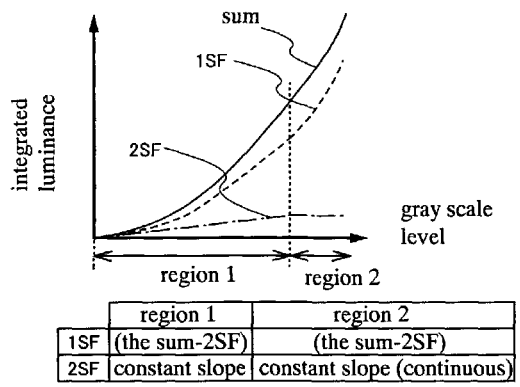

FIG. 5D shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 2SF in a region 2 is that change of integrated luminance with a respect to gray scale level is constant and a value of integrated luminance is continuous at the boundary with an adjacent region on the lower gray scale level side (the region 1). A value of the slope may be positive, 0, or negative. A feature of 1SF in the region 2 is that the luminance depends on the total luminance and the luminance of 2SF. With such features, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

Figure 5E:
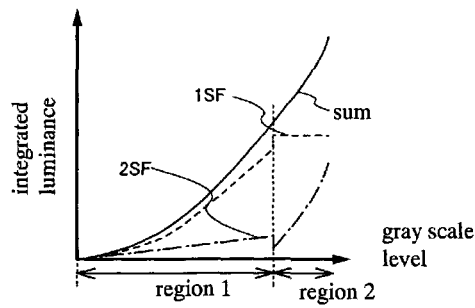

FIG. 5E shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 1SF in a region 2 is that change of integrated luminance with respect to a gray scale level is constant and a value of integrated luminance changes discontinuously toward a larger value of integrated luminance at the boundary with an adjacent region on the lower gray scale level side (the region 1). A value of the slope may be positive, 0, or negative. A feature of 2SF in the region 2 is that the luminance depends on the total luminance and the luminance of 1SF. With such features, luminance difference between 1SF and 2SF in the maximum gray scale is increased, and motion blur can be efficiently reduced.

Figure 5F:
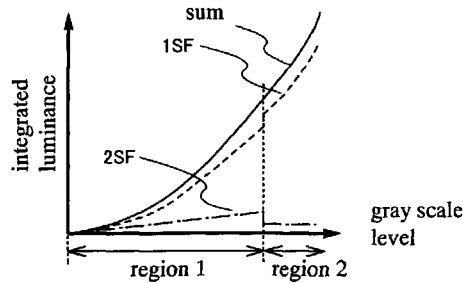

FIG. 5F shows an example of a method for distributing the total integrated luminance in one frame to 1SF and 2SF. A table under the graph shows a feature of each subframe briefly. A feature of 2SF in a region 1 is that change of integrated luminance with respect to a gray scale level is constant. A value of the slope may be positive, 0, or negative. A feature of 1SF in the region 1 is that the luminance depends on the total luminance and the luminance of 2SF. A feature of 2SF in a region 2 is that change of integrated luminance with respect to a gray scale level is constant and a value of integrated luminance changes discontinuously toward a smaller value of integrated luminance at the boundary with an adjacent region on the lower gray scale level side (the region 1). A value of the slope may be positive, 0, or negative. A feature of 1SF in the region 2 is that the luminance depends on the total luminance and the luminance of 2SF. With such features, luminance difference between 1SF and 2SF in the maximum gray scale is increased, and motion blur can be efficiently reduced.

In the modes shown in FIGS. 5A to 5F, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale level can be controlled more easily. A magnitude relation of luminance between 1SF and 2SF may be exchanged. Further, the magnitude relation of luminance between 1SF and 2SF may be exchanged separately in each region. A region or regions in which the magnitude relation of luminance is exchanged may be only the region 1, only the region 2, or the region 1 and the region 2, for example.

Next, another mode of this embodiment mode is described with reference to FIGS. 6A to 6F. FIGS. 6A to 6F each show an example of a method for distributing the total integrated luminance in one frame to 1SF and 2SF in the case where gray scale levels which can be displayed are divided into a plurality of regions, for example, two regions and each subframe can have different characteristics in each region. In particular, the case where change of integrated luminance with respect to a gray scale level of one of subframes in one of the two regions is constant and an integrated luminance ratio between 1SF and 2SF is equal in each gray scale level in the other region is described.

Figure 6A:
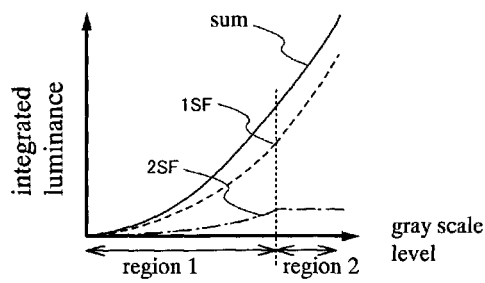
FIGS. 6A to 6F each illustrate one mode of a display device of the invention.

FIG. 6A shows an example of a method for distributing the total integrated luminance in one frame to 1SF and 2SF. A table under the graph shows a feature of each subframe briefly. A feature of 1SF and 2SF in a region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, luminance difference between 1SF and 2SF on the lower gray scale level side can be increased, and motion blur can be efficiently reduced. A feature of 2SF in a region 2 is that change of integrated luminance with respect to a gray scale is constant and a value of integrated luminance is continuous at the boundary with an adjacent region on the lower gray scale level side (the region 1). A value of the slope may be positive, 0, or negative. A feature of 1SF in the region 2 is that the luminance depends on the total luminance and the luminance of 2SF. With such features, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

Figure 6B:
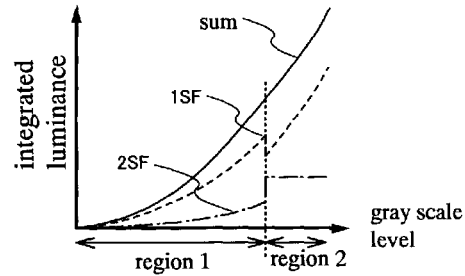

FIG. 6B shows an example of a method for distributing the total integrated luminance in one frame to 1SF and 2SF. A table under the graph shows a feature of each subframe briefly. A feature of 1SF and 2SF in a region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, luminance difference between 1SF and 2SF on the lower gray scale level side can be increased, and motion blur can be efficiently reduced. A feature of 2SF in a region 2 is that change of integrated luminance with respect to a gray scale is constant and a value of integrated luminance changes discontinuously toward a larger value of integrated luminance at the boundary with an adjacent region on the lower gray scale level side (the region 1). A value of the slope may be positive, 0, or negative. A feature of 1SF in the region 2 is that the luminance depends on the total luminance and the luminance of 2SF. With such features, luminance difference between 1SF and 2SF in the maximum gray scale is reduced, and flickers in displaying an image are reduced.

Figure 6C:
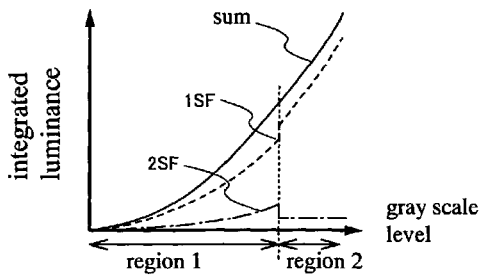

FIG. 6C shows an example of a method for distributing the total integrated luminance in one frame to 1SF and 2SF. A table under the graph shows a feature of each subframe briefly. A feature of 1SF and 2SF in a region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, luminance difference between 1SF and 2SF on the lower gray scale level side can be increased, and motion blur can be efficiently reduced. A feature of 2SF in a region 2 is that change of integrated luminance with respect to a gray scale is constant and a value of integrated luminance changes discontinuously toward a smaller value of integrated luminance at the boundary with an adjacent region on the lower gray scale level side (the region 1). A value of the slope may be positive, 0, or negative. A feature of 1SF in the region 2 is that the luminance depends on the total luminance and the luminance of 2SF. With such features, luminance difference between 1SF and 2SF in the maximum gray scale is increased, and motion blur can be efficiently reduced.

Figure 6D:
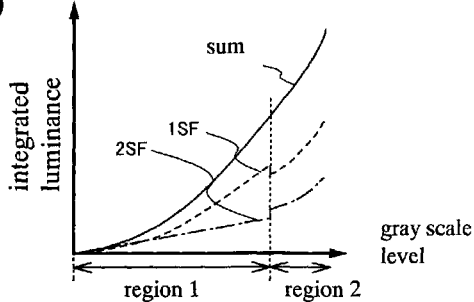

FIG. 6D shows an example of a method for distributing the total integrated luminance in one frame to 1SF and 2SF. A table under the graph shows a feature of each subframe briefly. A feature of 2SF in a region 1 is that change of integrated luminance with respect to a gray scale is constant. A value of the slope may be positive, 0, or negative. A feature of 1SF in the region 1 is that the luminance depends on the total luminance and the luminance of 2SF. A feature of 1SF and 2SF in a region 2 is that an integrated luminance ratio between 1SF and 2SF is equal in each gray scale, a value of integrated luminance of 1SF changes discontinuously toward a smaller value, and a value of integrated luminance of 2SF changes discontinuously toward a larger value at the boundary with an adjacent region on the lower gray scale level side (the region 1). With such features, luminance difference between 1SF and 2SF in the maximum gray scale is reduced, and flickers in displaying an image are reduced. A value of the ratio in this case (the level of the smaller luminance with respect to the larger luminance) is preferably greater than 0.5 and less than 1. Accordingly, motion blur can be efficiently reduced.

Figure 6E:
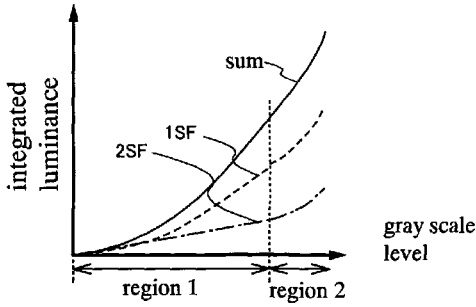

FIG. 6E shows an example of a method for distributing the total integrated luminance in one frame to 1SF and 2SF. A table under the graph shows a feature of each subframe briefly. A feature of 2SF in a region 1 is that change of integrated luminance with respect to a gray scale is constant. A value of the slope may be positive, 0, or negative. A feature of 1SF in the region 1 is that the luminance depends on the total luminance and the luminance of 2SF. A feature of 1SF and 2SF in a region 2 is that an integrated luminance ratio between 1SF and 2SF is equal in each gray scale, and a value of integrated luminance of each of 1SF and 2SF is continuous at the boundary with an adjacent region on the lower gray scale level side (the region 1). With such features, image processing and applied voltage are simplified, and a load of a peripheral driver circuit is reduced. Further, a phenomenon in which an unnatural contour is generated can be reduced. A value of the ratio in this case (the level of the smaller luminance with respect to the larger luminance) is preferably greater than 0.5 and less than 1. Accordingly, motion blur can be efficiently reduced.

Figure 6F:
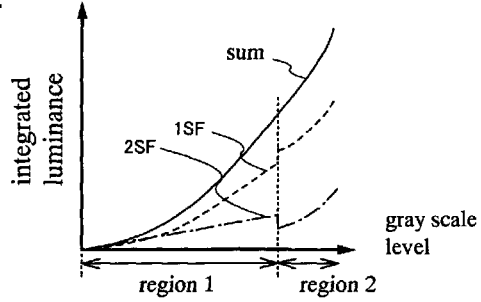

FIG. 6F shows an example of a method for distributing the total integrated luminance in one frame to 1SF and 2SF. A table under the graph shows a feature of each subframe briefly. A feature of 2SF in a region 1 is that change of integrated luminance with respect to a gray scale is constant. A value of the slope may be positive, 0, or negative. A feature of 1SF in the region 1 is that the luminance depends on the total luminance and the luminance of 2SF. A feature of 1SF and 2SF in a region 2 is that an integrated luminance ratio between 1SF and 2SF is equal in each gray scale, a value of integrated luminance of 1SF changes discontinuously toward a larger value, and a value of integrated luminance of 2SF changes discontinuously toward a smaller value at the boundary with an adjacent region on the lower gray scale level side (the region 1). With such features, luminance difference between 1SF and 2SF in the maximum gray scale is increased, and motion blur can be efficiently reduced. A value of the ratio in this case (the level of the smaller luminance with respect to the larger luminance) is preferably greater than 0.5 and less than 1. Accordingly, motion blur can be efficiently reduced.

In the modes shown in FIGS. 6A to 6F, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale can be controlled more easily. Further, a magnitude relation of luminance between 1SF and 2SF may be exchanged separately in each region. A region or regions in which the magnitude relation of luminance is exchanged may be only the region 1, only the region 2, or the region 1 and the region 2, for example.

Figure 7A:
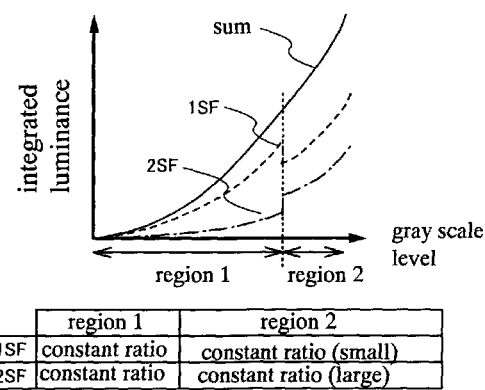
FIGS. 7A and 7B each illustrate one mode of a display device of the invention.
Figure 7B:
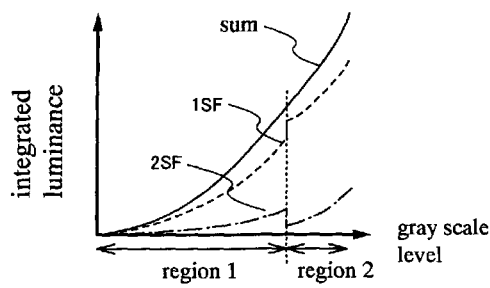

Next, another mode of this embodiment mode is described with reference to FIGS. 7A and 7B. FIGS. 7A and 7B each show an example of a method for distributing the total integrated luminance in one frame to 1SF and 2SF in the case where gray scales which can be displayed are divided into a plurality of regions, for example, two regions and each subframe can have different characteristics in each region. In particular, the case where an integrated luminance ratio between 1SF and 2SF is equal in each gray scale in the both regions is described.

FIG. 7A shows an example of a method for distributing the total integrated luminance in one frame to 1SF and 2SF. A table under the graph shows a feature of each subframe briefly. A feature of 1SF and 2SF in a region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, luminance difference between 1SF and 2SF on the lower gray scale level side can be increased, and motion blur can be efficiently reduced. A feature of 1SF and 2SF in a region 2 is that an integrated luminance ratio between 1SF and 2SF is equal in each gray scale, a value of integrated luminance of 1SF changes discontinuously toward a smaller value, and a value of integrated luminance of 2SF changes discontinuously toward a larger value at the boundary with an adjacent region on the lower gray scale level side (the region 1). With such features, luminance difference between 1SF and 2SF in the maximum gray scale is reduced, and flickers in displaying an image are reduced. A value of the ratio in this case (the level of the smaller luminance with respect to the larger luminance) is preferably greater than 0.5 and less than 1. Accordingly, motion blur can be efficiently reduced.

FIG. 7B shows an example of a method for distributing the total integrated luminance in one frame to 1SF and 2SF. A table under the graph shows a feature of each subframe briefly. A feature of 1SF and 2SF in a region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, luminance difference between 1SF and 2SF on the lower gray scale level side can be increased, and motion blur can be efficiently reduced. A feature of 1SF and 2SF in a region 2 is that an integrated luminance ratio between 1SF and 2SF is equal in each gray scale, a value of integrated luminance of 1SF changes discontinuously toward a larger value, and a value of integrated luminance of 2SF changes discontinuously toward a smaller value at the boundary with an adjacent region on the lower gray scale level side (the region 1). With such features, luminance difference between 1SF and 2SF in the maximum gray scale is increased, and motion blur can be efficiently reduced. A value of the ratio in this case (the level of the smaller luminance with respect to the larger luminance) is preferably greater than 0.5 and less than 1. Accordingly, motion blur can be efficiently reduced.

In the modes shown in FIGS. 7A and 7B, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF be lower than the luminance in 1SF because the gray scale can be controlled more easily. Further, a magnitude relation of luminance between 1SF and 2SF may be exchanged separately in each region. A region or regions in which the magnitude relation of luminance is exchanged may be only the region 1, only the region 2, or the region 1 and the region 2, for example.

Next, another mode of this embodiment mode is described with reference to FIGS. 8A to 8D. FIGS. 8A to 8D each show an example of a method for distributing the total integrated luminance in one frame to 1SF and 2SF in the case where gray scales which can be displayed are divided into a plurality of regions, for example, three regions and each subframe can have different characteristics in each region. In particular, the case where change of integrated luminance with respect to a gray scale level of one of subframes is constant in every region is described.

Figure 8A:
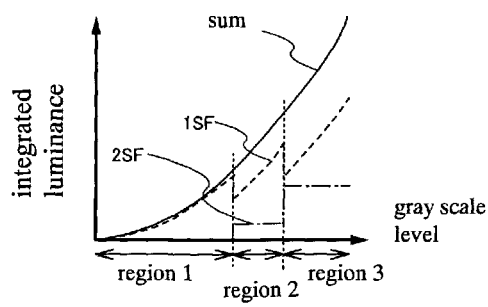
FIGS. 8A to 8D each illustrate one mode of a display device of the invention.

FIG. 8A shows an example of a method for distributing the total integrated luminance in one frame to 1SF and 2SF. A table under the graph shows a feature of each subframe briefly. Each feature of 2SF in a region 1, a region 2, and a region 3 is that change of integrated luminance with respect to a gray scale level is constant. Each feature of 1SF in the region 1, the region 2, and the region 3 is that the luminance depends on the total luminance and the luminance of the other subframe.

Figure 8B:
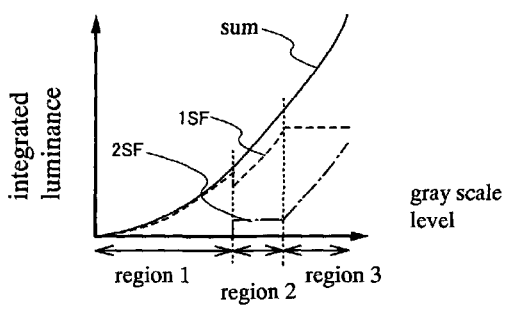

FIG. 8B shows an example of a method for distributing the total integrated luminance in one frame to 1SF and 2SF. A table under the graph shows a feature of each subframe briefly. Each feature of 2SF in a region 1 and a region 2 and 1SF in a region 3 is that change of integrated luminance with respect to a gray scale is constant. Each feature of 1SF in the region 1 and the region 2 and 2SF in the region 3 is that the luminance depends on the total luminance and the luminance of the other subframe.

Figure 8C:
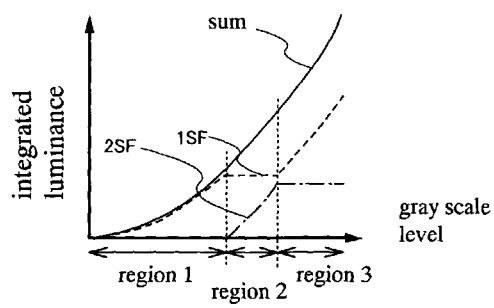

FIG. 8C shows an example of a method for distributing the total integrated luminance in one frame to 1SF and 2SF. A table under the graph shows a feature of each subframe briefly. Each feature of 2SF in a region 1 and a region 3 and 1SF in a region 2 is that change of integrated luminance with respect to a gray scale is constant. Each feature of 1SF in the region 1 and the region 3 and 2SF in the region 2 is that the luminance depends on the total luminance and the luminance of the other subframe.

Figure 8D:
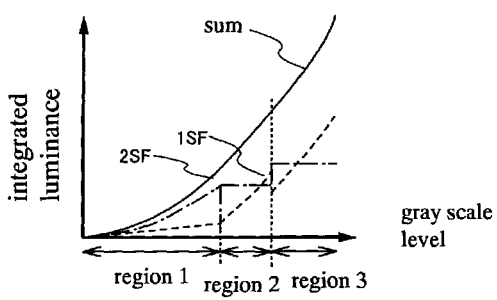

FIG. 8D shows an example of a method for distributing the total integrated luminance in one frame to 1SF and 2SF. A table under the graph shows a feature of each subframe briefly. Each feature of 1SF in a region 1 and 2SF in a region 2 and a region 3 is that change of integrated luminance with respect to a gray scale is constant. Each feature of 2SF in the region 1 and 1SF in the region 2 and the region 3 is that the luminance depends on the total luminance and the luminance of the other subframe.

Note that a value of the slope may be positive, 0, or negative. Differences among these are not described in detail in FIGS. 8A to 8D, and a combination of these can be applied to every region. When the slope is positive or negative and luminance difference between 1SF and 2SF is increased, motion blur can be efficiently reduced. When the slope is positive or negative and luminance difference between 1SF and 2SF is reduced, flickers in displaying an image are reduced. Alternatively, when the slope is 0, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

As described above, luminance at the boundary of regions can be in any of the following states: changing discontinuously toward higher luminance; being continuous; or changing discontinuously toward lower luminance, as compared with that in an adjacent region on the lower gray scale level side. Differences among these are not described in detail in FIGS. 8A to 8D, and a combination of these can be applied to every region boundary. When the luminance changes discontinuously at the boundary of regions, and thus the luminance difference between 1SF and 2SF is increased, motion blur can be efficiently reduced. When the luminance changes discontinuously at the boundary of regions, and thus the luminance difference between 1SF and 2SF is reduced, flickers in displaying an image are reduced. Alternatively, when the luminance is continuous at the boundary of regions, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

In the modes shown in FIGS. 8A to 8D, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale can be controlled more easily. A magnitude relation of luminance between 1SF and 2SF may be exchanged. Further, the magnitude relation of luminance between 1SF and 2SF may be exchanged separately in each region. A region or regions in which the magnitude relation of luminance is exchanged may be only the region 1, only the region 2, only the region 3, the region 1 and the region 2, the region 2 and the region 3, the region 3 and the region 1, or the region 1, the region 2 and the region 3, for example.

Next, another mode of this embodiment mode is described with reference to FIGS. 9A to 9F. FIGS. 9A to 9F each show an example of a method for distributing the total integrated luminance in one frame to 1SF and 2SF in the case where gray scales which can be displayed are divided into a plurality of regions, for example, three regions and each subframe can have different characteristics in each region. In particular, the case where change of integrated luminance with respect to a gray scale level of one of subframes is constant in two regions out of the three regions, and an integrated luminance ratio between 1SF and 2SF is equal in each gray scale in the other region is described.

Figure 9A:
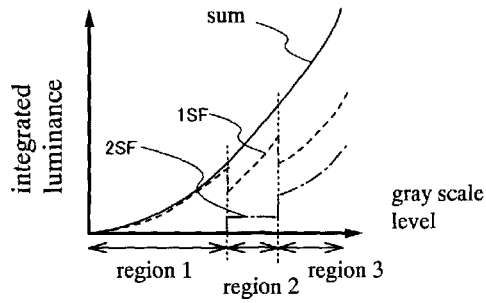
FIGS. 9A to 9F each illustrate one mode of a display device of the invention.

FIG. 9A shows an example of a method for distributing the total integrated luminance in one frame to 1SF and 2SF. A table under the graph shows a feature of each subframe briefly. A feature of 2SF in a region 1 and a region 2 is that change of integrated luminance with respect to a gray scale is constant. A feature of 1SF in the region 1 and the region 2 is that the luminance depends on the total luminance and the luminance of the other subframe. A feature of 1SF in a region 3 and 2SF in the region 3 is that an integrated luminance ratio between 1SF and 2SF is equal in each gray scale. A value of the ratio in this case (the level of the smaller luminance with respect to the larger luminance) is preferably greater than 0.5 and less than 1. Accordingly, motion blur can be efficiently reduced.

Figure 9B:
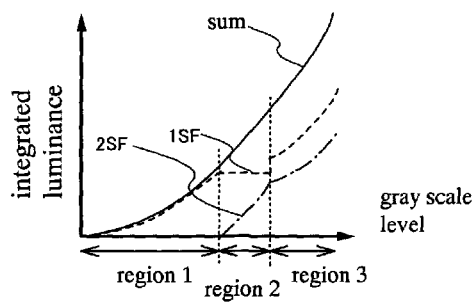

FIG. 9B shows an example of a method for distributing the total integrated luminance in one frame to 1SF and 2SF. A table under the graph shows a feature of each subframe briefly. A feature of 2SF in a region 1 and 1SF in a region 2 is that change of integrated luminance with respect to a gray scale is constant. A feature of 1SF in the region 1 and 2SF the region 2 is that the luminance depends on the total luminance and the luminance of the other subframe. A feature of 1SF in a region 3 and 2SF in the region 3 is that an integrated luminance ratio between 1SF and 2SF is equal in each gray scale. A value of the ratio in this case (the level of the smaller luminance with respect to the larger luminance) is preferably greater than 0.5 and less than 1. Accordingly, motion blur can be efficiently reduced.

Figure 9C:
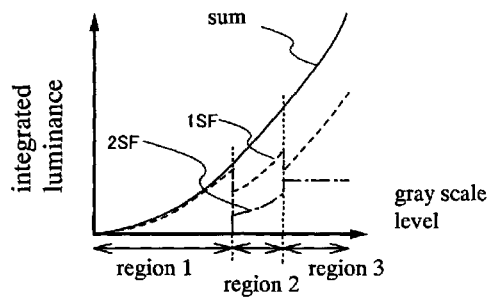

FIG. 9C shows an example of a method for distributing the total integrated luminance in one frame to 1SF and 2SF A table under the graph shows a feature of each subframe briefly. A feature of 2SF in a region 1 and a region 3 is that change of integrated luminance with respect to a gray scale is constant. A feature of 1SF in the region 1 and the region 3 is that the luminance depends on the total luminance and the luminance of the other subframe. A feature of 1SF in a region 2 and 2SF in the region 2 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced.

Figure 9D:
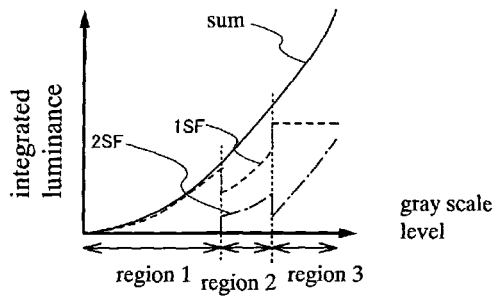

FIG. 9D shows an example of a method for distributing the total integrated luminance in one frame to 1SF and 2SF A table under the graph shows a feature of each subframe briefly. A feature of 2SF in a region 1 and 1SF in a region 3 is that change of integrated luminance with respect to a gray scale is constant. A feature of 1SF in the region 1 and 2SF in the region 3 is that the luminance depends on the total luminance and the luminance of the other subframe. A feature of 1SF in a region 2 and 2SF in the region 2 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced.

Figure 9E:
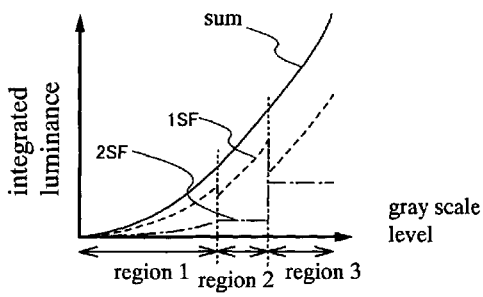

FIG. 9E shows an example of a method for distributing the total integrated luminance in one frame to 1SF and 2SF. A table under the graph shows a feature of each subframe briefly. A feature of 2SF in a region 2 and a region 3 is that change of integrated luminance with respect to a gray scale is constant. A feature of 1SF in the region 2 and the region 3 is that the luminance depends on the total luminance and the luminance of the other subframe. A feature of 1SF in a region 1 and 2SF in the region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced.

Figure 9F:
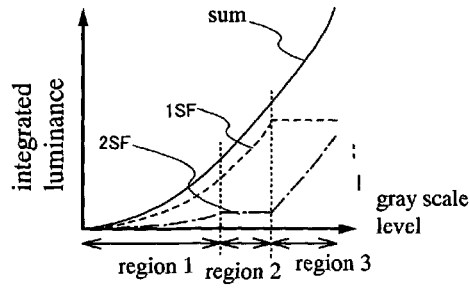

FIG. 9F shows an example of a method for distributing the total integrated luminance in one frame to 1SF and 2SF. A table under the graph shows a feature of each subframe briefly. A feature of 2SF in a region 2 and 1SF in a region 3 is that change of integrated luminance with respect to a gray scale is constant. A feature of 1SF in the region 2 and 2SF in the region 3 is that the luminance depends on the total luminance and the luminance of the other subframe. A feature of 1SF in a region 1 and 2SF in the region 1 is that an integrated luminance ratio between 1SF and 2SF is equal in each gray scale. A value of the ratio in this case (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced.

Note that a value of the slope may be positive, 0, or negative. Differences among these are not described in detail in FIGS. 9A to 9F, and a combination of these can be applied to every region. When the slope is positive or negative and luminance difference between 1SF and 2SF is increased, motion blur can be efficiently reduced. When the slope is positive or negative and luminance difference between 1SF and 2SF is decreased, flickers in displaying an image are reduced. Alternatively, when the slope is 0, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

As described above, luminance at the boundary of regions can be in any of the following states: changing discontinuously toward higher luminance; being continuous; or changing discontinuously toward lower luminance, as compared with that in an adjacent region on the lower gray scale level side. Differences among these are not described in detail in FIGS. 9A to 9F, and a combination of these can be applied to every region boundary. When the luminance changes discontinuously at the boundary of regions and thus the luminance difference between 1SF and 2SF is increased, motion blur can be efficiently reduced. When the luminance changes discontinuously at the boundary of regions and thus the luminance difference between 1SF and 2SF is decreased, flickers in displaying an image are reduced. Alternatively, when the luminance is continuous at the boundary of regions, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

In the modes shown in FIGS. 9A to 9F, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF be lower than the luminance in 1SF because the gray scale can be controlled more easily. Further, a magnitude relation of luminance between 1SF and 2SF may be exchanged separately in each region. A region or regions in which the magnitude relation of luminance is exchanged may be only the region 1, only the region 2, only the region 3, the region 1 and the region 2, the region 2 and the region 3, the region 3 and the region 1, or the region 1 and the region 2 and the region 3, for example.

Next, another mode of this embodiment mode is described with reference to FIGS. 10A to 10D. FIGS. 10A to 10D each show an example of a method for distributing the total integrated luminance in one frame to 1SF and 2SF in the case where gray scales which can be displayed are divided into a plurality of regions, for example, three regions and each subframe can have different characteristics in each region. In particular, the case where an integrated luminance ratio between 1SF and 2SF is equal in each gray scale in two regions out of the three regions, and change of integrated luminance with respect to a gray scale of one of subframes is constant in the other region is described. Moreover, the case where an integrated luminance ratio between 1SF and 2SF is equal in each gray scale in every region is also described.

Figure 10A:
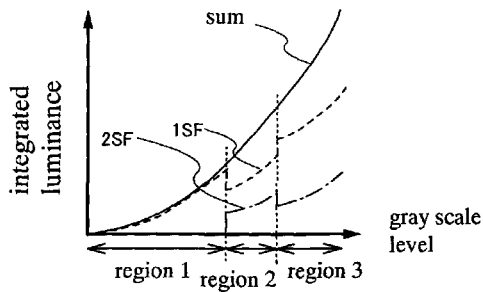
FIGS. 10A to 10D each illustrate one mode of a display device of the invention.

FIG. 10A shows an example of a method for distributing the total integrated luminance in one frame to 1SF and 2SF A table under the graph shows a feature of each subframe briefly. A feature of 2SF in a region 1 is that change of integrated luminance with respect to a gray scale is constant. A feature of 1SF in the region 1 is that the luminance depends on the total luminance and the luminance of the other subframe. A feature of 1SF in a region 2 and a region 3 and 2SF in the region 2 and the region 3 is that an integrated luminance ratio between 1SF and 2SF is equal in each gray scale. A value of the ratio in the region 2 (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced. Further, a value of the ratio in the region 3 is preferably greater than 0.5 and less than 1. Accordingly, motion blur can be efficiently reduced.

Figure 10B:
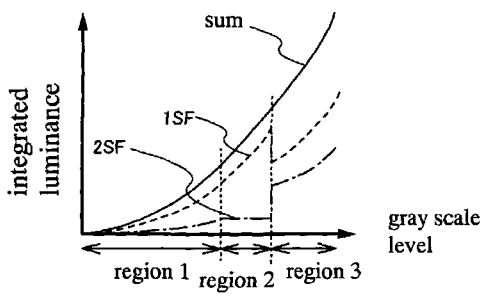

FIG. 10B shows an example of a method for distributing the total integrated luminance in one frame to 1SF and 2SF. A table under the graph shows a feature of each subframe briefly. A feature of 2SF in a region 2 is that change of integrated luminance with respect to a gray scale is constant. A feature of 1SF in the region 2 is that the luminance depends on the total luminance and the luminance of the other subframe. A feature of 1SF in a region 1 and a region 3 and 2SF in the region 1 and the region 3 is that an integrated luminance ratio between 1SF and 2SF is equal in each gray scale. A value of the ratio in the region 1 (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced. Further, a value of the ratio in the region 3 is preferably greater than 0.5 and less than 1. Accordingly, motion blur can be efficiently reduced.

Figure 10C:
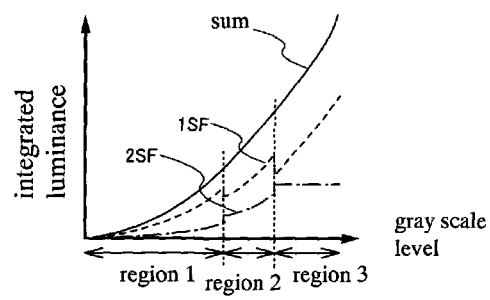

FIG. 10C shows an example of a method for distributing the total integrated luminance in one frame to 1SF and 2SF. A table under the graph shows a feature of each subframe briefly. A feature of 2SF in a region 3 is that change of integrated luminance with respect to a gray scale is constant. A feature of 1SF in the region 3 is that the luminance depends on the total luminance and the luminance of the other subframe. A feature of 1SF in a region 1 and a region 2 and 2SF in the region 1 and the region 2 is that an integrated luminance ratio between 1SF and 2SF is equal in each gray scale. A value of the ratio in the region 1 and the region 2 (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced.

Figure 10D:
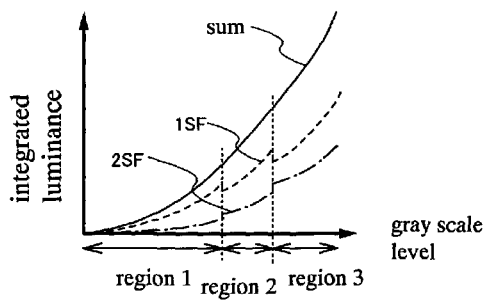

FIG. 10D shows an example of a method for distributing the total integrated luminance in one frame to 1SF and 2SF. A table under the graph shows a feature of each subframe briefly. A feature of 1SF in a region 1, a region 2, and a region 3, and 2SF in the region 1, the region 2, and the region 3 is that an integrated luminance ratio between 1SF and 2SF is equal in each gray scale. A value of the ratio in the region 1 and the region 2 (the level of the smaller luminance with respect to the larger luminance) is preferably greater than 0.1 and less than 0.5. Accordingly, the luminance difference between 1SF and 2SF on the lower gray scale level side can be increased, and motion blur can be efficiently reduced. A value of the ratio in the region 3 is preferably greater than 0.5 and less than 1. Accordingly, motion blur can be efficiently reduced.

Note that a value of the slope may be positive, 0, or negative. Differences among these are not described in detail in FIGS. 10A to 10D, and a combination of these can be applied to every region. When the slope is positive or negative and luminance difference between 1SF and 2SF is increased, motion blur can be efficiently reduced. When the slope is positive or negative and luminance difference between 1SF and 2SF is reduced, flickers in displaying an image are reduced. Alternatively, when the slope is 0, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

As described above, luminance at the boundary of regions can be in any of the following states: changing discontinuously toward higher luminance; being continuous; or changing discontinuously toward lower luminance, as compared with that in an adjacent region on the lower gray scale level side. Differences among these are not described in detail in FIGS. 10A to 10D, and a combination of these can be applied to every region boundary. When the luminance changes discontinuously at the boundary of regions and thus the luminance difference between 1SF and 2SF is increased, motion blur can be efficiently reduced. When the luminance changes discontinuously at the boundary of regions and thus the luminance difference between 1SF and 2SF is reduced, flickers in displaying an image are reduced. Alternatively, when the luminance is continuous at the boundary of regions, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

In the modes shown in FIGS. 10A to 10D, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale can be controlled more easily. Further, a magnitude relation of luminance between 1SF and 2SF may be exchanged separately in each region. A region or regions in which the magnitude relation of luminance is exchanged may be only the region 1, only the region 2, only the region 3, the region 1 and the region 2, the region 2 and the region 3, the region 3 and the region 1, or the region 1 and the region 2 and the region 3, for example.

Figure 11A:
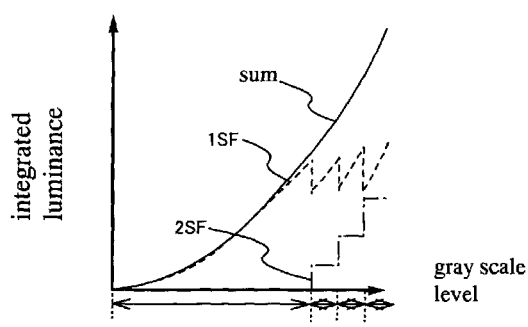
FIGS. 11A and 11B each illustrate one mode of a display device of the invention.
Figure 11B:
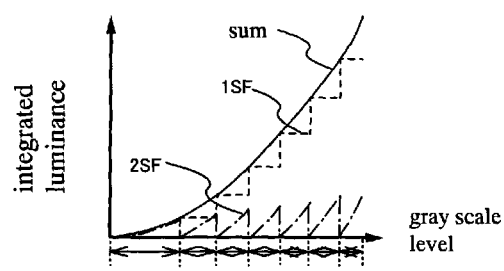

Next, another mode of this embodiment mode is described with reference to FIGS. 11A and 11B. FIGS. 11A and 11B each show an example of the case where the division number of gray scale levels to be displayed is 4 or more. The division number of regions may be any number as long as plural kinds of gray scales are included in each region. FIGS. 11A and 11B illustrate characteristic examples.

FIG. 11A shows an example of a method for distributing the total integrated luminance in one frame to 1SF and 2SF. Features of the method shown in FIG. 11A are as follows: an image to be displayed in 2SF is used as a dark image, the number of levels of luminance of the image to be displayed in 2SF is limited to be several, the luminance is gradually increased as a gray scale level becomes higher, and a gray scale is interpolated by using a bright image in each region. Accordingly, it becomes easy to form image data for displaying an image to be displayed in 2SF, and a load of a peripheral driver circuit is reduced. Moreover, since the number of levels of luminance to be expressed in 2SF is reduced when overdriving is combined, an overdrive circuit can be simplified. Note that the number of levels of luminance to be expressed in 2SF is preferably approximately from 4 to 16. In addition, the division number of gray scales which can be displayed is preferably equal to the number of levels of luminance to be expressed in SF.

FIG. 11B shows an example of a method for distributing the total integrated luminance in one frame to 1SF and 2SF. Features of the method shown in FIG. 11B are as follows: an image to be displayed in 1SF is used as a bright image, the number of levels of luminance of the image to be displayed in 1SF is limited to be several, the luminance is gradually increased as a gray scale level becomes higher, a gray scale is interpolated by using a dark image in each region, and the luminance of the dark image is made close to 0 at the boundary of regions. Accordingly, it becomes easy to form image data for displaying an image to be displayed in 1SF, and a load of a peripheral driver circuit is reduced. Further, since the number of levels of luminance to be expressed in 1SF is reduced when overdriving is combined, an overdrive circuit can be simplified. Furthermore, since average luminance of the dark image can be drastically reduced, motion blur can be significantly reduced. Note that the number of levels of luminance to be expressed in 1SF is preferably approximately from 16 to 64. In addition, the division number of gray scales which can be displayed is preferably equal to the number of kinds of luminance to be expressed in SF. Accordingly, a structure of a D/A converter can be simplified, for example. That is, a digital signal is treated as it is in one of the subframe periods, and the amplitude of an analog signal is reduced (the number of kinds of discrete values is reduced) in the other subframe period; thus, power consumption can be reduced, and the circuit size can be reduced. Note that when an analog signal is employed in both the subframe periods, the amplitude of both of the analog signals is reduced; thus, power consumption can be reduced, and the circuit size can be reduced.

In the modes shown in FIGS. 11A and 11B, 1SF and 2SF can be exchanged, and even when the characteristics of 1SF and 2SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale can be controlled more easily. Further, a magnitude relation of luminance between 1SF and 2SF may be exchanged separately in each region. A region or regions in which the magnitude relation of luminance is exchanged may be only the region 1, only the region 2, only the region 3, the region 1 and the region 2, the region 2 and the region 3, the region 3 and the region 1, or the region 1 and the region 2 and the region 3, for example. This can be similarly applied to the region 4 and subsequent regions.

Next, another mode of this embodiment mode is described with reference to FIGS. 12A to 12D. FIGS. 12A to 12D each show an example in which one frame is divided into three subframes. The number of subframes is not limited, but when it is 3, a particularly beneficial effect can be obtained. In this embodiment mode, a subframe period that is the first period in one frame period is referred to as 1SF, a subframe period that is the second period is referred to as 2SF, and a subframe period that is the third period is referred to as 3SF.

Figure 12A:
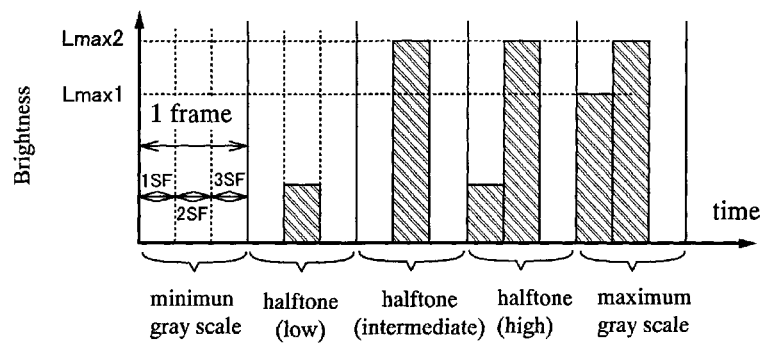
FIGS. 12A to 12D each illustrate one mode of a display device of the invention.
Figure 12B:
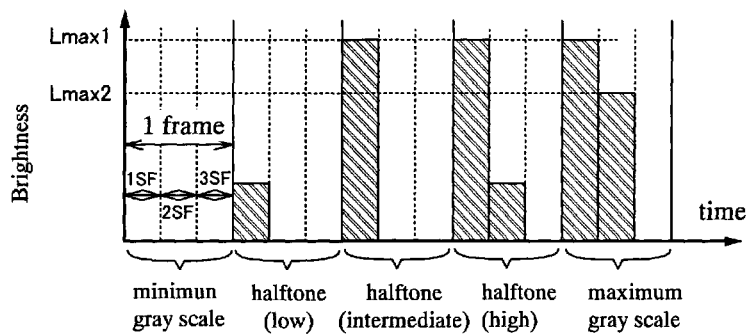

In graphs of FIGS. 12A and 12B, the horizontal axis represents time, and the vertical solid lines represent boundaries of frames. The vertical dashed lines represent boundaries of subframes. The vertical axis represents luminance. That is, each of FIGS. 12A and 12B shows change of luminance of a pixel with respect to time over five frames.

The degree of gray scale in each frame is represented below the horizontal axis. That is, each of FIGS. 12A and 12B shows change of the luminance of a pixel with respect to time in the case where a minimum gray scale is displayed first, and then, halftone on the lower gray scale level side, halftone of the intermediate degree, halftone on the higher gray scale level side, and a maximum gray scale are displayed in this order.

A feature of the methods shown in FIGS. 12A and 12B is that a gray scale is expressed by changing the luminance in 1SF and 2SF and the luminance in 3SF is 0 or very low, so that a pseudo impulsive driving method can be performed. FIG. 12A shows the case where a bright image is displayed in 2SF and a dark image is displayed in 1SF. FIG. 12B shows the case where a bright image is displayed in 1SF and a dark image is displayed in 2SF.

Note that since an effect of improving motion blur can be obtained by making the luminance in 3SF be 0 or very low, $L_{max1}$ and $L_{max2}$ which are the maximum luminance of 1SF and the maximum luminance of 2SF respectively, are not particularly limited. However, similarly to Embodiment Mode 3, when a dark image is inserted in 1SF, $L_{max1}$ is preferably in the range represented as follows: $(1/2)L_{max2} < L_{max1} < (9/10)L_{max2}$. Further, when a dark image is inserted in 2SF, $L_{max2}$ is preferably in the range represented as follows: $(1/2)L_{max1} < L_{max2} < (9/10)L_{max1}$.

Figure 12C:
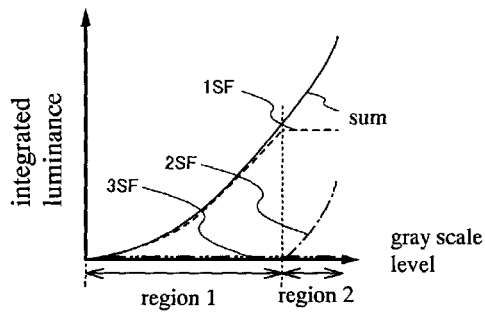

FIG. 12C shows an example of a method for distributing the total integrated luminance in one frame to 1SF, 2SF, and 3SF. A table under the graph shows a feature of each subframe briefly. A feature of 2SF in a region 1 and 1SF in a region 2 is that change of integrated luminance with respect to a gray scale is constant. A feature of 1SF in the region 1 and 2SF in the region 2 is that the luminance depends on the total luminance and the luminance of the other subframe. The luminance of 3SF in the region 1 and the region 2 may be kept constant at 0. Accordingly, motion blur can be effectively reduced in all the regions.

Figure 12D:
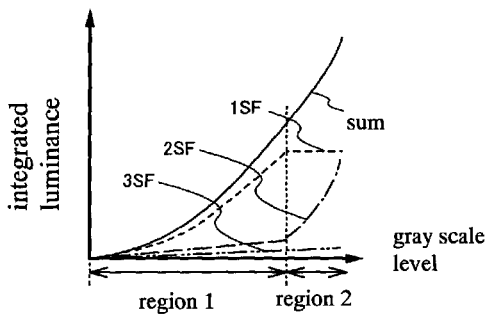

FIG. 12D shows an example of a method for distributing the total integrated luminance in one frame to 1SF, 2SF, and 3SF. A table under the graph shows a feature of each subframe briefly. A feature of 2SF in a region 1 and 1SF in a region 2 is that change of integrated luminance with respect to a gray scale is constant. A feature of 1SF in the region 1 and 2SF in the region 2 is that the luminance depends on the total luminance and the luminance of the other subframe. Further, the slope of luminance of 3SF in the region 1 and the region 2 may be kept constant at a small value. When the maximum luminance of 3SF is denoted by $L_{max3}$, $L_{max3}$ is preferably less than or equal to 1/10 of the maximum luminance of 1SF and the maximum luminance of 2SF. Accordingly, motion blur can be effectively reduced in all the gray scale regions.

Note that a value of the slope may be positive, 0, or negative. Differences among these are not described in detail in FIGS. 12A to 12D, and a combination of these can be applied to every region. When the slope is positive or negative and luminance difference between 1SF and 2SF is increased, motion blur can be efficiently reduced. When the slope is positive or negative and luminance difference between 1SF and 2SF is decreased, flickers in displaying an image are reduced. Alternatively, when the slope is 0, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

As described above, luminance at the boundary of regions can be in any of the following states: changing discontinuously toward higher luminance; being continuous; or changing discontinuously toward lower luminance, as compared with that in an adjacent region on the lower gray scale level side. Differences among these are not described in detail in FIGS. 12A to 12D, and a combination of these can be applied to every region boundary. When the luminance changes discontinuously at the boundary of regions and thus the luminance difference between 1SF and 2SF is increased, motion blur can be efficiently reduced. When the luminance changes discontinuously at the boundary of regions and thus the luminance difference between 1SF and 2SF is reduced, flickers in displaying an image are reduced. Alternatively, when the luminance is continuous at the boundary of regions, image processing and applied voltage are simplified, and a load of a peripheral driver circuit is reduced. Further, a phenomenon in which an unnatural contour is generated can be reduced. Moreover, since the maximum luminance in 1SF and 2SF can be lowered, power consumption can be reduced.

In the modes shown in FIGS. 12A to 12D, 1SF, 2SF and 3SF can be exchanged, and even when the characteristics of 1SF, 2SF and 3SF are exchanged, a similar effect can be obtained. Although the luminance in 1SF is higher than the luminance in 2SF, the invention is not limited to this. The luminance in 1SF may be lower than the luminance in 2SF. Note that when the total luminance is nonlinear, the luminance in 2SF is preferably lower than the luminance in 1SF because the gray scale can be controlled more easily. A magnitude relation of luminance between 1SF and 2SF may be exchanged. Further, a region or regions in which the magnitude relation of luminance between 1SF and 2SF is exchanged may be only the region 1, only the region 2, or the region 1 and the region 2.

All the modes described in this embodiment mode may be performed in combination with overdriving. Accordingly, response speed of a liquid crystal display element can be increased, and quality of moving images can be improved.

All the modes described in this embodiment mode may be performed as a liquid crystal display device in combination with a scanning backlight. Accordingly, average luminance of a backlight can be reduced, so that power consumption can be reduced.

All the modes described in this embodiment mode may be performed in combination with high frequency driving. Accordingly, quality of moving images can further be improved.

All the modes described in this embodiment mode may be performed in combination with a driving method in which objective voltage is applied to a display element by operating a potential of a common line. Accordingly, the frequency of writing a video signal to a pixel is decreased, so that power which is consumed when the video signal is written to the pixel can be reduced.

All the modes described in this embodiment mode may be performed in combination with a display element driven by a current, such as an organic EL element. Accordingly, video signal current can be increased, and writing time can be reduced.

All the modes described in this embodiment mode may be performed in combination with interlace scanning. Accordingly, operating frequency of a peripheral driver circuit can be reduced, and power consumption can be reduced. This is particularly effective in the case of a dark image with many pixels in a non-lighting state or in the case of a bright image with many pixels emitting light with the maximum luminance. This is because reduction in resolution due to the interlace scanning is small in an image with less change of gray scale level.

All the modes described in this embodiment mode may be performed in combination with a D/A converter circuit which can change a reference potential. Accordingly, efficiency of the D/A converter circuit can be improved. It is particularly effective that the reference potential can be changed between a subframe for displaying a bright image and a subframe for displaying a dark image. This is because an average value of a potential needed for a video signal is different in displaying a bright image and a dark image.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 5

In this embodiment mode, a silicon on insulator (SOI) substrate is described. Specifically, a method of forming an SOI substrate which is formed by transposition from a single-crystalline semiconductor substrate to a different substrate (hereinafter also referred to as a base substrate).

Note that in a transistor formed using an SOI substrate, parasitic capacitance is small and a short channel effect is suppressed compared with the case of a transistor formed using a normal single-crystalline semiconductor substrate. Further, the transistor formed using the SOI substrate has high mobility, low driving voltage, and little deterioration over time and little variation in characteristics compared with the case of a normal thin film transistor (including a thin film transistor using amorphous silicon or polycrystalline silicon). When the SOI substrate with which a transistor having such characteristics can be formed is applied to a variety of devices, various problems that a conventional device has can be solved.

For example, when a device whose performance can be improved by making a transistor minuter (e.g., a central processing unit (CPU) or a semiconductor memory) is formed using the SOI substrate, a short channel effect of the transistor can be suppressed; thus, the transistor can be further made minuter, and the performance can be improved.

In addition, when a device in which a thin film transistor is suitable to be used (e.g., a display device) is formed using the SOI substrate, various characteristics of the display device can be improved as follows, for example. Power consumption can be reduced by improvement in aperture ratio of pixels (the size of the transistor can be reduced). Power consumption can be reduced by reduction in driving voltage. Reliability can be improved (deterioration over time can be reduced). Quality of display images can be improved (variation in characteristics of the transistor can be reduced).

Specifically, characteristics of a liquid crystal display device formed using the SOI substrate can be significantly improved. For example, when a transistor in a pixel is formed using the SOI substrate, an aperture ratio of the liquid crystal display device can be increased; thus, power consumption can be reduced. When a peripheral driver circuit such as a gate driver or a source driver is formed using the SOI substrate, driving voltage of the circuit can be reduced; thus, power consumption can be reduced. When an image data processing circuit, a timing generation circuit, or the like is formed using the SOI substrate, driving voltage of the circuit can be reduced; thus, power consumption can be reduced. The use of the SOI substrate is more effective when the liquid crystal display device can perform overdriving. This is because image data is frequently processed by overdriving, and thus an effect of reducing power consumption due to reduction in driving voltage is more significant. Further, in the case of a circuit using a memory, such as a lookup table, an effect of reducing power consumption due to reduction in driving voltage is significant. Similarly, when a device has a structure capable of performing driving (double-frame rate driving) in which a frame rate of image data input to the liquid crystal display device is converted into a higher frame rate to perform display, the use of the SOI substrate is quite effective. This is because while driving frequency of a pixel circuit and a peripheral driver circuit becomes significantly high because of double-frame rate driving, driving voltage can be reduced when the circuit is formed using the SOI substrate; thus, power consumption can be drastically reduced.

Next, a method of forming an SOI substrate is described.

An SOI substrate 2400 has a structure where a plurality of stacks of layers in each of which an insulating layer 2420 and a single-crystalline semiconductor layer 2430 (hereinafter also referred to as an SOI layer) are stacked in this order are provided over a surface of a base substrate 2410 (see FIGS. 24F and 24G). The SOI layer 2430 is provided over the base substrate 2410 with the insulating layer 2420 interposed therebetween and forms a so-called SOI structure. Note that a plurality of SOI layers may be provided over one base substrate 2410 and form one SOI substrate 2400. FIGS. 24F and 24G show examples where two SOI layers 2430 are provided over one base substrate 2410.

The SOI layer 2430 is a single-crystalline semiconductor, and single-crystalline silicon can be typically used. Alternatively, a crystalline semiconductor layer of silicon, germanium, a compound semiconductor such as gallium arsenide or indium phosphide, or the like, which can be separated from a single-crystalline semiconductor substrate or a polycrystalline semiconductor substrate by a hydrogen ion implantation separation method, can be used.

Note that the size of the SOI layer 2430 which forms the SOI substrate may be approximately the same as a desired panel size. A panel size refers to the size of the sum of a display portion of a display panel and a peripheral frame portion (a non-display portion). Moreover, a size refers to an area.

The panel size may be selected as appropriate depending on applications, and for example, a medium or small panel size of a diagonal of less than 10 inches can be employed. When a medium or small panel is employed for a mobile phone, known sizes (screen sizes) of a display portion are diagonal of 2.2 inches (56 mm), 2.4 inches (61 mm), and 2.6 inches (66 mm), for example. When a mobile phone has the above panel size, the panel size may be determined in consideration of the size of a frame portion (the screen frame size) around a display portion in addition to the screen size.

Although a shape of the SOI layer 2430 is not particularly limited, it is preferable to employ a rectangular shape (including a square) because processing becomes easy and the SOI layer 2430 can be attached to the base substrate 2410 with a high integration degree. When the SOI layer 2430 is used for a panel of a display device, such a display, the SOI layer 2430 preferably has an aspect ratio of 4:3. When the SOI layer 2430 has approximately the same size as a desired panel, it is possible to control a yield on a panel-to-panel basis in manufacturing a variety of display devices by incorporating a display panel formed using a completed SOI substrate. Further, damage to elements can be prevented when the panels are cut from each other. Accordingly, a yield can be improved. Moreover, when the SOI layer 2430 has approximately the same size as the desired panel, respective elements of panels can be formed using one SOI layer, and thus variation in characteristics can be suppressed.

A substrate having an insulating surface or an insulating substrate is used for the base substrate 2410. Specifically, a variety of glass substrates used for electronic industries (e.g. aluminosilicate glass, aluminoborosilicate glass, or barium borosilicate glass), a quartz substrate, a ceramic substrate, or a sapphire substrate can be given as an example. It is preferable to use a glass substrate for the base substrate 2410, and for example, a large-sized mother glass substrate called the sixth generation (1500 mm×1850 mm), the seventh generation (1870 mm×2200 mm), or the eighth generation (2200 mm×2400 mm) is used. When a large-sized mother glass is used for the base substrate 2410 and an SOI substrate is formed by applying the invention, increase in area of the SOI substrate can be realized. Further, when each SOI layer has a desired panel size, the number of display panels which can be formed using one base substrate can be increased. Accordingly, productivity of end products (display devices) formed with the display panel incorporated therein can be improved.

The insulating layer 2420 is provided between the base substrate 2410 and the SOI layer 2430. The insulating layer 2420 may have a single-layer structure or a stacked-layer structure. A surface bonded to the base substrate 2410 (hereinafter also referred to as a bonding surface) is smooth and hydrophilic. FIG. 24F shows an example in which a bonding layer 2422 is formed as the insulating layer 2420. A silicon oxide layer is suitable for the bonding layer 2422 which has a smooth surface and can form a hydrophilic surface. In particular, a silicon oxide layer which is formed by a chemical vapor deposition method with the use of organic silane is preferable. As the organic silane, a compound containing silicon such as tetraethoxysilane (TEOS:Si(OC$_2$H$_5$)$_4$), tetramethylsilane (TMS:Si(CH$_3$)$_4$), trimethylsilane ((CH$_3$)$_3$SIH), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), or trisdimethylaminosilane (SiH(N(CH$_3$)$_2$)$_3$) can be used.

The bonding layer 2422 which has a smooth surface and forms a hydrophilic surface preferably has a thickness of 5 to 500 nm. When the bonding layer 2422 has a thickness within the above range, it is possible to smooth roughness of a surface of a film is to be formed and ensure smoothness of a developing surface of the bonding layer 2422. Further, a distortion between the bonding layer 2422 and a substrate bonded thereto (in FIG. 24F, the base substrate 2410) can be relieved. Note that a silicon oxide layer which is similar to the bonding layer 2422 may be provided in the base substrate 2410. In the SOI substrate according to the invention, when the SOI layer 2430 is bonded to the base substrate 2410 which is a substrate having an insulating surface or an insulating substrate, a bonding layer which is preferably formed of a silicon oxide layer using organic silane is provided in one or both of the surfaces on which a bond is formed, and thus, a firm bond can be formed.

FIG. 24G shows an example in which the insulating layer 2420 has a stacked-layer structure, and specifically, an example in which a stacked-layer structure of the bonding layer 2422 and an insulating layer 2424 containing nitrogen is formed as the insulating layer 2420. The insulating layer 2424 containing nitrogen is provided between the SOI layer 2430 and the bonding layer 2422 so that the bonding layer 2422 is formed in a surface bonded to the base substrate 2410. The insulating layer 2424 containing nitrogen is formed to have a single-layer structure or a stacked-layer structure of a silicon nitride layer, a silicon nitride oxide layer, and/or a silicon oxynitride layer. For example, the insulating layer 2424 containing nitrogen can be formed by sequentially stacking a silicon oxynitride layer and a silicon nitride oxide layer from the SOI layer 2430 side. The bonding layer 2422 is provided in order to form a bond with the base substrate 2410. The insulating layer 2424 containing nitrogen is preferably provided in order to prevent impurities such as mobile ions or moisture from diffusing into the SOI layer 2430 and contaminating the SOI layer 2430.

Note that a silicon oxynitride layer refers to a film that contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide layer refers to a film that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

Figure 26A:
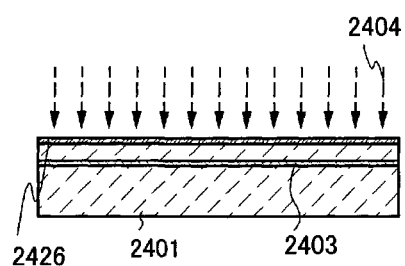
FIGS. 26A to 26E illustrate one mode of a display device of the invention.
Figure 26B:
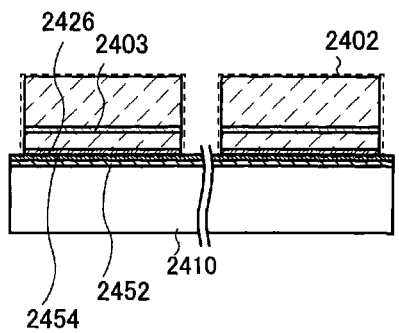
Figure 26C:
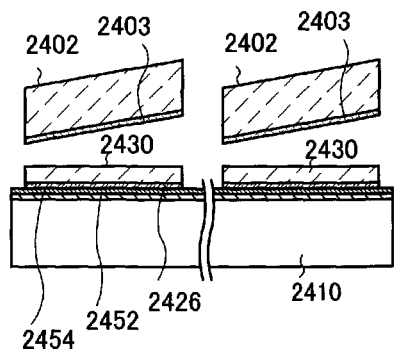
Figure 26D:
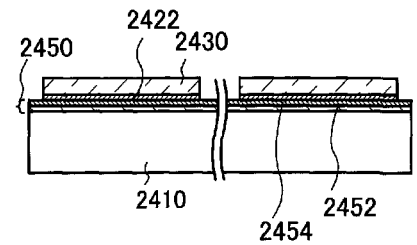
Figure 26E:
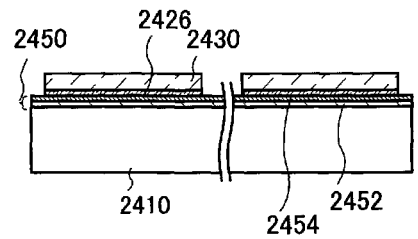

FIGS. 26D and 26E show examples in which an insulating layer 2450 including a bonding layer is formed over the base substrate 2410. The insulating layer 2450 may have a single-layer structure or a stacked-layer structure as long as a surface bonded to the SOI layer 2430 is smooth and hydrophilic. Note that it is preferable to provide a barrier layer between the base substrate 2410 and the bonding layer in order to prevent mobile ions such as alkali metal or alkaline earth metal from diffusing from the glass substrate used as the base substrate 2410.

FIGS. 26D and 26E show examples in which a stacked-layer structure of a barrier layer 2452 and a bonding layer 2454 is formed as the insulating layer 2450. As the bonding layer 2454, a silicon oxide layer which is similar to the bonding layer 2422 may be provided. Further, the SOI layer 2430 may be provided with a bonding layer as appropriate. FIG. 26D shows an example in which the SOI layer 2430 is also provided with the bonding layer 2422. With such a structure, the bonding layers form a bond when the SOI layer 2430 and the base substrate 2410 are bonded; thus, a firmer bond can be formed. The barrier layer 2452 is formed to have a single-layer structure or a stacked-layer structure of a silicon oxide layer, a silicon nitride layer, a silicon oxynitride layer, and/or a silicon nitride oxide layer. Preferably, the barrier layer 2452 is formed using an insulating layer containing nitrogen.

FIG. 26E shows an example in which the base substrate 2410 is provided with a bonding layer, and specifically, an example in which a stacked-layer structure of the barrier layer 2452 and the bonding layer 2454 is provided as the insulating layer 2450 over the base substrate 2410. Further, the SOI layer 2430 is provided with a silicon oxide layer 2426. When the SOI layer 2430 is bonded to the base substrate 2410, the silicon oxide layer 2426 forms a bond with the bonding layer 2454. It is preferable to form the silicon oxide layer 2426 by a thermal oxidation method. Alternatively, chemical oxide may be used for the silicon oxide layer 2426. Chemical oxide can be formed by processing a surface of a semiconductor substrate with water containing ozone, for example. Chemical oxide is preferable because it is formed reflecting planarity of the surface of the semiconductor substrate.

Next, a method of forming an SOI substrate according to the invention is described. First, an example of a method of forming the SOI substrate shown in FIG. 24F is described.

Figure 24A:
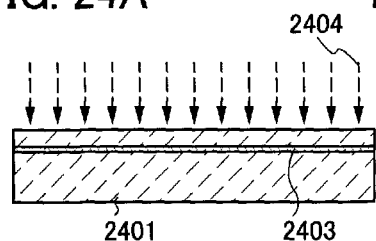
FIGS. 24A to 24G illustrate one mode of a display device of the invention.
Figure 25A:
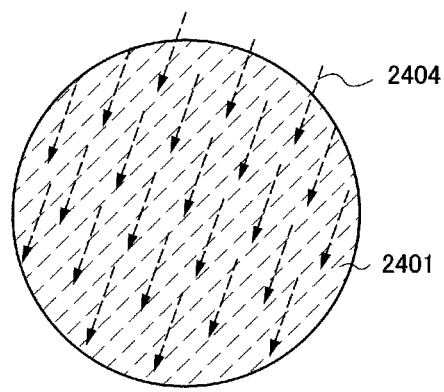
FIGS. 25A to 25C illustrate one mode of a display device of the invention.

First, a semiconductor substrate 2401 is prepared (see FIGS. 24A and 25A). As the semiconductor substrate 2401, a commercial semiconductor substrate such as a silicon substrate, a germanium substrate, or a compound semiconductor (e.g. gallium arsenide or indium phosphide) substrate can be used. Typical sizes of the commercial silicon substrate are 5 inches (125 mm), 6 inches (150 mm), 8 inches (200 mm), and 12 inches (300 mm) in diameter, and most of the commercial silicon substrates are circular. Further, the film thickness can be selected up to approximately 1.5 mm as appropriate.

Next, ions 2404 accelerated by an electric field are implanted at a predetermined depth from a surface of the semiconductor substrate 2401, and an ion-doped layer 2403 is formed (see FIGS. 24A and 25A). The ions 2404 are introduced in consideration of the thickness of an SOI layer which is transferred to a base substrate later. The SOI layer preferably has a thickness of 5 to 500 nm, and more preferably 10 to 200 nm. Acceleration voltage and the dose of the ions in ion introduction are selected as appropriate in consideration of the thickness of the SOI layer to be transferred. As the ions 2404, ions of hydrogen, helium, or halogen such as fluorine can be used. Note that as the ion 2404, it is preferable to use an ion species including an atom or a plurality of the same atoms formed by exciting a source gas selected from hydrogen, helium, and a halogen element with plasma. When a hydrogen ion is introduced, it is preferable that $H^+$, $H_2^+$, and $H_3^+$ ions be contained and the $H_3^+$ ion be contained at a higher percentage because efficiency of ion introduction can be improved and the time of ion introduction can be reduced. Further, such a structure enables easy separation.

In order to form the ion-doped layer 2403 at a predetermined depth, the ions 2404 need to be introduced at a high dose rate in some cases. In this case, the surface of the semiconductor substrate 2401 becomes rough depending on conditions. Therefore, a silicon nitride layer, a silicon nitride oxide layer, or the like with a thickness of 50 to 200 nm may be provided as a protective layer on the surface of the semiconductor substrate, in which the ions are introduced.

Figure 24B:
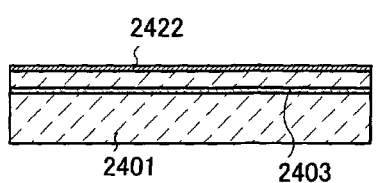
Figure 25B:
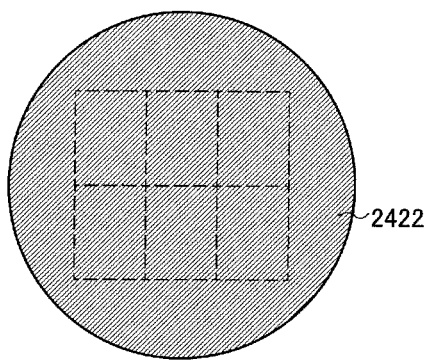

Next, the bonding layer 2422 is formed on the semiconductor substrate 2401 (see FIGS. 24B and 25B). The bonding layer 2422 is formed on the surface of the semiconductor substrate 2401, which forms a bond with the base substrate. As the bonding layer 2422 formed here, a silicon oxide layer formed by a chemical vapor deposition method with the use of organic silane as a source gas as described above is preferably employed. It is also possible to use a silicon oxide layer formed by a chemical vapor deposition method with the use of silane as a source gas. In film formation by a chemical vapor deposition method, temperatures at which degasification from the ion-doped layer 2403 formed in the semiconductor substrate 2401 does not occur are applied. For example, a film formation temperature of 350° C. or lower is applied. Note that a heat treatment temperature higher than the film formation temperature by a chemical vapor deposition method is applied to heat treatment for separating the SOI layer from the semiconductor substrate such as a single crystalline semiconductor substrate or a polycrystalline semiconductor substrate.

Figure 24C:
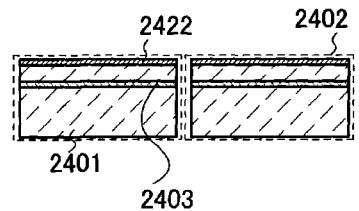
Figure 25C:
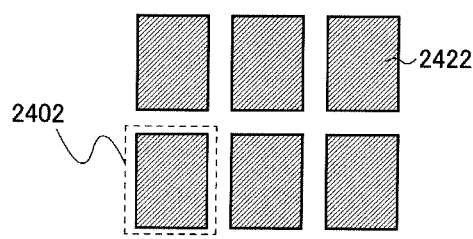

Next, the semiconductor substrate 2401 can be processed into desired size and shape (see FIGS. 24C and 25C). Specifically, the semiconductor substrate 2401 can be processed into a desired panel size. FIG. 25C shows an example in which the circular semiconductor substrate 2401 is divided to form rectangular semiconductor substrates 2402. At this time, the bonding layer 2422 and the ion-doped layer 2403 are also divided. Thus, the ion-doped layer 2403 is formed at a predetermined depth, the bonding layer 2422 formed on the surface (the surface to which the base substrate is bonded), and the semiconductor substrates 2402 which has a desired panel size can be obtained.

The semiconductor substrate 2402 preferably has a panel size of a variety of display devices. The panel size may be selected as appropriate in accordance with an end product into which the panel is incorporated, or the like. For example, the panel size may be a diagonal of less than 10 inches, which is a panel size of a medium or small panel. For example, when the semiconductor substrate 2402 is applied to a mobile phone with a screen size of 2.4 inches in diagonal, the panel size is determined in consideration of a screen frame size in addition to a screen size of 2.4 inches in diagonal. The shape of the semiconductor substrate 2402 may also be determined as appropriate depending on an application such as an end product. When the semiconductor substrate 2402 is applied to a display device such as a display, the semiconductor substrate 2402 preferably has a rectangular shape with an aspect ratio of approximately 3:4. Further, the semiconductor substrate 2402 preferably has a rectangular shape because processing in later manufacturing steps is easy and the semiconductor substrate 2402 can be efficiently obtained from the semiconductor substrate 2401. The semiconductor substrate 2401 can be cut with a cutting device such as a dicer or a wire saw, a laser, plasma, an electronic beam, or any other cutting means.

The order of steps up to formation of the bonding layer on the surface of the semiconductor substrate can be changed as appropriate. This embodiment mode shows an example in which the ion-doped layer is formed in the semiconductor substrate, the bonding layer is provided on the surface of the semiconductor substrate, and then the semiconductor substrate is processed into a desired panel size. Alternatively, the following order of steps may be used: after a semiconductor substrate is processed into a desired panel size, an ion-doped layer can be formed in the semiconductor substrate having the desired panel size, and then, a bonding layer can be formed on the surface of the semiconductor substrate having the desired panel size.

Figure 24D:
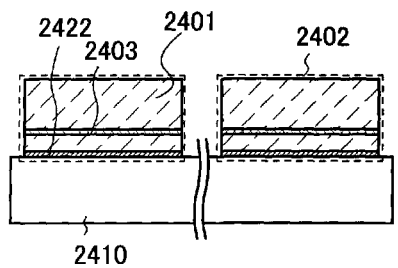

Next, the base substrate 2410 and the semiconductor substrate 2402 are bonded to each other. FIG. 24D shows an example in which the surface of the semiconductor substrate 2402 provided with the bonding layer 2422 is disposed in contact with the base substrate 2410, and the base substrate 2410 and the bonding layer 2422 are bonded to each other, so that the base substrate 2410 and the semiconductor substrate 2402 are bonded to each other. Note that it is preferable that the surface which forms a bond (the bonding surface) be cleaned sufficiently. The bond is formed by the contact between the base substrate 2410 and the bonding layer 2422. Van der Waals force acts on this bond, and the base substrate 2410 and the semiconductor substrate 2402 are bonded to each other by being pressed; thus, the firm bond due to hydrogen bonding can be formed.

The bonding surface may be activated in order to form a favorable bond between the base substrate 2410 and the bonding layer 2422. For example, at least one of the surfaces on which the bond is formed is irradiated with an atomic beam or an ion beam. When an atomic beam or an ion beam is utilized, an inert gas (e.g. argon) neutral atom beam or an inert gas ion beam can be used. It is also possible to activate the bonding surface by plasma irradiation or radical treatment. Such surface treatment facilitates formation of a bond between different materials even at a temperature of 400° C. or lower.

In addition, after the semiconductor substrate 2402 and the base substrate 2410 are bonded with the bonding layer 2422 interposed therebetween, it is preferable to perform heat treatment or pressure treatment. The heat treatment or the pressure treatment can improve a bonding strength. A process temperature of the heat treatment is preferably lower than or equal to the heat-resistant temperature of the base substrate 2410. The pressure treatment is performed so that pressure is applied in a direction perpendicular to the bonding surface in consideration of pressure resistance of the base substrate 2410 and the semiconductor substrate 2402.

Figure 24E:
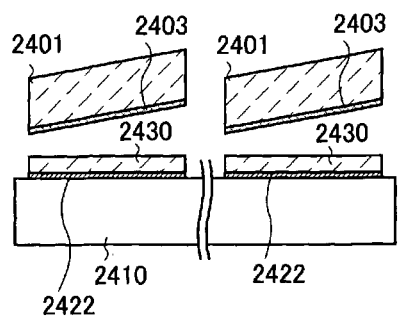
Figure 24F:
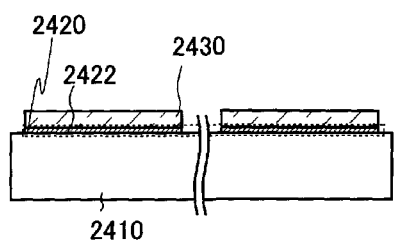
Figure 24G:
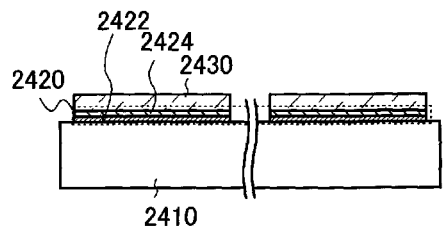

Next, heat treatment is performed, and part of the semiconductor substrate 2402 is separated from the base substrate 2410 with the ion-doped layer 2403 used as a cleavage plane (see FIG. 24E). A process temperature of the heat treatment is preferably higher than or equal to the film formation temperature of the bonding layer 2422 and lower than or equal to the heat-resistant temperature of the base substrate 2410. For example, when heat treatment is performed at a temperature of 400 to 600° C., the volume of a minute cavity formed in the ion-doped layer 2403 is changed, and thus cleavage along the ion-doped layer 2403 is possible. Since the bonding layer 2422 is bonded to the base substrate 2410, the SOI layer 2430 which has the same crystallinity as the semiconductor substrate 2402 is left over the base substrate 2410.

Figure 27A:
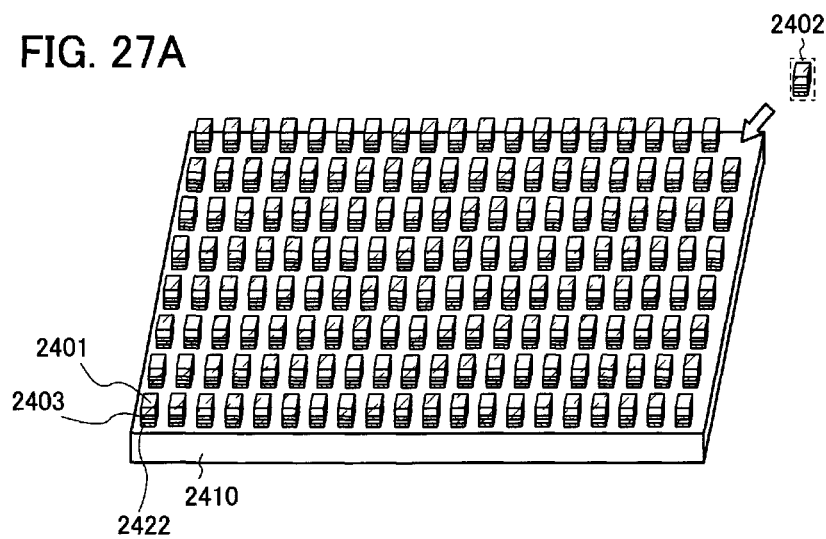
FIGS. 27A and 27B illustrate one mode of a display device of the invention.
Figure 27B:
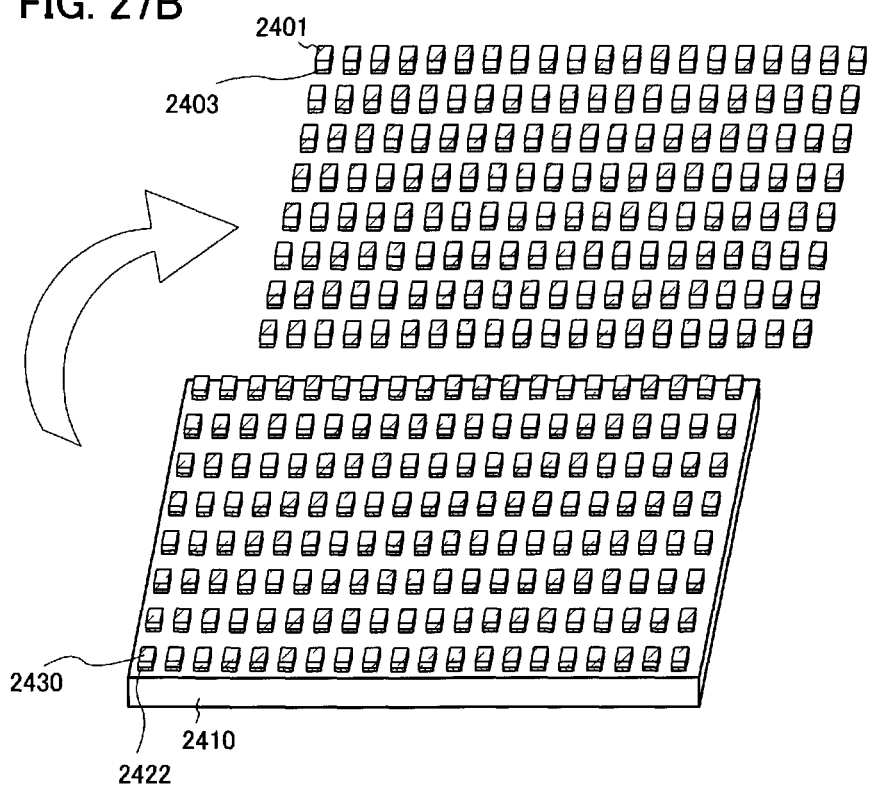

As described above, the SOI structure in which the SOI layer 2430 is provided over the base substrate 2410 with the bonding layer 2422 interposed therebetween is formed. Note that the SOI substrate can have a structure in which a plurality of SOI layers are provided over one base substrate with a bonding layer interposed therebetween. For example, an ion-doped layer is formed, a bonding layer is formed on a surface, and the desired number of semiconductor substrates 2402 formed by being processed into sections each having a desired panel size are prepared. Then, after the desired number of semiconductor substrates 2402 is bonded to the base substrate 2410 as shown in FIG. 27A, separation is performed at one time by heat treatment as shown in FIG. 27B; thus, an SOI substrate can be formed. Note that instead of performing separation at one time by heat treatment, it is also possible to repeat the steps of bonding and separation of one or some semiconductor substrates 2402 to form an SOI substrate.

It is preferable to regularly arrange the semiconductor substrates 2402 over the base substrate 2410 because such arrangement makes later steps easy. For example, by using a control system such as a CCD camera or a computer, the semiconductor substrates 2402 can be systematically arranged and bonded. Alternatively, a marker or the like may be formed over the base substrate 2410 or the semiconductor substrates 2402 to adjust the positions. Although FIGS. 27A and 27B show a structure in which adjacent SOI layers have some space therebetween, the SOI layers may be arranged with as little space as possible.

Note that chemical mechanical polishing (CMP) may be performed on the SOI layers obtained by separation in order to planarize the surfaces. Alternatively, planarization may be performed by irradiating the surfaces of the SOI layers with a laser beam instead of using a physical polishing method such as CMP. Laser beam irradiation is preferably performed in a nitrogen atmosphere containing oxygen at a concentration of 10 ppm or less. This is because the surfaces of the SOI layers might be rough when laser beam irradiation is performed in an oxygen atmosphere. Further, CMP or the like may be performed to thin the obtained SOI layers.

Next, steps of providing a bonding layer on the base substrate side and forming an SOI layer as shown in FIG. 26D are described.

FIG. 26A shows a step of introducing the ions 2404 accelerated by an electric field in the semiconductor substrate 2401 including the silicon oxide layer 2426 at a predetermined depth to form the ion-doped layer 2403. The silicon oxide layer 2426 can be formed by a CVD method or a sputtering method, preferably by a thermal oxidation method. As the silicon oxide layer 2426, it is also possible to use chemical oxide formed by processing the surface of the semiconductor substrate with water containing ozone, for example. The semiconductor substrate 2401 can be similar to that in FIG. 24A. Further, introduction of ions of hydrogen, helium, or halogen such as fluorine is performed in a similar manner to that shown in FIG. 24A. When the silicon oxide layer 2426 is formed on the surface of the semiconductor substrate 2401, loss of planarity due to damage to the surface of the semiconductor substrate in the ion introduction can be prevented.

FIG. 26B shows a step of disposing the surface of the semiconductor substrate 2402 provided with the silicon oxide layer 2426, in contact with the base substrate 2410 provided with the barrier layer 2452 and the bonding layer 2454, thereby forming a bond. The bond is formed by disposing the silicon oxide layer 2426 over the semiconductor substrate 2402 in contact with the bonding layer 2454 over the base substrate 2410. The semiconductor substrate 2402 is obtained by processing the semiconductor substrate 2401, in which the separation layer 2403 is formed and the silicon oxide layer 2426 is formed on the surface, into sections each having a desired panel size. The barrier layer 2452 may be formed using a silicon oxide layer, a silicon nitride layer, a silicon oxynitride layer, and/or a silicon nitride oxide layer to have a single-layer structure or a stacked-layer structure by a CVD method or a sputtering method. As the bonding layer 2454, a silicon oxide layer which is similar to the bonding layer 2422 may be formed.

Then, as shown in FIG. 26C, part of the semiconductor substrate 2402 is separated. Heat treatment for the separation is performed in a similar manner to that shown in FIG. 24E, and the part of the semiconductor substrate 2402 is separated from the base substrate 2410 with the ion-doped layer 2403 used as a cleavage plane. After the separation, the SOI layer 2430 having the same crystallinity as the semiconductor substrate 2402 is left over the base substrate 2410; thus, the SOI substrate can be obtained. The SOI substrate can have a structure in which the SOI layer 2430 is provided over the base substrate 2410 with the barrier layer 2452, the bonding layer 2454, and the silicon oxide layer 2426 interposed therebetween. Note that after the separation, CMP, laser beam irradiation, or the like may be performed to planarize or thin the obtained SOI layer.

With the manufacturing method of the SOI substrate described in this embodiment mode, the SOI layer 2430 having a bonding portion with a high bond strength can be obtained even when the base substrate 2410 has a heat-resistant temperature of 600° C. or lower. Further, a variety of glass substrates used for electronic industry which are called an alkali-free glass substrate, such as a substrate made of aluminosilicate glass, aluminoborosilicate glass, or barium borosilicate glass can be used as the base substrate 2410 because a process temperature of 600° C. or lower can be applied. It is needless to say that a ceramic substrate, a sapphire substrate, a quartz substrate, or the like can also be used. That is, a single crystalline semiconductor layer can be formed over a substrate with a side more than 1 meter long. With the use of such a large-sized substrate, a display device such as a liquid crystal display device or a semiconductor integrated circuit can be manufactured.

The SOI substrate described in this embodiment mode has a structure in which panel-sized SOI layers are provided over a base substrate. Such a structure enables formation of desired display panels using one SOI layer and can achieve improvement in yield. Further, desired display panels can be formed using one SOI layer, and thus variations in elements which form the display panels can be suppressed.

In addition, in the SOI substrate described in this embodiment mode, the yield can be controlled on a panel-to-panel basis even if a defect occurs in a crystal of the SOI layer in transferring the SOI layer to the base substrate. Moreover, even if different kinds of materials are bonded to each other, stress can be relieved because the SOI layers each having a panel size are transferred to the base substrate; thus, improvement in yield can be realized.

In addition, the SOI substrate described in this embodiment mode can have a large area by providing a plurality of SOI layers over a base substrate. Accordingly, a large number of display panels can be manufactured by one series of manufacturing steps, and thus productivity of end products manufactured by incorporating the display panel can be improved.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 6

In this embodiment mode, a structure and a manufacturing method of a transistor are described.

Figure 28A:
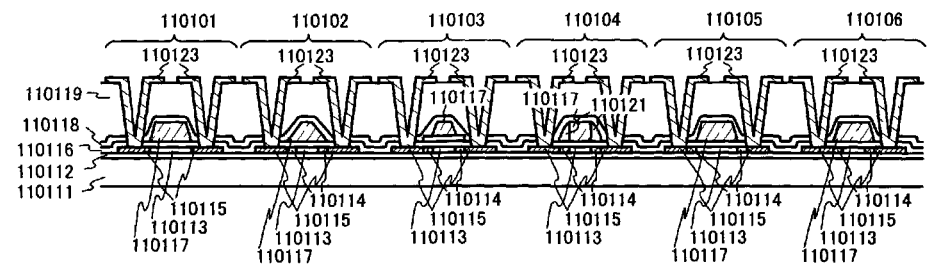
FIGS. 28A to 28G are cross-sectional views of a display device according to the invention.

FIGS. 28A to 28G show examples of structures and manufacturing methods of transistors. FIG. 28A shows structure examples of transistors. FIGS. 28B to 28G show examples of manufacturing methods of the transistors.

Note that the structure and the manufacturing method of the transistors are not limited to those shown in FIGS. 28A to 28G, and various structures and manufacturing methods can be employed.

First, structure examples of transistors are described with reference to FIG. 28A. FIG. 28A is a cross-sectional view of a plurality of transistors each having a different structure. Here, in FIG. 28A, the plurality of transistors each having a different structure are juxtaposed, which is for describing structures of the transistors. Accordingly, the transistors are not needed to be actually juxtaposed as shown in FIG. 28A and can be separately formed as needed.

Next, characteristics of each layer forming the transistor are described.

A substrate 110111 can be a glass substrate using barium borosilicate glass, aluminoborosilicate glass, or the like, a quartz substrate, a ceramic substrate, a metal substrate containing stainless steel, or the like. Further, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a semiconductor device capable of being bent can be formed. A flexible substrate has no strict limitations on the area or the shape of the substrate. Accordingly, for example, when a substrate having a rectangular shape, each side of which is 1 meter or more, is used as the substrate 110111, productivity can be significantly improved. Such an advantage is highly favorable as compared with the case where a circular silicon substrate is used.

An insulating film 110112 functions as a base film and is provided to prevent alkali metal such as Na or alkaline earth metal from the substrate 110111 from adversely affecting characteristics of a semiconductor element. The insulating film 110112 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y). For example, when the insulating film 110112 is provided to have a two-layer structure, it is preferable that a silicon nitride oxide film be used as a first insulating film and a silicon oxynitride film be used as a second insulating film. As another example, when the insulating film 110112 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 110113, 110114, and 110115 can be formed using an amorphous semiconductor or a semi-amorphous semiconductor (SAS). Alternatively, a polycrystalline semiconductor layer may be used. SAS is a semiconductor having an intermediate structure between amorphous and crystalline (including single crystal and polycrystalline) structures and having a third state which is stable in free energy. Moreover, SAS includes a crystalline region with a short-range order and lattice distortion. A crystalline region of 0.5 to 20 nm can be observed at least in part of a film. When silicon is contained as a main component, Raman spectrum shifts to a wave number side lower than 520 $cm^{-1}$. The diffraction peaks of (111) and (220) which are thought to be contributed to a silicon crystalline lattice are observed by X-ray diffraction. SAS contains hydrogen or halogen of at least 1 atomic percent or more to compensate dangling bonds. SAS is formed by glow discharge decomposition (plasma CVD) of a material gas. As the material gas, $Si_2H_6$, $SiH_2Cl_2$, $SiHCl_3$, $SiCl_4$, $SiF_4$, or the like as well as $SiH_4$ can be used. Alternatively, $GeF_4$ may be mixed. The material gas may be diluted with $H_2$, or $H_2$ and one or more kinds of rare gas elements selected from He, Ar, Kr, and Ne. A dilution ratio is in the range of 2 to 1000 times. Pressure is in the range of approximately 0.1 to 133 Pa, and a power supply frequency is 1 to 120 MHz, preferably 13 to 60 MHz. A substrate heating temperature may be 300° C. or lower. A concentration of impurities in atmospheric components such as oxygen, nitrogen, and carbon is preferably $1 \times 10^{20}$ $cm^{-1}$ or less as impurity elements in the film. In particular, an oxygen concentration is $5 \times 10^{19}$/$cm^3$ or less, preferably $1 \times 10^{19}$/$cm^3$ or less. Here, an amorphous semiconductor layer is formed using a material containing silicon (Si) as its main component (e.g., $Si_xGe_{1-x}$) by a known method (such as a sputtering method, an LPCVD method, or a plasma CVD method). Then, the amorphous semiconductor layer is crystallized by a known crystallization method such as a laser crystallization method, a thermal crystallization method using RTA or an annealing furnace, or a thermal crystallization method using a metal element which promotes crystallization.

An insulating film 110116 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y).

A gate electrode 110117 can have a single-layer structure of a conductive film or a stacked-layer structure of two or three conductive films. As a material for the gate electrode 110117, a known conductive film can be used. For example, a single film of an element such as tantalum (Ta), titanium (Ti), molybdenum (Mo), tungsten (W), chromium (Cr), or silicon (Si); a nitride film containing the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film containing the aforementioned element (typically, a tungsten silicide film or a titanium silicide film); and the like can be used. Note that the aforementioned single film, nitride film, alloy film, silicide film, and the like can have a single-layer structure or a stacked-layer structure.

An insulating film 110118 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); or a film containing carbon, such as a DLC (diamond-like carbon), by a known method (such as a sputtering method or a plasma CVD method).

An insulating film 110119 can have a single-layer structure or a stacked-layer structure of a siloxane resin; an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon, such as a DLC (diamond-like carbon); or an organic material such as epoxy, polyimide, polyamide, polyvinyl phenol, benzocyclobutene, or acrylic. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Note that the insulating film 110119 can be directly provided so as to cover the gate electrode 110117 without provision of the insulating film 110118.

As a conductive film 110123, a single film of an element such as Al, Ni, C, W, Mo, Ti, Pt, Cu, Ta, Au, or Mn, a nitride film containing the aforementioned element, an alloy film in which the aforementioned elements are combined, a silicide film containing the aforementioned element, or the like can be used. For example, as an alloy containing a plurality of the aforementioned elements, an Al alloy containing C and Ti, an Al alloy containing Ni, an Al alloy containing C and Ni, an Al alloy containing C and Mn, or the like can be used. For example, when the conductive film has a stacked-layer structure, Al can be interposed between Mo, Ti, or the like; thus, resistance of Al to heat and chemical reaction can be improved.

Next, with reference to the cross-sectional view of the plurality of transistors each having a different structure shown in FIG. 28A, characteristics of each structure are described.

A transistor 110101 is a single drain transistor. Since the single drain transistor can be formed by a simple method, it is advantageous in low manufacturing cost and high yield. Here, the semiconductor layers 110113 and 110115 have different concentrations of impurities. The semiconductor layer 110113 is used as a channel formation region. The semiconductor layers 110115 are used as a source region and a drain region. By controlling the concentration of impurities in this manner, the resistivity of the semiconductor layer can be controlled. Moreover, an electrical connection state of the semiconductor layer and the conductive film 110123 can be closer to ohmic contact. Note that as a method of separately forming the semiconductor layers each having different amount of impurities, a method can be used in which impurities are doped in a semiconductor layer using the gate electrode 110117 as a mask.

A transistor 110102 is a transistor in which the gate electrode 110117 is tapered at an angle of at least certain degrees. Since the transistor can be formed by a simple method, it is advantageous in low manufacturing cost and high yield. Here, the semiconductor layers 110113, 110114, and 110115 have different concentrations of impurities. The semiconductor layer 110113 is used as a channel region, the semiconductor layers 110114 as lightly doped drain (LDD) regions, and the semiconductor layers 110115 as a source region and a drain region. By controlling the amount of impurities in this manner, the resistivity of the semiconductor layer can be controlled. Moreover, an electrical connection state of the semiconductor layer and the conductive film 110123 can be closer to ohmic contact. Since the transistor includes the LDD regions, a high electric field is hardly applied inside the transistor, so that deterioration of the element due to hot carriers can be suppressed. Note that as a method of separately forming the semiconductor layers having different amount of impurities, a method can be used in which impurities are doped in a semiconductor layer using the gate electrode 110117 as a mask. In the transistor 110102, since the gate electrode 110117 is tapered at an angle of at least certain degrees, gradient of the concentration of impurities doped in the semiconductor layer through the gate electrode 110117 can be provided, and the LDD region can be easily formed.

A transistor 110103 is a transistor in which the gate electrode 110117 is formed of at least two layers and a lower gate electrode is longer than an upper gate electrode. In this specification, a shape of the lower and upper gate electrodes is called a hat shape. When the gate electrode 110117 has a hat shape, an LDD region can be formed without addition of a photomask. Note that a structure where the LDD region overlaps with the gate electrode 110117, like the transistor 110103, is particularly called a GOLD (gate overlapped LDD) structure. As a method of forming the gate electrode 110117 with a hat shape, the following method may be used.

First, when the gate electrode 110117 is patterned, the lower and upper gate electrodes are etched by dry etching so that side surfaces thereof are inclined (tapered). Then, the inclination of the upper gate electrode is processed to be almost perpendicular by anisotropic etching. Thus, the gate electrode a cross section of which is a hat shape is formed. After that, impurity elements are doped twice, so that the semiconductor layer 110113 used as the channel region, the semiconductor layers 110114 used as the LDD regions, and the semiconductor layers 110115 used as a source electrode and a drain electrode are formed.

Note that part of the LDD region, which overlaps with the gate electrode 110117, is referred to as an Lov region, and part of the LDD region, which does not overlap with the gate electrode 110117, is referred to as an Loff region. Here, the Loff region is highly effective in suppressing an off-current value, whereas it is not very effective in preventing deterioration in an on-current value due to hot carriers by relieving an electric field in the vicinity of the drain. On the other hand, the Lov region is effective in preventing deterioration in the on-current value by relieving the electric field in the vicinity of the drain, whereas it is not very effective in suppressing the off-current value. Thus, it is preferable to form a transistor having a structure appropriate for characteristics of each of a variety of circuits. For example, when the semiconductor device is used as a display device, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 110104 is a transistor including a sidewall 110121 in contact with the side surface of the gate electrode 110117. When the transistor includes the sidewall 110121, a region overlapping with the sidewall 110121 can be made to be an LDD region.

A transistor 110105 is a transistor in which an LDD (Loff) region is formed by performing doping of the semiconductor layer with the use of a mask. Thus, the LDD region can surely be formed, and an off-current value of the transistor can be reduced.

A transistor 110106 is a transistor in which an LDD (Lov) region is formed by performing doping of the semiconductor layer with the use of a mask. Thus, the LDD region can surely be formed, and deterioration in an on-current value can be prevented by relieving the electric field in the vicinity of the drain of the transistor.

Next, an example of a method for manufacturing the transistor is described with reference to FIGS. 28B to 28G.

Note that a structure and a manufacturing method of the transistor are not limited to those in FIGS. 28A to 28G, and a variety of structures and manufacturing methods can be used.

In this embodiment mode, a surface of the substrate 110111, a surface of the insulating film 110112, a surface of the semiconductor layer 110113, a surface of the semiconductor layer 110114, a surface of the semiconductor layer 110115, a surface of the insulating film 110116, a surface of the insulating film 110118, or a surface of the insulating film 110119 is oxidized or nitrided using plasma treatment, so that the semiconductor layer or the insulating film can be oxidized or nitrided. By oxidizing or nitriding the semiconductor layer or the insulating film by plasma treatment in such a manner, the surface of the semiconductor layer or the insulating film is modified, and the insulating film can be formed to be denser than an insulating film formed by a CVD method or a sputtering method. Thus, a defect such as a pinhole can be suppressed, and characteristics and the like of the semiconductor device can be improved.

First, the surface of the substrate 110111 is washed using hydrofluoric acid (HF), alkaline, or pure water. The substrate 110111 can be a glass substrate using barium borosilicate glass, aluminoborosilicate glass, or the like, a quartz substrate, a ceramic substrate, a metal substrate containing stainless steel, or the like. Further, a substrate formed of plastics typified by polyethylene terephthalate (PET), polyethylene naphthalate (PEN), or polyethersulfone (PES), or a substrate formed of a flexible synthetic resin such as acrylic can also be used. Here, the case where a glass substrate is used as the substrate 110111 is shown.

Figure 28B:
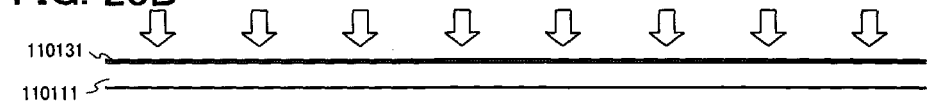

Here, an oxide film or a nitride film may be formed on the surface of the substrate 110111 by oxidizing or nitriding the surface of the substrate 110111 by plasma treatment (FIG. 28B). Hereinafter, an insulating film such as an oxide film or a nitride film formed by performing plasma treatment on the surface is also referred to as a plasma-treated insulating film. In FIG. 28B, an insulating film 110131 is a plasma-treated insulating film. In general, when a semiconductor element such as a thin film transistor is provided over a substrate formed of glass, plastic, or the like, an impurity element such as alkali metal (e.g., Na) or alkaline earth metal included in glass, plastic, or the like might be mixed into the semiconductor element so that the semiconductor element is contaminated; thus, characteristics of the semiconductor element may be adversely affected in some cases. Nitridation of a surface of the substrate formed of glass, plastic, or the like can prevent an impurity element such as alkali metal (e.g., Na) or alkaline earth metal included in the substrate from being mixed into the semiconductor element.

When the surface is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the surface is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar can be used, for example. Alternatively, a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

It is preferable to perform plasma treatment in the atmosphere containing the aforementioned gas, under conditions of an electron density in the range of $1\times10^{11}$ to $1\times10^{13}$ cm$^{-3}$ and a plasma electron temperature in the range of 0.5 to 1.5 eV. Since the plasma electron density is high and the electron temperature in the vicinity of an object to be treated is low, damage by plasma to the object to be treated can be prevented. Since the plasma electron density is as high as $1\times10^{11}$ cm$^{-3}$ or more, an oxide film or a nitride film formed by oxidizing or nitriding the object to be treated by plasma treatment is superior in its uniformity of thickness and the like as well as being dense, as compared with a film formed by a CVD method, a sputtering method, or the like. Alternatively, since the plasma electron temperature is as low as 1 eV or less, oxidation or nitridation can be performed at a lower temperature as compared with that of a conventional plasma treatment or thermal oxidation. For example, oxidation or nitridation can be performed sufficiently even when plasma treatment is performed at a temperature lower than the strain point of a glass substrate by 100 degrees or more. Note that as frequency for generating plasma, high frequency waves such as microwaves (2.45 GHz) can be used. Note that hereinafter, plasma treatment is performed using the aforementioned conditions unless otherwise specified.

Note that although FIG. 28B shows the case where the plasma-treated insulating film is formed by plasma treatment on the surface of the substrate 110111, this embodiment mode includes the case where a plasma-treated insulating film is not formed on the surface of the substrate 110111.

Note that although a plasma-treated insulating film formed by plasma treatment on the surface of the object to be treated is not shown in FIGS. 28C to 28G; this embodiment mode includes the case where a plasma-treated insulating film formed by plasma treatment exists on the surface of the substrate 110111, the insulating film 110112, the semiconductor layer 110113, the semiconductor layer 110114, the semiconductor layer 110115, the insulating film 110116, the insulating film 110118, or the insulating film 110119.

Figure 28C:
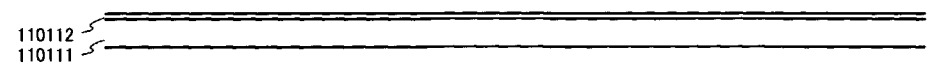

Next, the insulating film 110112 is formed over the substrate 110111 by a known method (such as a sputtering method, an LPCVD method, or a plasma CVD method) (FIG. 28C). For the insulating film 110112, silicon oxide ($SiO_x$) or silicon oxynitride ($SiO_xN_y$) (x>y) can be used.

Here, a plasma-treated insulating film may be formed on the surface of the insulating film 110112 by oxidizing or nitriding the surface of the insulating film 110112 by plasma treatment. By oxidizing the surface of the insulating film 110112, the surface of the insulating film 110112 is modified, and a dense film with fewer defects such as a pinhole can be obtained. Further, by oxidizing the surface of the insulating film 110112, the plasma-treated insulating film containing a little amount of N atoms can be formed; thus, interface characteristics of the plasma-treated insulating film and a semiconductor layer are improved when the semiconductor layer is provided over the plasma-treated insulating film. The plasma-treated insulating film contains a rare gas (containing at least one of He, Ne, Ar, Kr, and Xe) used for the plasma treatment. Note that the plasma treatment can be performed in a similar manner under the aforementioned conditions.

Figure 28D:
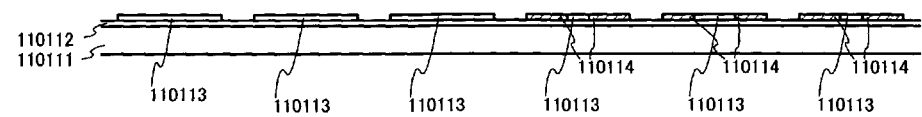

Next, the island-shaped semiconductor layers 110113 and 110114 are formed over the insulating film 110112 (FIG. 28D). The island-shaped semiconductor layers 110113 and 110114 can be formed in such a manner that an amorphous semiconductor layer is formed over the insulating film 110112 by using a material containing silicon (Si) as its main component (e.g., $Si_xGe_{1-x}$) or the like by a known method (such as a sputtering method, an LPCVD method, or a plasma CVD method), the amorphous semiconductor layer is crystallized, and the semiconductor layer is selectively etched. Note that crystallization of the amorphous semiconductor layer can be performed by a known crystallization method such as a laser crystallization method, a thermal crystallization method using RTA or an annealing furnace, a thermal crystallization method using a metal element which promotes crystallization, or a method in which these methods are combined. Here, end portions of the island-shaped semiconductor layers are provided with an angle of about 90° (θ=85 to 1000). Alternatively, the semiconductor layer 110114 to be a low concentration drain region may be formed by doping impurities with the use of a mask.

Here, a plasma-treated insulating film may be formed on the surfaces of the semiconductor layers 110113 and 110114 by oxidizing or nitriding the surfaces of the semiconductor layers 110113 and 110114 by plasma treatment. For example, when Si is used for the semiconductor layers 110113 and 110114, silicon oxide ($SiO_x$) or silicon nitride ($SiN_x$) is formed as the plasma-treated insulating film. Alternatively, after being oxidized by plasma treatment, the semiconductor layers 110113 and 110114 may be nitrided by performing plasma treatment again. In this case, silicon oxide ($SiO_x$) is formed in contact with the semiconductor layers 110113 and 110114, and silicon nitride oxide ($SiN_xO_y$) (x>y) is formed on the surface of the silicon oxide. Note that when the semiconductor layer is oxidized by plasma treatment, the plasma treatment is performed in an oxygen atmosphere (e.g., in an atmosphere of oxygen ($O_2$) and a rare gas (containing at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor layer is nitrided by plasma treatment, the plasma treatment is performed in a nitrogen atmosphere (e.g., in an atmosphere of nitrogen ($N_2$) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar can be used, for example. Alternatively, a gas in which Ar and Kr are mixed may be used. Accordingly, the plasma-treated insulating film contains a rare gas (containing at least one of He, Ne, Ar, Kr, and Xe) used for the plasma treatment. For example, the plasma-treated insulating film contains Ar when Ar is used.

Figure 28E:
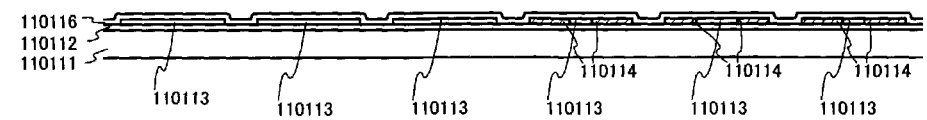

Next, the insulating film 110116 is formed (FIG. 28E). The insulating film 110116 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y), by a known method (such as a sputtering method, an LPCVD method, or a plasma CVD method). Note that when the plasma-treated insulating film is formed on the surfaces of the semiconductor layers 110113 and

110114 by performing plasma treatment on the surfaces of the semiconductor layers 110113 and 110114, the plasma-treated insulating film can be used as the insulating film 110116.

Here, the surface of the insulating film 110116 may be oxidized or nitrided by plasma treatment, so that a plasma-treated insulating film is formed on the surface of the insulating film 110116. Note that the plasma-treated insulating film contains a rare gas (containing at least one of He, Ne, Ar, Kr, and Xe) used for the plasma treatment. The plasma treatment can be performed in a similar manner under the aforementioned conditions.

Alternatively, after the insulating film 110116 is oxidized by performing plasma treatment once in an oxygen atmosphere, the insulating film 110116 may be nitrided by performing plasma treatment again in a nitrogen atmosphere. By oxidizing or nitriding the surface of the insulating film 110116 by plasma treatment in such a manner, the surface of the insulating film 110116 is modified, and a dense film can be formed. An insulating film obtained by plasma treatment is denser and has fewer defects such as a pinhole, as compared with an insulating film formed by a CVD method, a sputtering method, or the like. Thus, characteristics of a thin film transistor can be improved.

Figure 28F:
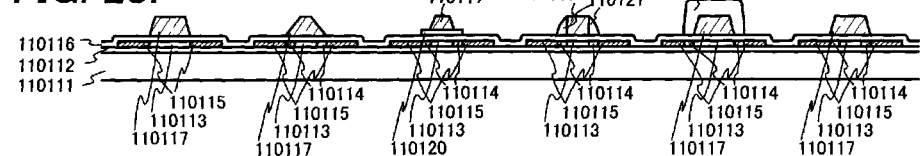

Next, the gate electrode 110117 is formed (FIG. 28F). The gate electrode 110117 can be formed by a known method (such as a sputtering method, an LPCVD method, or a plasma CVD method).

In the transistor 110101, the semiconductor layers 110115 used as the source region and the drain region can be formed by doping impurities after the gate electrode 110117 is formed.

In the transistor 110102, the semiconductor layers 110114 used as the LDD regions and the semiconductor layers 110115 used as the source region and the drain region can be formed by doping impurities after the gate electrode 110117 is formed.

In the transistor 110103, the semiconductor layers 110114 used as the LDD regions and the semiconductor layers 110115 used as the source region and the drain region can be formed by doping impurities after the gate electrode 110117 is formed.

In the transistor 110104, the semiconductor layers 110114 used as the LDD regions and the semiconductor layers 110115 used as the source region and the drain region can be formed by doping impurities after the sidewall 110121 is formed on the side surface of the gate electrode 110117.

Note that silicon oxide ($SiO_x$) or silicon nitride ($SiN_x$) can be used for the sidewall 110121. As a method of forming the sidewall 110121 on the side surface of the gate electrode 110117, a method can be used, for example, in which a silicon oxide ($SiO_x$) film or a silicon nitride ($SiN_x$) film is formed by a known method after the gate electrode 110117 is formed, and then, the silicon oxide ($SiO_x$) film or the silicon nitride ($SiN_x$) film is etched by anisotropic etching. Thus, the silicon oxide ($SiO_x$) film or the silicon nitride ($SiN_x$) film remains only on the side surface of the gate electrode 110117, so that the sidewall 110121 can be formed on the side surface of the gate electrode 110117.

In the transistor 110105, the semiconductor layers 110114 used as the LDD (Loff) regions and the semiconductor layer 110115 used as the source region and the drain region can be formed by doping impurities after a mask 110122 is formed to cover the gate electrode 110117.

In the transistor 110106, the semiconductor layers 110114 used as the LDD (Lov) regions and the semiconductor layers 110115 used as the source region and the drain region can be formed by doping impurities after the gate electrode 110117 is formed.

Figure 28G:
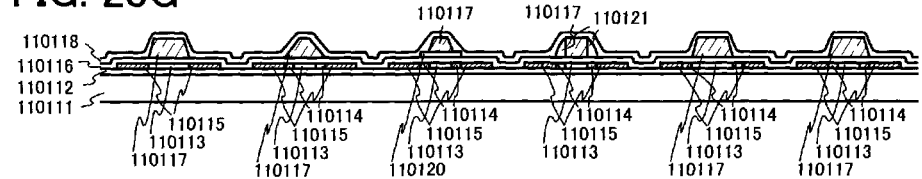

Next, the insulating film 110118 is formed (FIG. 28G). The insulating film 110118 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); or a film containing carbon, such as a DLC (diamond-like carbon), by a known method (such as a sputtering method or a plasma CVD method).

Here, the surface of the insulating film 110118 may be oxidized or nitrided by plasma treatment, so that a plasma-treated insulating film is formed on the surface of the insulating film 110118. Note that the plasma-treated insulating film contains a rare gas (containing at least one of He, Ne, Ar, Kr, and Xe) used for the plasma treatment. The plasma treatment can be performed in a similar manner under the aforementioned conditions.

Next, the insulating film 110119 is formed. The insulating film 110119 can have a single-layer structure or a stacked-layer structure of an organic material such as epoxy, polyimide, polyamide, polyvinyl phenol, benzocyclobutene, or acrylic; or a siloxane resin, in addition to an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); or a film containing carbon, such as a DLC (diamond-like carbon), by a known method (such as a sputtering method or a plasma CVD method). Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Note that the plasma-treated insulating film contains a rare gas (containing at least one of He, Ne, Ar, Kr, and Xe) used for the plasma treatment. For example, the plasma-treated insulating film contains Ar when Ar is used.

When an organic material such as polyimide, polyamide, polyvinyl phenol, benzocyclobutene, or acrylic, a siloxane resin, or the like is used for the insulating film 110119, the surface of the insulating film 110119 can be modified by oxidizing or nitriding the surface of the insulating film by plasma treatment. Modification of the surface improves strength of the insulating film 110119, and physical damage such as a crack generated when an opening is formed, for example, or film reduction in etching can be reduced. When the conductive film 110123 is formed over the insulating film 110119, modification of the surface of the insulating film 110119 improves adhesion to the conductive film. For example, when a siloxane resin is used for the insulating film 110119 and nitrided by plasma treatment, a plasma-treated insulating film containing nitrogen or a rare gas is formed by nitriding a surface of the siloxane resin, and physical strength is improved.

Next, a contact hole is formed in the insulating films 110119, 110118, and 110116 in order to form the conductive film 110123 which is electrically connected to the semiconductor layer 110115. Note that the contact hole may have a tapered shape. Thus, coverage with the conductive film 110123 can be improved.

Figure 32:
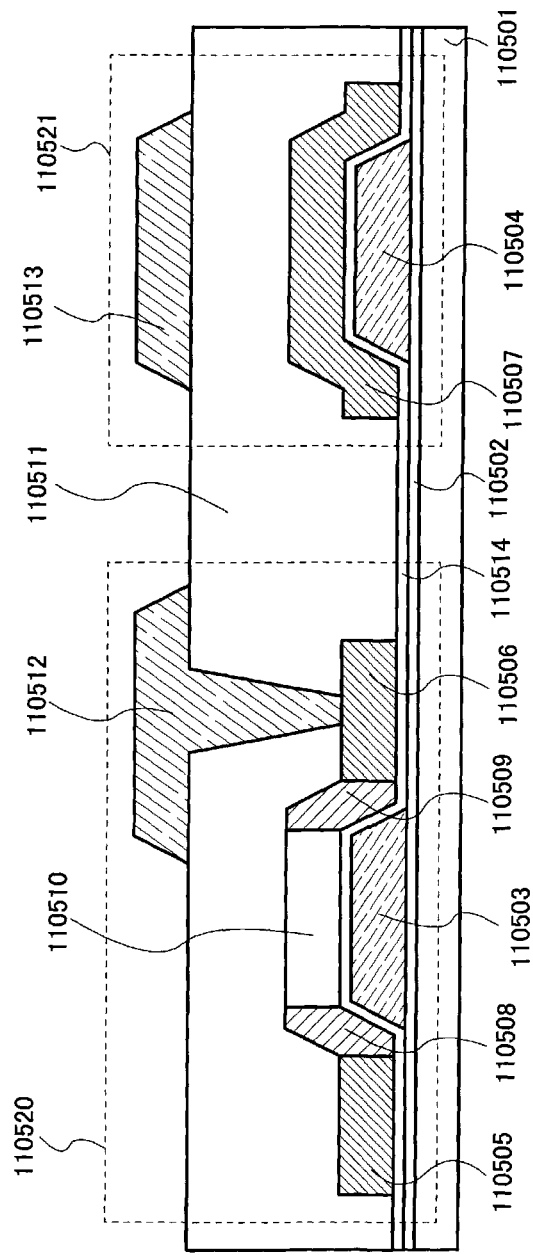
FIG. 32 is a cross-sectional view of a display device according to the invention.

FIG. 32 shows cross-sectional structures of a bottom-gate transistor and a capacitor.

A first insulating film (an insulating film 110502) is formed over an entire surface of a substrate 110501. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

A first conductive layer (conductive layers 110503 and 110504) is formed over the first insulating film. The conductive layer 110503 includes a portion functioning as a gate electrode of a transistor 110520. The conductive layer 110504 includes a portion functioning as a first electrode of a capacitor 110521. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A second insulating film (an insulating film 110514) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A semiconductor layer is formed in part of a portion over the second insulating film, which overlaps with the first conductive layer, by a photolithography method, an inkjet method, a printing method, or the like. Part of the semiconductor layer extends to a portion over the second insulating film, which does not overlap with the first conductive layer. The semiconductor layer includes a channel formation region (a channel formation region 110510), an LDD region (LDD regions 110508 and 110509), and an impurity region (impurity regions 110505, 110506, and 110507). The channel formation region 110510 functions as a channel formation region of the transistor 110520. The LDD regions 110508 and 110509 function as LDD regions of the transistor 110520. Note that the LDD regions 110508 and 110509 are not necessarily formed. The impurity region 110505 includes a portion functioning as one of a source electrode and a drain electrode of the transistor 110520. The impurity region 110506 includes a portion functioning as the other of the source electrode and the drain electrode of the transistor 110520. The impurity region 110507 includes a portion functioning as a second electrode of the capacitor 110521.

A third insulating film (an insulating film 110511) is entirely formed. A contact hole is selectively formed in part of the third insulating film. The insulating film 110511 functions as an interlayer film. As the third insulating film, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material containing siloxane may be used. Note that siloxane is a material in which a skeleton structure is formed by a bond of silicon (Si) and oxygen (O). As a substitute, an organic group containing at least hydrogen (such as an alkyl group or aromatic hydrocarbon) is used. Alternatively, a fluoro group, or a fluoro group and an organic group containing at least hydrogen may be used as a substituent.

A second conductive layer (conductive layers 110512 and 110513) is formed over the third insulating film. The conductive layer 110512 is connected to the other of the source electrode and the drain electrode of the transistor 110520 through the contact hole formed in the third insulating film. Thus, the conductive layer 110512 includes a portion functioning as the other of the source electrode and the drain electrode of the transistor 110520. The conductive layer 110513 includes a portion functioning as the first electrode of the capacitor 110521. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Next, structures of a transistor and a capacitor are described in the case where an amorphous silicon (a-Si:H) film is used as a semiconductor layer of the transistor.

Figure 29:
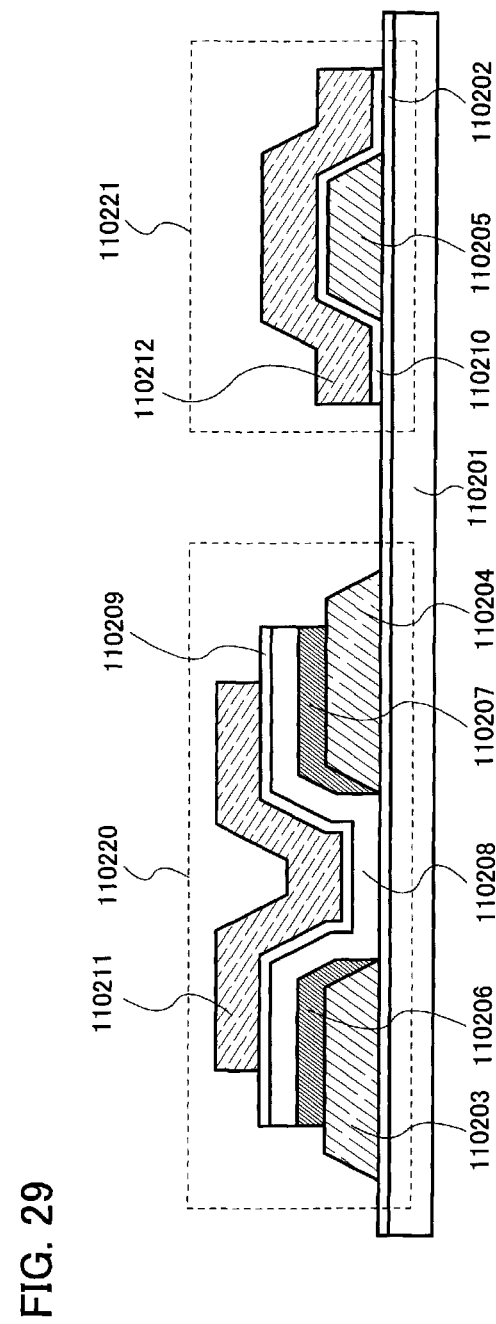
FIG. 29 is a cross-sectional view of a display device according to the invention.

FIG. 29 shows cross-sectional structures of a top-gate transistor and a capacitor.

A first insulating film (an insulating film 110202) is formed over an entire surface of a substrate 110201. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, the yield can be improved.

A first conductive layer (conductive layers 110203, 110204, and 110205) is formed over the first insulating film. The conductive layer 110203 includes a portion functioning as one of a source electrode and a drain electrode of a transistor 110220. The conductive layer 110204 includes a portion functioning as the other of the source electrode and the drain electrode of the transistor 110220. The conductive layer 110205 includes a portion functioning as a first electrode of a capacitor 110221. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A first semiconductor layer (semiconductor layers 110206 and 110207) is formed above the conductive layers 110203 and 110204. The semiconductor layer 110206 includes a portion functioning as one of the source electrode and the drain electrode. The semiconductor layer 110207 includes a portion functioning as the other of the source electrode and the drain electrode. As the first semiconductor layer, silicon containing phosphorus or the like can be used, for example.

A second semiconductor layer (a semiconductor layer 110208) is formed over the first insulating film and between the conductive layer 110203 and the conductive layer 110204. Part of the semiconductor layer 110208 extends over the conductive layers 110203 and 110204. The semiconductor layer 110208 includes a portion functioning as a channel formation region of the transistor 110220. As the second semiconductor layer, a semiconductor layer having no crystallinity such as an amorphous silicon (a-Si:H) layer, a semiconductor layer such as a microcrystalline semiconductor (μ-Si:H) layer, or the like can be used.

A second insulating film (insulating films 110209 and 110210) is formed to cover at least the semiconductor layer 110208 and the conductive layer 110205. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the second semiconductor layer, a silicon oxide film is preferably used. This is because the trap level at the interface between the second semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A second conductive layer (conductive layers 110211 and 110212) is formed over the second insulating film. The conductive layer 110211 includes a portion functioning as a gate electrode of the transistor 110220. The conductive layer 110212 functions as a second electrode of the capacitor 110221 or a wiring. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Figure 30:
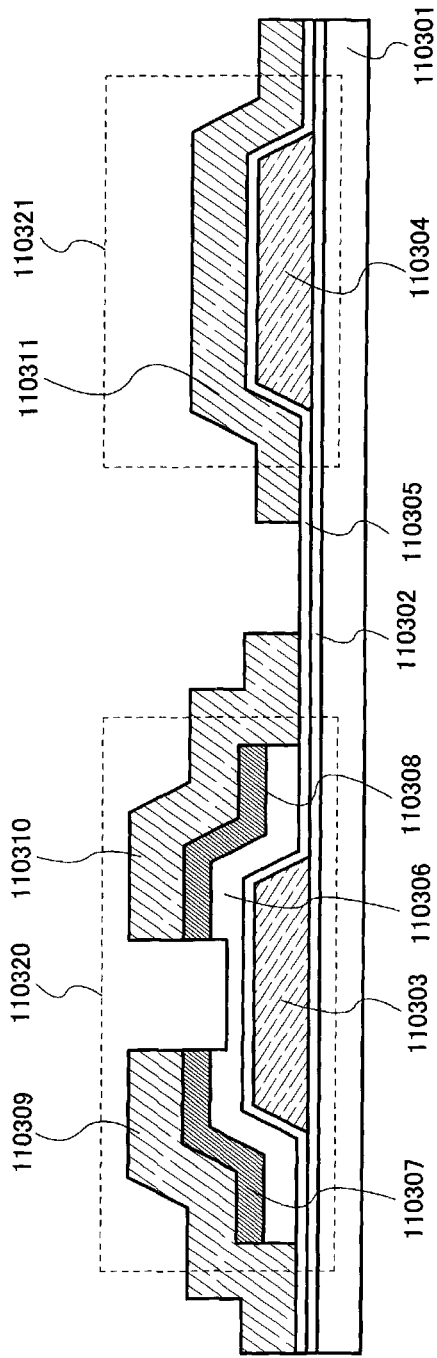
FIG. 30 is a cross-sectional view of a display device according to the invention.

FIG. 30 shows cross-sectional structures of an inversely staggered (bottom gate) transistor and a capacitor. In particular, the transistor shown in FIG. 30 has a channel-etched structure.

A first insulating film (an insulating film 110302) is formed over an entire surface of a substrate 110301. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, the yield can be improved.

A first conductive layer (conductive layers 110303 and 110304) is formed over the first insulating film. The conductive layer 110303 includes a portion functioning as a gate electrode of a transistor 110320. The conductive layer 110304 includes a portion functioning as a first electrode of a capacitor 110321. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

A second insulating film (an insulating film 110305) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 110306) is formed in part of a portion over the second insulating film, which overlaps with the first conductive layer, by a photolithography method, an inkjet method, a printing method, or the like. Part of the semiconductor layer 110306 extends to a portion over the second insulating film, which does not overlap with the first conductive layer. The semiconductor layer 110306 includes a portion functioning as a channel formation region of the transistor 110320. As the semiconductor layer 110306, a semiconductor layer having no crystallinity such as an amorphous silicon (a-Si:H) layer, a semiconductor layer such as a microcrystalline semiconductor (μ-Si:H) layer, or the like can be used.

A second semiconductor layer (semiconductor layers 110307 and 110308) is formed over part of the first semiconductor layer. The semiconductor layer 110307 includes a portion functioning as one of a source electrode and a drain electrode. The semiconductor layer 110308 includes a portion functioning as the other of the source electrode and the drain electrode. As the second semiconductor layer, silicon containing phosphorus or the like can be used, for example.

A second conductive layer (conductive layers 110309, 110310, and 110311) is formed over the second semiconductor layer and the second insulating film. The conductive layer 110309 includes a portion functioning as one of the source electrode and the drain electrode of the transistor 110320. The conductive layer 110310 includes a portion functioning as the other of the source electrode and the drain electrode of the transistor 110320. The conductive layer 110311 includes a portion functioning as a second electrode of the capacitor 110321. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternatively, a stacked layer of these elements (including the alloy thereof) can be used.

Note that in steps after forming the second conductive layer, various insulating films or various conductive films may be formed.

Here, an example of a step which is characteristic of the channel-etched type transistor is described. The first semiconductor layer and the second semiconductor layer can be formed using the same mask. Specifically, the first semiconductor layer and the second semiconductor layer are continuously formed. Further, the first semiconductor layer and the second semiconductor layer are formed using the same mask.

Another example of a step which is characteristic of the channel-etched type transistor is described. The channel region of the transistor can be formed without using an additional mask. Specifically, after the second conductive layer is formed, part of the second semiconductor layer is removed using the second conductive layer as a mask. Alternatively, part of the second semiconductor layer is removed by using the same mask as the second conductive layer. The first semiconductor layer below the removed second semiconductor layer serves as the channel formation region of the transistor.

Figure 31:
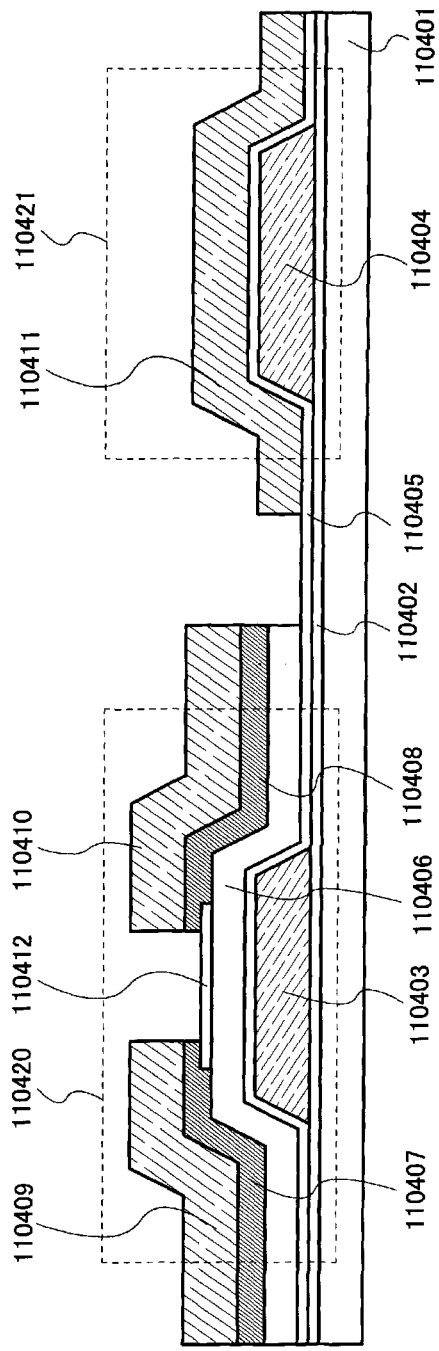
FIG. 31 is a cross-sectional view of a display device according to the invention.

FIG. 31 shows cross-sectional structures of an inversely staggered (bottom gate) transistor and a capacitor. In particular, the transistor shown in FIG. 31 has a channel protection (channel stop) structure.

A first insulating film (an insulating film 110402) is formed over an entire surface of a substrate 110401. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film ($SiO_xN_y$), or the like can be used.

Note that the first insulating film is not necessarily formed. When the first insulating film is not formed, reduction in the number of steps and reduction in manufacturing cost can be realized. Further, since the structure can be simplified, the yield can be improved.

A first conductive layer (conductive layers 110403 and 110404) is formed over the first insulating film. The conductive layer 110403 includes a portion functioning as a gate electrode of a transistor 110420. The conductive layer 110404 includes a portion functioning as a first electrode of a capacitor 110421. As the first conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternately, a stacked layer of these elements (including the alloy thereof) can be used.

A second insulating film (an insulating film 110405) is formed to cover at least the first conductive layer. The second insulating film functions as a gate insulating film. As the second insulating film, a single layer or a stacked layer of a silicon oxide film, a silicon nitride film, a silicon oxynitride film ($SiO_xN_y$), or the like can be used.

Note that for a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used for a portion of the second insulating film in contact with Mo. This is because the silicon oxide film does not oxidize Mo.

A first semiconductor layer (a semiconductor layer 110406) is formed in part of a portion over the second insulating film, which overlaps with the first conductive layer, by a photolithography method, an inkjet method, a printing method, or the like. Part of the semiconductor layer 110406 extends to a portion over the second insulating film, which does not overlap with the first conductive layer. The semiconductor layer 110406 includes a portion functioning as a channel formation region of the transistor 110420. As the semiconductor layer 110406, a semiconductor layer having no crystallinity such as an amorphous silicon (a-Si:H) layer, a semiconductor layer such as a microcrystalline semiconductor (μ-Si:H) layer, or the like can be used.

A third insulating film (an insulating film 110412) is formed over part of the first semiconductor layer. The insulating film 110412 prevents the channel region of the transistor 110420 from being removed by etching. That is, the insulating film 110412 functions as a channel protection film (a channel stop film). As the third insulating film, a single layer or a stacked layer of a silicon oxide film, a silicon nitride film, a silicon oxynitride film ($SiO_xN_y$), or the like can be used.

A second semiconductor layer (semiconductor layers 110407 and 110408) is formed over part of the first semiconductor layer and part of the third insulating film. The semiconductor layer 110407 includes a portion functioning as one of a source electrode and a drain electrode. The semiconductor layer 110408 includes a portion functioning as the other of the source electrode and the drain electrode. As the second semiconductor layer, silicon containing phosphorus or the like can be used, for example.

A second conductive layer (conductive layers 110409, 110410, and 110411) is formed over the second semiconductor layer. The conductive layer 110409 includes a portion functioning as one of the source electrode and the drain electrode of the transistor 110420. The conductive layer 110410 includes a portion functioning as the other of the source electrode and the drain electrode of the transistor 110420. The conductive layer 110411 includes a portion functioning as a second electrode of the capacitor 110421. As the second conductive layer, an element such as Ti, Mo, Ta, Cr, W, Al, Nd, Cu, Ag, Au, Pt, Nb, Si, Zn, Fe, Ba, or Ge, or an alloy of these elements can be used. Alternately, a stacked layer of these elements (including the alloy thereof) can be used.

Note that in steps after forming the second conductive layer, various insulating films or various conductive films may be formed.

Here, an example of a step which is characteristic of the channel protection type transistor is described. The first semiconductor layer, the second semiconductor layer, and the second conductive layer can be formed using the same mask. At the same time, the channel formation region can be formed. Specifically, the first semiconductor layer is formed, and then, the third insulating film (i.e., the channel protection film or the channel stop film) is patterned using a mask. Next, the second semiconductor layer and the second conductive layer are continuously formed. Then, after the second conductive layer is formed, the first semiconductor layer, the second semiconductor layer, and the second conductive film are patterned using the same mask. Note that part of the first semiconductor layer below the third insulating film is protected by the third insulating film, and thus is not removed by etching. This part (a part of the first semiconductor layer over which the third insulating film is formed) serves as the channel region.

Next, an example where a semiconductor substrate is used as a substrate for a transistor is described. Since a transistor formed using a semiconductor substrate has high mobility, the size of the transistor can be decreased. Accordingly, the number of transistors per unit area can be increased (the degree of integration can be improved), and the size of the substrate can be decreased as the degree of integration is increased in the case of the same circuit structure. Thus, manufacturing cost can be reduced. Further, since the circuit scale can be increased as the degree of integration is increased in the case of the same substrate size, more advanced functions can be provided without increase in manufacturing cost. Moreover, reduction in variations in characteristics can improve manufacturing yield. Reduction in operating voltage can reduce power consumption. High mobility can realize high-speed operation.

When a circuit which is formed by integrating transistors formed using a semiconductor substrate is mounted on a device in the form of an IC chip or the like, the device can be provided with a variety of functions. For example, when a peripheral driver circuit (e.g., a data driver (a source driver), a scan driver (a gate driver), a timing controller, an image processing circuit, an interface circuit, a power supply circuit, or an oscillation circuit) of a display device is formed by integrating transistors formed using a semiconductor substrate, a small peripheral circuit which can be operated with low power consumption and at high speed can be formed at low cost in high yield. Note that a circuit which is formed by integrating transistors formed using a semiconductor substrate may include a unipolar transistor. Thus, a manufacturing process can be simplified, so that manufacturing cost can be reduced.

A circuit which is formed by integrating transistors formed using a semiconductor substrate may also be used for a display panel, for example. More specifically, the circuit can be used for a reflective liquid crystal panel such as a liquid crystal on silicon (LCOS) device, a digital micromirror device (DMD) in which micromirrors are integrated, an EL panel, and the like. When such a display panel is formed using a semiconductor substrate, a small display panel which can be operated with low power consumption and at high speed can be formed at low cost in high yield. Note that the display panel may be formed over an element having a function other than a function of driving the display panel, such as a large-scale integration (LSI).

Hereinafter, a method of forming a transistor using a semiconductor substrate is described.

Figure 33A:
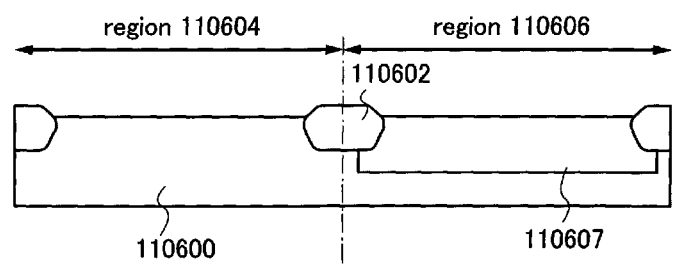
FIGS. 33A to 33C are cross-sectional views of a display device according to the invention.

First, element isolation regions 110604 and 110606 (hereinafter, referred to as regions 110604 and 110606) are formed on a semiconductor substrate 110600 (see FIG. 33A). The regions 110604 and 110606 provided in the semiconductor substrate 110600 are isolated from each other by an insulating film 110602. The example shown here is the case where a single crystal Si substrate having n-type conductivity is used as the semiconductor substrate 110600, and a p-well 110607 is provided in the region 110606 of the semiconductor substrate 110600.

Any substrate can be used as the substrate 110600 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The regions 110604 and 110606 can be formed by a LOCOS (local oxidation of silicon) method, a trench isolation method, or the like as appropriate.

The p-well formed in the region 110606 of the semiconductor substrate 110600 can be formed by selective doping of the semiconductor substrate 110600 with a p-type impurity element. As the p-type impurity element, boron (B), aluminum (Al), gallium (Ga), or the like can be used.

Note that in this embodiment mode, although the region 110604 is not doped with an impurity element because a semiconductor substrate having n-type conductivity is used as the semiconductor substrate 110600, an n-well may be formed in the region 110604 by introduction of an n-type impurity element. As the n-type impurity element, phosphorus (P), arsenic (As), or the like can be used. In contrast, when a semiconductor substrate having p-type conductivity is used, the region 110604 may be doped with an n-type impurity element to form an n-well, whereas the region 110606 may be doped with no impurity element.

Figure 33B:
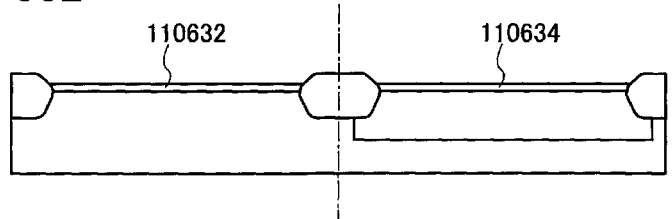

Next, insulating films 110632 and 110634 are formed so as to cover the regions 110604 and 110606, respectively (see FIG. 33B).

For example, surfaces of the regions 110604 and 110606 provided in the semiconductor substrate 110600 are oxidized by heat treatment, so that the insulating films 110632 and 110634 can be formed of silicon oxide films. Alternatively, the insulating films 110632 and 110634 may be formed to have a stacked-layer structure of a silicon oxide film and a film containing oxygen and nitrogen (a silicon oxynitride film) by forming a silicon oxide film by a thermal oxidation method and then nitriding the surface of the silicon oxide film by nitridation treatment.

Further alternatively, the insulating films 110632 and 110634 may be formed by plasma treatment as described above. For example, the insulating films 110632 and 110634 can be formed using a silicon oxide ($SiO_x$) film or a silicon nitride ($SiN_x$) film obtained by application of high-density plasma oxidation treatment or high-density plasma nitridation treatment to the surfaces of the regions 110604 and 110606 provided in the semiconductor substrate 110600. As another example, after application of high-density plasma oxidation treatment to the surfaces of the regions 110604 and 110606, high-density plasma nitridation treatment may be performed. In that case, silicon oxide films are formed on the surfaces of the regions 110604 and 110606, and then silicon oxynitride films are formed on the silicon oxide films. Thus, each of the insulating films 110632 and 110634 is formed to have a stacked-layer structure of the silicon oxide film and the silicon oxynitride film. As another example, after silicon oxide films are formed on the surfaces of the regions 110604 and 110606 by a thermal oxidation method, high-density plasma oxidation treatment or high-density nitridation treatment may be applied to the silicon oxide films.

The insulating films 110632 and 110634 formed over the regions 110604 and 110606 of the semiconductor substrate 110600 function as the gate insulating films of transistors which are completed later.

Figure 33C:
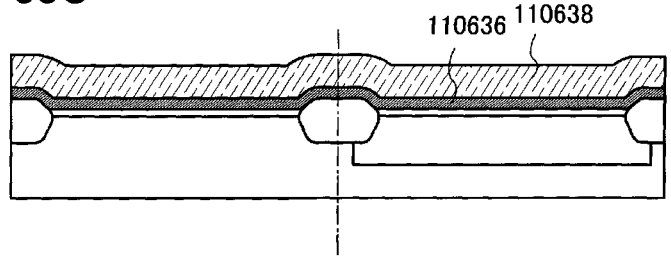

Next, a conductive film is formed so as to cover the insulating films 110632 and 110634 which are formed over the regions 110604 and 110606, respectively (see FIG. 33C). Here, an example is shown in which the conductive film is formed by sequentially stacking conductive films 110636 and 110638. It is needless to say that the conductive film may be formed using a single-layer structure or a stacked-layer structure of three or more layers.

As a material of the conductive films 110636 and 110638, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Further alternatively, a semiconductor material typified by polycrystalline silicon doped with an impurity element such as phosphorus or silicide in which a metal material is introduced can be used.

In this case, a stacked-layer structure is employed in which tantalum nitride is used for the conductive film 110636 and tungsten is used for the conductive film 110638. Alternatively, it is also possible to form the conductive film 110636 using a single-layer film or a stacked-layer film of tungsten nitride, molybdenum nitride, and/or titanium nitride. For the conductive film 110638, it is possible to use a single-layer film or a stacked-layer film of tantalum, molybdenum, and/or titanium.

Figure 34A:
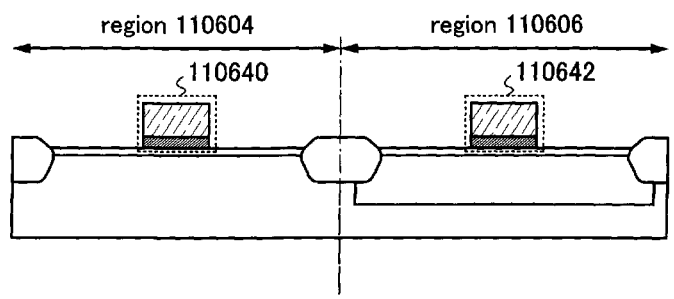
FIGS. 34A to 34D are cross-sectional views of a display device according to the invention.

Next, the stacked conductive films 110636 and 110638 are selectively removed by etching, so that the conductive films 110636 and 110638 remain above part of the regions 110604 and 110606, respectively. Thus, gate electrodes 110640 and 110642 are formed (see FIG. 34A).

Figure 34B:
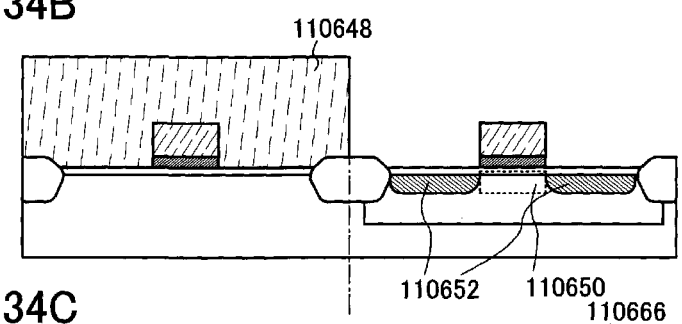

Next, a resist mask 110648 is selectively formed so as to cover the region 110604, and the region 110606 is doped with an impurity element, using the resist mask 110648 and the gate electrode 110642 as masks; thus, impurity regions 110652 are formed (see FIG. 34B). As an impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element. Note that after the impurity element is introduced, heat treatment may be performed in order to disperse the impurity element and to recover the crystalline structure.

In FIG. 34B, by introduction of an impurity element, impurity regions 110652 which form source and drain regions and a channel formation region 110650 are formed in the region 110606.

Figure 34C:
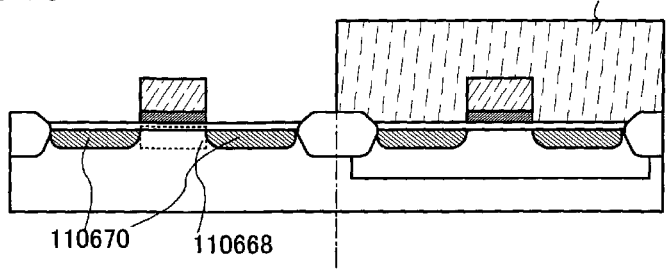

Next, a resist mask 110666 is selectively formed so as to cover the region 110606, and the region 110604 is doped with an impurity element, using the resist mask 110666 and the gate electrode 110640 as masks; thus, impurity regions 110670 are formed (see FIG. 34C). As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. At this time, an impurity element (e.g., boron (B)) of a conductivity type different from that of the impurity element introduced into the region 110606 in FIG. 34B is used. As a result, the impurity regions 110670 which form source and drain regions and a channel formation region 110668 are formed in the region 110604. Note that after the impurity element is introduced, heat treatment may be performed in order to disperse the impurity element and to recover the crystalline structure.

Figure 34D:
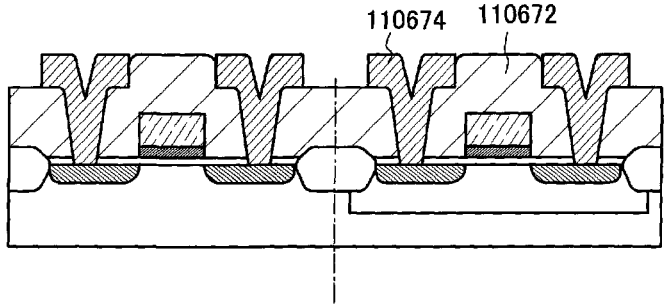

Next, a second insulating film 110672 is formed so as to cover the insulating films 110632 and 110634 and the gate electrodes 110640 and 110642. Further, wirings 110674 which are electrically connected to the impurity regions 110652 and 110670 formed in the regions 110606 and 110604 respectively are formed (see FIG. 34D).

The second insulating film 110672 can be formed to have a single-layer structure or a stacked-layer structure of an insulating film containing oxygen and/or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as DLC (diamond-like carbon); an organic material such as epoxy, polyimide, polyamide, polyvinyl phenol, benzocyclobutene, or acrylic; or a siloxane material such as a siloxane resin by a CVD method, a sputtering method, or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group, or both a fluoro group and an organic group containing at least hydrogen may be used as the substituent.

The wirings 110674 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. The wirings 110674 are preferably formed to have a stacked-layer structure of a barrier film, an aluminum-silicon (Al—Si) film, and a barrier film or a stacked-layer structure of a barrier film, an aluminum-silicon (Al—Si) film, a titanium nitride film, and a barrier film. Note that the barrier film corresponds to a thin film formed of titanium, titanium nitride, molybdenum, or molybdenum nitride. Aluminum and aluminum silicon are suitable materials for forming the wirings 110674 because they have high resistance values and are inexpensive. For example, when barrier layers are provided as the top layer and the bottom layer, generation of hillocks of aluminum or aluminum silicon can be prevented. For example, when a barrier film is formed of titanium which is an element having a high reducing property, even if a thin natural oxide film is formed on a crystalline semiconductor film, the natural oxide film can be reduced. As a result, the wirings 110674 can be connected to the crystalline semiconductor in electrically and physically favorable condition.

Note that the structure of a transistor is not limited to that shown in the drawing. For example, a transistor with an inversely staggered structure, a FinFET structure, or the like can be used. A FinFET structure is preferable because it can suppress a short channel effect which occurs along with reduction in transistor size.

Next, another example in which a semiconductor substrate is used as a substrate for forming a transistor is described.

Figure 35A:
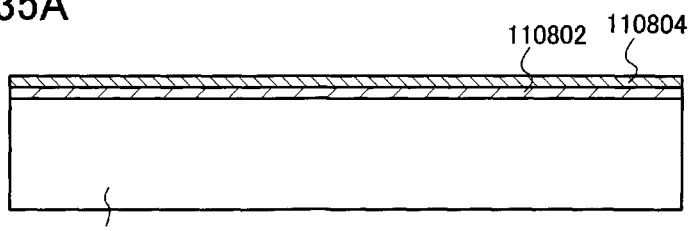
FIGS. 35A to 35C are cross-sectional views of a display device according to the invention.

First, an insulating film is formed on a substrate 110800. Here, a single crystal Si having n-type conductivity is used for the substrate 110800, and insulating films 110802 and 110804 are formed on the substrate 110800 (see FIG. 35A). For example, silicon oxide ($SiO_x$) is formed for the insulating film 110802 by performing heat treatment on the substrate 110800. Moreover, silicon nitride ($SiN_x$) is formed by a CVD method or the like.

Any substrate can be used as the substrate 110800 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The insulating film 110804 may be provided by forming the insulating film 110802 and then nitriding the insulating film 110802 by high-density plasma treatment. Note that the insulating film may have a single-layer structure or a stacked-layer structure of three or more layers.

Figure 35B:
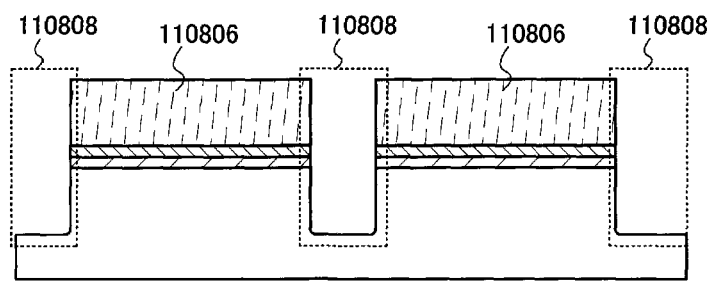

Next, a pattern of a resist mask 110806 is selectively formed. Then, etching is selectively performed using the resist mask 110806 as a mask, whereby depressed portions 110808 are selectively formed in the substrate 110800 (see FIG. 35B). The substrate 110800 and the insulating films 110802 and 110804 can be etched by dry etching using plasma.

Figure 35C:
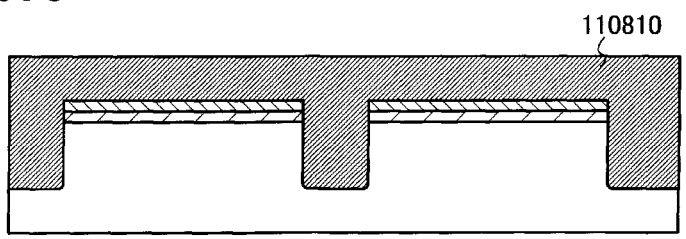

Next, after the pattern of the resist mask 110806 is removed, an insulating film 110810 is formed so as to fill the depressed portions 110808 formed in the substrate 110800 (see FIG. 35C).

The insulating film 110810 is formed using an insulating material such as silicon oxide, silicon nitride, silicon oxynitride ($SiO_xN_y$) (x>y>0), or silicon nitride oxide ($SiN_xO_y$) (x>y>0) by a CVD method, a sputtering method, or the like. Here, as the insulating film 110810, a silicon oxide film is formed using a tetraethyl orthosilicate (TEOS) gas by an atmospheric pressure CVD method or a low pressure CVD method.

Figure 36A:
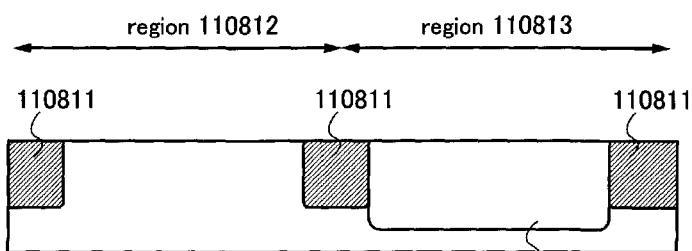
FIGS. 36A to 36D are cross-sectional views of a display device according to the invention.

Next, a surface of the substrate 110800 is exposed by performing grinding treatment, polishing treatment, or chemical mechanical polishing (CMP) treatment. Then, the surface of the substrate 110800 is separated by insulating films 110810 formed in the depressed portions 110808 of the substrate 110800. Here, the separated regions are referred to as regions 110812 and 110813 (see FIG. 36A). Note that the insulating films 110810 are obtained by partial removal of the insulating films 110810 by grinding treatment, polishing treatment, or CMP treatment.

Subsequently, the p-well can be formed in the region 110813 of the semiconductor substrate 110800 by selective introduction of an impurity element having p-type conductivity. As the p-type impurity element, boron (B), aluminum (Al), gallium (Ga), or the like can be used. Here, as the impurity element, boron (B) is introduced into the region 110813. Note that after the impurity element is introduced, heat treatment may be performed in order to disperse the impurity element and to recover the crystalline structure.

Although an impurity element is not necessarily introduced into the region 110812 when a semiconductor substrate having n-type conductivity is used as the semiconductor substrate 110800, an n-well may be formed in the region 110812 by introduction of an n-type impurity element. As the n-type impurity element, phosphorus (P), arsenic (As), or the like can be used.

In contrast, when a semiconductor substrate having p-type conductivity is used, the region 110812 may be doped with an n-type impurity element to form an n-well, whereas the region 110813 may be doped with no impurity element.

Figure 36B:
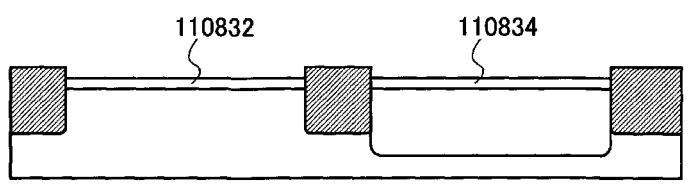

Next, insulating films 110832 and 110834 are formed, respectively, on the surfaces of the regions 110812 and 110813 of the substrate 110800 (see FIG. 36B).

For example, the surfaces of the regions 110812 and 110813 provided in the semiconductor substrate 110800 are oxidized by heat treatment, so that the insulating films 110832 and 110834 can be formed of silicon oxide films. Alternatively, the insulating films 110832 and 110834 may be formed to have a stacked-layer structure of a silicon oxide film and a film containing oxygen and nitrogen (a silicon oxynitride film) by the forming a silicon oxide film by a thermal oxidation method and then nitriding the surface of the silicon oxide film by nitridation treatment.

Further alternatively, the insulating films 110832 and 110834 may be formed by plasma treatment as described above. For example, the insulating films 110832 and 110834 can be formed using a silicon oxide ($SiO_x$) film or a silicon nitride ($SiN_x$) film obtained by application of high-density plasma oxidation treatment or high-density plasma nitridation treatment to the surfaces of the regions 110812 and 110813 provided in the substrate 110800. As another example, after application of high-density plasma oxidation treatment to the surfaces of the regions 110812 and 110813, high-density plasma nitridation treatment may be performed. In that case, silicon oxide films are formed on the surfaces of the regions 110812 and 110813, and then silicon oxynitride films are formed on the silicon oxide films. Thus, each of the insulating films 110832 and 110834 is formed to have a stacked-layer structure of the silicon oxide film and the silicon oxynitride film. As another example, after silicon oxide films are formed on the surfaces of the regions 110812 and 110813 by a thermal oxidation method, high-density plasma oxidation treatment or high-density nitridation treatment may be applied to the silicon oxide films.

The insulating films 110832 and 110834 formed over the regions 110812 and 110813 of the semiconductor substrate 110800 function as the gate insulating films of transistors which are completed later.

Figure 36C:
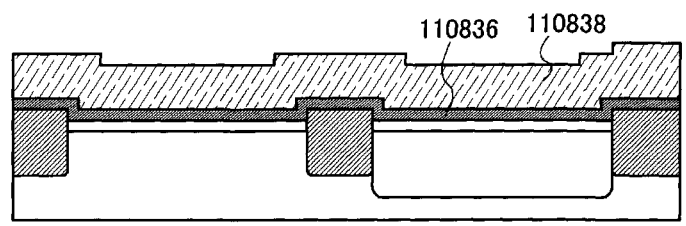

Next, a conductive film is formed so as to cover the insulating films 110832 and 110834 which are formed over the regions 110812 and 110813, respectively, provided in the substrate 110800 (see FIG. 36C). Here, an example is shown in which the conductive film is formed by sequentially stacking conductive films 110836 and 110838. It is needless to say that the conductive film may be formed using a single-layer structure or a stacked-layer structure of three or more layers.

As a material of the conductive films 110836 and 110838, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Further alternatively, a semiconductor material typified by polycrystalline silicon doped with an impurity element such as phosphorus or silicide in which a metal material is introduced can be used.

In this case, a stacked-layer structure is employed in which tantalum nitride is used for the conductive film 110836 and tungsten is used for the conductive film 110838. Alternatively, it is also possible to form the conductive film 110836 using a single-layer film or a stacked-layer film of tantalum nitride, tungsten nitride, molybdenum nitride, and/or titanium nitride. For the conductive film 110838, it is possible to use a single-layer film or a stacked-layer film of tungsten, tantalum, molybdenum, and/or titanium.

Figure 36D:
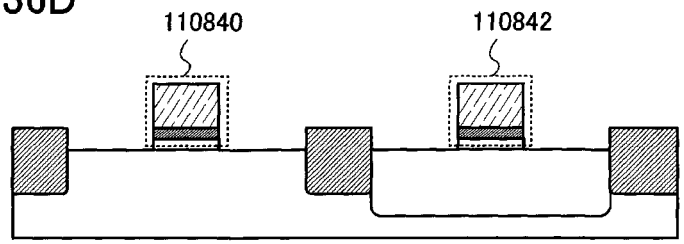

Next, the stacked conductive films 110836 and 110838 are selectively removed by etching, so that the conductive films 110836 and 110838 remain above part of the regions 110812 and 110813 of the substrate 110800, respectively. Thus, conductive films 110840 and 110842 functioning as gate electrodes are formed (see FIG. 36D). Here, the surface of the substrate 110800 is made to be exposed in the region which does not overlap with the conductive films 110840 and 110842.

Specifically, in the region 110812 of the substrate 110800, a portion of the insulating film 110832 which does not overlap with the conductive film 110840 is selectively removed, and an end portion of the conductive film 110840 and an end portion of the insulating film 110832 are made to roughly match. Further, in the region 110813 of the substrate 110800, part of the insulating film 110834 which does not overlap with the conductive film 110842 is selectively removed, and an end portion of the conductive film 110842 and an end portion of the insulating film 110834 are made to roughly match.

In this case, insulating films and the like of the portions which do not overlap with the conductive films 110840 and 110842 may be removed at the same time as formation of the conductive films 110840 and 110842. Alternatively, the insulating films and the like of the portions which do not overlap may be removed using the resist mask, which is left after the conductive films 110840 and 110842 are formed, or the conductive films 110840 and 110842 as masks.

Figure 37A:
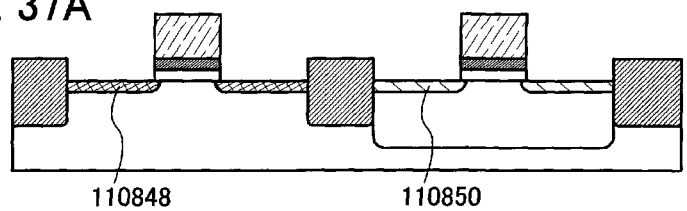
FIGS. 37A to 37D are cross-sectional views of a display device according to the invention.

Next, an impurity element is selectively introduced into the regions 110812 and 110813 of the substrate 110800 (see FIG. 37A). Here, an n-type impurity element is selectively introduced into the region 110813 at a low concentration, using the conductive film 110842 as a mask. On the other hand, a p-type impurity element is selectively introduced into the region 110812 at a low concentration, using the conductive film 110840 as a mask. As the n-type impurity element, phosphorus (P), arsenic (As), or the like can be used. As the p-type impurity element, boron (B), aluminum (Al), gallium (Ga), or the like can be used. Note that after the impurity element is introduced, heat treatment may be performed in order to disperse the impurity element and to recover the crystalline structure.

Next, sidewalls 110854 which are in contact with side surfaces of the conductive films 110840 and 110842 are formed. Specifically, the sidewalls are formed to have a single-layer structure or a stacked-layer structure of a film containing an inorganic material such as silicon, oxide of silicon, or nitride of silicon, or a film containing an organic material such as an organic resin by a plasma CVD method, a sputtering method, or the like. Then, the insulating films are selectively etched by anisotropic etching mainly in a perpendicular direction, so that the sidewalls are formed in contact with the side surfaces of the conductive films 110840 and 110842. Note that the sidewalls 110854 are used as masks for doping in forming LDD (lightly doped drain) regions. Here, the sidewalls 110854 are formed to be also in contact with side surfaces of the insulating films or floating gate electrodes formed under the conductive films 110840 and 110842.

Figure 37B:
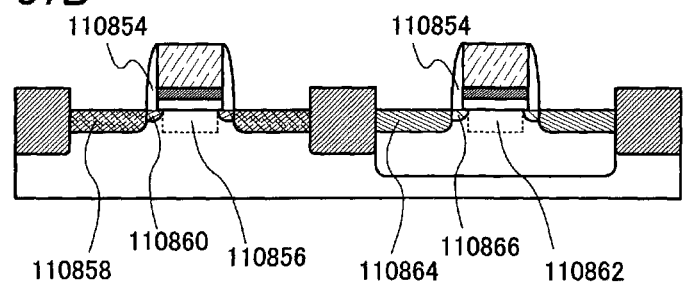

Subsequently, an impurity element is introduced into the regions 110812 and 110813 of the substrate 110800, using the sidewalls 110854 and the conductive films 110840 and 110842 as masks; thus, impurity regions functioning as source and drain regions are formed (see FIG. 37B). Here, an n-type impurity element is introduced into the region 110813 of the substrate 110800 at a high concentration, using the sidewalls 110854 and the conductive film 110842 as masks, and a p-type impurity element is introduced into the region 110812 at a high concentration, using the sidewalls 110854 and the conductive film 110840 as masks.

As a result, in the region 110812 of the substrate 110800, an impurity region 110858 forming a source or drain region, a low-concentration impurity region 110860 forming an LDD region, and a channel formation region 110856 are formed. Moreover, in the region 110813 of the substrate 110800, an impurity region 110864 forming a source or drain region, a low-concentration impurity region 110866 forming an LDD region, and a channel formation region 110862 are formed.

Note that although the example in which the LDD regions are formed using the sidewalls is described, the invention is not limited thereto. The LDD regions may be formed using a mask or the like without the use of the sidewalls, or is not necessarily formed. When the LDD regions are not formed, a manufacturing process can be simplified, so that manufacturing cost can be reduced.

Note that in this embodiment mode, impurity elements are introduced in a state where the surface of the substrate 110800 is exposed in the region which does not overlap with the conductive films 110840 and 110842. Accordingly, the channel formation regions 110856 and 110862 formed in the regions 110812 and 110813 respectively of the substrate 110800 can be formed in a self-aligned manner with the conductive films 110840 and 110842, respectively.

Figure 37C:
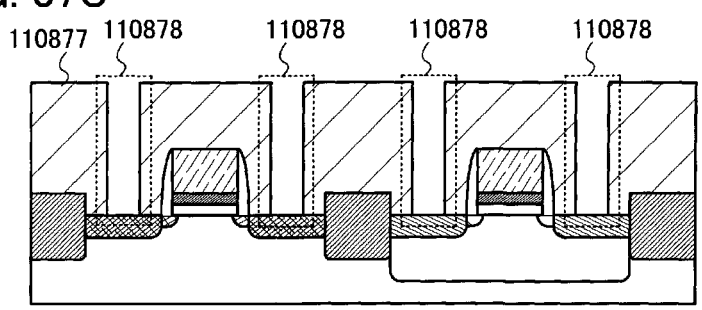

Next, a second insulating film 110877 is formed so as to cover the insulating films, conductive films, and the like provided over the regions 110812 and 110813 of the substrate 110800, and openings 110878 are formed in the insulating film 110877 (see FIG. 37C).

The second insulating film 110877 can be formed to have a single-layer structure or a stacked-layer structure of an insulating film containing oxygen and/or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as diamond-like carbon (DLC); an organic material such as epoxy, polyimide, polyamide, polyvinyl phenol, benzocyclobutene, or acrylic; or a siloxane material such as a siloxane resin by a CVD method, a sputtering method, or the like. A siloxane material corresponds to a material having a bond of Si—O—Si. Siloxane has a skeleton structure with the bond of silicon (Si) and oxygen (O). As a substituent of siloxane, an organic group containing at least hydrogen (for example, an alkyl group or aromatic hydrocarbon) is used. Alternatively, a fluoro group, or both a fluoro group and an organic group containing at least hydrogen may be used as the substituent.

Figure 37D:
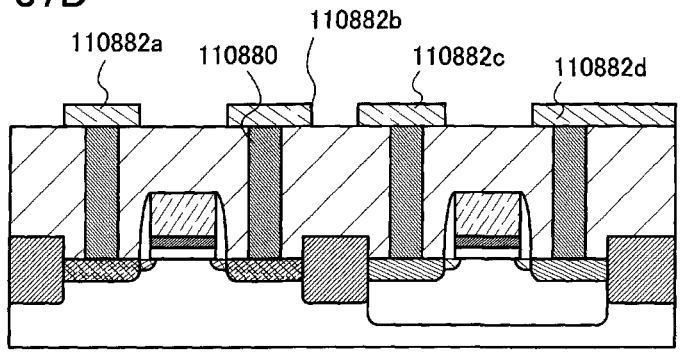

Next, a conductive film 110880 is formed in each of the openings 110878 by a CVD method, and conductive films 110882a to 110882d are selectively formed over the insulating film 110877 so as to be electrically connected to the conductive films 110880 (see FIG. 37D).

The conductive films 110880 and 110882a to 110882d are formed to have a single-layer structure or a stacked-layer structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. The conductive films 110880 and 110882a to 110882d are preferably formed to have a stacked-layer structure of a barrier film, an aluminum-silicon (Al—Si) film, and a barrier film or a stacked structure of a barrier film, an aluminum-silicon (Al—Si) film, a titanium nitride film, and a barrier film. Note that the barrier film corresponds to a thin film formed of titanium, titanium nitride, molybdenum, or molybdenum nitride. Aluminum and aluminum silicon are suitable materials for forming the conductive film 110880 because they have high resistance values and are inexpensive. For example, when barrier layers are provided as the top layer and the bottom layer, generation of hillocks of aluminum or aluminum silicon can be prevented. For example, when a barrier film is formed of titanium which is an element having a high reducing property, even if a thin natural oxide film is formed on the crystalline semiconductor film, the natural oxide film can be reduced, and a favorable contact between the conductive film and the crystalline semiconductor film can be obtained. Here, the conductive films 110880 can be formed by selective growth of tungsten (W) by a CVD method.

By the steps described above, a p-channel transistor formed in the region 110812 of the substrate 110800 and an n-channel transistor formed in the region 110813 of the substrate 110800 can be obtained.

Note that the structure of a transistor is not limited to that shown in the drawing. For example, a transistor with an inversely staggered structure, a FinFET structure, or the like can be used. A FinFET structure is preferable because it can suppress a short channel effect which occurs along with reduction in transistor size.

The above is the description of the structures and the manufacturing methods of transistors. In this embodiment mode, a wiring, an electrode, a conductive layer, a conductive film, a terminal, a via, a plug, and the like are preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon oxide (ITSO), zinc oxide (ZnO), tin oxide (SnO), cadmium tin oxide (CTO), aluminum neodymium (Al—Nd), magnesium silver (Mg—Ag), or molybdenum-niobium (Mo—Nb)); a substance in which these compounds are combined; or the like. Alternatively, they are preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Accordingly, such silicon can be utilized easily as a wiring, an electrode, or the like.

In addition, silicon with various levels of crystallinity, such as single crystalline silicon, polycrystalline silicon, or microcrystalline silicon can be used. Alternatively, silicon having no crystallinity, such as amorphous silicon can be used. By using single crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Aluminum and silver have high conductivity, and thus can reduce signal delay. Moreover, since aluminum and silver can be easily etched, they are easily patterned and can be minutely processed.

Copper has high conductivity, and thus can reduce signal delay. When copper is used, a stacked-layer structure is preferably employed to improve adhesion.

Molybdenum and titanium are preferable because even if molybdenum or titanium is in contact with an oxide semiconductor (e.g., ITO or IZO) or silicon, molybdenum or titanium does not cause defects. Moreover, molybdenum and titanium are preferable because they are easily etched and has high heat resistance.

Tungsten is preferable because it has advantages such as high heat resistance.

Neodymium is also preferable because it has advantages such as high heat resistance. In particular, an alloy of neodymium and aluminum is preferable because heat resistance is increased and aluminum hardly causes hillocks.

Silicon is preferably used because it can be formed at the same time as a semiconductor layer included in a transistor and has high heat resistance.

Since ITO, IZO, ITSO, zinc oxide (ZnO), silicon (Si), tin oxide (SnO), and cadmium tin oxide (CTO) have light-transmitting properties, they can be used for a portion which transmits light. For example, they can be used for a pixel electrode or a common electrode.

IZO is preferable because it is easily etched and processed. In etching IZO, a residue is hardly left. Accordingly, when IZO is used for a pixel electrode, defects (such as short circuit or orientation disorder) of a liquid crystal element or a light-emitting element can be reduced.

A wiring, an electrode, a conductive layer, a conductive film, a terminal, a via, a plug, or the like may have a single-layer structure or a multi-layer structure. By employing a single-layer structure, each manufacturing process of a wiring, an electrode, a conductive layer, a conductive film, a terminal, or the like can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a stacked-layer structure in which a low heat-resistant material is interposed between high heat-resistant materials is employed, heat resistance of a wiring, an electrode, and the like can be increased, utilizing advantages of the low heat-resistance material. For example, it is preferable to employ a stacked-layer structure in which a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

The term "wiring" indicates a portion including a conductor. A wiring may be a linear shape or made to be short without being extended. Therefore, an electrode is included in a wiring.

Note that a carbon nanotube may be used for a wiring, an electrode, a conductive layer, a conductive film, a terminal, a via, a plug, or the like. Since a carbon nanotube has a light-transmitting property, it can be used for a portion which transmits light. For example, a carbon nanotube can be used for a pixel electrode or a common electrode.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 7

In this embodiment mode, a structure of a display device is described.

Figure 38A:
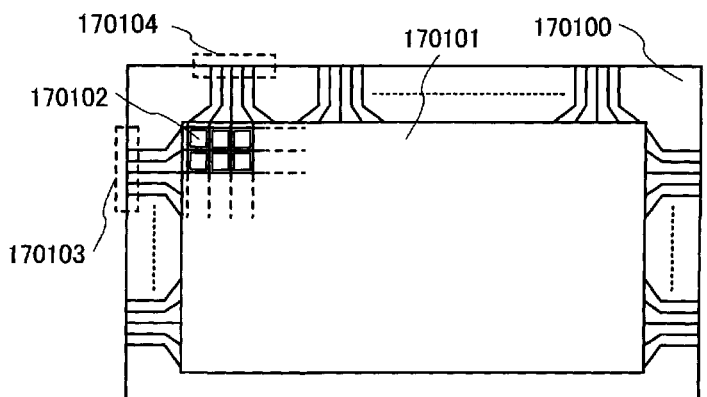
FIGS. 38A to 38C each illustrate a structure of a peripheral circuit of a display device according to the invention.

A structure of a display device is described with reference to FIG. 38A. FIG. 38A is a top plan view of the display device.

A pixel portion 170101, a scan line input terminal 170103, and a signal line input terminal 170104 are formed over a substrate 170100. Scan lines extending in a row direction from the scan line input terminal 170103 are formed over the substrate 170100, and signal lines extending in a column direction from the signal line input terminal 170104 are formed over the substrate 170100. Pixels 170102 are arranged in matrix at each intersection of the scan lines and the signal lines in the pixel portion 170101.

The scan line side input terminal 170103 is formed on both sides of the row direction of the substrate 170100. Further, a scan line extending from one scan line side input terminal 170103 and a scan line extending from the other scan line side input terminal 170103 are alternately formed. In this case, since the pixels 170102 can be arranged in a highly dense state, a high-definition display device can be obtained. However, the invention is not limited to this structure, and the scan line side input terminal 170103 may be formed only on one side of the row direction of the substrate 170100. In this case, a frame of the display device can be made smaller. Moreover, the area of the pixel portion 170101 can be increased. As another example, the scan line extending from one scan line side input terminal 170103 and the scan line extending from the other scan line side input terminal 170103 may be used in common. In this case, the structure is suitable for display devices in which a load on a scan line is large, such as large-scale display devices. Note that signals are input from an external driver circuit to the scan line through the scan line side input terminal 170103.

The signal line side input terminal 170104 is formed on one side of the column direction of the substrate 170100. In this case, the frame of the display device can be made smaller. Moreover, the area of the pixel portion 170101 can be increased. However, the invention is not limited to this structure, and the signal line side input terminal 170104 may be formed on both sides of the column direction of the substrate 170100. In this case, the pixels 170102 are arranged with high density. Note that signals are input from an external driver circuit to the scan line through the signal line side input terminal 170104.

The pixel 170102 includes a switching element and a pixel electrode. In each pixel 170102, a first terminal of the switching element is connected to the signal line, and a second terminal of the switching element is connected to the pixel electrode. On/off of the switching element is controlled by the scan line. However, the invention is not limited to this structure, and a variety of structures can be employed. For example, the pixel 170102 may include a capacitor. In this case, a capacitor line is preferably formed over the substrate 170100. As another example, the pixel 170102 may include a current source such as a driving transistor. In this case, a power supply line is preferably formed over the substrate 170100.

As the substrate 170100, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, a substrate including a stainless steel foil, or the like can be used. Alternatively, a skin (e.g., surfaces of the skin or corium) or hypodermal tissue of an animal such as a human can be used as the substrate. Note that the substrate 170100 is not limited to those described above, and a variety of substrates can be used.

As the switching element included in the pixel 170102, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used. Note that the switching element is not limited to those described above, and a variety of switching elements can be used. Note that when a MOS transistor is used as the switching element included in the pixel 170102, a gate electrode is connected to the scan line, a first terminal is connected to the signal line, and a second terminal is connected to the pixel electrode.

The above is the description of the case where a signal is input from an external driver circuit; however, the invention is not limited to this structure, and an IC chip can be mounted on a display device.

Figure 39A:
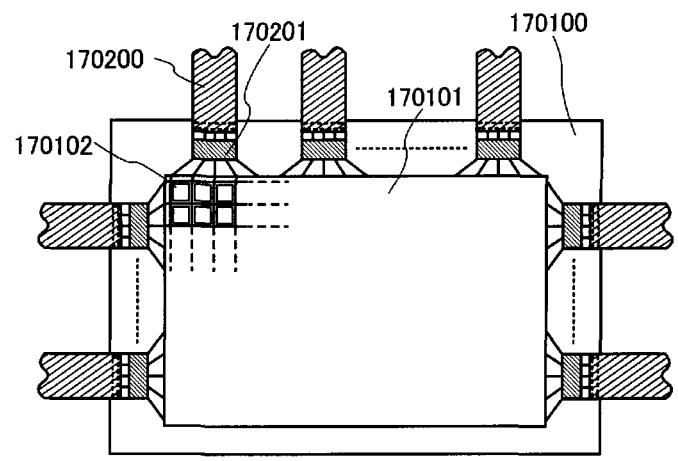
FIGS. 39A and 39B each illustrate a structure of a peripheral circuit of a display device according to the invention.

For example, as shown in FIG. 39A, an IC chip 170201 can be mounted on the substrate 170100 by a COG (chip on glass) method. In this case, the IC chip 170201 can be examined before being mounted on the substrate 170100, so that improvement in yield and reliability of the display device can be realized. Note that portions common to those in FIG. 38A are denoted by common reference numerals, and description thereof is omitted.

Figure 39B:
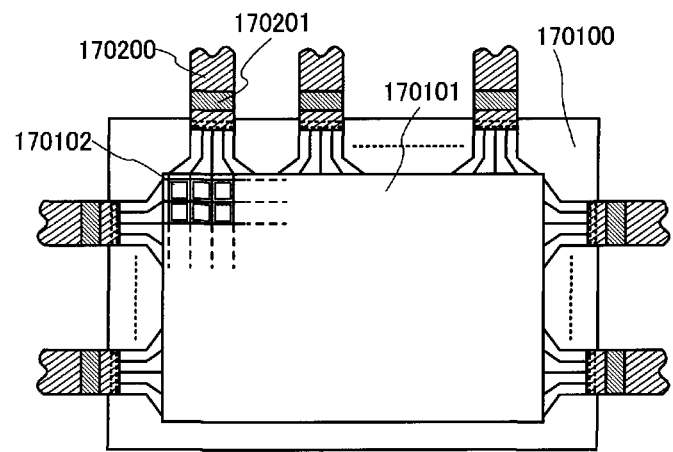

As another example, as shown in FIG. 39B, the IC chip 170201 can be mounted on an FPC (flexible printed circuit) 170200 by a TAB (tape automated bonding) method. In this case, the IC chip 170201 can be examined before being mounted on the FPC 170200, so that improvement in yield and reliability of the display device can be realized. Note that portions common to those in FIG. 38A are denoted by common reference numerals, and description thereof is omitted.

Not only the IC chip can be mounted on the substrate 170100, but also a driver circuit can be formed over the substrate 170100.

Figure 38B:
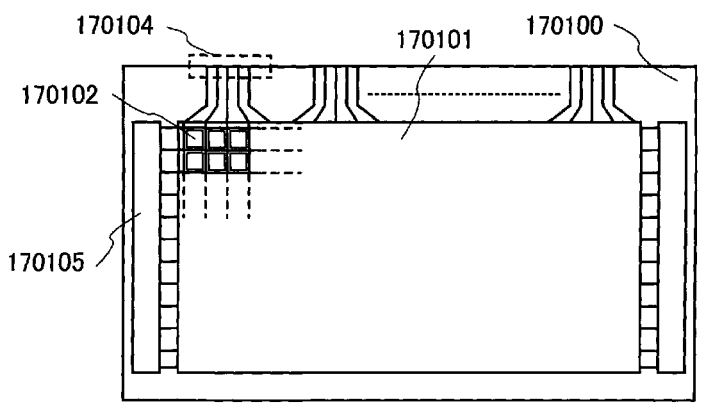

For example, as shown in FIG. 38B, a scan line driver circuit 170105 can be formed over the substrate 170100. In this case, the cost can be reduced by reduction in the number of components. Further, reliability can be improved by reduction in the number of connection points between components. Since the driving frequency of the scan line driver circuit 170105 is low, the scan line driver circuit 170105 can be easily formed using amorphous silicon or microcrystalline silicon as a semiconductor layer of a transistor. Note that an IC chip for outputting a signal to the signal line may be mounted on the substrate 170100 by a COG method. Alternatively, an FPC on which an IC chip for outputting a signal to the signal line is mounted by a TAB method may be provided on the substrate 170100. In addition, an IC chip for controlling the scan line driver circuit 170105 may be mounted on the substrate 170100 by a COG method. Alternatively, an FPC on which an IC chip for controlling the scan line driver circuit 170105 is mounted by a TAB method may be provided on the substrate 170100. Note that portions common to those in FIG. 38A are denoted by common reference numerals, and description thereof is omitted.

Figure 38C:
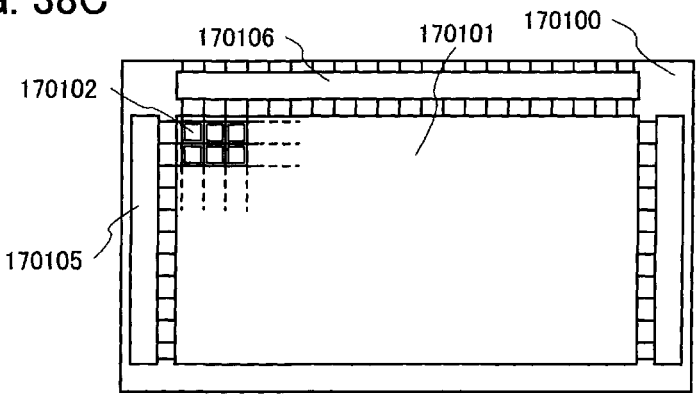

As another example, as shown in FIG. 38C, the scan line driver circuit 170105 and a signal line driver circuit 170106 can be formed over the substrate 170100. Thus, the cost can be reduced by reduction in the number of components. Further, reliability can be improved by reduction in the number of connection points between components. Note that an IC chip for controlling the scan line driver circuit 170105 may be mounted on the substrate 170100 by a COG method. Alternatively, an FPC on which an IC chip for controlling the scan line driver circuit 170105 is mounted by a TAB method may be provided on the substrate 170100. In addition, an IC chip for controlling the signal line driver circuit 170106 may be mounted on the substrate 170100 by a COG method. Alternatively, an FPC on which an IC chip for controlling the signal line driver circuit 170106 is mounted by a TAB method may be provided on the substrate 170100. Note that portions common to those in FIG. 38A are denoted by common reference numerals, and description thereof is omitted.

Figure 40:
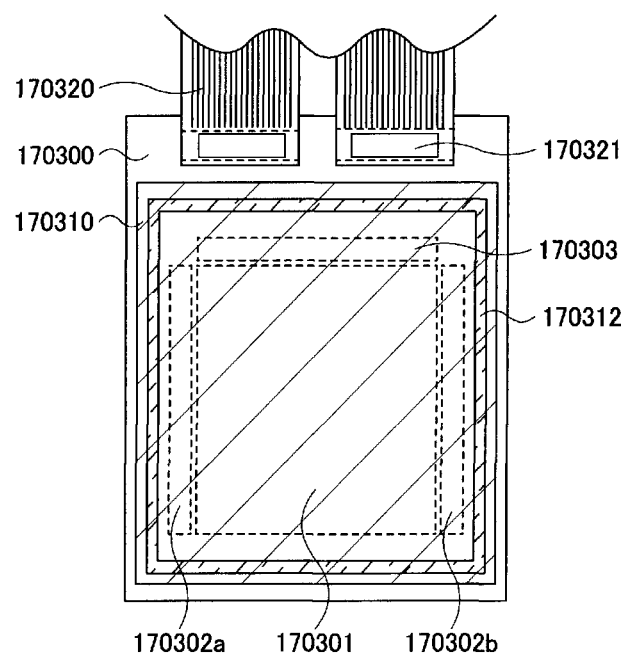
FIG. 40 illustrates a structure of a peripheral circuit of a display device according to the invention.

Next, another structure of a display device is described with reference to FIG. 40. Specifically, the display device includes a TFT substrate, an opposite substrate, and a display layer interposed between the TFT substrate and the opposite substrate. FIG. 40 is a top view of the display device.

A pixel portion 170301, a scan line driver circuit 170302a, a scan line driver circuit 170302b, and a signal line driver circuit 170303 are formed over a substrate 170300. The scan line driver circuits 170302a and 170302b and the signal line driver circuit 170303 are sealed between the substrate 170300 and a substrate 170310 with the use of a sealant 170312.

Further, an FPC 107320 is arranged over the substrate 170300. Moreover, an IC chip 170321 is mounted on the FPC 170320 by a TAB method.

A plurality of pixels are arranged in matrix in the pixel portion 170301. A scan line extending in the row direction from the scan line driver circuit 170302a is formed over the substrate 170300. A signal line extending in the column direction from the signal line driver circuit 170303 is formed over the substrate 170300.

The scan line side input circuit 170302a is formed on one side of the row direction of the substrate 170300. The scan line driver circuit 170302b is formed on the other side of the row direction of the substrate 170300. Further, a scan line extending from the scan line side input circuit 170302a and a scan line extending from the scan line side input circuit 170302b are alternately formed. Accordingly, a high-definition display device can be obtained. Note that the invention is not limited to this structure, and only one of the scan line side input circuits 170302a and 170302b may be formed over the substrate 170300. In this case, the frame of the display device can be made smaller. Moreover, the area of the pixel portion 170301 can be increased. As another example, the scan line extending from the scan line side input circuit 170302a and the scan line extending from the scan line driver circuit 170302b may be used in common. In this case, the structure is suitable for display devices in which a load on a scan line is large, such as large-scale display devices.

The signal line driver circuit 170303 is formed on one side of the column direction of the substrate 170300. Accordingly, the frame of the display device can be made smaller. The area of the pixel portion 170301 can be increased. Note that the invention is not limited to this structure, and the signal line driver circuit 170303 may be formed on both sides of the column direction of the substrate 170300. In this case, a high-definition display device can be obtained.

As the substrate 170300, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, a substrate including a stainless steel foil, or the like can be used. Alternatively, a skin (e.g., surfaces of the skin or corium) or hypodermal tissue of an animal such as a human can be used as the substrate. Note that the substrate 170300 is not limited to those described above, and a variety of substrates can be used.

As the switching element included in the display device, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used. Note that the switching element is not limited to those described above, and a variety of switching elements can be used.

The case where a driver circuit and a pixel portion are formed over the same substrate has been described so far. Note that the invention is not limited to this case, and another substrate over which the driver circuit is partially or entirely formed may be made to be an IC chip so that the substrate is mounted on the substrate over which the pixel portion is formed.

Figure 41A:
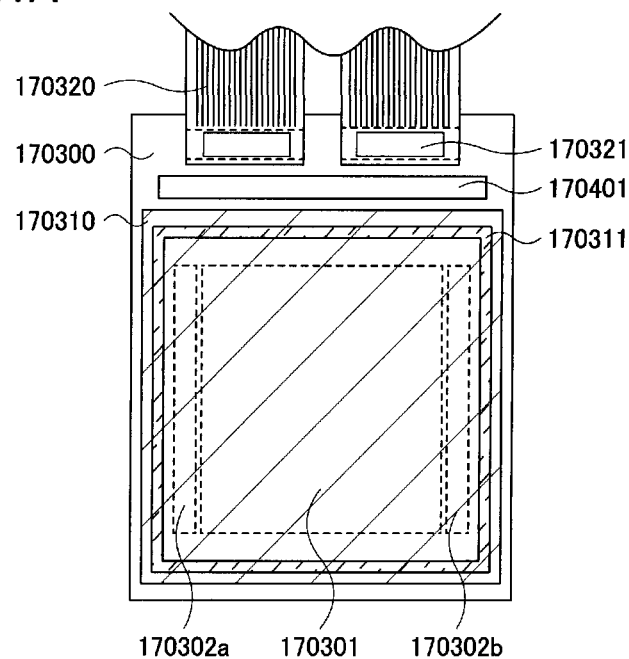
FIGS. 41A and 41B each illustrate a structure of a peripheral circuit of a display device according to the invention.

For example, as shown in FIG. 41A, an IC chip 170401 instead of the signal line driver circuit can be mounted on the substrate 170300 by a COG method. In this case, increase of power consumption can be prevented by mounting of the IC chip 170401 instead of the signal line driver circuit on the substrate 170300 by a COG method. This is because the drive frequency of the signal line driver circuit is high and thus power consumption is increased. Since the IC chip 170401 can be examined before it is mounted on the substrate 170300, yield of a display device can be improved. moreover, reliability can be improved. Since the drive frequency of the scan line driver circuits 170302a and 170302b is low, the scan line driver circuits 170302a and 170302b can be easily formed using amorphous silicon or microcrystalline silicon for a semiconductor layer of a transistor. Accordingly, a display device can be formed using a large substrate. Note that portions which are common to those in the structure of FIG. 40 are denoted by common reference numerals, and the description thereof is omitted.

Figure 41B:
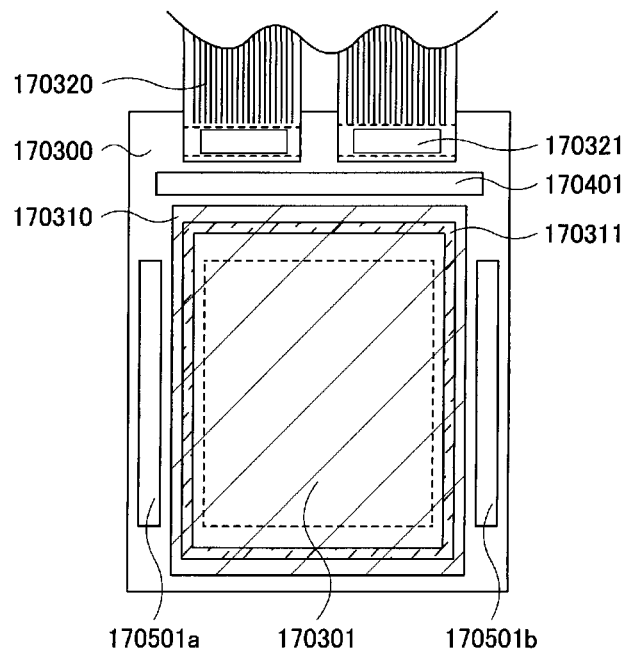

As another example, as shown in FIG. 41B, the IC chip 170401 instead of the signal line driver circuit may be mounted on the substrate 170300 by a COG method, an IC chip 170501a instead of the scan line driver circuit 170302a may be mounted on the substrate 170300 by a COG method, and an IC chip 170501b instead of the scan line driver circuit 170302b may be mounted on the substrate 170300 by a COG method. In this case, since the IC chips 170401, 170501a, and 170501b can be examined before they are mounted on the substrate 170300, yield of a display device can be improved. Moreover, reliability can be improved. It is easy to use amorphous silicon or microcrystalline silicon for a semiconductor layer of a transistor to be formed over the substrate 170300. Accordingly, a display device can be formed using a large substrate. Note that portions which are common to those in the structure of FIG. 40 are denoted by common reference numerals, and the description thereof is omitted.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 8

In this embodiment mode, an operation of a display device is described.

Figure 42:
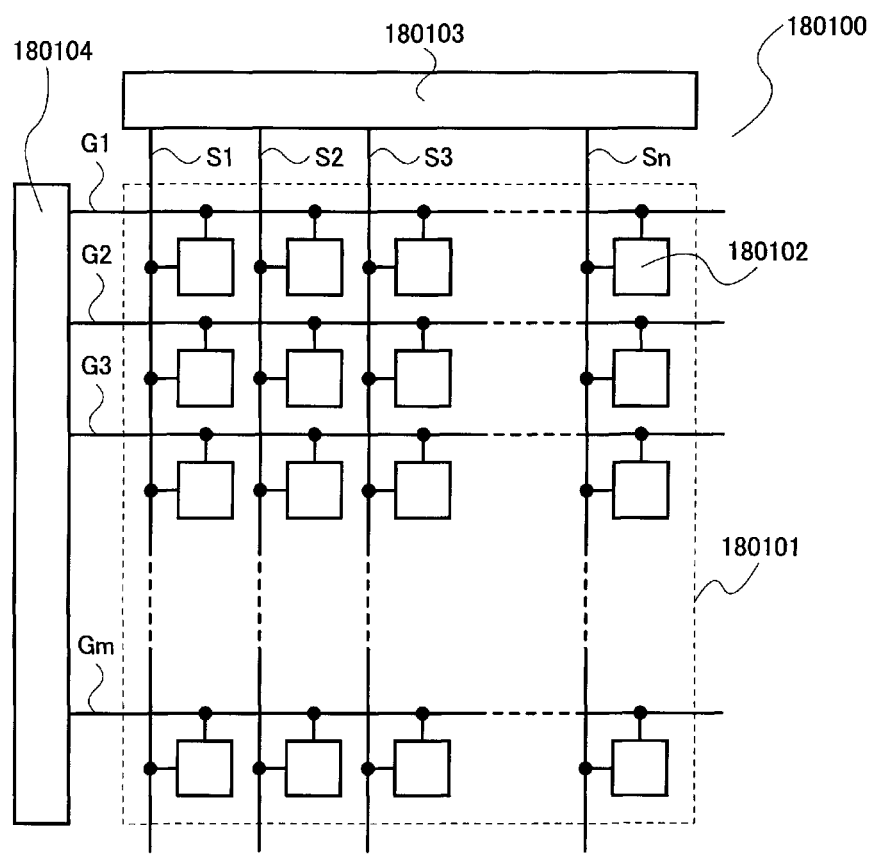
FIG. 42 illustrates a circuit structure of a display device according to the invention.

FIG. 42 shows a structure example of a display device.

A display device 180100 includes a pixel portion 180101, a signal line driver circuit 180103, and a scan line driver circuit 180104. In the pixel portion 180101, a plurality of signal lines S1 to Sn extend from the signal line driver circuit 180103 in a column direction. In the pixel portion 180101, a plurality of scan lines G1 to Gm extend from the scan line driver circuit 180104 in a row direction. Pixels 180102 are arranged in matrix at each intersection of the plurality of signal lines S1 to Sn and the plurality of scan lines G1 to Gm.

The signal line driver circuit 180103 has a function of outputting a signal to each of the signal lines S1 to Sn. This signal may be referred to as a video signal. The scan line driver circuit 180104 has a function of outputting a signal to each of the scan lines G1 to Gm. This signal may be referred to as a scan signal.

The pixel 180102 includes at least a switching element connected to the signal line. On/off of the switching element is controlled by a potential of the scan line (a scan signal). When the switching element is turned on, the pixel 180102 is selected. On the other hand, when the switching element is turned off, the pixel 180102 is not selected.

When the pixel 180102 is selected (a selection state), a video signal is input to the pixel 180102 from the signal line. A state (e.g., luminance, transmittance, or voltage of a storage capacitor) of the pixel 180102 is changed in accordance with the video signal input thereto.

When the pixel 180102 is not selected (a non-selection state), the video signal is not input to the pixel 180102. Note that the pixel 180102 holds a potential corresponding to the video signal which is input when selected; thus, the pixel 180102 maintains the state (e.g., luminance, transmittance, or voltage of a storage capacitor) in accordance with the video signal.

Note that a structure of the display device is not limited to that shown in FIG. 42. For example, an additional wiring (such as a scan line, a signal line, a power supply line, a capacitor line, or a common line) may be added in accordance with the structure of the pixel 180102. As another example, a circuit having various functions may be added.

Figure 43:
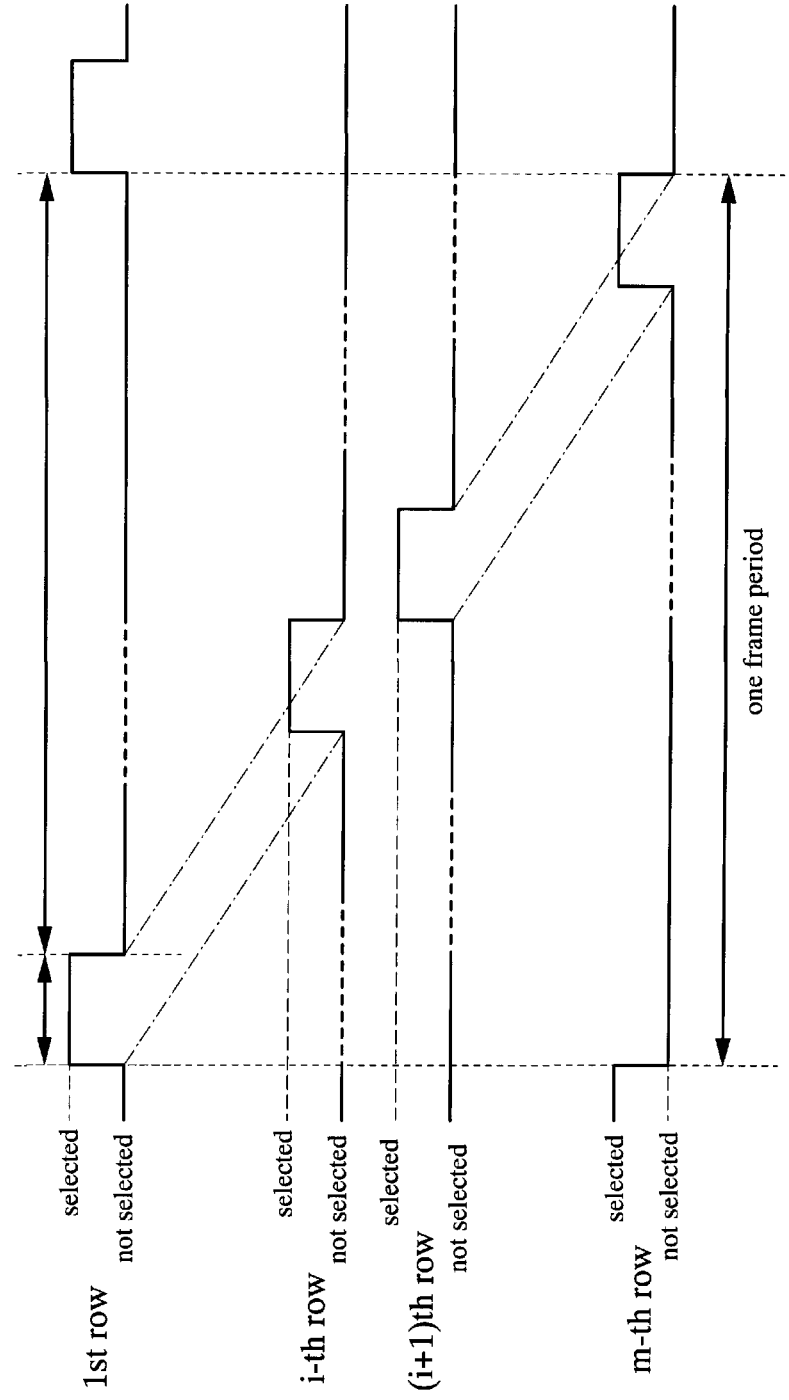
FIG. 43 is a timing chart of a display device according to the invention.

FIG. 43 shows an example of a timing chart for describing an operation of a display device.

The timing chart of FIG. 43 shows one frame period corresponding to a period when an image of one screen is displayed. One frame period is not particularly limited, but is preferably 1/60 second or less so that a viewer does not perceive a flicker.

The timing chart of FIG. 43 shows timing of selecting the scan line G1 in the first row, the scan line G1 (one of the scan lines G1 to Gm) in the i-th row, the scan line Gi+1 in the (i+1)th row, and the scan line Gm in the m-th row.

At the same time as the scan line is selected, the pixel 180102 connected to the scan line is also selected. For example, when the scan line Gi in the i-th row is selected, the pixel 180102 connected to the scan line Gi in the i-th row is also selected.

The scan lines G1 to Gm are sequentially selected (hereinafter also referred to as scanned) from the scan line G1 in the first row to the scan line Gm in the m-th row. For example, while the scan line Gi in the i-th row is selected, the scan lines (G1 to Gi−1 and Gi+1 to Gm) other than the scan line Gi in the i-th row are not selected. Then, during the next period, the scan line Gi+1 in the (i+1)th row is selected. Note that a period during which one scan line is selected is referred to as one gate selection period.

Accordingly, when a scan line in a certain row is selected, video signals from the signal lines S1 to Sn are input to a plurality of pixels 180102 connected to the scan line, respectively. For example, while the scan line Gi in the i-th row is selected, given video signals are input from the signal lines S1 to Sn to the plurality of pixels 180102 connected to the scan line Gi in the i-th row, respectively. Thus, each of the plurality of pixels 180102 can be controlled individually by the scan signal and the video signal.

Figure 44:
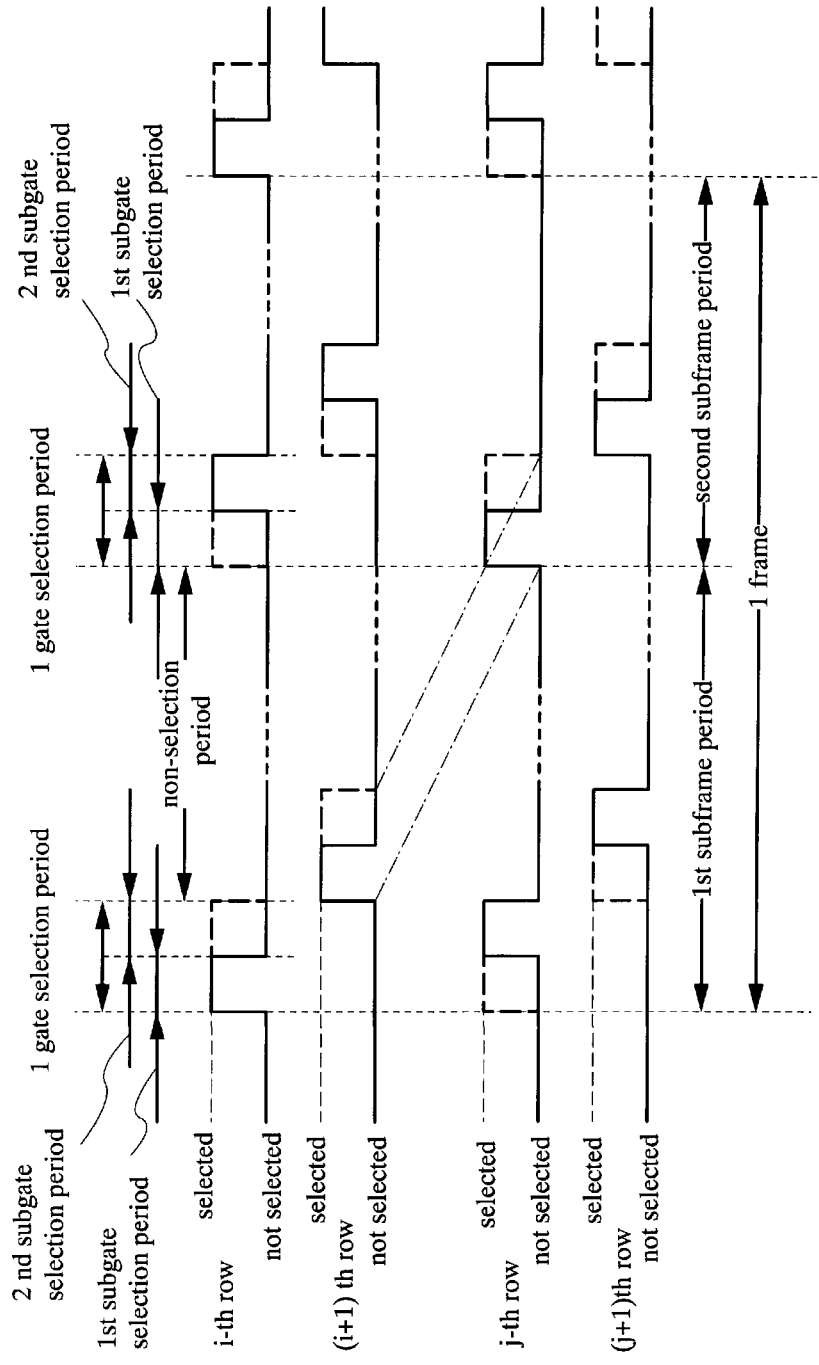
FIG. 44 is a timing chart of a display device according to the invention.

Next, the case where one gate selection period is divided into a plurality of subgate selection periods is described. FIG. 44 is a timing chart in the case where one gate selection period is divided into two subgate selection periods (a first subgate selection period and a second subgate selection period).

Note that one gate selection period may be divided into three or more subgate selection periods.

The timing chart of FIG. 44 shows one frame period corresponding to a period when an image of one screen is displayed. One frame period is not particularly limited, but is preferably 1/60 second or less so that a viewer does not perceive a flicker.

Note that one frame is divided into two subframes (a first subframe and a second subframe).

The timing chart of FIG. 44 shows timing of selecting the scan line Gi in the i-th row, the scan line Gi+1 in the (i+1)th row, the scan line Gj (one of the scan lines Gi+1 to Gm) in the j-th row, and the scan line Gj+1 (one of the scan lines Gi+1 to Gm) in the (j+1)th row.

At the same time as the scan line is selected, the pixel 180102 connected to the scan line is also selected. For example, when the scan line Gi in the i-th row is selected, the pixel 180102 connected to the scan line Gi in the i-th row is also selected.

The scan lines G1 to Gm are sequentially scanned in each subgate selection period. For example, in one gate selection period, the scan line Gi in the i-th row is selected in the first subgate selection period, and the scan line Gj in the j-th row is selected in the second subgate selection period. Thus, in one gate selection period, an operation can be performed as if the scan signals of two rows are selected. At this time, different video signals are input to the signal lines S1 to Sn in the first subgate selection period and the second subgate selection period. Accordingly, different video signals can be input to a plurality of pixels 180102 connected to the i-th row and a plurality of pixels 180102 connected to the j-th row.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 9

In this embodiment mode, a peripheral portion of a liquid crystal panel is described.

Figure 45:
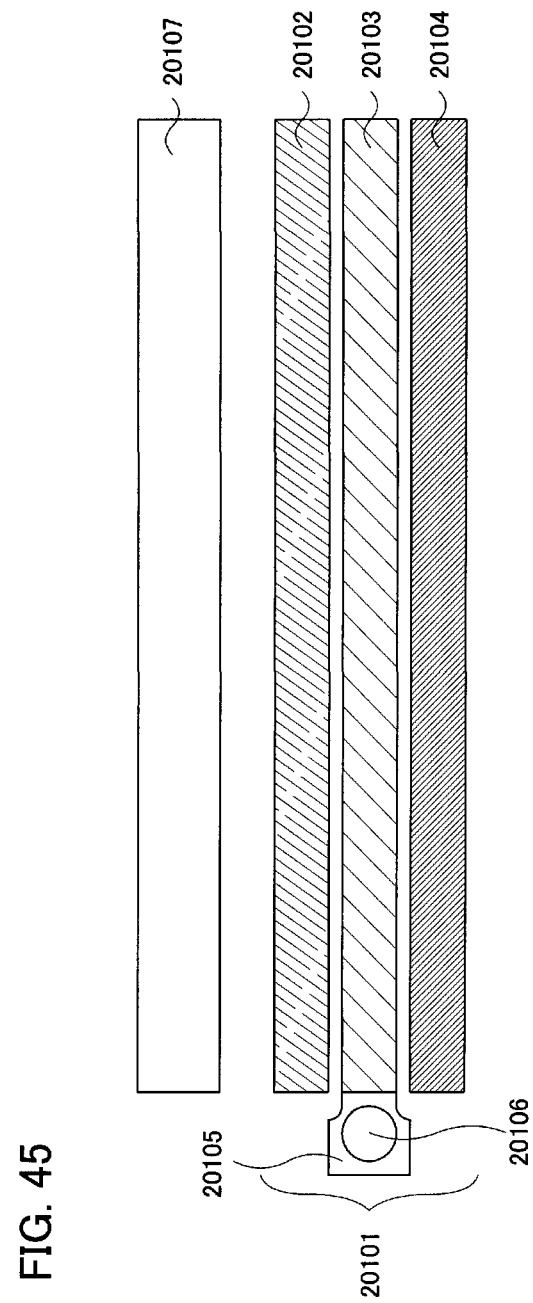
FIG. 45 is a cross-sectional view of a display device according to the invention.

FIG. 45 shows an example of a liquid crystal display device including a so-called edge-light type backlight unit 20101 and a liquid crystal panel 20107. An edge-light type corresponds to a type in which a light source is provided at an end of a backlight unit and fluorescence of the light source is emitted from the entire light-emitting surface. The edge-light type backlight unit is thin and can save power.

The backlight unit 20101 includes a diffusion plate 20102, a light guide plate 20103, a reflection plate 20104, a lamp reflector 20105, and a light source 20106.

The light source 20106 has a function of emitting light as necessary. For example, as the light source 20106, a cold cathode fluorescent lamp, a hot cathode fluorescent lamp, a light-emitting diode, an inorganic EL element, an organic EL element, or the like is used. The lamp reflector 20105 has a function of efficiently guiding fluorescence from the light source 20106 to the light guide plate 20103. The light guide plate 20103 has a function of guiding light to the entire surface by total reflection of the fluorescence. The diffusion plate 20102 has a function of reducing variations in brightness. The reflection plate 20104 has a function of reflecting light which is leaked from the light guide plate 20103 downward (a direction which is opposite to the liquid crystal panel 20107) to be reused.

Note that a control circuit for controlling luminance of the light source 20106 is connected to the backlight unit 20101. By using this control circuit, the luminance of the light source 20106 can be controlled.

FIGS. 46A to 46D are views each showing a detailed structure of the edge-light type backlight unit. Note that description of a diffusion plate, a light guide plate, a reflection plate, and the like is omitted.

Figure 46A:
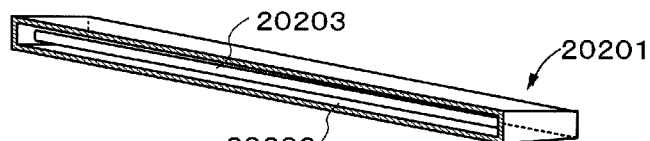
FIGS. 46A to 46D each illustrate a peripheral component of a display device according to the invention.

A backlight unit 20201 shown in FIG. 46A has a structure in which a cold cathode fluorescent lamp 20203 is used as a light source. In addition, a lamp reflector 20202 is provided to efficiently reflect light from the cold cathode fluorescent lamp 20203. Such a structure is often used for a large display device because luminance of light obtained from the cold cathode fluorescent lamp is high.

Figure 46B:
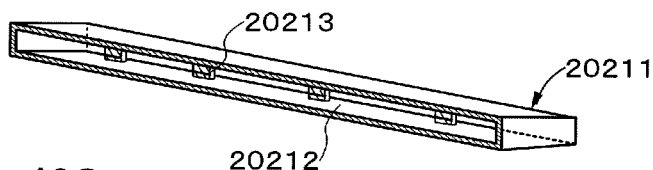

A backlight unit 20211 shown in FIG. 46B has a structure in which light-emitting diodes (LEDs) 20213 are used as light sources. For example, the light-emitting diodes (LEDs) 20213 which emit white light are provided at a predetermined interval. In addition, a lamp reflector 20212 is provided to efficiently reflect light from the light-emitting diodes (LEDs) 20213.

Since luminance of light-emitting diodes is high, a structure using light-emitting diodes is suitable for a large display device. Since light-emitting diodes are superior in color reproductivity, an image which is closer to the real object can be displayed. Since chips of the light-emitting diodes are small, the layout area can be reduced. Accordingly, a frame of a display device can be narrowed.

Note that in the case where light-emitting diodes are mounted on a large display device, the light-emitting diodes can be provided on a back side of the substrate. The light-emitting diodes of R, G, and B are sequentially provided at a predetermined interval. By providing the light-emitting diodes, color reproductivity can be improved.

Figure 46C:
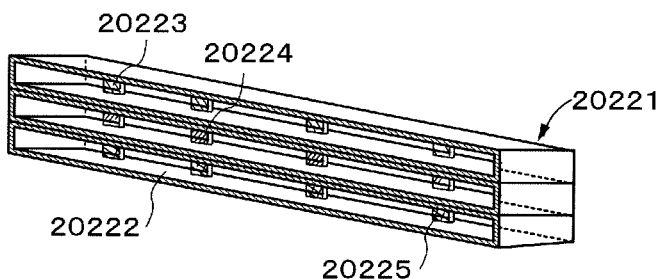

A backlight unit 20221 shown in FIG. 46C has a structure in which light-emitting diodes (LEDs) 20223, light-emitting diodes (LEDs) 20224, and light-emitting diodes (LEDs) 20225 of R, G, and B are used as light sources. The light-emitting diodes (LEDs) 20223, the light-emitting diodes (LEDs) 20224, and the light-emitting diodes (LEDs) 20225 of R, G, and B are each provided at a predetermined interval. By using the light-emitting diodes (LEDs) 20223, the light-emitting diodes (LEDs) 20224, and the light-emitting diodes (LEDs) 20225 of R, G, and B, color reproductivity can be improved. In addition, a lamp reflector 20222 is provided to efficiently reflect light from the light-emitting diodes.

Since luminance of light-emitting diodes is high, a structure using light-emitting diodes is suitable for a large display device. Since light-emitting diodes are superior in color reproductivity, an image which is closer to the real object can be displayed. Since chips of the LEDs are small, the layout area can be reduced. Accordingly, a frame of a display device can be narrowed.

By sequentially making the light-emitting diodes of R, G and B emit light in accordance with time, color display can be performed. This is a so-called field sequential mode.

Note that a light-emitting diode which emits white light can be combined with the light-emitting diodes (LEDs) 20223, the light-emitting diodes (LEDs) 20224, and the light-emitting diodes (LEDs) 20225 of R, G and B.

Note that in the case where light-emitting diodes are mounted on a large display device, the light-emitting diodes can be provided on a back side of the substrate. The light-emitting diodes of R, G and B are sequentially provided at a predetermined interval. By providing the light-emitting diodes, color reproductivity can be improved.

Figure 46D:
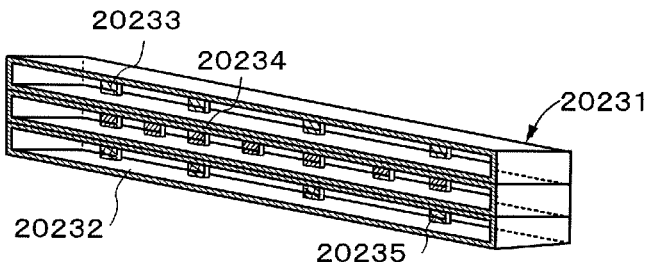

A backlight unit 20231 shown in FIG. 46D has a structure in which light-emitting diodes (LEDs) 20233, light-emitting diodes (LEDs) 20234, and light-emitting diodes (LEDs) 20235 of R, G and B are used as light sources. For example, among the light-emitting diodes (LEDs) 20233, the light-emitting diodes (LEDs) 20234, and the light-emitting diodes (LEDs) 20235 of R, Q and B, a plurality of the light-emitting diodes of a color with low emission intensity (e.g., green) are provided. By using the light-emitting diodes (LEDs) 20233, the light-emitting diodes (LEDs) 20234, and the light-emitting diodes (LEDs) 20235 of R, Q and B, color reproductivity can be improved. In addition, a lamp reflector 20232 is provided to efficiently reflect light from the light-emitting diodes.

Since luminance of light-emitting diodes is high, a structure using light-emitting diodes is suitable for a large display device. Since light-emitting diodes are superior in color reproductivity, an image which is closer to the real object can be displayed. Since chips of the light-emitting diodes are small, the layout area can be reduced. Accordingly, a frame of a display device can be narrowed.

By sequentially making the light-emitting diodes of R, G, and B emit light in accordance with time, color display can be performed. This is a so-called field sequential mode.

Note that a light-emitting diode which emits white light can be combined with the light-emitting diodes (LEDs)

20233, the light-emitting diodes (LEDs) 20234, and the light-emitting diodes (LEDs) 20235 of R, G, and B.

Note that in the case where light-emitting diodes are mounted on a large display device, the light-emitting diodes can be provided on a back side of the substrate. The light-emitting diodes of R, G, and B are sequentially provided at a predetermined interval. By providing the light-emitting diodes, color reproductivity can be improved.

FIG. 49A shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20500 includes a diffusion plate 20501, a light-shielding plate 20502, a lamp reflector 20503, and a light source 20504.

Light emitted from the light source 20504 is collected on one of surfaces of the backlight unit 20500 by the lamp reflector 20503. That is, the backlight unit 20500 has a surface through which light is strongly emitted and a surface through which less light is emitted. At this time, when the liquid crystal panel 20505 is provided on the side of the surface of the backlight unit 20500, through which light is strongly emitted, the light emitted from the light source 20504 can be efficiently emitted to a liquid crystal panel 20505.

The light source 20504 has a function of emitting light as necessary. For example, as the light source 20504, a cold cathode fluorescent lamp, a hot cathode fluorescent lamp, a light-emitting diode, an inorganic EL element, an organic EL element, or the like is used. The lamp reflector 20503 has a function of efficiently guiding fluorescence from the light source 20504 to the diffusion plate 20501 and the light-shielding plate 20502. The light-shielding plate 20502 has a function of reducing variations in luminance by shielding much light as light becomes more intense in accordance with provision of the light source 20504. The diffusion plate 20501 also has a function of reducing variations in luminance.

A control circuit for controlling luminance of the light source 20504 is connected to the backlight unit 20500. By using this control circuit, the luminance of the light source 20504 can be controlled.

FIG. 49B shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20510 includes a diffusion plate 20511; a light-shielding plate 20512; a lamp reflector 20513; and a light source (R) 20514a, a light source (G) 20514b, and a light source (B) 20514c of R, G; and B.

Light emitted from each of the light source (R) 20514a, the light source (G) 20514b, and the light source (B) 20514c is collected on one of surfaces of the backlight unit 20510 by the lamp reflector 20513. That is, the backlight unit 20510 has a surface through which light is strongly emitted and a surface through which less light is emitted. At this time, when a liquid crystal display panel 20515 is provided on the surface side of the backlight unit 20510, through which light is strongly emitted, the light emitted from each of the light source (R) 20514a, the light source (G) 20514b, and the light source (B) 20514c can be sufficiently emitted to the liquid crystal display panel 20515.

Each of the light source (R) 20514a, the light source (G) 20514b, and the light source (B) 20514c of R, G, and B has a function of emitting light as necessary. For example, as each of the light source (R) 20514a, the light source (G) 20514b, and the light source (B) 20514c, a cold cathode fluorescent lamp, a hot cathode fluorescent lamp, a light-emitting diode, an inorganic EL element, an organic EL element, or the like is used. The lamp reflector 20513 has a function of efficiently guiding fluorescence from the light sources 20514a to 20514c to the diffusion plate 20511 and the light-shielding plate 20512. The light-shielding plate 20512 has a function of reducing variations in brightness or luminance by shielding much light as light becomes more intense in accordance with provision of the light sources 20514a to 20514c. The diffusion plate 20511 also has a function of reducing variations in brightness or luminance.

A control circuit for controlling luminance of the light source (R) 20514a, the light source (G) 20514b, and the light source (B) 20514c of R, G, and B is connected to the backlight unit 20510. By using this control circuit, the luminance of the light source (R) 20514a, the light source (G) 20514b, and the light source (B) 20514c of R, G, and B can be controlled.

Figure 47:
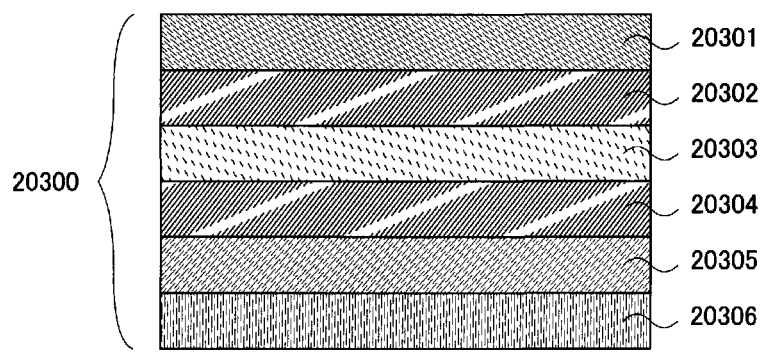
FIG. 47 is a cross-sectional view of a display device according to the invention.

FIG. 47 shows an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a mold release film 20306.

The PVA polarizing film 20303 has a function of generating light in only a certain vibration direction (linear polarized light). Specifically, the PVA polarizing film 20303 includes molecules (polarizers) in which lengthwise electron density and widthwise electron density are greatly different from each other. The PVA polarizing film 20303 can generate linear polarized light by aligning directions of the molecules in which lengthwise electron density and widthwise electron density are greatly different from each other.

For example, a high molecular film of poly vinyl alcohol is doped with an iodine compound and a PVA film is pulled in a certain direction, so that a film in which iodine molecules are aligned in a certain direction can be obtained as the PVA polarizing film 20303. Then, light which is parallel to a major axis of the iodine molecule is absorbed by the iodine molecule. Note that a dichroic dye may be used instead of iodine for high durability use and high heat resistance use. Note that it is preferable that the dye be used for a liquid crystal display device which needs to have durability and heat resistance, such as an in-car LCD or an LCD for a projector.

When the PVA polarizing film 20303 is sandwiched between films to serve as base materials (the substrate film 20302 and the substrate film 20304), reliability can be improved. Note that the PVA polarizing film 20303 may be sandwiched between triacetylcellulose (TAC) films with high transparency and high durability. Note that each of the substrate films and the TAC films function as protective films of polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The mold release film 20306 (a separate film) is provided for the adhesive layer 20305.

The other of the substrates films (the substrate film 20302) is provided with the protective film 20301.

A hard coating scattering layer (an anti-glare layer) may be provided on a surface of the polarizing film 20300. Since the surface of the hard coating scattering layer has minute unevenness formed by AG treatment and has an anti-glare function which scatters external light, reflection of external light in the liquid crystal panel can be prevented. Surface reflection can also be prevented.

Note that a treatment in which plurality of optical thin film layers having different refractive indexes are layered (also referred to as anti-reflection treatment or AR treatment) may be performed on the surface of the polarizing film 20300. The plurality of layered optical thin film layers having different refractive indexes can reduce reflectivity on the surface by an interference effect of light.

Figure 48A:
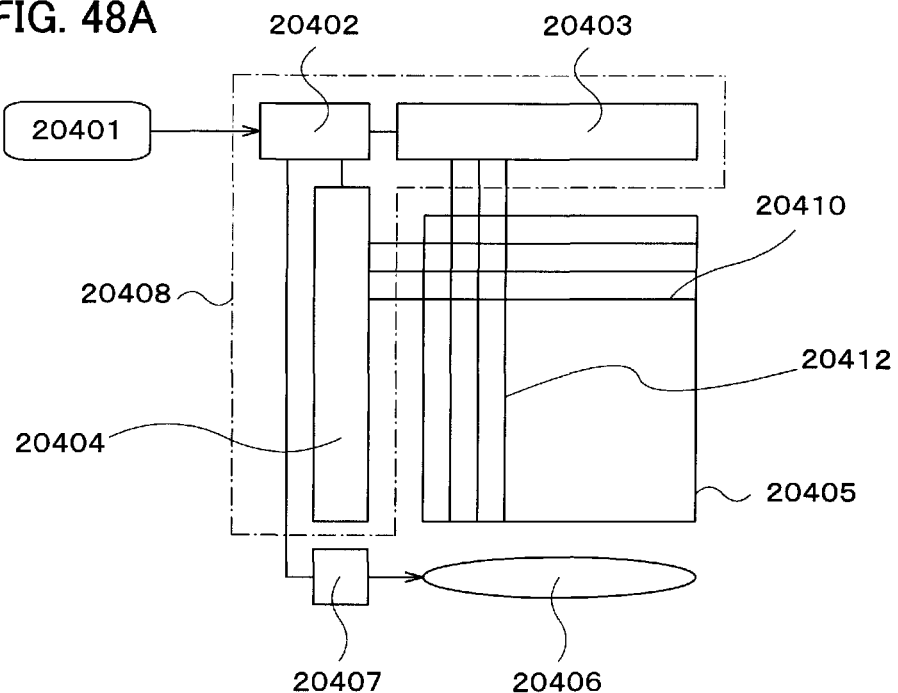
FIGS. 48A to 48C each are a block diagram of a display device according to the invention.
Figure 48B:
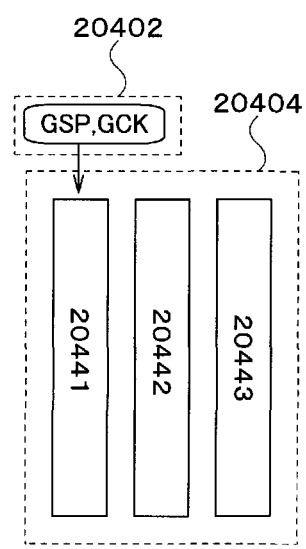
Figure 48C:
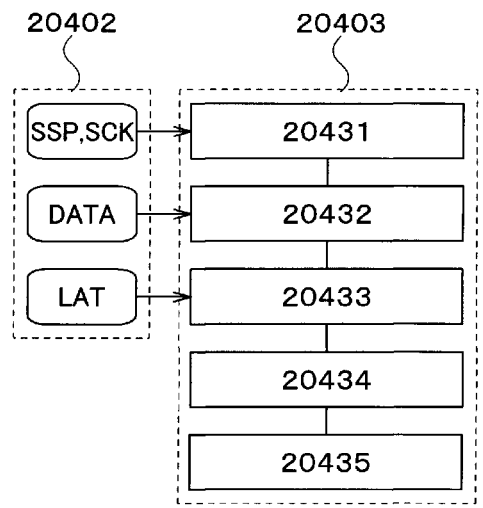

FIGS. 48A to 48C each show an example of a system block of the liquid crystal display device.

In a pixel portion 20405, signal lines 20412 which are extended from a signal line driver circuit 20403 are arranged. Moreover, in the pixel portion 20405, scan lines 20410 which are extended from a scan line driver circuit 20404 are also arranged. In addition, a plurality of pixels are arranged in matrix in cross regions of the signal lines 20412 and the scan lines 20410. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active type. Note that the invention is not limited to such an active type and a structure of a passive type may be used. Since the passive type does not have a switching element in each pixel, a process is simple.

A driver circuit portion 20408 includes a control circuit 20402, the signal line driver circuit 20403, and the scan line driver circuit 20404. An image signal 20401 is input to the control circuit 20402. The signal line driver circuit 20403 and the scan line driver circuit 20404 are controlled by the control circuit 20402 in accordance with this image signal 20401. That is, the control circuit 20402 inputs a control signal to each of the signal line driver circuit 20403 and the scan line driver circuit 20404. Then, in accordance with this control signal, the signal line driver circuit 20403 inputs a video signal to each of the signal lines 20412 and the scan line driver circuit 20404 inputs a scan signal to each of the scan lines 20410. Then, the switching element included in the pixel is selected in accordance with the scan signal and the video signal is input to a pixel electrode of the pixel.

Note that the control circuit 20402 also controls a power source 20407 in accordance with the image signal 20401. The power source 20407 includes a unit for supplying power to a lighting unit 20406. As the lighting unit 20406, an edge-light type backlight unit or a direct-type backlight unit can be used. Note that a front light may be used as the lighting unit 20406. A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

As shown in FIG. 48B, the scan line driver circuit 20404 includes a shift register 20441, a level shifter 20442, and a circuit functioning as a buffer 20443. A signal such as a gate start pulse (GSP) or a gate clock signal (GCK) is input to the shift register 20441.

As shown in FIG. 48C, the signal line driver circuit 20403 includes a shift register 20431, a first latch 20432, a second latch 20433, a level shifter 20434, and a circuit functioning as a buffer 20435. The circuit functioning as the buffer 20435 corresponds to a circuit which has a function of amplifying a weak signal and includes an operational amplifier or the like.

A signal such as a source start pulse (SSP) or a source clock signal (SCK) is input to the level shifter 20434, and data (DATA) such as a video signal is input to the first latch 20432. Latch (LAT) signals can be temporally held in the second latch 20433 and are simultaneously input to the pixel portion 20405. This is referred to as line sequential driving. Therefore, when a pixel is used in which not line sequential driving but dot sequential driving is performed, the second latch can be omitted.

Note that in this embodiment mode, a known liquid crystal panel can be used for the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, a counter electrode, an alignment film, or the like is provided on the other of the substrates. A polarizing plate or a retardation plate may be provided on the surface opposite to a top surface of the other of the substrates. The color filter and the black matrix may be formed over the top surface of the one of the substrates. Note that three-dimensional display can be performed by providing a slit (a grid) on the top surface side of the one of the substrates or the surface opposite to the top surface side of the one of the substrates.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 10

In this embodiment mode, a pixel structure and an operation of a pixel which can be applied to a liquid crystal display device are described.

In this embodiment mode, as an operation mode of a liquid crystal element, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Figure 50A:
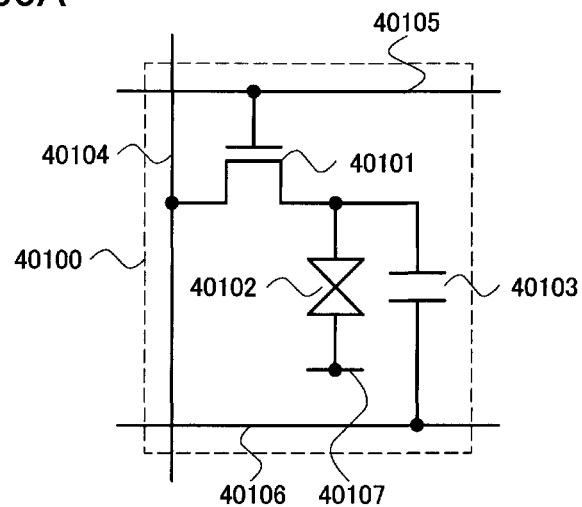
FIGS. 50A and 50B each illustrate a circuit structure of a display device according to the invention.

FIG. 50A shows an example of a pixel structure which can be applied to the liquid crystal display device.

A pixel 40100 includes a transistor 40101, a liquid crystal element 40102, and a capacitor 40103. A gate of the transistor 40101 is connected to a wiring 40105. A first terminal of the transistor 40101 is connected to a wiring 40104. A second terminal of the transistor 40101 is connected to a first electrode of the liquid crystal element 40102 and a first electrode of the capacitor 40103. A second electrode of the liquid crystal element 40102 corresponds to a counter electrode 40107. A second electrode of the capacitor 40103 is connected to a wiring 40106.

The wiring 40104 functions as a signal line. The wiring 40105 functions as a scan line. The wiring 40106 functions as a capacitor line. The transistor 40101 functions as a switch. The capacitor 40103 functions as a storage capacitor.

It is acceptable as long as the transistor 40101 functions as a switch, and the transistor 40101 may be either a p-channel transistor or an n-channel transistor.

A video signal is input to the wiring 40104. A scan signal is input to the wiring 40105. A constant potential is supplied to the wiring 40106. Note that the scan signal is an H-level or L-level digital voltage signal. In the case where the transistor 40101 is an n-channel transistor, an H level of the scan signal is a potential which can turn on the transistor 40101 and an L level of the scan signal is a potential which can turn off the transistor 40101. Alternatively, in the case where the transistor 40101 is a p-channel transistor, the H level of the scan signal is a potential which can turn off the transistor 40101 and the L level of the scan signal is a potential which can turn on the transistor 40101. Note that the video signal is analog voltage. However, the invention is not limited thereto, and the video signal may be digital voltage. Alternatively, the video signal may be current. The current of the video signal may be either analog current or digital current. The video signal has a potential which is lower than the H level of the scan signal and higher than the L level of the scan signal. Note that the constant potential supplied to the wiring 40106 is preferably equal to a potential of the counter electrode 40107.

Operations of the pixel 40100 are described by dividing the whole operations into the case where the transistor 40101 is on and the case where the transistor 40101 is off.

In the case where the transistor 40101 is on, the wiring 40104 is electrically connected to the first electrode (a pixel electrode) of the liquid crystal element 40102 and the first electrode of the capacitor 40103. Therefore, the video signal is input to the first electrode (the pixel electrode) of the liquid crystal element 40102 and the first electrode of the capacitor 40103 from the wiring 40104 through the transistor 40101. In addition, the capacitor 40103 holds a potential difference between a potential of the video signal and the potential supplied to the wiring 40106.

In the case where the transistor 40101 is off, the wiring 40104 is not electrically connected to the first electrode (the pixel electrode) of the liquid crystal element 40102 and the first electrode of the capacitor 40103. Therefore, each of the first electrode of the liquid crystal element 40102 and the first electrode of the capacitor 40103 is set in a floating state. Since the capacitor 40103 holds the potential difference between the potential of the video signal and the potential supplied to the wiring 40106, each of the first electrode of the liquid crystal element 40102 and the first electrode of the capacitor 40103 holds a potential which is the same as (corresponds to) the video signal. Note that the liquid crystal element 40102 has transmissivity in accordance with the video signal.

Figure 50B:
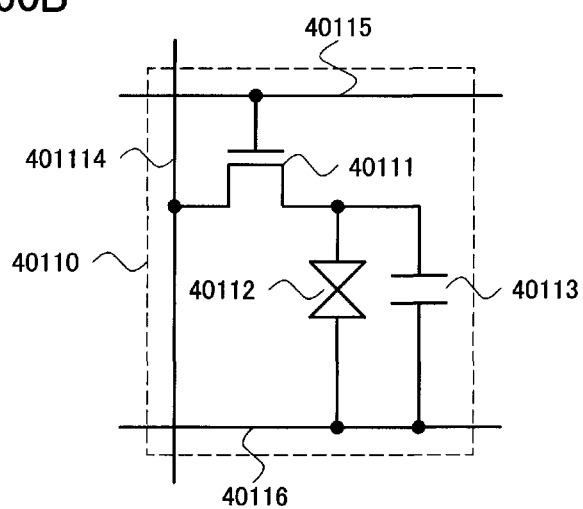

FIG. 50B shows an example of a pixel structure which can be applied to the liquid crystal display device. In particular, FIG. 50B shows an example of a pixel structure which can be applied to a liquid crystal display device suitable for a horizontal electric field mode (including an IPS mode and an FFS mode).

A pixel 40110 includes a transistor 40111, a liquid crystal element 40112, and a capacitor 40113. A gate of the transistor 40111 is connected to a wiring 40115. A first terminal of the transistor 40111 is connected to a wiring 40114. A second terminal of the transistor 40111 is connected to a first electrode of the liquid crystal element 40112 and a first electrode of the capacitor 40113. A second electrode of the liquid crystal element 40112 is connected to a wiring 40116. A second electrode of the capacitor 40103 is connected to the wiring 40116.

The wiring 40114 functions as a signal line. The wiring 40115 functions as a scan line. The wiring 40116 functions as a capacitor line. The transistor 40111 functions as a switch. The capacitor 40113 functions as a storage capacitor.

It is acceptable as long as the transistor 40111 functions as a switch, and the transistor 40111 may be a p-channel transistor or an n-channel transistor.

A video signal is input to the wiring 40114. A scan signal is input to the wiring 40115. A constant potential is supplied to the wiring 40116. Note that the scan signal is an H-level or L-level digital voltage signal. In the case where the transistor 40111 is an n-channel transistor, an H level of the scan signal is a potential which can turn on the transistor 40111 and an L level of the scan signal is a potential which can turn off the transistor 40111. Alternatively, in the case where the transistor 40111 is a p-channel transistor, the H level of the scan signal is a potential which can turn off the transistor 40111 and the L level of the scan signal is a potential which can turn on the transistor 40111. Note that the video signal is analog voltage. However, the invention is not limited thereto, and the video signal may be digital voltage. Alternatively, the video signal may be current. The current of the video signal may be either analog current or digital current. The video signal has a potential which is lower than the H level of the scan signal and higher than the L level of the scan signal.

Operations of the pixel 40110 are described by dividing the whole operations into the case where the transistor 40111 is on and the case where the transistor 40111 is off.

In the case where the transistor 40111 is on, the wiring 40114 is electrically connected to the first electrode (a pixel electrode) of the liquid crystal element 40112 and the first electrode of the capacitor 40113. Therefore, the video signal is input to the first electrode (the pixel electrode) of the liquid crystal element 40112 and the first electrode of the capacitor 40113 from the wiring 40114 through the transistor 40111. In addition, the capacitor 40113 holds a potential difference between a potential of the video signal and the potential supplied to the wiring 40116.

In the case where the transistor 40111 is off, the wiring 40114 is not electrically connected to the first electrode (the pixel electrode) of the liquid crystal element 40112 and the first electrode of the capacitor 40113. Therefore, each of the first electrode of the liquid crystal element 40112 and the first electrode of the capacitor 40113 is set in a floating state. Since the capacitor 40113 holds the potential difference between the potential of the video signal and the potential supplied to the wiring 40116, each of the first electrode of the liquid crystal element 40112 and the first electrode of the capacitor 40113 holds a potential which is the same as (corresponds to)

the video signal. Note that the liquid crystal element 40112 has transmissivity in accordance with the video signal.

Figure 51:
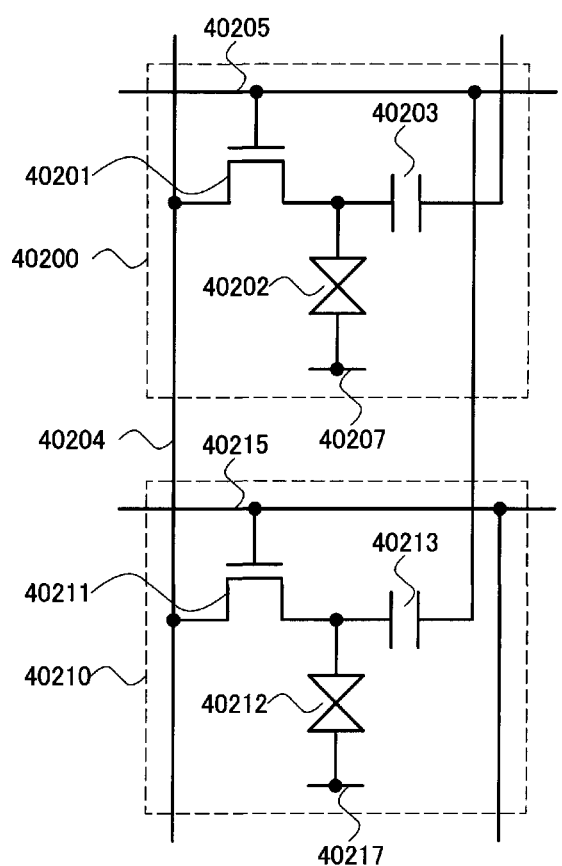
FIG. 51 illustrates a circuit structure of a display device according to the invention.

FIG. 51 shows an example of a pixel structure which can be applied to the liquid crystal display device. In particular, FIG. 51 shows an example of a pixel structure in which an aperture ratio of a pixel can be increased by reducing the number of wirings.

FIG. 51 shows two pixels which are provided in the same column direction (a pixel 40200 and a pixel 40210). For example, when the pixel 40200 is provided in an N-th row, the pixel 40210 is provided in an (N+1)th row.

The pixel 40200 includes a transistor 40201, a liquid crystal element 40202, and a capacitor 40203. A gate of the transistor 40201 is connected to a wiring 40205. A first terminal of the transistor 40201 is connected to a wiring 40204. A second terminal of the transistor 40201 is connected to a first electrode of the liquid crystal element 40202 and a first electrode of the capacitor 40203. A second electrode of the liquid crystal element 40202 corresponds to a counter electrode 40207. A second electrode of the capacitor 40203 is connected to a wiring which is the same as a wiring connected to a gate of a transistor of the previous row.

The pixel 40210 includes a transistor 40211, a liquid crystal element 40212, and a capacitor 40213. A gate of the transistor 40211 is connected to a wiring 40215. A first terminal of the transistor 40211 is connected to the wiring 40204. A second terminal of the transistor 40211 is connected to a first electrode of the liquid crystal element 40212 and a first electrode of the capacitor 40213. A second electrode of the liquid crystal element 40212 corresponds to a counter electrode 40217. A second electrode of the capacitor 40213 is connected to the wiring which is the same as the wiring connected to the gate of the transistor of the previous row (the wiring 40205).

The wiring 40204 functions as a signal line. The wiring 40205 functions as a scan line of the N-th row. The gate of the transistor of the previous row functions as a capacitor line of the N-th row. The transistor 40201 functions as a switch. The capacitor 40203 functions as a storage capacitor.

A wiring 40214 functions as a signal line. The wiring 40215 functions as a scan line of the (N+1)th row. The wiring 40205 functions as a capacitor line of the (N+1)th row. The transistor 40211 functions as a switch. The capacitor 40213 functions as a storage capacitor.

It is acceptable as long as each of the transistor 40201 and the transistor 40211 functions as a switch, and each of the transistor 40201 and the transistor 40211 may be either a p-channel transistor or an n-channel transistor.

A video signal is input to the wiring 40204. A scan signal (of the N-th row) is input to the wiring 40205. A scan signal (of the (N+1)th row) is input to the wiring 40215.

The scan signal is an H-level or L-level digital voltage signal. In the case where the transistor 40201 (or the transistor 40211) is an n-channel transistor, an H level of the scan signal is a potential which can turn on the transistor 40201 (or the transistor 40211) and an L level of the scan signal is a potential which can turn off the transistor 40201 (or the transistor 40211). Alternatively, in the case where the transistor 40201 (or the transistor 40211) is a p-channel transistor, the H level of the scan signal is a potential which can turn off the transistor 40201 (or the transistor 40211) and the L level of the scan signal is a potential which can turn on the transistor 40201 (or the transistor 40211). Note that the video signal is analog voltage. However, the invention is not limited thereto, and the video signal may be digital voltage. Alternatively, the video signal may be current. The current of the video signal may be either analog current or digital current. The video signal has a potential which is lower than the H level of the scan signal and higher than the L level of the scan signal.

Operations of the pixel 40200 are described by dividing the whole operations into the case where the transistor 40201 is on and the case where the transistor 40201 is off.

In the case where the transistor 40201 is on, the wiring 40204 is electrically connected to the first electrode (a pixel electrode) of the liquid crystal element 40202 and the first electrode of the capacitor 40203. Therefore, the video signal is input to the first electrode (the pixel electrode) of the liquid crystal element 40202 and the first electrode of the capacitor 40203 from the wiring 40204 through the transistor 40201. In addition, the capacitor 40203 holds a potential difference between a potential of the video signal and a potential supplied to the wiring which is the same as the wiring connected to the gate of the transistor of the previous row.

In the case where the transistor 40201 is off, the wiring 40204 is not electrically connected to the first electrode (the pixel electrode) of the liquid crystal element 40202 and the first electrode of the capacitor 40203. Therefore, each of the first electrode of the liquid crystal element 40202 and the first electrode of the capacitor 40203 is set in a floating state. Since the capacitor 40203 holds the potential difference between the potential of the video signal and the potential of the wiring which is the same as the wiring connected to the gate of the transistor of the previous row, each of the first electrode of the liquid crystal element 40202 and the first electrode of the capacitor 40203 holds a potential which is the same as (corresponds to) the video signal. Note that the liquid crystal element 40202 has transmissivity in accordance with the video signal.

Operations of the pixel 40210 are described by dividing the whole operations into the case where the transistor 40211 is on and the case where the transistor 40211 is off.

In the case where the transistor 40211 is on, the wiring 40214 is electrically connected to the first electrode (a pixel electrode) of the liquid crystal element 40212 and the first electrode of the capacitor 40213. Therefore, the video signal is input to the first electrode (the pixel electrode) of the liquid crystal element 40212 and the first electrode of the capacitor 40213 from the wiring 40214 through the transistor 40211. In addition, the capacitor 40213 holds a potential difference between a potential of the video signal and a potential supplied to a wiring which is the same as the wiring connected to the gate of the transistor of the previous row (the wiring 40205).

In the case where the transistor 40211 is off, the wiring 40204 is not electrically connected to the first electrode (the pixel electrode) of the liquid crystal element 40212 and the first electrode of the capacitor 40213. Therefore, each of the first electrode of the liquid crystal element 40212 and the first electrode of the capacitor 40213 is set in a floating state. Since the capacitor 40103 holds the potential difference between the potential of the video signal and the potential of the wiring which is the same as the wiring connected to the gate of the transistor of the previous row (the wiring 40215), each of the first electrode (the pixel electrode) of the liquid crystal element 40212 and the first electrode of the capacitor 40213 holds a potential which is the same as (corresponds to) the video signal. Note that the liquid crystal element 40212 has transmissivity in accordance with the video signal.

Figure 52:
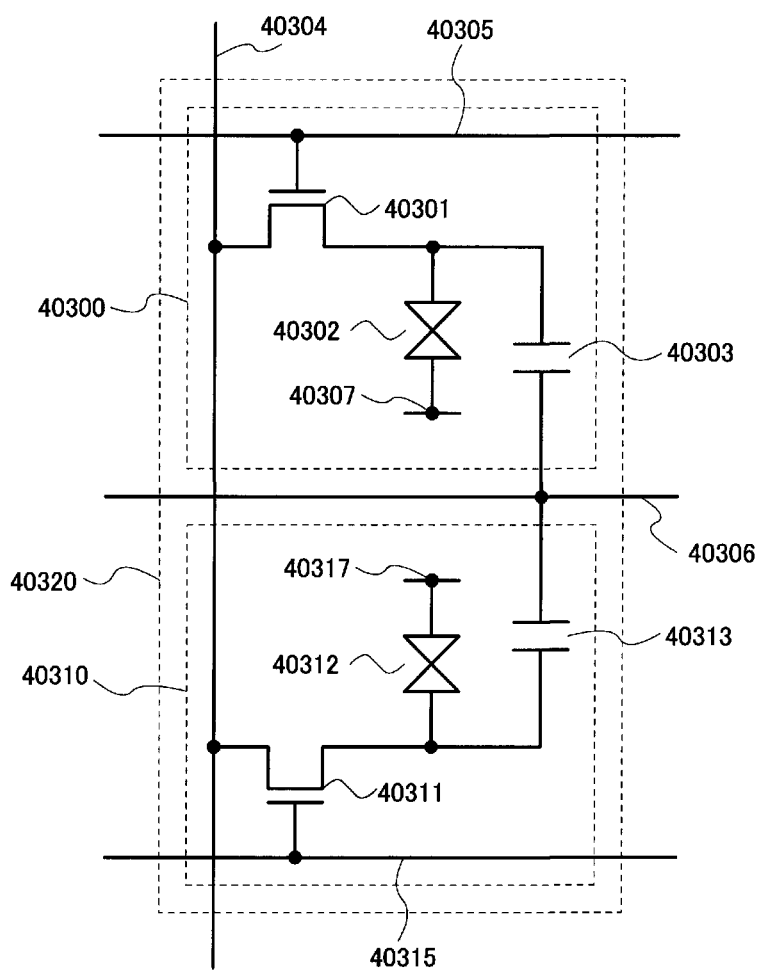
FIG. 52 illustrates a circuit structure of a display device according to the invention.

FIG. 52 shows an example of a pixel structure which can be applied to the liquid crystal display device. In particular, FIG. 52 shows an example of a pixel structure in which a viewing angle can be improved by using a subpixel.

A pixel 40320 includes a subpixel 40300 and a subpixel 40310. Although the case in which the pixel 40320 includes two subpixels is described, the pixel 40320 may include three or more subpixels.

The subpixel 40300 includes a transistor 40301, a liquid crystal element 40302, and a capacitor 40303. A gate of the transistor 40301 is connected to a wiring 40305. A first terminal of the transistor 40301 is connected to a wiring 40304. A second terminal of the transistor 40301 is connected to a first electrode of the liquid crystal element 40302 and a first electrode of the capacitor 40303. A second electrode of the liquid crystal element 40302 corresponds to a counter electrode 40307. A second electrode of the capacitor 40303 is connected to a wiring 40306.

The subpixel 40310 includes a transistor 40311, a liquid crystal element 40312, and a capacitor 40313. A gate of the transistor 40311 is connected to a wiring 40315. A first terminal of the transistor 40311 is connected to the wiring 40304. A second terminal of the transistor 40311 is connected to a first electrode of the liquid crystal element 40312 and a first electrode of the capacitor 40313. A second electrode of the liquid crystal element 40312 corresponds to a counter electrode 40317. A second electrode of the capacitor 40313 is connected to the wiring 40306.

The wiring 40304 functions as a signal line. The wiring 40305 functions as a scan line. The wiring 40315 functions as a signal line. The wiring 40306 functions as a capacitor line. Each of the transistor 40301 and the transistor 40311 functions as a switch. Each of the capacitor 40303 and the capacitor 40313 functions as a storage capacitor.

It is acceptable as long as each of the transistor 40301 and the transistor 40311 functions as a switch, and each of the transistor 40301 and the transistor 40311 may be either a p-channel transistor or an n-channel transistor.

A video signal is input to the wiring 40304. A scan signal is input to the wiring 40305. A scan signal is input to the wiring 40315. A constant potential is supplied to the wiring 40306.

The scan signal is an H-level or L-level digital voltage signal. In the case where the transistor 40301 (or the transistor 40311) is an n-channel transistor, an H level of the scan signal is a potential which can turn on the transistor 40301 (or the transistor 40311) and an L level of the scan signal is a potential which can turn off the transistor 40301 (or the transistor 40311). Alternatively, in the case where the transistor 40301 (or the transistor 40311) is a p-channel transistor, the H level of the scan signal is a potential which can turn off the transistor 40301 (or the transistor 40311) and the L level of the scan signal is a potential which can turn on the transistor 40301 (or the transistor 40311). Note that the video signal is analog voltage. However, the invention is not limited thereto, and the video signal may be digital voltage. Alternatively, the video signal may be current. The current of the video signal may be either analog current or digital current. The video signal has a potential which is lower than the H level of the scan signal and higher than the L level of the scan signal. Note that the constant potential supplied to the wiring 40306 is preferably equal to a potential of the counter electrode 40307 or a potential of the counter electrode 40307.

Operations of the pixel 40320 are described by dividing the whole operations into the case where the transistor 40301 is on and the transistor 40311 is off, the case where the transistor 40301 is off and the transistor 40311 is on, and the case where the transistor 40301 and the transistor 40311 are off.

In the case where the transistor 40301 is on and the transistor 40311 is off, the wiring 40304 is electrically connected to the first electrode (a pixel electrode) of the liquid crystal element 40302 and the first electrode of the capacitor 40303 in the subpixel 40300. Therefore, the video signal is input to the first electrode (the pixel electrode) of the liquid crystal element 40302 and the first electrode of the capacitor 40303 from the wiring 40304 through the transistor 40301. In addition, the capacitor 40303 holds a potential difference between a potential of the video signal and a potential supplied to the wiring 40306. At this time, the wiring 40304 is not electrically connected to the first electrode (the pixel electrode) of the liquid crystal element 40312 and the first electrode of the capacitor 40313 in the subpixel 40310. Therefore, the video signal is not input to the subpixel 40310.

In the case where the transistor 40301 is off and the transistor 40311 is on, the wiring 40304 is not electrically connected to the first electrode (the pixel electrode) of the liquid crystal element 40302 and the first electrode of the capacitor 40303 in the subpixel 40300. Therefore, each of the first electrode of the liquid crystal element 40302 and the first electrode of the capacitor 40303 is set in a floating state. Since the capacitor 40303 holds the potential difference between the potential of the video signal and the potential supplied to the wiring 40306, each of the first electrode of the liquid crystal element 40302 and the first electrode of the capacitor 40303 holds a potential which is the same as (corresponds to) the video signal. At this time, the wiring 40304 is electrically connected to the first electrode (the pixel electrode) of the liquid crystal element 40312 and the first electrode of the capacitor 40313 in the subpixel 40310. Therefore, the video signal is input to the first electrode (the pixel electrode) of the liquid crystal element 40312 and the first electrode of the capacitor 40313 from the wiring 40304 through the transistor 40311. In addition, the capacitor 40313 holds a potential difference between a potential of the video signal and a potential supplied to the wiring 40306.

In the case where the transistor 40301 and the transistor 40311 are off, the wiring 40304 is not electrically connected to the first electrode (the pixel electrode) of the liquid crystal element 40302 and the first electrode of the capacitor 40303 in the subpixel 40300. Therefore, each of the first electrode of the liquid crystal element 40302 and the first electrode of the capacitor 40303 is set in a floating state. Since the capacitor 40303 holds the potential difference between the potential of the video signal and the potential supplied to the wiring 40306, each of the first electrode of the liquid crystal element 40302 and the first electrode of the capacitor 40303 holds a potential which is the same as (corresponds to) the video signal. Note that the liquid crystal element 40302 has transmissivity in accordance with the video signal. At this time, the wiring 40304 is not electrically connected to the first electrode (the pixel electrode) of the liquid crystal element 40312 and the first electrode of the capacitor 40313 similarly in the subpixel 40310. Therefore, each of the first electrode of the liquid crystal element 40312 and the first electrode of the capacitor 40313 is set in a floating state. Since the capacitor 40313 holds the potential difference between the potential of the video signal and the potential of the wiring 40316, each of the first electrode of the liquid crystal element 40312 and the first electrode of the capacitor 40313 holds a potential which is the same as (corresponds to) the video signal. Note that the liquid crystal element 40312 has transmissivity in accordance with the video signal.

A video signal input to the subpixel 40300 may be a value which is different from that of a video signal input to the subpixel 40310. In this case, the viewing angle can be widened because alignment of liquid crystal molecules of the liquid crystal element 40302 and alignment of liquid crystal molecules of the liquid crystal element 40312 can be varied from each other.

Although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 11

In this embodiment mode, a driving method of a display device is described. In particular, a driving method of a liquid crystal display device is described.

A liquid crystal panel which can be used for the liquid crystal display device described in this embodiment mode has a structure in which a liquid crystal material is interposed between two substrates. Each of the two substrates is provided with an electrode for controlling an electric field applied to the liquid crystal material. A liquid crystal material corresponds to a material whose optical and electrical properties are changed by an electric field externally applied. Accordingly, a liquid crystal panel corresponds to a device in which desired optical and electrical properties can be obtained by controlling voltage applied to the liquid crystal material with use of the electrode provided for each of the two substrates. Further, a plurality of electrodes are arranged in a planar manner so that each of the electrodes corresponds to a pixel, and voltages applied to the pixels are individually controlled; thus, a liquid crystal display panel which can display a high-definition image can be obtained.

Here, response time of the liquid crystal material due to change in an electric field depends on a space (a cell gap) between the two substrates and a type or the like of the liquid crystal material, and is generally several milliseconds to several ten milliseconds. When the amount of change in the electric field is small, the response time of the liquid crystal material is further lengthened. This characteristic causes defects in image display, such as an after image, a phenomenon in which traces are seen, and decrease in contrast when the liquid crystal panel displays a moving image. In particular, when a half tone is changed into another half tone (when change in the electric field is small), a degree of the above-described defects become pronounced.

On the other hand, as a particular problem for a liquid crystal panel using an active matrix method, fluctuation in writing voltage due to constant charge driving is given. Constant charge driving in this embodiment mode is described below.

A pixel circuit using an active matrix method includes a switch which controls writing and a capacitor which holds a charge. A method for driving the pixel circuit using the active matrix method corresponds to a method in which predetermined voltage is written in the pixel circuit with a switch in an on state, and thereafter, the switch is immediately turned off and a charge in the pixel circuit is held (a hold state). At the time of the hold state, exchange of the charge between inside and outside of the pixel circuit is not performed (a constant charge). In general, a period during which the switch is in an off state is approximately several hundreds (the number of scan lines) of times longer than a period during which the switch is in an on state. Accordingly, it is likely that the switch of the pixel circuit is almost always in an off state. As described above, constant charge driving in this embodiment mode corresponds to a driving method in which a pixel circuit is in a hold state in almost all periods when a liquid crystal panel is driven.

Next, electrical properties of the liquid crystal material are described. A dielectric constant as well as optical properties of the liquid crystal material are changed when an electric field externally applied is changed. That is, when it is considered that each pixel of the liquid crystal panel is a capacitor (a liquid crystal element) interposed between two electrodes, the capacitor corresponds to a capacitor whose capacitance is changed in accordance with applied voltage. This phenomenon is called dynamic capacitance.

When a capacitor whose capacitance is changed in accordance with applied voltage in this manner is driven by the constant charge driving, the following problem occurs. When capacitance of a liquid crystal element is changed in a hold state in which a charge is not moved, applied voltage is also changed. This can be understood from the fact that the amount of charges is constant in a relational expression of (the amount of charges)=(capacitance)×(applied voltage).

Figure 56A:
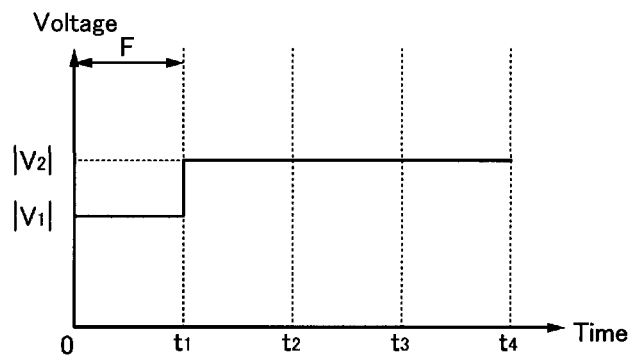
FIGS. 56A to 56C each illustrate a driving method of a display device according to the invention.
Figure 56B:
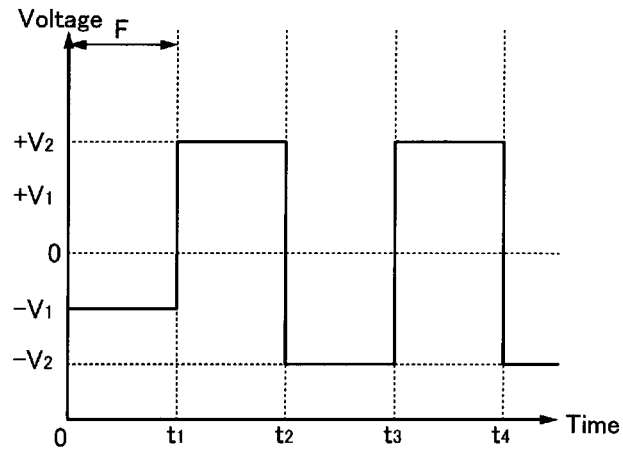
Figure 56C:
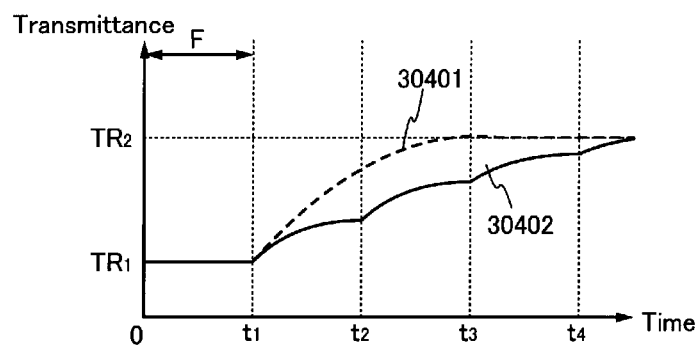

For the above-described reasons, voltage at the time of a hold state is changed from voltage at the time of writing because constant charge driving is performed in a liquid crystal panel using an active matrix method. Accordingly, change in transmittance of the liquid crystal element is different from change in transmittance of a liquid crystal element in a driving method which does not take a hold state. FIGS. 56A to 56C illustrate this state. FIG. 56A shows an example of control of voltage written in a pixel circuit when time is represented by the horizontal axis and an absolute value of the voltage is represented by the vertical axis. FIG. 56B shows an example of control of voltage written in the pixel circuit when time is represented by the horizontal axis and the voltage is represented by the vertical axis. FIG. 56C shows change in transmittance of the liquid crystal element over time in the case where the voltage shown in FIG. 56A or 56B is written in the pixel circuit when time is represented by the horizontal axis and transmittance of the liquid crystal element is represented by the vertical axis. In each of FIGS. 56A to 56C, a period F indicates a period for rewriting the voltage, and time for rewriting the voltage is denoted by $t_1, t_2, t_3, t_4$, and the like.

Here, writing voltage corresponding to image data input to the liquid crystal display device corresponds to $|V_1|$ in rewriting at the time of 0 and corresponds to $|V_2|$ in rewriting at the time of $t_1, t_2, t_3, t_4$, and the like (see FIG. 56A).

Note that polarity of the writing voltage corresponding to image data input to the liquid crystal display device may be switched periodically (inversion driving: see FIG. 56B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of flickers caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 56C shows change in transmittance of the liquid crystal element over time when voltage as shown in FIG. 56A or 56B is applied to the liquid crystal element. Here, transmittance of the liquid crystal element in the case where enough time passes after the voltage $|V_1|$ is applied to the liquid crystal element corresponds to $TR_1$. Similarly, transmittance of the liquid crystal element in the case where enough time passes after the voltage $|V_2|$ is applied to the liquid crystal element corresponds to $TR_2$. When the voltage applied to the liquid crystal element is changed from $|V_1|$ to $|V_2|$ at the time of $t_1$, transmittance of the liquid crystal element does not immediately become $TR_2$ but slowly changes as shown by a dashed line 30401. For example, when the period of rewriting voltage is the same as a frame period (16.7 milliseconds) of an image signal of 60 Hz, time for several frames is needed until transmittance is changed to $TR_2$.

Note that smooth change in transmittance over time as shown in the dashed line 30401 corresponds to change in transmittance over time when the voltage $|V_2|$ is accurately applied to the liquid crystal element. In an actual liquid crystal panel, for example, in a liquid crystal panel using an active matrix method, transmittance of the liquid crystal element does not changed over time as shown by the dashed line 30401 but gradually changes over time as shown by a solid line 30402. This is because voltage at the time of a hold state is changed due to constant charge driving, and it is impossible to reach intended voltage only by one writing. Accordingly, the response time of transmittance of the liquid crystal element becomes further longer than original response time (the dashed line 30401) in appearance, so that defects when an image is displayed, such as an after image, a phenomenon in which traces are seen, or decrease in contrast noticeably occur.

Figure 57A:
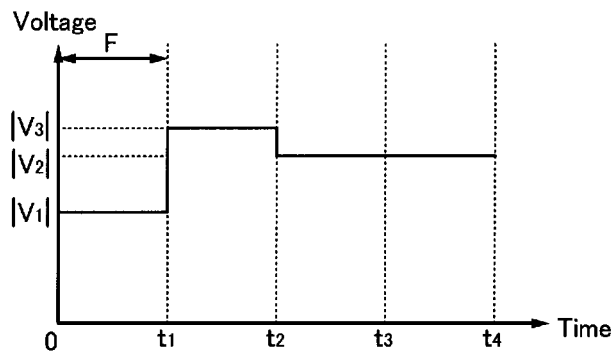
FIGS. 57A to 57C each illustrate a driving method of a display device according to the invention.
Figure 57B:
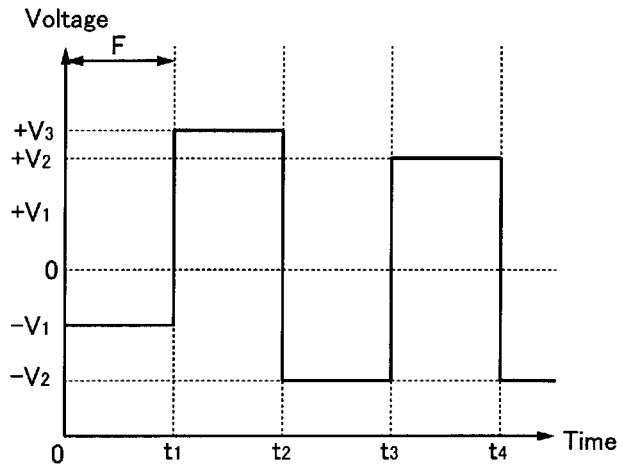
Figure 57C:
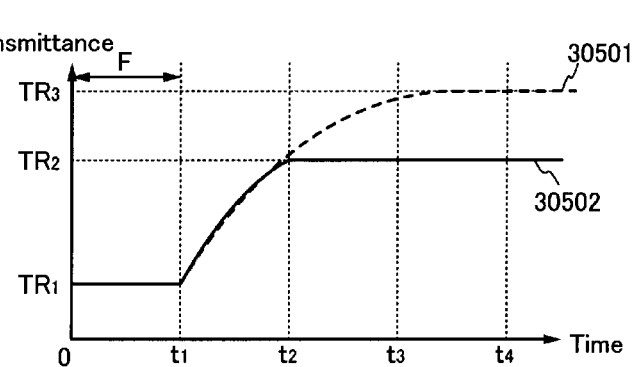

By using overdriving, it is possible to solve a phenomenon in which the response time in appearance becomes further longer due to shortage of writing by dynamic capacitance and constant charge driving as well as length of the original response time of the liquid crystal element. FIGS. 57A to 57C illustrate this state. FIG. 57A shows an example of control of voltage written in a pixel circuit when time is represented by the horizontal axis and an absolute value of the voltage is represented by the vertical axis. FIG. 57B shows an example of control of voltage written in the pixel circuit when time is represented by the horizontal axis and the voltage is represented by the vertical axis. FIG. 57C shows change in transmittance of the liquid crystal element over time in the case where the voltage shown in FIG. 57A or 57B is written in the pixel circuit when time is represented by the horizontal axis and transmittance of the liquid crystal element is represented by the vertical axis. In each of FIGS. 57A to 57C, a period F indicates a period for rewriting the voltage, and time for rewriting the voltage is denoted by $t_1$, $t_2$, $t_3$, $t_4$, and the like.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_2|$ in rewriting at the time of $t_2$, $t_3$, $t_4$, and the like (see FIG. 57A).

Note that polarity of the writing voltage corresponding to image data input to the liquid crystal display device may be switched periodically (inversion driving: see FIG. 57B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of flickers caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 57C shows change in transmittance of the liquid crystal element over time when voltage as shown in FIG. 57A or 57B is applied to the liquid crystal element. Here, transmittance of the liquid crystal element in the case where enough time passes after the voltage $|V_1|$ is applied to the liquid crystal element corresponds to $TR_1$. Similarly, transmittance of the liquid crystal element in the case where enough time passes after the voltage $|V_2|$ is applied to the liquid crystal element corresponds to $TR_2$. Similarly, transmittance of the liquid crystal element in the case where enough time passes after the voltage $|V_3|$ is applied to the liquid crystal element corresponds to $TR_3$. When the voltage applied to the liquid crystal element is changed from $|V_1|$ to $|V_3|$ at the time of $t_1$, transmittance of the liquid crystal element is tried to be changed to $TR_3$ for several frames as shown by a dashed line 30501. However, application of the voltage $|V_3|$ is terminated at the time of $t_2$, and the voltage $|V_2|$ is applied after the time of $t_2$. Accordingly, transmittance of the liquid crystal element does not become as shown by the dashed line 30501 but becomes as shown by a solid line 30502. A value of the voltage $|V_3|$ is preferably set so that transmittance is approximately $TR_2$ at the time of $t_2$. Here, the voltage $|V_3|$ is also referred to as overdriving voltage.

That is, the response time of the liquid crystal element can be controlled to some extent by changing $|V_3|$, which is the overdriving voltage. This is because the response time of the liquid crystal element is changed by the strength of an electric field. Specifically, the response time of the liquid crystal element becomes shorter as the electric field is stronger, and the response time of the liquid crystal element becomes longer as the electric field is weaker.

Note that $|V_3|$, which is the overdriving voltage, is preferably changed in accordance with the amount of change in the voltage, that is, the voltage $|V_1|$ and the voltage $|V_2|$ which provide intended transmittance $TR_1$ and $TR_2$. This is because appropriate response time can be always obtained by changing $|V_3|$, which is the overdriving voltage, in accordance with change in the response time of the liquid crystal element even when the response time of the liquid crystal element is changed by the amount of change in the voltage.

In addition, $|V_3|$, which is the overdriving voltage, is preferably changed depending on a mode of the liquid crystal element, such as a TN mode, a VA mode, an IPS mode, or an OCB mode. This is because appropriate response time can be always obtained by changing $|V_3|$, which is the overdriving voltage, in accordance with change in the response time of the liquid crystal element even when the response time of the liquid crystal element is changed depending on the mode of the liquid crystal element.

Note that the voltage rewriting period F may be the same as a frame period of an input signal. In this case, since a peripheral driver circuit of a liquid crystal display device can be simplified, the liquid crystal display device with low manufacturing cost can be obtained.

Note that the voltage rewriting period F may be shorter than the frame period of the input signal. For example, the voltage rewriting period F may be half the frame period of the input signal, or one third or less the frame period of the input signal. It is effective to combine this method with a measure against deterioration in quality of a moving image caused by hold driving of the liquid crystal display device, such as black data insertion driving, backlight blinking, backlight scanning, or intermediate image insertion driving by motion compensation. That is, since required response time of the liquid crystal element is short in the measure against deterioration in quality of a moving image caused by hold driving of the liquid crystal display device, the response time of the liquid crystal element can be relatively shortened easily by using the overdriving method described in this embodiment mode. Although the response time of the liquid crystal element can be essentially shortened by a cell gap, a liquid crystal material, a mode of the liquid crystal element, or the like, it is technically difficult to shorten the response time of the liquid crystal element. Accordingly, it is very important to use a method for shortening the response time of the liquid crystal element by a driving method, such as overdriving.

Note also that the voltage rewriting period F may be longer than the frame period of the input signal. For example, the voltage rewriting period F may be twice the frame period of the input signal, or three times or more the frame period of the input signal. It is effective to combine this method with a means (a circuit) which determines whether voltage is not rewritten for a long period or not. That is, when the voltage is not rewritten for a long period, an operation of the circuit can be stopped during a period where no voltage is rewritten without performing a rewriting operation of the voltage. Thus, a liquid crystal display device with low power consumption can be obtained.

Next, a specific method for changing the overdriving voltage $|V_3|$ in accordance with the voltage $|V_1|$ and the voltage $|V_2|$, which provide intended transmittance $TR_1$ and $TR_2$, is described.

Since an overdriving circuit is a circuit for controlling the overdriving voltage $|V_3|$ in accordance with the voltage $|V_1|$ and the voltage $|V_2|$, which provide intended transmittance $TR_1$ and $TR_2$, as appropriate, signals input to the overdriving circuit are a signal related to the voltage $|V_1|$, which provides intended transmittance $TR_1$, and a signal related to the voltage $|V_2|$, which provides intended transmittance $TR_2$. A signal output from the overdriving circuit is a signal related to the overdriving voltage $|V_3|$. Here, each of these signals may have an analog voltage value such as the voltage ($|V_1|$, $|V_2|$, or $|V_3|$) applied to the liquid crystal element or may be a digital signal for supplying the voltage applied to the liquid crystal element. Here, the signal related to the overdriving circuit is described as a digital signal.

Figure 53A:
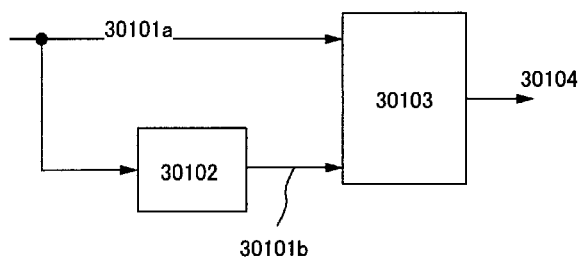
FIGS. 53A to 53E each illustrate a driving method of a display device according to the invention.

First, a general structure of the overdriving circuit is described with reference to FIG. 53A. Here, input image signals 30101a and 30101b are used as signals for controlling the overdriving voltage. As a result of processing these signals, an output image signal 30104 is to be output as a signal which provides the overdriving voltage.

Since the voltage $|V_1|$ and the voltage $|V_2|$, which provide intended transmittance $TR_1$ and $TR_2$, are image signals in adjacent frames, it is preferable that the input image signals 30101a and 30101b be also image signals in adjacent frames. In order to obtain such signals, the input image signal 30101a is input to a delay circuit 30102 in FIG. 53A, and a signal which is consequently output can be used as the input image signal 30101b. An example of the delay circuit 30102 includes a memory. That is, the input image signal 30101a is stored in the memory in order to delay the input image signal 30101a for one frame, and at the same time, a signal stored in the previous frame is extracted from the memory as the input image signal 30101b, and the input image signals 30101a and 30101b are simultaneously input to a correction circuit 30103. Thus, the image signals in adjacent frames can be handled. By inputting the image signals in adjacent frames to the correction circuit 30103, the output image signal 30104 can be obtained. Note that when a memory is used as the delay circuit 30102, a memory having capacity for storing an image signal for one frame in order to delay the input image signal 30101a for one frame (i.e., a frame memory) can be obtained. Thus, the memory can have a function as a delay circuit without causing excess and deficiency of memory capacity.

Next, the delay circuit 30102 formed mainly for reducing memory capacity is described. Since memory capacity can be reduced using such a circuit as the delay circuit 30102, manufacturing cost can be reduced.

Figure 53B:
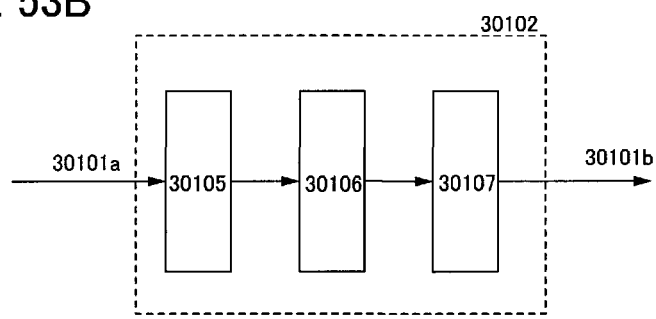

Specifically, a delay circuit as shown in FIG. 53B can be used as the delay circuit 30102 having such characteristics. The delay circuit shown in FIG. 53B includes an encoder 30105, a memory 30106, and a decoder 30107.

Operations of the delay circuit 30102 shown in FIG. 53B are as follows. First, compression processing is performed by the encoder 30105 before the input image signal 30101a is stored in the memory 30106. Thus, the size of data to be stored in the memory 30106 can be reduced. Accordingly, memory capacity can be reduced, and manufacturing cost can be reduced. Then, the compressed image signal is transmitted to the decoder 30107 in which extension processing is performed. Thus, the signal which has been compressed by the encoder 30105 can be restored. Here, compression processing and extension processing performed by the encoder 30105 and the decoder 30107 may be reversible processing. Accordingly, since the image signal does not deteriorate even after compression processing and extension processing are performed, memory capacity can be reduced without causing deterioration of quality of an image which is finally displayed on a device. Alternatively, compression processing and extension processing performed by the encoder 30105 and the decoder 30107 may be non-reversible processing. Accordingly, since the size of data of the compressed image signal can be made extremely small, memory capacity can be significantly reduced.

As a method for reducing memory capacity, a variety of methods can be used as well as the above-described method. For example, a method in which color information included in an image signal is reduced (e.g., tone reduction from 260 thousand colors to 65 thousand colors is performed) or the amount of data is reduced (resolution is reduced) without image compression by an encoder can be used.

Figure 53C:
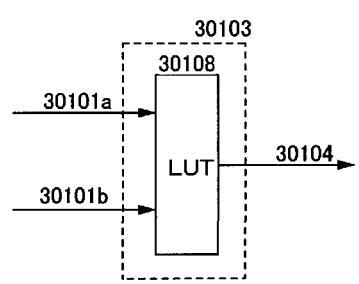

Next, specific examples of the correction circuit 30103 are described with reference to FIGS. 53C to 53E. The correction circuit 30103 is a circuit for outputting an output image signal of a certain value from two input image signals. Here, when a relation between the two input image signals and the output image signal is non-linear and it is difficult to calculate the relation by simple operation, a look up table (LUT) may be used as the correction circuit 30103. Since the relation between the two input image signals and the output image signal is calculated in advance by measurement in the LUT, the output image signal corresponding to the two input image signals can be calculated only by seeing the LUT (see FIG. 53C). When a LUT 30108 is used as the correction circuit 30103, the correction circuit 30103 can be realized without complicated circuit design or the like.

Since the LUT is one of memories, it is preferable to reduce memory capacity as much as possible in order to reduce manufacturing cost. As an example of the correction circuit 30103 for realizing reduction in memory capacity, a circuit shown in FIG. 53D can be considered. The correction circuit 30103 shown in FIG. 53D includes a LUT 30109 and an adder 30110. Difference data between the input image signal 30101a and the output image signal 30104 to be output is stored in the LUT 30109. That is, corresponding difference data between the input image signal 30101a and the input image signal 30101b is extracted from the LUT 30109, and the extracted difference data and the input image signal 30101a are added by the adder 30110; thus, the output image signal 30104 can be obtained. Note that when data stored in the LUT 30109 is difference data, memory capacity of the LUT can be reduced. This is because the size of difference data is smaller than that of the output image signal 30104 as it is, so that memory capacity necessary for the LUT 30109 can be reduced.

In addition, when the output image signal can be calculated by simple operation such as four arithmetic operations of the two input image signals, the correction circuit 30103 can be realized by a combination of simple circuits such as an adder, a subtractor, and a multiplier. Accordingly, it is not necessary to use the LUT, and manufacturing cost can be significantly reduced. As such a circuit, a circuit shown in FIG. 53E can be considered. The correction circuit 30103 shown in FIG. 53E includes a subtractor 30111, a multiplier 30112, and an adder 30113. First, difference between the input image signal 30101a and the input image signal 30101b is calculated by the subtractor 30111. After that, a differential value is multiplied by an appropriate coefficient by using the multiplier 30112. Then, the differential value multiplied by the appropriate coefficient is added to the input image signal 30101a by the adder 30113; thus, the output image signal 30104 can be obtained. By using such a circuit, it is not necessary to use the LUT, so that manufacturing cost can be significantly reduced.

Figure 53E:
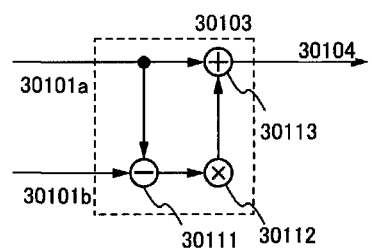
Figure 53D:
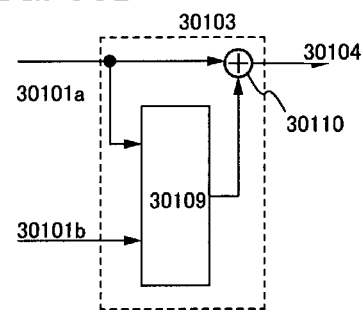

By using the correction circuit 30103 shown in FIG. 53E under a certain condition, inappropriate output of the output image signal 30104 can be prevented. The condition is that the output image signal 30104 applying the overdriving voltage and a differential value between the input image signals 30101a and 30101b have linearity. The slope of this linearity is a coefficient to be multiplied by the multiplier 30112. That is, the correction circuit 30103 shown in FIG. 53E is preferably used for a liquid crystal element having such properties. An example of a liquid crystal element having such properties includes an IPS mode liquid crystal element in which response time has little gray-scale dependency. For example, when the correction circuit 30103 shown in FIG. 53E is used for an IPS mode liquid crystal element, manufacturing cost can be significantly reduced, and an overdriving circuit which can prevent output of the inappropriate output image signal 30104 can be obtained.

Note that operations which are similar to those of the circuit shown in FIGS. 53A to 53E may be realized by software processing. As the memory used for the delay circuit, another memory included in the liquid crystal display device, a memory included in a device which transfers an image displayed on the liquid crystal display device (e.g., a video card or the like included in a personal computer or a device similar to the personal computer), or the like can be used. Accordingly, not only can manufacturing cost be reduced, intensity of overdriving, availability, or the like can be selected in accordance with user's preference.

Figure 54A:
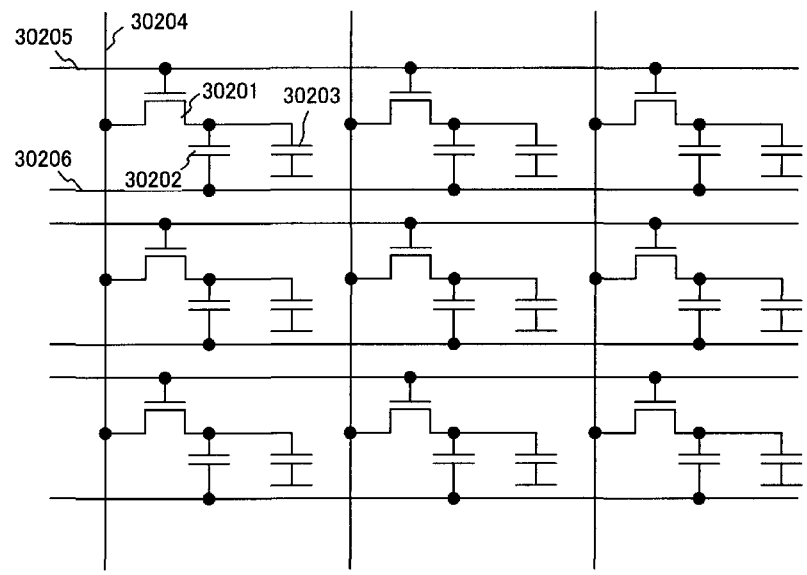
FIGS. 54A and 54B each illustrate a driving method of a display device according to the invention.

Next, driving which controls a potential of a common line is described with reference to FIGS. 54A and 54B. FIG. 54A is a diagram showing a plurality of pixel circuits in which one common line is provided with respect to one scan line in a display device using a display element which has capacitive properties like a liquid crystal element. Each of the pixel circuits shown in FIG. 54A includes a transistor 30201, an auxiliary capacitor 30202, a display element 30203, a video signal line 30204, a scan line 30205, and a common line 30206.

A gate electrode of the transistor 30201 is electrically connected to the scan line 30205; one of a source electrode and a drain electrode of the transistor 30201 is electrically connected to the video signal line 30204; and the other of the source electrode and the drain electrode of the transistor 30201 is electrically connected to one of electrodes of the auxiliary capacitor 30202 and one of electrodes of the display element 30203. In addition, the other of the electrodes of the auxiliary capacitor 30202 is electrically connected to the common line 30206.

First, in each of pixels selected by the scan line 30205, voltage corresponding to an image signal is applied to the display element 30203 and the auxiliary capacitor 30202 through the video signal line 30204 because the transistor 30201 is turned on. At this time, when the image signal is a signal which makes all of pixels connected to the common line 30206 display a minimum gray scale or when the image signal is a signal which makes all of the pixels connected to the common line 30206 display a maximum gray scale, it is not necessary that the image signal be written to each of the pixels through the video signal line 30204. Voltage applied to the display element 30203 can be changed by changing a potential of the common line 30206 instead of writing the image signal through the video signal line 30204.

Figure 54B:
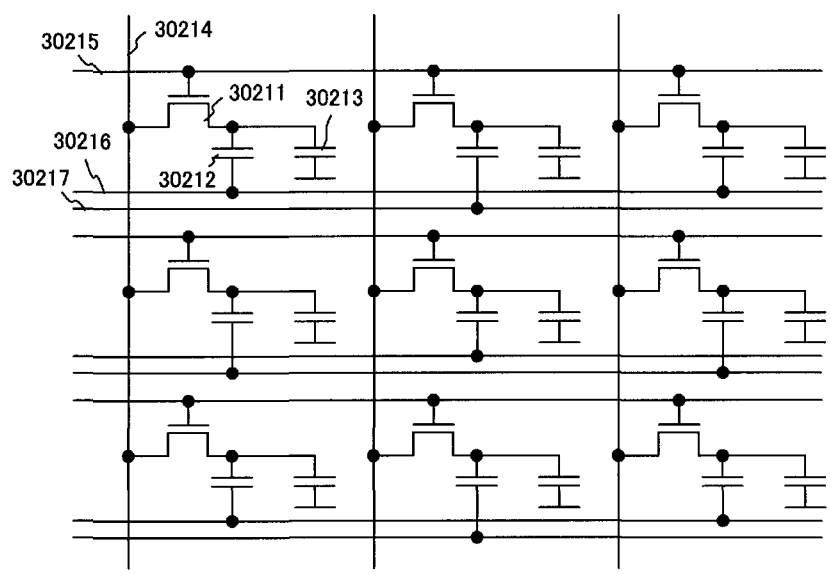

Next, FIG. 54B is a diagram showing a plurality of pixel circuits in which two common lines are provided with respect to one scan line in a display device using a display element which has capacitive properties like a liquid crystal element. Each of the pixel circuits shown in FIG. 54B includes a transistor 30211, an auxiliary capacitor 30212, a display element 30213, a video signal line 30214, a scan line 30215, a first common line 30216, and a second common line 30217.

A gate electrode of the transistor 30211 is electrically connected to the scan line 30215; one of a source electrode and a drain electrode of the transistor 30211 is electrically connected to the video signal line 30214; and the other of the source electrode and the drain electrode of the transistor 30211 is electrically connected to one of electrodes of the auxiliary capacitor 30212 and one of electrodes of the display element 30213. In addition, the other of the electrodes of the auxiliary capacitor 30212 is electrically connected to the first common line 30216. Further, in a pixel which is adjacent to the pixel, the other of the electrodes of the auxiliary capacitor 30212 is electrically connected to the second common line 30217.

In the pixel circuits shown in FIG. 54B, the number of pixels which are electrically connected to one common line is small. Therefore, by changing a potential of the first common line 30216 or the second common line 30217 instead of writing an image signal through the video signal line 30214, frequency of changing voltage applied to the display element 30213 is significantly increased. In addition, source inversion driving or dot inversion driving can be performed. By performing source inversion driving or dot inversion driving, reliability of the element can be improved and a flicker can be suppressed.

Figure 55A:
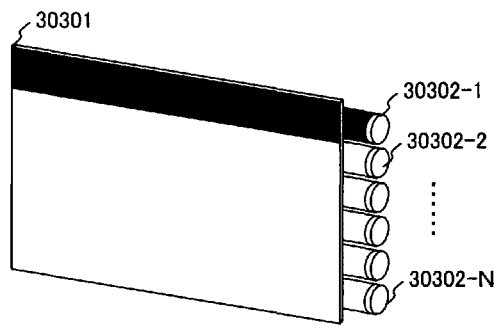
FIGS. 55A to 55C each illustrate a driving method of a display device according to the invention.
Figure 55B:
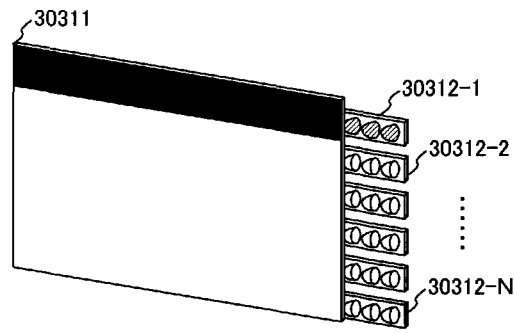

A scanning backlight is described with reference to FIGS. 55A to 55C. FIG. 55A is a view showing a scanning backlight in which cold cathode fluorescent lamps are arranged. The scanning backlight shown in FIG. 55A includes a diffusion plate 30301 and N pieces of cold cathode fluorescent lamps 30302-1 to 30302-N. The N pieces of the cold cathode fluorescent lamps 30302-1 to 30302-N are arranged on the back side of the diffusion plate 30301, so that the N pieces of the cold cathode fluorescent lamps 30302-1 to 30302-N can be scanned while luminance thereof is changed.

Change in luminance of each of the cold cathode fluorescent lamps in scanning is described with reference to FIG. 55C. First, luminance of the cold cathode fluorescent lamp 30302-1 is changed for a certain period. After that, luminance of the cold cathode fluorescent lamp 30302-2 which is provided adjacent to the cold cathode fluorescent lamp 30302-1 is changed for the same period. In this manner, luminance is changed sequentially from the cold cathode fluorescent lamp 30302-1 to the cold cathode fluorescent lamp 30302-N. Although luminance which is changed for a certain period is set to be lower than original luminance in FIG. 55C, it may also be higher than original luminance. In addition, although scanning is performed from the cold cathode fluorescent lamps 30302-1 to 30302-N, scanning may also be performed from the cold cathode fluorescent lamps 30302-N to 30302-1, which is in a reversed order.

Figure 55C:
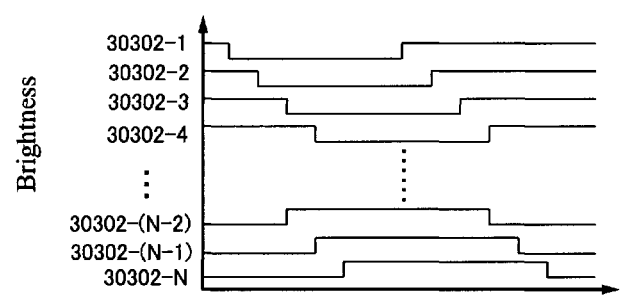

By performing driving as in FIG. 55C, average luminance of the backlight can be decreased. Therefore, power consumption of the backlight, which mainly takes up power consumption of the liquid crystal display device, can be reduced.

Note that an LED may be used as a light source of the scanning backlight. The scanning backlight in that case is as shown in FIG. 55B. The scanning backlight shown in FIG. 55B includes a diffusion plate 30311 and light sources 30312-1 to 30312-N, in each of which LEDs are arranged. When the LED is used as the light source of the scanning backlight, there is an advantage in that the backlight can be thin and lightweight. In addition, there is also an advantage that a color reproduction area can be widened. Further, since the LEDs which are arranged in each of the light sources 30312-1 to 30312-N can be similarly scanned, a dot scanning backlight can also be obtained. By using the dot scanning backlight, quality of a moving image can be further improved.

Note that when the LED is used as the light source of the backlight, driving can be performed by changing luminance as shown in FIG. 55C.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 12

In this embodiment mode, various liquid crystal modes are described.

First, various liquid crystal modes are described with reference to cross-sectional views.

Figure 58A:
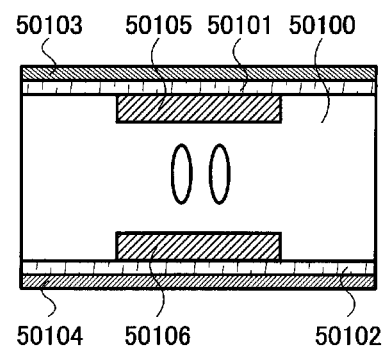
FIGS. 58A and 58B are cross-sectional views of a display device according to the invention.
Figure 58B:
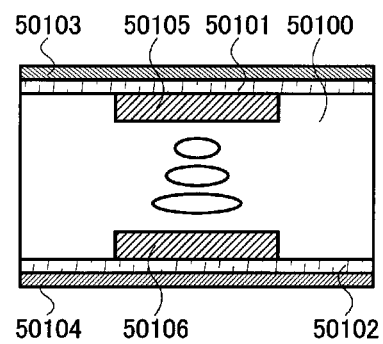

FIGS. 58A and 58B are schematic views of cross sections of a TN mode.

A liquid crystal layer 50100 is held between a first substrate 50101 and a second substrate 50102 which are provided so as to be opposite to each other. A first electrode 50105 is formed on a top surface of the first substrate 50101. A second electrode 50106 is formed on a top surface of the second substrate 50102. A first polarizing plate 50103 is provided on a surface of the first substrate 50101, which does not face the liquid crystal layer. A second polarizing plate 50104 is provided on a surface of the second substrate 50102, which does not face the liquid crystal layer. Note that the first polarizing plate 50103 and the second polarizing plate 50104 are provided so as to be in a cross nicol state.

The first polarizing plate 50103 may be provided on the top surface of the first substrate 50101. The second polarizing plate 50104 may be provided on the top surface of the second substrate 50102.

It is acceptable as long as at least one of or both the first electrode 50105 and the second electrode 50106 have light-transmitting properties (a transmissive or reflective liquid crystal display device). Alternatively, both the first electrode 50105 and the second electrode 50106 may have light-transmitting properties, and part of one of the electrodes may have reflectivity (a semi-transmissive liquid crystal display device).

FIG. 58A is a schematic view of a cross section in the case where voltage is applied to the first electrode 50105 and the second electrode 50106 (referred to as a vertical electric field mode). Since liquid crystal molecules are aligned longitudinally, light emitted from a backlight is not affected by birefringence of the liquid crystal molecules. In addition, since the first polarizing plate 50103 and the second polarizing plate 50104 are provided so as to be in a cross nicol state, light emitted from the backlight cannot pass through the substrate. Therefore, black display is performed.

Note that by controlling voltage applied to the first electrode 50105 and the second electrode 50106, conditions of the liquid crystal molecules can be controlled. Therefore, since the amount of light emitted from the backlight passing through the substrate can be controlled, predetermined image display can be performed.

FIG. 58B is a schematic view of a cross section in the case where voltage is not applied to the first electrode 50105 and the second electrode 50106. Since the liquid crystal molecules are aligned laterally and rotated in a plane, light emitted from a backlight is affected by birefringence of the liquid crystal molecules. In addition, since the first polarizing plate 50103 and the second polarizing plate 50104 are provided so as to be in a cross nicol state, light emitted from the backlight passes through the substrate. Therefore, white display is performed. This is a so-called normally white mode.

A liquid crystal display device having a structure shown in FIG. 58A or FIG. 58B can perform full-color display by being provided with a color filter. The color filter can be provided on a first substrate 50101 side or a second substrate 50102 side.

It is acceptable as long as a known material is used for a liquid crystal material used for a TN mode.

Figure 59A:
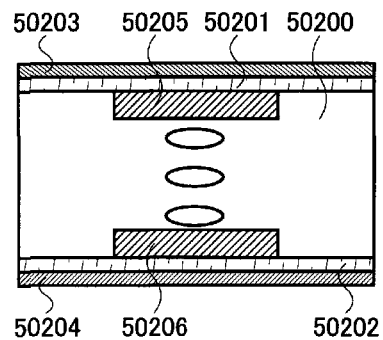
FIGS. 59A to 59D are cross-sectional views of display devices according to the invention.
Figure 59B:
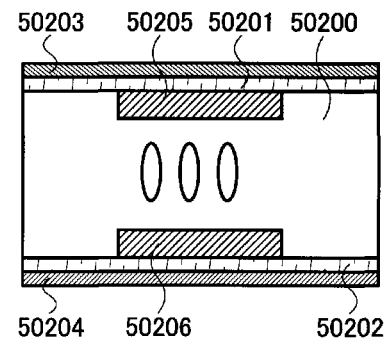

FIGS. 59A and 59B are schematic views of cross sections of a VA mode. In the VA mode, liquid crystal molecules are aligned such that they are vertical to a substrate when there is no electric field.

A liquid crystal layer 50200 is held between a first substrate 50201 and a second substrate 50202 which are provided so as to be opposite to each other. A first electrode 50205 is formed on a top surface of the first substrate 50201. A second electrode 50206 is formed on a top surface of the second substrate

50202. A first polarizing plate 50203 is provided on a surface of the first substrate 50201, which does not face the liquid crystal layer. A second polarizing plate 50204 is provided on a surface of the second substrate 50202, which does not face the liquid crystal layer. Note that the first polarizing plate 50203 and the second polarizing plate 50204 are provided so as to be in a cross nicol state.

The first polarizing plate 50203 may be provided on the top surface of the first substrate 50201. The second polarizing plate 50204 may be provided on the top surface of the second substrate 50202.

It is acceptable as long as at least one of or both the first electrode 50205 and the second electrode 50206 have light-transmitting properties (a transmissive or reflective liquid crystal display device). Alternatively, both the first electrode 50205 and the second electrode 50206 may have light-transmitting properties, and part of one of the electrodes may have reflectivity (a semi-transmissive liquid crystal display device).

FIG. 59A is a schematic view of a cross section in the case where voltage is applied to the first electrode 50205 and the second electrode 50206 (referred to as a vertical electric field mode). Since liquid crystal molecules are aligned laterally, light emitted from a backlight is affected by birefringence of the liquid crystal molecules. In addition, since the first polarizing plate 50203 and the second polarizing plate 50204 are provided so as to be in a cross nicol state, light emitted from the backlight passes through the substrate. Therefore, white display is performed.

Note that by controlling voltage applied to the first electrode 50205 and the second electrode 50206, conditions of the liquid crystal molecules can be controlled. Therefore, since the amount of light emitted from the backlight passing through the substrate can be controlled, predetermined image display can be performed.

FIG. 59B is a schematic view of a cross section in the case where voltage is not applied to the first electrode 50205 and the second electrode 50206. Since liquid crystal molecules are aligned longitudinally, light emitted from a backlight is not affected by birefringence of the liquid crystal molecules. In addition, since the first polarizing plate 50203 and the second polarizing plate 50204 are provided so as to be in a cross nicol state, light emitted from the backlight does not pass through the substrate. Therefore, black display is performed. This is a so-called normally black mode.

A liquid crystal display device having a structure shown in FIG. 59A or FIG. 59B can perform full-color display by being provided with a color filter. The color filter can be provided on a first substrate 50201 side or a second substrate 50202 side.

It is acceptable as long as a known material is used for a liquid crystal material used for a VA mode.

Figure 59C:
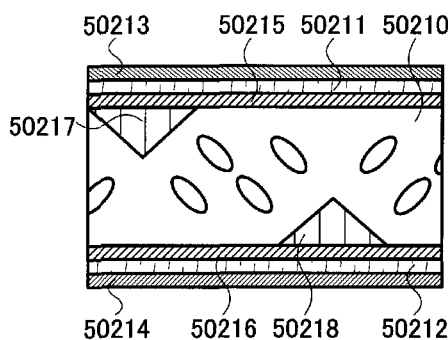
Figure 59D:
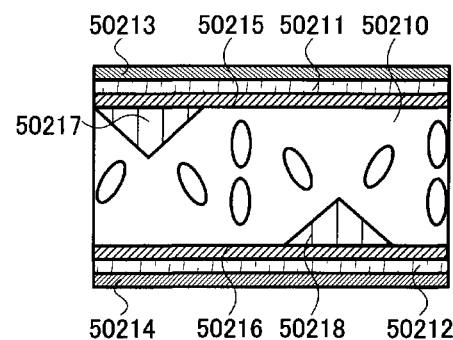

FIGS. 59C and 59D are schematic views of cross sections of an MVA mode. In the MVA mode, viewing angle dependency of each portion is compensated by each other.

A liquid crystal layer 50210 is held between a first substrate 50211 and a second substrate 50212 which are provided so as to be opposite to each other. A first electrode 50215 is formed on a top surface of the first substrate 50211. A second electrode 50216 is formed on a top surface of the second substrate 50212. A first protrusion 50217 for controlling alignment is formed on the first electrode 50215. A second protrusion 50218 for controlling alignment is formed over the second electrode 50216. A first polarizing plate 50213 is provided on a surface of the first substrate 50211, which does not face the liquid crystal layer. A second polarizing plate 50214 is provided on a surface of the second substrate 50212, which does not face the liquid crystal layer. Note that the first polarizing plate 50213 and the second polarizing plate 50214 are provided so as to be in a cross nicol state.

The first polarizing plate 50213 may be provided on the top surface of the first substrate 50211. The second polarizing plate 50214 may be provided on the top surface of the second substrate 50212.

It is acceptable as long as at least one of or both the first electrode 50215 and the second electrode 50216 have light-transmitting properties (a transmissive or reflective liquid crystal display device). Alternatively, both the first electrode 50215 and the second electrode 50216 may have light-transmitting properties, and part of one of the electrodes may have reflectivity (a semi-transmissive liquid crystal display device).

FIG. 59C is a schematic view of a cross section in the case where voltage is applied to the first electrode 50215 and the second electrode 50216 (referred to as a vertical electric field mode). Since liquid crystal molecules are aligned so as to tilt toward the first protrusion 50217 and the second protrusion 50218, light emitted from a backlight is affected by birefringence of the liquid crystal molecules. In addition, since the first polarizing plate 50213 and the second polarizing plate 50214 are provided so as to be in a cross nicol state, light emitted from the backlight passes through the substrate. Therefore, white display is performed.

Note that by controlling voltage applied to the first electrode 50215 and the second electrode 50216, conditions of the liquid crystal molecules can be controlled. Therefore, since the amount of light emitted from the backlight passing through the substrate can be controlled, predetermined image display can be performed.

FIG. 59D is a schematic view of a cross section in the case where voltage is not applied to the first electrode 50215 and the second electrode 50216. Since liquid crystal molecules are aligned longitudinally, light emitted from a backlight is not affected by birefringence of the liquid crystal molecules. In addition, since the first polarizing plate 50213 and the second polarizing plate 50214 are provided so as to be in a cross nicol state, light emitted from the backlight does not pass through the substrate. Therefore, black display is performed. This is a so-called normally black mode.

A liquid crystal display device having a structure shown in FIG. 59C or FIG. 59D can perform full-color display by being provided with a color filter. The color filter can be provided on a first substrate 50211 side or a second substrate 50212 side. It is acceptable as long as a known material is used for a liquid crystal material used for an MVA mode.

Figure 60A:
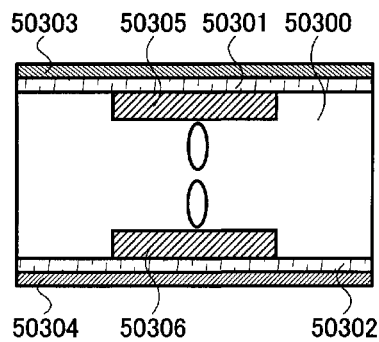
FIGS. 60A to 60D are cross-sectional views of display devices according to the invention.
Figure 60B:
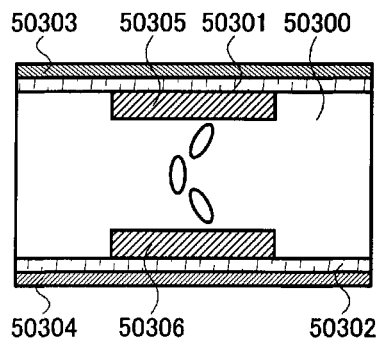

FIGS. 60A and 60B are schematic views of cross sections of an OCB mode. In the OCB mode, viewing angle dependency is low because alignment of liquid crystal molecules in a liquid crystal layer can be optically compensated. This state of the liquid crystal molecules is referred to as bend alignment.

A liquid crystal layer 50300 is held between a first substrate 50301 and a second substrate 50302 which are provided so as to be opposite to each other. A first electrode 50305 is formed on a top surface of the first substrate 50301. A second electrode 50306 is formed on a top surface of the second substrate 50302. A first polarizing plate 50303 is provided on a surface of the first substrate 50301, which does not face the liquid crystal layer. A second polarizing plate 50304 is provided on a surface of the second substrate 50302, which does not face the liquid crystal layer. Note that the first polarizing plate 50303 and the second polarizing plate 50304 are provided so as to be in a cross nicol state.

The first polarizing plate 50303 may be provided on the top surface of the first substrate 50301. The second polarizing plate 50304 may be provided on the top surface of the second substrate 50302.

It is acceptable as long as at least one of or both the first electrode 50305 and the second electrode 50306 have light-transmitting properties (a transmissive or reflective liquid crystal display device). Alternatively, both the first electrode 50305 and the second electrode 50306 may have light-transmitting properties, and part of one of the electrodes may have reflectivity (a semi-transmissive liquid crystal display device).

FIG. 60A is a schematic view of a cross section in the case where voltage is applied to the first electrode 50305 and the second electrode 50306 (referred to as a vertical electric field mode). Since liquid crystal molecules are aligned longitudinally, light emitted from a backlight is not affected by birefringence of the liquid crystal molecules. In addition, since the first polarizing plate 50303 and the second polarizing plate 50304 are provided so as to be in a cross nicol state, light emitted from the backlight does not pass through the substrate. Therefore, black display is performed.

Note that by controlling voltage applied to the first electrode 50305 and the second electrode 50306, conditions of the liquid crystal molecules can be controlled. Therefore, since the amount of light emitted from the backlight passing through the substrate can be controlled, predetermined image display can be performed.

FIG. 60B is a schematic view of a cross section in the case where voltage is not applied to the first electrode 50305 and the second electrode 50306. Since liquid crystal molecules are in a bend alignment state, light emitted from a backlight is affected by birefringence of the liquid crystal molecules. In addition, since the first polarizing plate 50303 and the second polarizing plate 50304 are provided so as to be in a cross nicol state, light emitted from the backlight passes through the substrate. Therefore, white display is performed. This is a so-called normally white mode.

A liquid crystal display device having a structure shown in FIG. 60A or FIG. 60B can perform full-color display by being provided with a color filter. The color filter can be provided on a first substrate 50301 side or a second substrate 50302 side.

It is acceptable as long as a known material is used for a liquid crystal material used for an OCB mode.

Figure 60C:
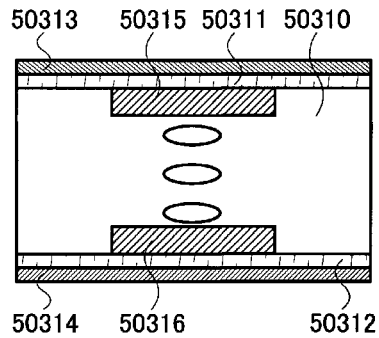
Figure 60D:
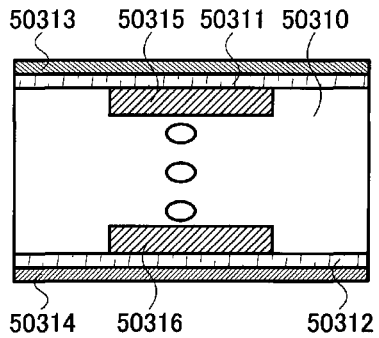

FIGS. 60C and 60D are schematic views of cross sections of an FLC mode or an AFLC mode.

A liquid crystal layer 50310 is held between a first substrate 50311 and a second substrate 50312 which are provided so as to be opposite to each other. A first electrode 50315 is formed on a top surface of the first substrate 50311. A second electrode 50316 is formed on a top surface of the second substrate 50312. A first polarizing plate 50313 is provided on a surface of the first substrate 50311, which does not face the liquid crystal layer. A second polarizing plate 50314 is provided on a surface of the second substrate 50312, which does not face the liquid crystal layer. Note that the first polarizing plate 50313 and the second polarizing plate 50314 are provided so as to be in a cross nicol state.

The first polarizing plate 50313 may be provided on the top surface of the first substrate 50311. The second polarizing plate 50314 may be provided on the top surface of the second substrate 50312.

It is acceptable as long as at least one of or both the first electrode 50315 and the second electrode 50316 have light-transmitting properties (a transmissive or reflective liquid crystal display device). Alternatively, both the first electrode 50315 and the second electrode 50316 may have light-transmitting properties, and part of one of the electrodes may have reflectivity (a semi-transmissive liquid crystal display device).

FIG. 60C is a schematic view of a cross section in the case where voltage is applied to the first electrode 50315 and the second electrode 50316 (referred to as a vertical electric field mode). Since liquid crystal molecules are aligned laterally in a direction which is deviated from a rubbing direction, light emitted from a backlight is affected by birefringence of the liquid crystal molecules. In addition, since the first polarizing plate 50313 and the second polarizing plate 50314 are provided so as to be in a cross nicol state, light emitted from the backlight passes through the substrate. Therefore, white display is performed.

Note that by controlling voltage applied to the first electrode 50315 and the second electrode 50316, conditions of the liquid crystal molecules can be controlled. Therefore, since the amount of light emitted from the backlight passing through the substrate can be controlled, predetermined image display can be performed.

FIG. 60D is a schematic view of a cross section in the case where voltage is not applied to the first electrode 50315 and the second electrode 50316. Since liquid crystal molecules are aligned laterally in a rubbing direction, light emitted from a backlight is not affected by birefringence of the liquid crystal molecules. In addition, since the first polarizing plate 50313 and the second polarizing plate 50314 are provided so as to be in a cross nicol state, light emitted from the backlight does not pass through the substrate. Therefore, black display is performed. This is a so-called normally black mode.

A liquid crystal display device having a structure shown in FIG. 60C or FIG. 60D can perform full-color display by being provided with a color filter. The color filter can be provided on a first substrate 50311 side or a second substrate 50312 side.

It is acceptable as long as a known material is used for a liquid crystal material used for an FLC mode or an AFLC mode.

Figure 61A:
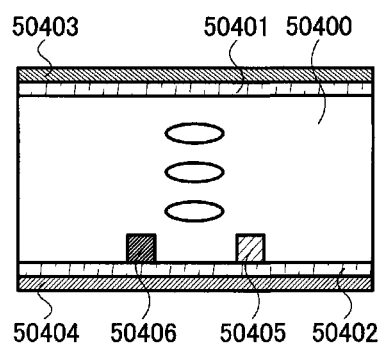
FIGS. 61A to 61D are cross-sectional views of display devices according to the invention.
Figure 61B:
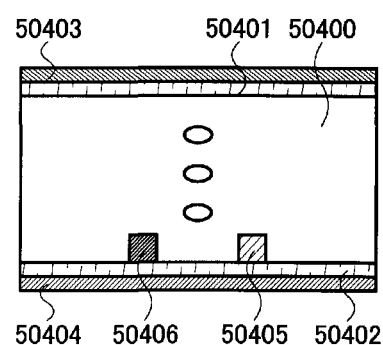

FIGS. 61A and 61B are schematic views of cross sections of an IPS mode. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50400 is held between a first substrate 50401 and a second substrate 50402 which are provided so as to be opposite to each other. A first electrode 50405 and a second electrode 50406 are formed on a top surface of the second substrate 50402. A first polarizing plate 50403 is provided on a surface of the first substrate 50401, which does not face the liquid crystal layer. A second polarizing plate 50404 is provided on a surface of the second substrate 50402, which does not face the liquid crystal layer. Note that the first polarizing plate 50403 and the second polarizing plate 50404 are provided so as to be in a cross nicol state.

The first polarizing plate 50403 may be provided on the top surface of the first substrate 50401. The second polarizing plate 50404 may be provided on the top surface of the second substrate 50402.

It is acceptable as long as both the first electrode 50405 and the second electrode 50406 have light-transmitting properties. Alternatively, part of one of the first electrode 50405 and the second electrode 50406 may have reflectivity.

FIG. 61A is a schematic view of a cross section in the case where voltage is applied to the first electrode 50405 and the second electrode 50406 (referred to as a horizontal electric field mode). Since liquid crystal molecules are aligned along a line of electric force which is deviated from a rubbing direction, light emitted from a backlight is affected by birefringence of the liquid crystal molecules. In addition, since the first polarizing plate 50403 and the second polarizing plate 50404 are provided so as to be in a cross nicol state, light emitted from the backlight passes through the substrate. Therefore, white display is performed.

Note that by controlling voltage applied to the first electrode 50405 and the second electrode 50406, conditions of the liquid crystal molecules can be controlled. Therefore, since the amount of light emitted from the backlight passing through the substrate can be controlled, predetermined image display can be performed.

FIG. 61B is a schematic view of a cross section in the case where voltage is not applied to the first electrode 50405 and the second electrode 50406. Since liquid crystal molecules are aligned laterally in a rubbing direction, light emitted from a backlight is not affected by birefringence of the liquid crystal molecules. In addition, since the first polarizing plate 50403 and the second polarizing plate 50404 are provided so as to be in a cross nicol state, light emitted from the backlight does not pass through the substrate. Therefore, black display is performed. This is a so-called normally black mode.

A liquid crystal display device having a structure shown in FIG. 61A or FIG. 61B can perform full-color display by being provided with a color filter. The color filter can be provided on a first substrate 50401 side or a second substrate 50402 side.

It is acceptable as long as a known material is used for a liquid crystal material used for an IPS mode.

Figure 61C:
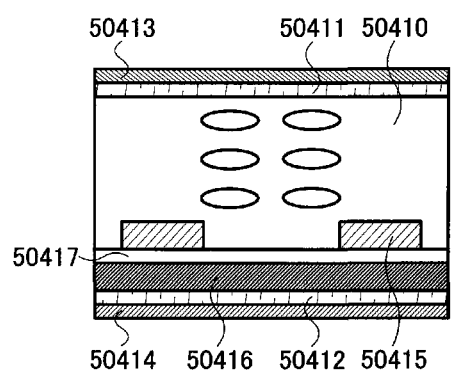
Figure 61D:
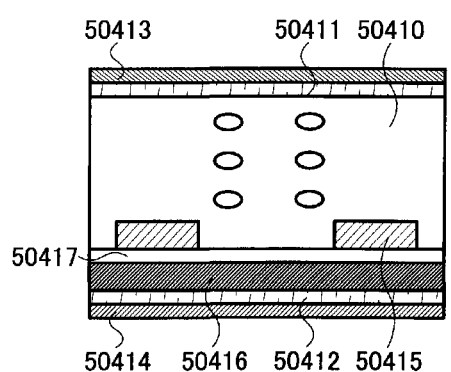

FIGS. 61C and 61D are schematic views of cross sections of an FFS mode. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50410 is held between a first substrate 50411 and a second substrate 50412 which are provided so as to be opposite to each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on a surface of the first substrate 50411, which does not face the liquid crystal layer. A second polarizing plate 50414 is provided on a surface of the second substrate 50412, which does not face the liquid crystal layer. Note that the first polarizing plate 50413 and the second polarizing plate 50414 are provided so as to be in a cross nicol state.

The first polarizing plate 50413 may be provided on the top surface of the first substrate 50411. The second polarizing plate 50414 may be provided on the top surface of the second substrate 50412.

It is acceptable as long as at least one of or both the first electrode 50415 and the second electrode 50416 have light-transmitting properties (a transmissive or reflective liquid crystal display device). Alternatively, both the first electrode 50415 and the second electrode 50416 may have light-transmitting properties, and part of one of the electrodes may have reflectivity (a semi-transmissive liquid crystal display device).

FIG. 61C is a schematic view of a cross section in the case where voltage is applied to the first electrode 50415 and the second electrode 50416 (referred to as a horizontal electric field mode). Since liquid crystal molecules are aligned along a line of electric force which is deviated from a rubbing direction, light emitted from a backlight is affected by birefringence of the liquid crystal molecules. In addition, since the first polarizing plate 50413 and the second polarizing plate 50414 are provided so as to be in a cross nicol state, light emitted from the backlight passes through the substrate. Therefore, white display is performed.

Note that by controlling voltage applied to the first electrode 50415 and the second electrode 50416, conditions of the liquid crystal molecules can be controlled. Therefore, since the amount of light emitted from the backlight passing through the substrate can be controlled, predetermined image display can be performed.

FIG. 61D is a schematic view of a cross section in the case where voltage is not applied to the first electrode 50415 and the second electrode 50416. Since liquid crystal molecules are aligned laterally in a rubbing direction, light emitted from the backlight is not affected by birefringence of the liquid crystal molecules. In addition, since the first polarizing plate 50413 and the second polarizing plate 50414 are provided so as to be in a cross nicol state, light emitted from the backlight does not pass through the substrate. Therefore, black display is performed. This is a so-called normally black mode.

A liquid crystal display device having a structure shown in FIG. 61C or FIG. 61D can perform full-color display by being provided with a color filter. The color filter can be provided on a first substrate 50411 side or a second substrate 50412 side.

It is acceptable as long as a known material is used for a liquid crystal material used for an FFS mode.

Next, various liquid crystal modes are described with reference to top plan views.

Figure 62:
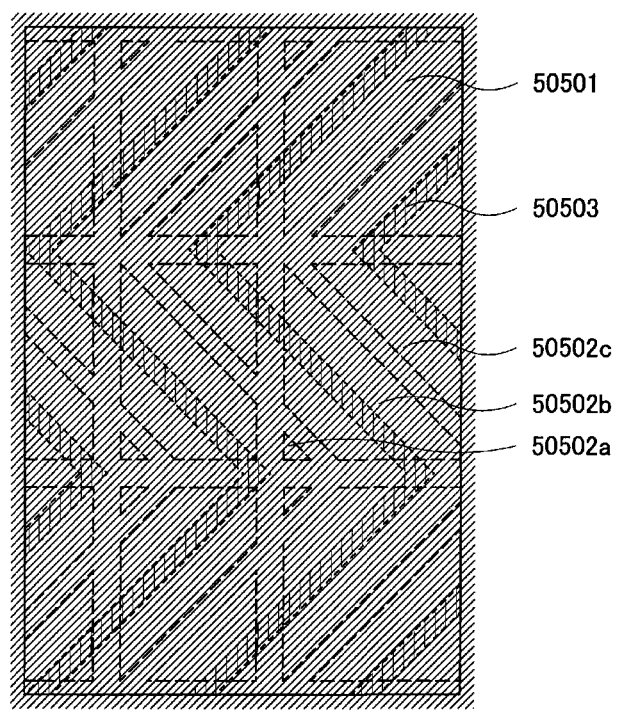
FIG. 62 is a top plan view of a display device according to the invention.

FIG. 62 is a top plan view of a pixel portion to which an MVA mode is applied. In the MVA mode, viewing angle dependency of each portion is compensated by each other.

FIG. 62 shows a first pixel electrode 50501, second pixel electrodes (50502*a*, 50502*b*, and 50502*c*), and a protrusion 50503. The first pixel electrode 50501 is formed over the entire surface of a counter substrate. The protrusion 50503 is formed so as to be a dogleg shape. In addition, the second pixel electrodes (50502*a*, 50502*b*, and 50502*c*) are formed over the first pixel electrode 50501 so as to have shapes corresponding to the protrusion 50503.

Opening portions of the second pixel electrodes (50502*a*, 50502*b*, and 50502*c*) function like protrusions.

In the case where voltage is applied to the first pixel electrode 50501 and the second pixel electrodes (50502*a*, 50502*b*, and 50502*c*) (referred to as a vertical electric field mode), liquid crystal molecules are aligned so as to tilt toward the opening portions of the second pixel electrodes (50502*a*, 50502*b*, and 50502*c*) and the protrusion 50503. Since light emitted from a backlight passes through a substrate when a pair of polarizing plates is provided so as to be in a cross nicol state, white display is performed.

Note that by controlling voltage applied to the first pixel electrode 50501 and the second pixel electrodes (50502*a*, 50502*b*, and 50502*c*), conditions of the liquid crystal molecules can be controlled. Therefore, since the amount of light emitted from the backlight passing through the substrate can be controlled, predetermined image display can be performed.

In the case where voltage is not applied to the first pixel electrode 50501 and the second pixel electrodes (50502*a*, 50502*b*, and 50502*c*), the liquid crystal molecules are aligned longitudinally. Since light emitted from the backlight does not pass through a panel when the pair of polarizing plates is provided so as to be in the cross nicol state, black display is performed. This is a so-called normally black mode.

It is acceptable as long as a known material is used for a liquid crystal material used for an MVA mode.

FIGS. 44A to 44D are top plan views of a pixel portion to which an IPS mode is applied. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

In the IPS mode, a pair of electrodes is formed so as to have different shapes.

Figure 63A:
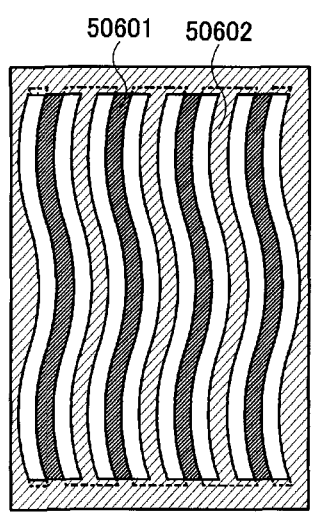
FIGS. 63A to 63D each are a top plan view of a display device according to the invention.

FIG. 63A shows a first pixel electrode 50601 and a second pixel electrode 50602. The first pixel electrode 50601 and the second pixel electrode 50602 are wavy shapes.

Figure 63B:
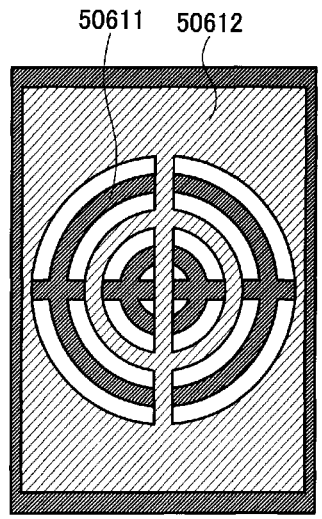

FIG. 63B shows a first pixel electrode 50611 and a second pixel electrode 50612. The first pixel electrode 50611 and the second pixel electrode 50612 have shapes having concentric openings.

Figure 63C:
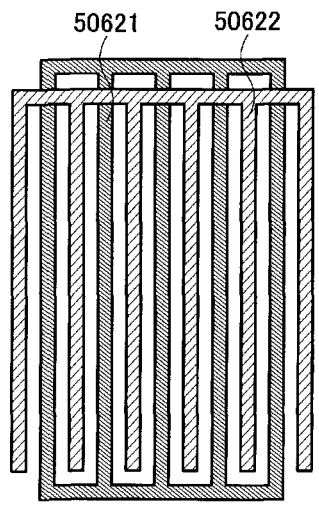

FIG. 63C shows a first pixel electrode 50621 and a second pixel electrode 50622. The first pixel electrode 50621 and the second pixel electrode 50622 are comb shapes and partially overlap with each other.

Figure 63D:
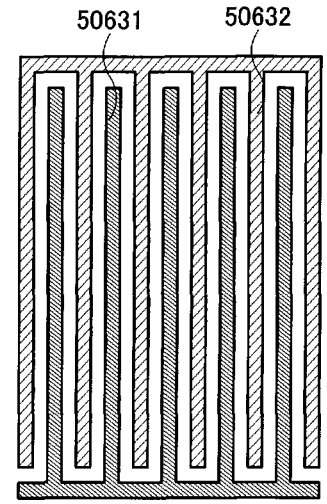

FIG. 63D shows a first pixel electrode 50631 and a second pixel electrode 50632. The first pixel electrode 50631 and the second pixel electrode 50632 are comb shapes in which electrodes engage with each other.

In the case where voltage is applied to the first pixel electrodes (50601, 50611, 50621, and 50631) and the second pixel electrodes (50602, 50612, 50622, and 50623) (referred to as a horizontal electric field mode), liquid crystal molecules are aligned along a line of electric force which is deviated from a rubbing direction. Since light emitted from a backlight passes through a substrate when a pair of polarizing plates is provided so as to be in a cross nicol state, white display is performed.

Note that by controlling voltage applied to the first pixel electrodes (50601, 50611, 50621, and 50631) and the second pixel electrodes (50602, 50612, 50622, and 50623), conditions of the liquid crystal molecules can be controlled. Therefore, since the amount of light emitted from the backlight passing through the substrate can be controlled, predetermined image display can be performed.

In the case where voltage is not applied to the first pixel electrodes (50601, 50611, 50621, and 50631) and the second pixel electrodes (50602, 50612, 50622, and 50623), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

It is acceptable as long as a known material be used for a liquid crystal material used for an IPS mode.

FIGS. 64A to 64D are top plan views of a pixel portion to which an FFS mode is applied. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

In the FFS mode, a first electrode is formed over a top surface of a second electrode so as to be various shapes.

Figure 64A:
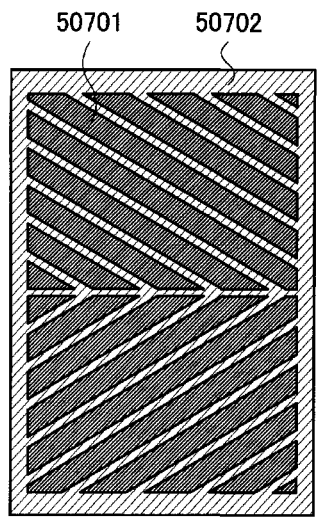
FIGS. 64A to 64D each are a top plan view of a display device according to the invention.

FIG. 64A shows a first pixel electrode 50701 and a second pixel electrode 50702. The first pixel electrode 50701 is a bent dogleg shape. The second pixel electrode 50702 is not necessarily patterned.

Figure 64B:
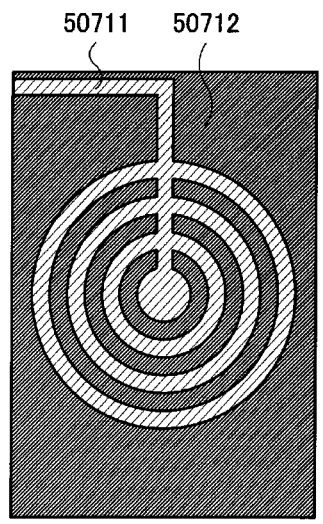

FIG. 64B shows a first pixel electrode 50711 and a second pixel electrode 50712. The first pixel electrode 50711 is a concentric shape. The second pixel electrode 50712 is not necessarily patterned.

Figure 64C:
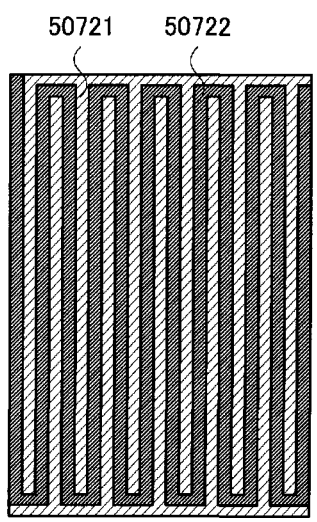

FIG. 64C shows a first pixel electrode 50721 and a second pixel electrode 50722. The first pixel electrode 50721 is a winding shape. The second pixel electrode 50722 is not necessarily patterned.

Figure 64D:
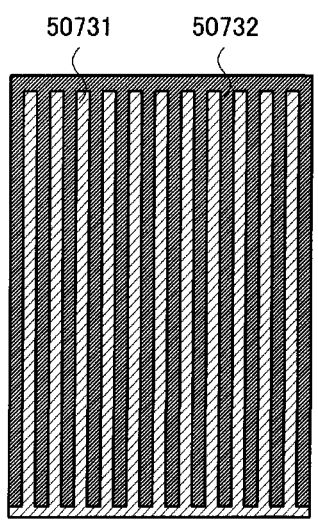

FIG. 64D shows a first pixel electrode 50731 and a second pixel electrode 50732. The first pixel electrode 50731 is a comb shape. The second pixel electrode 50732 is not necessarily patterned.

In the case where voltage is applied to the first pixel electrodes (50701, 50711, 50721, and 50731) and the second pixel electrodes (50702, 50712, 50722, and 50732) (referred to as a horizontal electric field mode), liquid crystal molecules are aligned along a line of electric force which is deviated from a rubbing direction. Since light emitted from a backlight passes through a substrate when a pair of polarizing plates is provided so as to be in a cross nicol state, white display is performed.

Note that by controlling voltage applied to the first pixel electrodes (50701, 50711, 50721, and 50731) and the second pixel electrodes (50702, 50712, 50722, and 50732), conditions of the liquid crystal molecules can be controlled. Therefore, since the amount of light emitted from the backlight passing through the substrate can be controlled, predetermined image display can be performed.

In the case where voltage is not applied to the first pixel electrodes (50701, 50711, 50721, and 50731) and the second pixel electrodes (50702, 50712, 50722, and 50732), the liquid crystal molecules are aligned laterally in the rubbing direction. Since light emitted from the backlight does not pass through the substrate when the pair of polarizing plates is provided so as to be in the cross nicol state, black display is performed. This is a so-called normally black mode.

It is acceptable as long as a known material is used for a liquid crystal material used for an FFS mode.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 13

In this embodiment mode, a pixel structure of a display device is described. In particular, a pixel structure of a liquid crystal display device is described.

A pixel structure in the case where each liquid crystal mode and a transistor are combined is described with reference to cross-sectional views of a pixel.

Note that as the transistor, a thin film transistor (a TFT) or the like including a non-single crystalline semiconductor layer typified by an amorphous silicon layer, a polycrystalline silicon layer, a microcrystalline (also referred to as semi-amorphous) silicon layer, or the like can be used.

As a structure of the transistor, a top-gate structure, a bottom-gate structure, or the like can be used. Note that a channel-etched transistor, a channel-protective transistor, or the like can be used as a bottom-gate transistor.

Figure 65:
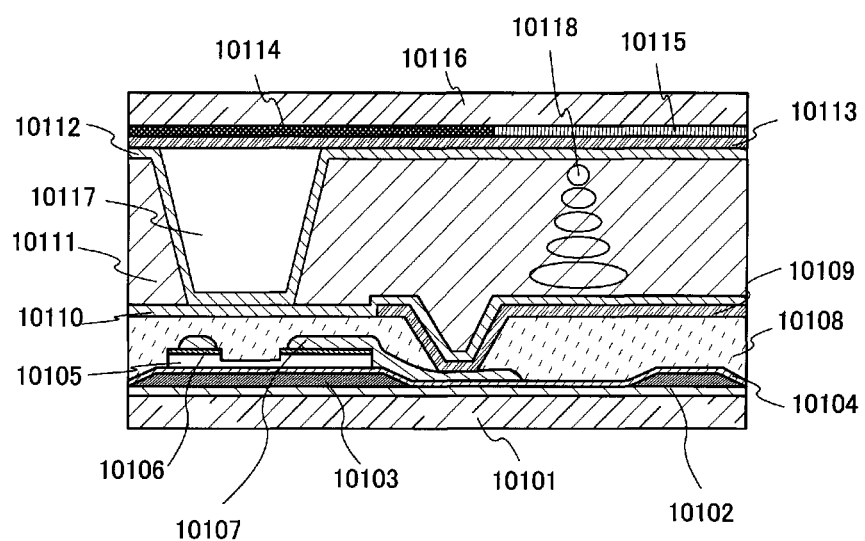
FIG. 65 is a cross-sectional view of a display device according to the invention.

FIG. 65 is an example of a cross-sectional view of a pixel in the case where a TN mode and a transistor are combined. By applying the pixel structure shown in FIG. 65 to a liquid crystal display device, a liquid crystal display device can be formed at low cost.

Features of the pixel structure shown in FIG. 65 are described. Liquid crystal molecules 10118 shown in FIG. 65 are long and narrow molecules each having a major axis and a minor axis. In FIG. 65, a direction of each of the liquid crystal molecules 10118 is expressed by the length thereof. That is, the direction of the major axis of the liquid crystal molecule 10118, which is expressed as long, is parallel to the page, and as the liquid crystal molecule 10118 is expressed to be shorter, the direction of the major axis becomes closer to a normal direction of the page. That is, among the liquid crystal molecules 10118 shown in FIG. 65, the direction of the major axis of the liquid crystal molecule 10118 which is close to a first substrate 10101 and the direction of the major axis of the liquid crystal molecule 10118 which is close to a second substrate 10116 are different from each other by 90 degrees, and the directions of the major axes of the liquid crystal molecules 10118 located therebetween are arranged so as to link the above two directions smoothly. That is, the liquid crystal molecules 10118 shown in FIG. 65 are aligned to be twisted by 90 degrees between the first substrate 10101 and the second substrate 10116.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion for displaying images, which is called a liquid crystal panel. The liquid crystal panel is manufactured as follows: two processed substrates are attached to each other with a gap of several μm therebetween, and a liquid crystal material is injected into a space between the two substrates. In FIG. 65, the two substrates correspond to the first substrate 10101 and the second substrate 10116. A transistor and a pixel electrode are formed over the first substrate. A light-shielding film 10114, a color filter 10115, a fourth conductive layer 10113, a spacer 10117, and a second alignment film 10112 are formed over the second substrate.

The light-shielding film 10114 is not necessarily formed over the second substrate 10116. When the light-shielding film 10114 is not formed, the number of steps is reduced, so that manufacturing cost can be reduced. Further, since a structure is simple, yield can be improved. Alternatively, when the light-shielding film 10114 is formed, a display device with less light leakage at the time of black display can be obtained.

The color filter 10115 is not necessarily formed over the second substrate 10116. When the color filter 10115 is not formed, the number of steps is reduced, so that manufacturing cost can be reduced. Further, since a structure is simple, yield can be improved. Note that even when the color filter 10115 is not formed, a display device which can perform color display can be obtained by field sequential driving. Alternatively, when the color filter 10115 is formed, a display device which can perform color display can be obtained.

Spherical spacers may be dispersed instead of forming the spacer 10117. When the spherical spacers are dispersed, the number of steps is reduced, so that manufacturing cost can be reduced. In addition, since a structure is simple when the spherical spacers are dispersed, yield can be improved. Alternatively, when the spacer 10117 is formed, a distance between the two substrates can be uniform because a position of the spacer is not varied, so that a display device with little display unevenness can be obtained.

A process to be performed to the first substrate 10101 is described below.

First, a first insulating film 10102 is formed over the first substrate 10101 by sputtering, a printing method, a coating method, or the like. Note that the first insulating film 10102 is not necessarily formed. The first insulating film 10102 has a function of preventing change in characteristics of the transistor due to an adverse effect of an impurity from the first substrate 10101 on a semiconductor layer.

Next, a first conductive layer 10103 is formed over the first insulating film 10102 by photolithography, a laser direct writing method, an inkjet method, or the like.

Next, a second insulating film 10104 is formed over the entire surface by sputtering, a printing method, a coating method, or the like. The second insulating film 10104 has a function of preventing change in characteristics of the transistor due to an adverse effect of an impurity from the first substrate 10101 on the semiconductor layer.

Next, a first semiconductor layer 10105 and a second semiconductor layer 10106 are formed. Note that the first semiconductor layer 10105 and the second semiconductor layer 10106 are formed sequentially and shapes thereof are processed at the same time.

Next, a second conductive layer 10107 is formed by photolithography, a laser direct writing method, an inkjet method, or the like. Note that as a method for etching which is performed at the time of processing a shape of the second conductive layer 10107, dry etching is preferable. Note that either a light-transmitting material or a reflective material may be used for the second conductive layer 10107.

Next, a channel formation region of the transistor is formed. Here, an example of a step thereof is described. The second semiconductor layer 10106 is etched by using the second conductive layer 10107 as a mask. Alternatively, the second semiconductor layer 10106 is etched by using a mask for processing the shape of the second conductive layer 10107. Then, the first conductive layer 10103 at a position where the second semiconductor layer 10106 is removed serves as the channel formation region of the transistor. Thus, the number of masks can be reduced, so that manufacturing cost can be reduced.

Next, a third insulating film 10108 is formed and a contact hole is selectively formed in the third insulating film 10108. Note that a contact hole may be formed also in the second insulating film 10104 at the same time as forming the contact hole in the third insulating film 10108. Note that a surface of the third insulating film 10108 is preferably as even as possible. This is because alignment of the liquid crystal molecules are affected by roughness of a surface with which the liquid crystal is in contact.

Next, a third conductive layer 10109 is formed by photolithography, a laser direct writing method, an inkjet method, or the like.

Next, a first alignment film 10110 is formed. Note that after the first alignment film 10110 is formed, rubbing may be performed so as to control the alignment of the liquid crystal molecules. Rubbing is a step of forming stripes on an alignment film by rubbing the alignment film with a cloth. By performing rubbing, the alignment film can have alignment properties.

The first substrate 10101 which is manufactured as described above and the second substrate 10116 provided with the light-shielding film 10114, the color filter 10115, the fourth conductive layer 10113, the spacer 10117, and the second alignment film 10112 are attached to each other by a sealant with a gap of several μm therebetween. Then, a liquid crystal material is injected into a space between the two substrates. Note that in the TN mode, the fourth conductive layer 10113 is formed over the entire surface of the second substrate 10116.

Figure 66A:
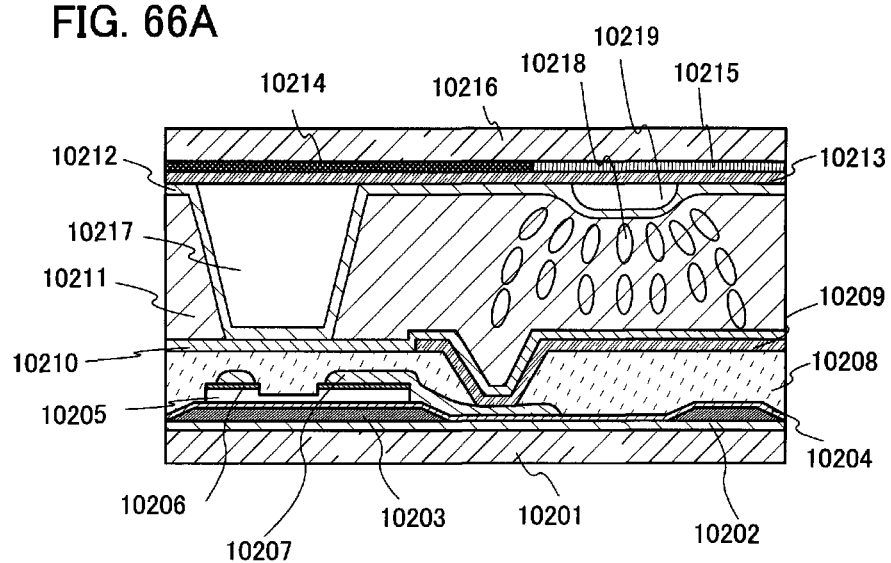
FIGS. 66A and 66B each are a cross-sectional view of a display device according to the invention.

FIG. 66A is an example of a cross-sectional view of a pixel in the case where an MVA (multi-domain vertical alignment) mode and a transistor are combined. By applying the pixel structure shown in FIG. 66A to a liquid crystal display device, a liquid crystal display device having a wide viewing angle, high response speed, and high contrast can be obtained.

Features of the pixel structure shown in FIG. 66A are described below. Features of the pixel structure of an MVA mode liquid crystal panel are described. Liquid crystal molecules 10218 shown in FIG. 66A are long and narrow molecules each having a major axis and a minor axis. In FIG. 66A, a direction of each of the liquid crystal molecules 10218 is expressed by the length thereof. That is, the direction of the major axis of the liquid crystal molecule 10218, which is expressed as long, is parallel to the page, and as the liquid crystal molecule 10218 is expressed to be shorter, the direction of the major axis becomes closer to a normal direction of the page. That is, each of the liquid crystal molecules 10218 shown in FIG. 66A is aligned such that the direction of the major axis is normal to the alignment film. Thus, the liquid crystal molecules 10218 at a position where an alignment control protrusion 10219 is formed are aligned radially with the alignment control protrusion 10219 as a center. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion for displaying images, which is called a liquid crystal panel. The liquid crystal panel is manufactured as follows: two processed substrates are attached to each other with a gap of several μm therebetween, and a liquid crystal material is injected into a space between the two substrates. In FIG. 66A, the two substrates correspond to a first substrate 10201 and a second substrate 10216. A transistor and a pixel electrode are formed over the first substrate. A light-shielding film 10214, a color filter 10215, a fourth conductive layer 10213, a spacer 10217, a second alignment film 10212, and the alignment control protrusion 10219 are formed over the second substrate.

The light-shielding film 10214 is not necessarily formed over the second substrate 10216. When the light-shielding film 10214 is not formed, the number of steps is reduced, so that manufacturing cost can be reduced. Further, since a structure is simple, yield can be improved. Alternatively, when the light-shielding film 10214 is formed, a display device with less light leakage at the time of black display can be obtained.

The color filter 10215 is not necessarily formed over the second substrate 10216. When the color filter 10215 is not formed, the number of steps is reduced, so that manufacturing cost can be reduced. Further, since a structure is simple, yield can be improved. Note that even when the color filter 10215 is not formed, a display device which can perform color display can be obtained by field sequential driving. Alternatively, when the color filter 10215 is formed, a display device which can perform color display can be obtained.

Spherical spacers may be dispersed instead of forming the spacer 10217. When the spherical spacers are dispersed, the number of steps is reduced, so that manufacturing cost can be reduced. In addition, since a structure is simple when the spherical spacers are dispersed, yield can be improved. Alternatively, when the spacer 10217 is formed, a distance between the two substrates can be uniform because a position of the spacer is not varied, so that a display device with little display unevenness can be obtained.

A process to be performed to the first substrate 10201 is described below.

First, a first insulating film 10202 is formed over the first substrate 10201 by sputtering, a printing method, a coating method, or the like. Note that the first insulating film 10202 is not necessarily formed. The first insulating film 10202 has a function of preventing change in characteristics of the transistor due to an adverse effect of an impurity from the first substrate 10201 on a semiconductor layer.

Next, a first conductive layer 10203 is formed over the first insulating film 10202 by photolithography, a laser direct writing method, an inkjet method, or the like.

Next, a second insulating film 10204 is formed over the entire surface by sputtering, a printing method, a coating method, or the like. The second insulating film 10204 has a function of preventing change in characteristics of the transistor due to an adverse effect of an impurity from the first substrate 10201 on the semiconductor layer.

Next, a first semiconductor layer 10205 and a second semiconductor layer 10206 are formed. Note that the first semiconductor layer 10205 and the second semiconductor layer 10206 are formed sequentially and shapes thereof are processed at the same time.

Next, a second conductive layer 10207 is formed by photolithography, a laser direct writing method, an inkjet method, or the like. Note that as a method for etching which is performed at the time of processing a shape of the second conductive layer 10207, dry etching is preferable. Note that as the second conductive layer 10207, either a light-transmitting material or a reflective material may be used.

Next, a channel formation region of the transistor is formed. Here, an example of a step thereof is described. The second semiconductor layer 10206 is etched by using the second conductive layer 10207 as a mask. Alternatively, the second semiconductor layer 10206 is etched by using a mask for processing the shape of the second conductive layer 10207. Then, the first conductive layer 10203 at a position where the second semiconductor layer 10206 is removed serves as the channel formation region of the transistor. Thus, the number of masks can be reduced, so that manufacturing cost can be reduced.

Next, a third insulating film 10208 is formed and a contact hole is selectively formed in the third insulating film 10208. Note that a contact hole may be formed also in the second insulating film 10204 at the same time as forming the contact hole in the third insulating film 10208.

Next, a third conductive layer 10209 is formed by photolithography, a laser direct writing method, an inkjet method, or the like.

Next, a first alignment film 10210 is formed. Note that after the first alignment film 10210 is formed, rubbing may be performed so as to control the alignment of the liquid crystal molecules. Rubbing is a step of forming stripes on an alignment film by rubbing the alignment film with a cloth. By performing rubbing, the alignment film can have alignment properties.

The first substrate 10201 which is manufactured as described above and the second substrate 10216 provided with the light-shielding film 10214, the color filter 10215, the fourth conductive layer 10213, the spacer 10217, and the second alignment film 10212 are attached to each other by a sealant with a gap of several μm therebetween. Then, a liquid crystal material is injected into a space between the two substrates. Note that in the MVA mode, the fourth conductive layer 10213 is formed over the entire surface of the second substrate 10216. Note that the alignment control protrusion 10219 is formed so as to be in contact with the fourth conductive layer 10213. The alignment control protrusion 10219 preferably has a shape with a smooth curved surface. Thus, alignment of the adjacent liquid crystal molecules 10218 is extremely similar, so that an alignment defect can be reduced. Further, a defect of the alignment film caused by disconnection of the alignment film can be reduced.

Figure 66B:
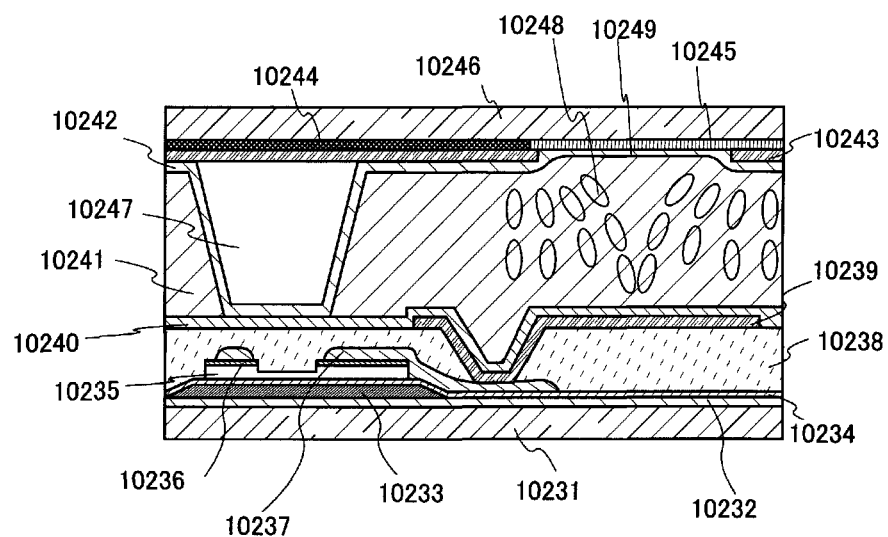

FIG. 66B is an example of a cross-sectional view of a pixel in the case where a PVA (patterned vertical alignment) mode and a transistor are combined. By applying the pixel structure shown in FIG. 66B to a liquid crystal display device, a liquid crystal display device having a wide viewing angle, high response speed, and high contrast can be obtained.

Features of the pixel structure shown in FIG. 66B are described below. Liquid crystal molecules 10248 shown in FIG. 66B are long and narrow molecules each having a major axis and a minor axis. In FIG. 66B, a direction of each of the liquid crystal molecules 10248 is expressed by the length thereof. That is, the direction of the major axis of the liquid crystal molecule 10248, which is expressed as long, is parallel to the page, and as the liquid crystal molecule 10248 is expressed to be shorter, the direction of the major axis becomes closer to a normal direction of the page. That is, each of the liquid crystal molecules 10248 shown in FIG. 66B is aligned such that the direction of the major axis is normal to the alignment film. Thus, the liquid crystal molecules 10248 at a position where an electrode notch portion 10249 is formed are aligned radially with a boundary of the electrode notch portion 10249 and the fourth conductive layer 10243 as a center. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion for displaying images, which is called a liquid crystal panel. The liquid crystal panel is manufactured as follows: two processed substrates are attached to each other with a gap of several μm therebetween, and a liquid crystal material is injected into a space between the two substrates. In FIG. 66B, the two substrates correspond to a first substrate 10231 and a second substrate 10246. A transistor and a pixel electrode are formed over the first substrate. A light-shielding film 10244, a color filter 10245, a fourth conductive layer 10243, a spacer 10247, and a second alignment film 10242 are formed over the second substrate.

The light-shielding film 10244 is not necessarily formed over the second substrate 10246. When the light-shielding film 10244 is not formed, the number of steps is reduced, so that manufacturing cost can be reduced. Further, since a structure is simple, yield can be improved. Alternatively, when the light-shielding film 10244 is formed, a display device with less light leakage at the time of black display can be obtained.

The color filter 10245 is not necessarily formed over the second substrate 10246. When the color filter 10245 is not formed, the number of steps is reduced, so that manufacturing cost can be reduced. Further, since a structure is simple, yield can be improved. Note that even when the color filter 10245 is not formed, a display device which can perform color display can be obtained by field sequential driving. Alternatively, when the color filter 10245 is formed, a display device which can perform color display can be obtained.

Spherical spacers may be dispersed over the second substrate 10246 instead of forming the spacer 10247. When the spherical spacers are dispersed, the number of steps is reduced, so that manufacturing cost can be reduced. In addition, since a structure is simple when the spherical spacers are dispersed, yield can be improved. Alternatively, when the spacer 10247 is formed, a distance between the two substrates can be uniform because a position of the spacer is not varied, so that a display device with little display unevenness can be obtained.

A process to be performed to the first substrate 10231 is described below.

First, a first insulating film 10232 is formed over the first substrate 10231 by sputtering, a printing method, a coating method, or the like. Note that the first insulating film 10232 is not necessarily formed. The first insulating film 10232 has a function of preventing change in characteristics of the transistor due to an adverse effect of an impurity from the first substrate 10231 on a semiconductor layer.

Next, a first conductive layer 10233 is formed over the first insulating film 10232 by photolithography, a laser direct writing method, an inkjet method, or the like.

Next, a second insulating film 10234 is formed over the entire surface by sputtering, a printing method, a coating method, or the like. The second insulating film 10234 has a function of preventing change in characteristics of the transistor due to an adverse effect of an impurity from the first substrate 10231 on the semiconductor layer.

Next, a first semiconductor layer 10235 and a second semiconductor layer 10236 are formed. Note that the first semiconductor layer 10235 and the second semiconductor layer 10236 are formed sequentially and shapes thereof are processed at the same time.

Next, a second conductive layer 10237 is formed by photolithography, a laser direct writing method, an inkjet method, or the like. Note that as a method for etching which is performed at the time of processing a shape of the second conductive layer 10237, dry etching is preferable. Note that as the second conductive layer 10237, either a light-transmitting material or a reflective material may be used.

Next, a channel formation region of the transistor is formed. Here, an example of a step thereof is described. The second semiconductor layer 10236 is etched by using the second conductive layer 10237 as a mask. Alternatively, the second semiconductor layer 10236 is etched by using a mask for processing the shape of the second conductive layer 10237. Then, the first conductive layer 10233 at a position where the second semiconductor layer 10236 is removed serves as the channel formation region of the transistor. Thus, the number of masks can be reduced, so that manufacturing cost can be reduced.

Next, a third insulating film 10238 is formed and a contact hole is selectively formed in the third insulating film 10238. Note that a contact hole may be formed also in the second insulating film 10234 at the same time as forming the contact hole in the third insulating film 10238. Note that a surface of the third insulating film 10238 is preferably as even as possible. This is because alignment of the liquid crystal molecules are affected by roughness of a surface with which the liquid crystal is in contact.

Next, a third conductive layer 10239 is formed by photolithography, a laser direct writing method, an inkjet method, or the like.

Next, a first alignment film 10240 is formed. Note that after the first alignment film 10240 is formed, rubbing may be performed so as to control the alignment of the liquid crystal molecules. Rubbing is a step of forming stripes on an alignment film by rubbing the alignment film with a cloth. By performing rubbing, the alignment film can have alignment properties.

The first substrate 10231 which is manufactured as described above and the second substrate 10246 provided with the light-shielding film 10244, the color filter 10245, the fourth conductive layer 10243, the spacer 10247, and the second alignment film 10242 are attached to each other by a sealant with a gap of several μm therebetween. Then, a liquid crystal material is injected into a space between the two substrates. Note that in the PVA mode, the fourth conductive layer 10243 is patterned and is provided with the electrode notch portion 10249. Although a shape of the electrode notch portion 10249 is not particularly limited, the electrode notch portion 10249 preferably has a shape in which a plurality of rectangles having different directions are combined. Thus, a plurality of regions having different alignment can be formed, so that a liquid crystal display device having a wide viewing angle can be obtained. Note that the fourth conductive layer 10243 at the boundary between the electrode notch portion 10249 and the fourth conductive layer 10243 preferably has a shape with a smooth curved surface. Thus, alignment of the adjacent liquid crystal molecules 10248 is extremely similar, so that an alignment defect is reduced. Further, a defect of the alignment film caused by disconnection of the second alignment film 10242 by the electrode notch portion 10249 can be prevented.

Figure 67A:
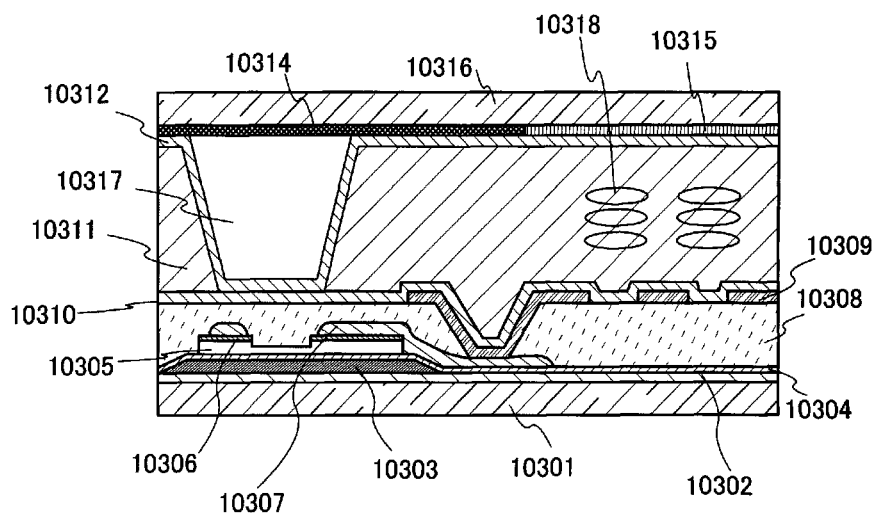
FIGS. 67A and 67B each are a cross-sectional view of a display device according to the invention.

FIG. 67A is an example of a cross-sectional view of a pixel in the case where an IPS (in-plane-switching) mode and a transistor are combined. By applying the pixel structure shown in FIG. 67A to a liquid crystal display device, a liquid crystal display device theoretically having a wide viewing angle and response speed which has low dependency on a gray scale can be obtained.

Features of the pixel structure shown in FIG. 67A are described below. Liquid crystal molecules 10318 shown in FIG. 67A are long and narrow molecules each having a major axis and a minor axis. In FIG. 67A, a direction of each of the liquid crystal molecules 10318 is expressed by the length thereof. That is, the direction of the major axis of the liquid crystal molecule 10318, which is expressed as long, is parallel to the page, and as the liquid crystal molecule 10318 is expressed to be shorter, the direction of the major axis becomes closer to a normal direction of the page. That is, each of the liquid crystal molecules 10318 shown in FIG. 67A is aligned so that the direction of the major axis thereof is always horizontal to the substrate. Although FIG. 67A shows alignment with no electric field, when an electric field is applied to the liquid crystal molecules 10318, each of the liquid crystal molecules 10318 rotates in a horizontal plane as the direction of the major axis thereof is always horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion displaying images, which is called a liquid crystal panel. The liquid crystal panel is manufactured as follows: two processed substrates are attached to each other with a gap of several μm therebetween, and a liquid crystal material is injected into a space between the two substrates. In FIG. 67A, the two substrates correspond to the first substrate 10301 and the second substrate 10316. A transistor and a pixel electrode are formed over the first substrate. A light-shielding film 10314, a color filter 10315, a spacer 10317, and a second alignment film 10312 are formed on the second substrate.

The light-shielding film 10314 is not necessarily formed on the second substrate 10316. When the light-shielding film 10314 is not formed, the number of steps is reduced, so that manufacturing cost can be reduced. Further, since a structure is simple, yield can be improved. Alternatively, when the light-shielding film 10314 is formed, a display device with less light leakage at the time of black display can be obtained.

The color filter 10315 is not necessarily formed on the second substrate 10316. When the color filter 10315 is not formed, the number of steps is reduced, so that manufacturing cost can be reduced. Further, since a structure is simple, yield can be improved. Note that even when the color filter 10315 is not formed, a display device which can perform color display can be obtained by field sequential driving. Alternatively, when the color filter 10315 is formed, a display device which can perform color display can be obtained.

Spherical spacers may be dispersed on the second substrate 10316 instead of forming the spacer 10317. When the spherical spacers are dispersed, the number of steps is reduced, so that manufacturing cost can be reduced. In addition, since a structure is simple when the spherical spacers are dispersed, yield can be improved. Alternatively, when the spacer 10317 is formed, a distance between the two substrates can be uniform because a position of the spacer is not varied, so that a display device with little display unevenness can be obtained.

A process to be performed to the first substrate 10301 is described.

First, a first insulating film 10302 is formed over the first substrate 10301 by sputtering, a printing method, a coating method, or the like. Note that the first insulating film 10302 is not necessarily formed. The first insulating film 10302 has a function of preventing change in characteristics of the transistor due to an adverse effect of an impurity from the first substrate 10301 on a semiconductor layer.

Next, a first conductive layer 10303 is formed over the first insulating film 10302 by photolithography, a laser direct writing method, an inkjet method, or the like.

Next, a second insulating film 10304 is formed over the entire surface by sputtering, a printing method, a coating method, or the like. The second insulating film 10304 has a function of preventing change in characteristics of the transistor due to an adverse effect of an impurity from the first substrate 10301 on the semiconductor layer.

Next, a first semiconductor layer 10305 and a second semiconductor layer 10306 are formed. Note that the first semiconductor layer 10305 and the second semiconductor layer 10306 are formed sequentially and shapes thereof are processed at the same time.

Next, a second conductive layer 10307 is formed by photolithography, a laser direct writing method, an inkjet method, or the like. Note that as a method for etching which is performed at the time of processing a shape of the second conductive layer 10307, dry etching is preferable. Note that as the second conductive layer 10307, either a light-transmitting material or a reflective material may be used.

Next, a channel formation region of the transistor is formed. Here, an example of a step thereof is described. The second semiconductor layer 10106 is etched by using the second conductive layer 10307 as a mask. Alternatively, the second semiconductor layer 10306 is etched by using a mask for processing the shape of the second conductive layer 10307. Then, the first conductive layer 10303 at a position where the second semiconductor layer 10306 is removed serves as the channel formation region of the transistor. Thus, the number of masks can be reduced, so that manufacturing cost can be reduced.

Next, a third insulating film 10308 is formed and a contact hole is selectively formed in the third insulating film 10308. Note that a contact hole may be formed also in the second insulating film 10304 at the same time as forming the contact hole in the third insulating film 10308.

Next, a third conductive layer 10309 is formed by photolithography, a laser direct writing method, an inkjet method, or the like. Here, the third conductive layer 10309 has a shape in which two comb-shaped electrodes engage with each other. One of the comb-shaped electrodes is electrically connected to one of a source electrode and a drain electrode of the transistor, and the other of the comb-shaped electrodes is electrically connected to a common electrode. Thus, a horizontal electric field can be effectively applied to the liquid crystal molecules 10318.

Next, a first alignment film 10310 is formed. Note that after the first alignment film 10310 is formed, rubbing may be performed so as to control the alignment of the liquid crystal molecules. Rubbing is a step of forming stripes on an alignment film by rubbing the alignment film with a cloth. By performing rubbing, the alignment film can have alignment properties.

The first substrate 10301 which is manufactured as described above and the second substrate 10316 provided with the light-shielding film 10314, the color filter 10315, the spacer 10317, and the second alignment film 10312 are formed are attached to each other by a sealant with a gap of several μm therebetween. Then, a liquid crystal material is injected into a space between the two substrates.

Figure 67B:
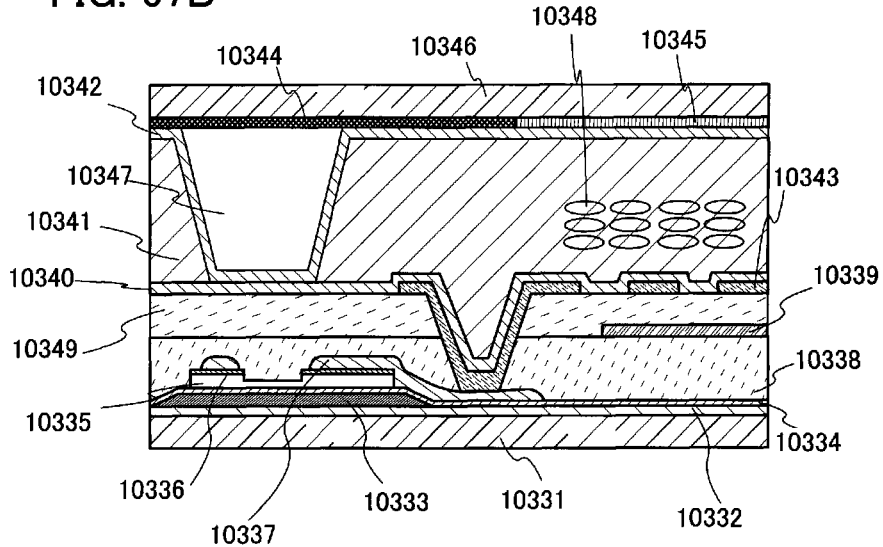

FIG. 67B is an example of a cross-sectional view of a pixel in the case where an FFS (fringe field switching) mode and a transistor are combined. By applying the pixel structure shown in FIG. 67B to a liquid crystal display device, a liquid crystal display device theoretically having a wide viewing angle and response speed which has low dependency on a gray scale can be obtained.

Features of the pixel structure shown in FIG. 67B are described. Liquid crystal molecules 10348 shown in FIG. 67B are long and narrow molecules each having a major axis and a minor axis. In FIG. 67B, a direction of each of the liquid crystal molecules 10348 is expressed by the length thereof. That is, the direction of the major axis of the liquid crystal molecule 10348, which is expressed as long, is parallel to the page, and as the liquid crystal molecule 10348 is expressed to be shorter, the direction of the major axis becomes closer to a normal direction of the page. That is, each of the liquid crystal molecules 10348 shown in FIG. 67B is aligned so that the direction of the major axis thereof is always horizontal to the substrate. Although FIG. 67B shows alignment with no electric field, when an electric field is applied to the liquid crystal molecules 10348, each of the liquid crystal molecules 10348 rotates in a horizontal plane as the direction of the major axis thereof is kept to be horizontal to the substrate. With this state, a liquid crystal display device having a wide viewing angle can be obtained.

Note that the case is described in which a bottom-gate transistor using an amorphous semiconductor is used as the transistor. In the case where a transistor using an amorphous semiconductor is used, a liquid crystal display device can be formed at low cost by using a large substrate.

A liquid crystal display device includes a basic portion for displaying images, which is called a liquid crystal panel. The liquid crystal panel is manufactured as follows: two processed substrates are attached to each other with a gap of several μm therebetween, and a liquid crystal material is injected into a space between the two substrates. In FIG. 67B, the two substrates correspond to a first substrate 10331 and a second substrate 10346. A transistor and a pixel electrode are formed over the first substrate. A light-shielding film 10344, a color filter 10345, a spacer 10347, and a second alignment film 10342 are formed over the second substrate.

The light-shielding film 10344 is not necessarily formed over the second substrate 10346. When the light-shielding film 10344 is not formed, the number of steps is reduced, so that manufacturing cost can be reduced. Further, since a structure is simple, yield can be improved. Alternatively, when the light-shielding film 10344 is formed, a display device with less light leakage at the time of black display can be obtained.

The color filter 10345 is not necessarily formed over the second substrate 10346. When the color filter 10345 is not formed, the number of steps is reduced, so that manufacturing cost can be reduced. Further, since a structure is simple, yield can be improved. Note that even when the color filter 10345 is not formed, a display device which can perform color display can be obtained by field sequential driving. Alternatively, when the color filter 10345 is formed, a display device which can perform color display can be obtained.

Spherical spacers may be dispersed over the second substrate 10346 instead of forming the spacer 10347. When the spherical spacers are dispersed, the number of steps is reduced, so that manufacturing cost can be reduced. In addition, since a structure is simple when the spherical spacers are dispersed, yield can be improved. Alternatively, when the spacer 10347 is formed, a distance between the two substrates can be uniform because a position of the spacer is not varied, so that a display device with little display unevenness can be obtained.

A process to be performed to the first substrate 10331 is described below.

First, a first insulating film 10332 is formed over the first substrate 10331 by sputtering, a printing method, a coating method, or the like. Note that the first insulating film 10332 is not necessarily formed. The first insulating film 10332 has a function of preventing change in characteristics of the transistor due to an adverse effect of an impurity from the first substrate 10331 on a semiconductor layer.

Next, a first conductive layer 10333 is formed over the first insulating film 10332 by photolithography, a laser direct writing method, an inkjet method, or the like.

Next, a second insulating film 10334 is formed over the entire surface by sputtering, a printing method, a coating method, or the like. The second insulating film 10334 has a function of preventing change in characteristics of the transistor due to an adverse effect of an impurity from the first substrate 10331 on the semiconductor layer.

Next, a first semiconductor layer 10335 and a second semiconductor layer 10336 are formed. Note that the first semiconductor layer 10335 and the second semiconductor layer 10336 are formed sequentially and shapes thereof are processed at the same time.

Next, a second conductive layer 10337 is formed by photolithography, a laser direct writing method, an inkjet method, or the like. Note that as a method for etching which is performed at the time of processing a shape of the second conductive layer 10337, dry etching is preferable. Note that as the second conductive layer 10337, either a light-transmitting material or a reflective material may be used.

Next, a channel formation region of the transistor is formed. Here, an example of a step thereof is described. The second semiconductor layer 10336 is etched by using the second conductive layer 10337 as a mask. Alternatively, the second semiconductor layer 10336 is etched by using a mask for processing the shape of the second conductive layer 10337. Then, the first conductive layer 10333 at a position where the second semiconductor layer 10336 is removed serves as the channel formation region of the transistor. Thus, the number of masks can be reduced, so that manufacturing cost can be reduced.

Next, a third insulating film 10338 is formed and a contact hole is selectively formed in the third insulating film 10338.

Next, a fourth conductive layer 10343 is formed by photolithography, a laser direct writing method, an inkjet method, or the like.

Next, a fourth insulating film 10349 is formed and a contact hole is selectively formed in the fourth insulating film 10349. Note that a surface of the fourth insulating film 10349 is preferably as even as possible. This is because alignment of the liquid crystal molecules are affected by roughness of a surface with which the liquid crystal is in contact.

Next, a third conductive layer 10339 is formed by photolithography, a laser direct writing method, an inkjet method, or the like. Here, the third conductive layer 10339 is comb-shaped.

Next, a first alignment film 10340 is formed. Note that after the first alignment film 10340 is formed, rubbing may be performed so as to control the alignment of the liquid crystal molecules. Rubbing is a step of forming stripes on an alignment film by rubbing the alignment film with a cloth. By performing rubbing, the alignment film can have alignment properties.

The first substrate 10331 which is manufactured as described above and the second substrate 10346 provided with the light-shielding film 10344, the color filter 10345, the spacer 10347, and the second alignment film 10342 are attached to each other by a sealant with a gap of several μm therebetween. Then, a liquid crystal material is injected into a space between the two substrates. Accordingly, a liquid crystal panel can be manufactured.

Here, materials which can be used for conductive layers or insulating films are described.

As the first insulating film 10102 in FIG. 65, the first insulating film 10202 in FIG. 66A, the first insulating film 10232 in FIG. 66B, the first insulating film 10302 in FIG. 67A, or the first insulating film 10332 in FIG. 67B, an insulating film such as a silicon oxide film, a silicon nitride film, or a silicon oxynitride ($SiO_xN_y$) film can be used. Alternatively, an insulating film having a stacked-layer structure in which two or more of a silicon oxide film, a silicon nitride film, a silicon oxynitride ($SiO_xN_y$) film, and the like are combined can be used as.

As the first conductive layer 10103 in FIG. 65, the first conductive layer 10203 in FIG. 66A, the first conductive layer 10233 in FIG. 66B, the first conductive layer 10303 in FIG. 67A, or the first conductive layer 10333 in FIG. 67B, Mo, Ti, Al, Nd, Cr, or the like can be used. Alternatively, a stacked-layer structure in which two or more of Mo, Ti, Al, Nd, Cr, and/or the like are combined can be used.

As the second insulating film 10104 in FIG. 65, the second insulating film 10204 in FIG. 66A, the second insulating film 10234 in FIG. 66B, the second insulating film 10304 in FIG. 67A, or the second insulating film 10334 in FIG. 67B, a thermal oxide film, a silicon oxide film, a silicon nitride film, a silicon oxynitride film, or the like can be used. Alternatively, a stacked-layer structure in which two or more of a thermal oxide film, a silicon oxide film, a silicon nitride film, a silicon oxynitride film, and/or the like are combined can be used. Note that a silicon oxide film is preferable in a portion which is in contact with a semiconductor layer. This is because a trap level at an interface with the semiconductor layer decreases when a silicon oxide film is used. Note that a silicon nitride film is preferable in a portion which is in contact with Mo. This is because a silicon nitride film does not oxidize Mo.

As the first semiconductor layer 10105 in FIG. 65, the first semiconductor layer 10205 in FIG. 66A, the first semiconductor layer 10235 in FIG. 66B, the first semiconductor layer 10305 in FIG. 67A, or the first semiconductor layer 10335 in FIG. 67B, silicon, silicon germanium (SiGe), or the like can be used.

As the second semiconductor layer 10106 in FIG. 65, the second semiconductor layer 10206 in FIG. 66A, the second semiconductor layer 10236 in FIG. 66B, the second semiconductor layer 10306 in FIG. 67A, or the second semiconductor layer 10336 in FIG. 67B, silicon or the like including phosphorus can be used, for example.

As a light-transmitting material of the second conductive layer 10107 and the third conductive layer 10109 in FIG. 65; the second conductive layer 10207 and the third conductive layer 10209 in FIG. 66A; the second conductive layer 10237 and the third conductive layer 10239 in FIG. 66B; the second conductive layer 10307 and the third conductive layer 10309 in FIG. 67A; or the second conductive layer 10337, the third conductive layer 10339, the fourth conductive layer 10113 in FIG. 65, the fourth conductive layer 10213 in FIG. 66A, the fourth conductive layer 10243 in FIG. 66B, and the fourth conductive layer 10343 in FIG. 67B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO is a light-transmitting conductive material formed by sputtering using a target in which zinc oxide (ZnO) is mixed into ITO at 2 to 20 wt %.

As a reflective material of the second conductive layer 10107 and the third conductive layer 10109 in FIG. 65; the second conductive layer 10207 and the third conductive layer 10209 in FIG. 66A; the second conductive layer 10237 and the third conductive layer 10239 in FIG. 66B; the second conductive layer 10307 and the third conductive layer 10309 in FIG. 67A; or the second conductive layer 10337, the third conductive layer 10339, and the fourth conductive layer 10343 in FIG. 67B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 10108 in FIG. 65, the third insulating film 10208 in FIG. 66A, the third insulating film 10238 in FIG. 66B, the third insulating film 10308 in FIG. 67A, or the third insulating film 10338 and the fourth insulating film 10349 in FIG. 67B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substituent, an organic group including at least hydrogen (e.g., an alkyl group or aromatic hydrocarbon) is used. Alternatively, a fluoro group may be used as the substituent. Further alternatively, an organic group including at least hydrogen and a fluoro group may be used as the substituent.

As the first alignment film 10110 in FIG. 65, the first alignment film 10210 in FIG. 66A, the first alignment film 10240 in FIG. 66B, the first alignment film 10310 in FIG. 67A, or the first alignment film 10340 in FIG. 67B, a film of a polymer such as polyimide can be used.

Next, the pixel structure in the case where each liquid crystal mode and the transistor are combined is described with reference to a top plan view (a layout diagram) of the pixel.

Note that as a liquid crystal mode, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

As the transistor, a thin film transistor (a TFT) including a non-single crystalline semiconductor layer typified by an amorphous silicon layer, a polycrystalline silicon layer, a microcrystalline (also referred to as semi-amorphous) silicon layer, or the like can be used.

Note that as a structure of the transistor, a top-gate structure, a bottom-gate structure, or the like can be used. A channel-etched transistor, a channel-protective transistor, or the like can be used as a bottom-gate transistor.

Figure 68:
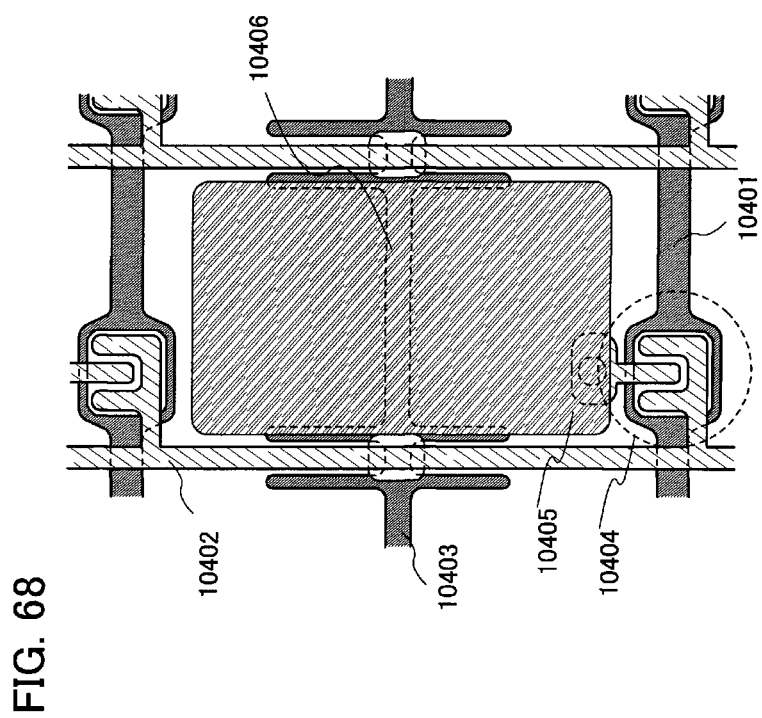
FIG. 68 is a top plan view of a display device according to the invention.

FIG. 68 is an example of a top plan view of a pixel in the case where a TN mode and a transistor are combined. By applying the pixel structure shown in FIG. 68 to a liquid crystal display device, a liquid crystal display device can be formed at low cost.

The pixel shown in FIG. 68 includes a scan line 10401, a video signal line 10402, a capacitor line 10403, a transistor 10404, a pixel electrode 10405, and a pixel capacitor 10406.

The scan line 10401 has a function of transmitting a signal (a scan signal) to the pixel. The video signal line 10402 has a function of transmitting a signal (an image signal) to the pixel. Note that since the scan lines 10401 and the video signal lines 10402 are arranged in matrix, they are formed of conductive layers in different layers. Note that a semiconductor layer may be provided at an intersection of the scan line 10401 and the video signal line 10402; thus, intersection capacitance formed between the scan line 10401 and the video signal line 10402 can be reduced.

The capacitor line 10403 is provided in parallel to the pixel electrode 10405. A portion where the capacitor line 10403 and the pixel electrode 10405 overlap with each other corresponds to the pixel capacitor 10406. Note that part of the capacitor line 10403 is extended along the video signal line 10402 so as to surround the video signal line 10402. Thus, crosstalk can be reduced. Crosstalk is a phenomenon in which a potential of an electrode, which is needed to be kept, is changed in accordance with change in potential of the video signal line 10402. Note that intersection capacitance can be reduced by providing a semiconductor layer between the capacitor line 10403 and the video signal line 10402. Note that the capacitor line 10403 is formed of a material which is similar to that of the scan line 10401.

The transistor 10404 has a function as a switch which electrically connects the video signal line 10402 and the pixel electrode 10405. Note that one of a source region and a drain region of the transistor 10404 is provided so as to be surrounded by the other of the source region and the drain region of the transistor 10404. Thus, the channel width of the transistor 10404 increases, so that switching capability can be improved. Note that a gate electrode of the transistor 10404 is provided so as to surround the semiconductor layer.

The pixel electrode 10405 is electrically connected to one of a source electrode and a drain electrode of the transistor 10404. The pixel electrode 10405 is an electrode for applying signal voltage which is transmitted by the video signal line 10402 to a liquid crystal element. Note that the pixel electrode 10405 is rectangular. Thus, an aperture ratio of the pixel can be improved. Note that as the pixel electrode 10405, a light-transmitting material or a reflective material may be used. Alternatively, the pixel electrode 10405 may be formed by combining a light-transmitting material and a reflective material.

Figure 69A:
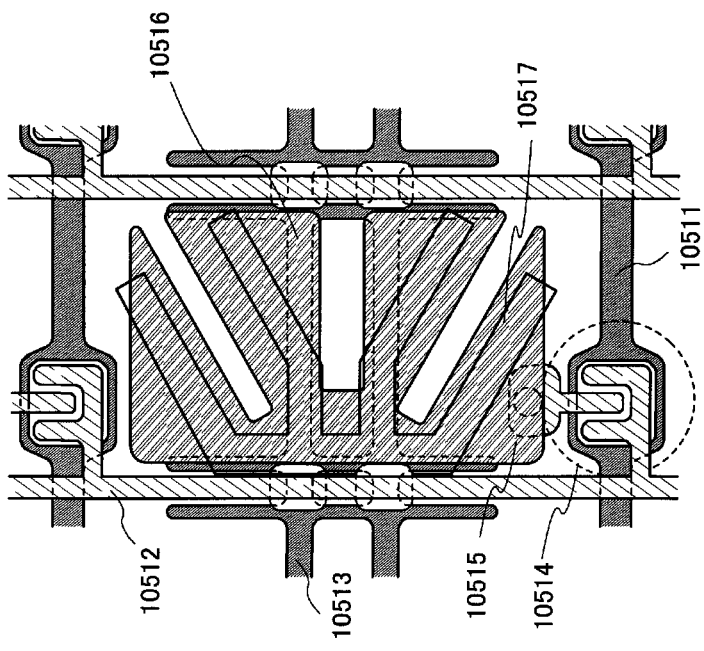
FIGS. 69A and 69B each are a top plan view of a display device according to the invention.

FIG. 69A is an example of a top plan view of a pixel in the case where an MVA mode and a transistor are combined. By applying the pixel structure shown in FIG. 69A to a liquid crystal display device, a liquid crystal display device having a wide viewing angle, high response speed, and high contrast can be obtained.

The pixel shown in FIG. 69A includes a scan line 10501, a video signal line 10502, a capacitor line 10503, a transistor 10504, a pixel electrode 10505, a pixel capacitor 10506, and an alignment control protrusion 10507.

The scan line 10501 has a function of transmitting a signal (a scan signal) to the pixel. The video signal line 10502 has a function of transmitting a signal (an image signal) to the pixel. Note that since the scan lines 10501 and the video signal lines 10502 are arranged in matrix, they are formed of conductive layers in different layers. Note that a semiconductor layer may be provided at an intersection of the scan line 10501 and the video signal line 10502; thus, intersection capacitance formed between the scan line 10501 and the video signal line 10502 can be reduced.

The capacitor line 10503 is provided in parallel to the pixel electrode 10505. A portion where the capacitor line 10503 and the pixel electrode 10505 overlap with each other corresponds to the pixel capacitor 10506. Note that part of the capacitor line 10503 is extended along the video signal line 10502 so as to surround the video signal line 10502. Thus, crosstalk can be reduced. Crosstalk is a phenomenon in which a potential of an electrode, which is needed to be kept, is changed in accordance with change in potential of the video signal line 10502. Note that intersection capacitance can be reduced by providing a semiconductor layer between the capacitor line 10503 and the video signal line 10502. Note that the capacitor line 10503 is formed of a material which is similar to that of the scan line 10501.

The transistor 10504 has a function as a switch which electrically connects the video signal line 10502 and the pixel electrode 10505. Note that one of a source region and a drain region of the transistor 10504 is provided so as to be surrounded by the other of the source region and the drain region of the transistor 10504. Thus, the channel width of the transistor 10504 increases, so that switching capability can be improved. Note that a gate electrode of the transistor 10504 is provided so as to surround the semiconductor layer.

The pixel electrode 10505 is electrically connected to one of a source electrode and a drain electrode of the transistor 10504. The pixel electrode 10505 is an electrode for applying signal voltage which is transmitted by the video signal line 10502 to a liquid crystal element. Note that the pixel electrode 10505 is rectangular. Thus, an aperture ratio of the pixel can be improved. Note that as the pixel electrode 10505, a light-transmitting material or a reflective material may be used. Alternatively, the pixel electrode 10505 may be formed by combining a light-transmitting material and a reflective material.

The alignment control protrusion 10507 is formed over a counter substrate. The alignment control protrusion 10507 has a function of aligning liquid crystal molecules radially. Note that a shape of the alignment control protrusion 10507 is not particularly limited. For example, the alignment control protrusion 10507 may be a dogleg shape. Thus, a plurality of regions having different alignment of the liquid crystal molecules can be formed, so that a viewing angle can be improved.

Figure 69B:
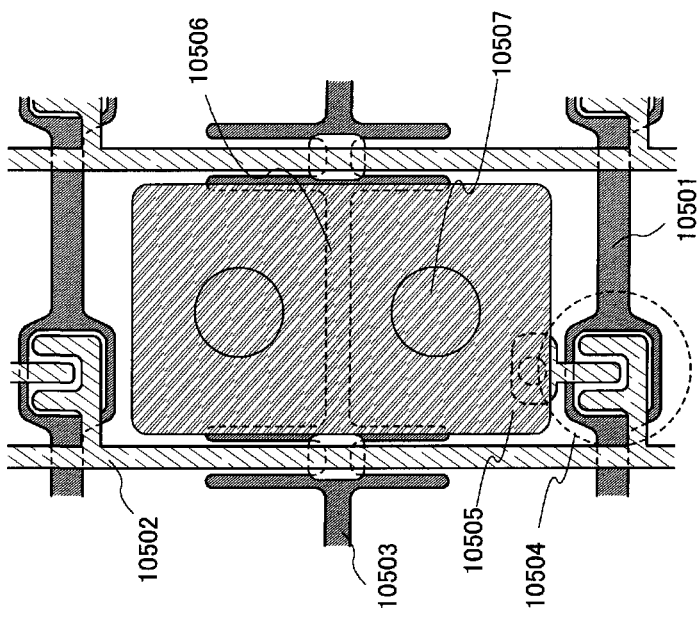

FIG. 69B is an example of a top plan view of a pixel in the case where a PVA mode and a transistor are combined. By applying the pixel structure shown in FIG. 69B to a liquid crystal display device, a liquid crystal display device having a wide viewing angle, high response speed, and high contrast can be obtained.

The pixel shown in FIG. 69B includes a scan line 10511, a video signal line 10512, a capacitor line 10513, a transistor 10514, a pixel electrode 10515, a pixel capacitor 10516, and an electrode notch portion 10517.

The scan line 10511 has a function of transmitting a signal (a scan signal) to the pixel. The video signal line 10512 has a function of transmitting a signal (an image signal) to the pixel. Note that since the scan lines 10511 and the video signal lines 10512 are arranged in matrix, they are formed of conductive layers in different layers. Note that a semiconductor layer may be provided at an intersection of the scan line 10511 and the video signal line 10512; thus, intersection capacitance formed between the scan line 10511 and the video signal line 10512 can be reduced.

The capacitor line 10513 is provided in parallel to the pixel electrode 10515. A portion where the capacitor line 10513 and the pixel electrode 10515 overlap with each other corresponds to the pixel capacitor 10516. Note that part of the capacitor line 10513 is extended along the video signal line 10512 so as to surround the video signal line 10512. Thus, crosstalk can be reduced. Crosstalk is a phenomenon in which a potential of an electrode, which is needed to be kept, is changed in accordance with change in potential of the video signal line 10512. Note that intersection capacitance can be reduced by providing a semiconductor layer between the capacitor line 10513 and the video signal line 10512. Note that the capacitor line 10513 is formed of a material which is similar to that of the scan line 10511.

The transistor 10514 has a function as a switch which electrically connects the video signal line 10512 and the pixel electrode 10515. Note that one of a source region and a drain region of the transistor 10514 is provided so as to be surrounded by the other of the source region and the drain region of the transistor 10514. Thus, the channel width of the transistor 10514 increases, so that switching capability can be improved. Note that a gate electrode of the transistor 10514 is provided so as to surround the semiconductor layer.

The pixel electrode 10515 is electrically connected to one of a source electrode and a drain electrode of the transistor 10514. The pixel electrode 10515 is an electrode for applying signal voltage which is transmitted by the video signal line 10512 to a liquid crystal element. Note that the pixel electrode 10515 has a shape which is formed in accordance with a shape of the electrode notch portion 10517. Specifically, the pixel electrode 10515 has a shape in which a portion where the pixel electrode 10515 is notched is formed in a portion where the electrode notch portion 10517 is not formed. Thus, a plurality of regions having different alignment of the liquid crystal molecules can be formed, so that a viewing angle can be improved. Note that as the pixel electrode 10515, a light-transmitting material or a reflective material may be used. Alternatively, the pixel electrode 10515 may be formed by combining a light-transmitting material and a reflective material.

Figure 70A:
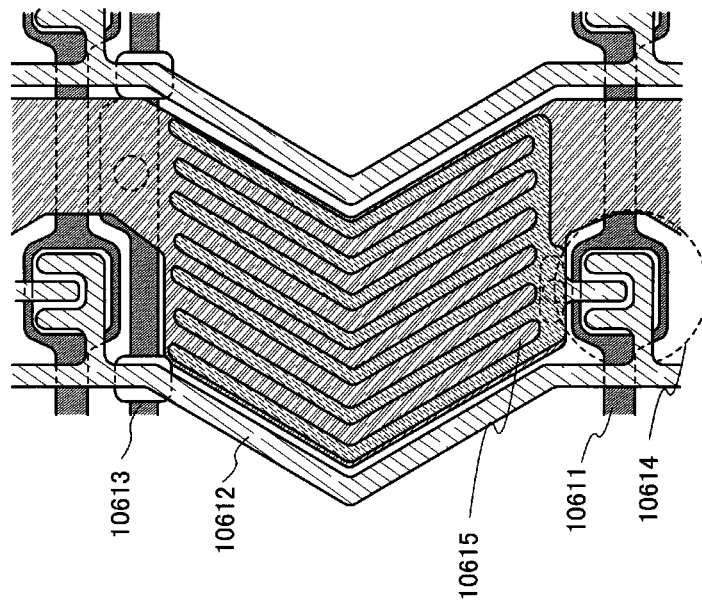
FIGS. 70A and 70B each are a top plan view of a display device according to the invention.

FIG. 70A is an example of a top plan view of a pixel in the case where an IPS mode and a transistor are combined. By applying the pixel structure shown in FIG. 70A to a liquid crystal display device, a liquid crystal display device theoretically having a wide viewing angle and response speed which has low dependency on a gray scale can be obtained.

The pixel shown in FIG. 70A includes a scan line 10601, a video signal line 10602, a common electrode 10603, a transistor 10604, and a pixel electrode 10605.

The scan line 10601 has a function of transmitting a signal (a scan signal) to the pixel. The video signal line 10602 has a function of transmitting a signal (an image signal) to the pixel. Note that since the scan lines 10601 and the video signal lines 10602 are arranged in matrix, they are formed of conductive layers in different layers. Note that a semiconductor layer may be provided at an intersection of the scan line 10601 and the video signal line 10602; thus, intersection capacitance formed between the scan line 10601 and the video signal line 10602 can be reduced. Note that the video signal line 10602 is formed in accordance with a shape of the pixel electrode 10605.

The common electrode 10603 is provided in parallel to the pixel electrode 10605. The common electrode 10603 is an electrode for generating a horizontal electric field. Note that the common electrode 10603 is bent comb-shaped. Note that part of the common electrode 10603 is extended along the video signal line 10602 so as to surround the video signal line 10602. Thus, crosstalk can be reduced. Crosstalk is a phenomenon in which a potential of an electrode, which is needed to be kept, is changed in accordance with change in potential of the video signal line 10602. Note that intersection capacitance can be reduced by providing a semiconductor layer between the common electrode 10603 and the video signal line 10602. Part of the common electrode 10603, which is provided in parallel to the scan line 10601, is formed of a material which is similar to that of the scan line 10601. Part of the common electrode 10603, which is provided in parallel to the pixel electrode 10605, is formed of a material which is similar to that of the pixel electrode 10605.

The transistor 10604 has a function as a switch which electrically connects the video signal line 10602 and the pixel electrode 10605. Note that one of a source region and a drain region of the transistor 10604 is provided so as to be surrounded by the other of the source region and the drain region of the transistor 10604. Thus, the channel width of the transistor 10604 increases, so that switching capability can be improved. Note that a gate electrode of the transistor 10604 is provided so as to surround the semiconductor layer.

The pixel electrode 10605 is electrically connected to one of a source electrode and a drain electrode of the transistor 10604. The pixel electrode 10605 is an electrode for applying signal voltage which is transmitted by the video signal line 10602 to a liquid crystal element. Note that the pixel electrode 10605 is bent comb-shaped. Thus, a horizontal electric field can be applied to liquid crystal molecules. In addition, since a plurality of regions having different alignment of the liquid crystal molecules can be formed, a viewing angle can be improved. Note that as the pixel electrode 10605, a light-transmitting material or a reflective material may be used. Alternatively, the pixel electrode 10605 may be formed by combining a light-transmitting material and a reflective material.

Note that a comb-shaped portion in the common electrode 10603 and the pixel electrode 10605 may be formed of different conductive layers. For example, the comb-shaped portion in the common electrode 10603 may be formed of the same conductive layer as the scan line 10601 or the video signal line 10602. Similarly, the pixel electrode 10605 may be formed of the same conductive layer as the scan line 10601 or the video signal line 10602.

Figure 70B:
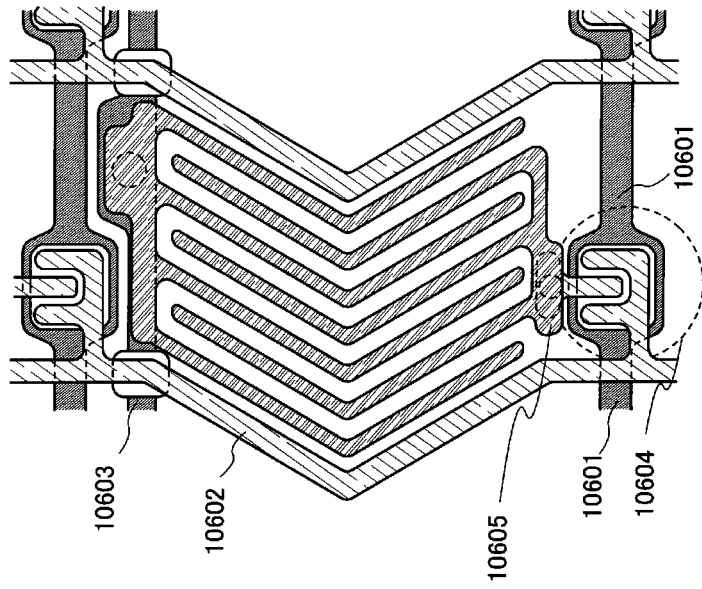

FIG. 70B is a top plan view of a pixel in the case where an FFS mode and a transistor are combined. By applying the pixel structure shown in FIG. 70B to a liquid crystal display device, a liquid crystal display device theoretically having a wide viewing angle and response speed which has low dependency on a gray scale can be obtained.

The pixel shown in FIG. 70B may include a scan line 10611, a video signal line 10612, a common electrode 10613, a transistor 10614, and a pixel electrode 10615.

The scan line 10611 has a function of transmitting a signal (a scan signal) to the pixel. The video signal line 10612 has a function of transmitting a signal (an image signal) to the pixel. Note that since the scan lines 10611 and the video signal lines 10612 are arranged in matrix, they are formed of conductive layers in different layers. Note that a semiconductor layer may be provided at an intersection of the scan line 10611 and the video signal line 10612; thus, intersection capacitance formed between the scan line 10611 and the video signal line 10612 can be reduced. Note that the video signal line 10612 is formed in accordance with a shape of the pixel electrode 10615.

The common electrode 10613 is formed uniformly below the pixel electrode 10615 and below and between the pixel electrodes 10615. Note that as the common electrode 10613, either a light-transmitting material or a reflective material may be used. Alternatively, the common electrode 10613 may be formed by combining a material in which a light-transmitting material and a reflective material.

The transistor 10614 has a function as a switch which electrically connects the video signal line 10612 and the pixel electrode 10615. Note that one of a source region and a drain region of the transistor 10614 is provided so as to be surrounded by the other of the source region and the drain region of the transistor 10614. Thus, the channel width of the transistor 10614 increases, so that switching capability can be improved. Note that a gate electrode of the transistor 10614 is provided so as to surround the semiconductor layer.

The pixel electrode 10615 is electrically connected to one of a source electrode and a drain electrode of the transistor 10614. The pixel electrode 10615 is an electrode for applying signal voltage which is transmitted by the video signal line 10612 to a liquid crystal element. Note that the pixel electrode 10615 is bent comb-shaped. The comb-shaped pixel electrode 10615 is provided to be closer to a liquid crystal layer than a uniform portion of the common electrode 10613. Thus, a horizontal electric field can be applied to liquid crystal molecules. In addition, a plurality of regions having different alignment of the liquid crystal molecules can be formed, so that a viewing angle can be improved. Note that as the pixel electrode 10615, a light-transmitting material or a reflective material may be used. Alternatively, the pixel electrode 10615 may be formed by combining a light-transmitting material and a reflective material.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 14

In this embodiment mode, steps of manufacturing a liquid crystal cell (also referred to as a liquid crystal panel) are described.

Steps of manufacturing a liquid crystal cell in the case where a vacuum injection method is used as a method of filling with liquid crystals are described with reference to FIGS. 71A to 71E and 72A to 72C.

Figure 72A:
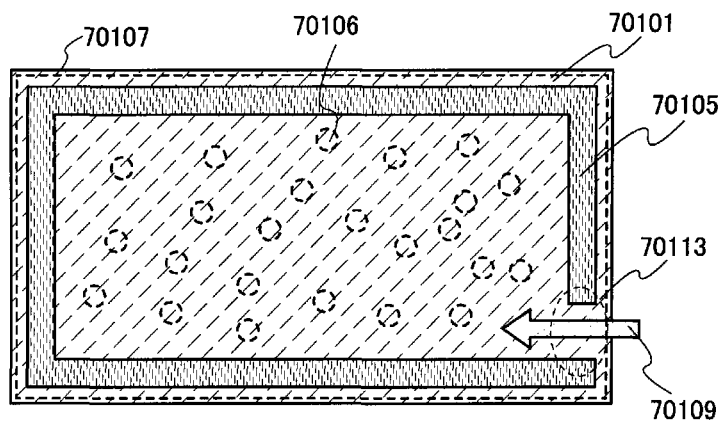
FIGS. 72A and 72B are top plan views of a display device according to the invention.
Figure 72B:
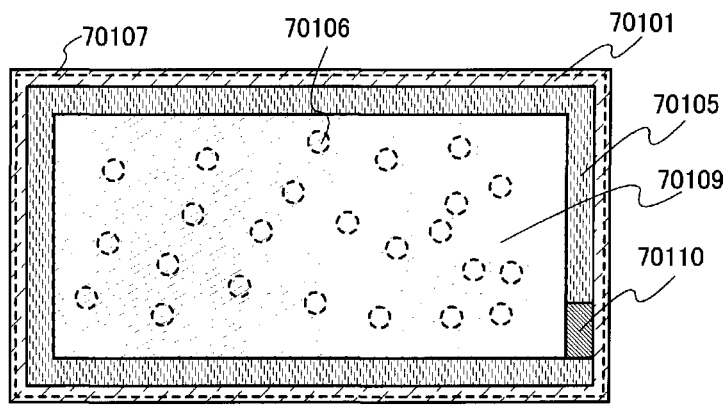
Figure 72C:
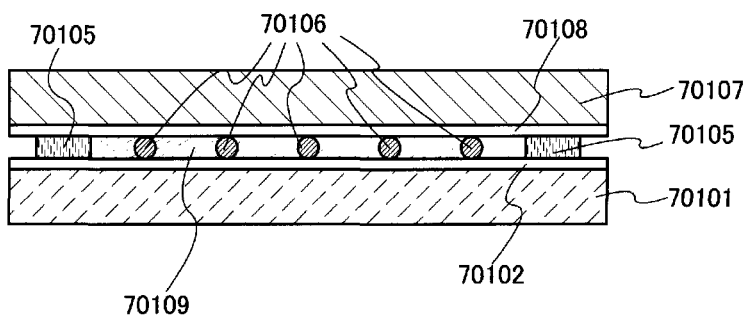
FIG. 72C is a cross-sectional view thereof.

FIG. 72C is a cross-sectional view of a liquid crystal cell. A first substrate 70101 and a second substrate 70107 are attached with spacers 70106 and a sealing material 70105 interposed therebetween. Liquid crystals 70109 are arranged between the first substrate 70101 and the second substrate 70107. Note that an alignment film 70102 is formed over the first substrate 70101, and an alignment film 70108 is formed over the second substrate 70107.

The first substrate 70101 is provided with a plurality of pixels arranged in matrix. Each of the plurality of pixels may include a transistor. Note that the first substrate 70101 may be referred to as a TFT substrate, an array substrate, or a TFT array substrate. Examples of the first substrate 70101 include, but are not limited to, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, and a substrate including stainless steel foil. Alternatively, a skin (e.g., epidermis or corium) or hypodermal tissue of an animal such as a human can be used as the substrate.

The second substrate 70107 is provided with a common electrode, a color filter, a black matrix, and the like. Note that the second substrate 70107 may be referred to as a counter substrate or a color filter substrate.

The alignment film 70102 has a function of aligning liquid crystal molecules in a certain direction. An example of the alignment film 70102 includes, but is not limited to, a polyimide resin. Note that the alignment film 70108 is similar to the alignment film 70102.

The sealing material 70105 has a function of bonding the first substrate 70101 and the second substrate 70107 so that the liquid crystals 70109 are not leaked. That is, the sealing material 70105 functions as a sealant.

The spacer 70106 has a function of maintaining a fixed space between the first substrate 70101 and the second substrate 70107 (a cell gap of the liquid crystal). As the spacer 70106, a granular spacer or a columnar spacer can be used. Examples of the granular spacer include a fiber-shaped spacer and a spherical spacer. Examples of a material for the granular spacer include plastic and glass. A spherical spacer formed of plastic is called a plastic bead and has been widely used. A fiber-shaped spacer formed of glass is called a glass fiber and mixed in a sealing material when used.

Figure 71A:
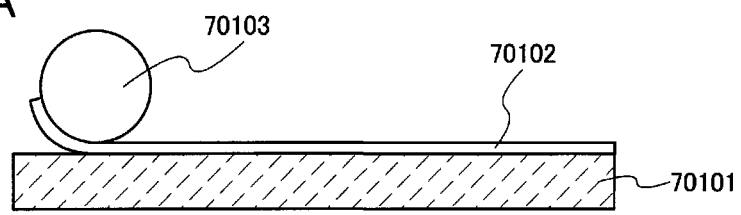
FIGS. 71A to 71E are cross-sectional views of a display device according to the invention.

FIG. 71A is a cross-sectional view of a step of forming the alignment film 70102 over the first substrate 70101. The alignment film 70102 is formed over the first substrate 70101 by a roller coating method with the use of a roller 70103. Note that other than a roller coating method, an offset printing method, a dip coating method, an air-knife method, a curtain coating method, a wire-bar coating method, a gravure coating method, an extrusion coating method, or the like can be used. Thereafter, pre-baking and main-baking are sequentially performed on the alignment film 70102.

Figure 71B:
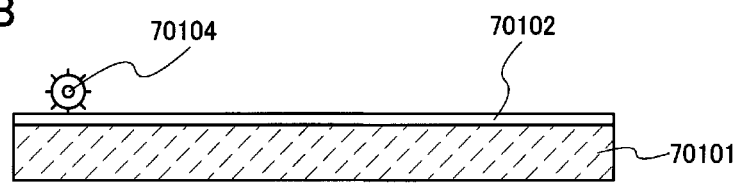

FIG. 71B is a cross-sectional view of a step of performing rubbing treatment on the alignment film 70102. The rubbing treatment is performed by rotating a roller 70104 for rubbing, in which a cloth is wrapped around a drum, to rub the alignment film 70102. When the rubbing treatment is performed on the alignment film 70102, a groove for aligning liquid crystal molecules in a certain direction is formed in the alignment film 70102. Note that the invention is not limited to this structure, and a groove may be formed in the alignment film by using an ion beam. Thereafter, water washing treatment is performed on the first substrate 70101. Accordingly, contaminant, dirt, or the like on a surface of the first substrate 70101 can be removed.

Although not shown, similarly to the first substrate 70101, the alignment film 70108 is formed over the second substrate 70107, and rubbing treatment is performed on the alignment film 70108. Note that the invention is not limited to this structure, and a groove may be formed in the alignment film by using an ion beam.

Figure 71C:
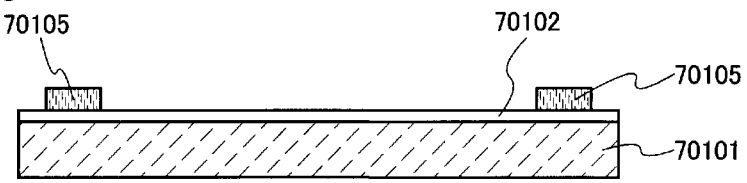

FIG. 71C is a cross-sectional view of a step of forming the sealing material 70105 over the alignment film 70102. The sealing material 70105 is applied by a lithography device, screen printing, or the like, and a seal pattern is formed. The seal pattern is formed along the periphery of the first substrate 70101, and a liquid crystal inlet is provided in part of the seal pattern. A UV resin for temporal fixing is spot-applied to a region other than a display region of the first substrate 70101 by a dispenser or the like.

Note that the sealing material 70105 may be provided for the second substrate 70107.

Figure 71D:
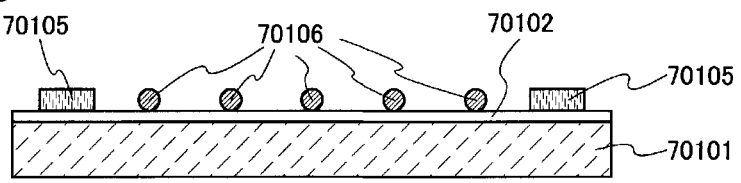

FIG. 71D is a cross-sectional view of a step of dispersing the spacers 70106 over the first substrate 70101. The spacers 70106 are ejected by a nozzle together with a compressed gas and dispersed (dry dispersion). Alternatively, the spacers 70106 are mixed in a volatile liquid, and the liquid is sprayed so as to be dispersed (wet dispersion). By such dry dispersion or wet dispersion, the spacers 70106 can be uniformly dispersed over the first substrate 70101.

In this embodiment mode, the case where the spherical spacer of the granular spacer is used as the spacer 70106 is described; however, the invention is not limited thereto, and a columnar spacer may be used. The columnar spacer may be provided for the first substrate 70101 or the second substrate 70107. Alternatively, a part of the spacers may be provided for the first substrate 70101 and the other part thereof may be provided for the second substrate 70107.

Note that a spacer may be mixed in the sealing material. Accordingly, the cell gap of the liquid crystal can be maintained constant more easily.

Figure 71E:
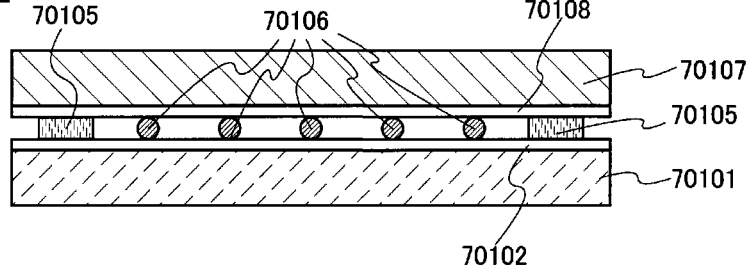

FIG. 71E is a cross-sectional view of a step of attaching the first substrate 70101 and the second substrate 70107. The first substrate 70101 and the second substrate 70107 are attached in the atmosphere. Then, the first substrate 70101 and the second substrate 70107 are pressurized so that a gap between the first substrate 70101 and the second substrate 70107 is constant. Thereafter, ultraviolet ray irradiation or heat treatment is performed on the sealing material 70105; thus, the sealing material 70105 is hardened.

FIGS. 72A and 72B are top plan views of steps of filling with liquid crystals. A cell in which the first substrate 70101 and the second substrate 70107 are attached (also referred to as an empty cell) is placed in a vacuum chamber. Then, the pressure in the vacuum chamber is reduced, and thereafter, a liquid crystal inlet 70113 of the empty cell is immersed in liquid crystals. Then, when the vacuum chamber is opened to the atmosphere, the empty cell is filled with the liquid crystals 70109 due to pressure difference and a capillary phenomenon.

When the empty cell is filled with the needed amount of liquid crystals 70109, the liquid crystal inlet is sealed by a resin 70110. Then, extra liquid crystals attached to the empty cell are washed out. Thereafter, realignment treatment is performed on the liquid crystals 70109 by annealing treatment. Accordingly, the liquid crystal cell is completed.

Next, steps of manufacturing a liquid crystal cell in the case where a dropping method is used as a method of filling with liquid crystals are described with reference to FIGS. 73A to 73D and 74A to 74C.

Figure 74A:
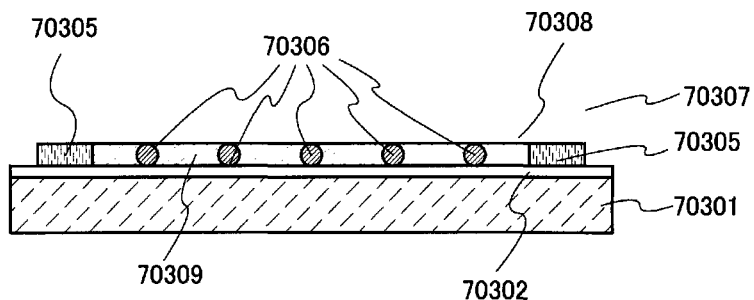
FIGS. 74A and 74C are cross-sectional views of a display device according to the invention.
Figure 74B:
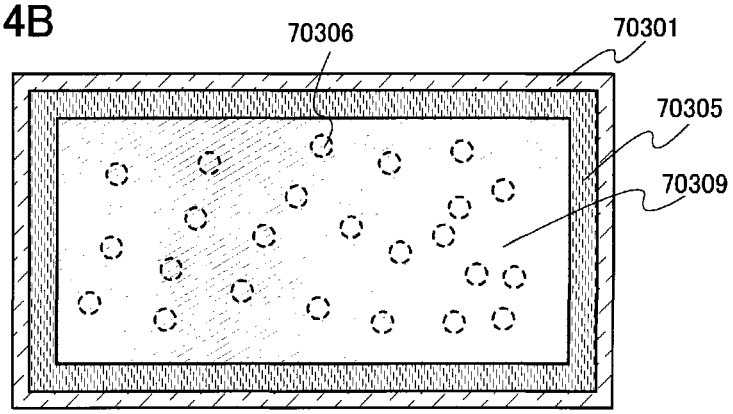
FIG. 74B is a top plan view thereof.
Figure 74C:
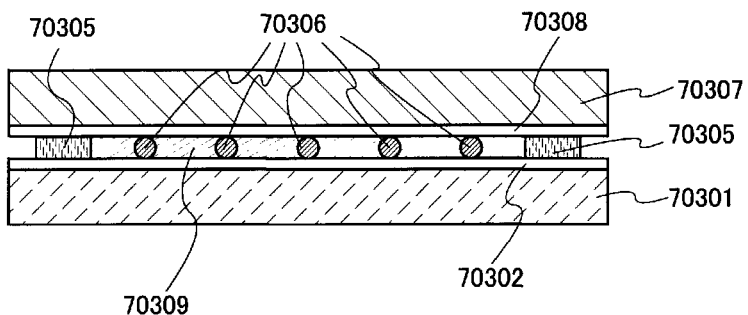

FIG. 74C is a cross-sectional view of a liquid crystal cell. A first substrate 70301 and a second substrate 70307 are attached with spacers 70306 and a sealing material 70305 interposed therebetween. Liquid crystals 70309 are arranged between the first substrate 70301 and the second substrate 70307. Note that an alignment film 70302 is formed over the first substrate 70301, and an alignment film 70308 is formed over the second substrate 70307.

The first substrate 70301 is provided with a plurality of pixels arranged in matrix. Each of the plurality of pixels may include a transistor. Note that the first substrate 70301 may be referred to as a TFT substrate, an array substrate, or a TFT array substrate. Examples of the first substrate 70301 include, but are not limited to, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), and a regenerated fiber (e.g., acetate, cupra, rayon, or regenerated polyester)), a leather substrate, a rubber substrate, a stainless steel substrate, and a substrate including stainless steel foil. Alternatively, a skin (e.g., epidermis or corium) or hypodermal tissue of an animal such as a human can be used as the substrate.

The second substrate 70307 is provided with a common electrode, a color filter, a black matrix, and the like. Note that the second substrate 70307 may be referred to as a counter substrate or a color filter substrate.

The alignment film 70302 has a function of aligning liquid crystal molecules in a certain direction. An example of the alignment film 70302 includes, but is not limited to, a polyimide resin. Note that the alignment film 70308 is similar to the alignment film 70302.

The sealing material 70305 has a function of bonding the first substrate 70301 and the second substrate 70307 so that the liquid crystals 70309 are not leaked. That is, the sealing material 70305 functions as a sealant.

The spacer 70306 has a function of maintaining a fixed space between the first substrate 70301 and the second substrate 70307 (a cell gap of the liquid crystal). As the spacer 70306, a granular spacer or a columnar spacer can be used. Examples of the granular spacer include a fiber-shaped spacer and a spherical spacer. Examples of a material for the granular spacer include plastic and glass. A spherical spacer formed of plastic is called a plastic bead and has been widely used. A fiber-shaped spacer formed of glass is called a glass fiber and mixed in a sealing material when used.

Figure 73A:
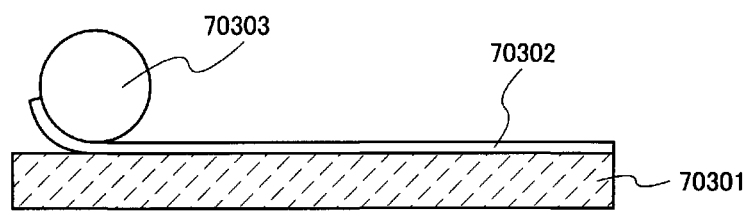
FIGS. 73A to 73D are cross-sectional views of a display device according to the invention.

FIG. 73A is a cross-sectional view of a step of forming the alignment film 70302 over the first substrate 70301. The alignment film 70302 is formed over the first substrate 70301 by a roller coating method with the use of a roller 70303. Note that other than a roller coating method, an offset printing method, a dip coating method, an air-knife method, a curtain coating method, a wire-bar coating method, a gravure coating method, an extrusion coating method, or the like can be used. Thereafter, pre-baking and main-baking are sequentially performed on the alignment film 70302.

Figure 73B:
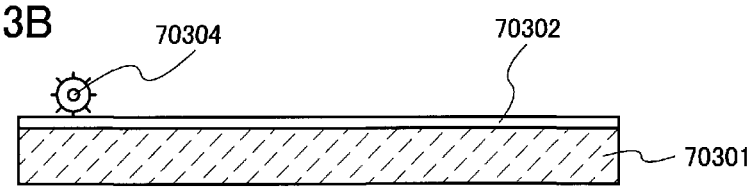

FIG. 73B is a cross-sectional view of a step of performing rubbing treatment on the alignment film 70302. The rubbing treatment is performed by rotating a roller 70304 for rubbing, in which a cloth is wrapped around a drum, to rub the alignment film 70302. When the rubbing treatment is performed on the alignment film 70302, a groove for aligning liquid crystal molecules in a certain direction is formed in the alignment film 70302. Note that the invention is not limited to this structure, and a groove may be formed in the alignment film by using an ion beam. Thereafter, water washing treatment is performed on the first substrate 70301. Accordingly, contaminant, dirt, or the like on a surface of the first substrate 70301 can be removed.

Although not shown, similarly to the first substrate 70301, the alignment film 70308 is formed over the second substrate 70307, and rubbing treatment is performed on the alignment film 70308. Note that the invention is not limited to this structure, and a groove may be formed in the alignment film by using an ion beam.

Figure 73C:
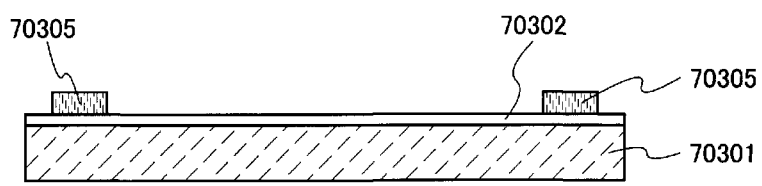

FIG. 73C is a cross-sectional view of a step of forming the sealing material 70305 over the alignment film 70302. The sealing material 70305 is applied by a lithography device, screen printing, or the like, and a seal pattern is formed. The seal pattern is formed along the periphery of the first substrate 70301. In this embodiment mode, a radical UV resin or a cationic UV resin is used for the sealing material 70305. Then, a conductive resin is spot-applied by a dispenser.

Note that the sealing material 70305 may be provided for the second substrate 70307.

Figure 73D:
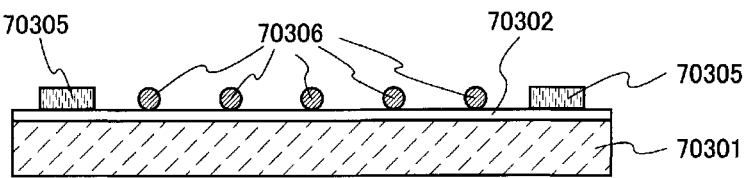

FIG. 73D is a cross-sectional view of a step of dispersing the spacers 70306 over the first substrate 70301. The spacers 70306 are ejected by a nozzle together with a compressed gas and dispersed (dry dispersion). Alternatively, the spacers 70306 are mixed in a volatile liquid, and the liquid is sprayed so as to be dispersed (wet dispersion). By such dry dispersion or wet dispersion, the spacer 70306 can be uniformly dispersed over the first substrate 70301.

In this embodiment mode, the case where the spherical spacer of the granular spacer is used as the spacer 70306 is described; however, the invention is not limited thereto, and a columnar spacer may be used. The columnar spacer may be provided for the first substrate 70301 or the second substrate 70307. Alternatively, a part of the spacers may be provided for the first substrate 70301 and the other part thereof may be provided for the second substrate 70307.

Note that a spacer may be mixed in the sealing material. Accordingly, the cell gap of the liquid crystal can be maintained constant more easily.

FIG. 74A is a cross-sectional view of a step of dropping the liquid crystals 70309. Defoaming treatment is performed on the liquid crystals 70309, and thereafter, the liquid crystals 70309 are dropped into the inside of the sealing material 70305.

FIG. 74B is a top plan view after the liquid crystals 70309 are dropped. Since the sealing material 70305 is formed along the periphery of the first substrate 70301, the liquid crystals 70309 are not leaked.

FIG. 74C is a cross-sectional view of a step of attaching the first substrate 70301 and the second substrate 70307. The first substrate 70301 and the second substrate 70307 are attached in a vacuum chamber. Then, the first substrate 70301 and the second substrate 70307 are pressurized so that a gap between the first substrate 70301 and the second substrate 70307 is constant. Thereafter, ultraviolet ray irradiation is performed on the sealing material 70305; thus, the sealing material 70305 is hardened. It is preferable to perform ultraviolet ray irradiation on the sealing material 70305 while a display portion is covered with a mask because deterioration of the liquid crystals 70309 due to ultraviolet rays can be prevented. Thereafter, realignment treatment is performed on the liquid crystals 70309 by annealing treatment. Accordingly, the liquid crystal cell is completed.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing in another embodiment mode. Further, even more drawings can be formed by combining each part with part of another embodiment mode in the drawings of this embodiment mode.

This embodiment mode shows an example of an embodied case of the contents (or part of the contents) described in another embodiment mode, an example of slight transformation thereof, an example of partial modification thereof, an example of improvement thereof, an example of detailed description thereof, an application example thereof, an example of related part thereof, or the like. Therefore, the contents described in another embodiment mode can be freely applied to, combined with, or replaced with this embodiment mode.

Embodiment Mode 15

In this embodiment mode, a structure and an operation of a pixel in a display device are described.

Figures 75A, 75B:
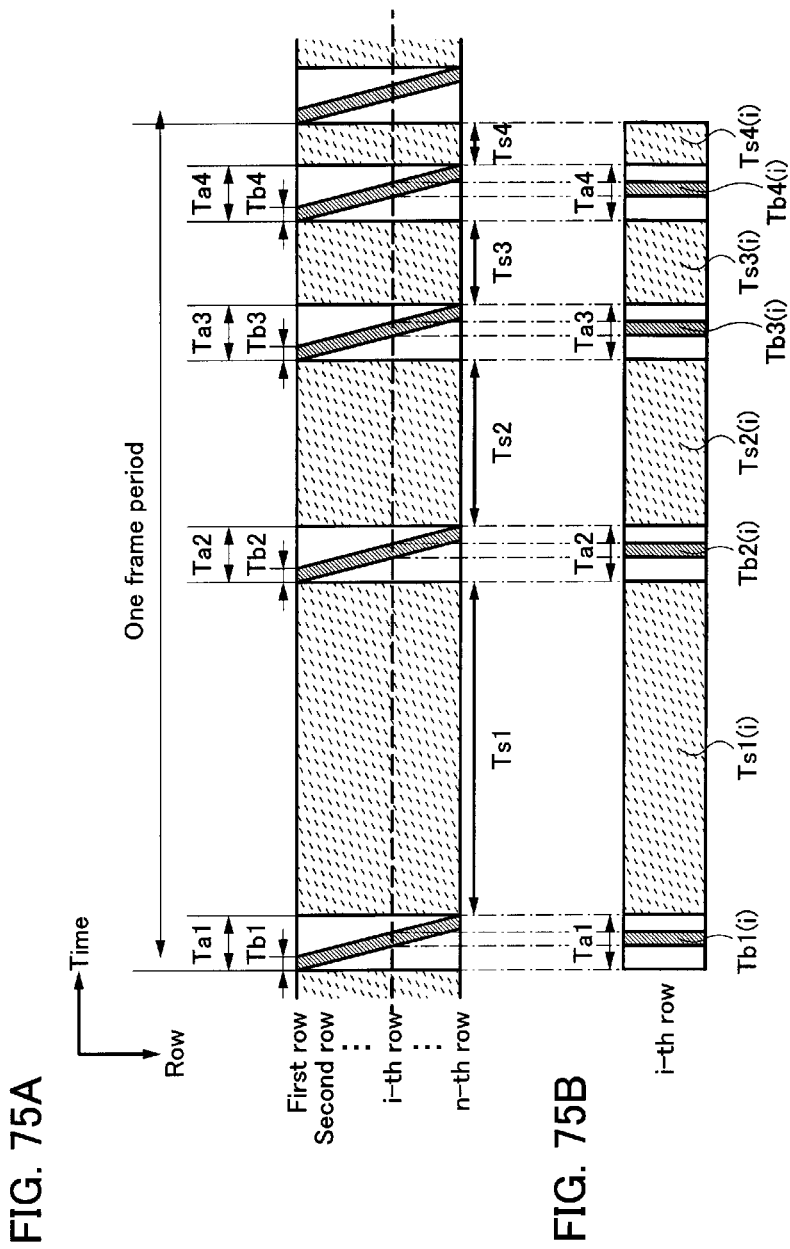
FIGS. 75A and 75B each are a timing chart of a display device according to the invention.

FIGS. 75A and 75B are timing charts showing an example of digital time gray scale driving. The timing chart of FIG. 75A shows a driving method in the case where a signal writing period (an address period) to a pixel and a light-emitting period (a sustain period) are separated.

One frame period refers to a period for fully displaying an image for one display region. One frame period includes a plurality of subframe periods, and one subframe period includes an address period and a sustain period. Address periods $T_{a1}$ to $T_{a4}$ indicate time for writing signals to pixels in all rows, and periods $T_{b1}$ to $T_{b4}$ indicate time for writing signals to pixels in one row (or one pixel). Sustain periods $T_{s1}$ to $T_{s4}$ indicate time for maintaining a lighting state or a non-lighting state in accordance with a video signal written to the pixel, and a ratio of the length of the sustain periods is set to satisfy $T_{s1}:T_{s2}:T_{s3}:T_{s4}=2^3:2^2:2^1:2^0=8:4:2:1$. A gray scale is expressed depending on in which sustain period light emission is performed.

An operation is described. First, in the address period $T_{a1}$, pixel selection signals are sequentially input to scan lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of each pixel in the sustain period $T_{s1}$ are controlled by the written video signal. Similarly, in each of the address periods $T_{a2}$, $T_{a3}$, and $T_{a4}$, a video signal is input to pixels, and lighting and non-lighting of each pixel in each of the sustain periods $T_{s2}$, $T_{s3}$, and $T_{s4}$ are controlled by the video signal. Then, in each subframe period, a pixel to which a signal for not lighting in the address period and for lighting when the sustain period starts after the address period ends is written is lit.

Here, the i-th pixel row is described with reference to FIG. 75B. First, in the address period $T_{a1}$, pixel selection signals are input to the scan lines from a first row, and in a period $T_{b1(i)}$ in the address period $T_{a1}$, a pixel in the i-th row is selected. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period $T_{s1}$ are controlled by the written video signal. Similarly, in each of the address periods $T_{a2}$, $T_{a3}$, and $T_{a4}$, a video signal is input to the pixel in the i-th row, and lighting and non-lighting of the pixel in the i-th row in each of the sustain periods $T_{s2}$, $T_{s3}$, and $T_{s4}$ are controlled by the video signal. Then, in each subframe period, a pixel to which a signal for not lighting in the address period and for lighting when the sustain period starts after the address period ends is written is lit.

The case where 4-bit gray scales are expressed is described here; however, the number of bits and the number of gray scales are not limited thereto. Note that lighting is not needed to be performed in order of $T_{s1}$, $T_{s2}$, $T_{s3}$, and $T_{s4}$, and the order may be random or light may be emitted by dividing any of the periods of $T_{s1}$, $T_{s2}$, $T_{s3}$, and $T_{s4}$ into a plurality of periods. A ratio of lighting times of $T_{s1}$, $T_{s2}$, $T_{s3}$, and $T_{s4}$ is not needed to be a power of two, and may be the same length or slightly different from a power of two.

Next, a driving method in the case where a period for writing a signal to a pixel (an address period) and a light-emitting period (a sustain period) are not separated is described. That is, a pixel in a row in which a writing operation of a video signal is completed maintains the signal until another signal is written to the pixel (or the signal is erased). A period between the writing operation and writing of another signal to the pixel is referred to as data holding time. In the data holding time, the pixel is lit or not lit in accordance with the video signal written to the pixel. The same operations are performed until the last row, and the address period ends. Then, a signal writing operation of the next subframe period starts sequentially from the row in which the data holding time ends.

As described above, in the case of the driving method in which a pixel is immediately lit or not lit in accordance with a video signal written to the pixel when the signal writing operation is completed and the data holding time starts, signals cannot be input to two rows at the same time. Accordingly, address periods need to be prevented from overlapping, so that the data holding time cannot be made shorter. As a result, it is difficult to perform high-level gray scale display.

Thus, the data holding time is set to be shorter than the address period by provision of an erasing period. A driving method in the case where the data holding time which is shorter than the address period is set by provision of an erasing period is described with reference to FIG. 76A.

First, in the address period $T_{a1}$, pixel scan signals are input to the scan lines from a first row, and a pixel is selected. Then, while the pixel is selected, a video signal is input to the pixel from a signal line. Then, when the video signal is written to the pixel, the pixel maintains the signal until a signal is input again. Lighting and non-lighting of the pixel in the sustain period $T_{s1}$ are controlled by the written video signal. In the row in which a writing operation of a video signal is completed, each pixel is immediately lit or not lit in accordance with the written video signal. The same operations are performed until the last row, and the address period $T_{a1}$ ends. Then, a signal writing operation of the next subframe period starts sequentially from the row in which the data holding time ends. Similarly, in each of the address periods $T_{a2}$, $T_{a3}$, and $T_{a4}$, a video signal is input to the pixel, and lighting and non-lighting of the pixel in each of the sustain periods $T_{s2}$, $T_{s3}$, and $T_{s4}$ are controlled by the video signal. The end of the sustain period $T_{s4}$ is set by the start of an erasing operation. This is because when a signal written to a pixel is erased in an erasing time $T_e$ of each row, the pixel is forced to be not lit regardless of the video signal written to the pixel in the address period until another signal is written to the pixel. That is, the data holding time ends from a pixel in which the erasing time $T_e$ starts.

Here, the i-th pixel row is described with reference to FIG. 76B. In the address period $T_{a1}$, pixel scan signals are input to the scan lines from a first row, and a pixel is selected. Then, in the period $T_{b1(i)}$, while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in a sustain period $T_{s1(i)}$ are controlled by the written video signal. That is, the pixel in the i-th row is immediately lit or not lit in accordance with the video signal written to the pixel after the writing operation of the video signal to the i-th row is completed. Similarly, in each of the address periods $T_{a2}$, $T_{a3}$, and $T_{a4}$, a video signal is input to the pixel in the i-th row, and lighting and non-lighting of the pixel in the i-th row in each of the sustain periods $T_{s2}$, $T_{s3}$, and $T_{s4}$ are controlled by the video signal. The end of a sustain period $T_{s4(i)}$ is set by the start of an erasing operation. This is because the pixel is forced to be not lit regardless of the video signal written to the pixel in the i-th row in an erasing time $T_{e(i)}$ in the i-th row. That is, the data holding time of the pixel in the i-th row ends when the erasing time $T_{e(i)}$ starts.

Thus, a display device with a high-level gray scale and a high duty ratio (a ratio of a lighting period in one frame period) can be provided, in which data holding time is shorter than an address period without separating the address period and a sustain period. Since instantaneous luminance can be lowered, reliability of a display element can be improved.

The case where 4-bit gray scales are expressed is described here; however, the number of bits and the number of gray scales are not limited thereto. Note that lighting is not needed to be performed in order of $T_{s1}$, $T_{s2}$, $T_{s3}$, and $T_{s4}$, and the order may be random or light may be emitted by dividing any of the periods of $T_{s1}$, $T_{s2}$, $T_{s3}$, and $T_{s4}$ into a plurality of periods. A ratio of lighting times of $T_{s1}$, $T_{s2}$, $T_{s3}$, and $T_{s4}$ is not needed to be a power of two, and may be the same length or slightly different from a power of two.

Next, a structure and an operation of a pixel to which digital time gray scale driving can be applied are described.

Figure 77:
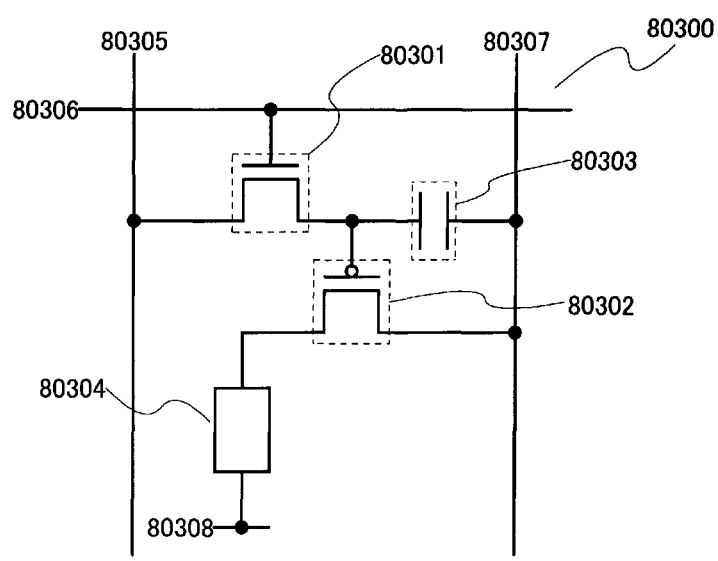
FIG. 77 illustrates a circuit structure of a display device according to the invention.

FIG. 77 shows an example of a pixel structure to which digital time gray scale driving can be applied.

A pixel 80300 includes a switching transistor 80301, a driving transistor 80302, a light-emitting element 80304, and a capacitor 80303. A gate of the switching transistor 80301 is connected to a scan line 80306, a first electrode (one of a source electrode and a drain electrode) of the switching transistor 80301 is connected to a signal line 80305, and a second electrode (the other of the source electrode and the drain electrode) of the switching transistor 80301 is connected to a gate of the driving transistor 80302. The gate of the driving transistor 80302 is connected to a power supply line 80307 through the capacitor 80303, a first electrode of the driving transistor 80302 is connected to the power supply line 80307, and a second electrode of the driving transistor 80302 is connected to a first electrode (a pixel electrode) of the light-emitting element 80304. A second electrode of the light-emitting element 80304 corresponds to a common electrode 80308.

Note that the second electrode (the common electrode 80308) of the light-emitting element 80304 is set to have a low power supply potential. The low power supply potential refers to a potential satisfying (the low power supply potential)<(a high power supply potential) based on the high power supply potential set to the power supply line 80307. As the low power supply potential, GND, 0 V, or the like may be set, for example. In order to make the light-emitting element 80304 emit light by applying a potential difference between the high power supply potential and the low power supply potential to the light-emitting element 80304 so that current is supplied to the light-emitting element 80304, each of the potentials is set so that the potential difference between the high power supply potential and the low power supply potential is equal to or higher than the forward threshold voltage of the light-emitting element 80304.

Note that gate capacitance of the driving transistor 80302 may be used as a substitute for the capacitor 80303, so that the capacitor 80303 can be omitted. The gate capacitance of the driving transistor 80302 may be formed in a region where a source region, a drain region, an LDD region, or the like overlaps with the gate electrode. Alternatively, capacitance may be formed between a channel formation region and the gate electrode.

When a pixel is selected by the scan line 80306, that is, when the switching transistor 80301 is turned on, a video signal is input to the pixel from the signal line 80305. Then, a charge for voltage corresponding to the video signal is stored in the capacitor 80303, and the capacitor 80303 holds the voltage. The voltage is voltage between the gate and the first electrode of the driving transistor 80302 and corresponds to gate-source voltage $V_{gs}$ of the driving transistor 80302.

In general, an operation region of a transistor can be divided into a linear region and a saturation region. When the drain-source voltage is denoted by $V_{ds}$, the gate-source voltage is denoted by $V_{gs}$, and the threshold voltage is denoted by $V_{th}$, a boundary between the linear region and the saturation region is the time when $(V_{gs}-V_{th})=V_{ds}$ is satisfied. In the case where $(V_{gs}-V_{th})>V_{ds}$ is satisfied, the transistor operates in the linear region, and a current value is determined in accordance with the levels of $V_{ds}$ and $V_{gs}$. On the other hand, in the case where $(V_{gs}-V_{th})<V_{ds}$ is satisfied, the transistor operates in the saturation region and ideally, a current value hardly changes even when $V_{ds}$ changes. That is, the current value is determined only by the level of $V_{gs}$.

Here, in the case of a voltage-input voltage driving method, a video signal is input to the gate of the driving transistor 80302 so that the driving transistor 80302 is in either of two states of being sufficiently turned on and turned off. That is, the driving transistor 80302 operates in the linear region.

Thus, when a video signal which makes the driving transistor 80302 turned on is input, a power supply potential VDD set to the power supply line 80307 is ideally set to the first electrode of the light-emitting element 80304 without change.

That is, ideally, constant voltage is applied to the light-emitting element 80304 to obtain constant luminance from the light-emitting element 80304. Then, a plurality of subframe periods are provided in one frame period. A video signal is written to a pixel in each subframe period, lighting and non-lighting of the pixel are controlled in each subframe period, and a gray scale is expressed by the sum of lighting subframe periods.

Note that when the video signal by which the driving transistor 80302 operates in the saturation region is input, current can be supplied to the light-emitting element 80304. When the light-emitting element 80304 is an element luminance of which is determined in accordance with current, luminance decay due to deterioration of the light-emitting element 80304 can be suppressed. Further, when the video signal is an analog signal, current in accordance with the video signal can be supplied to the light-emitting element 80304. In this case, analog gray scale driving can be performed.

Figure 78:
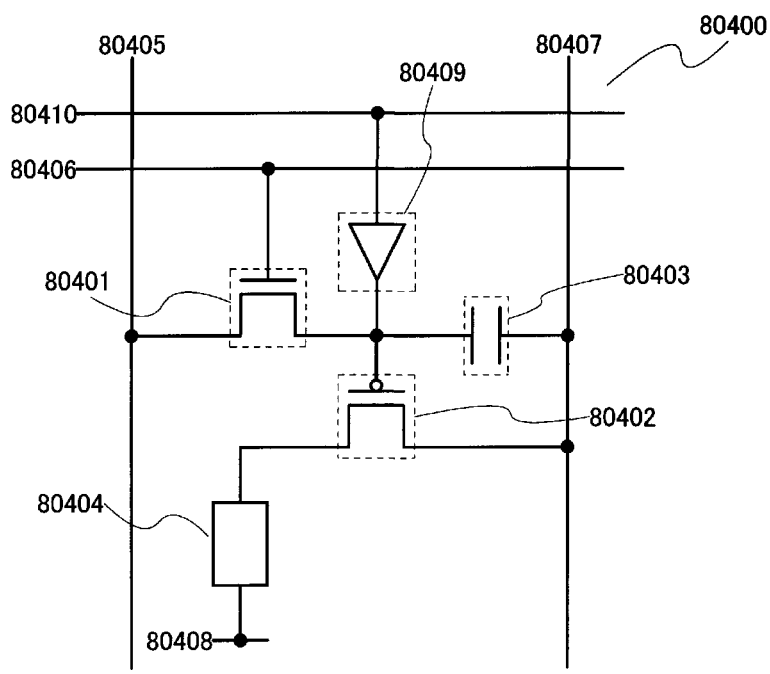
FIG. 78 illustrates a circuit structure of a display device according to the invention.

FIG. 78 shows another example of a pixel structure to which digital time gray scale driving can be applied.

A pixel 80400 includes a switching transistor 80401, a driving transistor 80402, a capacitor 80403, a light-emitting element 80404, and a rectifying element 80409. A gate of the switching transistor 80401 is connected to a first scan line 80406, a first electrode (one of a source electrode and a drain electrode) of the switching transistor 80401 is connected to a signal line 80405, and a second electrode (the other of the source electrode and the drain electrode) of the switching transistor 80401 is connected to a gate of the driving transistor 80402. The gate of the driving transistor 80402 is connected to a power supply line 80407 through the capacitor 80403, and is also connected to a second scan line 80410 through the rectifying element 80409. A first electrode of the driving transistor 80402 is connected to the power supply line 80407, and a second electrode of the driving transistor 80402 is connected to a first electrode (a pixel electrode) of the light-emitting element 80404. A second electrode of the light-emitting element 80404 corresponds to a common electrode 80408.

The second electrode (the common electrode 80408) of the light-emitting element 80404 is set to have a low power supply potential. Note that the low power supply potential refers to a potential satisfying (the low power supply potential)<(a high power supply potential) based on the high power supply potential set to the power supply line 80407. As the low power supply potential, GND, 0 V, or the like may be set, for example. In order to make the light-emitting element 80404 emit light by applying a potential difference between the high power supply potential and the low power supply potential to the light-emitting element 80404 so that current is supplied to the light-emitting element 80404, each of the potentials is set so that the potential difference between the high power supply potential and the low power supply potential is equal to or higher than the forward threshold voltage of the light-emitting element 80404.

Note that gate capacitance of the driving transistor 80402 may be used as a substitute for the capacitor 80403, so that the capacitor 80403 can be omitted. The gate capacitance of the driving transistor 80402 may be formed in a region where a source region, a drain region, an LDD region, or the like overlaps with the gate electrode. Alternatively, capacitance may be formed between a channel formation region and the gate electrode.

As the rectifying element 80409, a diode-connected transistor can be used. A PN junction diode, a PIN junction diode, a Schottky diode, a diode formed of a carbon nanotube, or the like may be used as well as a diode-connected transistor. A diode-connected transistor may be an n-channel transistor or a p-channel transistor.

The pixel 80400 is such that the rectifying element 80409 and the second scan line 80410 are added to the pixel shown in FIG. 77. Accordingly, the switching transistor 80401, the driving transistor 80402, the capacitor 80403, the light-emitting element 80404, the signal line 80405, the first scan line 80406, the power supply line 80407, and the common electrode 80408 shown in FIG. 78 correspond to the switching transistor 80301, the driving transistor 80302, the capacitor 80303, the light-emitting element 80304, the signal line 80305, the scan line 80306, the power supply line 80307, and the common electrode 80308 shown in FIG. 77. Accordingly, a writing operation and a light-emitting operation in FIG. 78 are similar to those described in FIG. 77, so that description thereof is omitted.

An erasing operation is described. In the erasing operation, an H-level signal is input to the second scan line 80410. Thus, current is supplied to the rectifying element 80409, and a gate potential of the driving transistor 80402 held by the capacitor 80403 can be set to a certain potential. That is, the potential of the gate of the driving transistor 80402 is set to a certain potential, and the driving transistor 80402 can be forced to be turned off regardless of a video signal written to the pixel.

Note that an L-level signal input to the second scan line 80410 has a potential such that current is not supplied to the rectifying element 80409 when a video signal for non-lighting is written to the pixel. An H-level signal input to the second scan line 80410 has a potential such that a potential to turn off the driving transistor 80402 can be set to the gate regardless of a video signal written to the pixel.

Figure 79:
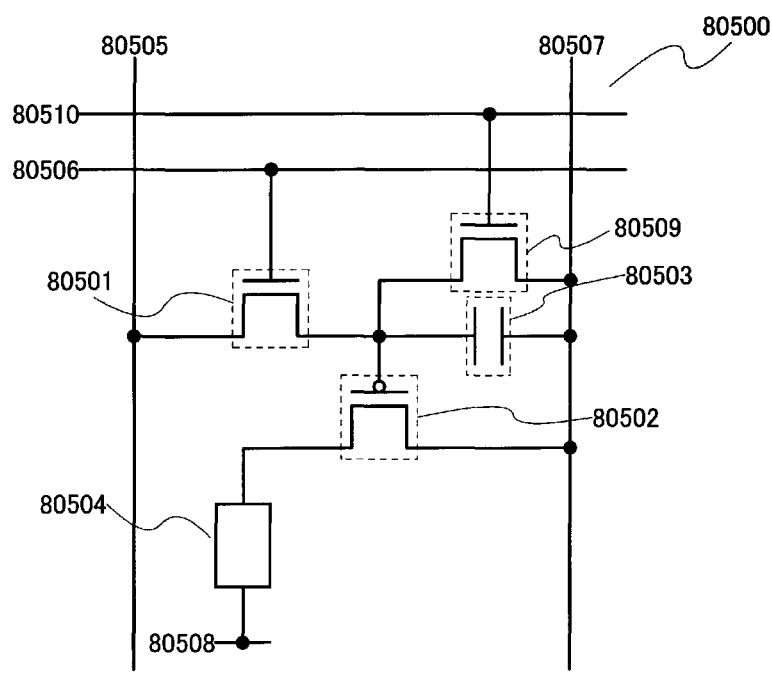
FIG. 79 illustrates a circuit structure of a display device according to the invention.

FIG. 79 shows another example of a pixel structure to which digital time gray scale driving can be applied.

A pixel 80500 includes a switching transistor 80501, a driving transistor 80502, a capacitor 80503, a light-emitting element 80504, and an erasing transistor 80509. A gate of the switching transistor 80501 is connected to a first scan line 80506, a first electrode (one of a source electrode and a drain electrode) of the switching transistor 80501 is connected to a signal line 80505, and a second electrode (the other of the source electrode and the drain electrode) of the switching transistor 80501 is connected to a gate of the driving transistor 80502. The gate of the driving transistor 80502 is connected to a power supply line 80507 through the capacitor 80503, and is also connected to a first electrode of the erasing transistor 80509. A first electrode of the driving transistor 80502 is connected to the power supply line 80507, and a second electrode of the driving transistor 80502 is connected to a first electrode (a pixel electrode) of the light-emitting element 80504. A gate of the erasing transistor 80509 is connected to a second scan line 80510, and a second electrode of the erasing transistor 80509 is connected to the power supply line 80507. A second electrode of the light-emitting element 80504 corresponds to a common electrode 80508.

The second electrode (the common electrode 80508) of the light-emitting element 80504 is set to have a low power supply potential. Note that the low power supply potential refers to a potential satisfying (the low power supply potential)<(a high power supply potential) based on the high power supply potential set to the power supply line 80507. As the low power supply potential, GND, 0 V, or the like may be set, for example. In order to make the light-emitting element 80504 emit light by applying a potential difference between the high power supply potential and the low power supply potential to the light-emitting element 80504 so that current is supplied to the light-emitting element 80504, each of the potentials is set so that the potential difference between the high power supply potential and the low power supply potential is equal to or higher than the forward threshold voltage of the light-emitting element 80504.

Note that gate capacitance of the driving transistor 80502 may be used as a substitute for the capacitor 80503, so that the capacitor 80503 can be omitted. The gate capacitance of the driving transistor 80502 may be formed in a region where a source region, a drain region, an LDD region, or the like overlaps with the gate electrode. Alternatively, capacitance may be formed between a channel formation region and the gate electrode.

The pixel 80500 is such that the erasing transistor 80509 and the second scan line 80510 are added to the pixel shown in FIG. 77. Accordingly, the switching transistor 80501, the driving transistor 80502, the capacitor 80503, the light-emitting element 80504, the signal line 80505, the first scan line 80506, the power supply line 80507, and the common electrode 80508 shown in FIG. 79 correspond to the switching transistor 80301, the driving transistor 80302, the capacitor 80303, the light-emitting element 80304, the signal line 80305, the scan line 80306, the power supply line 80307, and the common electrode 80308 shown in FIG. 77. Accordingly, a writing operation and a light-emitting operation in FIG. 79 are similar to those described in FIG. 77, so that description thereof is omitted.

An erasing operation is described. In the erasing operation, an H-level signal is input to the second scan line 80510. Thus, the erasing transistor 80509 is turned on, so that the gate and the first electrode of the driving transistor 80502 can have the same potential. That is, $V_{gs}$ of the driving transistor 80502 can be 0 V. Accordingly, the driving transistor 80502 can be forced to be turned off.

Next, a structure and an operation of a pixel called a threshold voltage compensation pixel are described. The threshold voltage compensation pixel can be applied to digital time gray scale driving and analog gray scale driving.

Figure 80:
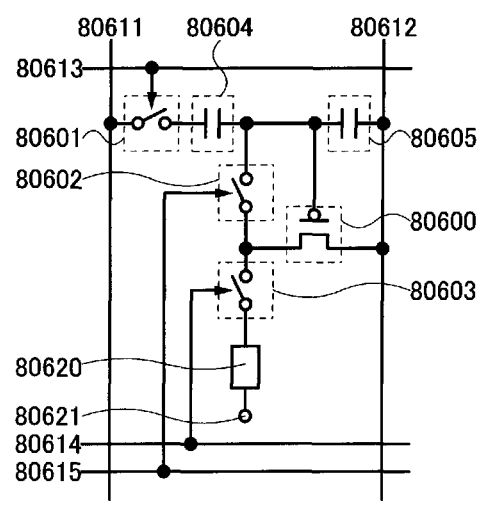
FIG. 80 illustrates a circuit structure of a display device according to the invention.

FIG. 80 shows an example of a structure of a pixel called a threshold voltage compensation pixel.

The pixel shown in FIG. 80 includes a driving transistor 80600, a first switch 80601, a second switch 80602, a third switch 80603, a first capacitor 80604, a second capacitor 80605, and a light-emitting element 80620. A gate of the driving transistor 80600 is connected to a signal line 80611 through the first capacitor 80604 and the first switch 80601 in this order. Further, the gate of the driving transistor 80600 is connected to a power supply line 80612 through the second capacitor 80605. A first electrode of the driving transistor 80600 is connected to the power supply line 80612. A second electrode of the driving transistor 80600 is connected to a first electrode of the light-emitting element 80620 through the third switch 80603. Further, the second electrode of the driving transistor 80600 is connected to the gate of the driving transistor 80600 through the second switch 80602. A second electrode of the light-emitting element 80620 corresponds to a common electrode 80621.

The second electrode of the light-emitting element 80620 is set to a low power supply potential. Note that the low power supply potential refers to a potential satisfying (the low power supply potential)<(a high power supply potential) based on the high power supply potential set to the power supply line 80612. As the low power supply potential, GND, 0 V, or the like may be set, for example. In order to make the light-emitting element 80620 emit light by applying a potential difference between the high power supply potential and the low power supply potential to the light-emitting element 80620 so that current is supplied to the light-emitting element 80620, each of the potentials is set so that the potential difference between the high power supply potential and the low power supply potential is equal to or higher than the forward threshold voltage of the light-emitting element 80620. Note that gate capacitance of the driving transistor 80600 may be used as a substitute for the second capacitor 80605, so that the second capacitor 80605 can be omitted. The gate capacitance of the driving transistor 80600 may be formed in a region where a source region, a drain region, an LDD region, or the like overlaps with the gate electrode. Alternatively, capacitance may be formed between a channel formation region and the gate electrode. Note that on/off of the first switch 80601, the second switch 80602, and the third switch 80603 is controlled by a first scan line 80613, a second scan line 80615, and a third scan line 80614, respectively.

A method for driving the pixel shown in FIG. 80 is described in which an operation period is divided into an initialization period, a data writing period, a threshold detection period, and a light-emitting period.

In the initialization period, the second switch 80602 and the third switch 80603 are turned on. Then, a potential of the gate of the driving transistor 80600 becomes lower than at least a potential of the power supply line 80612. At this time, the first switch 80601 may be in an on state or an off state. Note that the initialization period is not necessarily required.

In the threshold detection period, a pixel is selected by the first scan line 80613. That is, the first switch 80601 is turned on, and constant voltage is input from the signal line 80611. At this time, the second switch 80602 is turned on and the third switch 80603 is turned off. Accordingly, the driving transistor 80600 is diode-connected, and the second electrode and the gate of the driving transistor 80600 are placed in a floating state. Then, a potential of the gate of the driving transistor 80600 becomes a value obtained by subtracting the threshold voltage of the driving transistor 80600 from the potential of the power supply line 80612. Thus, the threshold voltage of the driving transistor 80600 is held in the first capacitor 80604. A potential difference between the potential of the gate of the driving transistor 80600 and the constant voltage input from the signal line 80611 is held in the second capacitor 80605.

In the data writing period, a video signal (voltage) is input from the signal line 80611. At this time, the first switch 80601 is kept on, the second switch 80602 is turned off, and the third switch 80603 is kept off. Since the gate of the driving transistor 80600 is in a floating state, the potential of the gate of the driving transistor 80600 changes depending on a potential difference between the constant voltage input from the signal line 80611 in the threshold detection period and the video signal input from the signal line 80611 in the data writing period. For example, when (a capacitance value of the first capacitor 80604)<<(a capacitance value of the second capacitor 80605) is satisfied, the potential of the gate of the driving transistor 80600 in the data writing period is approximately equal to the sum of a potential difference (the amount of change) between the potential of the signal line 80611 in the threshold detection period and the potential of the signal line 80611 in the data writing period, and a value obtained by subtracting the threshold voltage of the driving transistor 80600 from the potential of the power supply line 80612. That is, the potential of the gate of the driving transistor 80600 becomes a potential obtained by compensating the threshold voltage of the driving transistor 80600.

In the light-emitting period, current in accordance with a potential difference ($V_{gs}$) between the gate of the driving transistor 80600 and the power supply line 80612 is supplied to the light-emitting element 80620. At this time, the first switch 80601 is turned off, the second switch 80602 is kept off, and the third switch 80603 is turned on. Note that current flowing to the light-emitting element 80620 is constant regardless of the threshold voltage of the driving transistor 80600.

Note that a pixel structure of the present invention is not limited to that shown in FIG. 80. For example, a switch, a resistor, a capacitor, a transistor, a logic circuit, or the like may be added to the pixel shown in FIG. 80. For example, the second switch 80602 may include a p-channel transistor or an n-channel transistor, the third switch 80603 may include a transistor with polarity different from that of the second switch 80602, and the second switch 80602 and the third switch 80603 may be controlled by the same scan line.

A structure and an operation of a pixel called a current input pixel are described. The current input pixel can be applied to digital gray scale driving and analog gray scale driving.

Figure 81:
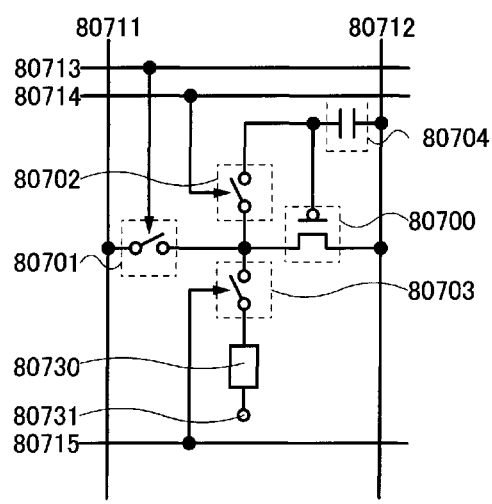
FIG. 81 illustrates a circuit structure of a display device according to the invention.

FIG. 81 shows an example of a structure of a pixel called a current input pixel.

The pixel shown in FIG. 81 includes a driving transistor 80700, a first switch 80701, a second switch 80702, a third switch 80703, a capacitor 80704, and a light-emitting element 80730. A gate of the driving transistor 80700 is connected to a signal line 80711 through the second switch 80702 and the first switch 80701 in this order. Further, the gate of the driving transistor 80700 is connected to a power supply line 80712 through the capacitor 80704. A first electrode of the driving transistor 80700 is connected to the power supply line 80712. A second electrode of the driving transistor 80700 is connected to the signal line 80711 through the first switch 80701. Further, the second electrode of the driving transistor 80700 is connected to a first electrode of the light-emitting element 80730 through the third switch 80703. A second electrode of the light-emitting element 80730 corresponds to a common electrode 80731.

The second electrode of the light-emitting element 80730 is set to a low power supply potential. Note that the low power supply potential refers to a potential satisfying (the low power supply potential)<(a high power supply potential) based on the high power supply potential set to the power supply line 80712. As the low power supply potential, GND, 0 V, or the like may be set, for example. In order to make the light-emitting element 80730 emit light by applying a potential difference between the high power supply potential and the low power supply potential to the light-emitting element 80730 so that current is supplied to the light-emitting element 80730, each of the potentials is set so that the potential difference between the high power supply potential and the low power supply potential is equal to or higher than the forward threshold voltage of the light-emitting element 80730. Note that gate capacitance of the driving transistor 80700 may be used as a substitute for the capacitor 80704, so that the capacitor 80704 can be omitted. The gate capacitance of the driving transistor 80700 may be formed in a region where a source region, a drain region, an LDD region, or the like overlaps with the gate electrode. Alternatively, capacitance may be formed between a channel formation region and the gate electrode. Note that on/off of the first switch 80701, the second switch 80702, and the third switch 80703 is controlled by a first scan line 80713, a second scan line 80714, and a third scan line 80715, respectively.

A method for driving the pixel shown in FIG. 81 is described in which an operation period is divided into a data writing period and a light-emitting period.

In the data writing period, the pixel is selected by the first scan line 80713. That is, the first switch 80701 is turned on, and current is input as a video signal from the signal line 80711. At this time, the second switch 80702 is turned on and the third switch 80703 is turned off. Accordingly, a potential of the gate of the driving transistor 80700 becomes a potential in accordance with the video signal. That is, voltage between the gate electrode and the source electrode of the driving transistor 80700, by which the driving transistor 80700 supplies the same current as the video signal, is held in the capacitor 80704.

Next, in the light-emitting period, the first switch 80701 and the second switch 80702 are turned off, and the third switch 80703 is turned on. Thus, current with the same value as the video signal is supplied to the light-emitting element 80730.

Note that the present invention is not limited to the pixel structure shown in FIG. 81. For example, a switch, a resistor, a capacitor, a transistor, a logic circuit, or the like may be added to the pixel shown in FIG. 81. For example, the first switch 80701 may include a p-channel transistor or an n-channel transistor, the second switch 80702 may include a transistor with the same polarity as the first switch 80701, and the first switch 80701 and the second switch 80702 may be controlled by the same scan line. The second switch 80702 may be provided between the gate of the driving transistor 80700 and the signal line 80711.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 16

In this embodiment mode, a pixel structure of a display device is described. In particular, a pixel structure of a display device using an organic EL element is described.

Figure 82A:
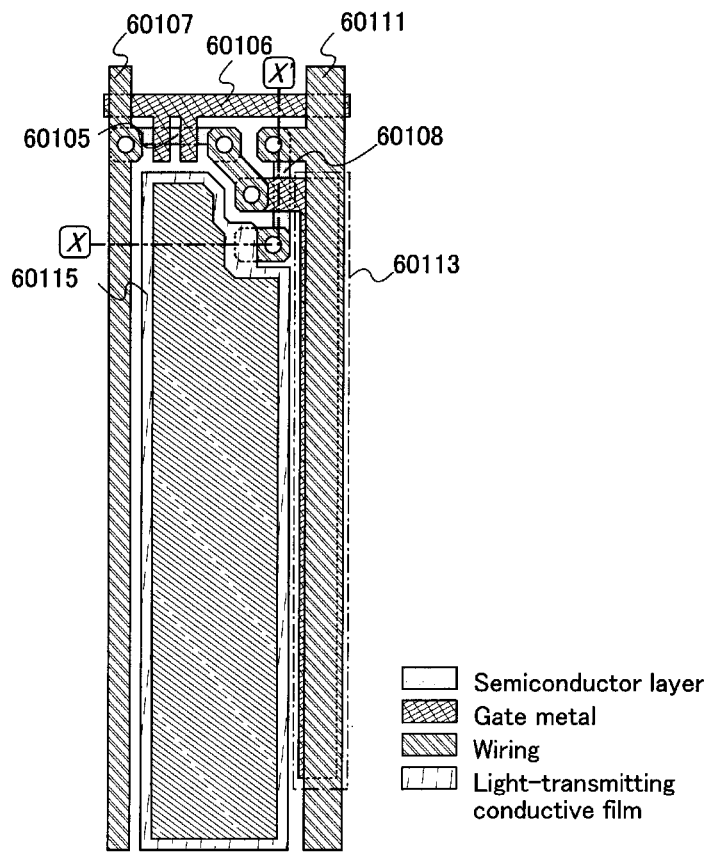
FIG. 82A is a top plan view of a display device according to the invention.
Figure 82B:
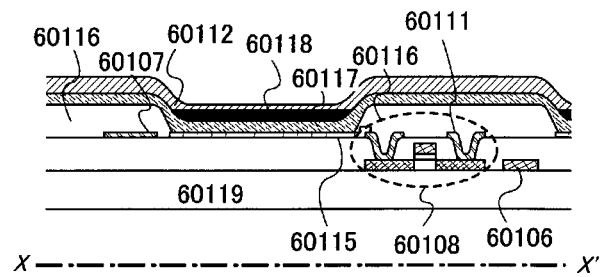
FIG. 82B is a cross-sectional view thereof.

FIG. 82A shows an example of a top plan view (a layout diagram) of a pixel including two transistors. FIG. 82B shows an example of a cross-sectional view along X-X' in FIG. 82A.

FIG. 82A shows a first transistor 60105, a first wiring 60106, a second wiring 60107, a second transistor 60108, a third wiring 60111, a counter electrode 60112, a capacitor 60113, a pixel electrode 60115, a partition wall 60116, an organic conductive film 60117, an organic thin film 60118, and a substrate 60119. Note that it is preferable that the first transistor 60105 be used as a switching transistor, the first wiring 60106 as a gate signal line, the second wiring 60107 as a source signal line, the second transistor 60108 as a driving transistor, and the third wiring 60111 as a current supply line.

A gate electrode of the first transistor 60105 is electrically connected to the first wiring 60106. One of a source electrode and a drain electrode of the first transistor 60105 is electrically connected to the second wiring 60107. The other of the source electrode and the drain electrode of the first transistor 60105 is electrically connected to a gate electrode of the second transistor 60108 and one electrode of the capacitor 60113. Note that the gate electrode of the first transistor 60105 includes a plurality of gate electrodes. Accordingly, leakage current in the off state of the first transistor 60105 can be reduced.

One of a source electrode and a drain electrode of the second transistor 60108 is electrically connected to the third wiring 60111, and the other of the source electrode and the drain electrode of the second transistor 60108 is electrically connected to the pixel electrode 60115. Accordingly, current flowing to the pixel electrode 60115 can be controlled by the second transistor 60108.

The organic conductive film 60117 is provided over the pixel electrode 60115, and the organic thin film 60118 (an organic compound layer) is provided thereover. The counter electrode 60112 is provided over the organic thin film 60118 (the organic compound layer). Note that the counter electrode 60112 may be formed over the entire surface to be connected to all the pixels in common, or may be patterned using a shadow mask or the like.

Light emitted from the organic thin film 60118 (the organic compound layer) is transmitted through either the pixel electrode 60115 or the counter electrode 60112.

In FIG. 82B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60115 be formed of a light-transmitting conductive film. On the other hand, in the case of top emission, it is preferable that the counter electrode 60112 be formed of a light-transmitting conductive film.

In a light-emitting device for color display, EL elements having respective light emission colors of RGB may be separately formed, or an EL element with a single color may be formed over an entire surface and light emission of RGB can be obtained by using a color filter.

Note that the structures shown in FIGS. 82A and 82B are examples, and various structures can be employed for a pixel layout, a cross-sectional structure, a stacking order of electrodes of an EL element, and the like, other than the structures shown in FIGS. 82A and 82B. Further, as a light-emitting element, various elements such as a crystalline element such as an LED, and an element formed of an inorganic thin film can be used as well as the element formed of the organic thin film shown in the drawing.

Figure 83A:
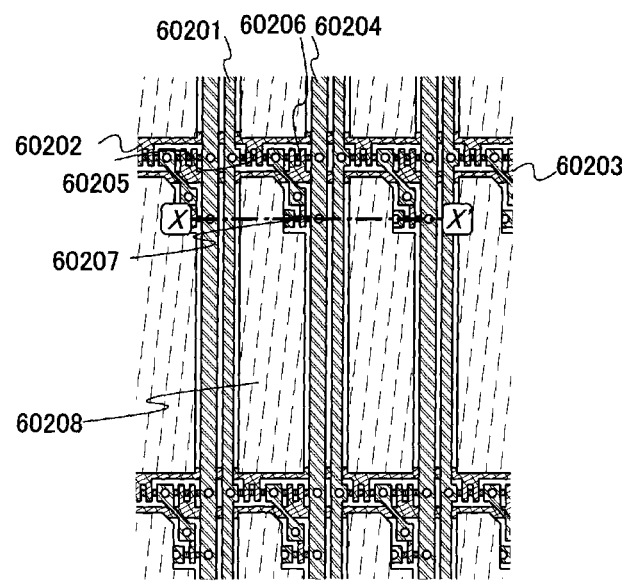
FIG. 83A is a top plan view of a display device according to the invention.
Figure 83B:
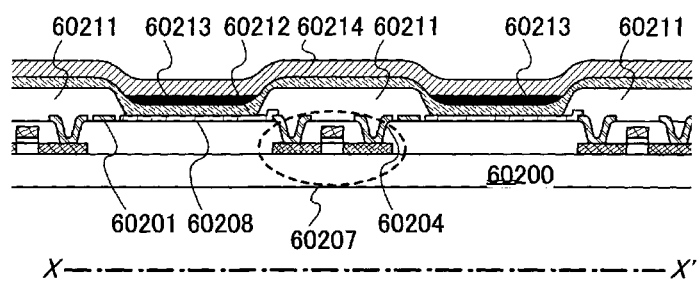
FIG. 83B is a cross-sectional view thereof.

FIG. 83A shows an example of a top plan view (a layout diagram) of a pixel including three transistors. FIG. 83B shows an example of a cross-sectional view along X-X' in FIG. 83A.

FIG. 83A shows a substrate 60200, a first wiring 60201, a second wiring 60202, a third wiring 60203, a fourth wiring 60204, a first transistor 60205, a second transistor 60206, a third transistor 60207, a pixel electrode 60208, a partition wall 60211, an organic conductive film 60212, an organic thin film 60213, and a counter electrode 60214. Note that it is preferable that the first wiring 60201 be used as a source signal line, the second wiring 60202 as a gate signal line for writing, the third wiring 60203 as a gate signal line for erasing, the fourth wiring 60204 as a current supply line, the first transistor 60205 as a switching transistor, the second transistor 60206 as an erasing transistor, and the third transistor 60207 as a driving transistor.

A gate electrode of the first transistor 60205 is electrically connected to the second wiring 60202. One of a source electrode and a drain electrode of the first transistor 60205 is electrically connected to the first wiring 60201. The other of the source electrode and the drain electrode of the first transistor 60205 is electrically connected to a gate electrode of the third transistor 60207. Note that the gate electrode of the first transistor 60205 includes a plurality of gate electrodes. Accordingly, leakage current in the off state of the first transistor 60205 can be reduced.

A gate electrode of the second transistor 60206 is electrically connected to the third wiring 60203. One of a source electrode and a drain electrode of the second transistor 60206 is electrically connected to the fourth wiring 60204. The other of the source electrode and the drain electrode of the second transistor 60206 is electrically connected to the gate electrode of the third transistor 60207. Note that the gate electrode of the second transistor 60206 includes a plurality of gate electrodes. Accordingly, leakage current in the off state of the second transistor 60206 can be reduced.

One of a source electrode and a drain electrode of the third transistor 60207 is electrically connected to the fourth wiring 60204, and the other of the source electrode and the drain electrode of the third transistor 60207 is electrically connected to the pixel electrode 60208. Accordingly, current flowing to the pixel electrode 60208 can be controlled by the third transistor 60207.

The organic conductive film 60212 is provided over the pixel electrode 60208, and the organic thin film 60213 (an organic compound layer) is provided thereover. The counter electrode 60214 is provided over the organic thin film 60213 (the organic compound layer). Note that the counter electrode 60214 may be formed over the entire surface to be connected to all the pixels in common, or may be patterned using a shadow mask or the like.

Light emitted from the organic thin film 60213 (the organic compound layer) is transmitted through either the pixel electrode 60208 or the counter electrode 60214.

In FIG. 83B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60208 be formed of a light-transmitting conductive film. On the other hand, in the case of top emission, it is preferable that the counter electrode 60214 be formed of a light-transmitting conductive film.

In a light-emitting device for color display, EL elements having respective light emission colors of RGB may be separately formed, or an EL element with a single color may be formed over an entire surface and light emission of RGB can be obtained by using a color filter.

Note that the structures shown in FIGS. 83A and 83B are examples, and various structures can be employed for a pixel layout, a cross-sectional structure, a stacking order of electrodes of an EL element, and the like, other than the structures shown in FIGS. 83A and 83B. Further, as a light-emitting element, various elements such as a crystalline element such as an LED, and an element formed of an inorganic thin film can be used as well as the element formed of the organic thin film shown in the drawing.

Figure 84A:
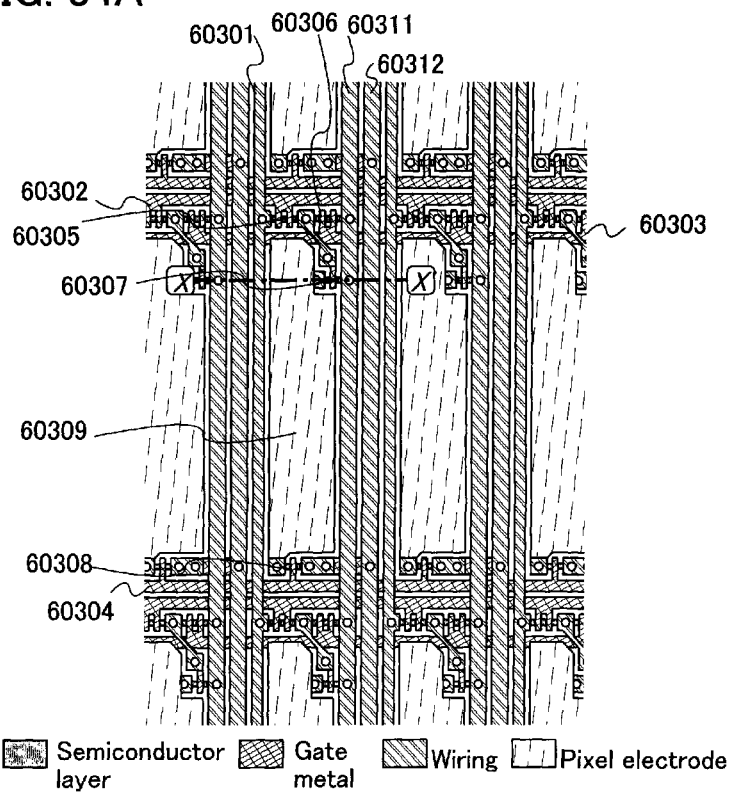
FIG. 84A is a top plan view of a display device according to the invention.
Figure 84B:
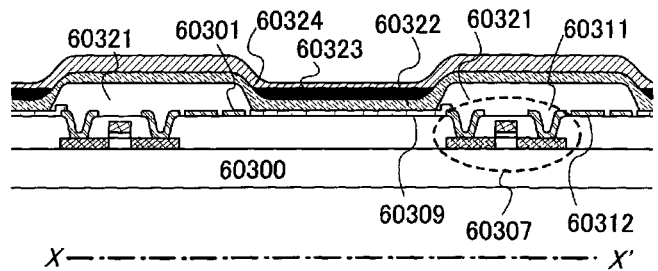
FIG. 84B is a cross-sectional view thereof.

FIG. 84A shows an example of a top plan view (a layout diagram) of a pixel including four transistors. FIG. 84B shows an example of a cross-sectional view along X-X' in FIG. 84A.

FIG. 84A shows a substrate 60300, a first wiring 60301, a second wiring 60302, a third wiring 60303, a fourth wiring 60304, a first transistor 60305, a second transistor 60306, a third transistor 60307, a fourth transistor 60308, a pixel electrode 60309, a fifth wiring 60311, a sixth wiring 60312, a partition wall 60321, an organic conductive film 60322, an organic thin film 60323, and a counter electrode 60324. Note that it is preferable that the first wiring 60301 be used as a source signal line, the second wiring 60302 as a gate signal line for writing, the third wiring 60303 as a gate signal line for erasing, the fourth wiring 60304 as a signal line for reverse bias, the first transistor 60305 as a switching transistor, the second transistor 60306 as an erasing transistor, the third transistor 60307 as a driving transistor, the fourth transistor 60308 as a transistor for reverse bias, the fifth wiring 60311 as a current supply line, and the sixth wiring 60312 as a power supply line for reverse bias.

A gate electrode of the first transistor 60305 is electrically connected to the second wiring 60302. One of a source electrode and a drain electrode of the first transistor 60305 is electrically connected to the first wiring 60301. The other of the source electrode and the drain electrode of the first transistor 60305 is electrically connected to a gate electrode of the third transistor 60307. Note that the gate electrode of the first transistor 60305 includes a plurality of gate electrodes. Accordingly, leakage current in the off state of the first transistor 60305 can be reduced.

A gate electrode of the second transistor 60306 is electrically connected to the third wiring 60303. One of a source electrode and a drain electrode of the second transistor 60306 is electrically connected to the fifth wiring 60311. The other of the source electrode and the drain electrode of the second transistor 60306 is electrically connected to the gate electrode of the third transistor 60307. Note that the gate electrode of the second transistor 60306 includes a plurality of gate electrodes. Accordingly, leakage current in the off state of the second transistor 60306 can be reduced.

One of a source electrode and a drain electrode of the third transistor 60307 is electrically connected to the fifth wiring 60311, and the other of the source electrode and the drain electrode of the third transistor 60307 is electrically connected to the pixel electrode 60309. Accordingly, current flowing to the pixel electrode 60309 can be controlled by the third transistor 60307.

A gate electrode of the fourth transistor 60308 is electrically connected to the fourth wiring 60304. One of a source electrode and a drain electrode of the fourth transistor 60308 is electrically connected to the sixth wiring 60312. The other of the source electrode and the drain electrode of the fourth transistor 60308 is electrically connected to the pixel electrode 60309. Accordingly, a potential of the pixel electrode 60309 can be controlled by the fourth transistor 60308, so that reverse bias can be applied to the organic conductive film 60322 and the organic thin film 60323. When reverse bias is applied to a light-emitting element including the organic conductive film 60322, the organic thin film 60323, and the like, reliability of the light-emitting element can be significantly improved.

The organic conductive film 60322 is provided over the pixel electrode 60309, and the organic thin film 60323 (an organic compound layer) is provided thereover. The counter electrode 60324 is provided over the organic thin film 60323 (the organic compound layer). Note that the counter electrode 60324 may be formed over the entire surface to be connected to all the pixels in common, or may be patterned using a shadow mask or the like.

Light emitted from the organic thin film 60323 (the organic compound layer) is transmitted through either the pixel electrode 60309 or the counter electrode 60324.

In FIG. 84B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60309 be formed of a light-transmitting conductive film. On the other hand, in the case of top emission, it is preferable that the counter electrode 60324 be formed of a light-transmitting conductive film.

In a light-emitting device for color display, EL elements having respective light emission colors of RGB may be separately formed, or an EL element with a single color may be formed over an entire surface and light emission of RGB can be obtained by using a color filter.

Note that the structures shown in FIGS. 84A and 84B are examples, and various structures can be employed for a pixel layout, a cross-sectional structure, a stacking order of electrodes of an EL element, and the like, other than the structures shown in FIGS. 84A and 84B. Further, as a light-emitting element, various elements such as a crystalline element such as an LED, and an element formed of an inorganic thin film can be used as well as the element formed of the organic thin film shown in the drawing.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 17

In this embodiment mode, a structure of an EL element is described. In particular, a structure of an organic EL element is described.

A structure of a mixed junction EL element is described. As an example, a structure is described, which includes a layer (a mixed layer) in which a plurality of materials among a hole injecting material, a hole transporting material, a light-emitting material, an electron transporting material, an electron injecting material, and the like are mixed (hereinafter referred to as a mixed junction type EL element), which is different from a stacked-layer structure where a hole injecting layer formed of a hole injecting material, a hole transporting layer formed of a hole transporting material, a light-emitting layer formed of a light-emitting material, an electron transporting layer formed of an electron transporting material, an electron injecting layer formed of an electron injecting material, and the like are clearly distinguished.

FIGS. 85A to 85E are schematic views each showing a structure of a mixed junction type EL element. Note that a layer interposed between an anode 190101 and a cathode 190102 corresponds to an EL layer.

Figure 85A:
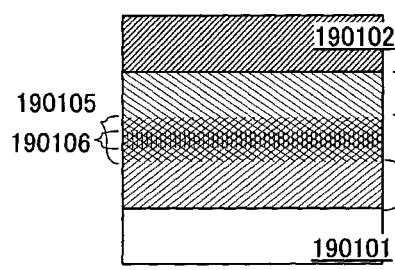
FIGS. 85A to 85E each illustrate a light-emitting element of a display device according to the invention.

FIG. 85A shows a structure in which an EL layer includes a hole transporting region 190103 formed of a hole transporting material and an electron transporting region 190104 formed of an electron transporting material. The hole transporting region 190103 is closer to the anode than the electron transporting region 190104. A mixed region 190105 including both the hole transporting material and the electron transporting material is provided between the hole transporting region 190103 and the electron transporting region 190104.

In a direction from the anode 190101 to the cathode 190102, a concentration of the hole transporting material in the mixed region 190105 is decreased and a concentration of the electron transporting material in the mixed region 190105 is increased.

Note that a concentration gradient can be freely set. For example, a ratio of concentrations of each functional material may be changed (a concentration gradient may be formed) in the mixed region 190105 including both the hole transporting material and the electron transporting material, without including the hole transporting region 190103 formed of only the hole transporting material. Alternatively, a ratio of concentrations of each functional material may be changed (a concentration gradient may be formed) in the mixed region 190105 including both the hole transporting material and the electron transporting material, without including the hole transporting region 190103 formed of only the hole transporting material and the electron transporting region 190104 formed of only the electron transporting material. Further alternatively, a ratio of concentrations may be changed depending on a distance from the anode or the cathode. Note that the ratio of concentrations may be changed continuously.

A region 190106 to which a light-emitting material is added is included in the mixed region 190105. A light emission color of the EL element can be controlled by the light-emitting material. Further, carriers can be trapped by the light-emitting material. As the light-emitting material, various fluorescent dyes as well as a metal complex having a quinoline skeleton, a benzoxazole skeleton, or a benzothiazole skeleton can be used. The light emission color of the EL element can be controlled by adding the light-emitting material.

As the anode 190101, an electrode material having a high work function is preferably used in order to inject holes efficiently. For example, a transparent electrode formed of indium tin oxide (ITO), indium zinc oxide (IZO), ZnO, $SnO_2$, $In_2O_3$, or the like can be used. When a light-transmitting property is not needed, the anode 190101 may be formed of an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum ($Alq_3$)), or the like can be used.

As the cathode 190102, an electrode material having a low work function is preferably used in order to inject electrons efficiently. A metal such as aluminum, indium, magnesium, silver, calcium, barium, or lithium can be used by itself. Alternatively, an alloy of the aforementioned metal or an alloy of the aforementioned metal and another metal may be used.

Figure 85B:
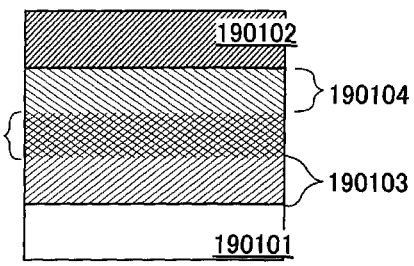

FIG. 85B is the schematic view of the structure of the EL element, which is different from that of FIG. 85A. Note that the same portions as those in FIG. 85A are denoted by the same reference numerals, and description thereof is omitted.

In FIG. 85B, a region to which a light-emitting material is added is not included. However, when a material (electron-transporting and light-emitting material) having both an electron transporting property and a light-emitting property, for example, tris(8-quinolinolato)aluminum (Alq3) is used as a material added to the electron transporting region 190104, light emission can be performed.

Alternatively, as a material added to the hole transporting region 190103, a material (a hole-transporting and light-emitting material) having both a hole transporting property and a light-emitting property may be used.

Figure 85C:
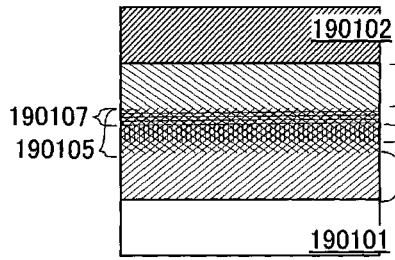

FIG. 85C is the schematic view of the structure of the EL element, which is different from those of FIGS. 85A and 85B. Note that the same portions as those in FIGS. 85A and 85B are denoted by the same reference numerals, and description thereof is omitted.

In FIG. 85C, a region 190107 included in the mixed region 190105 is provided, to which a hole blocking material having a larger energy difference between the highest occupied molecular orbital and the lowest unoccupied molecular orbital than the hole transporting material is added. The region 190107 to which the hole blocking material is added is provided closer to the cathode 190102 than the region 190106 in the mixed region 190105, to which the light-emitting material is added; thus, a recombination rate of carriers can be increased, and light emission efficiency can be increased. The structure provided with the region 190107 to which the hole blocking material is added is especially effective in an EL element which utilizes light emission (phosphorescence) by a triplet exciton.

Figure 85D:
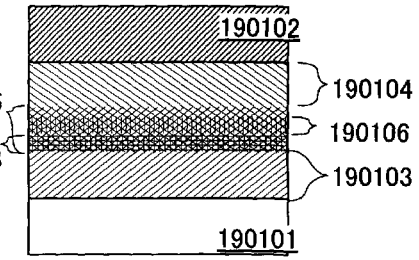

FIG. 85D is the schematic view of the structure of the EL element, which is different from those of FIGS. 85A to 85C. Note that the same portions as those in FIGS. 85A to 85C are denoted by the same reference numerals, and description thereof is omitted.

In FIG. 85D, a region 190108 included in the mixed region 190105 is provided, to which an electron blocking material having a larger energy difference between the highest occupied molecular orbital and the lowest unoccupied molecular orbital than the electron transporting material is added. The region 190108 to which the electron blocking material is added is provided closer to the anode 190101 than the region 190106 in the mixed region 190105, to which the light-emitting material is added; thus, a recombination rate of carriers can be increased, and light emission efficiency can be increased. The structure provided with the region 190108 to which the electron blocking material is added is especially effective in an EL element which utilizes light emission (phosphorescence) by a triplet exciton.

Figure 85E:
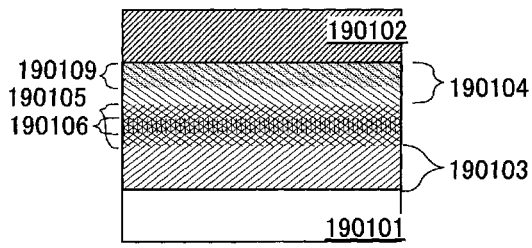

FIG. 85E is the schematic view of the structure of the mixed junction type EL element, which is different from those of FIGS. 85A to 85D. FIG. 85E shows an example of a structure where a region 190109 to which a metal material is added is included in part of an EL layer in contact with an electrode of the EL element. In FIG. 85E, the same portions as those in FIGS. 85A to 85D are denoted by the same reference numerals, and description thereof is omitted. In the structure shown in FIG. 85E, MgAg (an Mg—Ag alloy) may be used as the cathode 190102, and the region 190109 to which an Al (aluminum) alloy is added may be included in a region of the electron transporting region 190104 to which the electron transporting material is added, which is in contact with the cathode 190102, for example. With the aforementioned structure, oxidation of the cathode can be prevented, and electron injection efficiency from the cathode can be increased. Accordingly, the lifetime of the mixed junction type EL element can be extended. Further, driving voltage can be lowered.

As a method of forming the mixed junction type EL element, a co-evaporation method or the like can be used.

In the mixed junction type EL elements as shown in FIGS. 85A to 85E, a clear interface between the layers does not exist, and charge accumulation can be reduced. Accordingly, the lifetime of the EL element can be extended. Further, driving voltage can be lowered.

Note that the structures shown in FIGS. 85A to 85E can be implemented in free combination with each other.

In addition, a structure of the mixed junction type EL element is not limited to those described above. A known structure can be freely used.

An organic material which forms an EL layer of an EL element may be a low molecular material or a high molecular material. Alternatively, both of the materials may be used. When a low molecular material is used for an organic compound material, a film can be formed by an evaporation method. When a high molecular material is used for the EL layer, the high molecular material is dissolved in a solvent and a film can be formed by a spin coating method or an inkjet method.

The EL layer may be formed of a middle molecular material. In this specification, a middle molecule organic light-emitting material refers to an organic light-emitting material without a sublimation property and with a polymerization degree of approximately 20 or less. When a middle molecular material is used for the EL layer, a film can be formed by an inkjet method or the like.

Note that a low molecular material, a high molecular material, and a middle molecular material may be used in combination.

An EL element may utilize either light emission (fluorescence) by a singlet exciton or light emission (phosphorescence) by a triplet exciton.

Next, an evaporation device for manufacturing a display device is described with reference to drawings.

A display device may be manufactured to include an EL layer. The EL layer is formed including at least partially a material which exhibits electroluminescence. The EL layer may be formed of a plurality of layers having different functions. In this case, the EL layer may be formed of a combination of layers having different functions, which are also referred to as a hole injecting and transporting layer, a light-emitting layer, an electron injecting and transporting layer, and the like.

Figure 86:
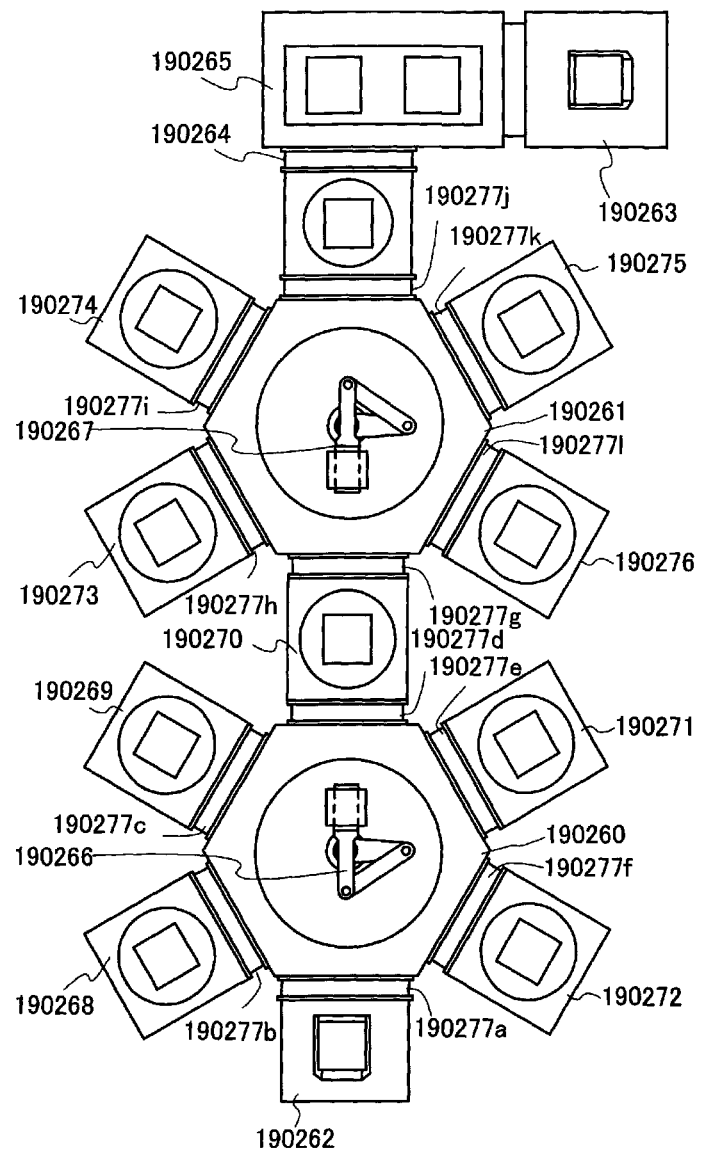
FIG. 86 illustrates a manufacturing device of a display device according to the invention.

FIG. 86 shows a structure of an evaporation device for forming an EL layer over an element substrate provided with a transistor. In the evaporation device, a plurality of treatment chambers are connected to transfer chambers 190260 and 190261. Each treatment chamber includes a loading chamber 190262 for supplying a substrate, an unloading chamber 190263 for collecting the substrate, a heat treatment chamber 190268, a plasma treatment chamber 190272, deposition treatment chambers 190269 to 190271 and 190273 to 190275 for depositing an EL material, and a deposition treatment chamber 190276 for forming a conductive film which is formed of aluminum or contains aluminum as its main component as one electrode of an EL element. Gate valves 190277a to 1902771 are provided between the transfer chambers and the treatment chambers, so that the pressure in each treatment chamber can be controlled independently, and cross contamination between the treatment chambers is prevented.

A substrate introduced into the transfer chamber 190260 from the loading chamber 190262 is transferred to a predetermined treatment chamber by an arm type transfer means 190266 capable of rotating. The substrate is transferred from a certain treatment chamber to another treatment chamber by the transfer means 190266. The transfer chambers 190260 and 190261 are connected by the deposition treatment chamber 190270 at which the substrate is transported by the transfer means 190266 and a transfer means 190267.

Each treatment chamber connected to the transfer chambers 190260 and 190261 is maintained in a reduced pressure state. Accordingly, in the evaporation device, deposition treatment of an EL layer is continuously performed without exposing the substrate to the room air. A display panel in which formation of the EL layer is finished is deteriorated due to moisture or the like in some cases. Accordingly, in the evaporation device, a sealing treatment chamber 190265 for performing sealing treatment before exposure to the room air in order to maintain the quality is connected to the transfer chamber 190261. Since the sealing treatment chamber 190265 is under atmospheric pressure or reduced pressure near atmospheric pressure, an intermediate treatment chamber 190264 is also provided between the transfer chamber 190261 and the sealing treatment chamber 190265. The intermediate treatment chamber 190264 is provided for transporting the substrate and buffering the pressure between the chambers.

An exhaust means is provided in the loading chamber, the unloading chamber, the transfer chamber, and the deposition treatment chamber in order to maintain reduced pressure in the chamber. As the exhaust means, various vacuum pumps such as a dry pump, a turbo-molecular pump, and a diffusion pump can be used.

In the evaporation device of FIG. 86, the number of treatment chambers connected to the transfer chambers 190260 and 190261 and structures thereof can be combined as appropriate in accordance with a stacked-layer structure of the EL element. An example of a combination is described below.

In the heat treatment chamber 190268, degasification treatment is performed by heating a substrate over which a lower electrode, an insulating partition wall, or the like is formed. In the plasma treatment chamber 190272, a surface of the lower electrode is treated with a rare gas or oxygen plasma. This plasma treatment is performed for cleaning the surface, stabilizing a surface state, or stabilizing a physical or chemical state (e.g., a work function) of the surface.

The deposition treatment chamber 190269 is for forming an electrode buffer layer which is in contact with one electrode of the EL element. The electrode buffer layer has a carrier injection property (hole injection or electron injection) and suppresses generation of a short-circuit or a black spot defect of the EL element. Typically, the electrode buffer layer is formed of an organic-inorganic hybrid material, has a resistivity of $5\times10^4$ to $1\times10^6$ Ωcm, and is formed having a thickness of 30 to 300 nm. Note that the deposition treatment chamber 190271 is for forming a hole transporting layer.

A light-emitting layer in an EL element has a different structure between the case of emitting single color light and the case of emitting white light. Deposition treatment chambers in the evaporation device are preferably arranged depending on the structure. For example, when three kinds of EL elements each having a different light emission color are formed in a display panel, it is necessary to form light-emitting layers corresponding to respective light emission colors. In this case, the deposition treatment chamber 190270 can be used for forming a first light-emitting layer, the deposition treatment chamber 190273 can be used for forming a second light-emitting layer, and the deposition treatment chamber 190274 can be used for forming a third light-emitting layer. By using different deposition treatment chambers for respective light-emitting layers, cross contamination due to different light-emitting materials can be prevented, and throughput of the deposition treatment can be improved.

Note that three kinds of EL elements each having a different light emission color may be sequentially deposited in each of the deposition treatment chambers 190270, 190273, and 190274. In this case, evaporation is performed by moving a shadow mask depending on a region to be deposited.

When an EL element which emits white light is formed, the EL element is formed by vertically stacking light-emitting layers of different light emission colors. In this case also, the element substrate can be sequentially transferred through the deposition treatment chambers so that each light-emitting layer is formed. Alternatively, different light-emitting layers can be formed continuously in the same deposition treatment chamber.

In the deposition treatment chamber 190276, an electrode is formed over the EL layer. The electrode can be formed by an electron beam evaporation method or a sputtering method, and preferably by a resistance heating evaporation method.

The element substrate in which formation of the electrode is finished is transferred to the sealing treatment chamber 190265 through the intermediate treatment chamber 190264. The sealing treatment chamber 190265 is filled with an inert gas such as helium, argon, neon, or nitrogen, and a sealing substrate is attached to a side of the element substrate where the EL layer is formed under the atmosphere so that the EL layer is sealed. In a sealed state, a space between the element substrate and the sealing substrate may be filled with an inert gas or a resin material. The sealing treatment chamber 190265 is provided with a dispenser which draws a sealing material, a mechanical element such as an arm or a fixing stage which fixes the sealing substrate to face the element substrate, a dispenser or a spin coater which fills the chamber with a resin material, or the like.

Figure 87:
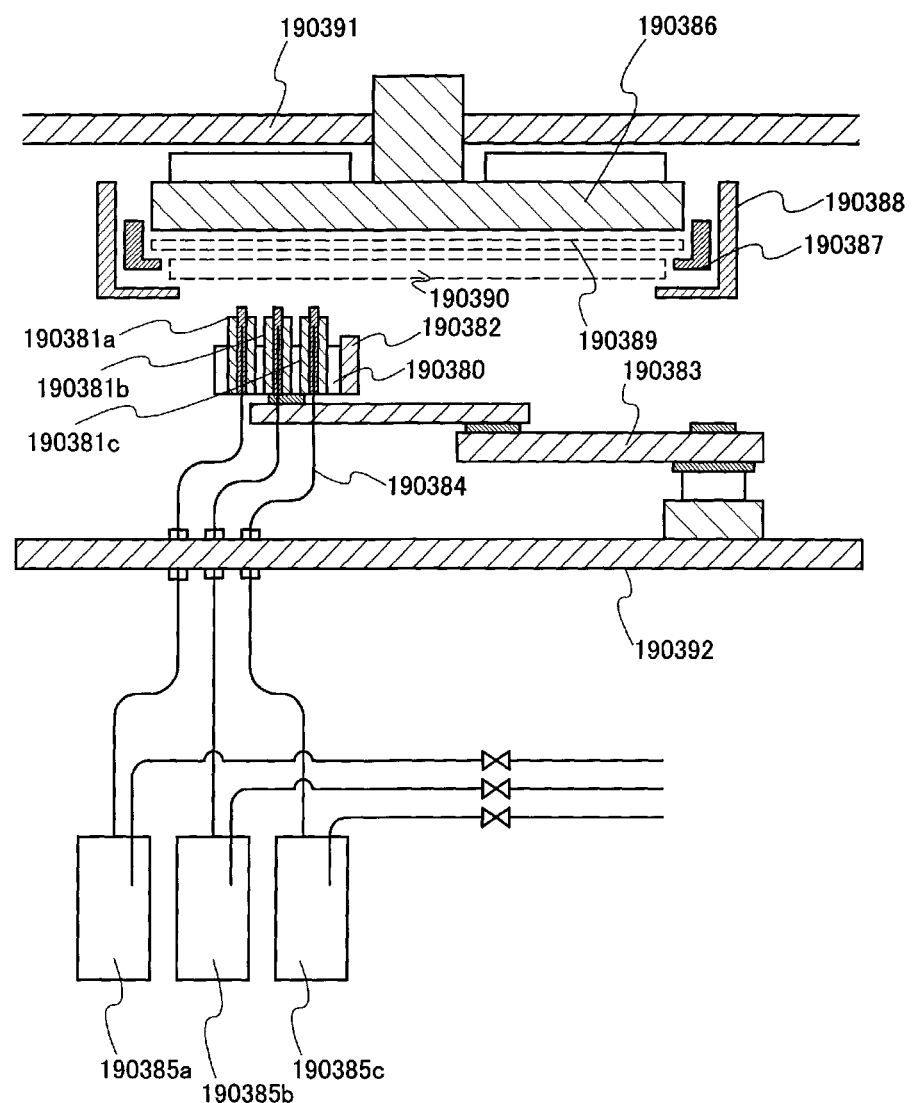
FIG. 87 illustrates a manufacturing device of a display device according to the invention.

FIG. 87 shows an internal structure of a deposition treatment chamber. The deposition treatment chamber is maintained in a reduced pressure state. In FIG. 87, a space interposed between a top plate 190391 and a bottom plate 190392 corresponds to an internal space of the chamber, which is maintained in a reduced pressure state.

One or a plurality of evaporation sources are provided in the treatment chamber. This is because a plurality of evaporation sources are preferably provided when a plurality of layers having different compositions are formed or when different materials are co-evaporated. In FIG. 87, evaporation sources 190381*a*, 190381*b*, and 190381*c* are attached to an evaporation source holder 190380. The evaporation source holder 190380 is held by a multi-joint arm 190383. The multi-joint arm 190383 allows the evaporation source holder 190380 to move within its movable range by stretching the joint. Alternatively, the evaporation source holder 190380 may be provided with a distance sensor 190382 to monitor a distance between the evaporation sources 190381*a* to 190381*c* and a substrate 190389 so that an optimal distance for evaporation is controlled. In this case, the multi-joint arm may be capable of moving toward upper and lower directions (Z direction) as well.

The substrate 190389 is fixed by using a substrate stage 190386 and a substrate chuck 190387 together. The substrate stage 190386 may have a structure where a heater is incorporated so that the substrate 190389 can be heated. The substrate 190389 is fixed to the substrate stage 190386 and transferred by the substrate chuck 190387. At the time of evaporation, a shadow mask 190390 provided with an opening corresponding to an evaporation pattern can be used when needed. In this case, the shadow mask 190390 is arranged between the substrate 190389 and the evaporation sources 190381*a* to 190381*c*. The shadow mask 190390 adheres to the substrate 190389 or is fixed to the substrate 190389 with a certain interval therebetween by a mask chuck 190388. When alignment of the shadow mask 190390 is needed, the alignment is performed by arranging a camera in the treatment chamber and providing the mask chuck 190388 with a positioning means which slightly moves in X-Y-θ directions.

Each of the evaporation sources 190381*a* to 190381*c* is provided with an evaporation material supply means which continuously supplies an evaporation material to the evaporation source. The evaporation material supply means includes material supply sources 190385*a*, 190385*b*, and 190385*c*, which are provided apart from the evaporation sources 190381*a*, 190381*b*, and 190381*c*, and a material supply pipe 190384 which connects the evaporation source and the material supply source. Typically, the material supply sources 190385*a* to 190385*c* are provided corresponding to the evaporation sources 190381*a* to 190381*c*. In FIG. 87, the material supply source 190385*a* corresponds to the evaporation source 190381*a*, the material supply source 190385*b* corresponds to the evaporation source 190381*b*, and the material supply source 190385*c* corresponds to the evaporation source 190381*c*.

As a method for supplying an evaporation material, an airflow transfer method, an aerosol method, or the like can be employed. In an airflow transfer method, impalpable powder of an evaporation material is transferred in airflow to the evaporation sources 190381*a* to 190381*c* by using an inert gas or the like. In an aerosol method, evaporation is performed while material liquid in which an evaporation material is dissolved or dispersed in a solvent is transferred and aerosolized by an atomizer and the solvent in the aerosol is vaporized. In each case, the evaporation sources 190381*a* to 190381*c* are provided with a heating means, and a film is formed over the substrate 190389 by vaporizing the transferred evaporation material. In FIG. 87, the material supply pipe 190384 can be bent flexibly and is formed of a thin pipe which has enough rigidity not to be transformed even under reduced pressure.

When an airflow transfer method or an aerosol method is employed, film formation may be performed in the deposition treatment chamber under atmospheric pressure or lower, and preferably under a reduced pressure of 133 to 13300 Pa. The pressure can be adjusted while an inert gas such as helium, argon, neon, krypton, xenon, or nitrogen fills the deposition treatment chamber or is supplied (and exhausted at the same time) to the deposition treatment chamber. Note that an oxidizing atmosphere may be employed by introducing a gas such as oxygen or nitrous oxide in the deposition treatment chamber where an oxide film is formed. Alternately, a reducing atmosphere may be employed by introducing a gas such as hydrogen in the deposition treatment chamber where an organic material is deposited.

As another method for supplying an evaporation material, a screw may be provided in the material supply pipe 190384 to continuously push the evaporation material toward the evaporation source.

With this evaporation device, a film can be formed continuously with high uniformity even in the case of a large display panel. Since it is not necessary to supply an evaporation material to the evaporation source every time the evaporation material is run out, throughput can be improved.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 18

In this embodiment mode, a structure of an EL element is described. In particular, a structure of an inorganic EL element is described.

An inorganic EL element is classified as either a dispersion type inorganic EL element or a thin-film type inorganic EL element, depending on its element structure. These elements differ in that the former includes an electroluminescent layer in which particles of a light-emitting material are dispersed in a binder, whereas the latter includes an electroluminescent layer formed of a thin film of a light-emitting material. However, the former and the latter have in common in that they need electrons accelerated by a high electric field. Note that mechanisms for obtaining light emission are donor-acceptor recombination light emission which utilizes a donor level and an acceptor level; and localized light emission which utilizes inner-shell electron transition of a metal ion. In general, donor-acceptor recombination light emission is employed in dispersion type inorganic EL elements and localized light emission is employed in thin-film type inorganic EL elements in many cases.

A light-emitting material includes a base material and an impurity element to be a luminescence center. Light emission of various colors can be obtained by changing the impurity element to be included. The light-emitting material can be formed using various methods, such as a solid phase method or a liquid phase method (a coprecipitation method). Further, a liquid phase method such as a spray pyrolysis method, a double decomposition method, a method employing precursor pyrolysis, a reverse micelle method, a method in which one or more of these methods are combined with high-temperature baking, or a freeze-drying method, or the like can be used.

A solid phase method is a method in which a base material and an impurity element or a compound containing an impurity element are weighed, mixed in a mortar, and heated and baked in an electric furnace so as to be reacted; thus, the impurity element is included in the base material. The baking temperature is preferably 700 to 1500° C. This is because a solid-phase reaction does not proceed when the temperature is too low, and the base material decomposes when the temperature is too high. Note that although the materials may be baked in powder form, they are preferably baked in pellet form. Although a solid phase method needs a comparatively high temperature, it is a simple method, and thus has high productivity and is suitable for mass production.

A liquid phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the particles are small and the baking temperature is low.

As a base material to be used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like; or a ternary mixed crystal such as calcium gallium sulfide ($CaGa_2S_4$), strontium gallium sulfide ($SrGa_2S_4$), or barium gallium sulfide ($BaGa_2S_4$) may be used.

As a luminescence center for localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added for charge compensation.

On the other hand, as a luminescence center for donor-acceptor recombination light emission, a light-emitting material including a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

When the light-emitting material for donor-acceptor recombination light emission is synthesized by a solid phase method, a base material, the first impurity element or a compound containing the first impurity element, and the second impurity element or a compound containing the second impurity element are weighed, mixed in a mortar, and heated and baked in an electric furnace. As the base material, the aforementioned base material can be used. As the first impurity element or the compound containing the first impurity element, fluorine (F), chlorine (Cl), aluminum sulfide ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because a solid-phase reaction does not proceed when the temperature is too low, and the base material decomposes when the temperature is too high. Note that although the materials may be baked in powder form, they are preferably baked in pellet form.

As the impurity element in the case of using a solid phase reaction, compounds including the first impurity element and the second impurity element may be used in combination. In this case, the impurity elements are easily diffused, and the solid phase reaction proceeds readily, so that a uniform light-emitting material can be obtained. Further, since an unnecessary impurity element is not included, a light-emitting material with high purity can be obtained. As the compound including the first impurity element and the second impurity element, copper chloride (CuCl), silver chloride (AgCl), or the like can be used, for example.

Note that the concentration of these impurity elements is in the range of 0.01 to 10 atomic percent, and is preferably in the range of 0.05 to 5 atomic percent with respect to the base material.

In the case of a thin-film type inorganic EL element, an electroluminescent layer includes the aforementioned light-emitting material, and can be formed using a physical vapor deposition (PVD) method such as a sputtering method or a vacuum evaporation method, for example, a resistance heating evaporation method or an electron beam evaporation (EB evaporation) method, a chemical vapor deposition (CVD) method such as a metal organic CVD method or a low-pressure hydride transport CVD method, an atomic layer epitaxy (ALE) method, or the like.

Figure 88A:
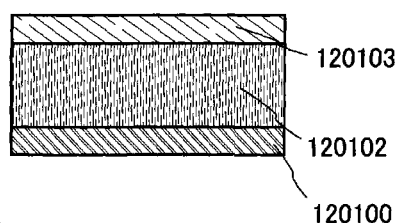
FIGS. 88A to 88C each illustrate a light-emitting element of a display device according to the invention.
Figure 88B:
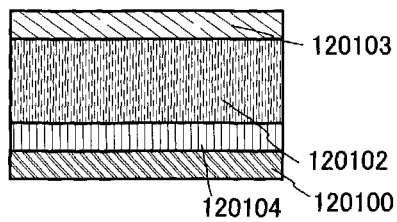
Figure 88C:
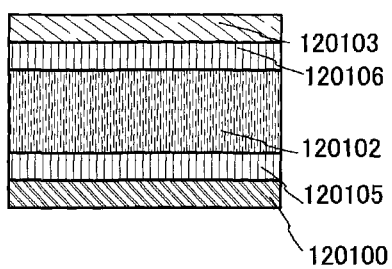

FIGS. 88A to 88C each show an example of a thin-film type inorganic EL element which can be used as the light-emitting element. In FIGS. 88A to 88C, a light-emitting element includes a first electrode layer 120100, an electroluminescent layer 120102, and a second electrode layer 120103.

The light-emitting elements shown in FIGS. 88B and 88C each have a structure where an insulating film is provided between the electrode layer and the electroluminescent layer in the light-emitting element in FIG. 88A. The light-emitting element shown in FIG. 88B includes an insulating film 120104 between the first electrode layer 120100 and the electroluminescent layer 120102. The light-emitting element shown in FIG. 88C includes an insulating film 120105 between the first electrode layer 120100 and the electroluminescent layer 120102, and an insulating film 120106 between the second electrode layer 120103 and the electroluminescent layer 120102.

In such a manner, the insulating film may be provided between the electroluminescent layer and one of the electrode layers interposing the electroluminescent layer, or may be provided between the electroluminescent layer and each of the electrode layers interposing the electroluminescent layer. The insulating film may be a single layer or stacked layers including a plurality of layers.

Note that the insulating film 120104 is provided in contact with the first electrode layer 120100 in FIG. 88B; however, the insulating film 120104 may be provided in contact with the second electrode layer 120103 by reversing the order of the insulating film and the electroluminescent layer.

In the case of a dispersion type inorganic EL, a film-shaped electroluminescent layer is formed by dispersing particulate light-emitting materials in a binder. When particles with a desired size cannot be sufficiently obtained by a method of forming the light-emitting material, the light-emitting materials may be processed into particles by being crushed in a mortar or the like. The binder is a substance for fixing the particulate light-emitting material in a dispersed state and maintaining the shape as the electroluminescent layer. The light-emitting material is uniformly dispersed in the electroluminescent layer and fixed by the binder.

In the case of a dispersion type inorganic EL, as a method of forming the electroluminescent layer, a droplet discharging method by which the electroluminescent layer can be selectively formed, a printing method (such as screen printing or offset printing), a coating method such as a spin coating method, a dipping method, a dispenser method, or the like can be used. The thickness of the electroluminescent layer is not particularly limited, but preferably in the range of 10 to 1000 nm. In the electroluminescent layer including the light-emitting material and the binder, a ratio of the light-emitting material is preferably 50 wt % or more and 80 wt % or less.

Figure 89A:
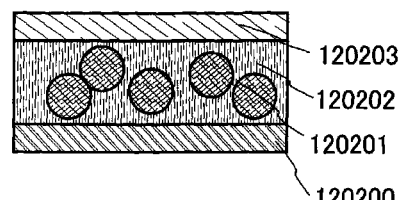
FIGS. 89A to 89C each illustrate a light-emitting element of a display device according to the invention.
Figure 89B:
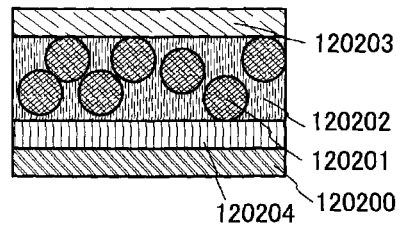
Figure 89C:
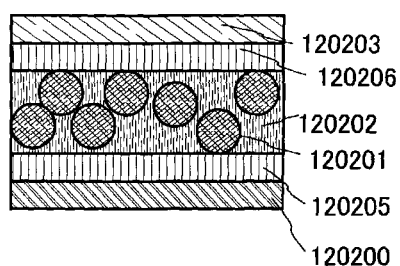

FIGS. 89A to 89C each show an example of a dispersion type inorganic EL element which can be used as the light-emitting element. A light-emitting element in FIG. 89A has a stacked-layer structure of a first electrode layer 120200, an electroluminescent layer 120202, and a second electrode layer 120203. The electroluminescent layer 120202 includes a light-emitting material 120201 held by a binder.

An insulating material can be used for the binder. As the insulating material, an organic material or an inorganic material can be used. Alternatively, a mixed material containing an organic material and an inorganic material may be used. As the organic insulating material, a polymer having a comparatively high dielectric constant, such as a cyanoethyl cellulose based resin, or a resin such as polyethylene, polypropylene, a polystyrene based resin, a silicone resin, an epoxy resin, or vinylidene fluoride can be used. Alternatively, a heat-resistant polymer such as aromatic polyamide or polybenzimidazole, or a siloxane resin may be used. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen may be used as a substituent. Further alternately, a resin material, for example, a vinyl resin such as polyvinyl alcohol or polyvinylbutyral, a phenol resin, a novolac resin, an acrylic resin, a melamine resin, an urethane resin, or an oxazole resin (polybenzoxazole) may be used. A dielectric constant can be adjusted by appropriately mixing these resins with fine particles having a high dielectric constant, such as barium titanate ($BaTiO_3$) or strontium titanate ($SrTiO_3$).

The inorganic insulating material included in the binder can be formed using silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$) containing oxygen and nitrogen, titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalite ($BaTa_2O_6$), lithium tantalite ($LiTaO_3$), yttrium oxide ($Y_2O_3$), zirconium oxide ($ZrO_2$), ZnS, or a substance containing another inorganic insulating material. When an inorganic material having a high dielectric constant is included in the organic material (by addition or the like), the dielectric constant of the electroluminescent layer formed of the light-emitting material and the binder can be more effectively controlled, and the dielectric constant can be further increased.

In a manufacturing step, the light-emitting material is dispersed in a solution containing the binder. As a solvent for the solution containing the binder, it is acceptable as long as a solvent dissolves a binder material and can make a solution having a viscosity suitable for a method of forming the electroluminescent layer (various wet processes) and for desired film thickness. For example, an organic solvent or the like can be used as the solvent. When a siloxane resin is used as the binder, propylene glycol monomethyl ether, propylene glycol monomethyl ether acetate (also referred to as PGMEA), 3-methoxy-3-methyl-1-butanol (also referred to as MMB), or the like can be used as the solvent.

The light-emitting elements shown in FIGS. 89B and 89C each have a structure where an insulating film is provided between the electrode layer and the electroluminescent layer in the light-emitting element in FIG. 89A. The light-emitting element shown in FIG. 89B includes an insulating film 120204 between the first electrode layer 120200 and the electroluminescent layer 120202. The light-emitting element shown in FIG. 89C includes an insulating film 120205 between the first electrode layer 120200 and the electroluminescent layer 120202, and an insulating film 120206 between the second electrode layer 120203 and the electroluminescent layer 120202. In such a manner, the insulating film may be provided between the electroluminescent layer and one of the electrode layers interposing the electroluminescent layer, or may be provided between the electroluminescent layer and each of the electrode layers interposing the electroluminescent layer. The insulating film may be a single layer or stacked layers including a plurality of layers.

Although the insulating film 120204 is provided in contact with the first electrode layer 120200 in FIG. 89B, the insulating film 120204 may be provided in contact with the second electrode layer 120203 by reversing the order of the insulating film and the electroluminescent layer.

A material used for an insulating film such as the insulating film 120104 in FIG. 88B and the insulating film 120204 in FIG. 89B preferably has high withstand voltage and dense film quality. Further, the material preferably has a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; or a mixed film of these materials or a stacked-layer film including two or more of those materials can be used. The insulating film can be formed by sputtering, evaporation, CVD, or the like. The insulating film may be formed by dispersing particles of the insulating material in a binder. A binder material may be formed using a material and a method similar to those of the binder contained in the electroluminescent layer. The thickness of the insulating film is not particularly limited, but preferably in the range of 10 to 1000 nm.

Note that the light-emitting element can emit light when voltage is applied between the pair of electrode layers interposing the electroluminescent layer. The light-emitting element can operate with DC drive or AC drive.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 19

In this embodiment mode, an example of a display device is described. In particular, the case where optical treatment is performed is described.

Figure 90A:
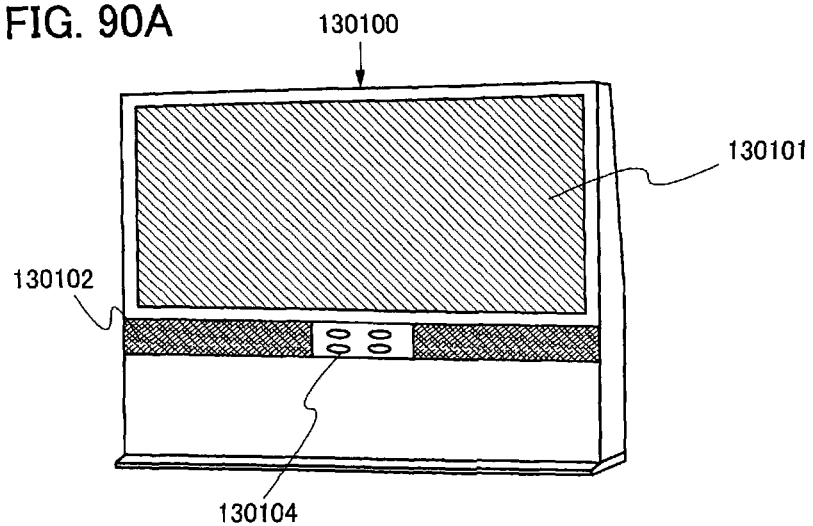
FIGS. 90A and 90B illustrate a structure of a display device according to the invention.
Figure 90B:
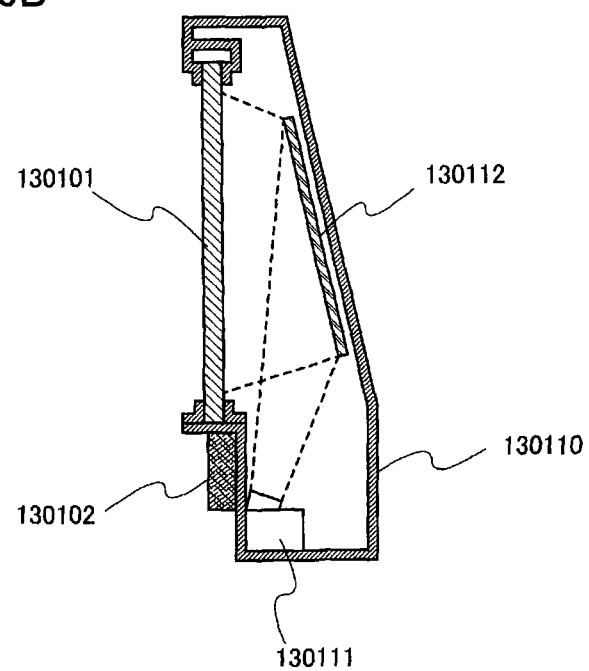

A rear projection display device 130100 in FIGS. 90A and 90B is provided with a projector unit 130111, a mirror 130112, and a screen panel 130101. The rear projection display device 130100 may also be provided with a speaker 130102 and operation switches 130104. The projector unit 130111 is provided at a lower portion of a housing 130110 of the rear projection display device 130100, and projects incident light which projects an image based on a video signal to the mirror 130112. The rear projection display device 130100 displays an image projected from a rear surface of the screen panel 130101.

Figure 91:
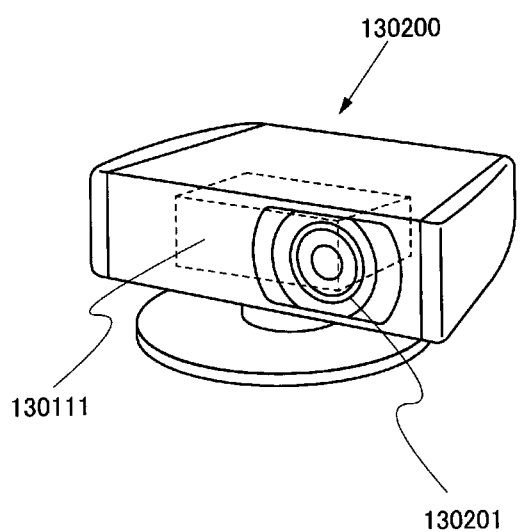
FIG. 91 illustrates a structure of a display device according to the invention.

FIG. 91 shows a front projection display device 130200. The front projection display device 130200 is provided with the projector unit 130111 and a projection optical system 130201. The projection optical system 130201 projects an image to a screen or the like provided at the front.

Hereinafter, a structure of the projector unit 130111 which is applied to the rear projection display device 130100 in FIGS. 90A and 90B and the front projection display device 130200 in FIG. 91 is described.

Figure 92:
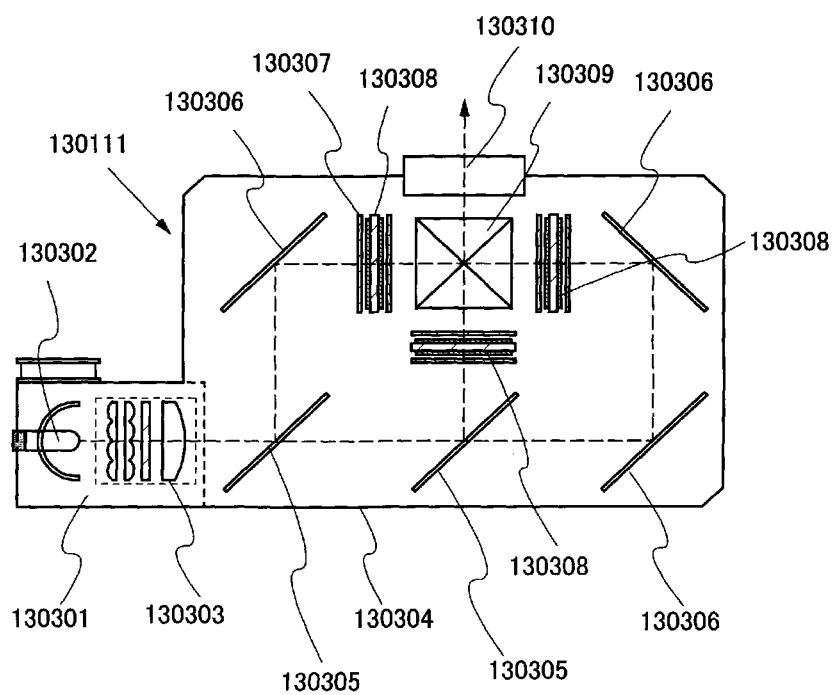
FIG. 92 illustrates a structure of a display device according to the invention.

FIG. 92 shows a structure example of the projector unit 130111. The projector unit 130111 is provided with a light source unit 130301 and a modulation unit 130304. The light source unit 130301 is provided with a light source optical system 130303 including lenses and a light source lamp 130302. The light source lamp 130302 is stored in a housing so that stray light is not scattered. As the light source lamp 130302, a high-pressure mercury lamp or a xenon lamp, for example, which can emit a large amount of light, is used. The light source optical system 130303 is provided with an optical lens, a film having a function of polarizing light, a film for adjusting phase difference, an IR film, or the like as appropriate. The light source unit 130301 is provided so that emitted light is incident on the modulation unit 130304. The modulation unit 130304 is provided with a plurality of display panels 130308, a color filter, a dichroic mirror 130305, a total reflection mirror 130306, a prism 130309, and a projection optical system 130310. Light emitted from the light source unit 130301 is split into a plurality of optical paths by the dichroic mirror 130305.

The display panel 130308 and a color filter which transmits light with a predetermined wavelength or wavelength range are provided in each optical path. The transmissive display panel 130308 modulates transmitted light based on a video signal. Light of each color transmitted through the display panel 130308 is incident on the prism 130309, and an image is displayed on a screen through the projection optical system 130310. Note that a Fresnel lens may be provided between the mirror and the screen. Then, projected light which is projected by the projector unit 130111 and reflected by the mirror is converted into generally parallel light by the Fresnel lens and projected on the screen.

Figure 93:
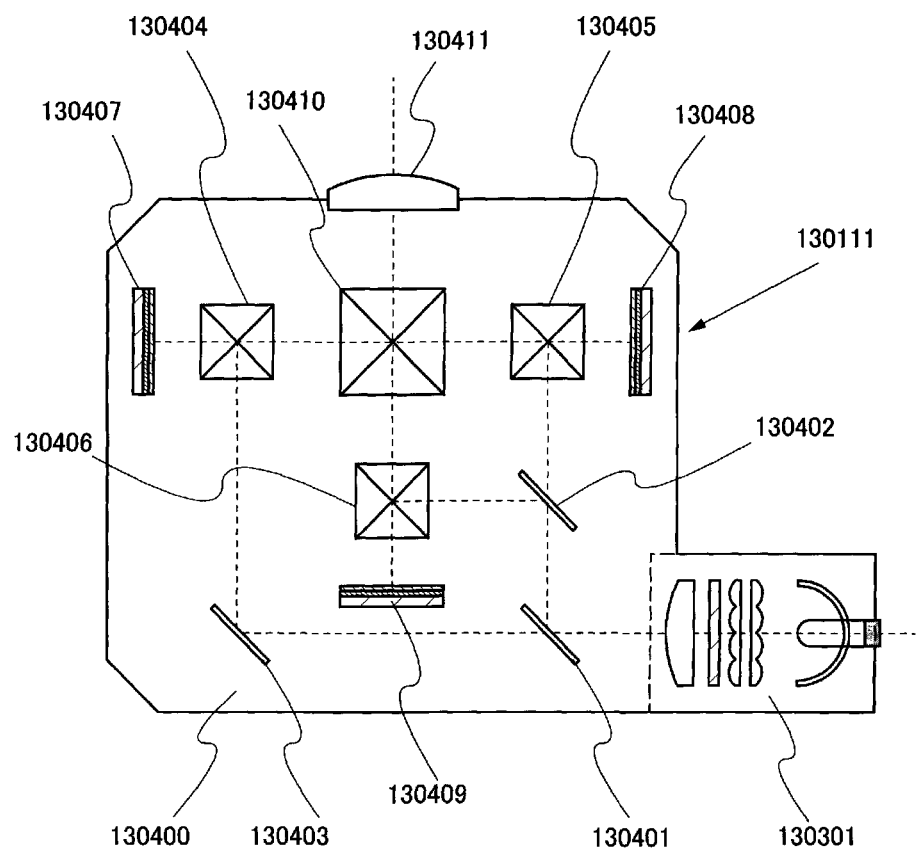
FIG. 93 illustrates a structure of a display device according to the invention.

FIG. 93 shows the projector unit 130111 provided with reflective display panels 130407, 130408, and 130409.

The projector unit 130111 shown in FIG. 93 is provided with the light source unit 130301 and a modulation unit 130400. The light source unit 130301 may have a structure similar to that of FIG. 92. Light from the light source unit 130301 is split into a plurality of optical paths by dichroic mirrors 130401 and 130402 and a total reflection mirror 130403 to be incident on polarization beam splitters 130404, 130405, and 130406. The polarization beam splitters 130404, 130405, and 130406 are provided corresponding to the reflective display panels 130407, 130408, and 130409 which correspond to respective colors. The reflective display panels 130407, 130408, and 130409 modulate reflected light based on a video signal. Light of respective colors which is reflected by the reflective display panels 130407, 130408, and 130409 is incident on the prism 130410 to be synthesized, and projected through a projection optical system 130411.

Among light emitted from the light source unit 130301, only light in a red wavelength region is transmitted through the dichroic mirror 130401 and light in green and blue wavelength regions is reflected by the dichroic mirror 130401. Further, only the light in the green wavelength region is reflected by the dichroic mirror 130402. The light in the red wavelength region, which is transmitted through the dichroic mirror 130401, is reflected by the total reflection mirror 130403 and incident on the polarization beam splitter 130404. The light in the blue wavelength region is incident on the polarization beam splitter 130405. The light in the green wavelength region is incident on the polarization beam splitter 130406. The polarization beam splitters 130404, 130405, and 130406 have a function of splitting incident light into p-polarized light and s-polarized light and a function of transmitting only p-polarized light. The reflective display panels 130407, 130408, and 130409 polarize incident light based on a video signal.

Only s-polarized light corresponding to respective colors is incident on the reflective display panels 130407, 130408, and 130409 corresponding to respective colors. Note that the reflective display panels 130407, 130408, and 130409 may be liquid crystal panels. In this case, the liquid crystal panel operates in an electrically controlled birefringence (ECB) mode. Liquid crystal molecules are vertically aligned with respect to a substrate at a certain angle. Accordingly, in the reflective display panels 130407, 130408, and 130409, when a pixel is in an off state, display molecules are aligned so as to reflect incident light without changing a polarization state of the incident light. When the pixel is in an on state, alignment of the display molecules is changed, and the polarization state of the incident light is changed.

The projector unit 130111 in FIG. 93 can be applied to the rear projection display device 130100 in FIGS. 90A and 90B and the front projection display device 130200 in FIG. 91.

Figure 94A:
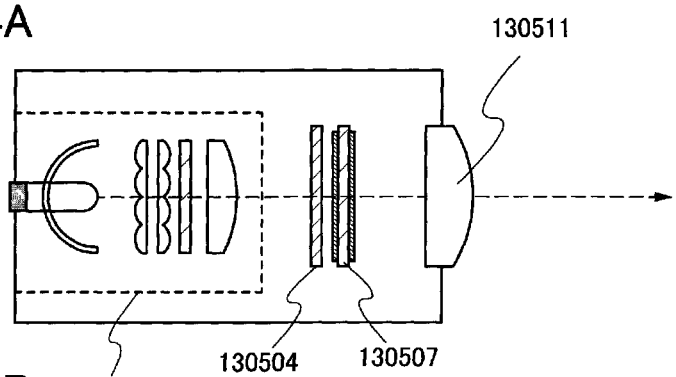
FIGS. 94A to 94C each illustrate a structure of a display device according to the invention.
Figure 94B:
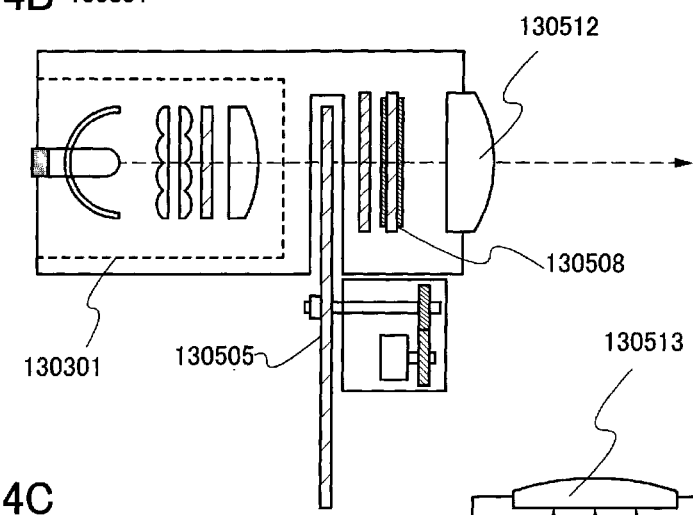
Figure 94C:
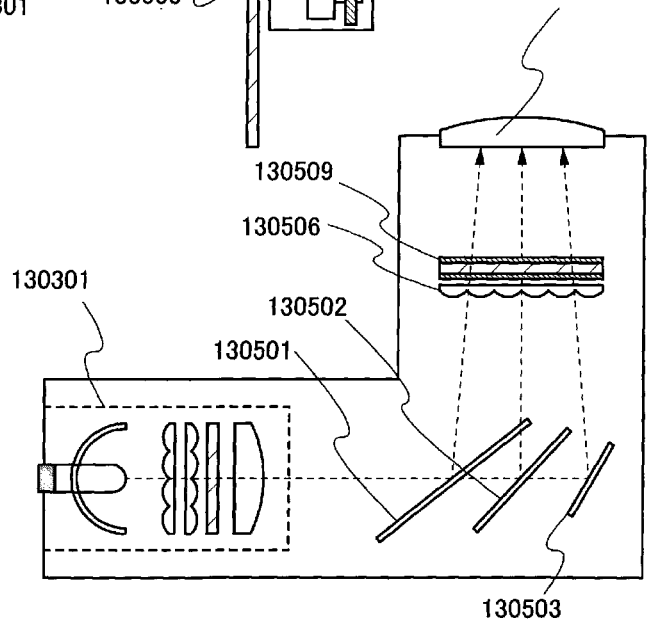

FIGS. 94A to 94C show single-panel type projector units. The projector unit 130111 shown in FIG. 94A is provided with the light source unit 130301, a display panel 130507, a projection optical system 130511, and a retardation plate

130504. The projection optical system 130511 includes one or a plurality of lenses. The display panel 130507 may be provided with a color filter.

FIG. 94B shows a structure of the projector unit 130111 operating in a field sequential mode. A field sequential mode refers to a mode in which color display is performed by light of respective colors such as red, green, and blue sequentially incident on a display panel with a time lag, without a color filter. High-definition image can be displayed particularly by combination with a display panel with high response speed to change in input signal. In FIG. 94B, a rotating color filter plate 130505 including a plurality of color filters with red, green, blue, or the like is provided between the light source unit 130301 and a display panel 130508.

FIG. 94C shows a structure of the projector unit 130111 with a color separation method using a micro lens, as a color display method. This method refers to a method in which color display is realized by providing a micro lens array 130506 on a light incident side of a display panel 130509 and emitting light of each color from each direction. The projector unit 130111 employing this method has little loss of light due to a color filter, so that light from the light source unit 130301 can be efficiently utilized. The projector unit 130111 shown in FIG. 94C is provided with dichroic mirrors 130501, 130502, and 130503 so that light of each color is lit to the display panel 130509 from each direction.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 20

In this embodiment mode, examples of electronic devices according to the present invention are described.

Figure 95:
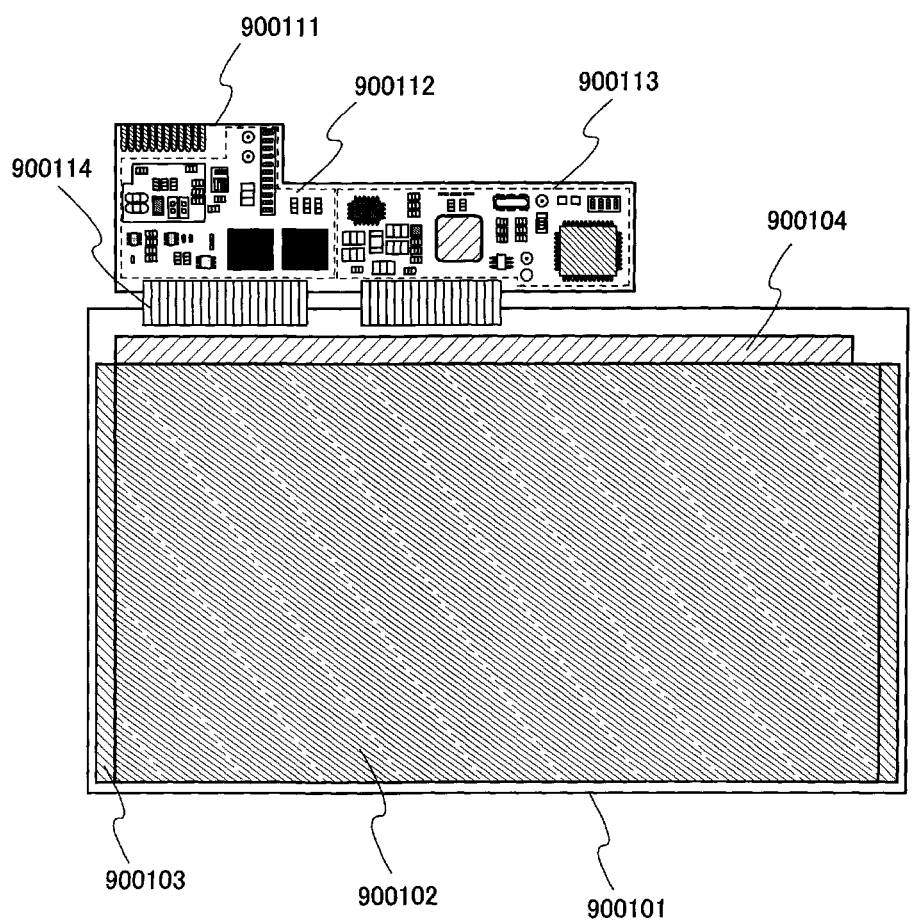
FIG. 95 illustrates an electronic device in which a display device according to the invention is used.

FIG. 95 shows a display panel module combining a display panel 900101 and a circuit board 900111. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected by a connection wiring 900114. An FPC or the like can be used for the connection wiring.

In the display panel 900101, the pixel portion 900102 and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900101 by COG (chip on glass) or the like. Thus, the area of the circuit board 900111 can be reduced, and a small display device can be obtained. Alternatively, the IC chip may be mounted on the display panel 900101 by using TAB (tape automated bonding) or a printed wiring board. Thus, the area of the display panel 900101 can be reduced, and a display device with a narrower frame can be obtained.

For example, in order to reduce power consumption, a pixel portion may be formed over a glass substrate by using transistors, and all peripheral circuits may be formed over an IC chip. Then, the IC chip may be mounted on a display panel by COG or TAB.

Figure 96:
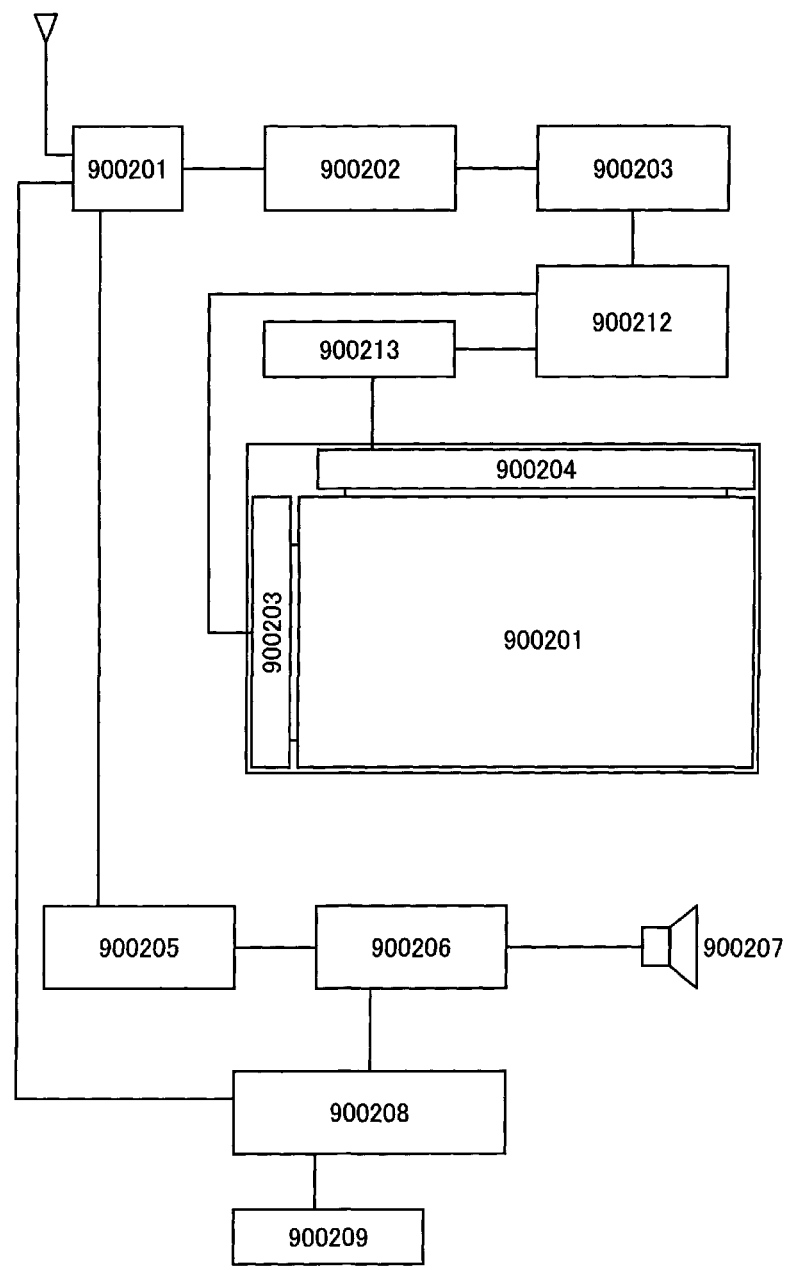
FIG. 96 illustrates an electronic device in which a display device according to the invention is used.

A television receiver can be completed with the display panel module shown in FIG. 95. FIG. 96 is a block diagram showing a main structure of a television receiver. A tuner 900201 receives a video signal and an audio signal. The video signals are processed by a video signal amplifier circuit 900202; a video signal processing circuit 900203 which converts a signal output from the video signal amplifier circuit 900202 into a color signal corresponding to each color of red, green, and blue; and a control circuit 900212 which converts the video signal into an input specification of a driver circuit. The control circuit 900212 outputs signals to each of the scan line side and the signal line side. When digital driving is performed, a structure may be employed in which a signal dividing circuit 900213 is provided on the signal line side and an input digital signal is divided into m signals (m is a positive integer) to be supplied.

Among the signals received by the tuner 900201, an audio signal is transmitted to an audio signal amplifier circuit 900205, and an output thereof is supplied to a speaker 900207 through an audio signal processing circuit 900206. A control circuit 900208 receives control information on receiving station (receiving frequency) and volume from an input portion 900209 and transmits a signal to the tuner 900201 or the audio signal processing circuit 900206.

Figure 97A:
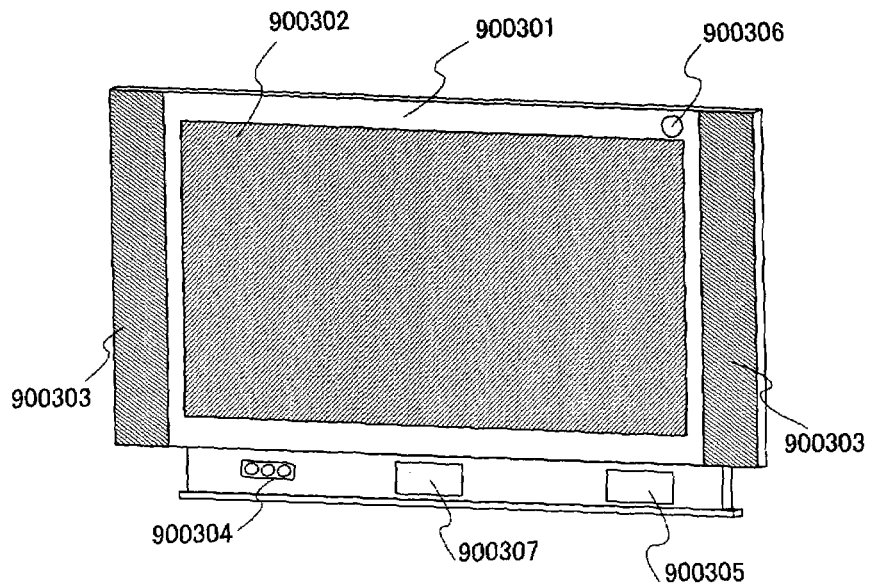
FIGS. 97A and 97B each illustrate an electronic device in which a display device according to the invention is used.

FIG. 97A shows a television receiver incorporated with a display panel module which is different from FIG. 96. In FIG. 97A, a display screen 900302 stored in a housing 900301 is formed using the display panel module. Note that speakers 900303, an operation switch 900304, an input means 900305, a sensor 900306 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900307, and the like may be provided as appropriate.

Figure 97B:
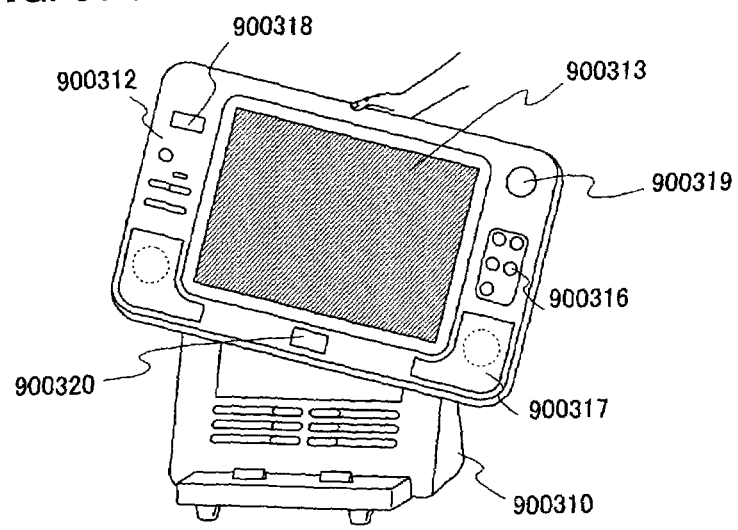

FIG. 97B shows a television receiver in which only a display can be carried wirelessly. A battery and a signal receiver are incorporated in a housing 900312. By the battery, a display portion 900313, a speaker portion 900317, a sensor 900319 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 900320 are driven. The battery can be repeatedly charged by a charger 900310. The charger 900310 which is capable of transmitting and receiving a video signal can transmit the video signal to the signal receiver of the display. The device shown in FIG. 97B is controlled by an operation key 900316. Alternatively, the device shown in FIG. 97B can transmit a signal to the charger 900310 by operating the operation key 900316. That is, the device may be an image and audio interactive communication device. Further alternatively, by operating the operation key 900316, a signal is transmitted to the charger 900310 from the housing 900312, and another electronic device is made to receive a signal which can be transmitted from the charger 900310; thus, the device shown in FIG. 97B can control communication of another electronic device. That is, the device may be a general-purpose remote control device. Note that an input means 900318 or the like may be provided as appropriate. Note that the contents (or part of the contents) described in each drawing of this embodiment mode can be applied to the display portion 900313.

Figure 98A:
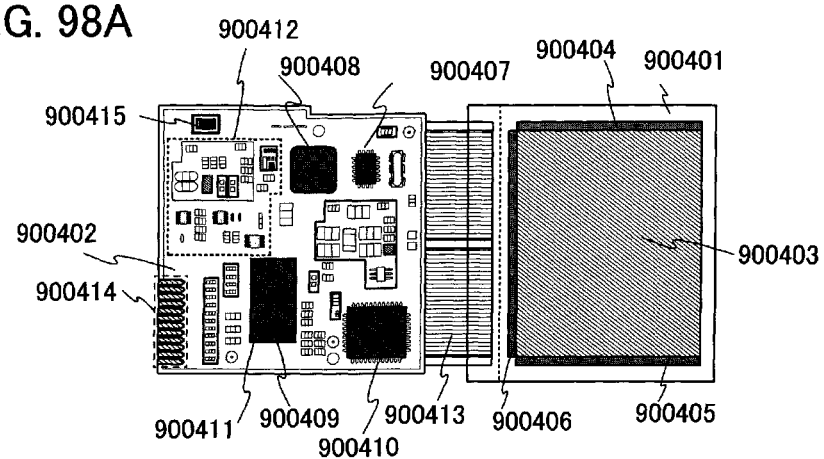
FIGS. 98A and 98B each illustrate an electronic device in which a display device according to the invention is used.

FIG. 98A shows a module combining a display panel 900401 and a printed wiring board 900402. The display panel 900401 may be provided with a pixel portion 900403 including a plurality of pixels, a first scan line driver circuit 900404, a second scan line driver circuit 900405, and a signal line driver circuit 900406 which supplies a video signal to a selected pixel.

The printed wiring board 900402 is provided with a controller 900407, a central processing unit (CPU) 900408, a memory 900409, a power supply circuit 900410, an audio processing circuit 900411, a transmitting/receiving circuit 900412, and the like. The printed wiring board 900402 and the display panel 900401 are connected by a flexible printed circuit (FPC) 900413. The flexible printed circuit (FPC) 900413 may be provided with a capacitor, a buffer circuit, or the like so as to prevent noise on power supply voltage or a signal, and increase in rise time of a signal. Note that the controller 900407, the audio processing circuit 900411, the memory 900409, the central processing unit (CPU) 900408, the power supply circuit 900410, or the like can be mounted to the display panel 900401 by using a COG (chip on glass) method. By using a COG method, the size of the printed wiring board 900402 can be reduced.

Various control signals are input and output through an interface (I/F) portion 900414 provided for the printed wiring board 900402. An antenna port 900415 for transmitting and receiving a signal to/from an antenna is provided for the printed wiring board 900402.

Figure 98B:
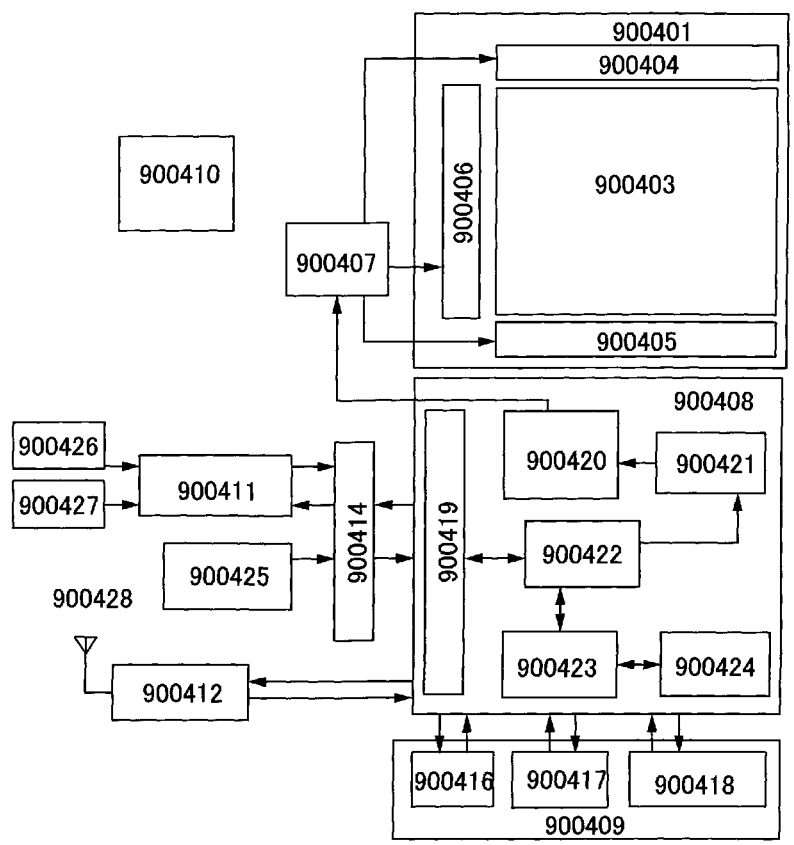

FIG. 98B is a block diagram of the module shown in FIG. 98A. The module includes a VRAM 900416, a DRAM 900417, a flash memory 900418, and the like as the memory 900409. The VRAM 900416 stores data on an image displayed on a panel, the DRAM 900417 stores video data or audio data, and the flash memory 900418 stores various programs.

The power supply circuit 900410 supplies electric power for operating the display panel 900401, the controller 900407, the central processing unit (CPU) 900408, the audio processing circuit 900411, the memory 900409, and the transmitting/receiving circuit 900412. Note that the power supply circuit 900410 may be provided with a current source depending on a panel specification.

The central processing unit (CPU) 900408 includes a control signal generation circuit 900420, a decoder 900421, a register 900422, an arithmetic circuit 900423, a RAM 900424, an interface (I/F) portion 900419 for the central processing unit (CPU) 900408, and the like. Various signals input to the central processing unit (CPU) 900408 via the interface (I/F) portion 900414 are once stored in the register 900422, and subsequently input to the arithmetic circuit 900423, the decoder 900421, and the like. The arithmetic circuit 900423 performs operation based on the signal input thereto so as to designate a location to which various instructions are sent. On the other hand, the signal input to the decoder 900421 is decoded and input to the control signal generation circuit 900420. The control signal generation circuit 900420 generates a signal including various instructions based on the signal input thereto, and transmits the signal to the location designated by the arithmetic circuit 900423, specifically the memory 900409, the transmitting/receiving circuit 900412, the audio processing circuit 900411, and the controller 900407, for example.

The memory 900409, the transmitting/receiving circuit 900412, the audio processing circuit 900411, and the controller 900407 operate in accordance with respective instructions. Hereinafter, the operation is briefly described.

A signal input from an input means 900425 is transmitted via the interface (I/F) portion 900414 to the central processing unit (CPU) 900408 mounted to the printed wiring board 900402. The control signal generation circuit 900420 converts image data stored in the VRAM 900416 into a predetermined format depending on the signal transmitted from the input means 900425 such as a pointing device or a keyboard, and transmits the converted data to the controller 900407.

The controller 900407 performs data processing of the signal including the image data transmitted from the central processing unit (CPU) 900408 in accordance with the panel specification, and supplies the signal to the display panel 900401. The controller 900407 generates an Hsync signal, a Vsync signal, a clock signal CLK, alternating voltage (AC Cont), and a switching signal L/R based on power supply voltage input from the power supply circuit 900410 or various signals input from the central processing unit (CPU) 900408, and supplies the signals to the display panel 900401.

The transmitting/receiving circuit 900412 processes a signal which is to be transmitted and received as an electric wave by an antenna 900428. Specifically, the transmitting/receiving circuit 900412 may include a high-frequency circuit such as an isolator, a band pass filter, a VCO (voltage controlled oscillator), an LPF (low pass filter), a coupler, or a balun. A signal including audio information among signals transmitted and received by the transmitting/receiving circuit 900412 is transmitted to the audio processing circuit 900411 in accordance with an instruction from the central processing unit (CPU) 900408.

The signal including the audio information which is transmitted in accordance with the instruction from the central processing unit (CPU) 900408 is demodulated into an audio signal by the audio processing circuit 900411 and transmitted to a speaker 900427. An audio signal transmitted from a microphone 900426 is modulated by the audio processing circuit 900411 and transmitted to the transmitting/receiving circuit 900412 in accordance with an instruction from the central processing unit (CPU) 900408.

The controller 900407, the central processing unit (CPU) 900408, the power supply circuit 900410, the audio processing circuit 900411, and the memory 900409 can be mounted as a package of this embodiment mode.

It is needless to say that this embodiment mode is not limited to a television receiver and can be applied to various uses, such as a monitor of a personal computer, and especially as a large display medium such as an information display board at the train station, the airport, or the like, or an advertisement display board on the street.

Next, a structure example of a mobile phone according to the present invention is described with reference to FIG. 99.

A display panel 900501 is detachably incorporated in a housing 900530. The shape or the size of the housing 900530 can be changed as appropriate in accordance with the size of the display panel 900501. The housing 900530 to which the display panel 900501 is fixed is fitted in a printed wiring board 900531 to be assembled as a module.

The display panel 900501 is connected to the printed wiring board 900531 through an FPC 900513. The printed wiring board 900531 is provided with a speaker 900532, a microphone 900533, a transmitting/receiving circuit 900534, a signal processing circuit 900535 including a CPU, a controller, and the like, and a sensor 900541 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray). Such a module, an input means 900536, and a battery 900537 are combined and stored in a housing 900539. A pixel portion of the display panel 900501 is provided to be seen from an opening window formed in the housing 900539.

In the display panel 900501, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 900501 by COG (chip on glass). Alternatively, the IC chip may be connected to a glass substrate by using TAB (tape automated bonding) or a printed wiring board. With such a structure, power consumption of a display device can be reduced, and operation time of the mobile phone per charge can be extended. Further, reduction in cost of the mobile phone can be realized.

Figure 99:
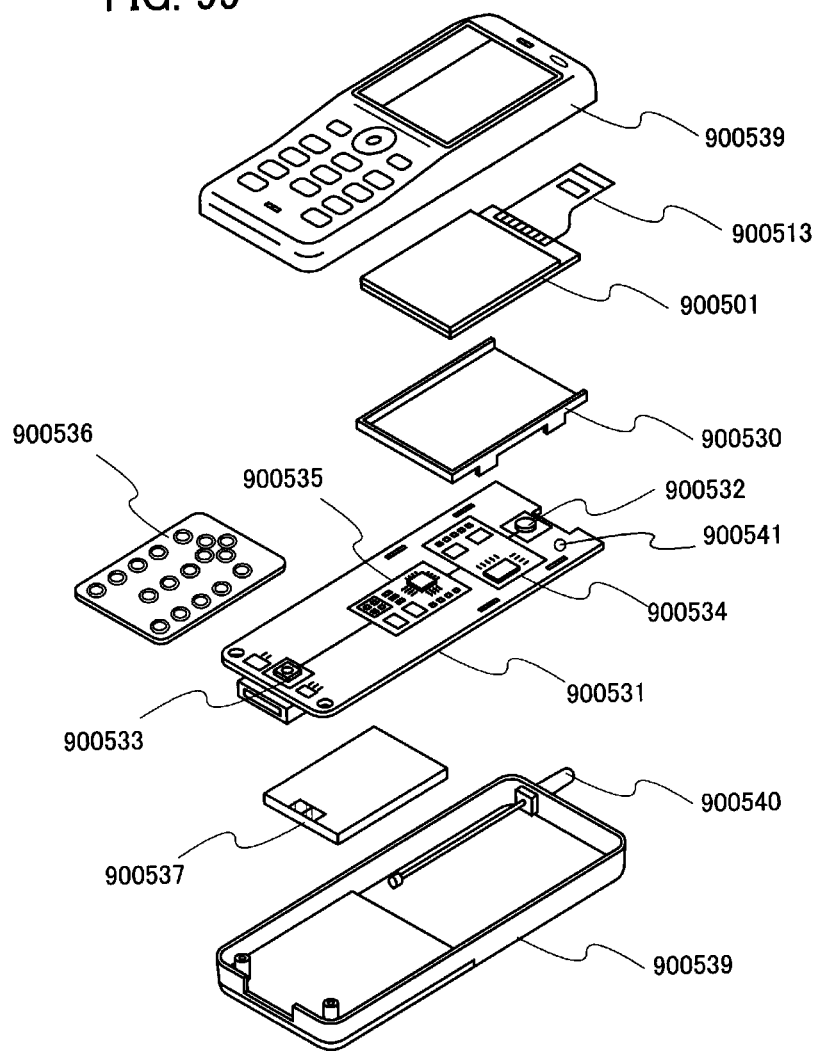
FIG. 99 illustrates an electronic device in which a display device according to the invention is used.

The mobile phone shown in FIG. 99 has various functions such as, but not limited to, a function of displaying various kinds of information (e.g., a still image, a moving image, and a text image); a function of displaying a calendar, a date, the time, and the like on a display portion; a function of operating or editing the information displayed on the display portion; a function of controlling processing by various kinds of software (programs); a function of wireless communication; a function of communicating with another mobile phone, a fixed phone, or an audio communication device by using the wireless communication function; a function of connecting with various computer networks by using the wireless communication function; a function of transmitting or receiving various kinds of data by using the wireless communication function; a function of operating a vibrator in accordance with incoming call, reception of data, or an alarm; and a function of generating a sound in accordance with incoming call, reception of data, or an alarm.

Figure 100:
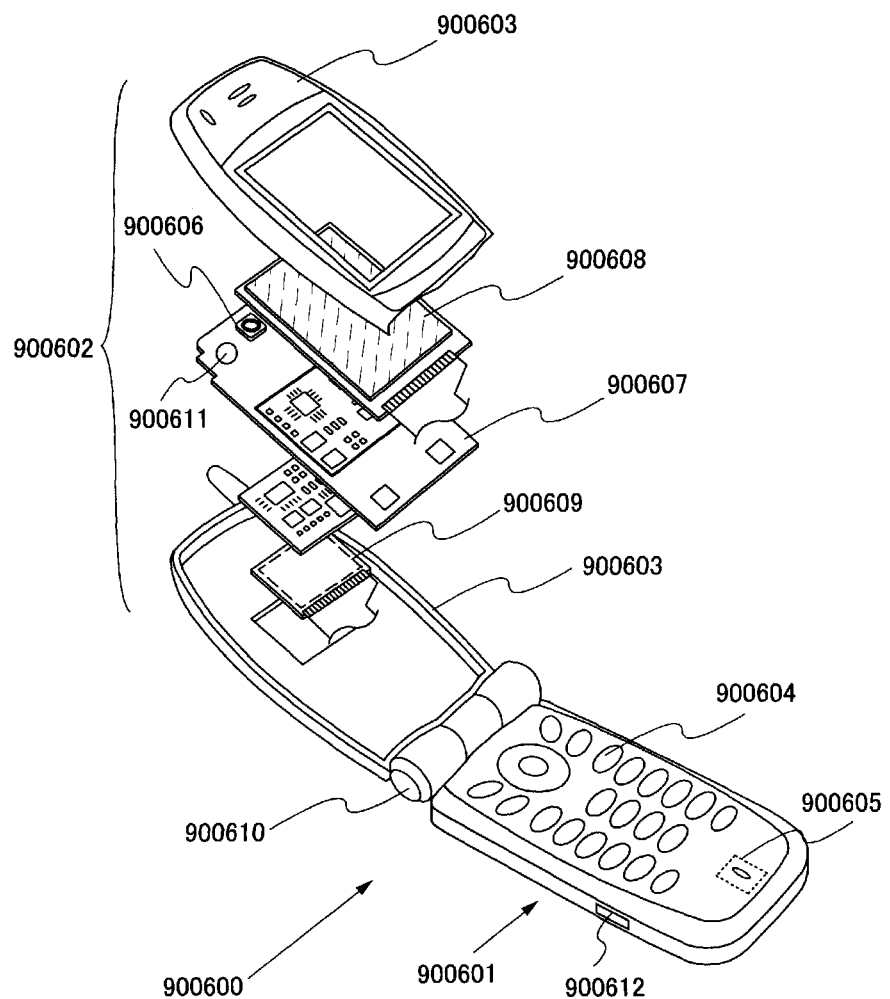
FIG. 100 illustrates an electronic device in which a display device according to the invention is used.

In a mobile phone shown in FIG. 100, a main body (A) 900601 provided with operation switches 900604, a microphone 900605, and the like is connected to a main body (B) 900602 provided with a display panel (A) 900608, a display panel (B) 900609, a speaker 900606, a sensor 900611 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), an input means 900612, and the like by using a hinge 900610 so that the mobile phone can be opened and closed. The display panel (A) 900608 and the display panel (B) 900609 are placed in a housing 900603 of the main body (B) 900602 together with a circuit board 900607. Each of pixel portions of the display panel (A) 900608 and the display panel (B) 900609 is arranged to be seen from an opening window formed in the housing 900603.

Specifications of the display panel (A) 900608 and the display panel (B) 900609, such as the number of pixels, can be set as appropriate in accordance with functions of a mobile phone 900600. For example, the display panel (A) 900608 can be used as a main screen and the display panel (B) 900609 can be used as a sub-screen.

A mobile phone according to this embodiment mode can be changed in various modes depending on functions or applications thereof. For example, it may be a camera-equipped mobile phone by incorporating an imaging element in a portion of the hinge 900610. When the operation switches 900604, the display panel (A) 900608, and the display panel (B) 900609 are placed in one housing, the aforementioned effects can be obtained. Further, a similar effect can be obtained when the structure of this embodiment mode is applied to an information display terminal equipped with a plurality of display portions.

The mobile phone in FIG. 100 has various functions such as, but not limited to, a function of displaying various kinds of information (e.g., a still image, a moving image, and a text image); a function of displaying a calendar, a date, the time, and the like on a display portion; a function of operating or editing the information displayed on the display portion; a function of controlling processing by various kinds of software (programs); a function of wireless communication; a function of communicating with another mobile phone, a fixed phone, or an audio communication device by using the wireless communication function; a function of connecting with various computer networks by using the wireless communication function; a function of transmitting or receiving various kinds of data by using the wireless communication function; a function of operating a vibrator in accordance with incoming call, reception of data, or an alarm; and a function of generating a sound in accordance with incoming call, reception of data, or an alarm.

The contents (or part of the contents) described in each drawing in this embodiment mode can be applied to various electronic devices. Specifically, the present invention can be applied to a display portion of an electronic device. Examples of such electronic devices include cameras such as a video camera and a digital camera, a goggle-type display, a navigation system, an audio reproducing device (such as car audio components and audio components), a computer, a game machine, a portable information terminal (such as a mobile computer, a mobile phone, a mobile game machine, and an e-book reader), and an image reproducing device provided with a recording medium (specifically, a device which reproduces a recording medium such as a digital versatile disc (DVD) and has a display for displaying the reproduced image).

Figure 101A:
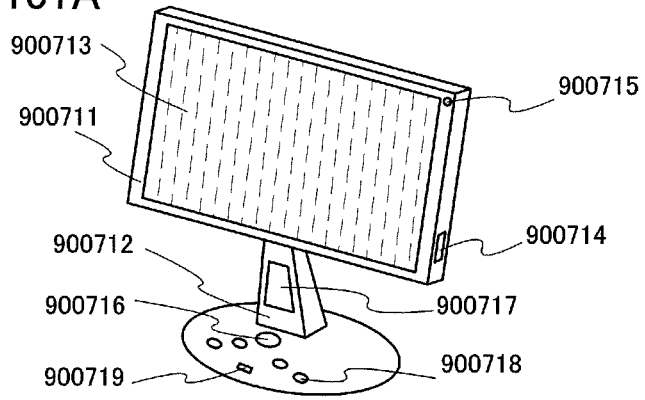
FIGS. 101A to 101C each illustrate an electronic device in which a display device according to the invention is used.

FIG. 101A shows a display, which includes a housing 900711, a support base 900712, a display portion 900713, an input means 900714, a sensor 900715 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900716, a speaker 900717, operation keys 900718, an LED lamp 900719, and the like. The display shown in FIG. 101A can have various functions such as, but not limited to, a function of displaying various kinds of information (e.g., a still image, a moving image, and a text image) on the display portion.

Figure 101B:
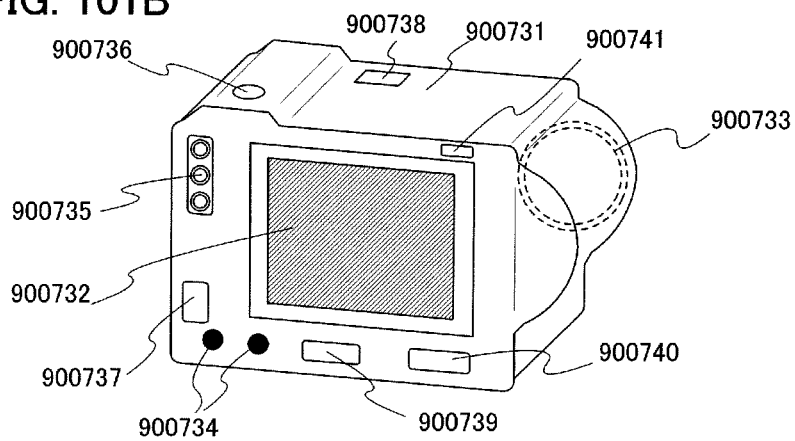

FIG. 101B shows a camera, which includes a main body 900731, a display portion 900732, an image receiving portion 900733, operation keys 900734, an external connection port 900735, a shutter button 900736, an input means 900737, a sensor 900738 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900739, a speaker 900740, an LED lamp 900741, and the like. The camera shown in FIG. 101B can have various functions such as, but not limited to, a function of photographing a still image and a moving image; a function of automatically adjusting the photographed image (the still image or the moving image); a function of storing the photographed image in a recording medium (provided externally or incorporated in the camera); and a function of displaying the photographed image on the display portion.

Figure 101C:
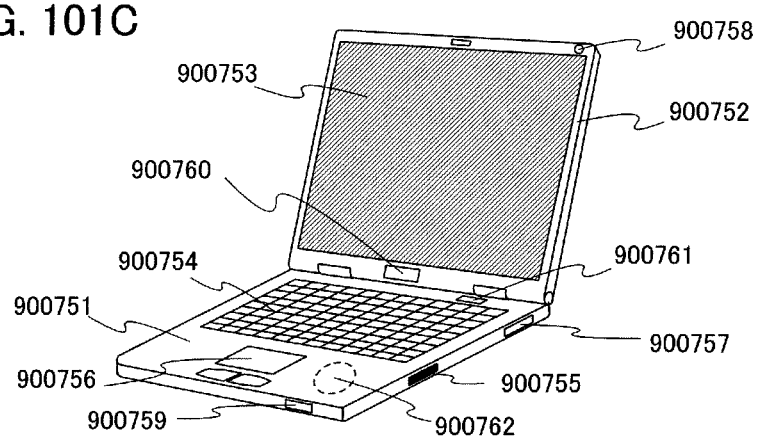

FIG. 101C shows a computer, which includes a main body 900751, a housing 900752, a display portion 900753, a keyboard 900754, an external connection port 900755, a pointing device 900756, an input means 900757, a sensor 900758 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 900759, a speaker 900760, an LED lamp 900761, a reader/writer 900762, and the like. The computer shown in FIG. 101C can have various functions such as, but not limited to, a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; and a function of transmitting or receiving various kinds of data by using the communication function.

Figure 108A:
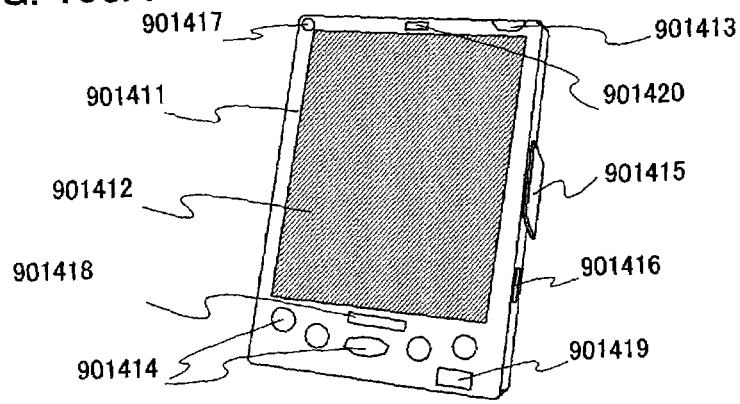
FIGS. 108A to 108C each illustrate an electronic device in which a display device according to the invention is used.

FIG. 108A shows a mobile computer, which includes a main body 901411, a display portion 901412, a switch 901413, operation keys 901414, an infrared port 901415, an input means 901416, a sensor 901417 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901418, a speaker 901419, an LED lamp 901420, and the like. The mobile computer shown in FIG. 108A can have various functions such as, but not limited to, a function of displaying various kinds of information (e.g., a still image, a moving image, and a text image) on the display portion; a touch panel function provided on the display portion; a function of displaying a calendar, a date, the time, and the like on the display portion; a function of controlling processing by various kinds of software (programs); a function of wireless communication; a function of connecting with various computer networks by using the wireless communication function; and a function of transmitting or receiving various kinds of data by using the wireless communication function.

Figure 108B:
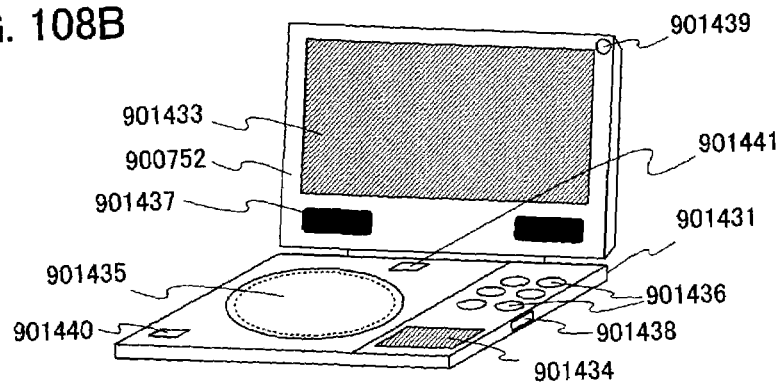

FIG. 108B shows a portable image reproducing device provided with a recording medium (e.g., a DVD reproducing device), which includes a main body 901431, a housing 901432, a display portion A 901433, a display portion B 901434, a recording medium (e.g., DVD) reading portion 901435, operation keys 901436, a speaker portion 901437, an input means 901438, a sensor 901439 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901440, an LED lamp 901441, and the like. The display portion A 901433 can mainly display image information, and the display portion B 901434 can mainly display text information.

Figure 108C:
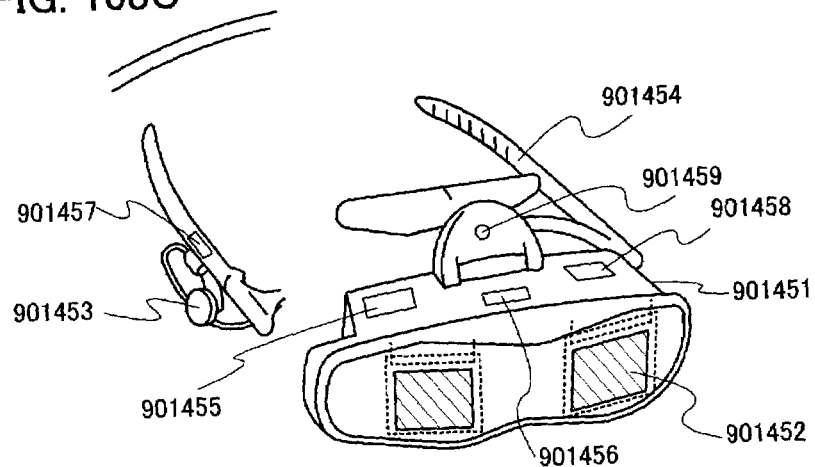

FIG. 108C shows a goggle-type display, which includes a main body 901451, a display portion 901452, an earphone 901453, a support portion 901454, an input means 901455, a sensor 901456 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901457, a speaker 901458, an LED lamp 901459, and the like. The goggle-type display shown in FIG. 108C can have various functions such as, but not limited to, a function of displaying an image (e.g., a still image, a moving image, and a text image) which is externally obtained on the display portion.

Figure 109A:
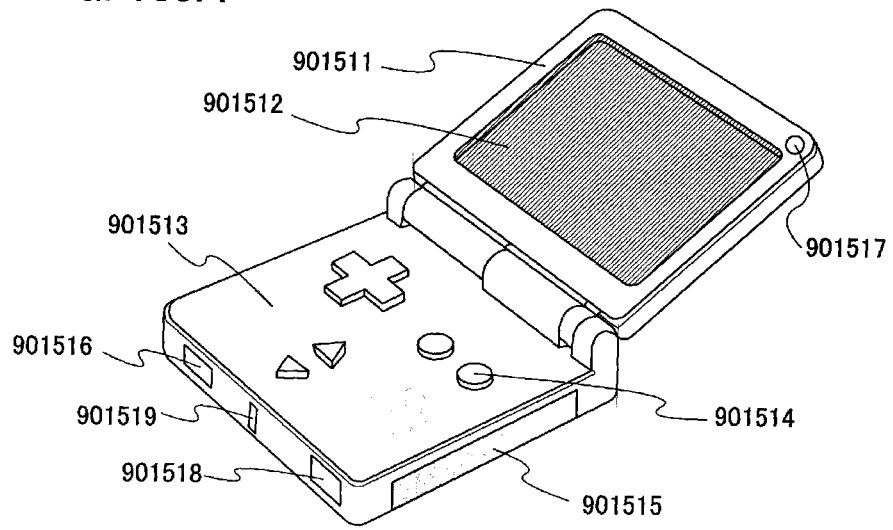
FIGS. 109A and 109B each illustrate an electronic device in which a display device according to the invention is used.

FIG. 109A shows a portable game machine, which includes a housing 901511, a display portion 901512, speaker portions 901513, operation keys 901514, a recording medium insert portion 901515, an input means 901516, a sensor 901517 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901518, an LED lamp 901519, and the like. The portable game machine shown in FIG. 109A can have various functions such as, but not limited to, a function of reading a program or data stored in the recording medium to display on the display portion; and a function of sharing information by wireless communication with another portable game machine.

Figure 109B:
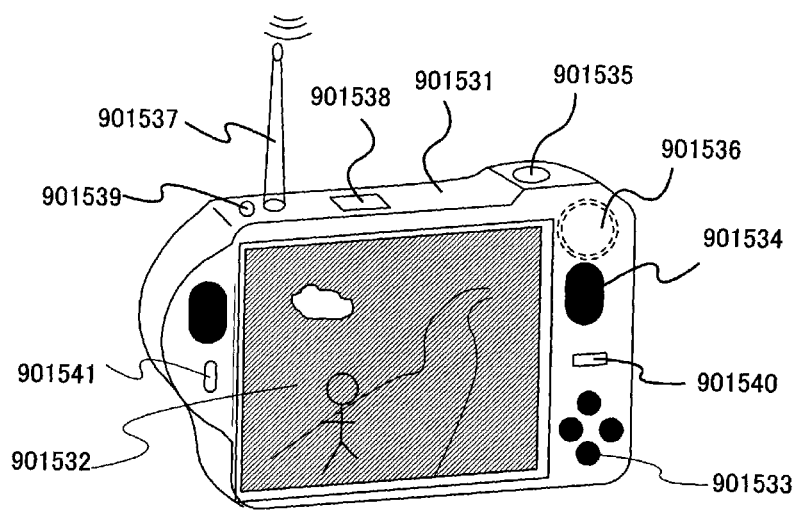

FIG. 109B shows a digital camera having a television reception function, which includes a housing 901531, a display portion 901532, operation keys 901533, a speaker 901534, a shutter button 901535, an image receiving portion 901536, an antenna 901537, an input means 901538, a sensor 901539 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901540, an LED lamp 901541, and the like. The digital camera having the television reception function shown in FIG. 109B can have various functions such as, but not limited to, a function of photographing a still image and a moving image; a function of automatically adjusting the photographed image; a function of obtaining various kinds of information from the antenna; a function of storing the photographed image or the information obtained from the antenna; and a function of displaying the photographed image or the information obtained from the antenna on the display portion.

Figure 110:
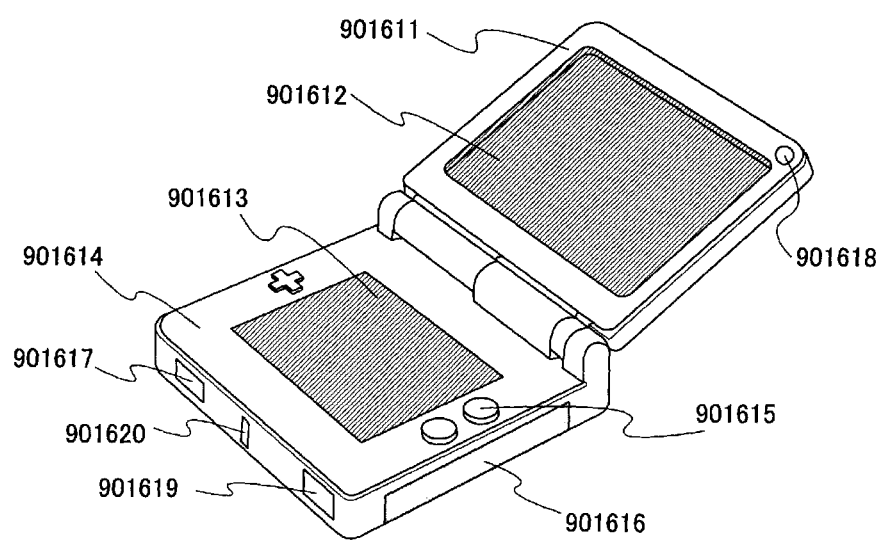
FIG. 110 illustrates an electronic device in which a display device according to the invention is used.

FIG. 110 shows a portable game machine, which includes a housing 901611, a first display portion 901612, a second display portion 901613, speaker portions 901614, operation keys 901615, a recording medium insert portion 901616, an input means 901617, a sensor 901618 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 901619, an LED lamp 901620, and the like. The portable game machine shown in FIG. 110 can have various functions such as, but not limited to, a function of reading a program or data stored in the recording medium to display on the display portion, and a function of sharing information with another portable game machine by wireless communication.

As shown in FIGS. 101A to 101C, 108A to 108C, 109A and 109B, and 110, the electronic device includes a display portion for displaying some kind of information. Such electronic devices can have a display portion with improved image quality. Further, the problem of motion blur and the problem of flicker can be reduced. In particular, an electronic device having a display portion using liquid crystal can include a display portion with improved viewing angle. An electronic device can include a display portion with improved response speed. Since a display portion with reduced power consumption can be provided, an electronic device with reduced power consumption can be obtained. Moreover, since a display portion with reduced manufacturing cost can be provided, an electronic device with reduced manufacturing cost can be obtained.

Next, application examples of the semiconductor device are described.

Figure 102:
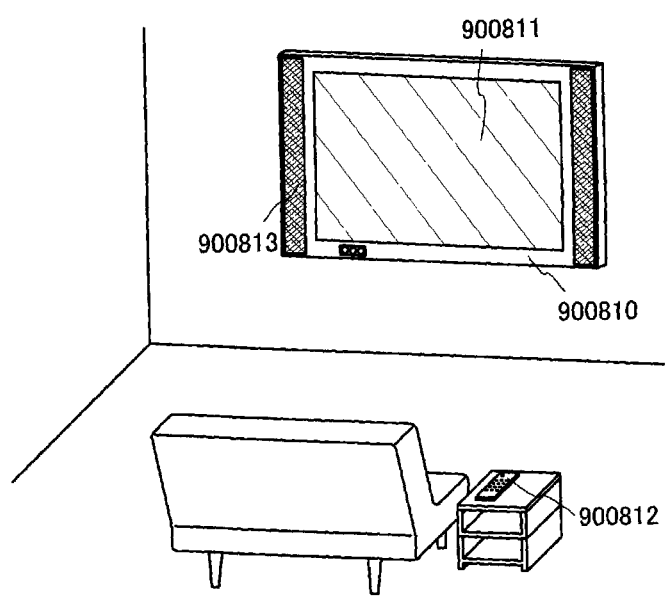
FIG. 102 illustrates an electronic device in which a display device according to the invention is used.

FIG. 102 shows an example in which the semiconductor device is incorporated in a constructed object. FIG. 102 shows a housing 900810, a display portion 900811, a remote control device 900812 which is an operation portion, a speaker portion 900813, and the like. The semiconductor device is incorporated in the constructed object as a wall-mounted semiconductor device, which can be provided without requiring a large space.

Figure 103:
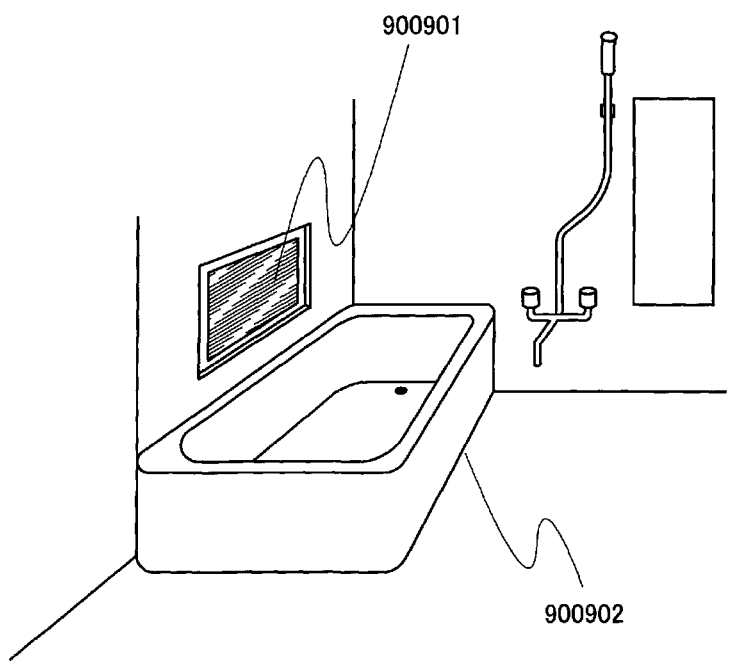
FIG. 103 illustrates an electronic device in which a display device according to the invention is used.

FIG. 103 shows another example in which the semiconductor device is incorporated in a constructed object. A display panel 900901 is incorporated with a prefabricated bath 900902, and a person who takes a bath can view the display panel 900901. The display panel 900901 has a function of displaying information by an operation by the person who takes a bath; and a function of being used as an advertisement or an entertainment means.

Note that the semiconductor device can be provided not only for a side wall of the prefabricated bath 900902 as shown in FIG. 103, but also for various places. For example, the semiconductor device can be incorporated with part of a mirror, a bathtub itself, or the like. At this time, the shape of the display panel 900901 may be changed in accordance with the shape of the mirror or the bathtub.

Figure 104:
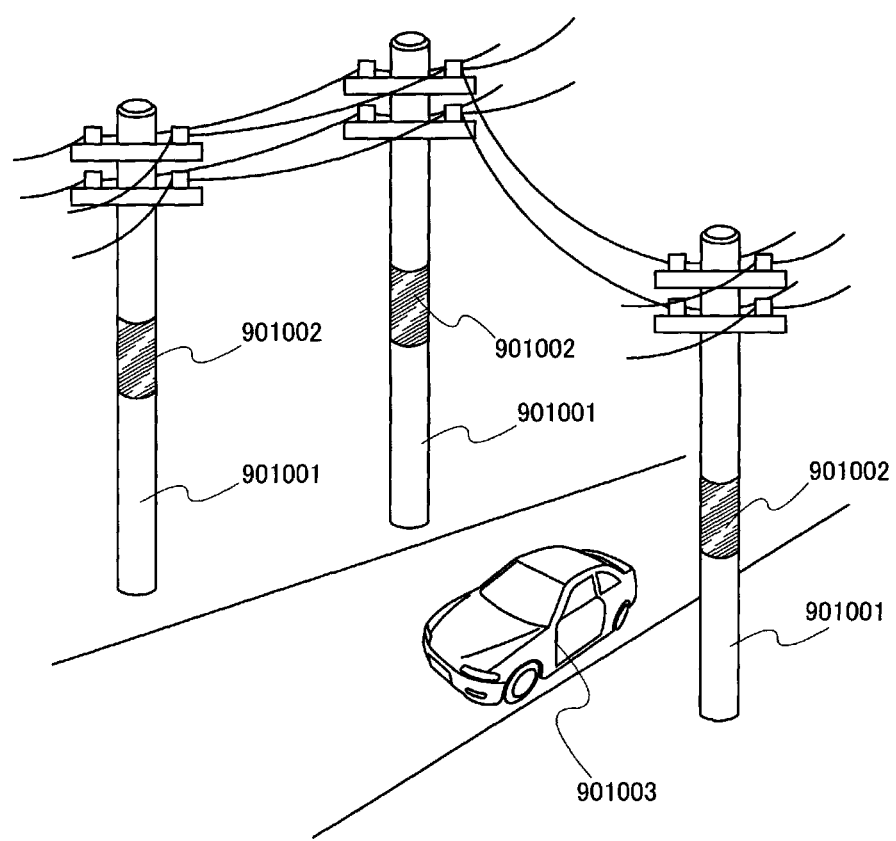
FIG. 104 illustrates an electronic device in which a display device according to the invention is used.

FIG. 104 shows another example in which the semiconductor device is incorporated in a constructed object. A display panel 901002 is bent and attached to a curved surface of a column-shaped object 901001. Note that here, a utility pole is described as the column-shaped object 901001.

The display panel 901002 shown in FIG. 104 is provided at a position higher than a human viewpoint. When the display panels 901002 are provided in constructed objects which stand together in large numbers outdoors, such as utility poles, advertisement can be performed to an unspecified number of viewers. Since it is easy for the display panels 901002 to display the same images and instantly switch images by external control, highly efficient information display and advertisement effect can be expected. By provision of self-luminous display elements, the display panel 901002 can be useful as a highly visible display medium even at night. When the display panel 901002 is provided in the utility pole, a power supply means for the display panel 901002 can be easily obtained. In an emergency such as disaster, the display panel 901002 can also be used as a means to transmit correct information to victims rapidly.

Note that an example of the display panel 901002 includes a display panel in which a switching element such as an organic transistor is provided over a film-shaped substrate and a display element is driven so that an image is displayed.

Note that in this embodiment mode, a wall, a column-shaped object, and a prefabricated bath are shown as examples of constructed objects; however, this embodiment mode is not limited thereto, and various constructed objects can be provided with the semiconductor device.

Next, examples where the semiconductor device is incorporated with a moving object are described.

Figure 105:
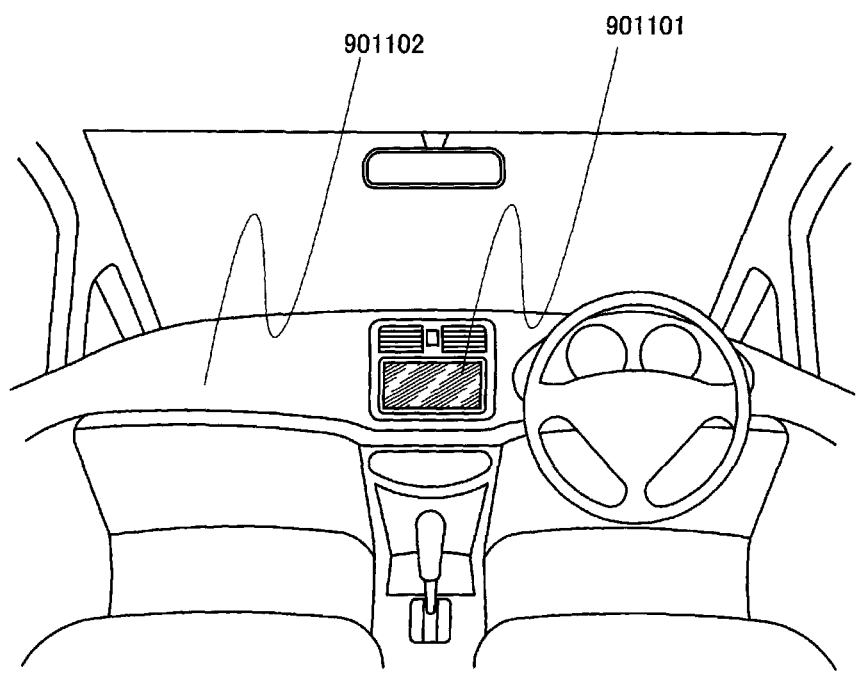
FIG. 105 illustrates an electronic device in which a display device according to the invention is used.

FIG. 105 shows an example in which the semiconductor device is incorporated with a car. A display panel 901101 is incorporated with a car body 901102 and can display an operation of the car body or information input from inside or outside the car body on demand. Note that a navigation function may be provided.

The semiconductor device can be provided not only for the car body 901102 as shown in FIG. 105, but also for various places. For example, the semiconductor device can be incorporated with a glass window, a door, a steering wheel, a gear shift, a seat, a rear-view mirror, and the like. At this time, the shape of the display panel 901101 may be changed in accordance with the shape of an object to be provided with the display panel 901101.

Figure 106A:
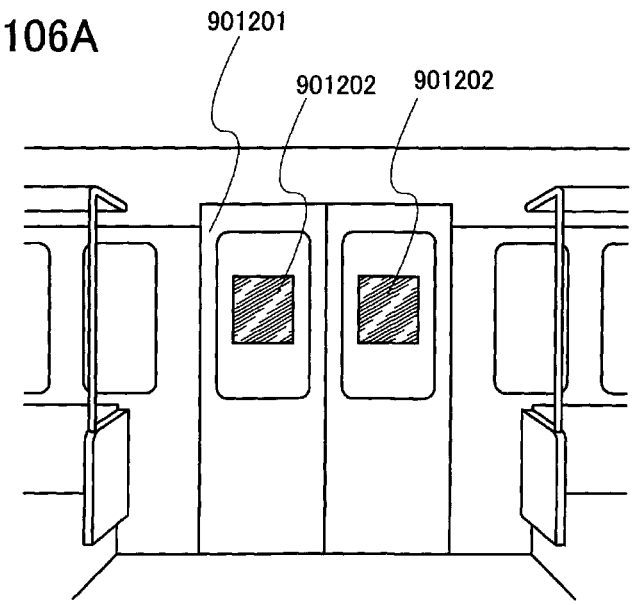
FIGS. 106A and 106B each illustrate an electronic device in which a display device according to the invention is used.
Figure 106B:
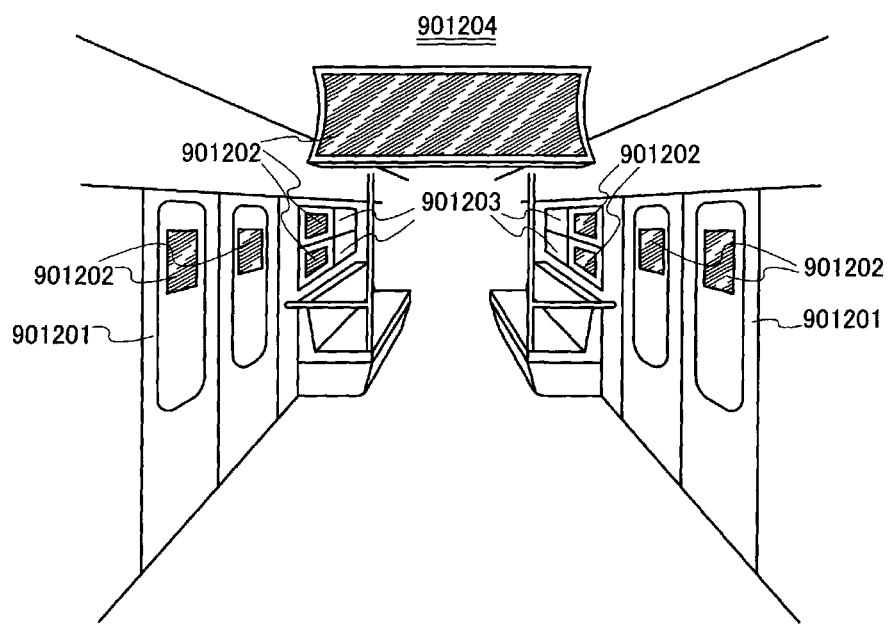

FIGS. 106A and 106B show examples where the semiconductor device is incorporated with a train car.

FIG. 106A shows an example in which a display panel 901202 is provided in glass of a door 901201 in a train car, which has an advantage compared with a conventional advertisement using paper in that labor cost for changing an advertisement is not necessary. Since the display panel 901202 can instantly switch images displaying on a display portion by an external signal, images on the display panel can be switched in every time period when types of passengers on the train are changed, for example. Thus, a more effective advertisement effect can be expected.

FIG. 106B shows an example in which the display panels 901202 are provided for a glass window 901203 and a ceiling 901204 as well as the glass of the door 901201 in the train car. In such a manner, the semiconductor device can be easily provided for a place where a semiconductor device has been difficult to be provided conventionally; thus, an effective advertisement effect can be obtained. Further, the semiconductor device can instantly switch images displayed on a display portion by an external signal; thus, cost and time for changing an advertisement can be reduced, and more flexible advertisement management and information transmission can be realized.

Note that the semiconductor device can be provided not only for the door 901201, the glass window 901203, and the ceiling 901204 as shown in FIGS. 106A and 106B, but also for various places. For example, the semiconductor device can be incorporated with a strap, a seat, a handrail, a floor, and the like. At this time, the shape of the display panel 901202 may be changed in accordance with the shape of an object to be provided with the display panel 901202.

Figure 107A:
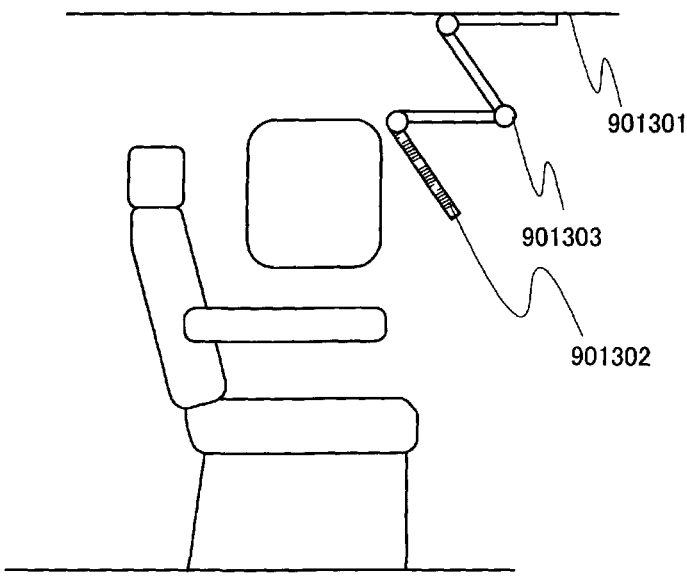
FIGS. 107A and 107B illustrate an electronic device in which a display device according to the invention is used.
Figure 107B:
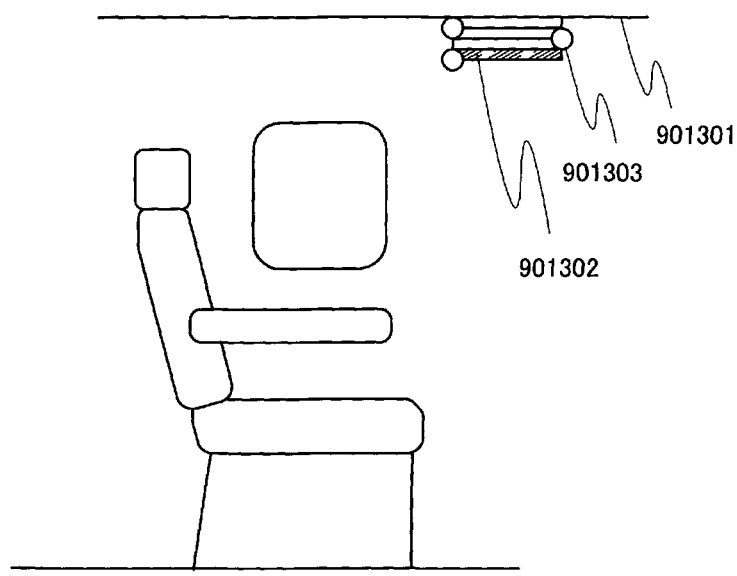

FIGS. 107A and 107B show an example in which the semiconductor device is incorporated with a passenger airplane.

FIG. 107A shows the shape of a display panel 901302 provided on a ceiling 901301 above a seat of the passenger airplane when the display panel 901302 is used. The display panel 901302 is incorporated with the ceiling 901301 with a hinge portion 901303, and a passenger can view the display panel 901302 by stretching of the hinge portion 901303. The display panel 901302 has a function of displaying information by an operation by the passenger and a function of being used for an advertisement or an entertainment means. As shown in FIG. 107B, when the hinge portion is bent so that the display panel is stored in the ceiling 901301, safety in taking-off and landing can be assured. Note that in an emergency, the display panel can also be used for an information transmission means and a guide light by lighting a display element in the display panel.

Note that the semiconductor device can be provided not only for the ceiling 901301 as shown in FIGS. 107A and 107B, but also for various places. For example, the semiconductor device can be incorporated with a seat, a table attached to a seat, an armrest, a window, and the like. A large display panel which a plurality of people can view may be provided on a wall of an airframe. At this time, the shape of the display panel 901302 may be changed in accordance with the shape of an object to be provided with the display panel 901302.

Note that in this embodiment mode, bodies of a train car, a car, and an airplane are shown as moving objects; however, the present invention is not limited thereto, and the semiconductor device can be provided for various objects such as a motorcycle, an four-wheel drive car (including a car, a bus, and the like), a train (including a monorail, a railroad car, and the like), and a vessel. Since the semiconductor device can instantly switch images displayed on a display panel in a moving object by an external signal, the moving object provided with the semiconductor device can be used as an advertisement display board for an unspecified number of customers, an information display board in disaster, and the like.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

This application is based on Japanese Patent Application serial No. 2007-133557 filed with Japan Patent Office on May 18, 2007, the entire contents of which are hereby incorporated by reference.

What is claimed is:

1. A method for driving a display device comprising:
   inputting a first external image signal to a control circuit;
   inputting a second external image signal to the control circuit after the step of inputting the first external image signal;
   generating a third image signal from the first external image signal and the second external image signal by the control circuit;
   displaying a first image corresponding to the first external image signal when the third image signal is generated;
   displaying a second image corresponding to the third image signal after displaying the first image; and
   displaying a third image corresponding to the second external image signal after displaying the second image,
   wherein the second image comprises:
     a first region which is an intermediate image between the first image and the third image; and
     a second region which is a black image,
   wherein a movement vector of the first region is larger than a movement vector of the second region, the movement vector being detected based on an amount of change from the first image to the third image,
   wherein a brightness of all pixels of the second image is lower than a brightness of each corresponding pixel of the first image and a brightness of each corresponding pixel of the third image, and
   wherein all pixels of the first image and the third image are not black.

2. The method for driving the display device according to claim 1,
   wherein the control circuit outputs a data of the first image, a data of the second image and a data of the third image to a source driver, and
   wherein each of the first image, the second image and the third image are displayed on a display region.

3. The method for driving the display device according to claim 1, wherein the control circuit comprises:
   a first memory holding the first external image signal;
   a second memory holding the second external image signal;
   a motion detection circuit configured to detect a motion vector by difference between the first image and the second image to generate the third image signal; and
   a third memory holding the third image signal.

4. A method for driving a display device comprising:
   inputting a first external image signal to a control circuit;
   inputting a second external image signal to the control circuit after the step of inputting the first external image signal;
   generating a third image signal from the first external image signal and the second external image signal by the control circuit;
   displaying a first image corresponding to the first external image signal when the third image signal is generated;
   displaying a second image corresponding to the third image signal after displaying the first image; and
   displaying a third image corresponding to the second external image signal after displaying the second image,
   wherein the second image comprises:
     a first region which is an intermediate image between the first image and the third image; and
     a second region which is a black image,
   wherein a movement vector of the first region is larger than a movement vector of the second region, the movement vector being detected based on an amount of change from the first image to the third image, wherein a brightness of all pixels of the second image is lower than a brightness of each corresponding pixel of the first image and a brightness of each corresponding pixel of the third image by adjusting a brightness of a back light, and wherein all pixels of the first image and the third image are not black.

5. The method for driving the display device according to claim 4, wherein the control circuit outputs a data of the first image, a data of the second image and a data of the third image to a source driver, and wherein each of the first image, the second image and the third image are displayed on a display region.

6. The method for driving the display device according to claim 4, wherein the back light comprises a white light-emitting diode.

7. The method for driving the display device according to claim 4, wherein the control circuit comprises:

a first memory holding the first external image signal;

a second memory holding the second external image signal;

a motion detection circuit configured to detect a motion vector by difference between the first image and the second image to generate the third image signal; and a third memory holding the third image signal.

* * * * *